US012694934B2

(12) United States Patent
Shibata et al.

(10) Patent No.: US 12,694,934 B2
(45) Date of Patent: Jul. 28, 2026

(54) SEMICONDUCTOR MEMORY

(71) Applicant: Kioxia Corporation, Tokyo (JP)

(72) Inventors: Noboru Shibata, Kawasaki Kanagawa (JP); Hironori Uchikawa, Fujisawa Kanagawa (JP); Taira Shibuya, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 74 days.

(21) Appl. No.: 18/662,238

(22) Filed: May 13, 2024

(65) Prior Publication Data

US 2024/0296895 A1 Sep. 5, 2024

Related U.S. Application Data

(63) Continuation of application No. 18/134,719, filed on Apr. 14, 2023, now Pat. No. 12,020,756, which is a
(Continued)

(30) Foreign Application Priority Data

Dec. 27, 2018 (JP) ................................. 2018-245746
Feb. 15, 2019 (JP) ................................. 2019-026045

(51) Int. Cl.
*G11C 16/26* (2006.01)
*G06F 3/06* (2006.01)
(Continued)

(52) U.S. Cl.
CPC ............ *G11C 16/26* (2013.01); *G06F 3/0604* (2013.01); *G06F 3/0659* (2013.01);
(Continued)

(58) Field of Classification Search
CPC ............ G11C 16/26; G11C 2211/5621; G11C 16/0483; G06F 3/0679; G06F 3/0659
See application file for complete search history.

(56) References Cited

U.S. PATENT DOCUMENTS 6,195,377 B1 2/2001 Bell et al.
7,511,997 B2 3/2009 Toda
(Continued)

FOREIGN PATENT DOCUMENTS

JP 4253309 B2 3/2005
JP 5410737 B2 11/2013
(Continued)

OTHER PUBLICATIONS

Notice of Allowance dated Feb. 13, 2024, issued in parent U.S. Appl. No. 18/134,719.
(Continued)

*Primary Examiner* — Uyen Smet
(74) *Attorney, Agent, or Firm* — Holtz, Holtz & Volek PC

(57) ABSTRACT

A semiconductor memory includes a first memory cell configured to be set with one of different threshold voltage levels, a second memory cell configured to be set with one of the different threshold voltage levels, a first word line coupled to the first and second memory cells, a first bit line connected to the first memory cell, a second bit line connected to the second memory cell, a first sense amplifier connected to the first bit line, a second sense amplifier connected to the second bit line, a first switch provided between the first and second sense amplifiers, and a controller configured to read data of one of different bits based on a combination of the threshold voltage of the first memory cell and the threshold voltage of the second memory cell.

11 Claims, 188 Drawing Sheets

Data definitions (First embodiment)

| Read operation | Read voltages | | Read data | | | |
|---|---|---|---|---|---|---|
| | PL1 | PL2 | PL1:PL2 (0:0) | PL1:PL2 (1:0) | PL1:PL2 (0:1) | PL1:PL2 (1:1) |
| 1st page | DR | – | 0 | 1 | 0 | 1 |
| 2nd page | – | DR | 0 | 0 | 1 | 1 |
| 3rd page | AR,CR | BR,FR | 0 | 1 | 1 | 0 |
| 4th page | BR,FR | AR,CR | 0 | 1 | 1 | 0 |
| 5th page | BR,FR | ER,GR | 0 | 1 | 1 | 0 |
| 6th page | ER,GR | BR,FR | 0 | 1 | 1 | 0 |

Related U.S. Application Data continuation of application No. 17/244,246, filed on Apr. 29, 2021, now Pat. No. 11,657,879, which is a continuation of application No. 16/724,100, filed on Dec. 20, 2019, now Pat. No. 11,011,239.

(51) Int. Cl.

| | |
|---|---|
| *G11C 16/04* | (2006.01) |
| *G11C 16/08* | (2006.01) |
| *G11C 16/10* | (2006.01) |
| *G11C 16/32* | (2006.01) |
| *G11C 16/34* | (2006.01) |
| *H10B 69/00* | (2023.01) |

(52) U.S. Cl.

CPC ........ *G06F 3/0679* (2013.01); *G11C 16/0483* (2013.01); *G11C 16/08* (2013.01); *G11C 16/10* (2013.01); *G11C 16/32* (2013.01); *G11C 16/3459* (2013.01); *H10B 69/00* (2023.02)

(56) References Cited

U.S. PATENT DOCUMENTS

| | | | |
|---|---|---|---|
| 8,094,495 | B2 | 1/2012 | Toyama |
| 8,531,877 | B2 * | 9/2013 | Radke .................... G11C 16/10 365/185.28 |
| 8,732,560 | B2 | 5/2014 | Kern et al. |
| 8,837,213 | B2 | 9/2014 | Shibata |
| 9,190,161 | B2 | 11/2015 | Shibata |
| 10,049,749 | B2 | 8/2018 | Shibata |
| 10,121,536 | B2 | 11/2018 | Wang et al. |
| 10,566,051 | B2 | 2/2020 | Shibata et al. |
| 10,714,170 | B2 | 7/2020 | Shibata et al. |
| 10,916,300 | B2 | 2/2021 | Shibata |
| 2008/0084740 | A1 | 4/2008 | Kim et al. |
| 2009/0267128 | A1 | 10/2009 | Maejima |
| 2009/0268522 | A1 | 10/2009 | Maejima |
| 2010/0207195 | A1 | 8/2010 | Fukuzumi et al. |
| 2010/0214838 | A1 | 8/2010 | Hishida et al. |
| 2011/0284946 | A1 | 11/2011 | Kiyotoshi |
| 2012/0069663 | A1 | 3/2012 | Itagaki et al. |
| 2017/0365335 | A1 | 12/2017 | Wang et al. |
| 2018/0181301 | A1 | 6/2018 | Bandic et al. |
| 2019/0259458 | A1 | 8/2019 | Shibata et al. |
| 2021/0118495 | A1 | 4/2021 | Shibata et al. |

FOREIGN PATENT DOCUMENTS

| | | |
|---|---|---|
| JP | 2017224370 A | 12/2017 |
| JP | 2019145188 A | 8/2019 |

OTHER PUBLICATIONS

Notice of Allowance dated Jan. 20, 2023, issued in U.S. Appl. No. 17/244,246.

Office Action (Non-Final Rejection) dated Jun. 24, 2022, issued in U.S. Appl. No. 17/244,246.

Office Action (Non-Final Rejection) dated Oct. 24, 2023, issued in parent U.S. Appl. No. 18/134,719.

U.S. Appl. No. 17/158,567, First Named Inventor: Noboru Shibata; Title: "Semiconductor Memory Device, Memory System, and Write Method", filed Jan. 26, 2021.

Qin, "Fractional Bits-per-cell for NANO Flash with Low Read Latency", IEEE, 2017.

* cited by examiner

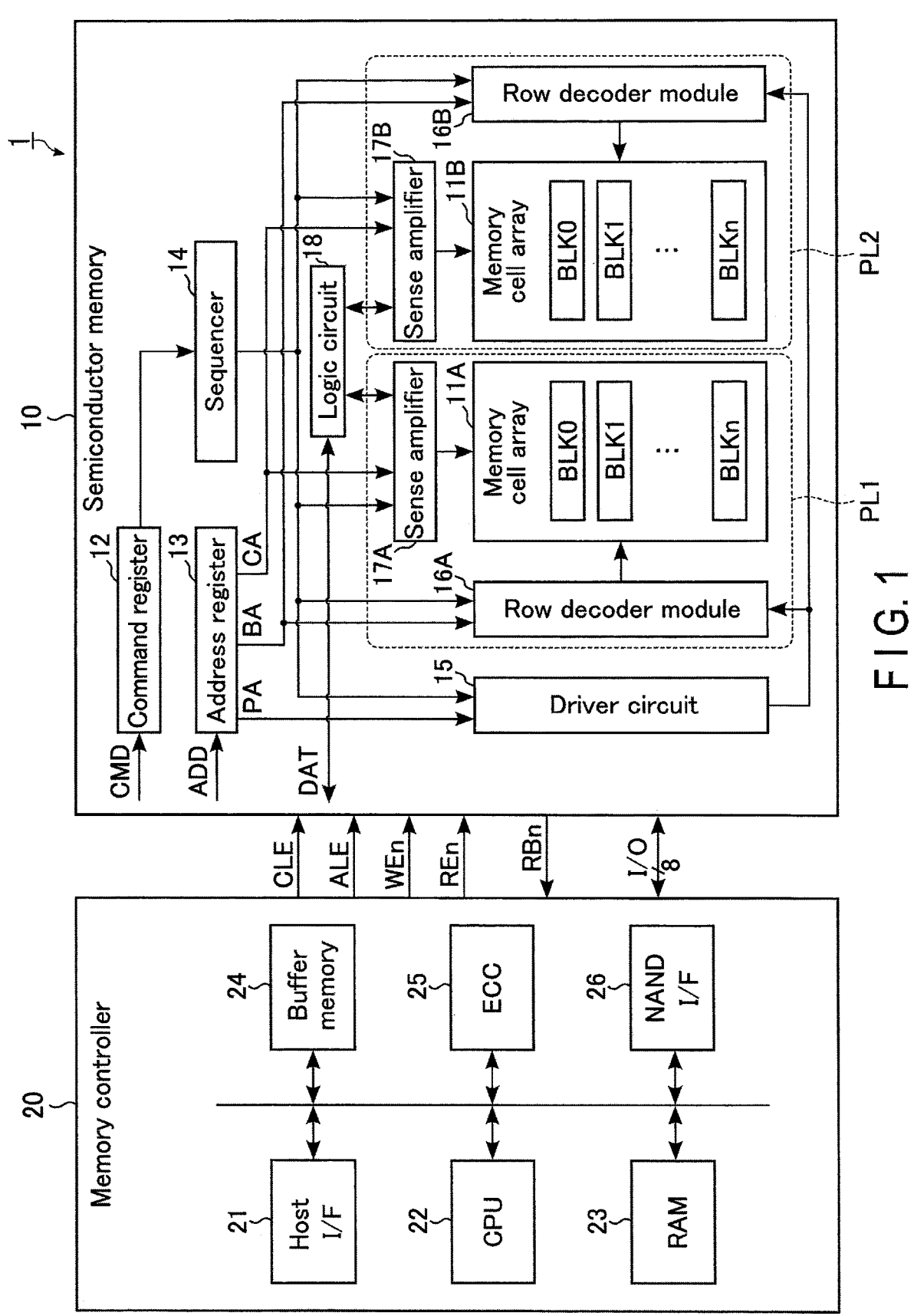
F I G. 1

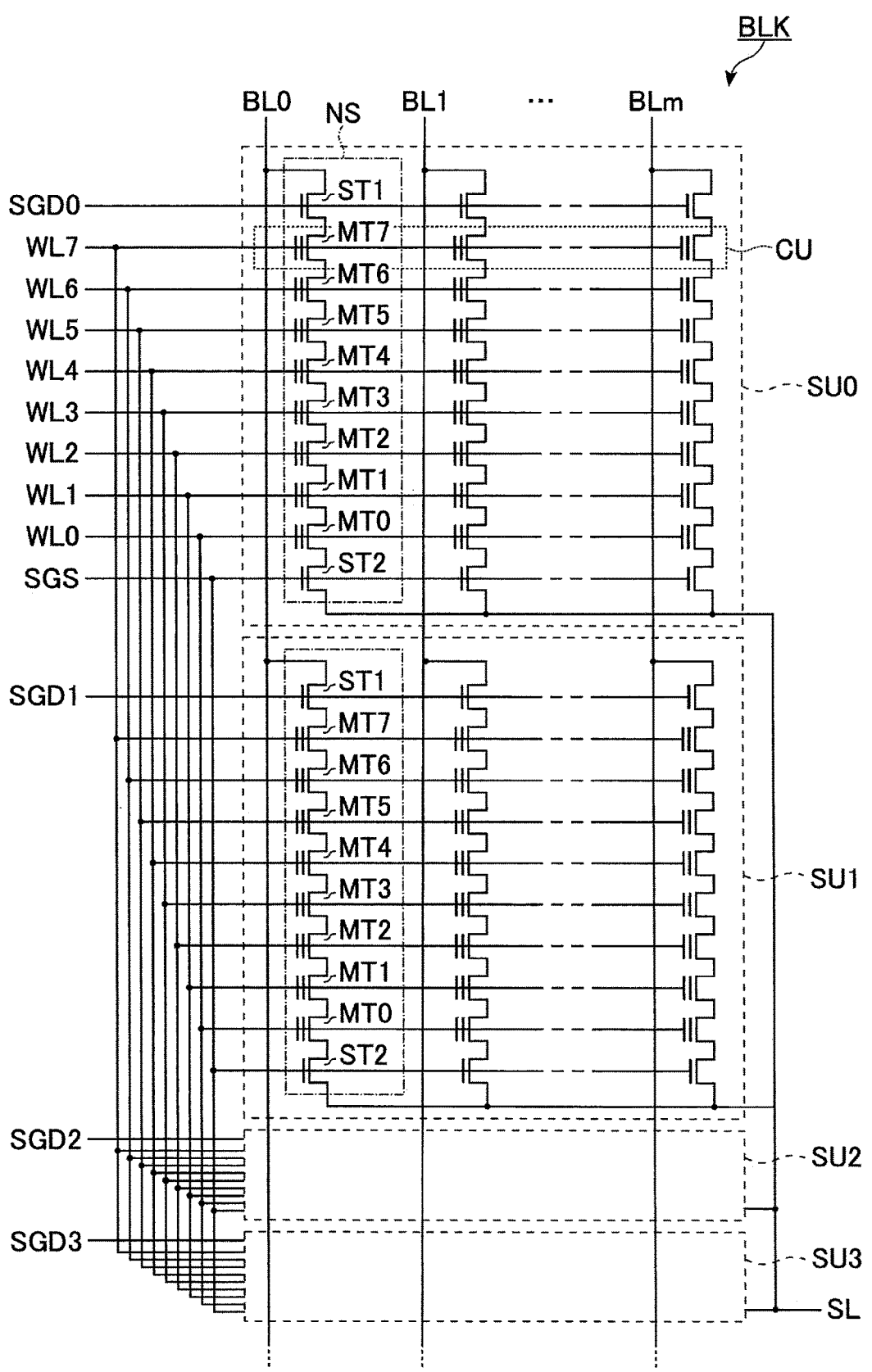
F I G. 2

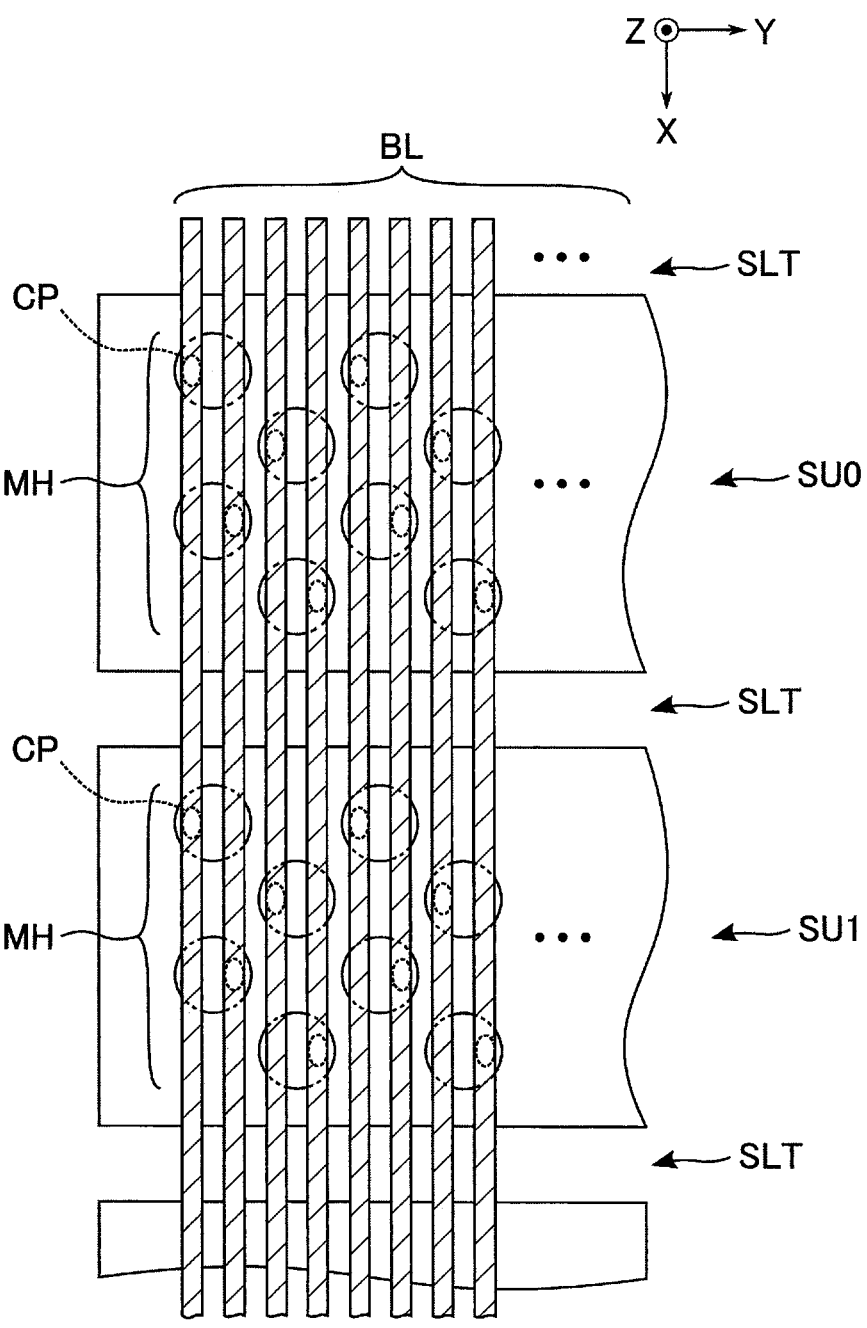
F I G. 3

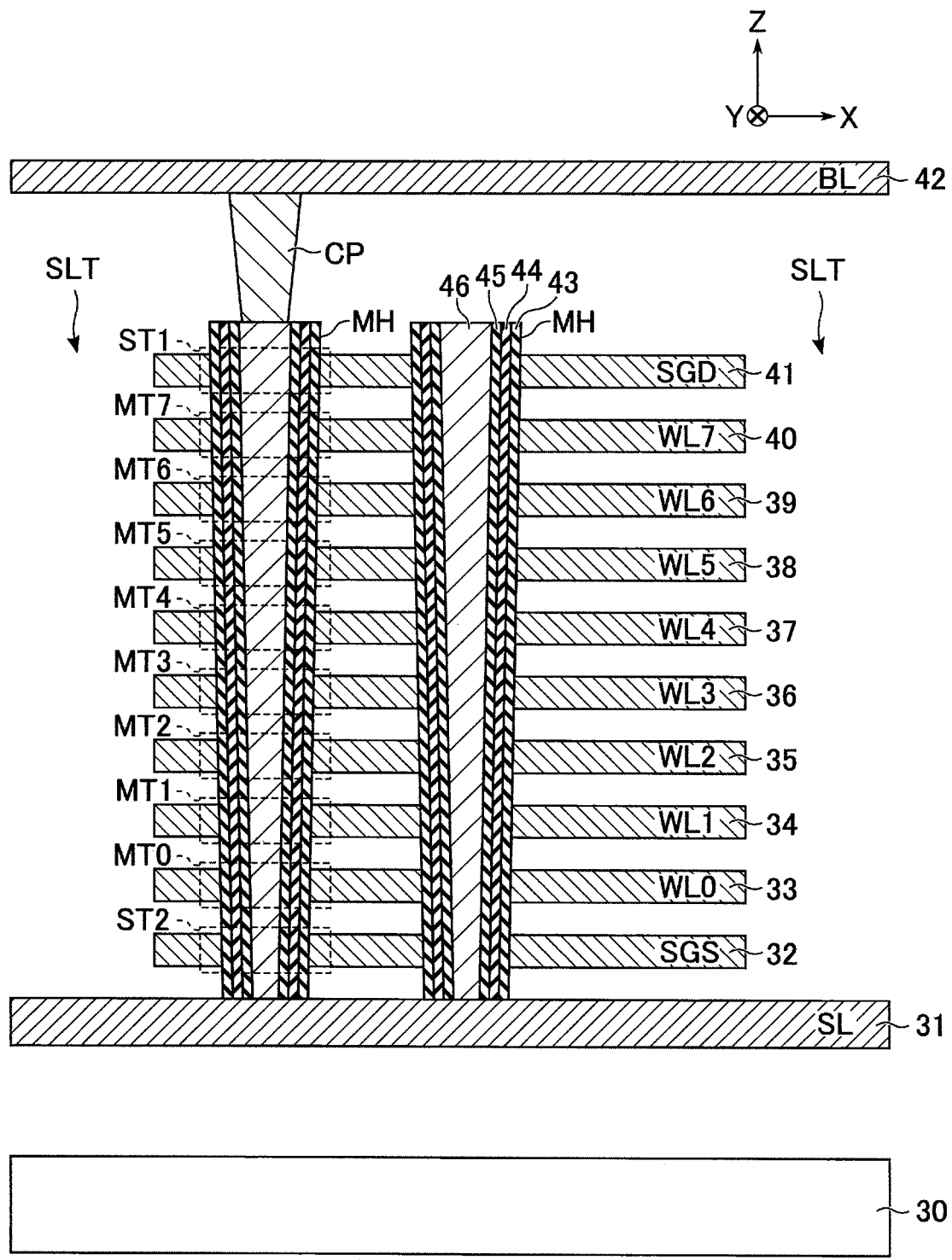
F I G. 4

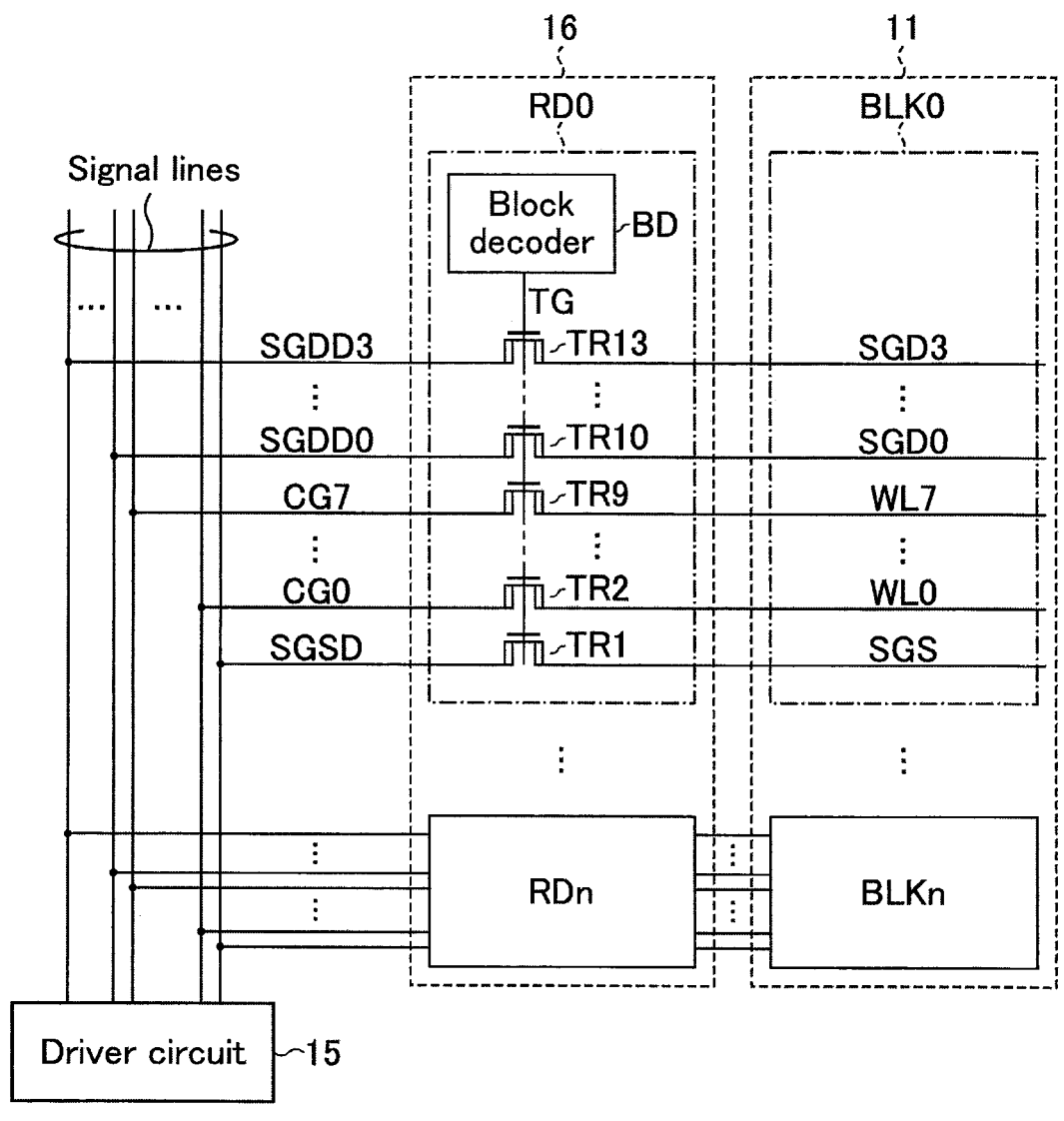
F I G. 5

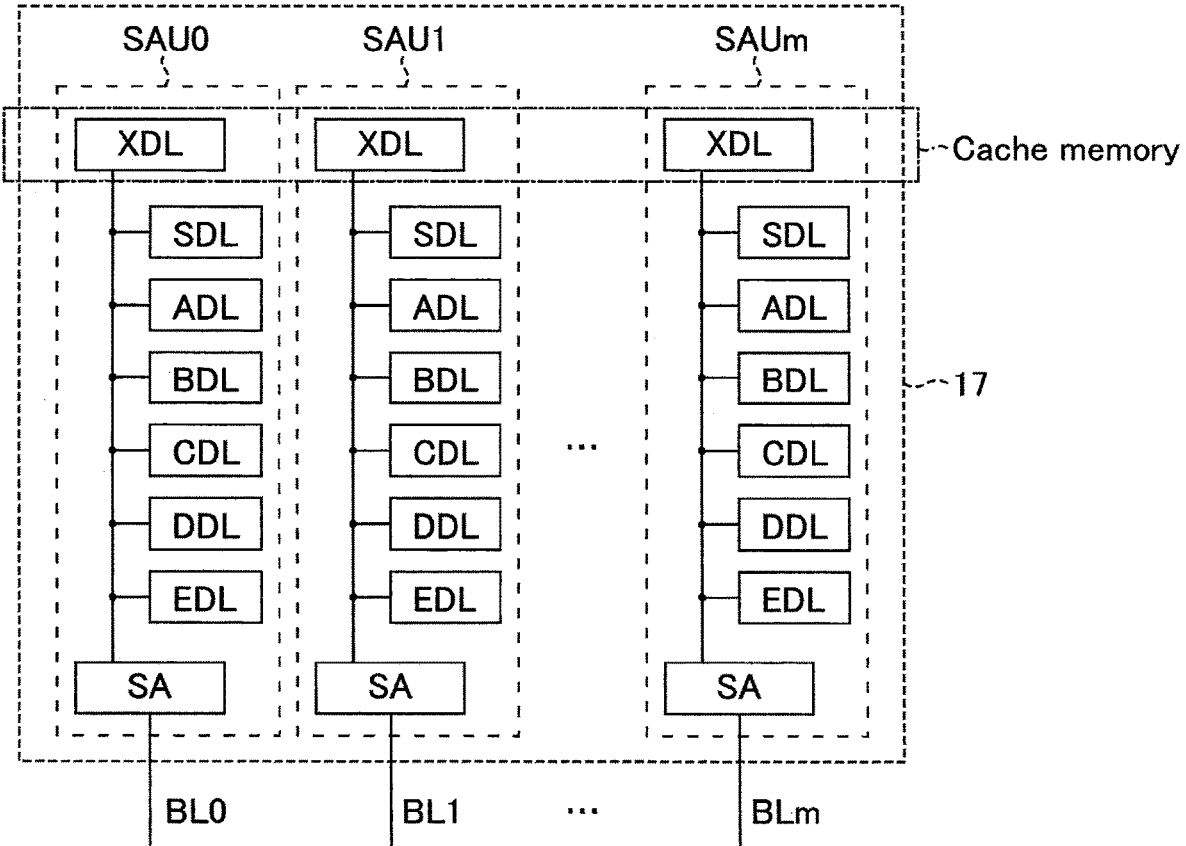
F I G. 6

Data allocation(1/2) (First embodiment)

| | Vth of memory cells | | Data | | | | | |
|---|---|---|---|---|---|---|---|---|
| | 1st plane | 2nd plane | 1st page | 2nd page | 3rd page | 4th page | 5th page | 6th page |
| (1) | Z | Z | 1 | 1 | 0 | 0 | 0 | 0 |
| (2) | Z | A | 1 | 1 | 0 | 1 | 0 | 0 |
| (3) | Z | B | 1 | 1 | 1 | 1 | 0 | 1 |
| (4) | Z | C | 1 | 1 | 1 | 0 | 0 | 1 |
| (5) | Z | D | 1 | 0 | 1 | 0 | 0 | 1 |
| (6) | Z | E | 1 | 0 | 1 | 0 | 1 | 1 |
| (7) | Z | F | 1 | 0 | 0 | 0 | 1 | 0 |
| (8) | Z | G | 1 | 0 | 0 | 0 | 0 | 0 |
| (9) | A | Z | 1 | 1 | 1 | 0 | 0 | 0 |
| (10) | A | A | 1 | 1 | 1 | 1 | 0 | 0 |
| (11) | A | B | 1 | 1 | 0 | 1 | 0 | 1 |
| (12) | A | C | 1 | 1 | 0 | 0 | 0 | 1 |
| (13) | A | D | 1 | 0 | 0 | 0 | 0 | 1 |
| (14) | A | E | 1 | 0 | 0 | 0 | 1 | 1 |
| (15) | A | F | 1 | 0 | 1 | 0 | 1 | 0 |
| (16) | A | G | 1 | 0 | 1 | 0 | 0 | 0 |
| (17) | B | Z | 1 | 1 | 1 | 1 | 1 | 0 |
| (18) | B | A | 1 | 1 | 1 | 0 | 1 | 0 |
| (19) | B | B | 1 | 1 | 0 | 0 | 1 | 1 |
| (20) | B | C | 1 | 1 | 0 | 1 | 1 | 1 |
| (21) | B | D | 1 | 0 | 0 | 1 | 1 | 1 |
| (22) | B | E | 1 | 0 | 0 | 1 | 0 | 1 |
| (23) | B | F | 1 | 0 | 1 | 1 | 0 | 0 |
| (24) | B | G | 1 | 0 | 1 | 1 | 1 | 0 |
| (25) | C | Z | 1 | 1 | 0 | 1 | 1 | 0 |
| (26) | C | A | 1 | 1 | 0 | 0 | 1 | 0 |
| (27) | C | B | 1 | 1 | 1 | 0 | 1 | 1 |
| (28) | C | C | 1 | 1 | 1 | 1 | 1 | 1 |
| (29) | C | D | 1 | 0 | 1 | 1 | 1 | 1 |
| (30) | C | E | 1 | 0 | 1 | 1 | 0 | 1 |
| (31) | C | F | 1 | 0 | 0 | 1 | 0 | 0 |
| (32) | C | G | 1 | 0 | 0 | 1 | 1 | 0 |

F I G. 9

Data allocation(2/2) (First embodiment)

| | Vth of memory cells | | Data | | | | | |
|---|---|---|---|---|---|---|---|---|
| | 1st plane | 2nd plane | 1st page | 2nd page | 3rd page | 4th page | 5th page | 6th page |
| (33) | D | Z | 0 | 1 | 0 | 1 | 1 | 0 |
| (34) | D | A | 0 | 1 | 0 | 0 | 1 | 0 |
| (35) | D | B | 0 | 1 | 1 | 0 | 1 | 1 |
| (36) | D | C | 0 | 1 | 1 | 1 | 1 | 1 |
| (37) | D | D | 0 | 0 | 1 | 1 | 1 | 1 |
| (38) | D | E | 0 | 0 | 1 | 1 | 0 | 1 |
| (39) | D | F | 0 | 0 | 0 | 1 | 0 | 0 |
| (40) | D | G | 0 | 0 | 0 | 1 | 1 | 0 |
| (41) | E | Z | 0 | 1 | 0 | 1 | 1 | 1 |
| (42) | E | A | 0 | 1 | 0 | 0 | 1 | 1 |
| (43) | E | B | 0 | 1 | 1 | 0 | 1 | 0 |
| (44) | E | C | 0 | 1 | 1 | 1 | 1 | 0 |
| (45) | E | D | 0 | 0 | 1 | 1 | 1 | 0 |
| (46) | E | E | 0 | 0 | 1 | 1 | 0 | 0 |
| (47) | E | F | 0 | 0 | 0 | 1 | 0 | 1 |
| (48) | E | G | 0 | 0 | 0 | 1 | 1 | 1 |
| (49) | F | Z | 0 | 1 | 0 | 0 | 0 | 1 |
| (50) | F | A | 0 | 1 | 0 | 1 | 0 | 1 |
| (51) | F | B | 0 | 1 | 1 | 1 | 0 | 0 |
| (52) | F | C | 0 | 1 | 1 | 0 | 0 | 0 |
| (53) | F | D | 0 | 0 | 1 | 0 | 0 | 0 |
| (54) | F | E | 0 | 0 | 1 | 0 | 1 | 0 |
| (55) | F | F | 0 | 0 | 0 | 0 | 1 | 1 |
| (56) | F | G | 0 | 0 | 0 | 0 | 0 | 1 |
| (57) | G | Z | 0 | 1 | 0 | 0 | 0 | 0 |
| (58) | G | A | 0 | 1 | 0 | 1 | 0 | 0 |
| (59) | G | B | 0 | 1 | 1 | 1 | 0 | 1 |
| (60) | G | C | 0 | 1 | 1 | 0 | 0 | 1 |
| (61) | G | D | 0 | 0 | 1 | 0 | 0 | 1 |
| (62) | G | E | 0 | 0 | 1 | 0 | 1 | 1 |
| (63) | G | F | 0 | 0 | 0 | 0 | 1 | 0 |
| (64) | G | G | 0 | 0 | 0 | 0 | 0 | 0 |

F I G. 10

Data definitions (First embodiment)

| Read operation | Read voltages | | Read data | | | |
|---|---|---|---|---|---|---|
| | PL1 | PL2 | PL1:PL2 (0:0) | PL1:PL2 (1:0) | PL1:PL2 (0:1) | PL1:PL2 (1:1) |
| 1st page | DR | — | 0 | 1 | 0 | 1 |
| 2nd page | — | DR | 0 | 0 | 1 | 1 |
| 3rd page | AR,CR | BR,FR | 0 | 1 | 1 | 0 |
| 4th page | BR,FR | AR,CR | 0 | 1 | 1 | 0 |
| 5th page | BR,FR | ER,GR | 0 | 1 | 1 | 0 |
| 6th page | ER,GR | BR,FR | 0 | 1 | 1 | 0 |

FIG. 11

| | Vth of memory cells | | Read results | | | | | |
|---|---|---|---|---|---|---|---|---|
| | 1st plane | 2nd plane | 1st page | | 2nd page | | 3rd page | |
| | | | PL1 | PL2 | PL1 | PL2 | PL1 | PL2 |
| (1) | Z | Z | 1 | – | – | 1 | 1 | 1 |
| (2) | Z | A | 1 | – | – | 1 | 1 | 1 |
| (3) | Z | B | 1 | – | – | 1 | 1 | 0 |
| (4) | Z | C | 1 | – | – | 1 | 1 | 0 |
| (5) | Z | D | 1 | – | – | 0 | 1 | 0 |
| (6) | Z | E | 1 | – | – | 0 | 1 | 0 |
| (7) | Z | F | 1 | – | – | 0 | 1 | 1 |
| (8) | Z | G | 1 | – | – | 0 | 1 | 1 |
| (9) | A | Z | 1 | – | – | 1 | 0 | 1 |
| (10) | A | A | 1 | – | – | 1 | 0 | 1 |
| (11) | A | B | 1 | – | – | 1 | 0 | 0 |
| (12) | A | C | 1 | – | – | 1 | 0 | 0 |
| (13) | A | D | 1 | – | – | 0 | 0 | 0 |
| (14) | A | E | 1 | – | – | 0 | 0 | 0 |
| (15) | A | F | 1 | – | – | 0 | 0 | 1 |
| (16) | A | G | 1 | – | – | 0 | 0 | 1 |
| (17) | B | Z | 1 | – | – | 1 | 0 | 1 |
| (18) | B | A | 1 | – | – | 1 | 0 | 1 |
| (19) | B | B | 1 | – | – | 1 | 0 | 0 |
| (20) | B | C | 1 | – | – | 1 | 0 | 0 |
| (21) | B | D | 1 | – | – | 0 | 0 | 0 |
| (22) | B | E | 1 | – | – | 0 | 0 | 0 |
| (23) | B | F | 1 | – | – | 0 | 0 | 1 |
| (24) | B | G | 1 | – | – | 0 | 0 | 1 |
| (25) | C | Z | 1 | – | – | 1 | 1 | 1 |
| (26) | C | A | 1 | – | – | 1 | 1 | 1 |
| (27) | C | B | 1 | – | – | 1 | 1 | 0 |
| (28) | C | C | 1 | – | – | 1 | 1 | 0 |
| (29) | C | D | 1 | – | – | 0 | 1 | 0 |
| (30) | C | E | 1 | – | – | 0 | 1 | 0 |
| (31) | C | F | 1 | – | – | 0 | 1 | 1 |
| (32) | C | G | 1 | – | – | 0 | 1 | 1 |

| Read voltages | DR | – | – | DR | AR,CR | BR,FR |
|---|---|---|---|---|---|---|

F I G. 12

| | Vth of memory cells | | Read results | | | | | |
|---|---|---|---|---|---|---|---|---|
| | 1st plane | 2nd plane | 1st page | | 2nd page | | 3rd page | |
| | | | PL1 | PL2 | PL1 | PL2 | PL1 | PL2 |
| (33) | D | Z | 0 | – | – | 1 | 1 | 1 |
| (34) | D | A | 0 | – | – | 1 | 1 | 1 |
| (35) | D | B | 0 | – | – | 1 | 1 | 0 |
| (36) | D | C | 0 | – | – | 1 | 1 | 0 |
| (37) | D | D | 0 | – | – | 0 | 1 | 0 |
| (38) | D | E | 0 | – | – | 0 | 1 | 0 |
| (39) | D | F | 0 | – | – | 0 | 1 | 1 |
| (40) | D | G | 0 | – | – | 0 | 1 | 1 |
| (41) | E | Z | 0 | – | – | 1 | 1 | 1 |
| (42) | E | A | 0 | – | – | 1 | 1 | 1 |
| (43) | E | B | 0 | – | – | 1 | 1 | 0 |
| (44) | E | C | 0 | – | – | 1 | 1 | 0 |
| (45) | E | D | 0 | – | – | 0 | 1 | 0 |
| (46) | E | E | 0 | – | – | 0 | 1 | 0 |
| (47) | E | F | 0 | – | – | 0 | 1 | 1 |
| (48) | E | G | 0 | – | – | 0 | 1 | 1 |
| (49) | F | Z | 0 | – | – | 1 | 1 | 1 |
| (50) | F | A | 0 | – | – | 1 | 1 | 1 |
| (51) | F | B | 0 | – | – | 1 | 1 | 0 |
| (52) | F | C | 0 | – | – | 1 | 1 | 0 |
| (53) | F | D | 0 | – | – | 0 | 1 | 0 |
| (54) | F | E | 0 | – | – | 0 | 1 | 0 |
| (55) | F | F | 0 | – | – | 0 | 1 | 1 |
| (56) | F | G | 0 | – | – | 0 | 1 | 1 |
| (57) | G | Z | 0 | – | – | 1 | 1 | 1 |
| (58) | G | A | 0 | – | – | 1 | 1 | 1 |
| (59) | G | B | 0 | – | – | 1 | 1 | 0 |
| (60) | G | C | 0 | – | – | 1 | 1 | 0 |
| (61) | G | D | 0 | – | – | 0 | 1 | 0 |
| (62) | G | E | 0 | – | – | 0 | 1 | 0 |
| (63) | G | F | 0 | – | – | 0 | 1 | 1 |
| (64) | G | G | 0 | – | – | 0 | 1 | 1 |
| | Read voltages | | DR | – | – | DR | AR,CR | BR,FR |

FIG. 13

| | Vth of memory cells | | Read results | | | | | |
|---|---|---|---|---|---|---|---|---|
| | 1st plane | 2nd plane | 4th page | | 5th page | | 6th page | |
| | | | PL1 | PL2 | PL1 | PL2 | PL1 | PL2 |
| (1) | Z | Z | 1 | 1 | 1 | 1 | 1 | 1 |
| (2) | Z | A | 1 | 0 | 1 | 1 | 1 | 1 |
| (3) | Z | B | 1 | 0 | 1 | 1 | 1 | 0 |
| (4) | Z | C | 1 | 1 | 1 | 1 | 1 | 0 |
| (5) | Z | D | 1 | 1 | 1 | 1 | 1 | 0 |
| (6) | Z | E | 1 | 1 | 1 | 0 | 1 | 0 |
| (7) | Z | F | 1 | 1 | 1 | 0 | 1 | 1 |
| (8) | Z | G | 1 | 1 | 1 | 1 | 1 | 1 |
| (9) | A | Z | 1 | 1 | 1 | 1 | 1 | 1 |
| (10) | A | A | 1 | 0 | 1 | 1 | 1 | 1 |
| (11) | A | B | 1 | 0 | 1 | 1 | 1 | 0 |
| (12) | A | C | 1 | 1 | 1 | 1 | 1 | 0 |
| (13) | A | D | 1 | 1 | 1 | 1 | 1 | 0 |
| (14) | A | E | 1 | 1 | 1 | 0 | 1 | 0 |
| (15) | A | F | 1 | 1 | 1 | 0 | 1 | 1 |
| (16) | A | G | 1 | 1 | 1 | 1 | 1 | 1 |
| (17) | B | Z | 0 | 1 | 0 | 1 | 1 | 1 |
| (18) | B | A | 0 | 0 | 0 | 1 | 1 | 1 |
| (19) | B | B | 0 | 0 | 0 | 1 | 1 | 0 |
| (20) | B | C | 0 | 1 | 0 | 1 | 1 | 0 |
| (21) | B | D | 0 | 1 | 0 | 1 | 1 | 0 |
| (22) | B | E | 0 | 1 | 0 | 0 | 1 | 0 |
| (23) | B | F | 0 | 1 | 0 | 0 | 1 | 1 |
| (24) | B | G | 0 | 1 | 0 | 1 | 1 | 1 |
| (25) | C | Z | 0 | 1 | 0 | 1 | 1 | 1 |
| (26) | C | A | 0 | 0 | 0 | 1 | 1 | 1 |
| (27) | C | B | 0 | 0 | 0 | 1 | 1 | 0 |
| (28) | C | C | 0 | 1 | 0 | 1 | 1 | 0 |
| (29) | C | D | 0 | 1 | 0 | 1 | 1 | 0 |
| (30) | C | E | 0 | 1 | 0 | 0 | 1 | 0 |
| (31) | C | F | 0 | 1 | 0 | 0 | 1 | 1 |
| (32) | C | G | 0 | 1 | 0 | 1 | 1 | 1 |

| Read voltages | BR,FR | AR,CR | BR,FR | ER,GR | ER,GR | BR,FR |
|---|---|---|---|---|---|---|

F I G. 14

| | Vth of memory cells | | Read results | | | | | |
|---|---|---|---|---|---|---|---|---|
| | 1st plane | 2nd plane | 4th page | | 5th page | | 6th page | |
| | | | PL1 | PL2 | PL1 | PL2 | PL1 | PL2 |
| (33) | D | Z | 0 | 1 | 0 | 1 | 1 | 1 |
| (34) | D | A | 0 | 0 | 0 | 1 | 1 | 1 |
| (35) | D | B | 0 | 0 | 0 | 1 | 1 | 0 |
| (36) | D | C | 0 | 1 | 0 | 1 | 1 | 0 |
| (37) | D | D | 0 | 1 | 0 | 1 | 1 | 0 |
| (38) | D | E | 0 | 1 | 0 | 0 | 1 | 0 |
| (39) | D | F | 0 | 1 | 0 | 0 | 1 | 1 |
| (40) | D | G | 0 | 1 | 0 | 1 | 1 | 1 |
| (41) | E | Z | 0 | 1 | 0 | 1 | 0 | 1 |
| (42) | E | A | 0 | 0 | 0 | 1 | 0 | 1 |
| (43) | E | B | 0 | 0 | 0 | 1 | 0 | 0 |
| (44) | E | C | 0 | 1 | 0 | 1 | 0 | 0 |
| (45) | E | D | 0 | 1 | 0 | 1 | 0 | 0 |
| (46) | E | E | 0 | 1 | 0 | 0 | 0 | 0 |
| (47) | E | F | 0 | 1 | 0 | 0 | 0 | 1 |
| (48) | E | G | 0 | 1 | 0 | 1 | 0 | 1 |
| (49) | F | Z | 1 | 1 | 1 | 1 | 0 | 1 |
| (50) | F | A | 1 | 0 | 1 | 1 | 0 | 1 |
| (51) | F | B | 1 | 0 | 1 | 1 | 0 | 0 |
| (52) | F | C | 1 | 1 | 1 | 1 | 0 | 0 |
| (53) | F | D | 1 | 1 | 1 | 1 | 0 | 0 |
| (54) | F | E | 1 | 1 | 1 | 0 | 0 | 0 |
| (55) | F | F | 1 | 1 | 1 | 0 | 0 | 1 |
| (56) | F | G | 1 | 1 | 1 | 1 | 0 | 1 |
| (57) | G | Z | 1 | 1 | 1 | 1 | 1 | 1 |
| (58) | G | A | 1 | 0 | 1 | 1 | 1 | 1 |
| (59) | G | B | 1 | 0 | 1 | 1 | 1 | 0 |
| (60) | G | C | 1 | 1 | 1 | 1 | 1 | 0 |
| (61) | G | D | 1 | 1 | 1 | 1 | 1 | 0 |
| (62) | G | E | 1 | 1 | 1 | 0 | 1 | 0 |
| (63) | G | F | 1 | 1 | 1 | 0 | 1 | 1 |
| (64) | G | G | 1 | 1 | 1 | 1 | 1 | 1 |
| | Read voltages | | BR,FR | AR,CR | BR,FR | ER,GR | ER,GR | BR,FR |

F I G. 15

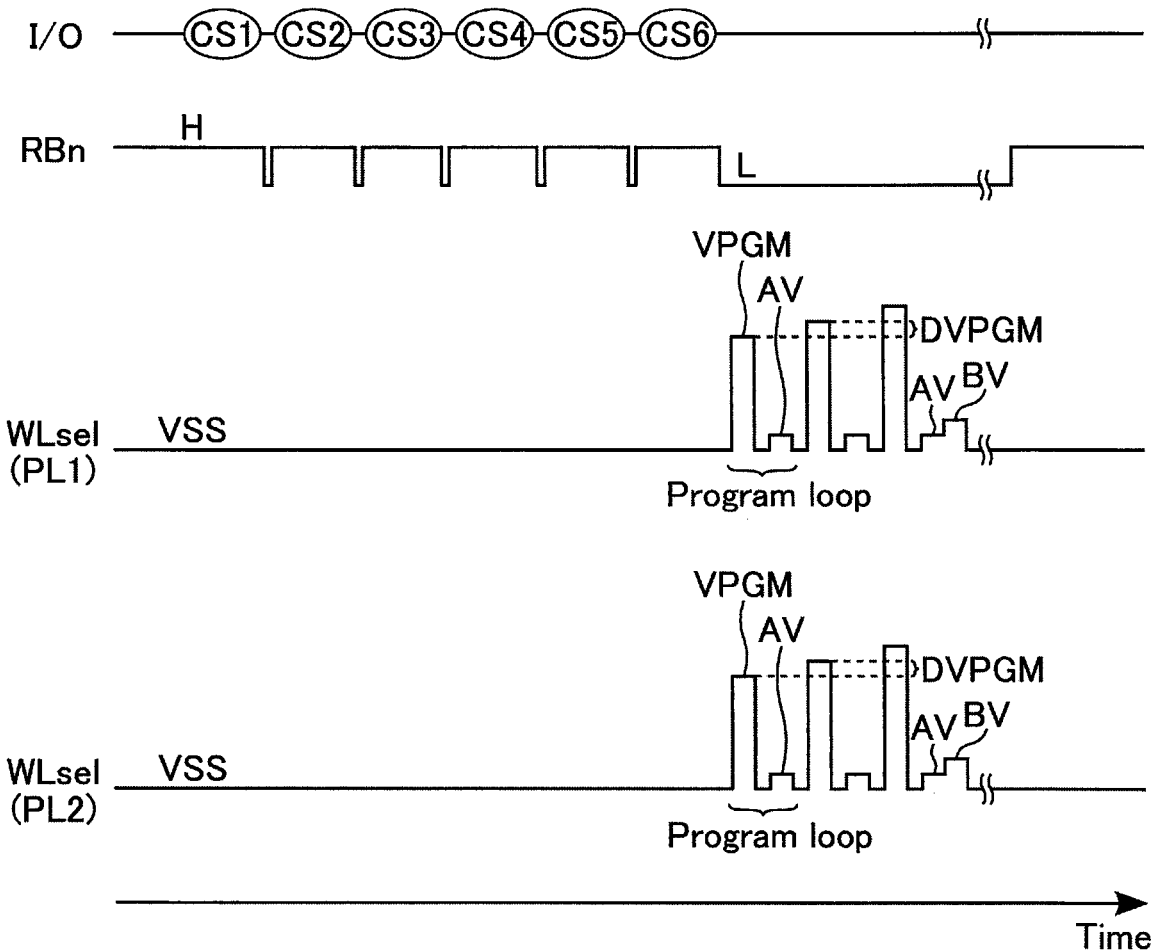
Read operation (First embodiment)
F I G. 16

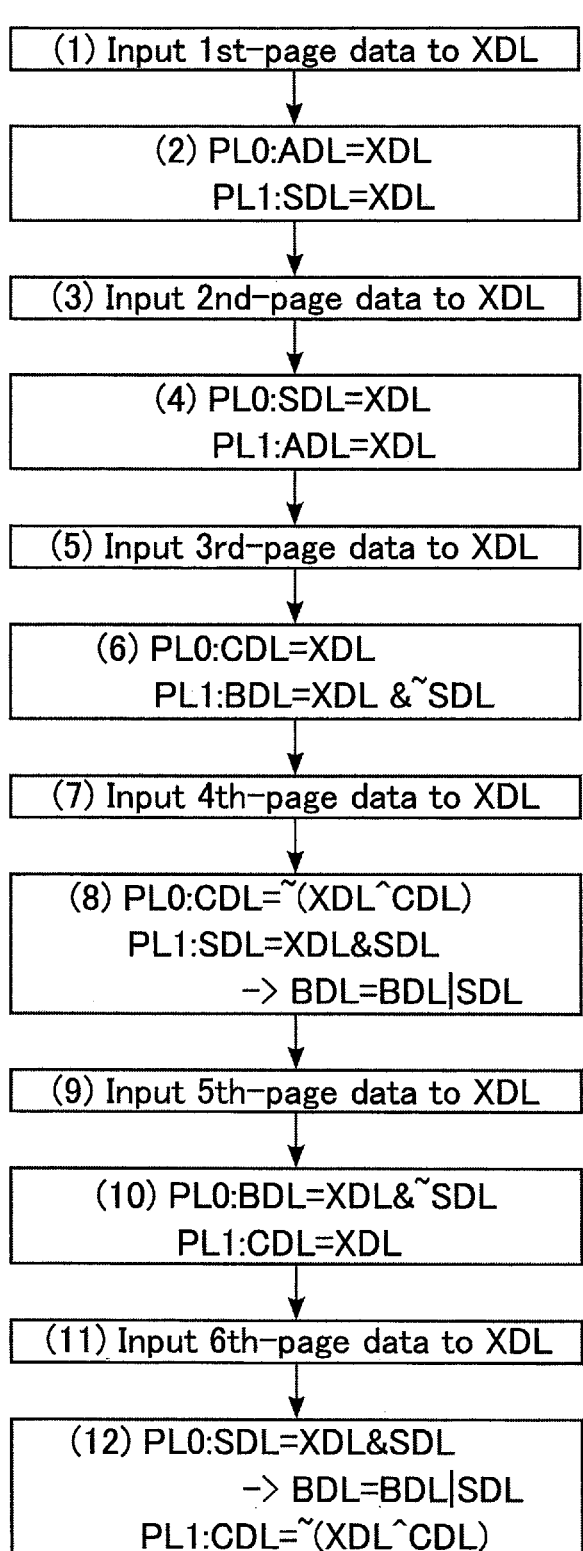
F I G. 17

First-page read (First embodiment)
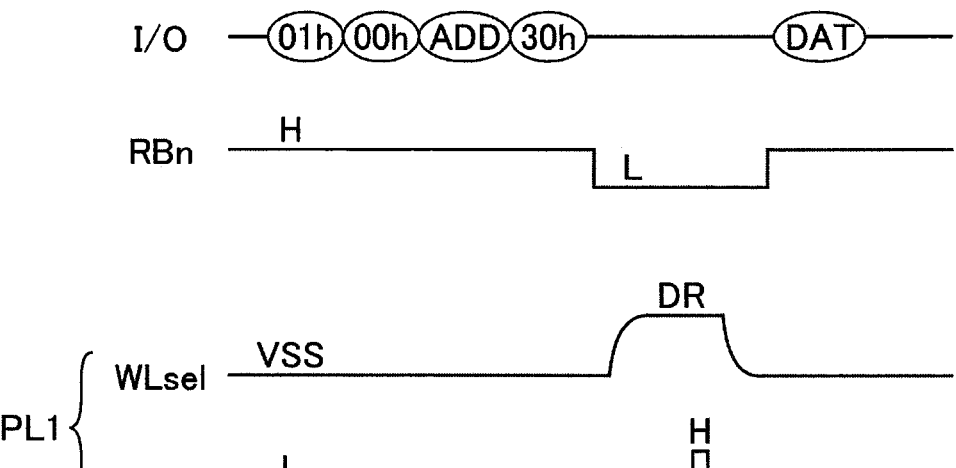
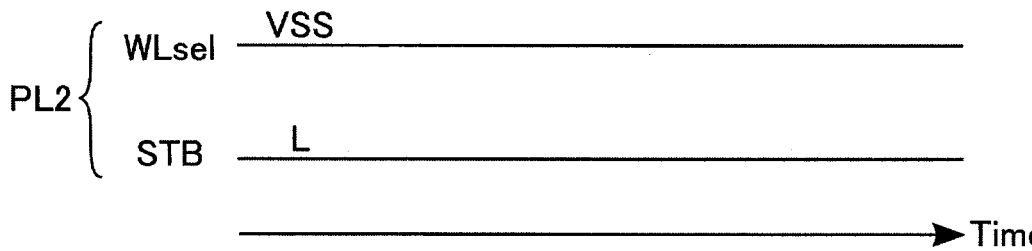
F I G. 18

Second-page read (First embodiment)
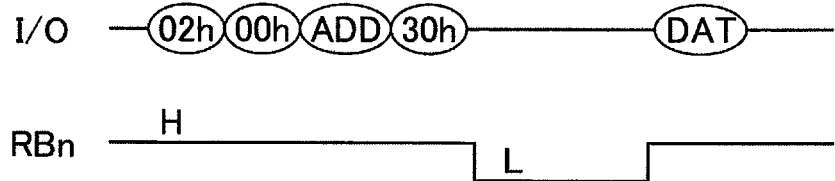
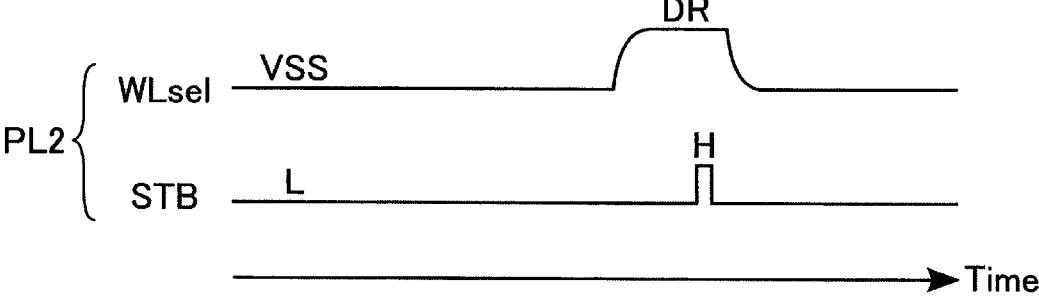
F I G. 19

Third-page read (First embodiment)
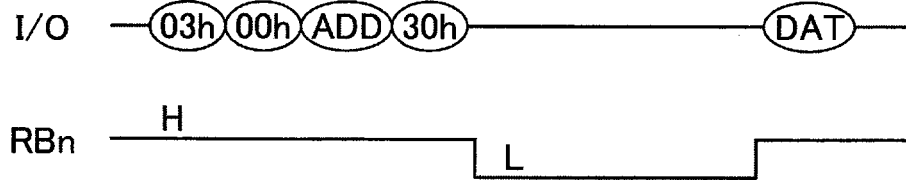
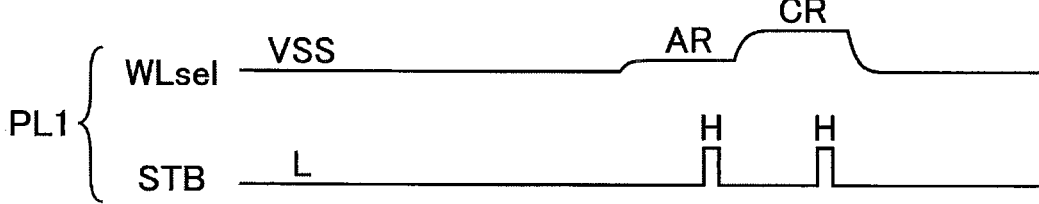
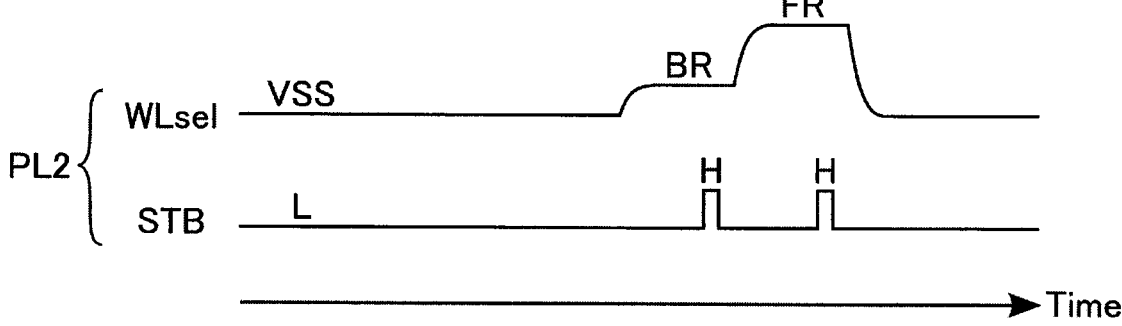
F I G. 20

Fourth-page read (First embodiment)
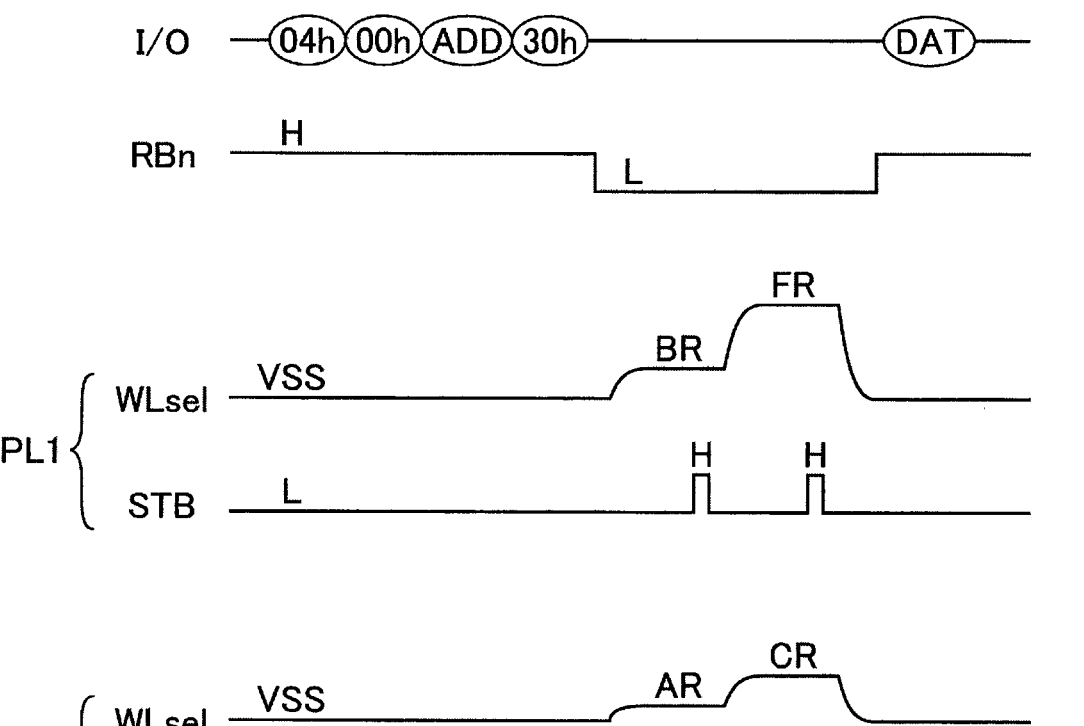
F I G. 21

Fifth-page read (First embodiment)
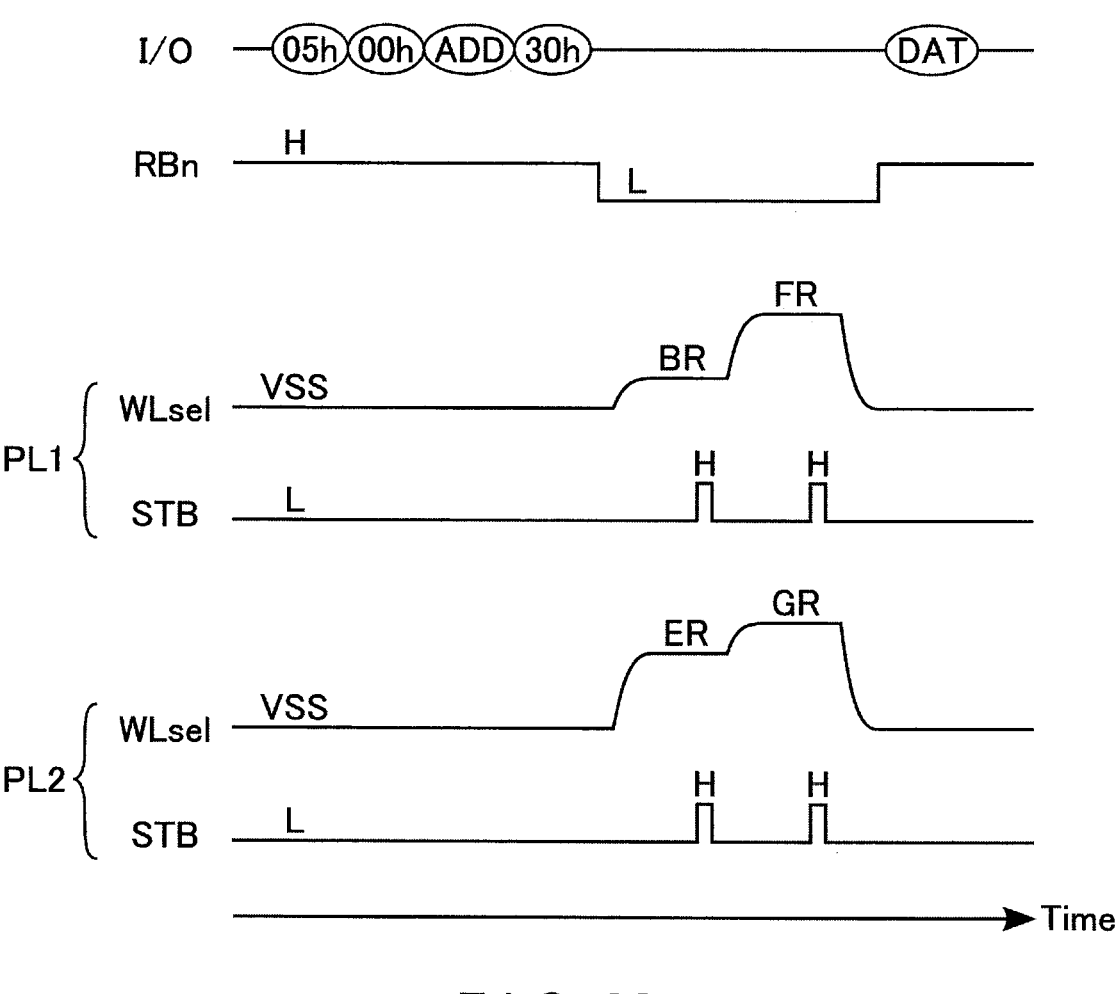
F I G. 22

Sixth-page read (First embodiment)

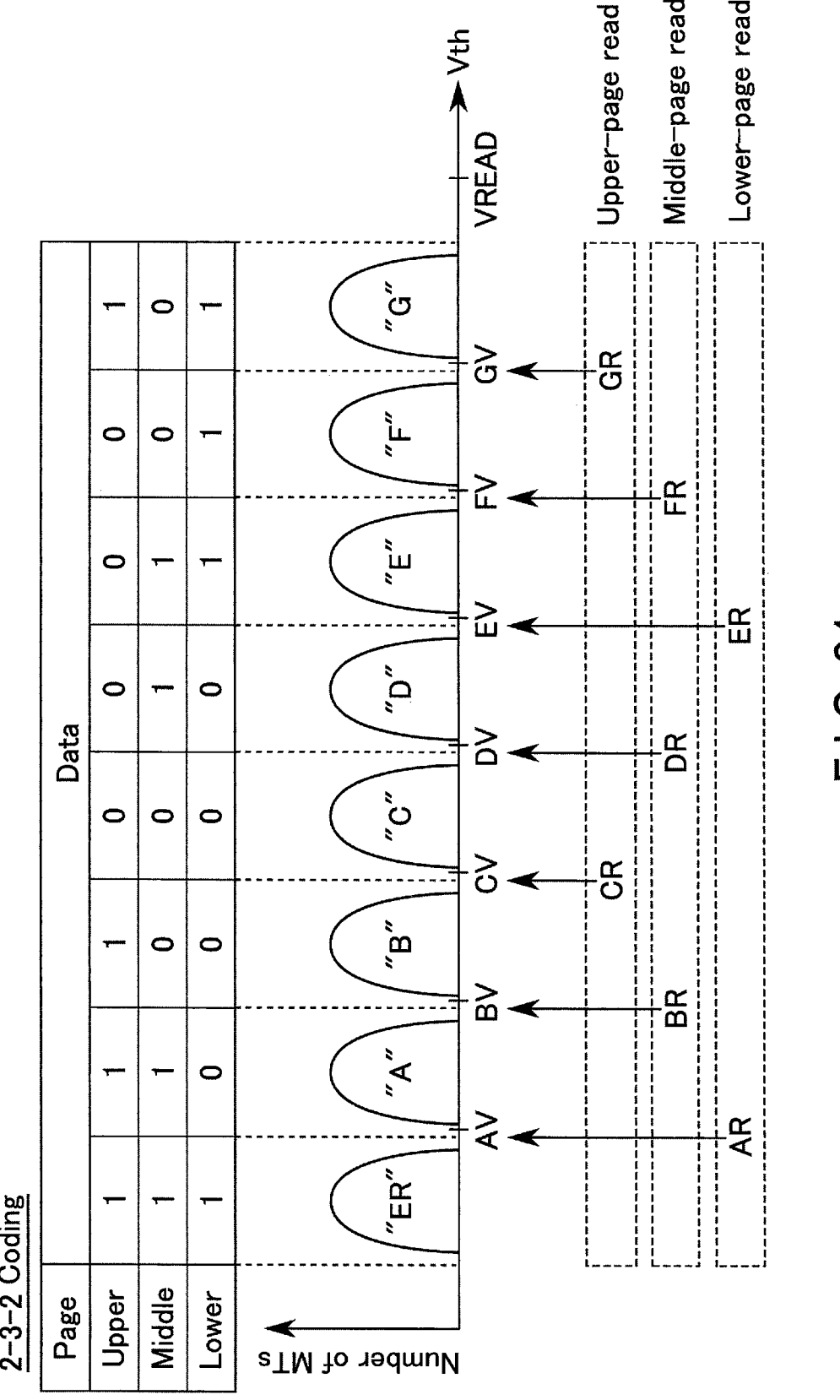
F I G. 24

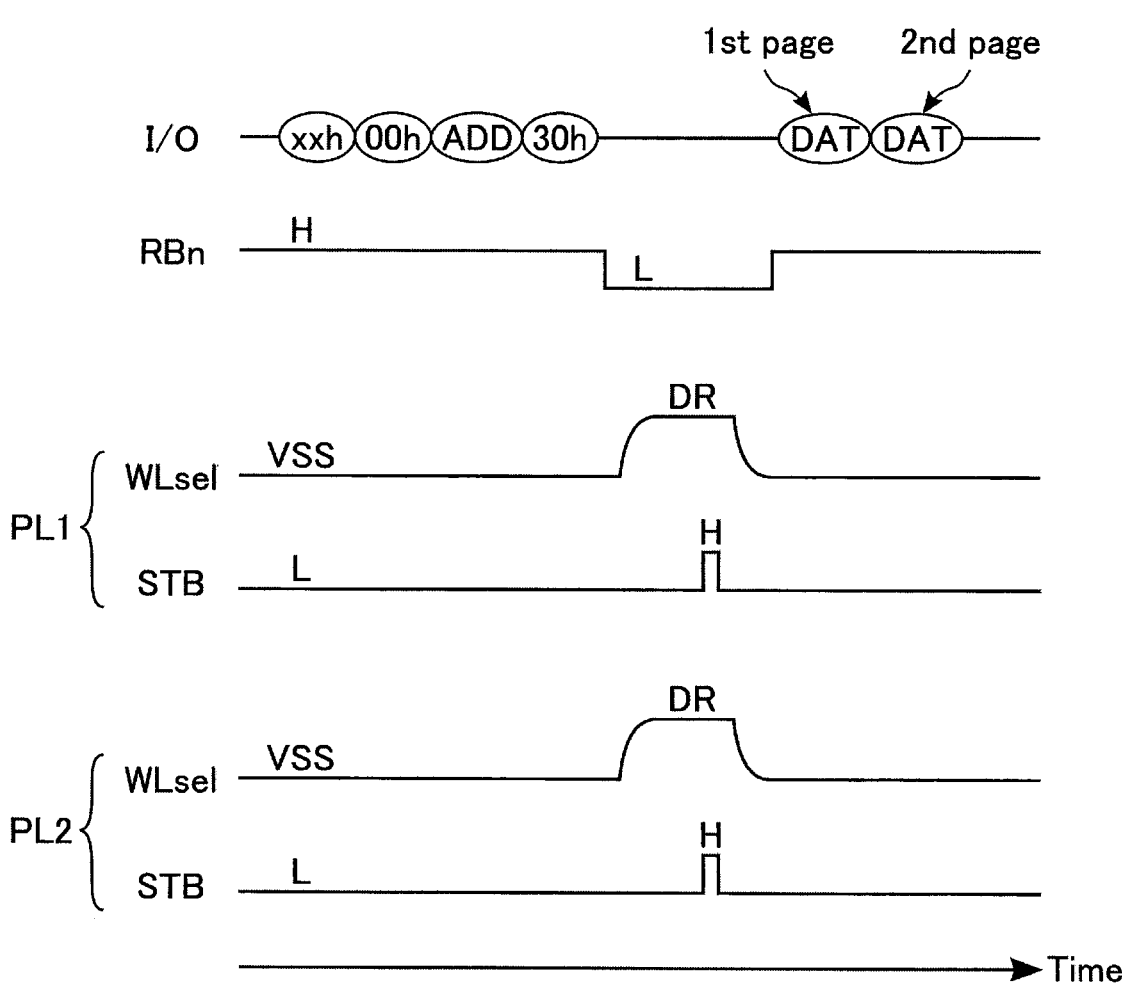
Sequential read: 1st & 2nd pages (Second embodiment)
F I G. 25

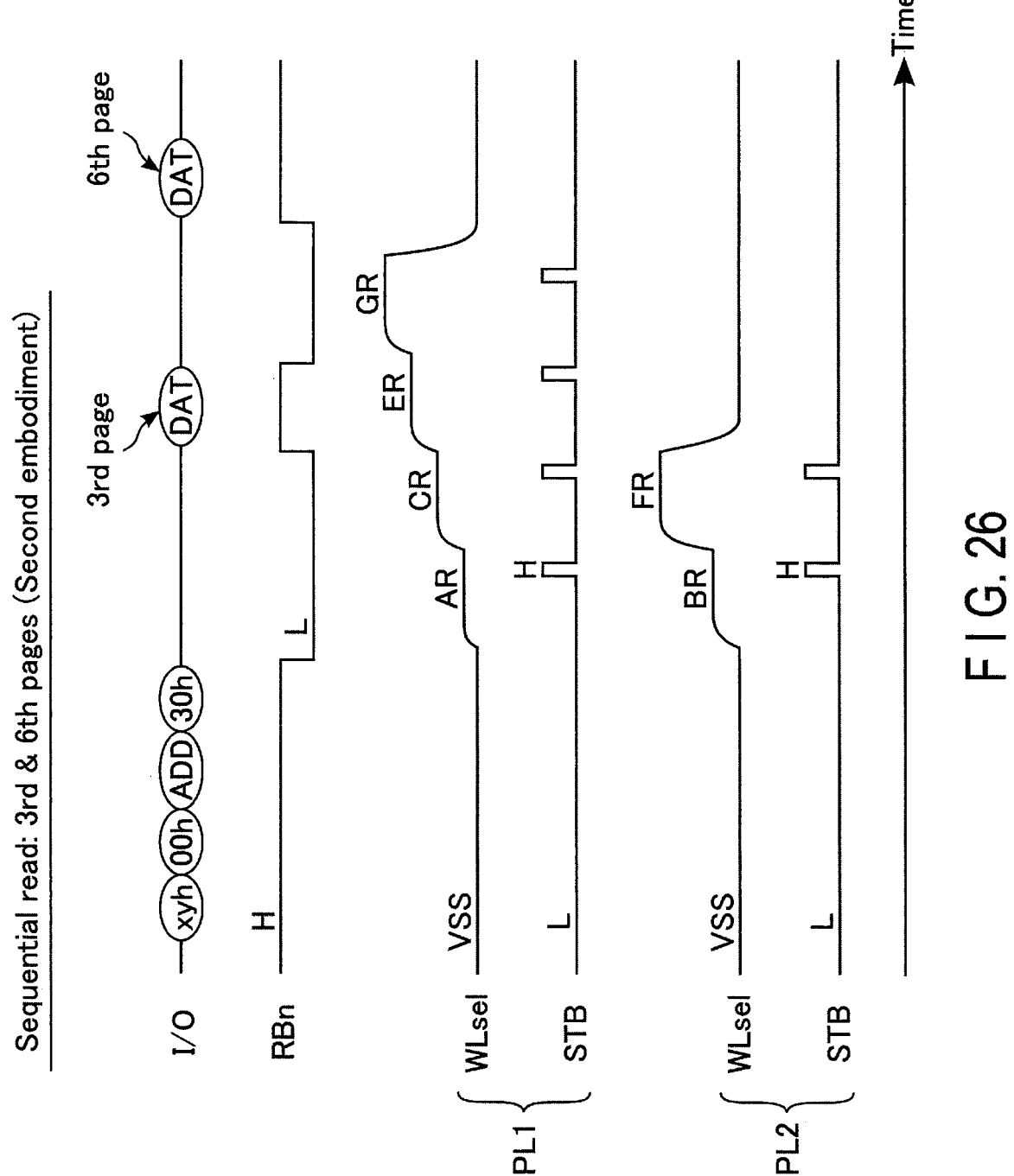
F I G. 26

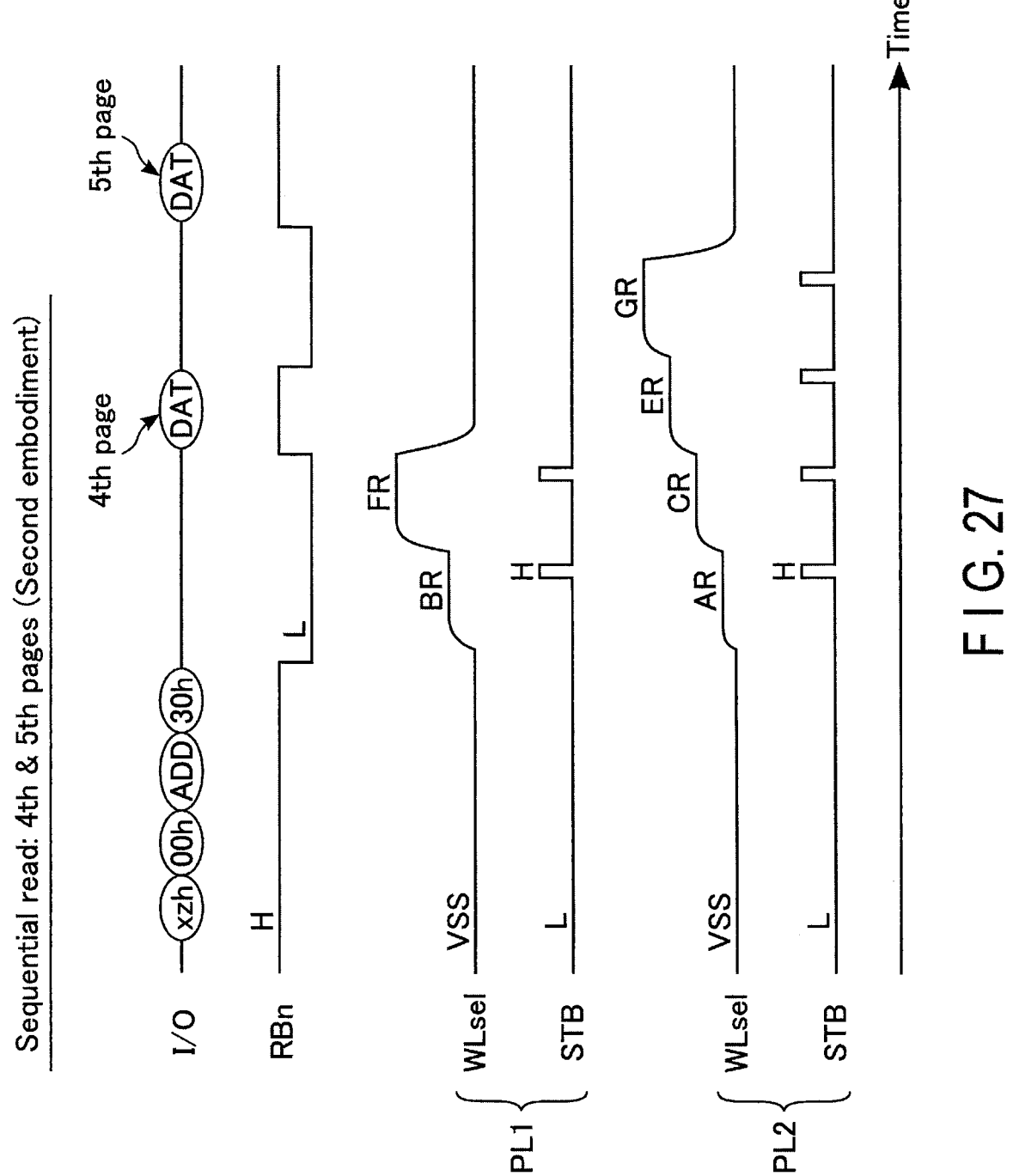
F I G. 27

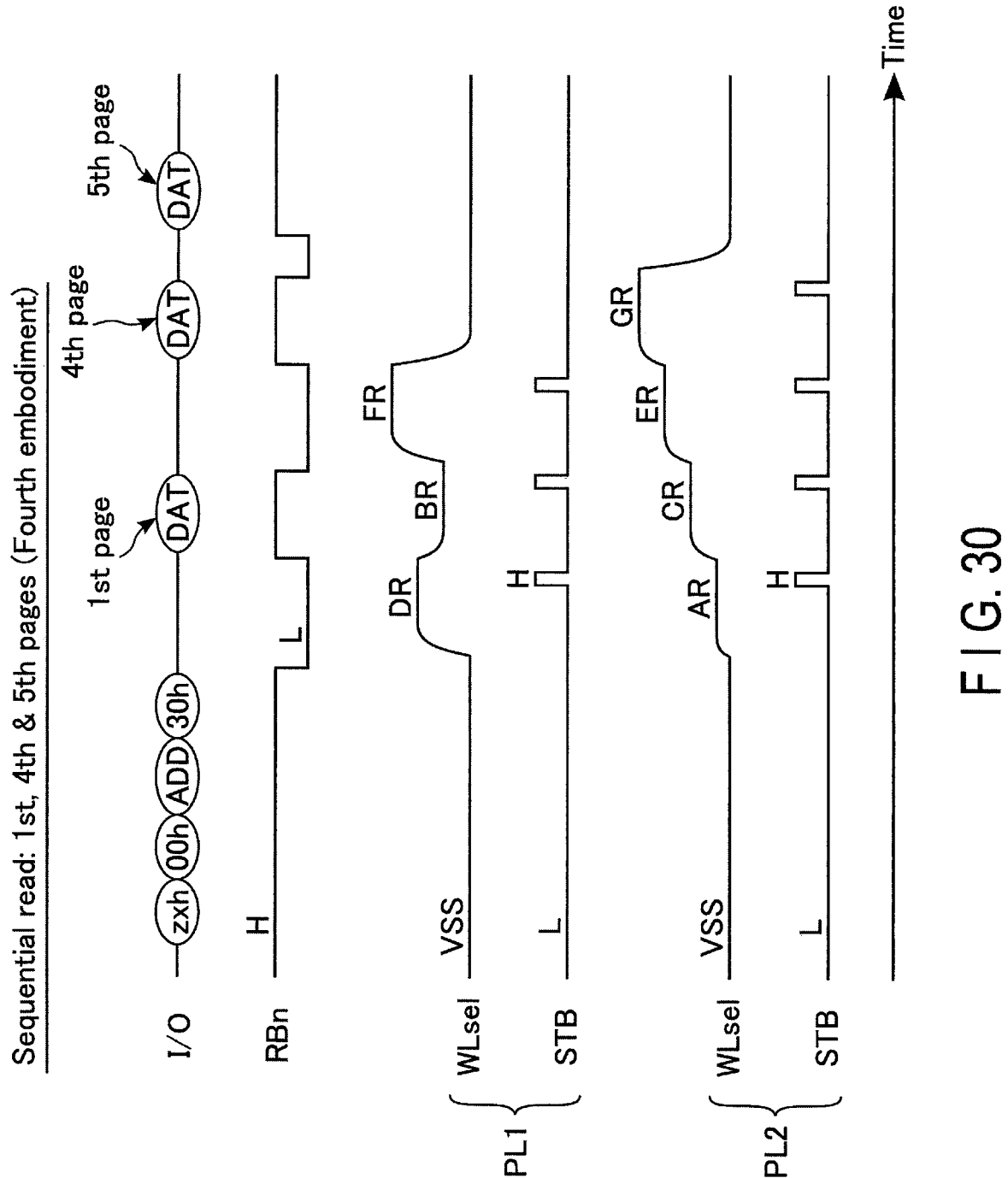
F I G. 30

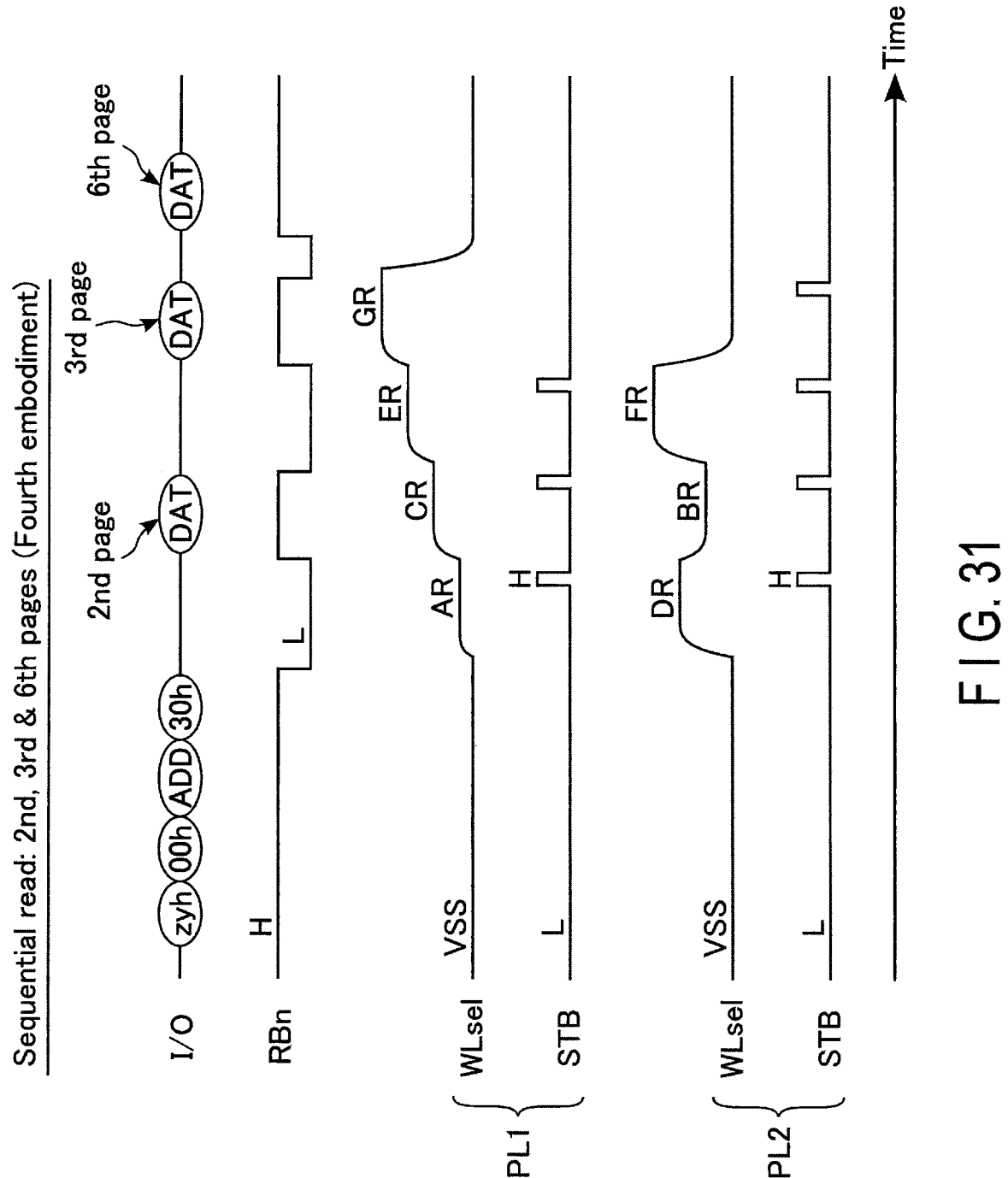
F I G. 31

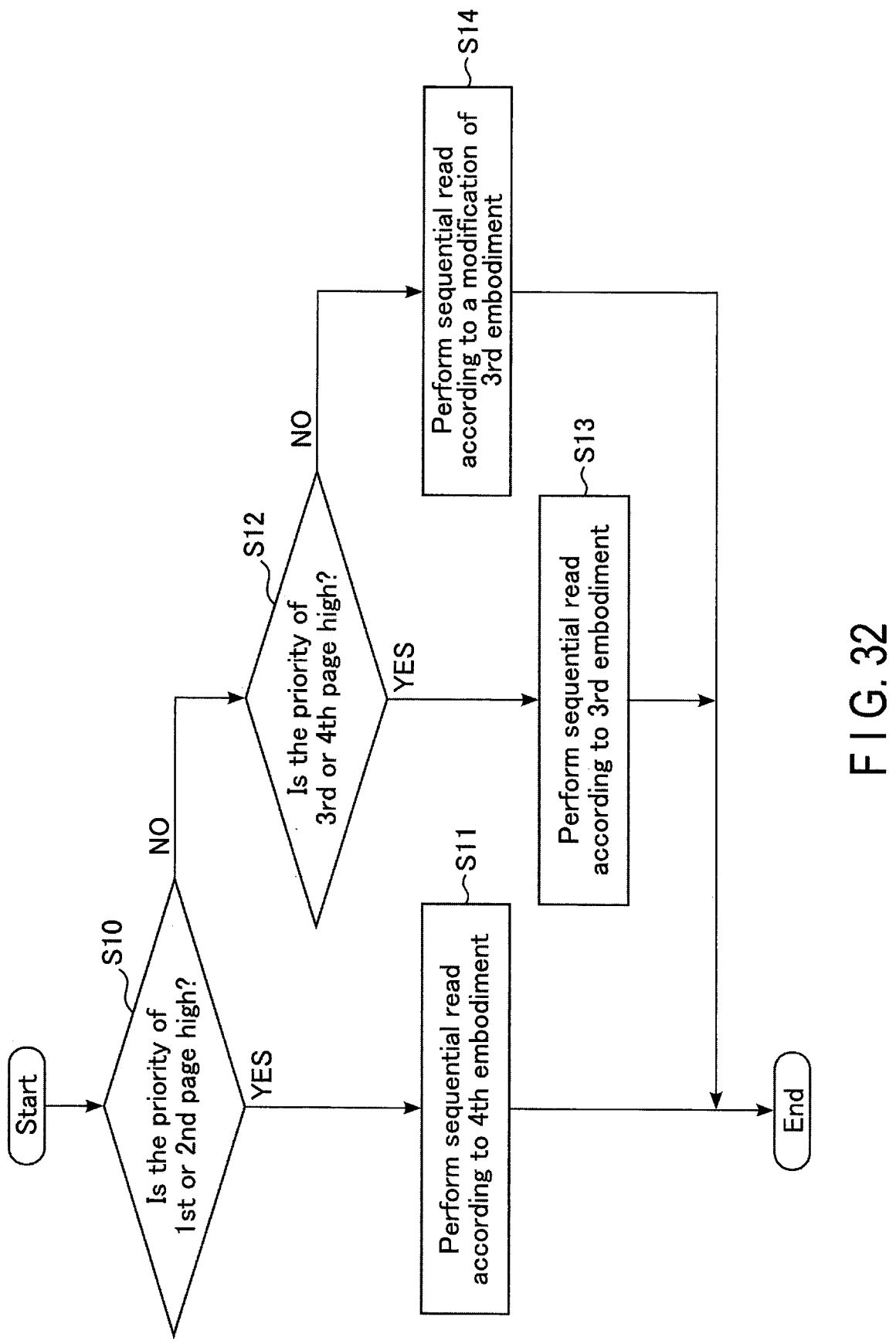
F I G. 32

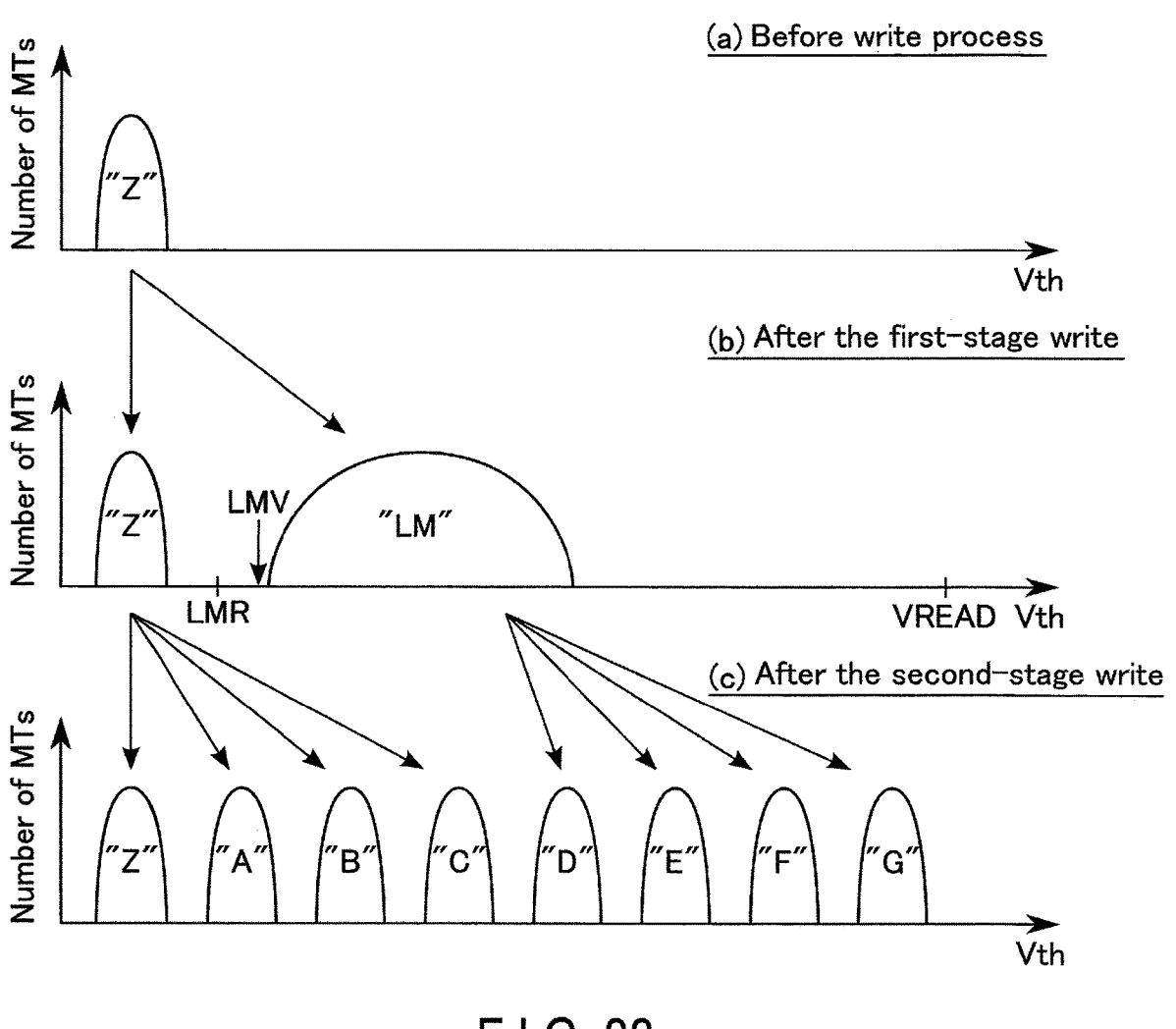
F I G. 33

Data allocation: 1st-stage write (Sixth embodiment)

| | Vth of memory cells | | Data | |
|---|---|---|---|---|
| | Plane PL1 | Plane PL2 | 1st page | 2nd page |
| (1) | Z | Z | 1 | 1 |
| (2) | Z | LM | 1 | 0 |
| (3) | LM | Z | 0 | 1 |
| (4) | LM | LM | 0 | 0 |

F I G. 34

First-stage write (Sixth embodiment)
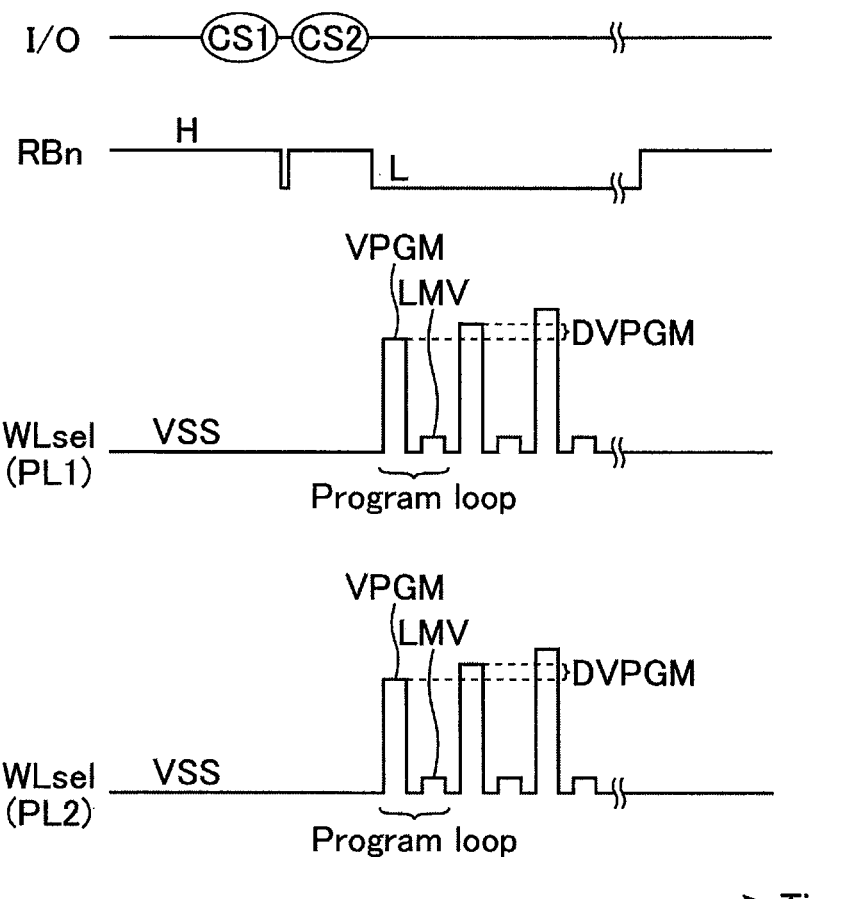
F I G. 35

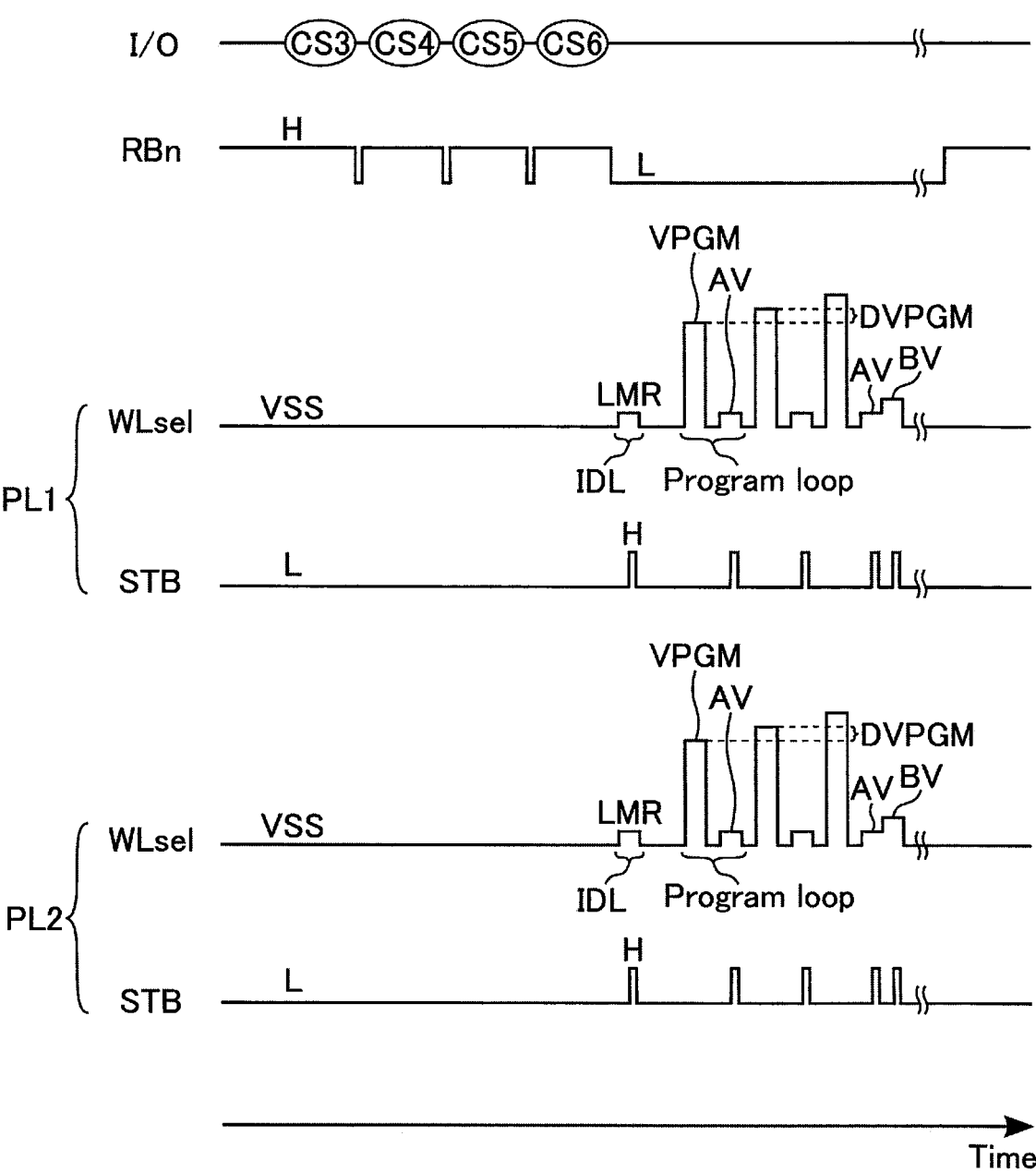
F I G. 36

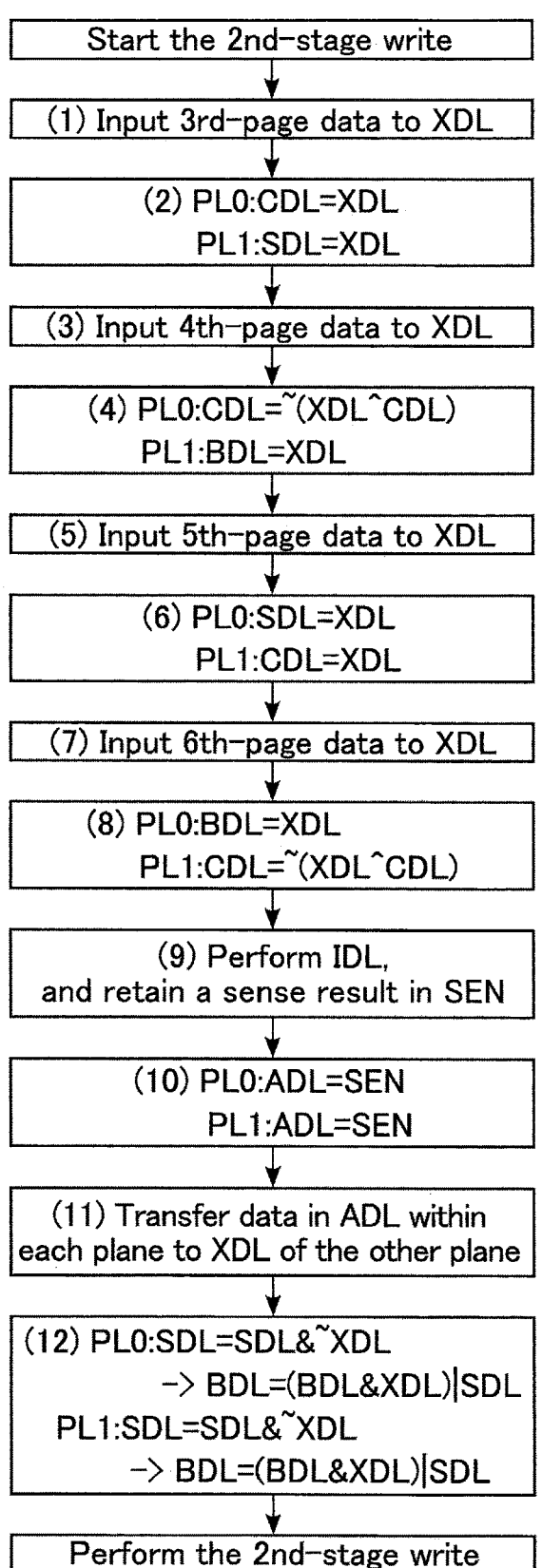
F I G. 37

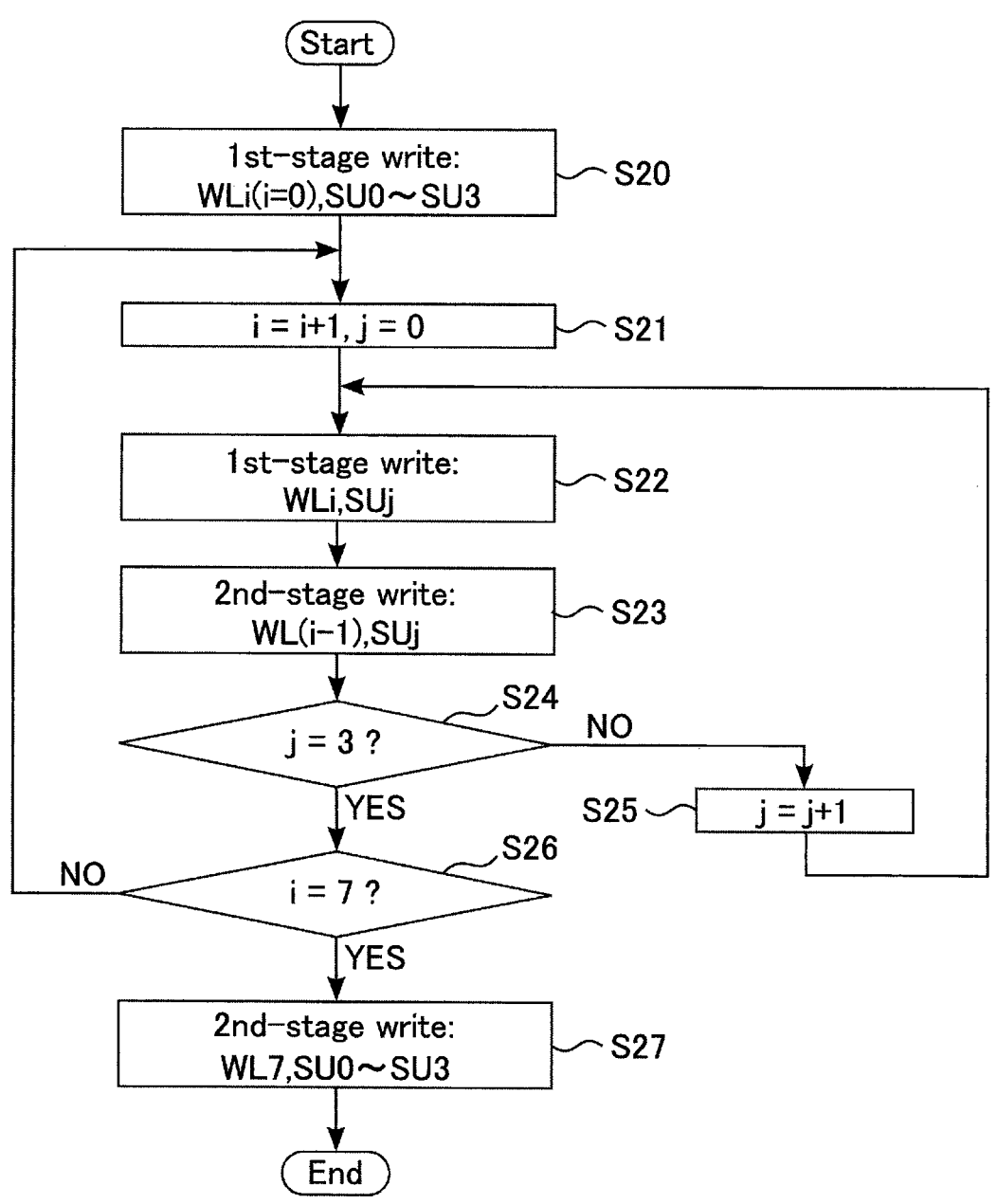
F I G. 38

Data allocation(1/2) (Seventh embodiment)

| | Vth of memory cells | | Data | | | | | |
|---|---|---|---|---|---|---|---|---|
| | 1st plane | 2nd plane | 1st page | 2nd page | 3rd page | 4th page | 5th page | 6th page |
| (1) | Z | Z | 1 | 1 | 0 | 0 | 0 | 0 |
| (2) | Z | A | 1 | 1 | 1 | 0 | 0 | 0 |
| (3) | Z | B | 1 | 0 | 1 | 0 | 0 | 0 |
| (4) | Z | C | 1 | 0 | 1 | 0 | 1 | 0 |
| (5) | Z | D | 1 | 0 | 1 | 1 | 1 | 1 |
| (6) | Z | E | 1 | 0 | 0 | 1 | 1 | 1 |
| (7) | Z | F | 1 | 1 | 0 | 1 | 1 | 1 |
| (8) | Z | G | 1 | 1 | 0 | 1 | 0 | 1 |
| (9) | A | Z | 1 | 1 | 0 | 1 | 0 | 0 |
| (10) | A | A | 1 | 1 | 1 | 1 | 0 | 0 |
| (11) | A | B | 1 | 0 | 1 | 1 | 0 | 0 |
| (12) | A | C | 1 | 0 | 1 | 1 | 1 | 0 |
| (13) | A | D | 1 | 0 | 1 | 0 | 1 | 1 |
| (14) | A | E | 1 | 0 | 0 | 0 | 1 | 1 |
| (15) | A | F | 1 | 1 | 0 | 0 | 1 | 1 |
| (16) | A | G | 1 | 1 | 0 | 0 | 0 | 1 |
| (17) | B | Z | 0 | 1 | 0 | 1 | 0 | 0 |
| (18) | B | A | 0 | 1 | 1 | 1 | 0 | 0 |
| (19) | B | B | 0 | 0 | 1 | 1 | 0 | 0 |
| (20) | B | C | 0 | 0 | 1 | 1 | 1 | 0 |
| (21) | B | D | 0 | 0 | 1 | 0 | 1 | 1 |
| (22) | B | E | 0 | 0 | 0 | 0 | 1 | 1 |
| (23) | B | F | 0 | 1 | 0 | 0 | 1 | 1 |
| (24) | B | G | 0 | 1 | 0 | 0 | 0 | 1 |
| (25) | C | Z | 0 | 1 | 0 | 1 | 0 | 1 |
| (26) | C | A | 0 | 1 | 1 | 1 | 0 | 1 |
| (27) | C | B | 0 | 0 | 1 | 1 | 0 | 1 |
| (28) | C | C | 0 | 0 | 1 | 1 | 1 | 1 |
| (29) | C | D | 0 | 0 | 1 | 0 | 1 | 0 |
| (30) | C | E | 0 | 0 | 0 | 0 | 1 | 0 |
| (31) | C | F | 0 | 1 | 0 | 0 | 1 | 0 |
| (32) | C | G | 0 | 1 | 0 | 0 | 0 | 0 |

F I G. 39

Data allocation(2/2) (Seventh embodiment)

| | Vth of memory cells | | Data | | | | | |
|---|---|---|---|---|---|---|---|---|
| | 1st plane | 2nd plane | 1st page | 2nd page | 3rd page | 4th page | 5th page | 6th page |
| (33) | D | Z | 0 | 1 | 1 | 1 | 1 | 1 |
| (34) | D | A | 0 | 1 | 0 | 1 | 1 | 1 |
| (35) | D | B | 0 | 0 | 0 | 1 | 1 | 1 |
| (36) | D | C | 0 | 0 | 0 | 1 | 0 | 1 |
| (37) | D | D | 0 | 0 | 0 | 0 | 0 | 0 |
| (38) | D | E | 0 | 0 | 1 | 0 | 0 | 0 |
| (39) | D | F | 0 | 1 | 1 | 0 | 0 | 0 |
| (40) | D | G | 0 | 1 | 1 | 0 | 1 | 0 |
| (41) | E | Z | 0 | 1 | 1 | 1 | 1 | 0 |
| (42) | E | A | 0 | 1 | 0 | 1 | 1 | 0 |
| (43) | E | B | 0 | 0 | 0 | 1 | 1 | 0 |
| (44) | E | C | 0 | 0 | 0 | 1 | 0 | 0 |
| (45) | E | D | 0 | 0 | 0 | 0 | 0 | 1 |
| (46) | E | E | 0 | 0 | 1 | 0 | 0 | 1 |
| (47) | E | F | 0 | 1 | 1 | 0 | 0 | 1 |
| (48) | E | G | 0 | 1 | 1 | 0 | 1 | 1 |
| (49) | F | Z | 1 | 1 | 1 | 1 | 1 | 0 |
| (50) | F | A | 1 | 1 | 0 | 1 | 1 | 0 |
| (51) | F | B | 1 | 0 | 0 | 1 | 1 | 0 |
| (52) | F | C | 1 | 0 | 0 | 1 | 0 | 0 |
| (53) | F | D | 1 | 0 | 0 | 0 | 0 | 1 |
| (54) | F | E | 1 | 0 | 1 | 0 | 0 | 1 |
| (55) | F | F | 1 | 1 | 1 | 0 | 0 | 1 |
| (56) | F | G | 1 | 1 | 1 | 0 | 1 | 1 |
| (57) | G | Z | 1 | 1 | 1 | 0 | 1 | 0 |
| (58) | G | A | 1 | 1 | 0 | 0 | 1 | 0 |
| (59) | G | B | 1 | 0 | 0 | 0 | 1 | 0 |
| (60) | G | C | 1 | 0 | 0 | 0 | 0 | 0 |
| (61) | G | D | 1 | 0 | 0 | 1 | 0 | 1 |
| (62) | G | E | 1 | 0 | 1 | 1 | 0 | 1 |
| (63) | G | F | 1 | 1 | 1 | 1 | 0 | 1 |
| (64) | G | G | 1 | 1 | 1 | 1 | 1 | 1 |

F I G. 40

Data definitions (Seventh embodiment)

| Read operation | Read voltages | | Read data | | | |
|---|---|---|---|---|---|---|
| | PL1 | PL2 | PL1:PL2 (0:0) | PL1:PL2 (1:0) | PL1:PL2 (0:1) | PL1:PL2 (1:1) |
| 1st page | BR,FR | ‐ | 0 | 1 | 0 | 1 |
| 2nd page | ‐ | BR,FR | 0 | 0 | 1 | 1 |
| 3rd page | DR | AR,ER | 0 | 1 | 1 | 0 |
| 4th page | AR,GR | DR | 0 | 1 | 1 | 0 |
| 5th page | DR | CR,GR | 0 | 1 | 1 | 0 |
| 6th page | CR,ER | DR | 0 | 1 | 1 | 0 |

F I G. 41

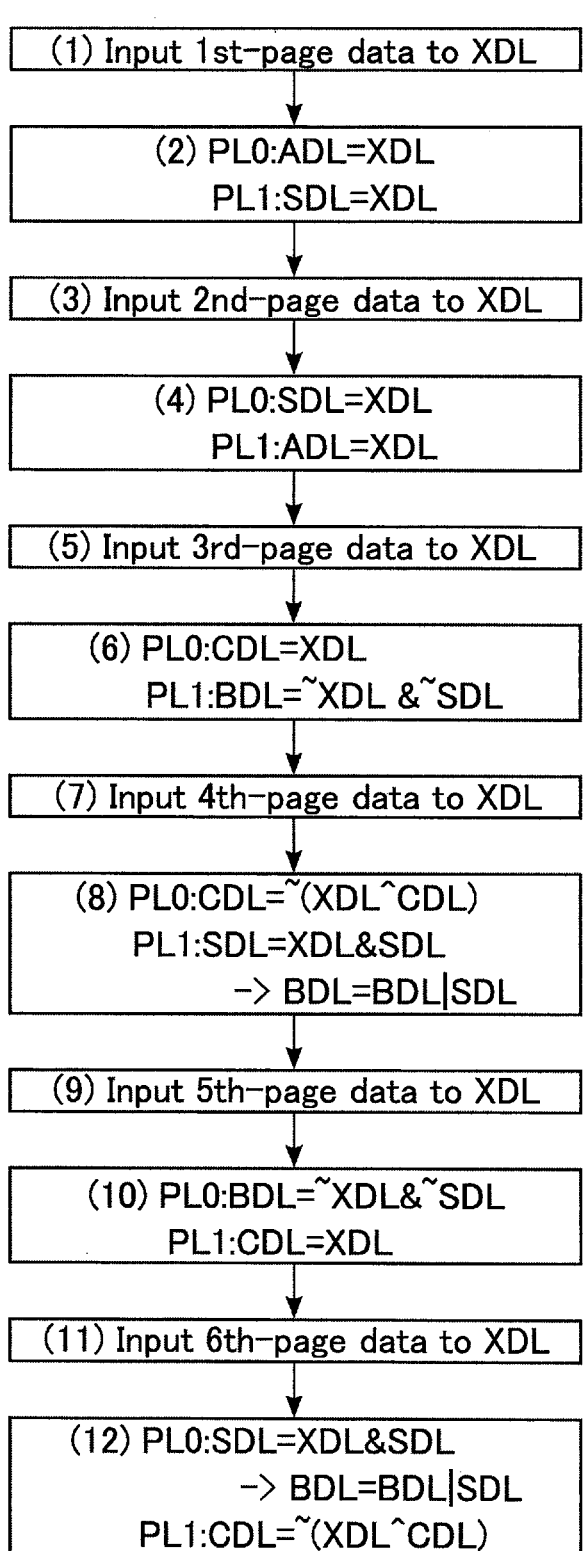
(1) Input 1st-page data to XDL
(2) PL0:ADL=XDL
PL1:SDL=XDL
(3) Input 2nd-page data to XDL
(4) PL0:SDL=XDL
PL1:ADL=XDL
(5) Input 3rd-page data to XDL
(6) PL0:CDL=XDL
PL1:BDL=~XDL &~SDL
(7) Input 4th-page data to XDL
(8) PL0:CDL=~(XDL^CDL)
PL1:SDL=XDL&SDL
-> BDL=BDL|SDL
(9) Input 5th-page data to XDL
(10) PL0:BDL=~XDL&~SDL
PL1:CDL=XDL
(11) Input 6th-page data to XDL
(12) PL0:SDL=XDL&SDL
-> BDL=BDL|SDL
PL1:CDL=~(XDL^CDL)
F I G. 42

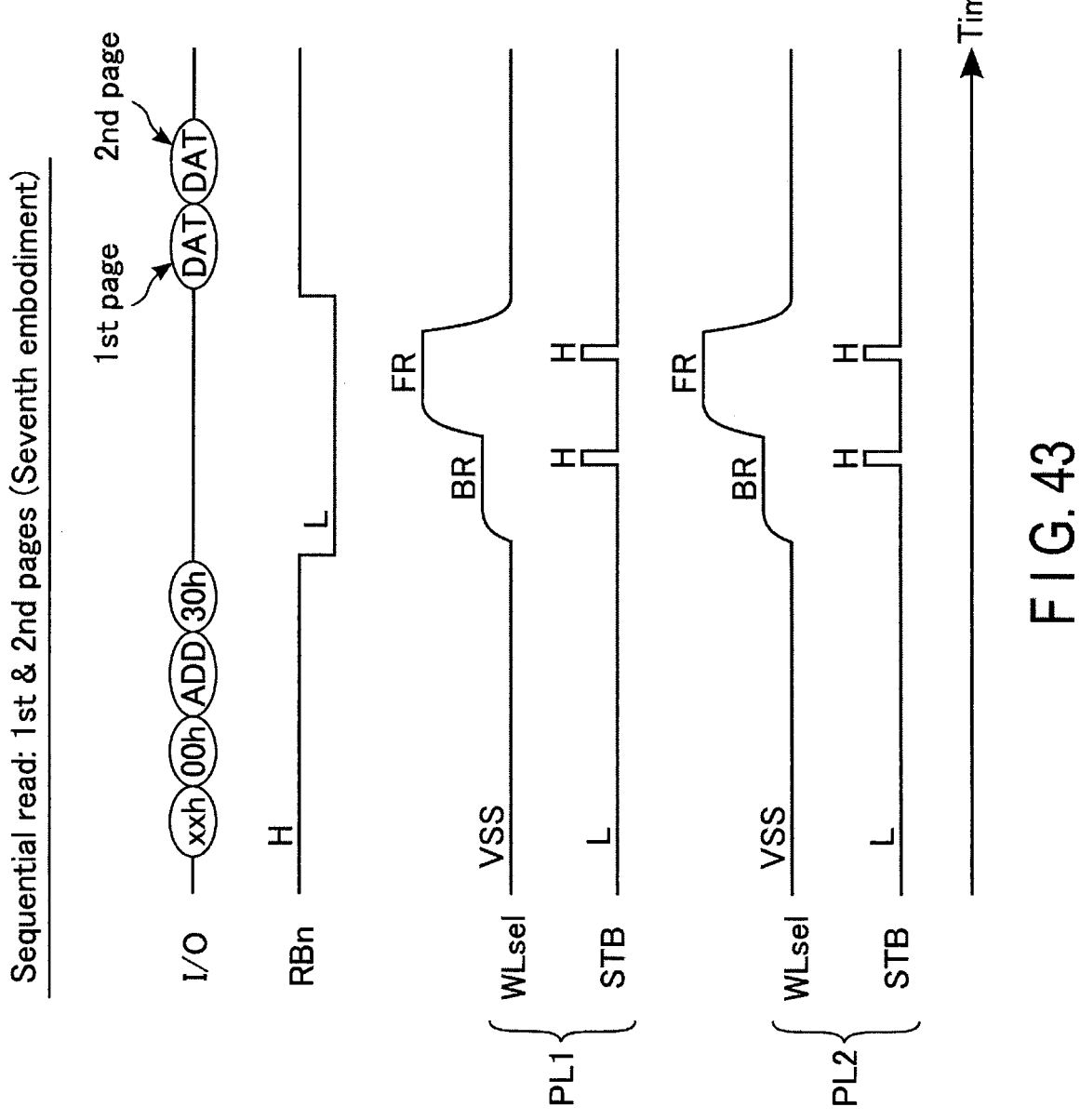
F I G. 43

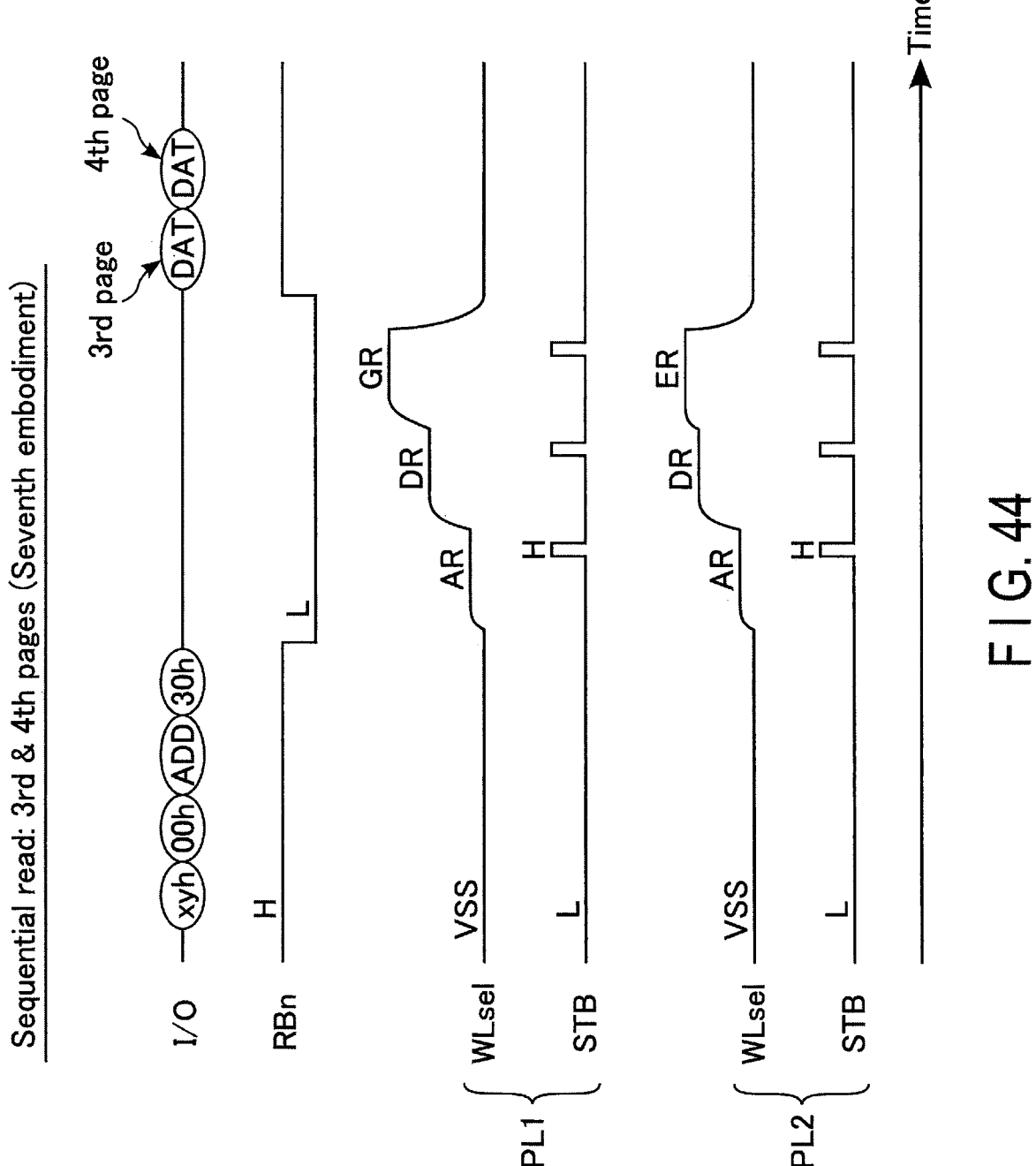
F I G. 44

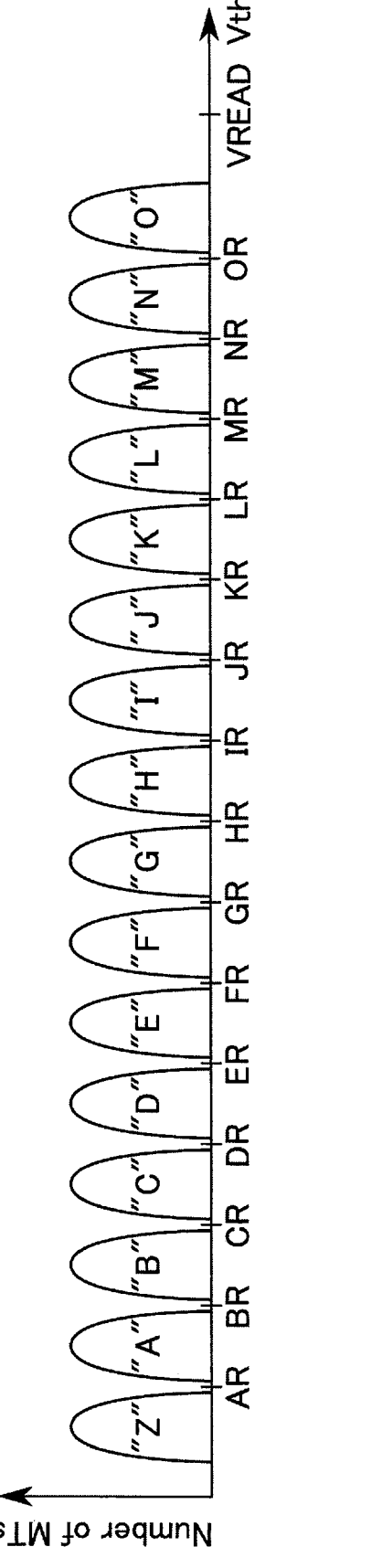
F I G. 46

Data allocation(1/8) (Eighth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (1) | Z | Z | 1 | 1 | 1 | 1 | 0 | 0 | 0 | 0 |
| (2) | Z | A | 1 | 1 | 1 | 1 | 0 | 1 | 0 | 0 |
| (3) | Z | B | 1 | 1 | 1 | 1 | 1 | 1 | 1 | 0 |
| (4) | Z | C | 1 | 1 | 1 | 1 | 1 | 0 | 1 | 0 |
| (5) | Z | D | 1 | 1 | 1 | 0 | 1 | 0 | 1 | 0 |
| (6) | Z | E | 1 | 1 | 1 | 0 | 1 | 0 | 1 | 1 |
| (7) | Z | F | 1 | 1 | 1 | 0 | 0 | 0 | 0 | 1 |
| (8) | Z | G | 1 | 1 | 1 | 0 | 0 | 0 | 0 | 0 |
| (9) | Z | H | 1 | 0 | 1 | 0 | 0 | 0 | 0 | 0 |
| (10) | Z | I | 1 | 0 | 1 | 0 | 0 | 1 | 0 | 0 |
| (11) | Z | J | 1 | 0 | 1 | 0 | 1 | 1 | 1 | 0 |
| (12) | Z | K | 1 | 0 | 1 | 0 | 1 | 0 | 1 | 0 |
| (13) | Z | L | 1 | 0 | 1 | 1 | 1 | 0 | 1 | 0 |
| (14) | Z | M | 1 | 0 | 1 | 1 | 1 | 0 | 1 | 1 |
| (15) | Z | N | 1 | 0 | 1 | 1 | 0 | 0 | 0 | 1 |
| (16) | Z | O | 1 | 0 | 1 | 1 | 0 | 0 | 0 | 0 |
| (17) | A | Z | 1 | 1 | 1 | 1 | 1 | 0 | 0 | 0 |
| (18) | A | A | 1 | 1 | 1 | 1 | 1 | 1 | 0 | 0 |
| (19) | A | B | 1 | 1 | 1 | 1 | 0 | 1 | 1 | 0 |
| (20) | A | C | 1 | 1 | 1 | 1 | 0 | 0 | 1 | 0 |
| (21) | A | D | 1 | 1 | 1 | 0 | 0 | 0 | 1 | 0 |
| (22) | A | E | 1 | 1 | 1 | 0 | 0 | 0 | 1 | 1 |
| (23) | A | F | 1 | 1 | 1 | 0 | 1 | 0 | 0 | 1 |
| (24) | A | G | 1 | 1 | 1 | 0 | 1 | 0 | 0 | 0 |
| (25) | A | H | 1 | 0 | 1 | 0 | 1 | 0 | 0 | 0 |
| (26) | A | I | 1 | 0 | 1 | 0 | 1 | 1 | 0 | 0 |
| (27) | A | J | 1 | 0 | 1 | 0 | 0 | 1 | 1 | 0 |
| (28) | A | K | 1 | 0 | 1 | 0 | 0 | 0 | 1 | 0 |
| (29) | A | L | 1 | 0 | 1 | 1 | 0 | 0 | 1 | 0 |
| (30) | A | M | 1 | 0 | 1 | 1 | 0 | 0 | 1 | 1 |
| (31) | A | N | 1 | 0 | 1 | 1 | 1 | 0 | 0 | 1 |
| (32) | A | O | 1 | 0 | 1 | 1 | 1 | 0 | 0 | 0 |

F I G. 47

Data allocation(2/8) (Eighth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (33) | B | Z | 1 | 1 | 1 | 1 | 1 | 1 | 0 | 1 |
| (34) | B | A | 1 | 1 | 1 | 1 | 1 | 0 | 0 | 1 |
| (35) | B | B | 1 | 1 | 1 | 1 | 0 | 0 | 1 | 1 |
| (36) | B | C | 1 | 1 | 1 | 1 | 0 | 1 | 1 | 1 |
| (37) | B | D | 1 | 1 | 1 | 0 | 0 | 1 | 1 | 1 |
| (38) | B | E | 1 | 1 | 1 | 0 | 0 | 1 | 1 | 0 |
| (39) | B | F | 1 | 1 | 1 | 0 | 1 | 1 | 0 | 0 |
| (40) | B | G | 1 | 1 | 1 | 0 | 1 | 1 | 0 | 1 |
| (41) | B | H | 1 | 0 | 1 | 0 | 1 | 1 | 0 | 1 |
| (42) | B | I | 1 | 0 | 1 | 0 | 1 | 0 | 0 | 1 |
| (43) | B | J | 1 | 0 | 1 | 0 | 0 | 0 | 1 | 1 |
| (44) | B | K | 1 | 0 | 1 | 0 | 0 | 1 | 1 | 1 |
| (45) | B | L | 1 | 0 | 1 | 1 | 0 | 1 | 1 | 1 |
| (46) | B | M | 1 | 0 | 1 | 1 | 0 | 1 | 1 | 0 |
| (47) | B | N | 1 | 0 | 1 | 1 | 1 | 1 | 0 | 0 |
| (48) | B | O | 1 | 0 | 1 | 1 | 1 | 1 | 0 | 1 |
| (49) | C | Z | 1 | 1 | 1 | 1 | 0 | 1 | 0 | 1 |
| (50) | C | A | 1 | 1 | 1 | 1 | 0 | 0 | 0 | 1 |
| (51) | C | B | 1 | 1 | 1 | 1 | 1 | 0 | 1 | 1 |
| (52) | C | C | 1 | 1 | 1 | 1 | 1 | 1 | 1 | 1 |
| (53) | C | D | 1 | 1 | 1 | 0 | 1 | 1 | 1 | 1 |
| (54) | C | E | 1 | 1 | 1 | 0 | 1 | 1 | 1 | 0 |
| (55) | C | F | 1 | 1 | 1 | 0 | 0 | 1 | 0 | 0 |
| (56) | C | G | 1 | 1 | 1 | 0 | 0 | 1 | 0 | 1 |
| (57) | C | H | 1 | 0 | 1 | 0 | 0 | 1 | 0 | 1 |
| (58) | C | I | 1 | 0 | 1 | 0 | 0 | 0 | 0 | 1 |
| (59) | C | J | 1 | 0 | 1 | 0 | 1 | 0 | 1 | 1 |
| (60) | C | K | 1 | 0 | 1 | 0 | 1 | 1 | 1 | 1 |
| (61) | C | L | 1 | 0 | 1 | 1 | 1 | 1 | 1 | 1 |
| (62) | C | M | 1 | 0 | 1 | 1 | 1 | 1 | 1 | 0 |
| (63) | C | N | 1 | 0 | 1 | 1 | 0 | 1 | 0 | 0 |
| (64) | C | O | 1 | 0 | 1 | 1 | 0 | 1 | 0 | 1 |

F I G. 48

Data allocation(3/8) (Eighth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (65) | D | Z | 1 | 1 | 0 | 1 | 0 | 1 | 0 | 1 |
| (66) | D | A | 1 | 1 | 0 | 1 | 0 | 0 | 0 | 1 |
| (67) | D | B | 1 | 1 | 0 | 1 | 1 | 0 | 1 | 1 |
| (68) | D | C | 1 | 1 | 0 | 1 | 1 | 1 | 1 | 1 |
| (69) | D | D | 1 | 1 | 0 | 0 | 1 | 1 | 1 | 1 |
| (70) | D | E | 1 | 1 | 0 | 0 | 1 | 1 | 1 | 0 |
| (71) | D | F | 1 | 1 | 0 | 0 | 0 | 1 | 0 | 0 |
| (72) | D | G | 1 | 1 | 0 | 0 | 0 | 1 | 0 | 1 |
| (73) | D | H | 1 | 0 | 0 | 0 | 0 | 1 | 0 | 1 |
| (74) | D | I | 1 | 0 | 0 | 0 | 0 | 0 | 0 | 1 |
| (75) | D | J | 1 | 0 | 0 | 0 | 1 | 0 | 1 | 1 |
| (76) | D | K | 1 | 0 | 0 | 0 | 1 | 1 | 1 | 1 |
| (77) | D | L | 1 | 0 | 0 | 1 | 1 | 1 | 1 | 1 |
| (78) | D | M | 1 | 0 | 0 | 1 | 1 | 1 | 1 | 0 |
| (79) | D | N | 1 | 0 | 0 | 1 | 0 | 1 | 0 | 0 |
| (80) | D | O | 1 | 0 | 0 | 1 | 0 | 1 | 0 | 1 |
| (81) | E | Z | 1 | 1 | 0 | 1 | 0 | 1 | 1 | 1 |
| (82) | E | A | 1 | 1 | 0 | 1 | 0 | 0 | 1 | 1 |
| (83) | E | B | 1 | 1 | 0 | 1 | 1 | 0 | 0 | 1 |
| (84) | E | C | 1 | 1 | 0 | 1 | 1 | 1 | 0 | 1 |
| (85) | E | D | 1 | 1 | 0 | 0 | 1 | 1 | 0 | 1 |
| (86) | E | E | 1 | 1 | 0 | 0 | 1 | 1 | 0 | 0 |
| (87) | E | F | 1 | 1 | 0 | 0 | 0 | 1 | 1 | 0 |
| (88) | E | G | 1 | 1 | 0 | 0 | 0 | 1 | 1 | 1 |
| (89) | E | H | 1 | 0 | 0 | 0 | 0 | 1 | 1 | 1 |
| (90) | E | I | 1 | 0 | 0 | 0 | 0 | 0 | 1 | 1 |
| (91) | E | J | 1 | 0 | 0 | 0 | 1 | 0 | 0 | 1 |
| (92) | E | K | 1 | 0 | 0 | 0 | 1 | 1 | 0 | 1 |
| (93) | E | L | 1 | 0 | 0 | 1 | 1 | 1 | 0 | 1 |
| (94) | E | M | 1 | 0 | 0 | 1 | 1 | 1 | 0 | 0 |
| (95) | E | N | 1 | 0 | 0 | 1 | 0 | 1 | 1 | 0 |
| (96) | E | O | 1 | 0 | 0 | 1 | 0 | 1 | 1 | 1 |

F I G. 49

Data allocation(4/8) (Eighth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (97) | F | Z | 1 | 1 | 0 | 1 | 0 | 0 | 1 | 0 |
| (98) | F | A | 1 | 1 | 0 | 1 | 0 | 1 | 1 | 0 |
| (99) | F | B | 1 | 1 | 0 | 1 | 1 | 1 | 0 | 0 |
| (100) | F | C | 1 | 1 | 0 | 1 | 1 | 0 | 0 | 0 |
| (101) | F | D | 1 | 1 | 0 | 0 | 1 | 0 | 0 | 0 |
| (102) | F | E | 1 | 1 | 0 | 0 | 1 | 0 | 0 | 1 |
| (103) | F | F | 1 | 1 | 0 | 0 | 0 | 0 | 1 | 1 |
| (104) | F | G | 1 | 1 | 0 | 0 | 0 | 0 | 1 | 0 |
| (105) | F | H | 1 | 0 | 0 | 0 | 0 | 0 | 1 | 0 |
| (106) | F | I | 1 | 0 | 0 | 0 | 0 | 1 | 1 | 0 |
| (107) | F | J | 1 | 0 | 0 | 0 | 1 | 1 | 0 | 0 |
| (108) | F | K | 1 | 0 | 0 | 0 | 1 | 0 | 0 | 0 |
| (109) | F | L | 1 | 0 | 0 | 1 | 1 | 0 | 0 | 0 |
| (110) | F | M | 1 | 0 | 0 | 1 | 1 | 0 | 0 | 1 |
| (111) | F | N | 1 | 0 | 0 | 1 | 0 | 0 | 1 | 1 |
| (112) | F | O | 1 | 0 | 0 | 1 | 0 | 0 | 1 | 0 |
| (113) | G | Z | 1 | 1 | 0 | 1 | 0 | 0 | 0 | 0 |
| (114) | G | A | 1 | 1 | 0 | 1 | 0 | 1 | 0 | 0 |
| (115) | G | B | 1 | 1 | 0 | 1 | 1 | 1 | 1 | 0 |
| (116) | G | C | 1 | 1 | 0 | 1 | 1 | 0 | 1 | 0 |
| (117) | G | D | 1 | 1 | 0 | 0 | 1 | 0 | 1 | 0 |
| (118) | G | E | 1 | 1 | 0 | 0 | 1 | 0 | 1 | 1 |
| (119) | G | F | 1 | 1 | 0 | 0 | 0 | 0 | 0 | 1 |
| (120) | G | G | 1 | 1 | 0 | 0 | 0 | 0 | 0 | 0 |
| (121) | G | H | 1 | 0 | 0 | 0 | 0 | 0 | 0 | 0 |
| (122) | G | I | 1 | 0 | 0 | 0 | 0 | 1 | 0 | 0 |
| (123) | G | J | 1 | 0 | 0 | 0 | 1 | 1 | 1 | 0 |
| (124) | G | K | 1 | 0 | 0 | 0 | 1 | 0 | 1 | 0 |
| (125) | G | L | 1 | 0 | 0 | 1 | 1 | 0 | 1 | 0 |
| (126) | G | M | 1 | 0 | 0 | 1 | 1 | 0 | 1 | 1 |
| (127) | G | N | 1 | 0 | 0 | 1 | 0 | 0 | 0 | 1 |
| (128) | G | O | 1 | 0 | 0 | 1 | 0 | 0 | 0 | 0 |

F I G. 50

Data allocation(5/8) (Eighth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (129) | H | Z | 0 | 1 | 0 | 1 | 0 | 0 | 0 | 0 |
| (130) | H | A | 0 | 1 | 0 | 1 | 0 | 1 | 0 | 0 |
| (131) | H | B | 0 | 1 | 0 | 1 | 1 | 1 | 1 | 0 |
| (132) | H | C | 0 | 1 | 0 | 1 | 1 | 0 | 1 | 0 |
| (133) | H | D | 0 | 1 | 0 | 0 | 1 | 0 | 1 | 0 |
| (134) | H | E | 0 | 1 | 0 | 0 | 1 | 0 | 1 | 1 |
| (135) | H | F | 0 | 1 | 0 | 0 | 0 | 0 | 0 | 1 |
| (136) | H | G | 0 | 1 | 0 | 0 | 0 | 0 | 0 | 0 |
| (137) | H | H | 0 | 0 | 0 | 0 | 0 | 0 | 0 | 0 |
| (138) | H | I | 0 | 0 | 0 | 0 | 0 | 1 | 0 | 0 |
| (139) | H | J | 0 | 0 | 0 | 0 | 1 | 1 | 1 | 0 |
| (140) | H | K | 0 | 0 | 0 | 0 | 1 | 0 | 1 | 0 |
| (141) | H | L | 0 | 0 | 0 | 1 | 1 | 0 | 1 | 0 |
| (142) | H | M | 0 | 0 | 0 | 1 | 1 | 0 | 1 | 1 |
| (143) | H | N | 0 | 0 | 0 | 1 | 0 | 0 | 0 | 1 |
| (144) | H | O | 0 | 0 | 0 | 1 | 0 | 0 | 0 | 0 |
| (145) | I | Z | 0 | 1 | 0 | 1 | 0 | 0 | 1 | 0 |
| (146) | I | A | 0 | 1 | 0 | 1 | 0 | 1 | 1 | 0 |
| (147) | I | B | 0 | 1 | 0 | 1 | 1 | 1 | 0 | 0 |
| (148) | I | C | 0 | 1 | 0 | 1 | 1 | 0 | 0 | 0 |
| (149) | I | D | 0 | 1 | 0 | 0 | 1 | 0 | 0 | 0 |
| (150) | I | E | 0 | 1 | 0 | 0 | 1 | 0 | 0 | 1 |
| (151) | I | F | 0 | 1 | 0 | 0 | 0 | 0 | 1 | 1 |
| (152) | I | G | 0 | 1 | 0 | 0 | 0 | 0 | 1 | 0 |
| (153) | I | H | 0 | 0 | 0 | 0 | 0 | 0 | 1 | 0 |
| (154) | I | I | 0 | 0 | 0 | 0 | 0 | 1 | 1 | 0 |
| (155) | I | J | 0 | 0 | 0 | 0 | 1 | 1 | 0 | 0 |
| (156) | I | K | 0 | 0 | 0 | 0 | 1 | 0 | 0 | 0 |
| (157) | I | L | 0 | 0 | 0 | 1 | 1 | 0 | 0 | 0 |
| (158) | I | M | 0 | 0 | 0 | 1 | 1 | 0 | 0 | 1 |
| (159) | I | N | 0 | 0 | 0 | 1 | 0 | 0 | 1 | 1 |
| (160) | I | O | 0 | 0 | 0 | 1 | 0 | 0 | 1 | 0 |

F I G. 51

Data allocation(6/8) (Eighth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (161) | J | Z | 0 | 1 | 0 | 1 | 0 | 1 | 1 | 1 |
| (162) | J | A | 0 | 1 | 0 | 1 | 0 | 0 | 1 | 1 |
| (163) | J | B | 0 | 1 | 0 | 1 | 1 | 0 | 0 | 1 |
| (164) | J | C | 0 | 1 | 0 | 1 | 1 | 1 | 0 | 1 |
| (165) | J | D | 0 | 1 | 0 | 0 | 1 | 1 | 0 | 1 |
| (166) | J | E | 0 | 1 | 0 | 0 | 1 | 1 | 0 | 0 |
| (167) | J | F | 0 | 1 | 0 | 0 | 0 | 1 | 1 | 0 |
| (168) | J | G | 0 | 1 | 0 | 0 | 0 | 1 | 1 | 1 |
| (169) | J | H | 0 | 0 | 0 | 0 | 0 | 1 | 1 | 1 |
| (170) | J | I | 0 | 0 | 0 | 0 | 0 | 0 | 1 | 1 |
| (171) | J | J | 0 | 0 | 0 | 0 | 1 | 0 | 0 | 1 |
| (172) | J | K | 0 | 0 | 0 | 0 | 1 | 1 | 0 | 1 |
| (173) | J | L | 0 | 0 | 0 | 1 | 1 | 1 | 0 | 1 |
| (174) | J | M | 0 | 0 | 0 | 1 | 1 | 1 | 0 | 0 |
| (175) | J | N | 0 | 0 | 0 | 1 | 0 | 1 | 1 | 0 |
| (176) | J | O | 0 | 0 | 0 | 1 | 0 | 1 | 1 | 1 |
| (177) | K | Z | 0 | 1 | 0 | 1 | 0 | 1 | 0 | 1 |
| (178) | K | A | 0 | 1 | 0 | 1 | 0 | 0 | 0 | 1 |
| (179) | K | B | 0 | 1 | 0 | 1 | 1 | 0 | 1 | 1 |
| (180) | K | C | 0 | 1 | 0 | 1 | 1 | 1 | 1 | 1 |
| (181) | K | D | 0 | 1 | 0 | 0 | 1 | 1 | 1 | 1 |
| (182) | K | E | 0 | 1 | 0 | 0 | 1 | 1 | 1 | 0 |
| (183) | K | F | 0 | 1 | 0 | 0 | 0 | 1 | 0 | 0 |
| (184) | K | G | 0 | 1 | 0 | 0 | 0 | 1 | 0 | 1 |
| (185) | K | H | 0 | 0 | 0 | 0 | 0 | 1 | 0 | 1 |
| (186) | K | I | 0 | 0 | 0 | 0 | 0 | 0 | 0 | 1 |
| (187) | K | J | 0 | 0 | 0 | 0 | 1 | 0 | 1 | 1 |
| (188) | K | K | 0 | 0 | 0 | 0 | 1 | 1 | 1 | 1 |
| (189) | K | L | 0 | 0 | 0 | 1 | 1 | 1 | 1 | 1 |
| (190) | K | M | 0 | 0 | 0 | 1 | 1 | 1 | 1 | 0 |
| (191) | K | N | 0 | 0 | 0 | 1 | 0 | 1 | 0 | 0 |
| (192) | K | O | 0 | 0 | 0 | 1 | 0 | 1 | 0 | 1 |

F I G. 52

Data allocation(7/8) (Eighth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (193) | L | Z | 0 | 1 | 1 | 1 | 0 | 1 | 0 | 1 |
| (194) | L | A | 0 | 1 | 1 | 1 | 0 | 0 | 0 | 1 |
| (195) | L | B | 0 | 1 | 1 | 1 | 1 | 0 | 1 | 1 |
| (196) | L | C | 0 | 1 | 1 | 1 | 1 | 1 | 1 | 1 |
| (197) | L | D | 0 | 1 | 1 | 0 | 1 | 1 | 1 | 1 |
| (198) | L | E | 0 | 1 | 1 | 0 | 1 | 1 | 1 | 0 |
| (199) | L | F | 0 | 1 | 1 | 0 | 0 | 1 | 0 | 0 |
| (200) | L | G | 0 | 1 | 1 | 0 | 0 | 1 | 0 | 1 |
| (201) | L | H | 0 | 0 | 1 | 0 | 0 | 1 | 0 | 1 |
| (202) | L | I | 0 | 0 | 1 | 0 | 0 | 0 | 0 | 1 |
| (203) | L | J | 0 | 0 | 1 | 0 | 1 | 0 | 1 | 1 |
| (204) | L | K | 0 | 0 | 1 | 0 | 1 | 1 | 1 | 1 |
| (205) | L | L | 0 | 0 | 1 | 1 | 1 | 1 | 1 | 1 |
| (206) | L | M | 0 | 0 | 1 | 1 | 1 | 1 | 1 | 0 |
| (207) | L | N | 0 | 0 | 1 | 1 | 0 | 1 | 0 | 0 |
| (208) | L | O | 0 | 0 | 1 | 1 | 0 | 1 | 0 | 1 |
| (209) | M | Z | 0 | 1 | 1 | 1 | 1 | 1 | 0 | 1 |
| (210) | M | A | 0 | 1 | 1 | 1 | 1 | 0 | 0 | 1 |
| (211) | M | B | 0 | 1 | 1 | 1 | 0 | 0 | 1 | 1 |
| (212) | M | C | 0 | 1 | 1 | 1 | 0 | 1 | 1 | 1 |
| (213) | M | D | 0 | 1 | 1 | 0 | 0 | 1 | 1 | 1 |
| (214) | M | E | 0 | 1 | 1 | 0 | 0 | 1 | 1 | 0 |
| (215) | M | F | 0 | 1 | 1 | 0 | 1 | 1 | 0 | 0 |
| (216) | M | G | 0 | 1 | 1 | 0 | 1 | 1 | 0 | 1 |
| (217) | M | H | 0 | 0 | 1 | 0 | 1 | 1 | 0 | 1 |
| (218) | M | I | 0 | 0 | 1 | 0 | 1 | 0 | 0 | 1 |
| (219) | M | J | 0 | 0 | 1 | 0 | 0 | 0 | 1 | 1 |
| (220) | M | K | 0 | 0 | 1 | 0 | 0 | 1 | 1 | 1 |
| (221) | M | L | 0 | 0 | 1 | 1 | 0 | 1 | 1 | 1 |
| (222) | M | M | 0 | 0 | 1 | 1 | 0 | 1 | 1 | 0 |
| (223) | M | N | 0 | 0 | 1 | 1 | 1 | 1 | 0 | 0 |
| (224) | M | O | 0 | 0 | 1 | 1 | 1 | 1 | 0 | 1 |

F I G. 53

Data allocation(8/8) (Eighth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (225) | N | Z | 0 | 1 | 1 | 1 | 1 | 0 | 0 | 0 |
| (226) | N | A | 0 | 1 | 1 | 1 | 1 | 1 | 0 | 0 |
| (227) | N | B | 0 | 1 | 1 | 1 | 0 | 1 | 1 | 0 |
| (228) | N | C | 0 | 1 | 1 | 1 | 0 | 0 | 1 | 0 |
| (229) | N | D | 0 | 1 | 1 | 0 | 0 | 0 | 1 | 0 |
| (230) | N | E | 0 | 1 | 1 | 0 | 0 | 0 | 1 | 1 |
| (231) | N | F | 0 | 1 | 1 | 0 | 1 | 0 | 0 | 1 |
| (232) | N | G | 0 | 1 | 1 | 0 | 1 | 0 | 0 | 0 |
| (233) | N | H | 0 | 0 | 1 | 0 | 1 | 0 | 0 | 0 |
| (234) | N | I | 0 | 0 | 1 | 0 | 1 | 1 | 0 | 0 |
| (235) | N | J | 0 | 0 | 1 | 0 | 0 | 1 | 1 | 0 |
| (236) | N | K | 0 | 0 | 1 | 0 | 0 | 0 | 1 | 0 |
| (237) | N | L | 0 | 0 | 1 | 1 | 0 | 0 | 1 | 0 |
| (238) | N | M | 0 | 0 | 1 | 1 | 0 | 0 | 1 | 1 |
| (239) | N | N | 0 | 0 | 1 | 1 | 1 | 0 | 0 | 1 |
| (240) | N | O | 0 | 0 | 1 | 1 | 1 | 0 | 0 | 0 |
| (241) | O | Z | 0 | 1 | 1 | 1 | 0 | 0 | 0 | 0 |
| (242) | O | A | 0 | 1 | 1 | 1 | 0 | 1 | 0 | 0 |
| (243) | O | B | 0 | 1 | 1 | 1 | 1 | 1 | 1 | 0 |
| (244) | O | C | 0 | 1 | 1 | 1 | 1 | 0 | 1 | 0 |
| (245) | O | D | 0 | 1 | 1 | 0 | 1 | 0 | 1 | 0 |
| (246) | O | E | 0 | 1 | 1 | 0 | 1 | 0 | 1 | 1 |
| (247) | O | F | 0 | 1 | 1 | 0 | 0 | 0 | 0 | 1 |
| (248) | O | G | 0 | 1 | 1 | 0 | 0 | 0 | 0 | 0 |
| (249) | O | H | 0 | 0 | 1 | 0 | 0 | 0 | 0 | 0 |
| (250) | O | I | 0 | 0 | 1 | 0 | 0 | 1 | 0 | 0 |
| (251) | O | J | 0 | 0 | 1 | 0 | 1 | 1 | 1 | 0 |
| (252) | O | K | 0 | 0 | 1 | 0 | 1 | 0 | 1 | 0 |
| (253) | O | L | 0 | 0 | 1 | 1 | 1 | 0 | 1 | 0 |
| (254) | O | M | 0 | 0 | 1 | 1 | 1 | 0 | 1 | 1 |
| (255) | O | N | 0 | 0 | 1 | 1 | 0 | 0 | 0 | 1 |
| (256) | O | O | 0 | 0 | 1 | 1 | 0 | 0 | 0 | 0 |

F I G. 54

Data definitions (Eighth embodiment)

| Read operation | Read voltages | | Read data | | | |
| --- | --- | --- | --- | --- | --- | --- |
| | PL1 | PL2 | PL1:PL2 (0:0) | PL1:PL2 (1:0) | PL1:PL2 (0:1) | PL1:PL2 (1:1) |
| 1st page | HR | – | 0 | 1 | 0 | 1 |
| 2nd page | – | HR | 0 | 0 | 1 | 1 |
| 3rd page | DR,LR | – | 0 | 1 | 0 | 1 |
| 4th page | – | DR,LR | 0 | 0 | 1 | 1 |
| 5th page | AR,CR,MR,OR | BR,FR,JR,NR | 0 | 1 | 1 | 0 |
| 6th page | BR,FR,JR,NR | AR,CR,IR,KR | 0 | 1 | 1 | 0 |
| 7th page | ER,GR,IR,KR | BR,FR,JR,NR | 0 | 1 | 1 | 0 |
| 8th page | BR,FR,JR,NR | ER,GR,MR,OR | 0 | 1 | 1 | 0 |

F I G. 55

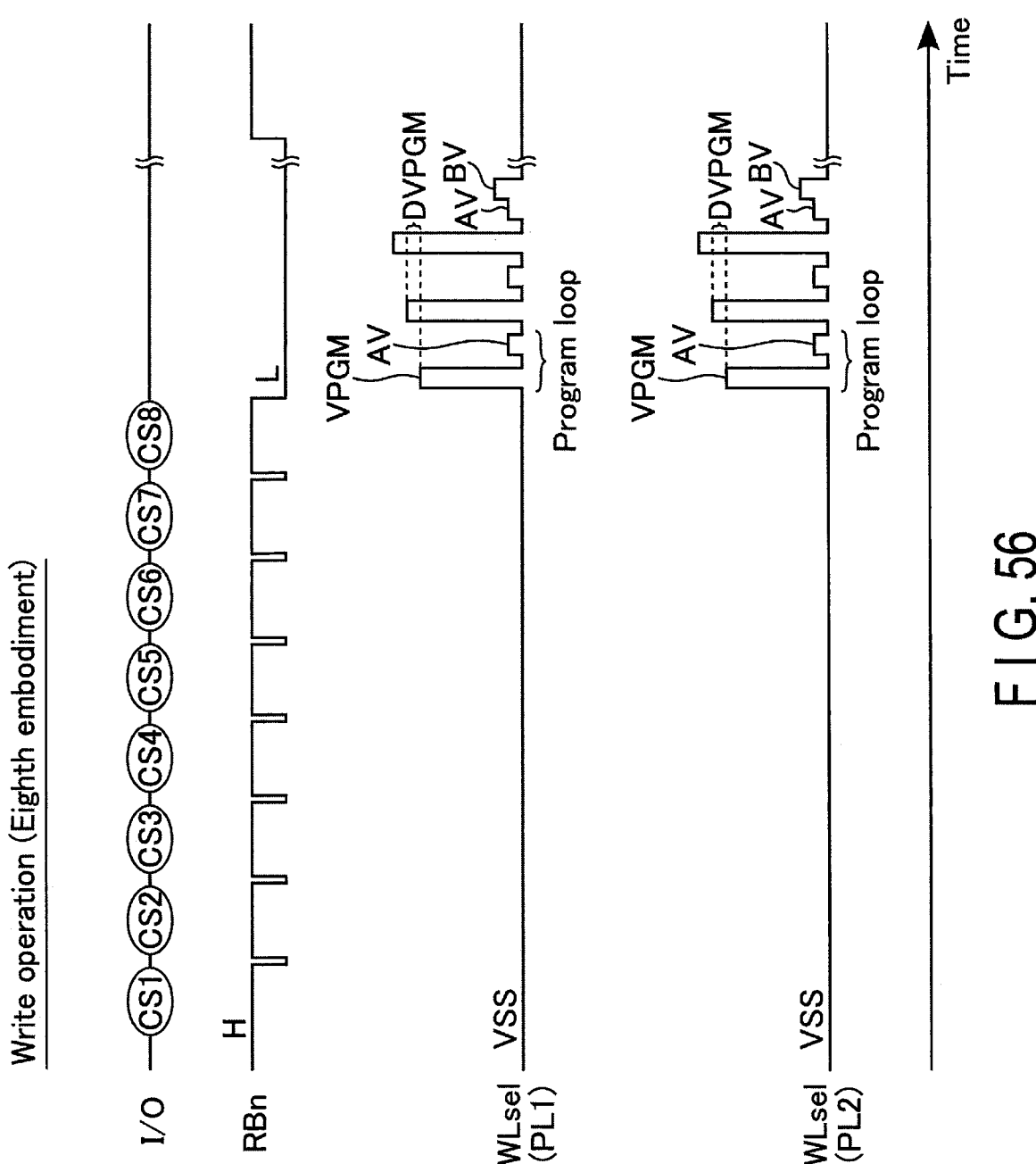
F I G. 56

First-page read (Eighth embodiment)
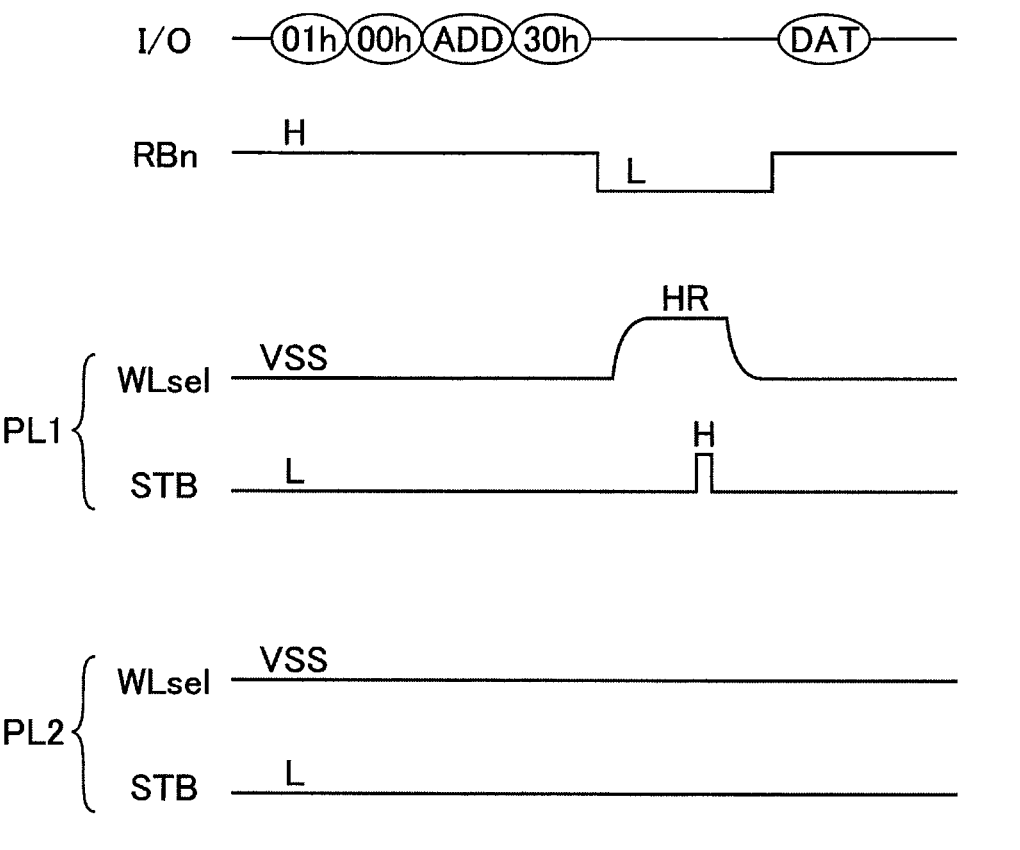
F I G. 58

Second-page read (Eighth embodiment)
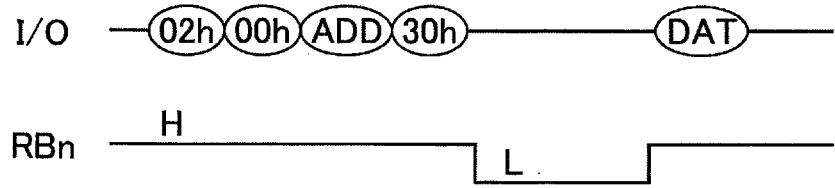
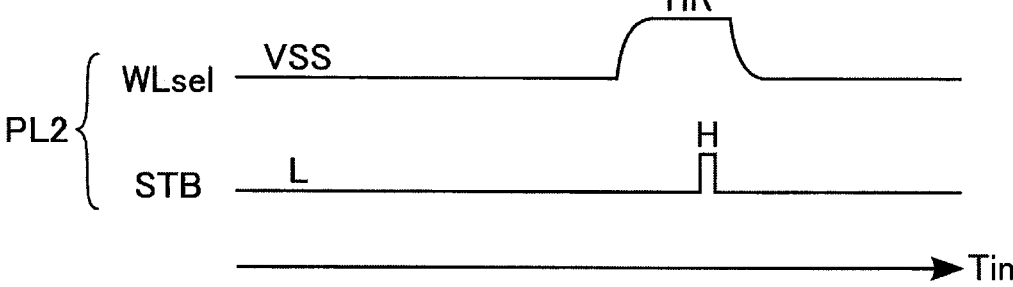
F I G. 59

Third-page read (Eighth embodiment)
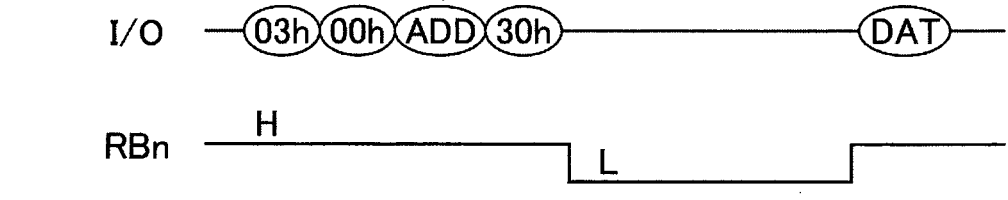
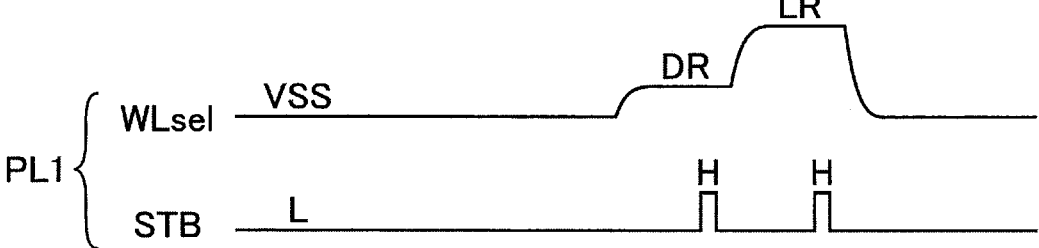
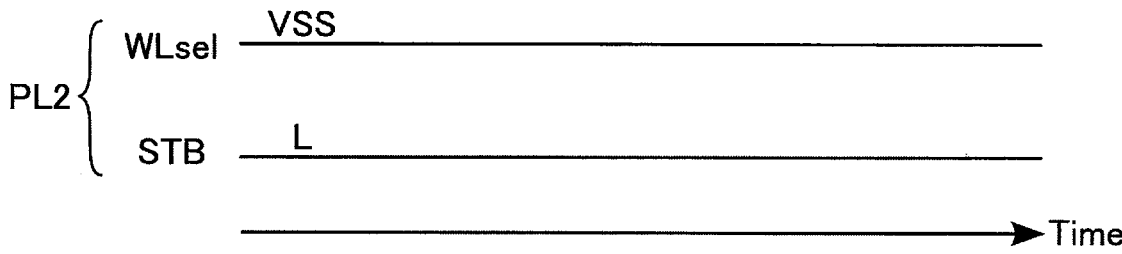
F I G. 60

Fourth-page read (Eighth embodiment)
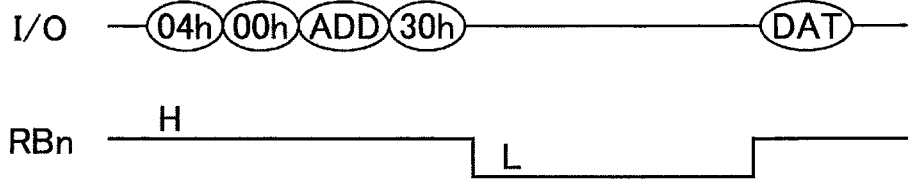
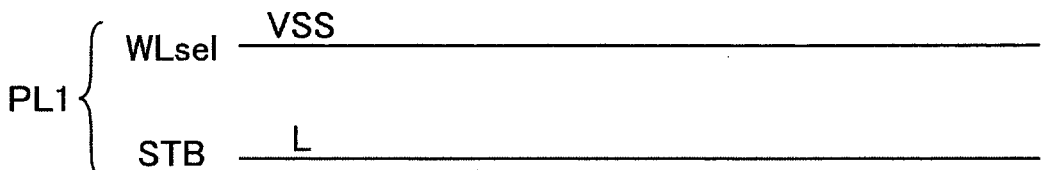
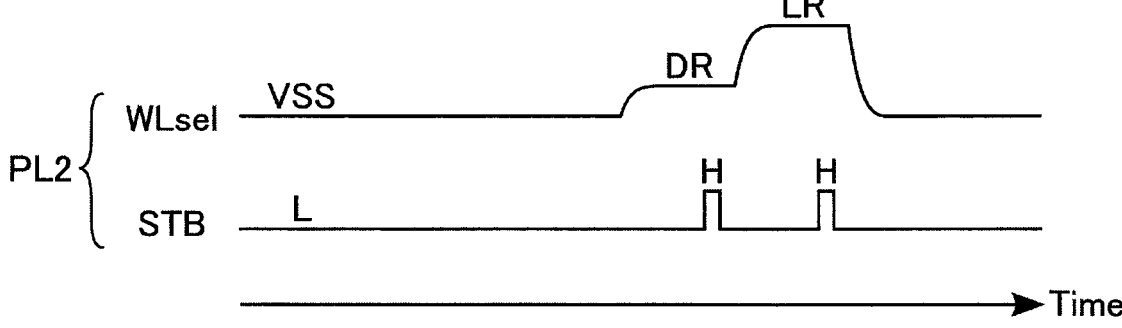
FIG. 61

Fifth-page read (Eighth embodiment)

F I G. 62

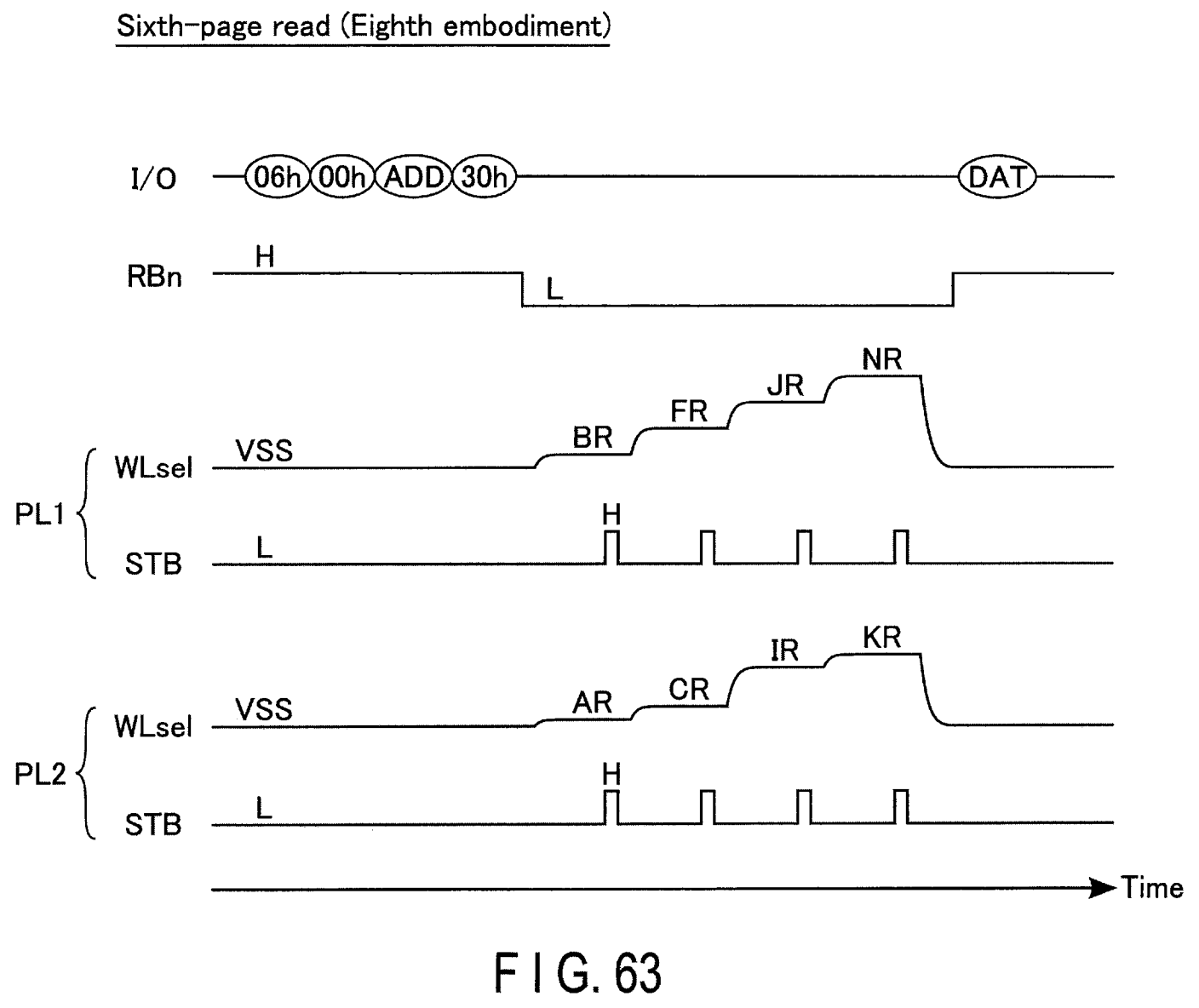

Sixth-page read (Eighth embodiment)

I/O ─────( 06h )( 00h )( ADD )( 30h )────────────( DAT )──

RBn

WLsel    VSS    BR   FR   JR   NR
STB      L      H

PL1

WLsel    VSS    AR   CR   IR   KR
STB      L      H

PL2

→ Time

F I G. 63

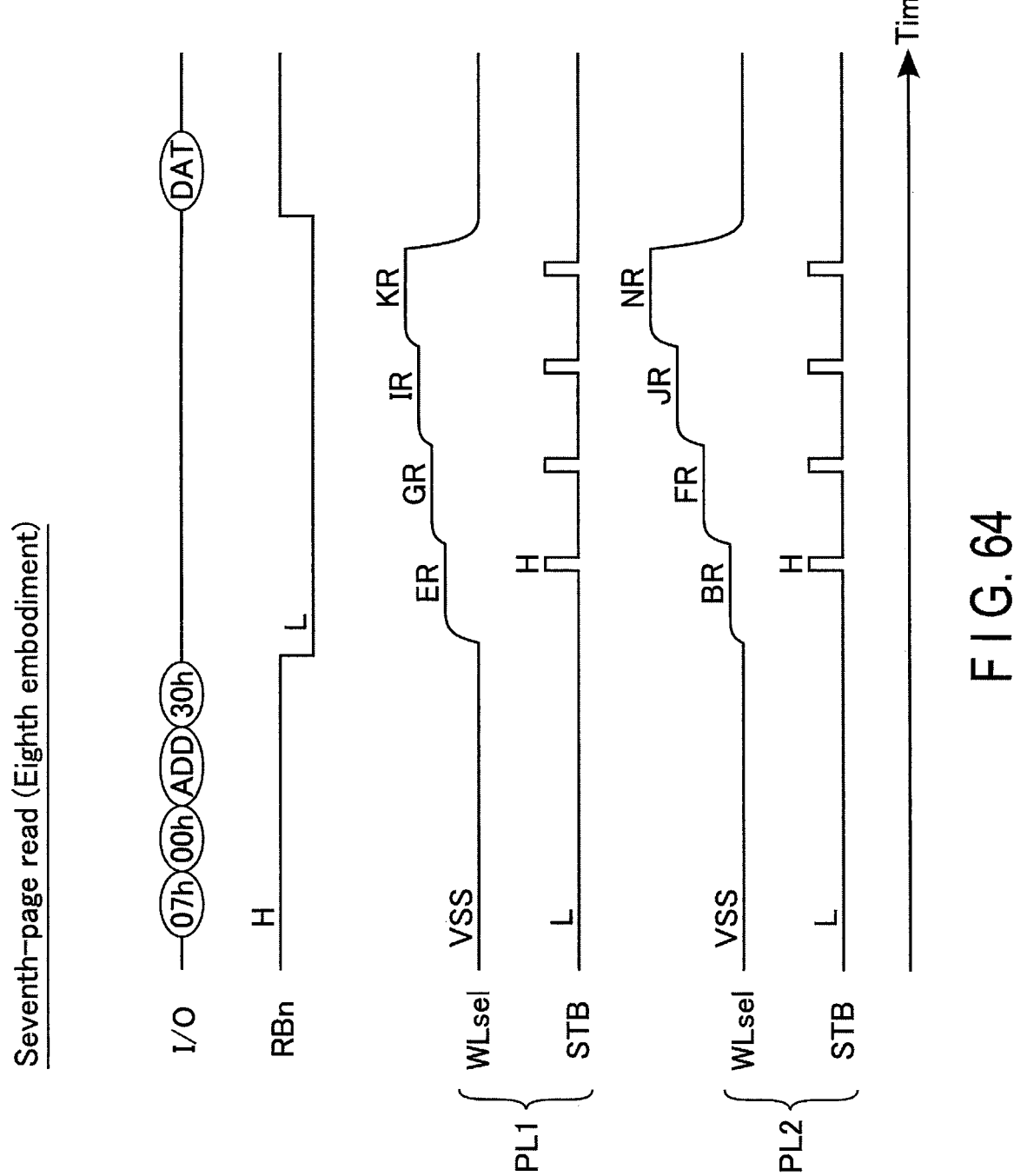
F I G. 64

Eighth-page read (Eighth embodiment)

F I G. 65

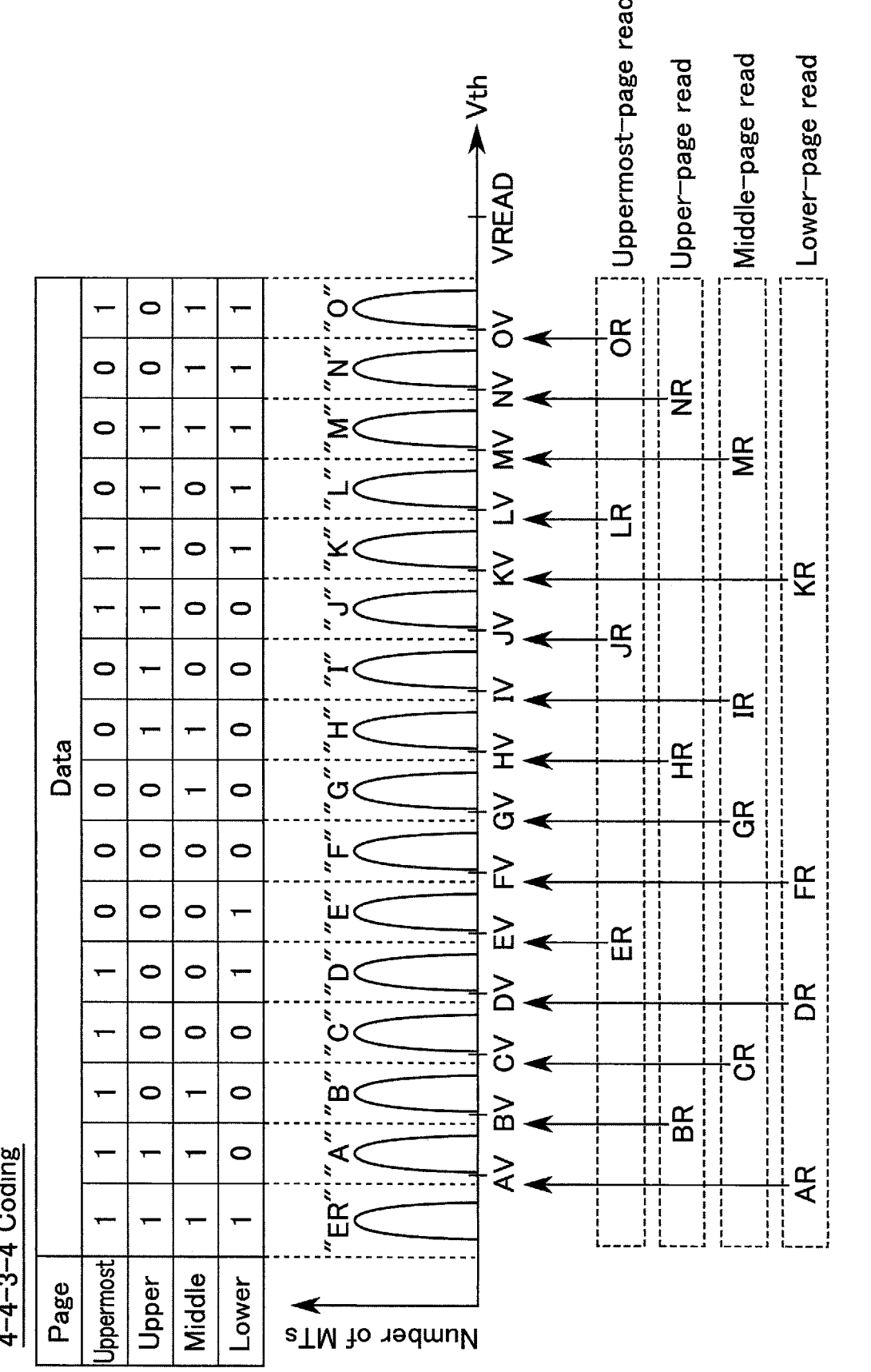
F I G. 66

Data allocation(1/8) (Ninth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (1) | Z | Z | 0 | 0 | 0 | 0 | 0 | 0 | 0 | 0 |
| (2) | Z | A | 1 | 0 | 1 | 0 | 0 | 0 | 0 | 0 |
| (3) | Z | B | 1 | 0 | 1 | 0 | 0 | 0 | 0 | 1 |
| (4) | Z | C | 1 | 0 | 1 | 1 | 0 | 0 | 0 | 1 |
| (5) | Z | D | 1 | 0 | 1 | 1 | 0 | 1 | 0 | 1 |
| (6) | Z | E | 1 | 0 | 1 | 1 | 1 | 1 | 1 | 1 |
| (7) | Z | F | 1 | 0 | 1 | 1 | 1 | 0 | 1 | 1 |
| (8) | Z | G | 1 | 1 | 1 | 1 | 1 | 0 | 1 | 1 |
| (9) | Z | H | 1 | 1 | 1 | 1 | 1 | 0 | 1 | 0 |
| (10) | Z | I | 0 | 1 | 0 | 1 | 1 | 0 | 1 | 0 |
| (11) | Z | J | 0 | 1 | 0 | 1 | 1 | 0 | 1 | 1 |
| (12) | Z | K | 0 | 0 | 0 | 1 | 1 | 0 | 1 | 1 |
| (13) | Z | L | 0 | 0 | 0 | 0 | 0 | 0 | 0 | 1 |
| (14) | Z | M | 0 | 0 | 0 | 1 | 0 | 0 | 0 | 1 |
| (15) | Z | N | 0 | 0 | 0 | 1 | 0 | 1 | 0 | 1 |
| (16) | Z | O | 0 | 0 | 0 | 1 | 1 | 1 | 1 | 1 |
| (17) | A | Z | 0 | 1 | 0 | 1 | 0 | 0 | 0 | 0 |
| (18) | A | A | 1 | 1 | 1 | 1 | 0 | 0 | 0 | 0 |
| (19) | A | B | 1 | 1 | 1 | 1 | 0 | 0 | 0 | 1 |
| (20) | A | C | 1 | 1 | 1 | 0 | 0 | 0 | 0 | 1 |
| (21) | A | D | 1 | 1 | 1 | 0 | 0 | 1 | 0 | 1 |
| (22) | A | E | 1 | 1 | 1 | 0 | 1 | 1 | 1 | 1 |
| (23) | A | F | 1 | 1 | 1 | 0 | 1 | 0 | 1 | 1 |
| (24) | A | G | 1 | 0 | 1 | 0 | 1 | 0 | 1 | 1 |
| (25) | A | H | 1 | 0 | 1 | 0 | 1 | 0 | 1 | 0 |
| (26) | A | I | 0 | 0 | 0 | 0 | 1 | 0 | 1 | 0 |
| (27) | A | J | 0 | 0 | 0 | 0 | 1 | 0 | 1 | 1 |
| (28) | A | K | 0 | 1 | 0 | 0 | 1 | 0 | 1 | 1 |
| (29) | A | L | 0 | 1 | 0 | 1 | 0 | 0 | 0 | 1 |
| (30) | A | M | 0 | 1 | 0 | 0 | 0 | 0 | 0 | 1 |
| (31) | A | N | 0 | 1 | 0 | 0 | 0 | 1 | 0 | 1 |
| (32) | A | O | 0 | 1 | 0 | 0 | 1 | 1 | 1 | 1 |

F I G. 67

Data allocation(2/8) (Ninth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (33) | B | Z | 0 | 1 | 0 | 1 | 0 | 0 | 1 | 0 |
| (34) | B | A | 1 | 1 | 1 | 1 | 0 | 0 | 1 | 0 |
| (35) | B | B | 1 | 1 | 1 | 1 | 0 | 0 | 1 | 1 |
| (36) | B | C | 1 | 1 | 1 | 0 | 0 | 0 | 1 | 1 |
| (37) | B | D | 1 | 1 | 1 | 0 | 0 | 1 | 1 | 1 |
| (38) | B | E | 1 | 1 | 1 | 0 | 1 | 1 | 0 | 1 |
| (39) | B | F | 1 | 1 | 1 | 0 | 1 | 0 | 0 | 1 |
| (40) | B | G | 1 | 0 | 1 | 0 | 1 | 0 | 0 | 1 |
| (41) | B | H | 1 | 0 | 1 | 0 | 1 | 0 | 0 | 0 |
| (42) | B | I | 0 | 0 | 0 | 0 | 1 | 0 | 0 | 0 |
| (43) | B | J | 0 | 0 | 0 | 0 | 1 | 0 | 0 | 1 |
| (44) | B | K | 0 | 1 | 0 | 0 | 1 | 0 | 0 | 1 |
| (45) | B | L | 0 | 1 | 0 | 1 | 0 | 0 | 1 | 1 |
| (46) | B | M | 0 | 1 | 0 | 0 | 0 | 0 | 1 | 1 |
| (47) | B | N | 0 | 1 | 0 | 0 | 0 | 1 | 1 | 1 |
| (48) | B | O | 0 | 1 | 0 | 0 | 1 | 1 | 0 | 1 |
| (49) | C | Z | 0 | 1 | 1 | 1 | 0 | 0 | 1 | 0 |
| (50) | C | A | 1 | 1 | 0 | 1 | 0 | 0 | 1 | 0 |
| (51) | C | B | 1 | 1 | 0 | 1 | 0 | 0 | 1 | 1 |
| (52) | C | C | 1 | 1 | 0 | 0 | 0 | 0 | 1 | 1 |
| (53) | C | D | 1 | 1 | 0 | 0 | 0 | 1 | 1 | 1 |
| (54) | C | E | 1 | 1 | 0 | 0 | 1 | 1 | 0 | 1 |
| (55) | C | F | 1 | 1 | 0 | 0 | 1 | 0 | 0 | 1 |
| (56) | C | G | 1 | 0 | 0 | 0 | 1 | 0 | 0 | 1 |
| (57) | C | H | 1 | 0 | 0 | 0 | 1 | 0 | 0 | 0 |
| (58) | C | I | 0 | 0 | 1 | 0 | 1 | 0 | 0 | 0 |
| (59) | C | J | 0 | 0 | 1 | 0 | 1 | 0 | 0 | 1 |
| (60) | C | K | 0 | 1 | 1 | 0 | 1 | 0 | 0 | 1 |
| (61) | C | L | 0 | 1 | 1 | 1 | 0 | 0 | 1 | 1 |
| (62) | C | M | 0 | 1 | 1 | 0 | 0 | 0 | 1 | 1 |
| (63) | C | N | 0 | 1 | 1 | 0 | 0 | 1 | 1 | 1 |
| (64) | C | O | 0 | 1 | 1 | 0 | 1 | 1 | 0 | 1 |

F I G. 68

Data allocation(3/8) (Ninth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (65) | D | Z | 0 | 1 | 1 | 1 | 1 | 0 | 1 | 0 |
| (66) | D | A | 1 | 1 | 0 | 1 | 1 | 0 | 1 | 0 |
| (67) | D | B | 1 | 1 | 0 | 1 | 1 | 0 | 1 | 1 |
| (68) | D | C | 1 | 1 | 0 | 0 | 1 | 0 | 1 | 1 |
| (69) | D | D | 1 | 1 | 0 | 0 | 1 | 1 | 1 | 1 |
| (70) | D | E | 1 | 1 | 0 | 0 | 0 | 1 | 0 | 1 |
| (71) | D | F | 1 | 1 | 0 | 0 | 0 | 0 | 0 | 1 |
| (72) | D | G | 1 | 0 | 0 | 0 | 0 | 0 | 0 | 1 |
| (73) | D | H | 1 | 0 | 0 | 0 | 0 | 0 | 0 | 0 |
| (74) | D | I | 0 | 0 | 1 | 0 | 0 | 0 | 0 | 0 |
| (75) | D | J | 0 | 0 | 1 | 0 | 0 | 0 | 0 | 1 |
| (76) | D | K | 0 | 1 | 1 | 0 | 0 | 0 | 0 | 1 |
| (77) | D | L | 0 | 1 | 1 | 1 | 1 | 0 | 1 | 1 |
| (78) | D | M | 0 | 1 | 1 | 0 | 1 | 0 | 1 | 1 |
| (79) | D | N | 0 | 1 | 1 | 0 | 1 | 1 | 1 | 1 |
| (80) | D | O | 0 | 1 | 1 | 0 | 0 | 1 | 0 | 1 |
| (81) | E | Z | 0 | 1 | 1 | 1 | 1 | 1 | 1 | 1 |
| (82) | E | A | 1 | 1 | 0 | 1 | 1 | 1 | 1 | 1 |
| (83) | E | B | 1 | 1 | 0 | 1 | 1 | 1 | 1 | 0 |
| (84) | E | C | 1 | 1 | 0 | 0 | 1 | 1 | 1 | 0 |
| (85) | E | D | 1 | 1 | 0 | 0 | 1 | 0 | 1 | 0 |
| (86) | E | E | 1 | 1 | 0 | 0 | 0 | 0 | 0 | 0 |
| (87) | E | F | 1 | 1 | 0 | 0 | 0 | 1 | 0 | 0 |
| (88) | E | G | 1 | 0 | 0 | 0 | 0 | 1 | 0 | 0 |
| (89) | E | H | 1 | 0 | 0 | 0 | 0 | 1 | 0 | 1 |
| (90) | E | I | 0 | 0 | 1 | 0 | 0 | 1 | 0 | 1 |
| (91) | E | J | 0 | 0 | 1 | 0 | 0 | 1 | 0 | 0 |
| (92) | E | K | 0 | 1 | 1 | 0 | 0 | 1 | 0 | 0 |
| (93) | E | L | 0 | 1 | 1 | 1 | 1 | 1 | 1 | 0 |
| (94) | E | M | 0 | 1 | 1 | 0 | 1 | 1 | 1 | 0 |
| (95) | E | N | 0 | 1 | 1 | 0 | 1 | 0 | 1 | 0 |
| (96) | E | O | 0 | 1 | 1 | 0 | 0 | 0 | 0 | 0 |

F I G. 69

Data allocation(4/8) (Ninth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (97) | F | Z | 0 | 1 | 1 | 1 | 0 | 1 | 1 | 1 |
| (98) | F | A | 1 | 1 | 0 | 1 | 0 | 1 | 1 | 1 |
| (99) | F | B | 1 | 1 | 0 | 1 | 0 | 1 | 1 | 0 |
| (100) | F | C | 1 | 1 | 0 | 0 | 0 | 1 | 1 | 0 |
| (101) | F | D | 1 | 1 | 0 | 0 | 0 | 0 | 1 | 0 |
| (102) | F | E | 1 | 1 | 0 | 0 | 1 | 0 | 0 | 0 |
| (103) | F | F | 1 | 1 | 0 | 0 | 1 | 1 | 0 | 0 |
| (104) | F | G | 1 | 0 | 0 | 0 | 1 | 1 | 0 | 0 |
| (105) | F | H | 1 | 0 | 0 | 0 | 1 | 1 | 0 | 1 |
| (106) | F | I | 0 | 0 | 1 | 0 | 1 | 1 | 0 | 1 |
| (107) | F | J | 0 | 0 | 1 | 0 | 1 | 1 | 0 | 0 |
| (108) | F | K | 0 | 1 | 1 | 0 | 1 | 1 | 0 | 0 |
| (109) | F | L | 0 | 1 | 1 | 1 | 0 | 1 | 1 | 0 |
| (110) | F | M | 0 | 1 | 1 | 0 | 0 | 1 | 1 | 0 |
| (111) | F | N | 0 | 1 | 1 | 0 | 0 | 0 | 1 | 0 |
| (112) | F | O | 0 | 1 | 1 | 0 | 1 | 0 | 0 | 0 |
| (113) | G | Z | 1 | 1 | 1 | 1 | 0 | 1 | 1 | 1 |
| (114) | G | A | 0 | 1 | 0 | 1 | 0 | 1 | 1 | 1 |
| (115) | G | B | 0 | 1 | 0 | 1 | 0 | 1 | 1 | 0 |
| (116) | G | C | 0 | 1 | 0 | 0 | 0 | 1 | 1 | 0 |
| (117) | G | D | 0 | 1 | 0 | 0 | 0 | 0 | 1 | 0 |
| (118) | G | E | 0 | 1 | 0 | 0 | 1 | 0 | 0 | 0 |
| (119) | G | F | 0 | 1 | 0 | 0 | 1 | 1 | 0 | 0 |
| (120) | G | G | 0 | 0 | 0 | 0 | 1 | 1 | 0 | 0 |
| (121) | G | H | 0 | 0 | 0 | 0 | 1 | 1 | 0 | 1 |
| (122) | G | I | 1 | 0 | 1 | 0 | 1 | 1 | 0 | 1 |
| (123) | G | J | 1 | 0 | 1 | 0 | 1 | 1 | 0 | 0 |
| (124) | G | K | 1 | 1 | 1 | 0 | 1 | 1 | 0 | 0 |
| (125) | G | L | 1 | 1 | 1 | 1 | 0 | 1 | 1 | 0 |
| (126) | G | M | 1 | 1 | 1 | 0 | 0 | 1 | 1 | 0 |
| (127) | G | N | 1 | 1 | 1 | 0 | 0 | 0 | 1 | 0 |
| (128) | G | O | 1 | 1 | 1 | 0 | 1 | 0 | 0 | 0 |

F I G. 70

Data allocation(5/8) (Ninth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (129) | H | Z | 1 | 1 | 1 | 1 | 0 | 1 | 0 | 1 |
| (130) | H | A | 0 | 1 | 0 | 1 | 0 | 1 | 0 | 1 |
| (131) | H | B | 0 | 1 | 0 | 1 | 0 | 1 | 0 | 0 |
| (132) | H | C | 0 | 1 | 0 | 0 | 0 | 1 | 0 | 0 |
| (133) | H | D | 0 | 1 | 0 | 0 | 0 | 0 | 0 | 0 |
| (134) | H | E | 0 | 1 | 0 | 0 | 1 | 0 | 1 | 0 |
| (135) | H | F | 0 | 1 | 0 | 0 | 1 | 1 | 1 | 0 |
| (136) | H | G | 0 | 0 | 0 | 0 | 1 | 1 | 1 | 0 |
| (137) | H | H | 0 | 0 | 0 | 0 | 1 | 1 | 1 | 1 |
| (138) | H | I | 1 | 0 | 1 | 0 | 1 | 1 | 1 | 1 |
| (139) | H | J | 1 | 0 | 1 | 0 | 1 | 1 | 1 | 0 |
| (140) | H | K | 1 | 1 | 1 | 0 | 1 | 1 | 1 | 0 |
| (141) | H | L | 1 | 1 | 1 | 1 | 0 | 1 | 0 | 0 |
| (142) | H | M | 1 | 1 | 1 | 0 | 0 | 1 | 0 | 0 |
| (143) | H | N | 1 | 1 | 1 | 0 | 0 | 0 | 0 | 0 |
| (144) | H | O | 1 | 1 | 1 | 0 | 1 | 0 | 1 | 0 |
| (145) | I | Z | 1 | 0 | 1 | 0 | 0 | 1 | 0 | 1 |
| (146) | I | A | 0 | 0 | 0 | 0 | 0 | 1 | 0 | 1 |
| (147) | I | B | 0 | 0 | 0 | 0 | 0 | 1 | 0 | 0 |
| (148) | I | C | 0 | 0 | 0 | 1 | 0 | 1 | 0 | 0 |
| (149) | I | D | 0 | 0 | 0 | 1 | 0 | 0 | 0 | 0 |
| (150) | I | E | 0 | 0 | 0 | 1 | 1 | 0 | 1 | 0 |
| (151) | I | F | 0 | 0 | 0 | 1 | 1 | 1 | 1 | 0 |
| (152) | I | G | 0 | 1 | 0 | 1 | 1 | 1 | 1 | 0 |
| (153) | I | H | 0 | 1 | 0 | 1 | 1 | 1 | 1 | 1 |
| (154) | I | I | 1 | 1 | 1 | 1 | 1 | 1 | 1 | 1 |
| (155) | I | J | 1 | 1 | 1 | 1 | 1 | 1 | 1 | 0 |
| (156) | I | K | 1 | 0 | 1 | 1 | 1 | 1 | 1 | 0 |
| (157) | I | L | 1 | 0 | 1 | 0 | 0 | 1 | 0 | 0 |
| (158) | I | M | 1 | 0 | 1 | 1 | 0 | 1 | 0 | 0 |
| (159) | I | N | 1 | 0 | 1 | 1 | 0 | 0 | 0 | 0 |
| (160) | I | O | 1 | 0 | 1 | 1 | 1 | 0 | 1 | 0 |

F I G. 71

Data allocation(6/8) (Ninth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (161) | J | Z | 1 | 0 | 1 | 0 | 0 | 1 | 1 | 1 |
| (162) | J | A | 0 | 0 | 0 | 0 | 0 | 1 | 1 | 1 |
| (163) | J | B | 0 | 0 | 0 | 0 | 0 | 1 | 1 | 0 |
| (164) | J | C | 0 | 0 | 0 | 1 | 0 | 1 | 1 | 0 |
| (165) | J | D | 0 | 0 | 0 | 1 | 0 | 0 | 1 | 0 |
| (166) | J | E | 0 | 0 | 0 | 1 | 1 | 0 | 0 | 0 |
| (167) | J | F | 0 | 0 | 0 | 1 | 1 | 1 | 0 | 0 |
| (168) | J | G | 0 | 1 | 0 | 1 | 1 | 1 | 0 | 0 |
| (169) | J | H | 0 | 1 | 0 | 1 | 1 | 1 | 0 | 1 |
| (170) | J | I | 1 | 1 | 1 | 1 | 1 | 1 | 0 | 1 |
| (171) | J | J | 1 | 1 | 1 | 1 | 1 | 1 | 0 | 0 |
| (172) | J | K | 1 | 0 | 1 | 1 | 1 | 1 | 0 | 0 |
| (173) | J | L | 1 | 0 | 1 | 0 | 0 | 1 | 1 | 0 |
| (174) | J | M | 1 | 0 | 1 | 1 | 0 | 1 | 1 | 0 |
| (175) | J | N | 1 | 0 | 1 | 1 | 0 | 0 | 1 | 0 |
| (176) | J | O | 1 | 0 | 1 | 1 | 1 | 0 | 0 | 0 |
| (177) | K | Z | 0 | 0 | 1 | 0 | 0 | 1 | 1 | 1 |
| (178) | K | A | 1 | 0 | 0 | 0 | 0 | 1 | 1 | 1 |
| (179) | K | B | 1 | 0 | 0 | 0 | 0 | 1 | 1 | 0 |
| (180) | K | C | 1 | 0 | 0 | 1 | 0 | 1 | 1 | 0 |
| (181) | K | D | 1 | 0 | 0 | 1 | 0 | 0 | 1 | 0 |
| (182) | K | E | 1 | 0 | 0 | 1 | 1 | 0 | 0 | 0 |
| (183) | K | F | 1 | 0 | 0 | 1 | 1 | 1 | 0 | 0 |
| (184) | K | G | 1 | 1 | 0 | 1 | 1 | 1 | 0 | 0 |
| (185) | K | H | 1 | 1 | 0 | 1 | 1 | 1 | 0 | 1 |
| (186) | K | I | 0 | 1 | 1 | 1 | 1 | 1 | 0 | 1 |
| (187) | K | J | 0 | 1 | 1 | 1 | 1 | 1 | 0 | 0 |
| (188) | K | K | 0 | 0 | 1 | 1 | 1 | 1 | 0 | 0 |
| (189) | K | L | 0 | 0 | 1 | 0 | 0 | 1 | 1 | 0 |
| (190) | K | M | 0 | 0 | 1 | 1 | 0 | 1 | 1 | 0 |
| (191) | K | N | 0 | 0 | 1 | 1 | 0 | 0 | 1 | 0 |
| (192) | K | O | 0 | 0 | 1 | 1 | 1 | 0 | 0 | 0 |

FIG. 72

Data allocation(7/8) (Ninth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (193) | L | Z | 0 | 0 | 0 | 0 | 0 | 0 | 1 | 0 |
| (194) | L | A | 1 | 0 | 1 | 0 | 0 | 0 | 1 | 0 |
| (195) | L | B | 1 | 0 | 1 | 0 | 0 | 0 | 1 | 1 |
| (196) | L | C | 1 | 0 | 1 | 1 | 0 | 0 | 1 | 1 |
| (197) | L | D | 1 | 0 | 1 | 1 | 0 | 1 | 1 | 1 |
| (198) | L | E | 1 | 0 | 1 | 1 | 1 | 1 | 0 | 1 |
| (199) | L | F | 1 | 0 | 1 | 1 | 1 | 0 | 0 | 1 |
| (200) | L | G | 1 | 1 | 1 | 1 | 1 | 0 | 0 | 1 |
| (201) | L | H | 1 | 1 | 1 | 1 | 1 | 0 | 0 | 0 |
| (202) | L | I | 0 | 1 | 0 | 1 | 1 | 0 | 0 | 0 |
| (203) | L | J | 0 | 1 | 0 | 1 | 1 | 0 | 0 | 1 |
| (204) | L | K | 0 | 0 | 0 | 1 | 1 | 0 | 0 | 1 |
| (205) | L | L | 0 | 0 | 0 | 0 | 0 | 0 | 1 | 1 |
| (206) | L | M | 0 | 0 | 0 | 1 | 0 | 0 | 1 | 1 |
| (207) | L | N | 0 | 0 | 0 | 1 | 0 | 1 | 1 | 1 |
| (208) | L | O | 0 | 0 | 0 | 1 | 1 | 1 | 0 | 1 |
| (209) | M | Z | 0 | 0 | 1 | 0 | 0 | 0 | 1 | 0 |
| (210) | M | A | 1 | 0 | 0 | 0 | 0 | 0 | 1 | 0 |
| (211) | M | B | 1 | 0 | 0 | 0 | 0 | 0 | 1 | 1 |
| (212) | M | C | 1 | 0 | 0 | 1 | 0 | 0 | 1 | 1 |
| (213) | M | D | 1 | 0 | 0 | 1 | 0 | 1 | 1 | 1 |
| (214) | M | E | 1 | 0 | 0 | 1 | 1 | 1 | 0 | 1 |
| (215) | M | F | 1 | 0 | 0 | 1 | 1 | 0 | 0 | 1 |
| (216) | M | G | 1 | 1 | 0 | 1 | 1 | 0 | 0 | 1 |
| (217) | M | H | 1 | 1 | 0 | 1 | 1 | 0 | 0 | 0 |
| (218) | M | I | 0 | 1 | 1 | 1 | 1 | 0 | 0 | 0 |
| (219) | M | J | 0 | 1 | 1 | 1 | 1 | 0 | 0 | 1 |
| (220) | M | K | 0 | 0 | 1 | 1 | 1 | 0 | 0 | 1 |
| (221) | M | L | 0 | 0 | 1 | 0 | 0 | 0 | 1 | 1 |
| (222) | M | M | 0 | 0 | 1 | 1 | 0 | 0 | 1 | 1 |
| (223) | M | N | 0 | 0 | 1 | 1 | 0 | 1 | 1 | 1 |
| (224) | M | O | 0 | 0 | 1 | 1 | 1 | 1 | 0 | 1 |

F I G. 73

Data allocation(8/8) (Ninth embodiment)

| | Vth of MT | | Data | | | | | | | |
|---|---|---|---|---|---|---|---|---|---|---|
| | PL1 | PL2 | 1st page | 2nd page | 3rd page | 4th page | 5th page | 6th page | 7th page | 8th page |
| (225) | N | Z | 0 | 0 | 1 | 0 | 1 | 0 | 1 | 0 |
| (226) | N | A | 1 | 0 | 0 | 0 | 1 | 0 | 1 | 0 |
| (227) | N | B | 1 | 0 | 0 | 0 | 1 | 0 | 1 | 1 |
| (228) | N | C | 1 | 0 | 0 | 1 | 1 | 0 | 1 | 1 |
| (229) | N | D | 1 | 0 | 0 | 1 | 1 | 1 | 1 | 1 |
| (230) | N | E | 1 | 0 | 0 | 1 | 0 | 1 | 0 | 1 |
| (231) | N | F | 1 | 0 | 0 | 1 | 0 | 0 | 0 | 1 |
| (232) | N | G | 1 | 1 | 0 | 1 | 0 | 0 | 0 | 1 |
| (233) | N | H | 1 | 1 | 0 | 1 | 0 | 0 | 0 | 0 |
| (234) | N | I | 0 | 1 | 1 | 1 | 0 | 0 | 0 | 0 |
| (235) | N | J | 0 | 1 | 1 | 1 | 0 | 0 | 0 | 1 |
| (236) | N | K | 0 | 0 | 1 | 1 | 0 | 0 | 0 | 1 |
| (237) | N | L | 0 | 0 | 1 | 0 | 1 | 0 | 1 | 1 |
| (238) | N | M | 0 | 0 | 1 | 1 | 1 | 0 | 1 | 1 |
| (239) | N | N | 0 | 0 | 1 | 1 | 1 | 1 | 1 | 1 |
| (240) | N | O | 0 | 0 | 1 | 1 | 0 | 1 | 0 | 1 |
| (241) | O | Z | 0 | 0 | 1 | 0 | 1 | 1 | 1 | 1 |
| (242) | O | A | 1 | 0 | 0 | 0 | 1 | 1 | 1 | 1 |
| (243) | O | B | 1 | 0 | 0 | 0 | 1 | 1 | 1 | 0 |
| (244) | O | C | 1 | 0 | 0 | 1 | 1 | 1 | 1 | 0 |
| (245) | O | D | 1 | 0 | 0 | 1 | 1 | 0 | 1 | 0 |
| (246) | O | E | 1 | 0 | 0 | 1 | 0 | 0 | 0 | 0 |
| (247) | O | F | 1 | 0 | 0 | 1 | 0 | 1 | 0 | 0 |
| (248) | O | G | 1 | 1 | 0 | 1 | 0 | 1 | 0 | 0 |
| (249) | O | H | 1 | 1 | 0 | 1 | 0 | 1 | 0 | 1 |
| (250) | O | I | 0 | 1 | 1 | 1 | 0 | 1 | 0 | 1 |
| (251) | O | J | 0 | 1 | 1 | 1 | 0 | 1 | 0 | 0 |
| (252) | O | K | 0 | 0 | 1 | 1 | 0 | 1 | 0 | 0 |
| (253) | O | L | 0 | 0 | 1 | 0 | 1 | 1 | 1 | 0 |
| (254) | O | M | 0 | 0 | 1 | 1 | 1 | 1 | 1 | 0 |
| (255) | O | N | 0 | 0 | 1 | 1 | 1 | 0 | 1 | 0 |
| (256) | O | O | 0 | 0 | 1 | 1 | 0 | 0 | 0 | 0 |

F I G. 74

Data definitions (Ninth embodiment)

| Read operation | Read voltages | | Read data | | | |
|---|---|---|---|---|---|---|
| | PL1 | PL2 | PL1:PL2 (0:0) | PL1:PL2 (1:0) | PL1:PL2 (0:1) | PL1:PL2 (1:1) |
| 1st page | GR,KR | AR,IR | 0 | 1 | 1 | 0 |
| 2nd page | AR,IR | GR,KR | 0 | 1 | 1 | 0 |
| 3rd page | CR,LR,MR | AR,IR | 0 | 1 | 1 | 0 |
| 4th page | AR,IR | CR,LR,MR | 0 | 1 | 1 | 0 |
| 5th page | DR,FR,NR | ER,LR,OR | 0 | 1 | 1 | 0 |
| 6th page | ER,LR,OR | DR,FR,NR | 0 | 1 | 1 | 0 |
| 7th page | BR,HR,JR | ER,LR,OR | 0 | 1 | 1 | 0 |
| 8th page | ER,LR,OR | BR,HR,JR | 0 | 1 | 1 | 0 |

F I G. 75

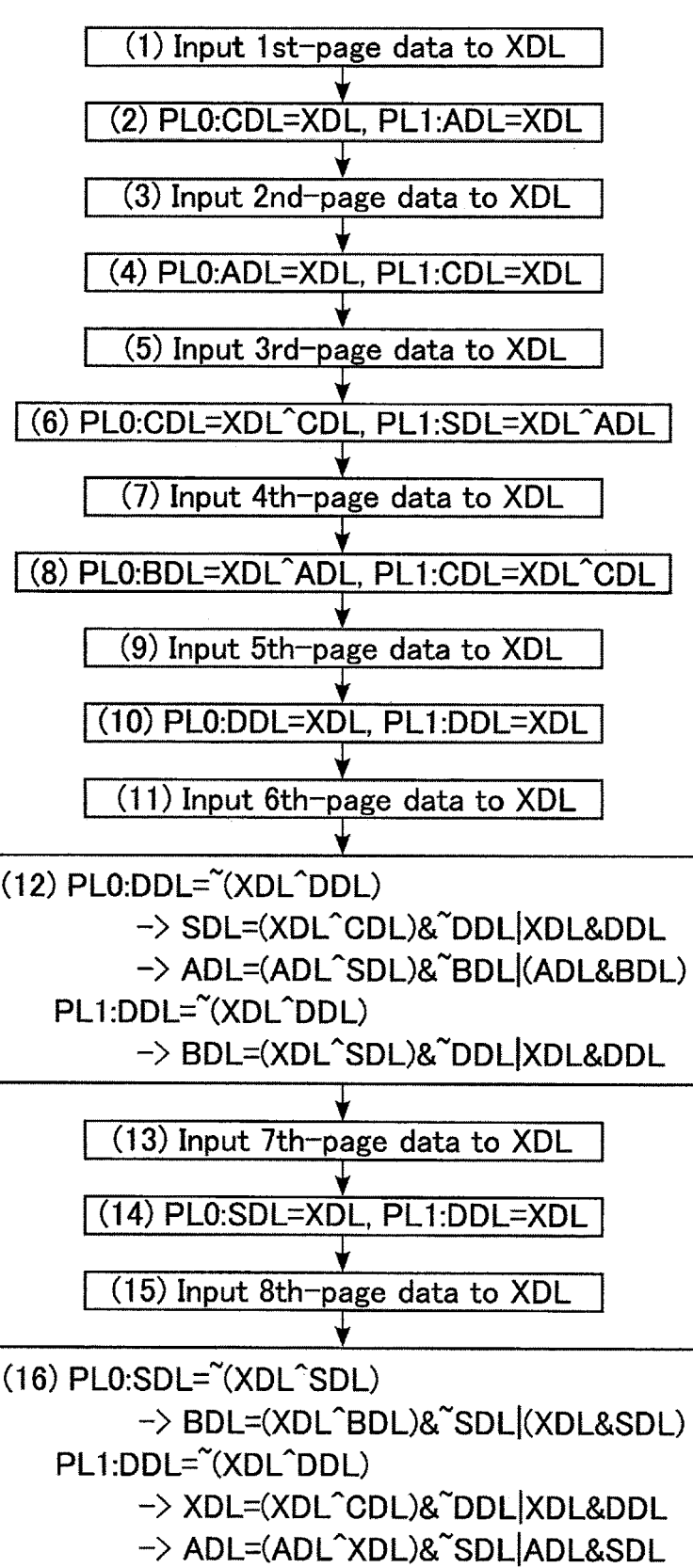
F I G. 76

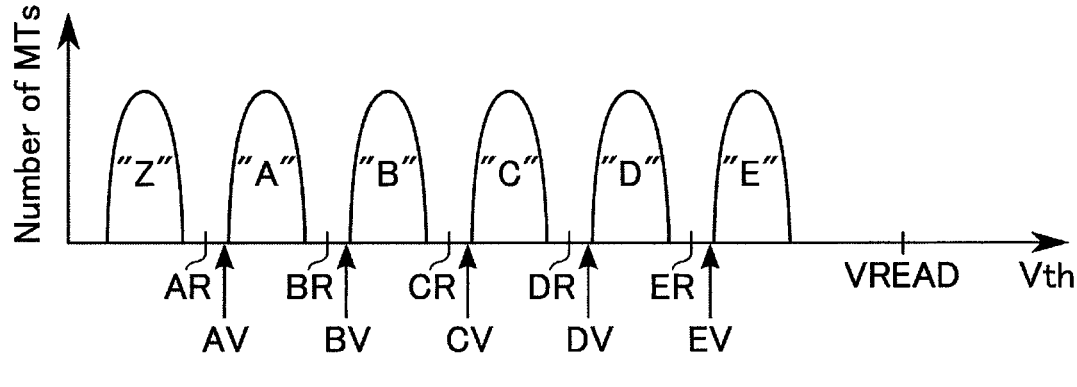
F I G. 77

Data allocation (10th Embodiment)

| | Vth of memory cells | | Data | | | | |
|---|---|---|---|---|---|---|---|
| | 1st plane | 2nd plane | 1st page | 2nd page | 3rd page | 4th page | 5th page |
| (1) | Z | Z | 0 | 0 | 0 | 0 | 0 |
| (2) | Z | A | 0 | 1 | 0 | 0 | 0 |
| (3) | Z | B | 0 | 1 | 0 | 0 | 0 |
| (4) | Z | C | 0 | 1 | 0 | 1 | 0 |
| (5) | Z | D | 0 | 0 | 0 | 1 | 0 |
| (6) | Z | E | 0 | 0 | 0 | 1 | 0 |
| (7) | A | Z | 0 | 0 | 1 | 0 | 0 |
| (8) | A | A | 0 | 1 | 1 | 0 | 0 |
| (9) | A | B | 0 | 1 | 1 | 0 | 0 |
| (10) | A | C | 0 | 1 | 1 | 1 | 0 |
| (11) | A | D | 0 | 0 | 1 | 1 | 0 |
| (12) | A | E | 0 | 0 | 1 | 1 | 0 |
| (13) | B | Z | 0 | 0 | 1 | 0 | 1 |
| (14) | B | A | 0 | 1 | 1 | 0 | 1 |
| (15) | B | B | 1 | 1 | 1 | 0 | 1 |
| (16) | B | C | 1 | 1 | 1 | 1 | 0 |
| (17) | B | D | 1 | 0 | 1 | 1 | 0 |
| (18) | B | E | 1 | 0 | 1 | 1 | 1 |
| (19) | C | Z | 0 | 0 | 1 | 1 | 1 |
| (20) | C | A | 0 | 1 | 1 | 1 | 1 |
| (21) | C | B | 1 | 1 | 1 | 1 | 1 |
| (22) | C | C | 1 | 1 | 1 | 0 | 0 |
| (23) | C | D | 1 | 0 | 1 | 0 | 0 |
| (24) | C | E | 1 | 0 | 1 | 0 | 1 |
| (25) | D | Z | 0 | 0 | 0 | 1 | 1 |
| (26) | D | A | 0 | 1 | 0 | 1 | 1 |
| (27) | D | B | 1 | 1 | 0 | 1 | 1 |
| (28) | D | C | 1 | 1 | 0 | 0 | 0 |
| (29) | D | D | 1 | 0 | 0 | 0 | 0 |
| (30) | D | E | 1 | 0 | 0 | 0 | 1 |
| (31) | E | Z | 0 | 0 | 0 | 0 | 1 |
| (32) | E | A | 0 | 1 | 0 | 0 | 1 |
| (33) | E | B | 1 | 1 | 0 | 0 | 1 |
| (34) | E | C | 1 | 1 | 0 | 1 | 0 |
| (35) | E | D | 1 | 0 | 0 | 1 | 0 |
| (36) | E | E | 1 | 0 | 0 | 1 | 1 |

F I G. 78

Data definitions (10th Embodiment)

| Read operation | Read voltages | | Read data | | | |
|---|---|---|---|---|---|---|
| | PL1 | PL2 | PL1:PL2 (0:0) | PL1:PL2 (1:0) | PL1:PL2 (0:1) | PL1:PL2 (1:1) |
| 1st page | BR | BR | 0 | 0 | 0 | 1 |
| 2nd page | — | AR,DR | 0 | 0 | 1 | 1 |
| 3rd page | AR,DR | — | 0 | 1 | 0 | 1 |
| 4th page | CR,ER | CR | 0 | 1 | 1 | 0 |
| 5th page | BR | CR,ER | 0 | 1 | 0 | 0 |

FIG.79

First-page read (10th Embodiment)
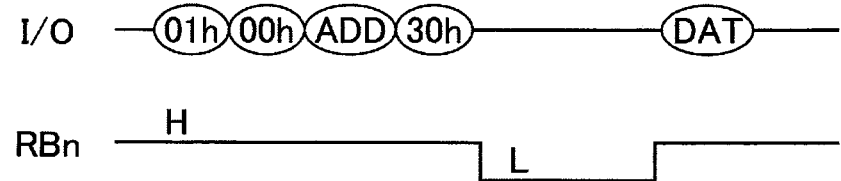
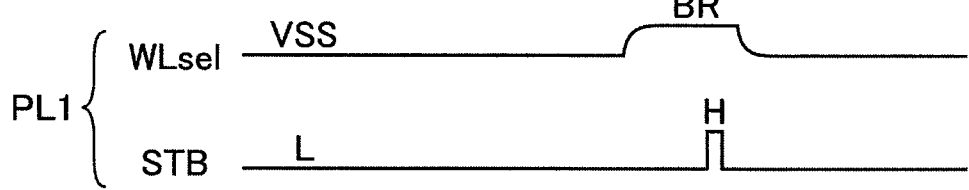
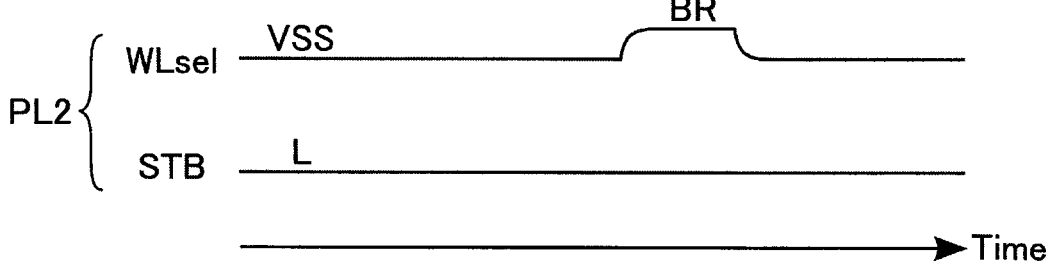
F I G. 80

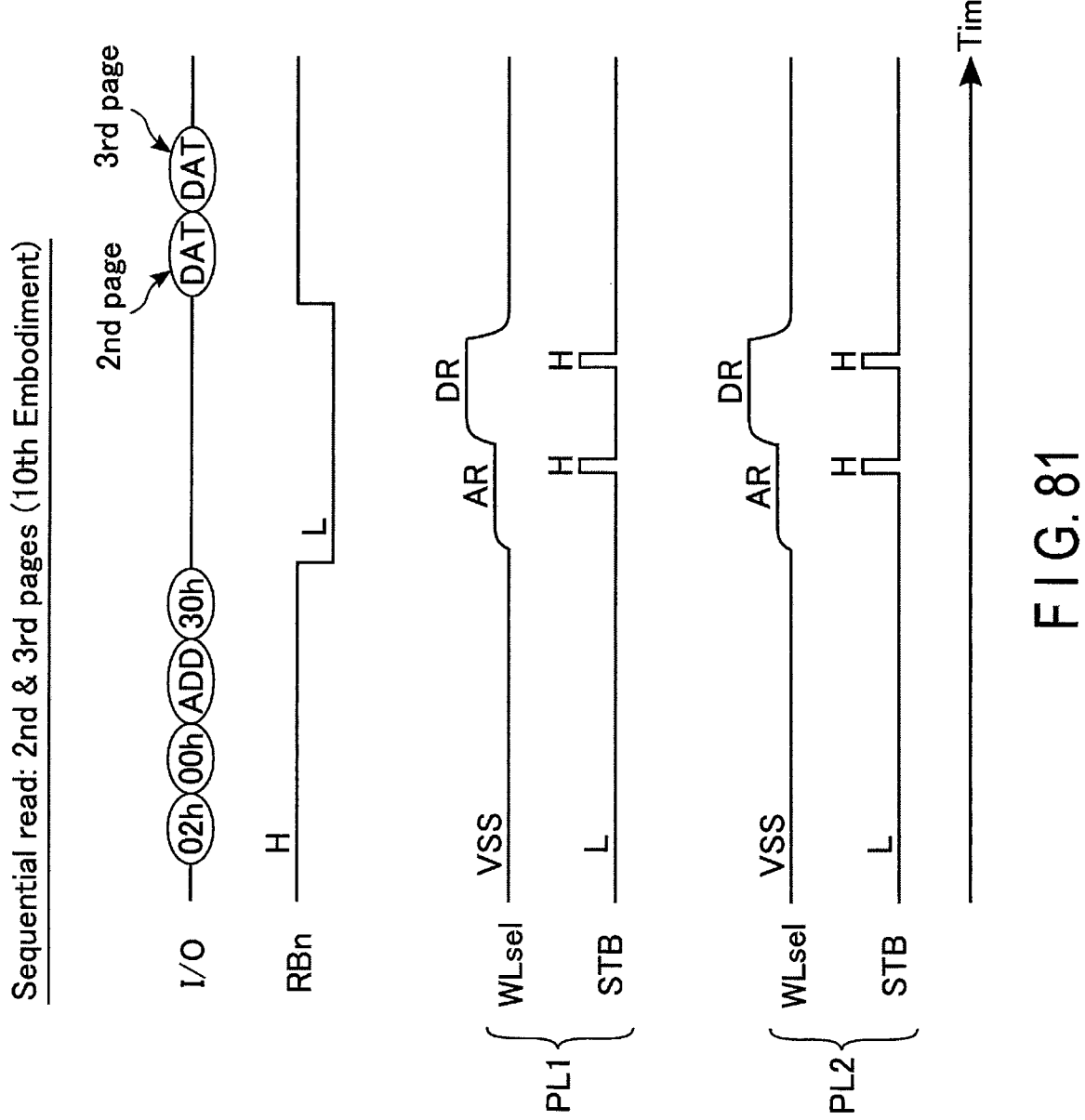
F I G. 81

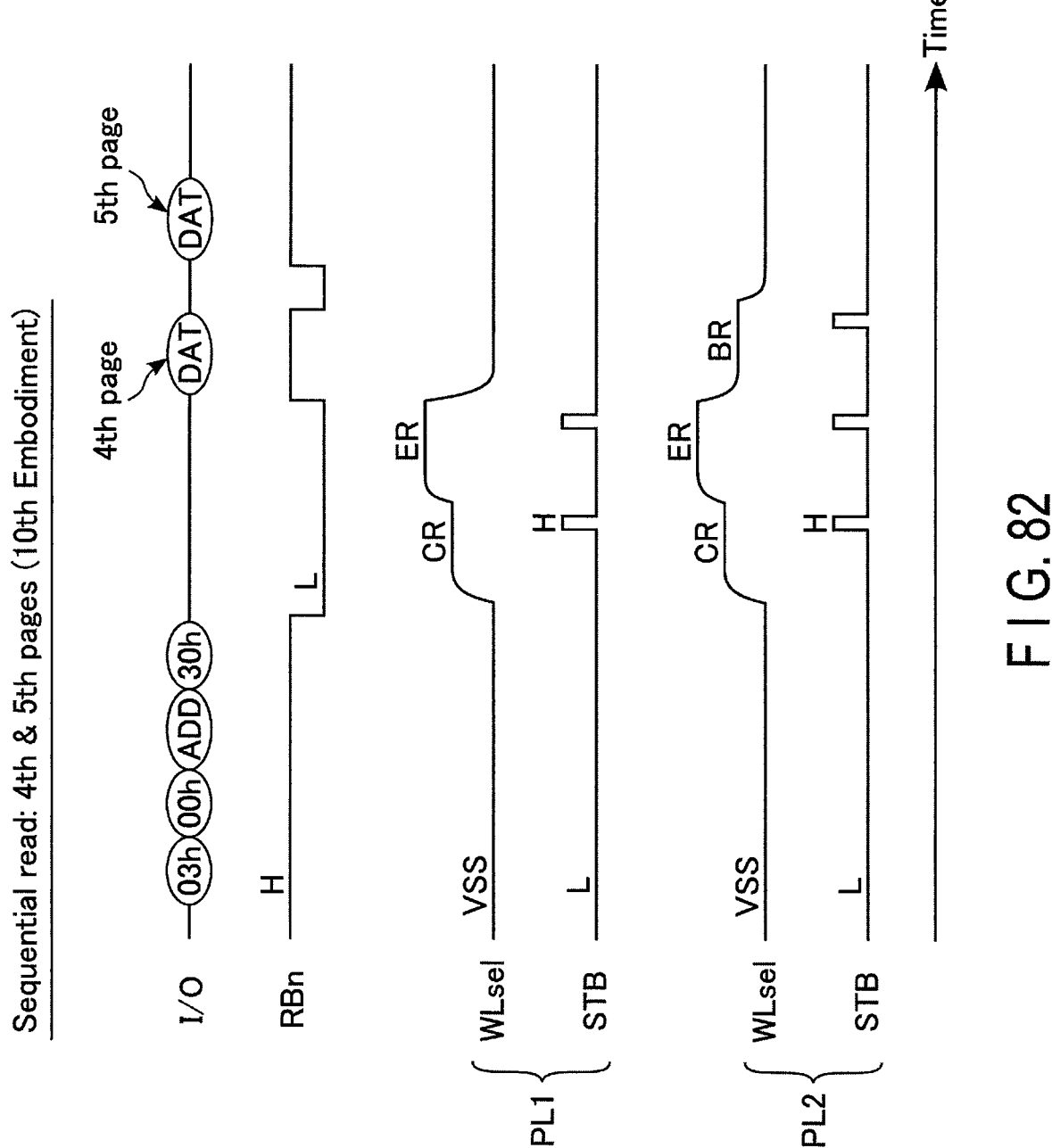
F I G. 82

10
| Input/output circuit | ~19 |
| Logic circuit | ~18 |
BUS0
BUS1
17
| SAU0 | ... | SAU(k−1) | | SAUk | ... | SAUm |
BL0 ··· BL(k−1) BLk ··· BLm
11
NS
WLi — MTa    MTa    MTb    MTb
F I G. 83

Page size = 8 kB/16 kB (in non-WL-divided case)
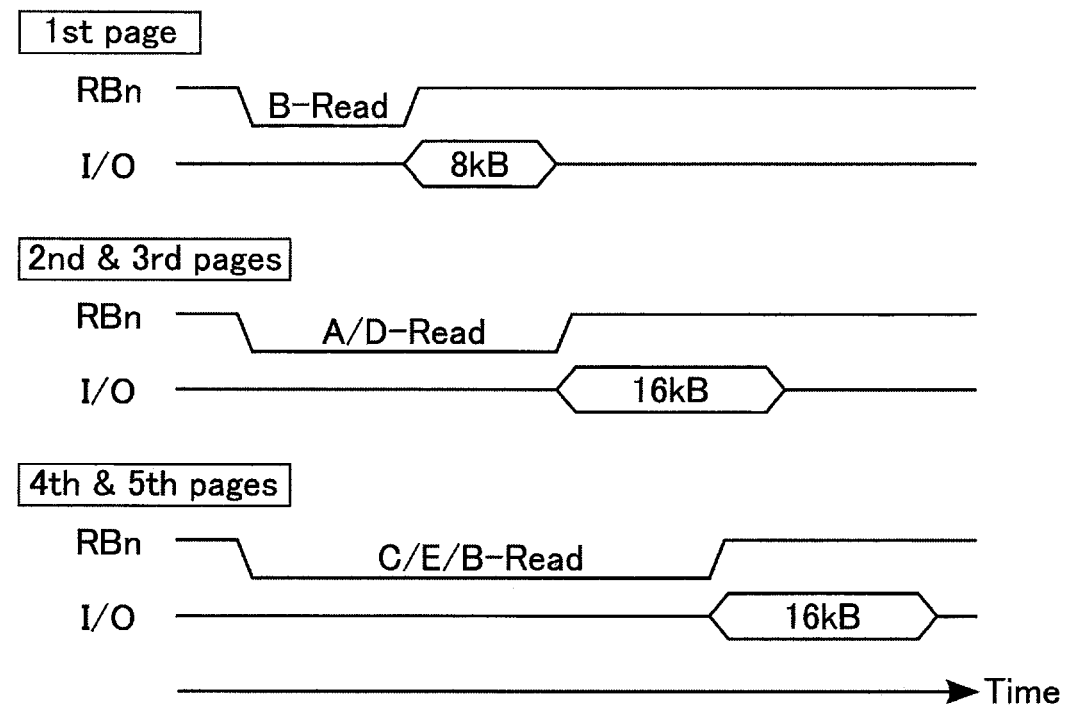
F I G. 84

Page size = 8 kB (in WL-divided case)
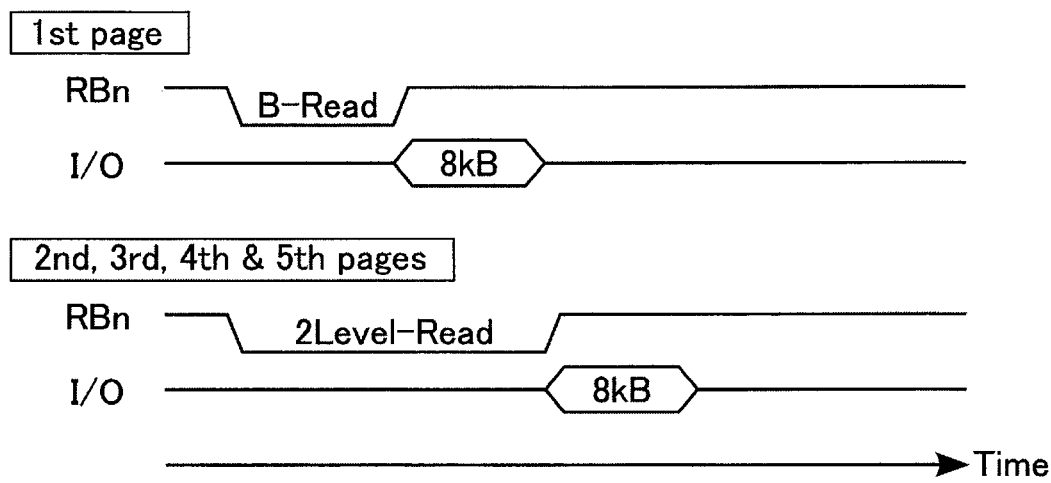
F I G. 85

Data allocation (1st Modification of 10th embodiment)

| | Vth of memory cells | | Data | | | | |
|---|---|---|---|---|---|---|---|
| | 1st plane | 2nd plane | 1st page | 2nd page | 3rd page | 4th page | 5th page |
| (1) | Z | Z | 0 | 0 | 0 | 0 | 0 |
| (2) | Z | A | 0 | 0 | 0 | 1 | 1 |
| (3) | Z | B | 0 | 1 | 0 | 1 | 1 |
| (4) | Z | C | 0 | 1 | 1 | 1 | 1 |
| (5) | Z | D | 1 | 1 | 1 | 0 | 1 |
| (6) | Z | E | 1 | 1 | 1 | 0 | 0 |
| (7) | A | Z | 0 | 0 | 0 | 1 | 0 |
| (8) | A | A | 0 | 0 | 0 | 0 | 1 |
| (9) | A | B | 0 | 1 | 0 | 0 | 1 |
| (10) | A | C | 0 | 1 | 1 | 0 | 1 |
| (11) | A | D | 1 | 1 | 1 | 1 | 1 |
| (12) | A | E | 1 | 1 | 1 | 1 | 0 |
| (13) | B | Z | 0 | 0 | 1 | 1 | 1 |
| (14) | B | A | 0 | 0 | 1 | 0 | 0 |
| (15) | B | B | 0 | 1 | 1 | 0 | 0 |
| (16) | B | C | 0 | 1 | 0 | 0 | 0 |
| (17) | B | D | 1 | 1 | 0 | 1 | 0 |
| (18) | B | E | 1 | 1 | 0 | 1 | 1 |
| (19) | C | Z | 0 | 0 | 1 | 0 | 1 |
| (20) | C | A | 0 | 0 | 1 | 1 | 0 |
| (21) | C | B | 0 | 1 | 1 | 1 | 0 |
| (22) | C | C | 0 | 1 | 0 | 1 | 0 |
| (23) | C | D | 1 | 1 | 0 | 0 | 0 |
| (24) | C | E | 1 | 1 | 0 | 0 | 1 |
| (25) | D | Z | 1 | 0 | 1 | 0 | 1 |
| (26) | D | A | 1 | 0 | 1 | 1 | 0 |
| (27) | D | B | 1 | 0 | 1 | 1 | 0 |
| (28) | D | C | 1 | 0 | 0 | 1 | 0 |
| (29) | D | D | 1 | 0 | 0 | 0 | 0 |
| (30) | D | E | 1 | 0 | 0 | 0 | 1 |
| (31) | E | Z | 1 | 0 | 1 | 0 | 0 |
| (32) | E | A | 1 | 0 | 1 | 1 | 1 |
| (33) | E | B | 1 | 0 | 1 | 1 | 1 |
| (34) | E | C | 1 | 0 | 0 | 1 | 1 |
| (35) | E | D | 1 | 0 | 0 | 0 | 1 |
| (36) | E | E | 1 | 0 | 0 | 0 | 0 |

F I G. 86

Data definitions (1st Modification of 10th embodiment)

| Read operation | Read voltages | | Read data | | | | |
|---|---|---|---|---|---|---|---|
| | PL1 | PL2 | PL1:PL2 (0:0) | PL1:PL2 (1:0) | PL1:PL2 (0:1) | PL1:PL2 (1:1) | |
| 1st page | DR | DR | 0 | 1 | 1 | 1 | |
| 2nd page | DR | BR | 0 | 1 | 0 | 0 | |
| 3rd page | BR | CR | 0 | 1 | 1 | 0 | |
| 4th page | AR,CR | AR,DR | 0 | 0 | 1 | 0 | |
| 5th page | BR,ER | AR,ER | 0 | 1 | 1 | 0 | |

FIG. 87

Data allocation (2nd Modification of 10th embodiment)

| | Vth of memory cells | | Data | | | | |
|---|---|---|---|---|---|---|---|
| | 1st plane | 2nd plane | 1st page | 2nd page | 3rd page | 4th page | 5th page |
| (1) | Z | Z | 0 | 0 | 0 | 0 | 0 |
| (2) | Z | A | 0 | 0 | 0 | 1 | 0 |
| (3) | Z | B | 0 | 0 | 0 | 1 | 1 |
| (4) | Z | C | 0 | 0 | 1 | 1 | 1 |
| (5) | Z | D | 0 | 1 | 1 | 0 | 1 |
| (6) | Z | E | 0 | 1 | 0 | 0 | 1 |
| (7) | A | Z | 0 | 0 | 0 | 1 | 0 |
| (8) | A | A | 0 | 0 | 0 | 0 | 0 |
| (9) | A | B | 0 | 0 | 0 | 0 | 1 |
| (10) | A | C | 0 | 0 | 1 | 0 | 1 |
| (11) | A | D | 0 | 1 | 1 | 1 | 1 |
| (12) | A | E | 0 | 1 | 0 | 1 | 1 |
| (13) | B | Z | 0 | 0 | 0 | 1 | 0 |
| (14) | B | A | 0 | 0 | 0 | 0 | 0 |
| (15) | B | B | 1 | 0 | 0 | 0 | 1 |
| (16) | B | C | 1 | 0 | 1 | 0 | 1 |
| (17) | B | D | 1 | 1 | 1 | 1 | 1 |
| (18) | B | E | 1 | 1 | 0 | 1 | 1 |
| (19) | C | Z | 0 | 0 | 1 | 1 | 0 |
| (20) | C | A | 0 | 0 | 1 | 0 | 0 |
| (21) | C | B | 1 | 0 | 1 | 0 | 0 |
| (22) | C | C | 1 | 0 | 0 | 0 | 0 |
| (23) | C | D | 1 | 1 | 0 | 1 | 0 |
| (24) | C | E | 1 | 1 | 1 | 1 | 0 |
| (25) | D | Z | 0 | 1 | 1 | 1 | 0 |
| (26) | D | A | 0 | 1 | 1 | 0 | 0 |
| (27) | D | B | 1 | 1 | 1 | 0 | 0 |
| (28) | D | C | 1 | 1 | 0 | 0 | 0 |
| (29) | D | D | 1 | 0 | 0 | 1 | 0 |
| (30) | D | E | 1 | 0 | 1 | 1 | 0 |
| (31) | E | Z | 0 | 1 | 0 | 1 | 0 |
| (32) | E | A | 0 | 1 | 0 | 0 | 0 |
| (33) | E | B | 1 | 1 | 0 | 0 | 1 |
| (34) | E | C | 1 | 1 | 1 | 0 | 1 |
| (35) | E | D | 1 | 0 | 1 | 1 | 1 |
| (36) | E | E | 1 | 0 | 0 | 1 | 1 |

F I G. 88

Data definitions (2nd Modification of 10th embodiment)

| Read operation | Read voltages | | Read data | | | | |
|---|---|---|---|---|---|---|---|
| | PL1 | PL2 | PL1:PL2 (0:0) | PL1:PL2 (1:0) | PL1:PL2 (0:1) | PL1:PL2 (1:1) | |
| 1st page | BR | BR | 0 | 0 | 0 | 1 | |
| 2nd page | DR | DR | 0 | 1 | 1 | 0 | |
| 3rd page | AR,CR | AR,CR | 0 | 1 | 1 | 0 | |
| 4th page | AR | DR | 0 | 1 | 1 | 0 | |
| 5th page | CR,ER | BR | 0 | 1 | 0 | 0 | |

F I G. 89

Data allocation (3rd Modification of 10th embodiment)

| | Vth of memory cells | | Data | | | | |
|---|---|---|---|---|---|---|---|
| | 1st plane | 2nd plane | 1st page | 2nd page | 3rd page | 4th page | 5th page |
| (1) | Z | Z | 0 | 0 | 0 | 0 | 0 |
| (2) | Z | A | 1 | 0 | 0 | 0 | 0 |
| (3) | Z | B | 1 | 0 | 0 | 1 | 1 |
| (4) | Z | C | 1 | 0 | 1 | 1 | 1 |
| (5) | Z | D | 0 | 0 | 1 | 1 | 1 |
| (6) | Z | E | 0 | 0 | 0 | 1 | 0 |
| (7) | A | Z | 0 | 1 | 0 | 0 | 0 |
| (8) | A | A | 1 | 1 | 0 | 0 | 0 |
| (9) | A | B | 1 | 1 | 0 | 1 | 1 |
| (10) | A | C | 1 | 1 | 1 | 1 | 1 |
| (11) | A | D | 0 | 1 | 1 | 1 | 1 |
| (12) | A | E | 0 | 1 | 0 | 1 | 0 |
| (13) | B | Z | 0 | 1 | 0 | 0 | 1 |
| (14) | B | A | 1 | 1 | 0 | 0 | 1 |
| (15) | B | B | 1 | 1 | 0 | 1 | 0 |
| (16) | B | C | 1 | 1 | 1 | 1 | 0 |
| (17) | B | D | 0 | 1 | 1 | 1 | 0 |
| (18) | B | E | 0 | 1 | 0 | 1 | 1 |
| (19) | C | Z | 0 | 1 | 1 | 0 | 1 |
| (20) | C | A | 1 | 1 | 1 | 0 | 1 |
| (21) | C | B | 1 | 1 | 1 | 0 | 0 |
| (22) | C | C | 1 | 1 | 1 | 0 | 0 |
| (23) | C | D | 0 | 1 | 1 | 0 | 0 |
| (24) | C | E | 0 | 1 | 1 | 0 | 1 |
| (25) | D | Z | 0 | 0 | 1 | 0 | 1 |
| (26) | D | A | 1 | 0 | 1 | 0 | 1 |
| (27) | D | B | 1 | 0 | 1 | 0 | 0 |
| (28) | D | C | 1 | 0 | 1 | 0 | 0 |
| (29) | D | D | 0 | 0 | 1 | 0 | 0 |
| (30) | D | E | 0 | 0 | 1 | 0 | 1 |
| (31) | E | Z | 0 | 0 | 0 | 0 | 1 |
| (32) | E | A | 1 | 0 | 0 | 0 | 1 |
| (33) | E | B | 1 | 0 | 0 | 1 | 0 |
| (34) | E | C | 1 | 0 | 1 | 1 | 0 |
| (35) | E | D | 0 | 0 | 1 | 1 | 0 |
| (36) | E | E | 0 | 0 | 0 | 1 | 1 |

F I G. 90

Data definitions (3rd Modification of 10th embodiment)

| Read operation | Read voltages | | Read data | | | | |
|---|---|---|---|---|---|---|---|
| | PL1 | PL2 | PL1:PL2 (0:0) | PL1:PL2 (1.0) | PL1:PL2 (0:1) | PL1:PL2 (1:1) | |
| 1st page | - | AR,DR | 0 | 0 | 1 | 1 | |
| 2nd page | AR,DR | - | 0 | 1 | 0 | 1 | |
| 3rd page | CR,ER | CR,ER | 0 | 1 | 1 | 1 | |
| 4th page | CR,ER | BR | 0 | 0 | 1 | 0 | |
| 5th page | BR | BR,ER | 0 | 1 | 1 | 0 | |

F I G. 91

Page size = 8 kB/16 kB (in non-WL-divided case)

Data allocation (4th Modification of 10th embodiment)

| | Vth of memory cells | | Data | | | | |
|---|---|---|---|---|---|---|---|
| | 1st plane | 2nd plane | 1st page | 2nd page | 3rd page | 4th page | 5th page |
| (1) | Z | Z | 0 | 0 | 0 | 0 | 0 |
| (2) | Z | A | 0 | 1 | 0 | 0 | 0 |
| (3) | Z | B | 0 | 1 | 0 | 1 | 0 |
| (4) | Z | C | 0 | 1 | 0 | 1 | 0 |
| (5) | Z | D | 0 | 0 | 0 | 1 | 0 |
| (6) | Z | E | 0 | 0 | 0 | 1 | 0 |
| (7) | A | Z | 0 | 0 | 1 | 0 | 0 |
| (8) | A | A | 0 | 1 | 1 | 0 | 0 |
| (9) | A | B | 0 | 1 | 1 | 1 | 0 |
| (10) | A | C | 0 | 1 | 1 | 1 | 0 |
| (11) | A | D | 0 | 0 | 1 | 1 | 0 |
| (12) | A | E | 0 | 0 | 1 | 1 | 0 |
| (13) | B | Z | 0 | 0 | 1 | 0 | 1 |
| (14) | B | A | 0 | 1 | 1 | 0 | 1 |
| (15) | B | B | 1 | 1 | 1 | 1 | 1 |
| (16) | B | C | 1 | 1 | 1 | 1 | 0 |
| (17) | B | D | 1 | 0 | 1 | 1 | 0 |
| (18) | B | E | 1 | 0 | 1 | 1 | 1 |
| (19) | C | Z | 0 | 0 | 1 | 1 | 1 |
| (20) | C | A | 0 | 1 | 1 | 1 | 1 |
| (21) | C | B | 1 | 1 | 1 | 0 | 1 |
| (22) | C | C | 1 | 1 | 1 | 0 | 0 |
| (23) | C | D | 1 | 0 | 1 | 0 | 0 |
| (24) | C | E | 1 | 0 | 1 | 0 | 1 |
| (25) | D | Z | 0 | 0 | 0 | 1 | 1 |
| (26) | D | A | 0 | 1 | 0 | 1 | 1 |
| (27) | D | B | 1 | 1 | 0 | 0 | 1 |
| (28) | D | C | 1 | 1 | 0 | 0 | 0 |
| (29) | D | D | 1 | 0 | 0 | 0 | 0 |
| (30) | D | E | 1 | 0 | 0 | 0 | 1 |
| (31) | E | Z | 0 | 0 | 0 | 0 | 1 |
| (32) | E | A | 0 | 1 | 0 | 0 | 1 |
| (33) | E | B | 1 | 1 | 0 | 1 | 1 |
| (34) | E | C | 1 | 1 | 0 | 1 | 0 |
| (35) | E | D | 1 | 0 | 0 | 1 | 0 |
| (36) | E | E | 1 | 0 | 0 | 1 | 1 |

F I G. 93

Data definitions (4th Modification of 10th embodiment)

| Read operation | Read voltages | | Read data | | | |
|---|---|---|---|---|---|---|
| | PL1 | PL2 | PL1:PL2 (0:0) | PL1:PL2 (1:0) | PL1:PL2 (0:1) | PL1:PL2 (1:1) |
| 1st page | BR | BR | 0 | 0 | 0 | 1 |
| 2nd page | — | AR,DR | 0 | 0 | 1 | 1 |
| 3rd page | AR,DR | — | 0 | 1 | 0 | 1 |
| 4th page | CR,ER | BR | 0 | 1 | 1 | 0 |
| 5th page | BR | CR,ER | 0 | 1 | 0 | 0 |

F I G. 94

| | Average number of times that read is performed | | | | Number of overlaps |
| | WL-divided | Non-WL-divided | | | |
| | 8kB × 5Page | 8kB × 5Page | 8kB × 1Page + 16kB × 2Page | 16kB × 1Page + 24kB × 1Page | |
| 10th Embodiment | (1+2+2+2)/5 =1.8 times | (1+2+2+2+3)/5 =2.0 times | (1+2+3)/2.5 =2.4 times | — | 2 |
| 1st Modification | (1+1+1+2)/5 =1.4 times | (1+2+3+3)/5 =2.2 times | (1+2+4)/2.5 =2.8 times | — | 4 |
| 2nd Modification | (1+1+2+2)/5 =1.6 times | (1+1+2+2+3)/5 =1.8 times | (1+2+3)/2.5 =2.4 times | — | 4 |
| 3rd Modification | (2+2+2+2)/5 =2.0 times | (2+2+2+2+3)/5 =2.2 times | (2+2+3)/2.5 =2.8 times | (2+3)/5=1.0 times (1 page is 8 kB in terms of kilobytes) | 4 |
| 4th Modification | (1+2+2+2)/5 =1.8 times | (1+2+2+3+3)/5 =2.2 times | (1+2+3)/2.5 =2.4 times | (2+3)/5=1.0 times (1 page is 8 kB in terms of kilobytes) | 2 |
| 5th Modification | (1+1+1+3+3)/5 =1.8 times | (1+2+2+3+3)/5 =2.2 times | (1+2+3)/2.5 =2.4 times | (2+3)/5=1.0 times (1 page is 8 kB in terms of kilobytes) | 2 |

F I G. 95

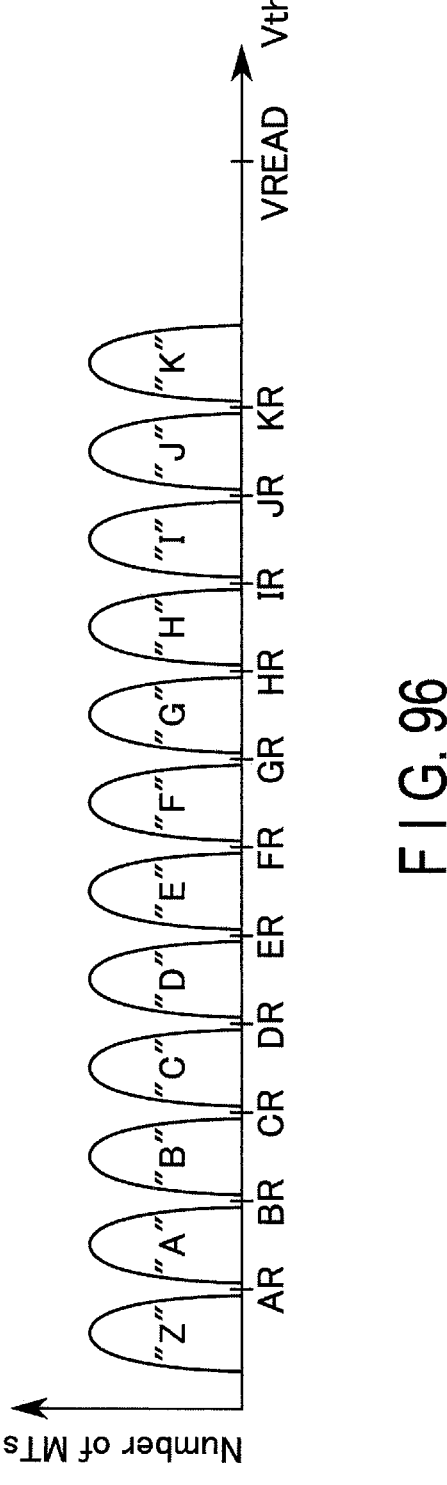
F I G. 96

Data allocation (1/4) (11th Embodiment)

| | Vth of MT | | Data | | | | | | |
|---|---|---|---|---|---|---|---|---|---|
| | PL1 | PL2 | 1st page | 2nd page | 3rd page | 4th page | 5th page | 6th page | 7th page |
| (1) | Z | Z | 0 | 0 | 0 | 0 | 0 | 0 | 0 |
| (2) | Z | A | 0 | 0 | 1 | 0 | 0 | 1 | 0 |
| (3) | Z | B | 0 | 0 | 1 | 0 | 1 | 0 | 0 |
| (4) | Z | C | 0 | 0 | 1 | 1 | 1 | 0 | 1 |
| (5) | Z | D | 0 | 1 | 1 | 1 | 1 | 0 | 1 |
| (6) | Z | E | 0 | 1 | 1 | 1 | 0 | 0 | 1 |
| (7) | Z | F | 0 | 1 | 0 | 1 | 0 | 1 | 1 |
| (8) | Z | G | 0 | 1 | 0 | 1 | 1 | 1 | 1 |
| (9) | Z | H | 1 | 1 | 0 | 1 | 1 | 1 | 1 |
| (10) | Z | I | 1 | 1 | 0 | 1 | 1 | 1 | 0 |
| (11) | Z | J | 1 | 1 | 0 | 0 | 1 | 1 | 0 |
| (12) | Z | K | 1 | 1 | 0 | 0 | 1 | 1 | 1 |
| (13) | A | Z | 0 | 0 | 1 | 0 | 0 | 0 | 0 |
| (14) | A | A | 0 | 0 | 0 | 0 | 0 | 1 | 0 |
| (15) | A | B | 0 | 0 | 0 | 0 | 1 | 0 | 0 |
| (16) | A | C | 0 | 0 | 0 | 1 | 1 | 0 | 1 |
| (17) | A | D | 0 | 1 | 0 | 1 | 1 | 0 | 1 |
| (18) | A | E | 0 | 1 | 0 | 1 | 0 | 0 | 1 |
| (19) | A | F | 0 | 1 | 1 | 1 | 0 | 1 | 1 |
| (20) | A | G | 0 | 1 | 1 | 1 | 1 | 1 | 1 |
| (21) | A | H | 1 | 1 | 1 | 1 | 1 | 1 | 1 |
| (22) | A | I | 1 | 1 | 1 | 1 | 1 | 1 | 0 |
| (23) | A | J | 1 | 1 | 1 | 0 | 1 | 1 | 0 |
| (24) | A | K | 1 | 1 | 1 | 0 | 1 | 1 | 1 |
| (25) | B | Z | 0 | 0 | 1 | 1 | 1 | 0 | 0 |
| (26) | B | A | 0 | 0 | 0 | 1 | 1 | 1 | 0 |
| (27) | B | B | 0 | 0 | 0 | 1 | 0 | 0 | 0 |
| (28) | B | C | 0 | 0 | 0 | 0 | 0 | 0 | 1 |
| (29) | B | D | 0 | 1 | 0 | 0 | 0 | 0 | 1 |
| (30) | B | E | 0 | 1 | 0 | 0 | 1 | 0 | 1 |
| (31) | B | F | 0 | 1 | 1 | 0 | 1 | 1 | 1 |
| (32) | B | G | 0 | 1 | 1 | 0 | 0 | 1 | 1 |
| (33) | B | H | 1 | 1 | 1 | 0 | 0 | 1 | 1 |
| (34) | B | I | 1 | 1 | 1 | 0 | 0 | 1 | 0 |
| (35) | B | J | 1 | 1 | 1 | 1 | 0 | 1 | 0 |
| (36) | B | K | 1 | 1 | 1 | 1 | 0 | 1 | 1 |

FIG. 97

Data allocation (2/4) (11th Embodiment)

| | Vth of MT | | Data | | | | | | |
|---|---|---|---|---|---|---|---|---|---|
| | PL1 | PL2 | 1st page | 2nd page | 3rd page | 4th page | 5th page | 6th page | 7th page |
| (37) | C | Z | 0 | 0 | 1 | 1 | 1 | 1 | 0 |
| (38) | C | A | 0 | 0 | 0 | 1 | 1 | 0 | 0 |
| (39) | C | B | 0 | 0 | 0 | 1 | 0 | 1 | 0 |
| (40) | C | C | 0 | 0 | 0 | 0 | 0 | 1 | 1 |
| (41) | C | D | 0 | 1 | 0 | 0 | 0 | 1 | 1 |
| (42) | C | E | 0 | 1 | 0 | 0 | 1 | 1 | 1 |
| (43) | C | F | 0 | 1 | 1 | 0 | 1 | 0 | 1 |
| (44) | C | G | 0 | 1 | 1 | 0 | 0 | 0 | 1 |
| (45) | C | H | 1 | 1 | 1 | 0 | 0 | 0 | 1 |
| (46) | C | I | 1 | 1 | 1 | 0 | 0 | 0 | 0 |
| (47) | C | J | 1 | 1 | 1 | 1 | 0 | 0 | 0 |
| (48) | C | K | 1 | 1 | 1 | 1 | 0 | 0 | 1 |
| (49) | D | Z | 0 | 0 | 1 | 1 | 0 | 1 | 1 |
| (50) | D | A | 0 | 0 | 0 | 1 | 0 | 0 | 1 |
| (51) | D | B | 0 | 0 | 0 | 1 | 1 | 1 | 1 |
| (52) | D | C | 0 | 0 | 0 | 0 | 1 | 1 | 0 |
| (53) | D | D | 0 | 1 | 0 | 0 | 1 | 1 | 0 |
| (54) | D | E | 0 | 1 | 0 | 0 | 0 | 1 | 0 |
| (55) | D | F | 0 | 1 | 1 | 0 | 0 | 0 | 0 |
| (56) | D | G | 0 | 1 | 1 | 0 | 1 | 0 | 0 |
| (57) | D | H | 1 | 1 | 1 | 0 | 1 | 0 | 0 |
| (58) | D | I | 1 | 1 | 1 | 0 | 1 | 0 | 1 |
| (59) | D | J | 1 | 1 | 1 | 1 | 1 | 0 | 1 |
| (60) | D | K | 1 | 1 | 1 | 1 | 1 | 0 | 0 |
| (61) | E | Z | 0 | 0 | 0 | 1 | 0 | 1 | 1 |
| (62) | E | A | 0 | 0 | 1 | 1 | 0 | 0 | 1 |
| (63) | E | B | 0 | 0 | 1 | 1 | 1 | 1 | 1 |
| (64) | E | C | 0 | 0 | 1 | 0 | 1 | 1 | 0 |
| (65) | E | D | 0 | 1 | 1 | 0 | 1 | 1 | 0 |
| (66) | E | E | 0 | 1 | 1 | 0 | 0 | 1 | 0 |
| (67) | E | F | 0 | 1 | 0 | 0 | 0 | 0 | 0 |
| (68) | E | G | 0 | 1 | 0 | 0 | 1 | 0 | 0 |
| (69) | E | H | 1 | 1 | 0 | 0 | 1 | 0 | 0 |
| (70) | E | I | 1 | 1 | 0 | 0 | 1 | 0 | 1 |
| (71) | E | J | 1 | 1 | 0 | 1 | 1 | 0 | 1 |
| (72) | E | K | 1 | 1 | 0 | 1 | 1 | 0 | 0 |

F I G. 98

Data allocation (3/4) (11th Embodiment)

| | Vth of MT | | Data | | | | | | |
|---|---|---|---|---|---|---|---|---|---|
| | PL1 | PL2 | 1st page | 2nd page | 3rd page | 4th page | 5th page | 6th page | 7th page |
| (73) | F | Z | 0 | 0 | 0 | 0 | 1 | 1 | 1 |
| (74) | F | A | 0 | 0 | 1 | 0 | 1 | 0 | 1 |
| (75) | F | B | 0 | 0 | 1 | 0 | 0 | 1 | 1 |
| (76) | F | C | 0 | 0 | 1 | 1 | 0 | 1 | 0 |
| (77) | F | D | 0 | 1 | 1 | 1 | 0 | 1 | 0 |
| (78) | F | E | 0 | 1 | 1 | 1 | 1 | 1 | 0 |
| (79) | F | F | 0 | 1 | 0 | 1 | 1 | 0 | 0 |
| (80) | F | G | 0 | 1 | 0 | 1 | 0 | 0 | 0 |
| (81) | F | H | 1 | 1 | 0 | 1 | 0 | 0 | 0 |
| (82) | F | I | 1 | 1 | 0 | 1 | 0 | 0 | 1 |
| (83) | F | J | 1 | 1 | 0 | 0 | 0 | 0 | 1 |
| (84) | F | K | 1 | 1 | 0 | 0 | 0 | 0 | 0 |
| (85) | G | Z | 0 | 0 | 0 | 0 | 1 | 0 | 1 |
| (86) | G | A | 0 | 0 | 1 | 0 | 1 | 1 | 1 |
| (87) | G | B | 0 | 0 | 1 | 0 | 0 | 0 | 1 |
| (88) | G | C | 0 | 0 | 1 | 1 | 0 | 0 | 0 |
| (89) | G | D | 0 | 1 | 1 | 1 | 0 | 0 | 0 |
| (90) | G | E | 0 | 1 | 1 | 1 | 1 | 0 | 0 |
| (91) | G | F | 0 | 1 | 0 | 1 | 1 | 1 | 0 |
| (92) | G | G | 0 | 1 | 0 | 1 | 0 | 1 | 0 |
| (93) | G | H | 1 | 1 | 0 | 1 | 0 | 1 | 0 |
| (94) | G | I | 1 | 1 | 0 | 1 | 0 | 1 | 1 |
| (95) | G | J | 1 | 1 | 0 | 0 | 0 | 1 | 1 |
| (96) | G | K | 1 | 1 | 0 | 0 | 0 | 1 | 0 |
| (97) | H | Z | 1 | 0 | 0 | 0 | 1 | 0 | 1 |
| (98) | H | A | 1 | 0 | 1 | 0 | 1 | 1 | 1 |
| (99) | H | B | 1 | 0 | 1 | 0 | 0 | 0 | 1 |
| (100) | H | C | 1 | 0 | 1 | 1 | 0 | 0 | 0 |
| (101) | H | D | 1 | 0 | 1 | 1 | 0 | 0 | 0 |
| (102) | H | E | 1 | 0 | 1 | 1 | 1 | 0 | 0 |
| (103) | H | F | 1 | 0 | 0 | 1 | 1 | 1 | 0 |
| (104) | H | G | 1 | 0 | 0 | 1 | 0 | 1 | 0 |
| (105) | H | H | 1 | 0 | 0 | 1 | 0 | 1 | 0 |
| (106) | H | I | 1 | 0 | 0 | 1 | 0 | 1 | 1 |
| (107) | H | J | 1 | 0 | 0 | 0 | 0 | 1 | 1 |
| (108) | H | K | 1 | 0 | 0 | 0 | 0 | 1 | 0 |

F I G. 99

Data allocation (4/4) (11th Embodiment)

| | Vth of MT | | Data | | | | | | |
|---|---|---|---|---|---|---|---|---|---|
| | PL1 | PL2 | 1st page | 2nd page | 3rd page | 4th page | 5th page | 6th page | 7th page |
| (109) | I | Z | 1 | 0 | 0 | 0 | 1 | 0 | 0 |
| (110) | I | A | 1 | 0 | 1 | 0 | 1 | 1 | 0 |
| (111) | I | B | 1 | 0 | 1 | 0 | 0 | 0 | 0 |
| (112) | I | C | 1 | 0 | 1 | 1 | 0 | 0 | 1 |
| (113) | I | D | 1 | 0 | 1 | 1 | 0 | 0 | 1 |
| (114) | I | E | 1 | 0 | 1 | 1 | 1 | 0 | 1 |
| (115) | I | F | 1 | 0 | 0 | 1 | 1 | 1 | 1 |
| (116) | I | G | 1 | 0 | 0 | 1 | 0 | 1 | 1 |
| (117) | I | H | 1 | 0 | 0 | 1 | 0 | 1 | 1 |
| (118) | I | I | 1 | 0 | 0 | 1 | 0 | 1 | 0 |
| (119) | I | J | 1 | 0 | 0 | 0 | 0 | 1 | 0 |
| (120) | I | K | 1 | 0 | 0 | 0 | 0 | 1 | 1 |
| (121) | J | Z | 1 | 0 | 0 | 0 | 1 | 1 | 0 |
| (122) | J | A | 1 | 0 | 1 | 0 | 1 | 0 | 0 |
| (123) | J | B | 1 | 0 | 1 | 0 | 0 | 1 | 0 |
| (124) | J | C | 1 | 0 | 1 | 1 | 0 | 1 | 1 |
| (125) | J | D | 1 | 0 | 1 | 1 | 0 | 1 | 1 |
| (126) | J | E | 1 | 0 | 1 | 1 | 1 | 1 | 1 |
| (127) | J | F | 1 | 0 | 0 | 1 | 1 | 0 | 1 |
| (128) | J | G | 1 | 0 | 0 | 1 | 0 | 0 | 1 |
| (129) | J | H | 1 | 0 | 0 | 1 | 0 | 0 | 1 |
| (130) | J | I | 1 | 0 | 0 | 1 | 0 | 0 | 0 |
| (131) | J | J | 1 | 0 | 0 | 0 | 0 | 0 | 0 |
| (132) | J | K | 1 | 0 | 0 | 0 | 0 | 0 | 1 |
| (133) | K | Z | 1 | 0 | 0 | 0 | 1 | 1 | 1 |
| (134) | K | A | 1 | 0 | 1 | 0 | 1 | 0 | 1 |
| (135) | K | B | 1 | 0 | 1 | 0 | 0 | 1 | 1 |
| (136) | K | C | 1 | 0 | 1 | 1 | 0 | 1 | 0 |
| (137) | K | D | 1 | 0 | 1 | 1 | 0 | 1 | 0 |
| (138) | K | E | 1 | 0 | 1 | 1 | 1 | 1 | 0 |
| (139) | K | F | 1 | 0 | 0 | 1 | 1 | 0 | 0 |
| (140) | K | G | 1 | 0 | 0 | 1 | 0 | 0 | 0 |
| (141) | K | H | 1 | 0 | 0 | 1 | 0 | 0 | 0 |
| (142) | K | I | 1 | 0 | 0 | 1 | 0 | 0 | 1 |
| (143) | K | J | 1 | 0 | 0 | 0 | 0 | 0 | 1 |
| (144) | K | K | 1 | 0 | 0 | 0 | 0 | 0 | 0 |

F I G. 100

Data definitions (11th Embodiment)

| Read operation | Read voltages | | Read data | | | |
|---|---|---|---|---|---|---|
| | PL1 | PL2 | PL1:PL2 (0:0) | PL1:PL2 (1:0) | PL1:PL2 (0:1) | PL1:PL2 (1:1) |
| 1st page | HR | HR | 0 | 1 | 1 | 1 |
| 2nd page | HR | DR | 0 | 1 | 0 | 0 |
| 3rd page | AR,ER | AR,FR | 0 | 1 | 1 | 0 |
| 4th page | BR,FR | CR,JR | 0 | 1 | 1 | 0 |
| 5th page | BR,DR,FR | BR,ER,GR | 0 | 1 | 1 | 0 |
| 6th page | CR,GR,JR | AR,BR,FR | 0 | 1 | 1 | 0 |
| 7th page | DR,IR,KR | CR,IR,KR | 0 | 1 | 1 | 0 |

F I G. 101

Data allocation (12th Embodiment)

| | Vth of memory cells | | Data | | | |
|---|---|---|---|---|---|---|
| | 1st plane | 2nd plane | 1st page | 2nd page | 3rd page | 4th page |
| (1) | Z | Z | 1 | 1 | 0 | 0 |
| (2) | Z | A | 1 | 1 | 1 | 0 |
| (3) | Z | B | 1 | 0 | 1 | 0 |
| (4) | Z | C | 1 | 0 | 1 | 1 |
| (5) | A | Z | 0 | 1 | 0 | 0 |
| (6) | A | A | 0 | 1 | 1 | 0 |
| (7) | A | B | 0 | 0 | 1 | 0 |
| (8) | A | C | 0 | 0 | 1 | 1 |
| (9) | B | Z | 0 | 1 | 1 | 1 |
| (10) | B | A | 0 | 1 | 0 | 1 |
| (11) | B | B | 0 | 0 | 0 | 1 |
| (12) | B | C | 0 | 0 | 0 | 0 |
| (13) | C | Z | 1 | 1 | 1 | 1 |
| (14) | C | A | 1 | 1 | 0 | 1 |
| (15) | C | B | 1 | 0 | 0 | 1 |
| (16) | C | C | 1 | 0 | 0 | 0 |

F I G. 102

Data definitions (12th Embodiment)

| Read operation | Read voltages | | Read data | | | | |
|---|---|---|---|---|---|---|---|
| | PL1 | PL2 | PL1:PL2 (0:0) | PL1:PL2 (1:0) | PL1:PL2 (0:1) | PL1:PL2 (1:1) | |
| 1st page | AR,CR | — | 0 | 1 | 0 | 1 | |
| 2nd page | — | BR | 1 | 0 | 1 | 0 | |
| 3rd page | BR | AR | 0 | 1 | 1 | 0 | |
| 4th page | BR | CR | 0 | 1 | 1 | 0 | |

F I G. 103

Data allocation (1/2) (13th Embodiment)

| | Vth of memory cells | | Data | | | | | |
|---|---|---|---|---|---|---|---|---|
| | 1st plane | 2nd plane | 1st page | 2nd page | 3rd page | 4th page | 5th page | 6th page |
| (1) | Z | Z | 1 | 1 | 1 | 0 | 0 | 0 |
| (2) | Z | A | 1 | 1 | 1 | 0 | 1 | 0 |
| (3) | Z | B | 1 | 1 | 1 | 1 | 1 | 1 |
| (4) | Z | C | 1 | 1 | 1 | 1 | 0 | 1 |
| (5) | Z | D | 1 | 0 | 1 | 1 | 0 | 1 |
| (6) | Z | E | 1 | 0 | 1 | 1 | 0 | 0 |
| (7) | Z | F | 1 | 0 | 1 | 0 | 1 | 0 |
| (8) | Z | G | 1 | 0 | 1 | 0 | 1 | 1 |
| (9) | A | Z | 1 | 1 | 1 | 0 | 1 | 1 |
| (10) | A | A | 1 | 1 | 1 | 0 | 0 | 1 |
| (11) | A | B | 1 | 1 | 1 | 1 | 0 | 0 |
| (12) | A | C | 1 | 1 | 1 | 1 | 1 | 0 |
| (13) | A | D | 1 | 0 | 1 | 1 | 1 | 0 |
| (14) | A | E | 1 | 0 | 1 | 1 | 1 | 1 |
| (15) | A | F | 1 | 0 | 1 | 0 | 0 | 1 |
| (16) | A | G | 1 | 0 | 1 | 0 | 0 | 0 |
| (17) | B | Z | 1 | 1 | 0 | 0 | 1 | 1 |
| (18) | B | A | 1 | 1 | 0 | 0 | 0 | 1 |
| (19) | B | B | 1 | 1 | 0 | 1 | 0 | 0 |
| (20) | B | C | 1 | 1 | 0 | 1 | 1 | 0 |
| (21) | B | D | 1 | 0 | 0 | 1 | 1 | 0 |
| (22) | B | E | 1 | 0 | 0 | 1 | 1 | 1 |
| (23) | B | F | 1 | 0 | 0 | 0 | 0 | 1 |
| (24) | B | G | 1 | 0 | 0 | 0 | 0 | 0 |
| (25) | C | Z | 1 | 1 | 0 | 0 | 0 | 0 |
| (26) | C | A | 1 | 1 | 0 | 0 | 1 | 0 |
| (27) | C | B | 1 | 1 | 0 | 1 | 1 | 1 |
| (28) | C | C | 1 | 1 | 0 | 1 | 0 | 1 |
| (29) | C | D | 1 | 0 | 0 | 1 | 0 | 1 |
| (30) | C | E | 1 | 0 | 0 | 1 | 0 | 0 |
| (31) | C | F | 1 | 0 | 0 | 0 | 1 | 0 |
| (32) | C | G | 1 | 0 | 0 | 0 | 1 | 1 |

F I G. 104

Data allocation (2/2) (13th Embodiment)

| | Vth of memory cells | | Data | | | | | |
|---|---|---|---|---|---|---|---|---|
| | 1st plane | 2nd plane | 1st page | 2nd page | 3rd page | 4th page | 5th page | 6th page |
| (33) | D | Z | 0 | 1 | 0 | 0 | 0 | 0 |
| (34) | D | A | 0 | 1 | 0 | 0 | 1 | 0 |
| (35) | D | B | 0 | 1 | 0 | 1 | 1 | 1 |
| (36) | D | C | 0 | 1 | 0 | 1 | 0 | 1 |
| (37) | D | D | 0 | 0 | 0 | 1 | 0 | 1 |
| (38) | D | E | 0 | 0 | 0 | 1 | 0 | 0 |
| (39) | D | F | 0 | 0 | 0 | 0 | 1 | 0 |
| (40) | D | G | 0 | 0 | 0 | 0 | 1 | 1 |
| (41) | E | Z | 0 | 1 | 0 | 0 | 1 | 1 |
| (42) | E | A | 0 | 1 | 0 | 0 | 0 | 1 |
| (43) | E | B | 0 | 1 | 0 | 1 | 0 | 0 |
| (44) | E | C | 0 | 1 | 0 | 1 | 1 | 0 |
| (45) | E | D | 0 | 0 | 0 | 1 | 1 | 0 |
| (46) | E | E | 0 | 0 | 0 | 1 | 1 | 1 |
| (47) | E | F | 0 | 0 | 0 | 0 | 0 | 1 |
| (48) | E | G | 0 | 0 | 0 | 0 | 0 | 0 |
| (49) | F | Z | 0 | 1 | 1 | 0 | 1 | 1 |
| (50) | F | A | 0 | 1 | 1 | 0 | 0 | 1 |
| (51) | F | B | 0 | 1 | 1 | 1 | 0 | 0 |
| (52) | F | C | 0 | 1 | 1 | 1 | 1 | 0 |
| (53) | F | D | 0 | 0 | 1 | 1 | 1 | 0 |
| (54) | F | E | 0 | 0 | 1 | 1 | 1 | 1 |
| (55) | F | F | 0 | 0 | 1 | 0 | 0 | 1 |
| (56) | F | G | 0 | 0 | 1 | 0 | 0 | 0 |
| (57) | G | Z | 0 | 1 | 1 | 1 | 1 | 1 |
| (58) | G | A | 0 | 1 | 1 | 1 | 0 | 1 |
| (59) | G | B | 0 | 1 | 1 | 0 | 0 | 0 |
| (60) | G | C | 0 | 1 | 1 | 0 | 1 | 0 |
| (61) | G | D | 0 | 0 | 1 | 0 | 1 | 0 |
| (62) | G | E | 0 | 0 | 1 | 0 | 1 | 1 |
| (63) | G | F | 0 | 0 | 1 | 1 | 0 | 1 |
| (64) | G | G | 0 | 0 | 1 | 1 | 0 | 0 |

F I G. 105

Data definitions (13th Embodiment)

| Read operation | Read voltages | | Read data | | | |
|---|---|---|---|---|---|---|
| | PL1 | PL2 | PL1:PL2 (0:0) | PL1:PL2 (1:0) | PL1:PL2 (0:1) | PL1:PL2 (1:1) |
| 1st page | DR | – | 0 | 1 | 0 | 1 |
| 2nd page | – | DR | 0 | 0 | 1 | 1 |
| 3rd page | BR,FR | – | 0 | 1 | 0 | 1 |
| 4th page | GR | BR,FR | 0 | 1 | 1 | 0 |
| 5th page | AR,CR,ER | AR,CR,FR | 0 | 1 | 1 | 0 |
| 6th page | AR,CR,ER | BR,ER,GR | 0 | 1 | 1 | 0 |

F I G. 106

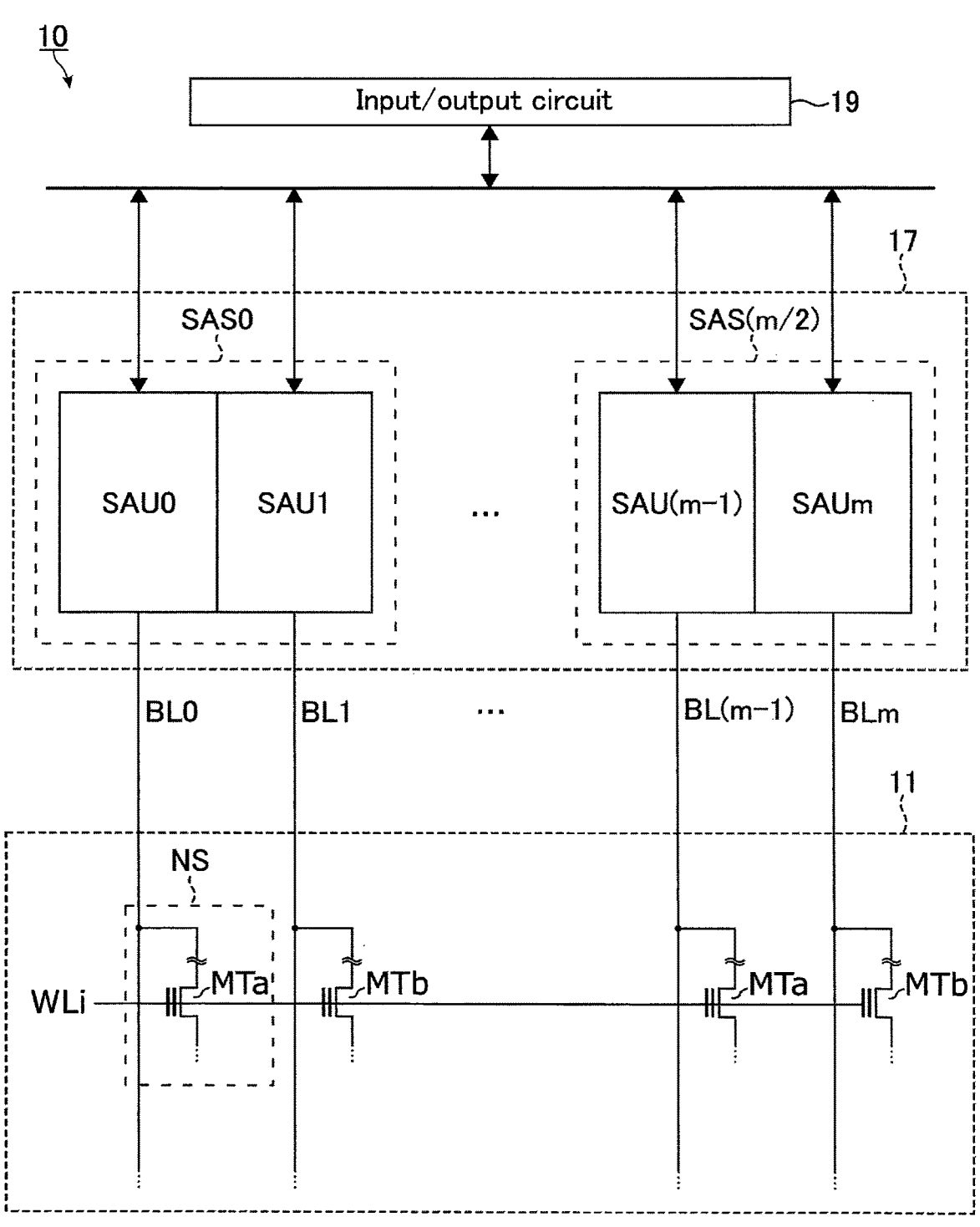
F I G. 107

Data allocation (14th Embodiment)

| | Vth of memory cells | | Data | | |
|---|---|---|---|---|---|
| | MTa | MTb | 1st page | 2nd page | 3rd page |
| (1) | Z | Z | 1 | 1 | 1 |
| (2) | Z | A | 1 | 0 | 1 |
| (3) | Z | B | 1 | 0 | 0 |
| (4) | A | Z | 1 | 1 | 1 |
| (5) | A | A | 0 | 0 | 1 |
| (6) | A | B | 0 | 0 | 0 |
| (7) | B | Z | 1 | 1 | 0 |
| (8) | B | A | 0 | 1 | 0 |
| (9) | B | B | 0 | 1 | 1 |

F I G. 109

Data definitions (14th Embodiment)

| Read operation | Read voltages | | Read data | | | | |
|---|---|---|---|---|---|---|---|
| | MTa | MTb | PL1:PL2 (0:0) | PL1:PL2 (1:0) | PL1:PL2 (1:0) | PL1:PL2 (0:1) | PL1:PL2 (1:1) |
| 1st page | AR | AR | 0 | 1 | 1 | 1 | 1 |
| 2nd page | BR | AR | 1 | 0 | 0 | 1 | 1 |
| 3rd page | BR | BR | 1 | 0 | 0 | 0 | 1 |

F I G. 110

Read operation (14th Embodiment)
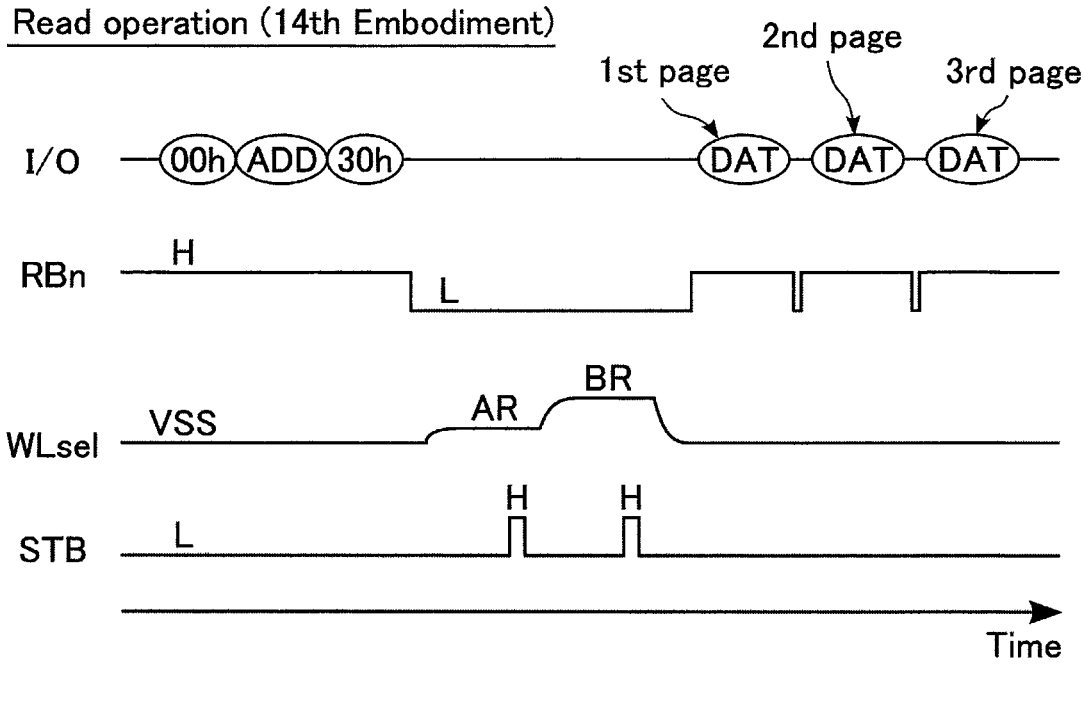
F I G. 111

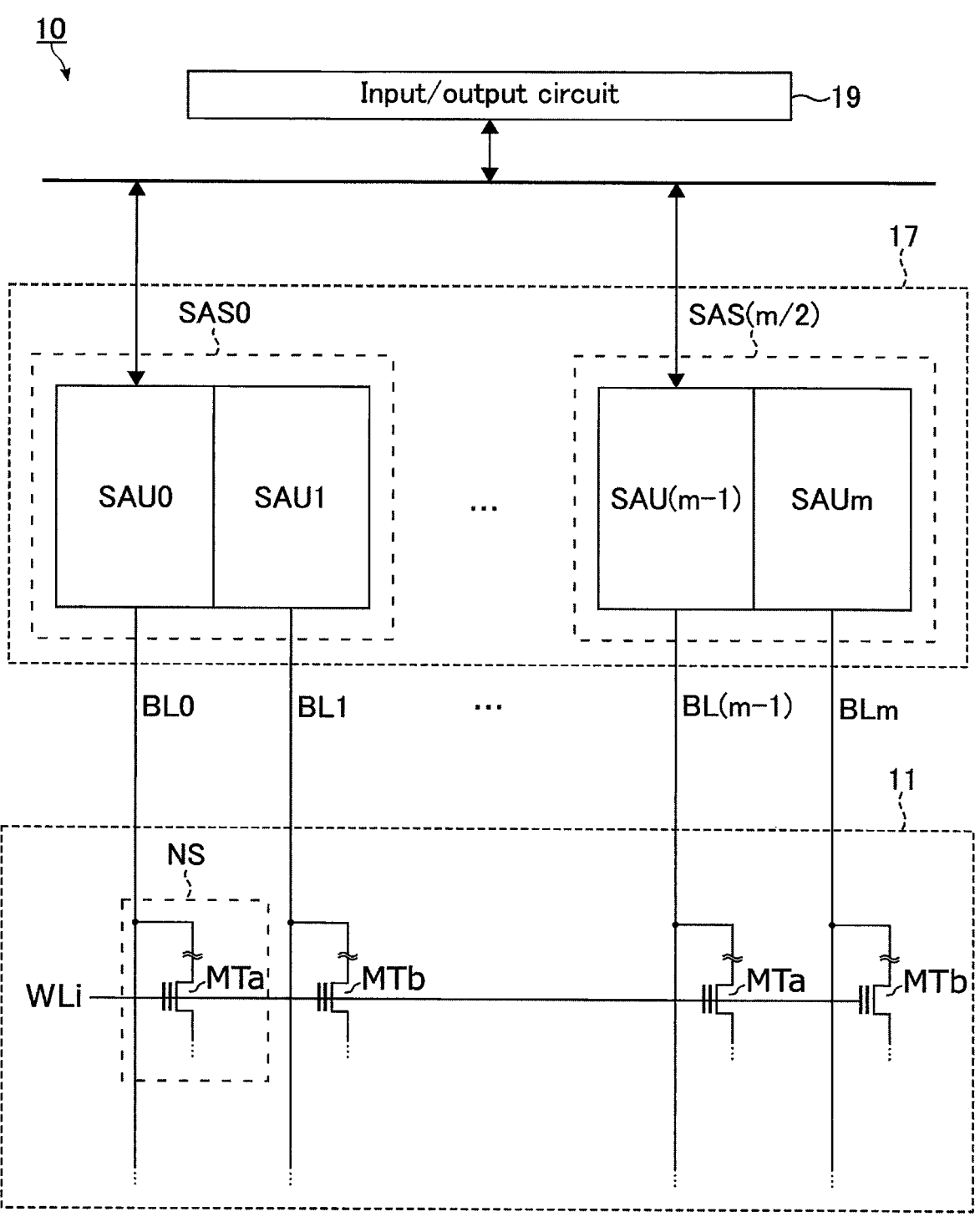
F I G. 112

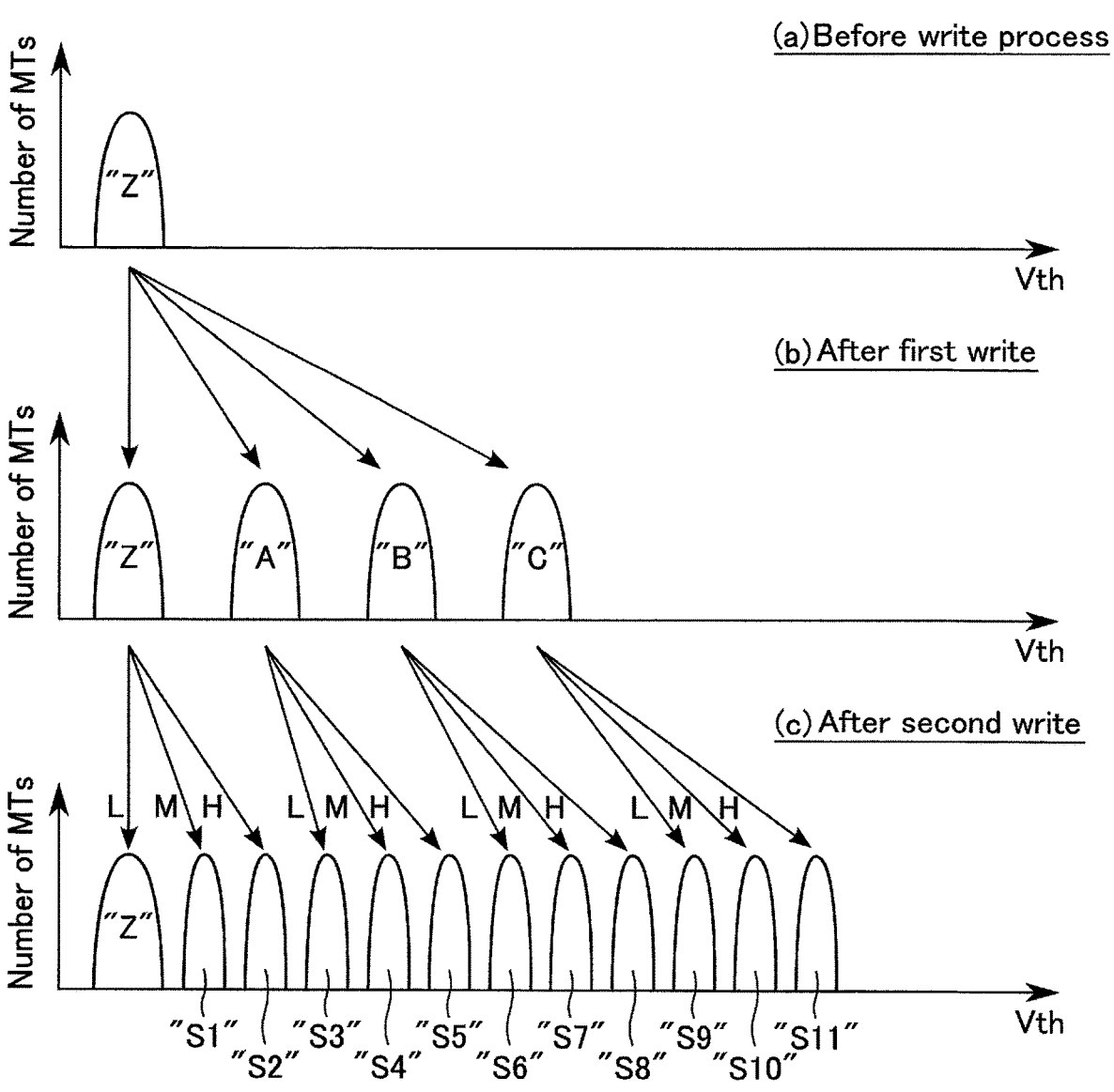
F I G. 113

Data allocation (15th Embodiment)
[First wtrite: PL1]

| Input data | | Write state |
|---|---|---|
| 1st page | 3rd page | |
| 1 | 1 | Z |
| 0 | 1 | A |
| 0 | 0 | B |
| 1 | 0 | C |

F I G. 114

Data allocation (15th Embodiment)
[First write: PL2]

| Input data | | Write state |
|---|---|---|
| 2nd page | 4th page | |
| 1 | 1 | Z |
| 0 | 1 | A |
| 0 | 0 | B |
| 1 | 0 | C |

FIG. 115

Data allocation (15th Embodiment)
[Second write: PL1, PL2]

| Input data | | | Write state | |
|---|---|---|---|---|
| 5th page | 6th page | 7th page | PL1 | PL2 |
| 1 | 1 | 1 | L | L |
| 1 | 0 | 1 | L | M |
| 1 | 0 | 0 | L | H |
| 0 | 0 | 1 | M | M |
| 0 | 0 | 0 | M | H |
| 1 | 1 | 0 | H | L |
| 0 | 1 | 0 | H | M |
| 0 | 1 | 1 | H | H |

F I G. 116

Settings of read voltages (15th Embodiment)
[After first write and before second write]

| Read operation | Read voltages | |
| --- | --- | --- |
| | PL1 | PL2 |
| 1st page | AR,CR | – |
| 2nd page | – | AR,CR |
| 3rd page | BR | – |
| 4th page | – | BR |

F I G. 117

Settings of read voltages (15th Embodiment)
[After second write]

| Read operation | Read voltages | |
| --- | --- | --- |
| | PL1 | PL2 |
| 1st page | S3R,S9R | – |
| 2nd page | – | S3R,S9R |
| 3rd page | S6R | – |
| 4th page | – | S6R |
| 5th page | S3R,S6R,S9R + S1R,S4R,S7R,S10 | S3R,S6R,S9R + S1R,S4R,S7R,S10 |
| 6th page | S3R,S6R,S9R + S2R,S5R,S8R,S11 | S3R,S6R,S9R + S1R,S4R,S7R,S10 |
| 7th page | S3R,S6R,S9R + S2R,S5R,S8R,S11 | S3R,S6R,S9R + S2R,S5R,S8R,S11 |

F I G. 118

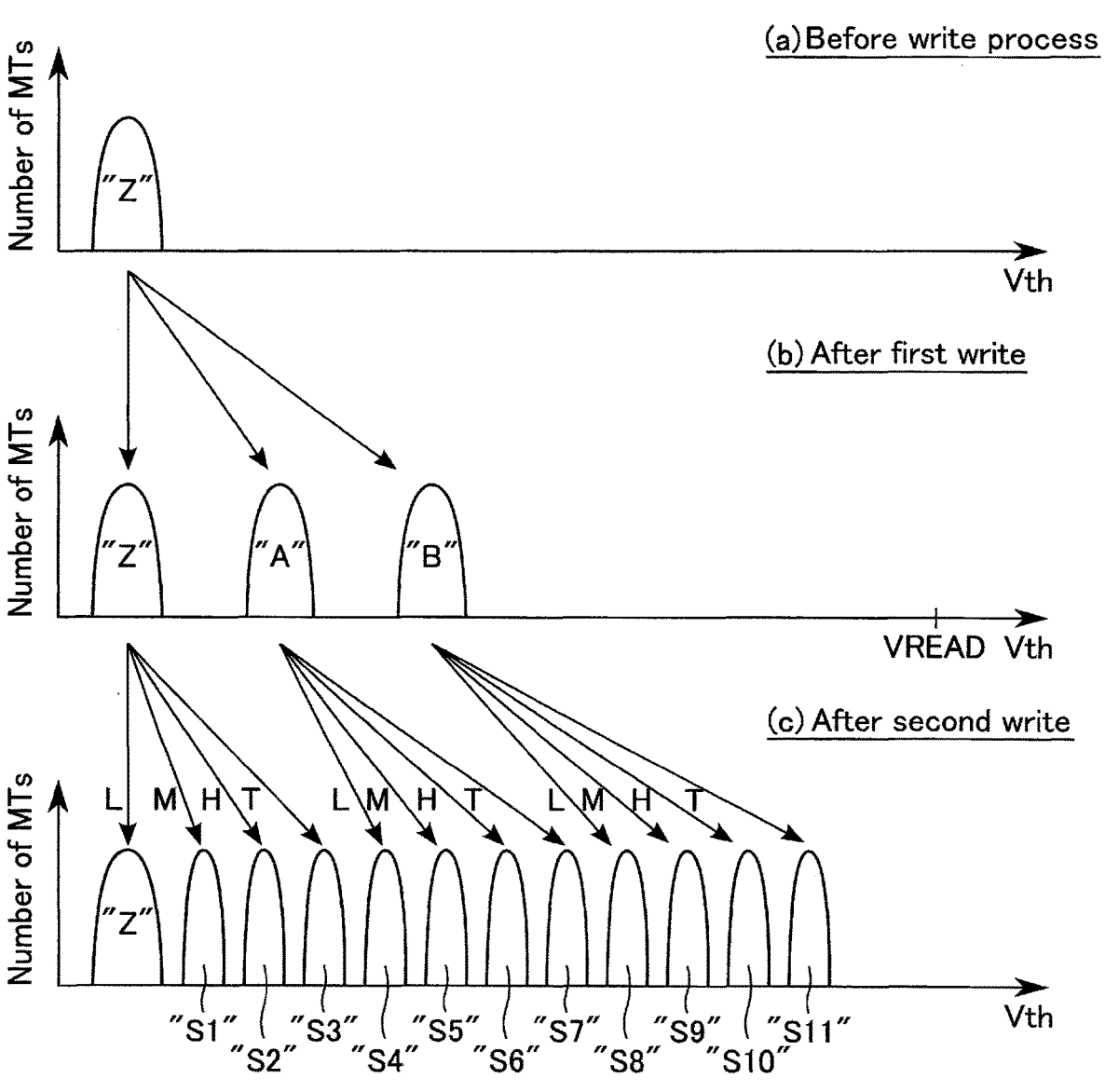
F I G. 119

Data allocation (16th Embodiment)
[Second write: PL1]

| Input data | | Write state |
|:---:|:---:|:---:|
| 4th page | 6th page | |
| 1 | 1 | L |
| 0 | 1 | M |
| 0 | 0 | H |
| 1 | 0 | T |

F I G. 120

Data allocation (16th Embodiment)
[Second write: PL2]

| Input data | | Write state |
|---|---|---|
| 5th page | 7th page | |
| 1 | 1 | L |
| 0 | 1 | M |
| 0 | 0 | H |
| 1 | 0 | T |

F I G. 121

Settings of read voltages (16th Embodiment)
[After second write]

| Read operation | Read voltages | |
| --- | --- | --- |
| | PL1 | PL2 |
| 1st page | S4R | S4R |
| 2nd page | S8R | S4R |
| 3rd page | S8R | S8R |
| 4th page | S4R,S8R<br>+ S1R,S5R,S9R<br>+ S3R,S7R,S11R | – |
| 5th page | – | S4R,S8R<br>+ S1R,S5R,S9R<br>+ S3R,S7R,S11R |
| 6th page | S4R,S8R<br>+ S2R,S6R,S10R | – |
| 7th page | – | S4R,S8R<br>+ S2R,S6R,S10R |

F I G. 122

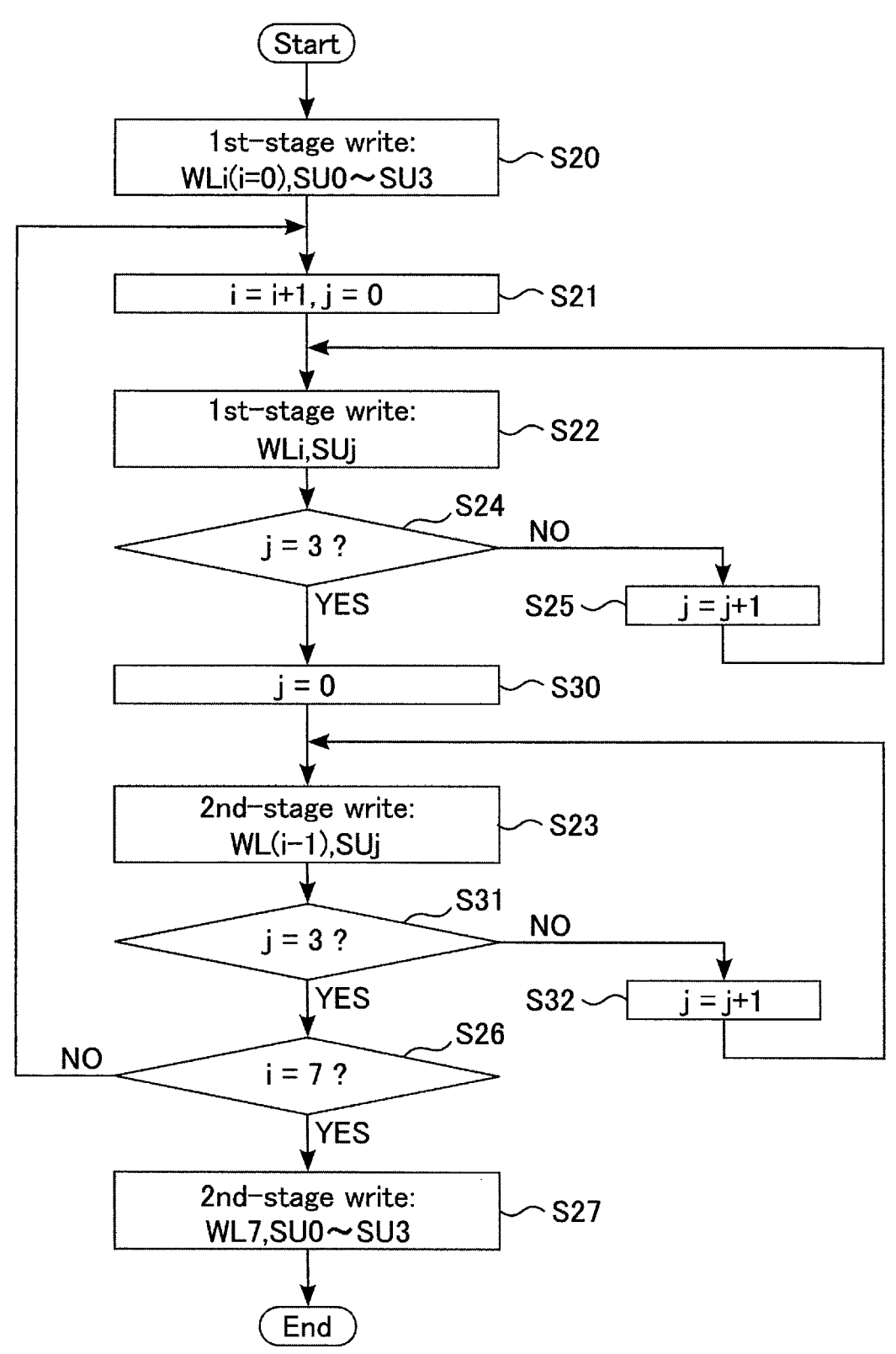
F I G. 123

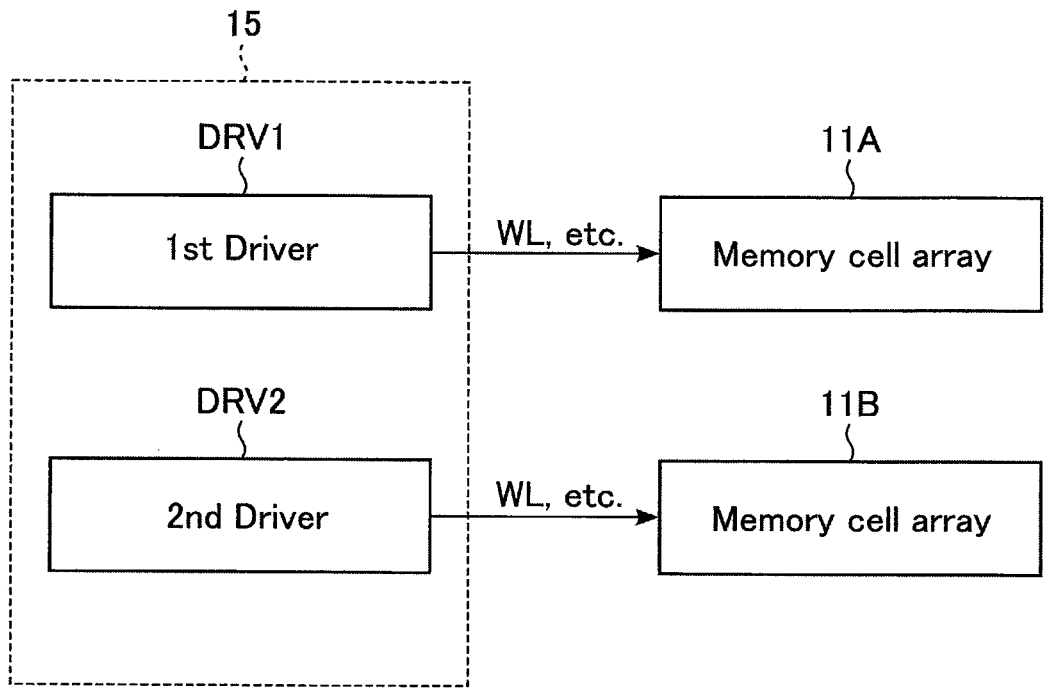
F I G. 124

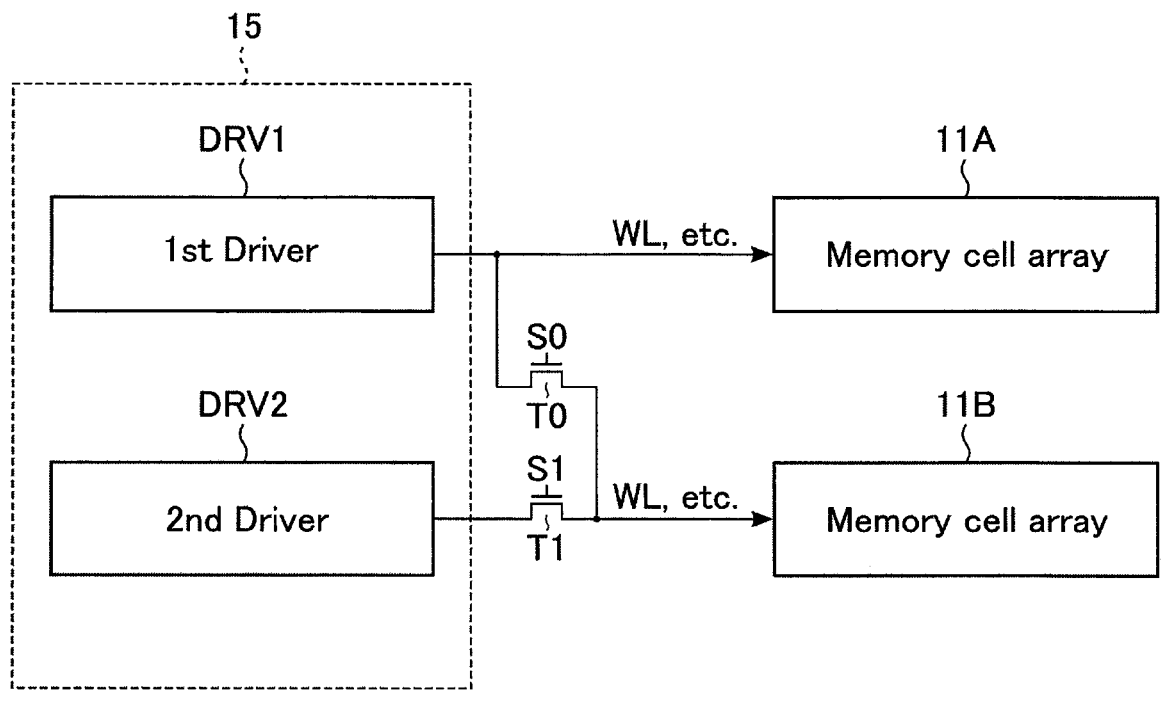
F I G. 125

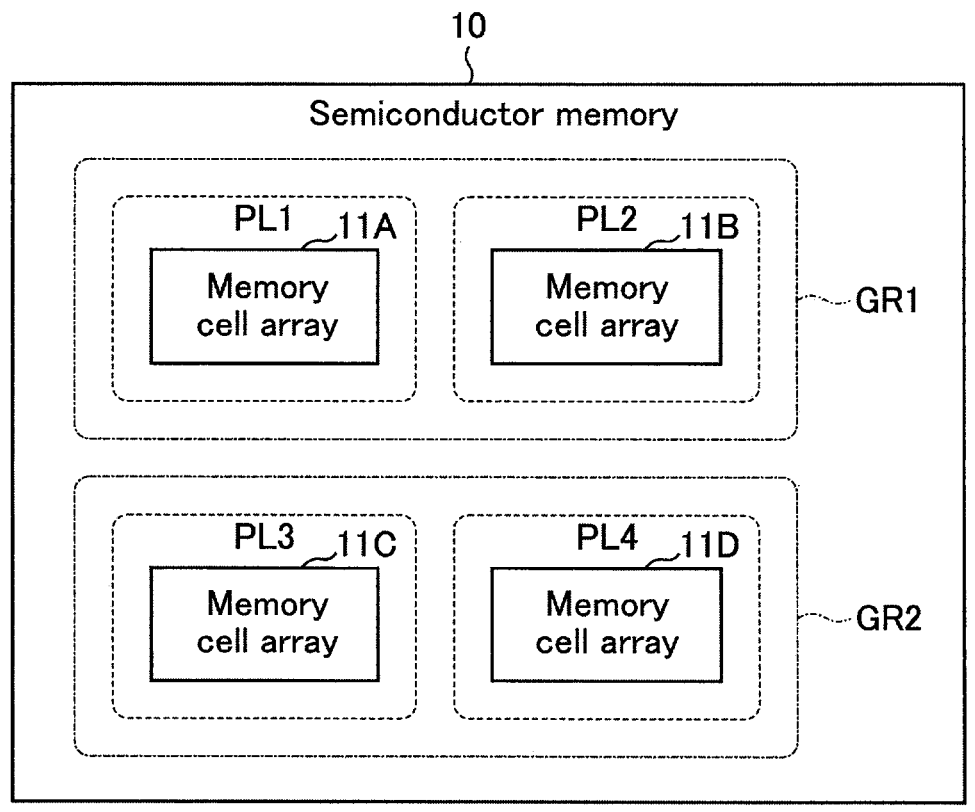
F I G. 126

Assignment of latch circuits when 16-value write is performed

| | Z | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| SDL | H | QPW data | | | | | | | | | | | | | | L |
| ADL | H | L | H | L | H | L | H | L | H | L | H | L | H | L | H | L |
| BDL | H | | L | | H | | L | | H | | L | | H | | L | |
| CDL | H | | | | L | | | | H | | | | L | | | |
| XDL | H | | | | | | | | L | | | | | | | |

F I G. 127

(1) After S1-state write to S8-state write are finished

|     | Z | S1 | S2 | S3 | S4 | S5 | S6 | S7 | S8 | S9 | S10 | S11 | S12 | S13 | S14 | S15 |
|-----|---|----|----|----|----|----|----|----|----|----|-----|-----|-----|-----|-----|-----|
| SDL | H | QPW data | | | | | | | | | | | | | | L |
| ADL | H | | | | | | | | | L | H | L | H | L | H | L |
| BDL | H | | | | | | | | | H | | L | | H | | L |
| CDL | H | | | | | | | | | H | | | | L | | |
| XDL | Write data of next page | | | | | | | | | | | | | | | |

⇩

(2) After S1-state write to S12-state write are finished

|     | Z | S1 | S2 | S3 | S4 | S5 | S6 | S7 | S8 | S9 | S10 | S11 | S12 | S13 | S14 | S15 |
|-----|---|----|----|----|----|----|----|----|----|----|-----|-----|-----|-----|-----|-----|
| SDL | H | QPW data | | | | | | | | | | | | | | L |
| ADL | H | | | | | | | | | | | | | L | H | L |
| BDL | H | | | | | | | | | | | | | H | | L |
| CDL | Write data of next page | | | | | | | | | | | | | | | |
| XDL | Write data of next page | | | | | | | | | | | | | | | |

⇩

(3) After S1-state write to S13-state write are finished

|     | Z | S1 | S2 | S3 | S4 | S5 | S6 | S7 | S8 | S9 | S10 | S11 | S12 | S13 | S14 | S15 |
|-----|---|----|----|----|----|----|----|----|----|----|-----|-----|-----|-----|-----|-----|
| SDL | H | QPW data | | | | | | | | | | | | | | L |
| ADL | H | | | | | | | | | | | | | | H | L |
| BDL | Write data of next page | | | | | | | | | | | | | | | |
| CDL | Write data of next page | | | | | | | | | | | | | | | |
| XDL | Write data of next page | | | | | | | | | | | | | | | |

⇩

(4) After S1-state write to S14-state write are finished

|     | Z | S1 | S2 | S3 | S4 | S5 | S6 | S7 | S8 | S9 | S10 | S11 | S12 | S13 | S14 | S15 |
|-----|---|----|----|----|----|----|----|----|----|----|-----|-----|-----|-----|-----|-----|
| SDL | H | QPW data | | | | | | | | | | | | | | L |
| ADL | Write data of next page | | | | | | | | | | | | | | | |
| BDL | Write data of next page | | | | | | | | | | | | | | | |
| CDL | Write data of next page | | | | | | | | | | | | | | | |
| XDL | Write data of next page | | | | | | | | | | | | | | | |

F I G. 128

Assignment of latch circuits when 12-value write is performed

| | Z | S1 | S2 | S3 | S4 | S5 | S6 | S7 | S8 | S9 | S10 | S11 |
|---|---|---|---|---|---|---|---|---|---|---|---|---|
| SDL | H | QPW data | | | | | | | | | | L |
| ADL | H | L | H | L | H | L | H | L | H | L | H | L |
| BDL | H | | L | | H | | L | | H | | L | |
| CDL | H | L | | | H | | | | L | | | |
| XDL | H | | | | L | | | | | | | |

F I G. 129

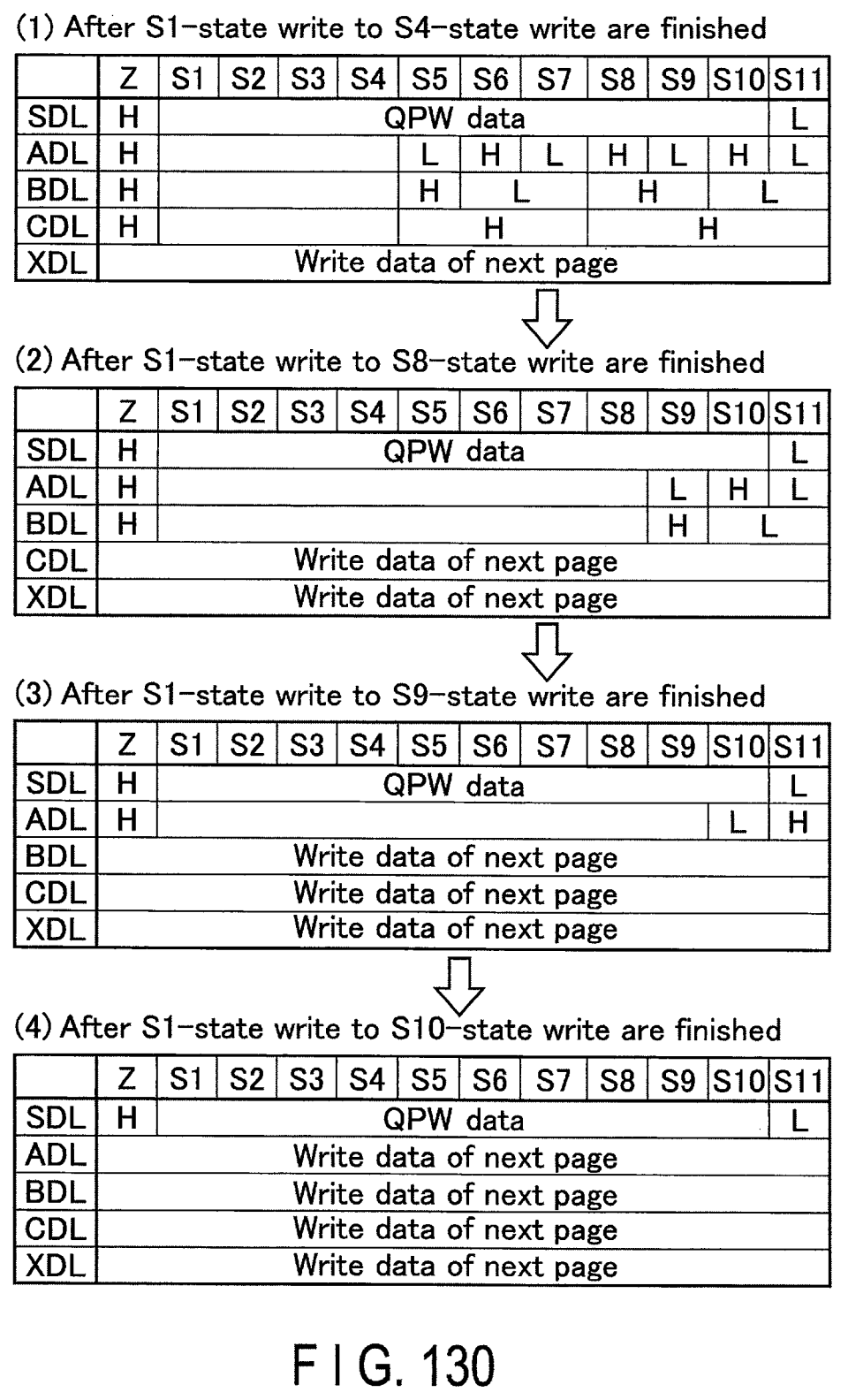

(1) After S1-state write to S4-state write are finished

| | Z | S1 | S2 | S3 | S4 | S5 | S6 | S7 | S8 | S9 | S10 | S11 |
|---|---|---|---|---|---|---|---|---|---|---|---|---|
| SDL | H | QPW data | | | | | | | | | | L |
| ADL | H | | | | | L | H | L | H | L | H | L |
| BDL | H | | | | | H | H | L | L | H | L | L |
| CDL | H | | | | | H | H | H | H | H | H | |
| XDL | Write data of next page | | | | | | | | | | | |

⇩

(2) After S1-state write to S8-state write are finished

| | Z | S1 | S2 | S3 | S4 | S5 | S6 | S7 | S8 | S9 | S10 | S11 |
|---|---|---|---|---|---|---|---|---|---|---|---|---|
| SDL | H | QPW data | | | | | | | | | | L |
| ADL | H | | | | | | | | | L | H | L |
| BDL | H | | | | | | | | | H | L | L |
| CDL | Write data of next page | | | | | | | | | | | |
| XDL | Write data of next page | | | | | | | | | | | |

⇩

(3) After S1-state write to S9-state write are finished

| | Z | S1 | S2 | S3 | S4 | S5 | S6 | S7 | S8 | S9 | S10 | S11 |
|---|---|---|---|---|---|---|---|---|---|---|---|---|
| SDL | H | QPW data | | | | | | | | | | L |
| ADL | H | | | | | | | | | | L | H |
| BDL | Write data of next page | | | | | | | | | | | |
| CDL | Write data of next page | | | | | | | | | | | |
| XDL | Write data of next page | | | | | | | | | | | |

⇩

(4) After S1-state write to S10-state write are finished

| | Z | S1 | S2 | S3 | S4 | S5 | S6 | S7 | S8 | S9 | S10 | S11 |
|---|---|---|---|---|---|---|---|---|---|---|---|---|
| SDL | H | QPW data | | | | | | | | | | L |
| ADL | Write data of next page | | | | | | | | | | | |
| BDL | Write data of next page | | | | | | | | | | | |
| CDL | Write data of next page | | | | | | | | | | | |
| XDL | Write data of next page | | | | | | | | | | | |

F I G. 130

Assignment of latch circuits when 8-value write is performed

| | Z | A | B | C | D | E | F | G |
|---|---|---|---|---|---|---|---|---|
| SDL | H | QPW data | | | | | | L |
| ADL | H | L | H | L | H | L | H | L |
| BDL | H | | L | | H | | L | |
| XDL | H | | | | L | | | |

FIG. 131

(1) After A-state write to D-state write are finished

|  | Z | A | B | C | D | E | F | G |
|---|---|---|---|---|---|---|---|---|
| SDL | H | QPW data | | | | | | L |
| ADL | H | | | | | L | H | L |
| BDL | H | | | | | H | | L |
| XDL | Write data of next page | | | | | | | |

(2) After A-state write to E-state write are finished

|  | Z | A | B | C | D | E | F | G |
|---|---|---|---|---|---|---|---|---|
| SDL | H | QPW data | | | | | | L |
| ADL | H | | | | | | L | H |
| BDL | Write data of next page | | | | | | | |
| XDL | Write data of next page | | | | | | | |

(3) After A-state write to F-state write are finished

|  | Z | A | B | C | D | E | F | G |
|---|---|---|---|---|---|---|---|---|
| SDL | H | QPW data | | | | | | L |
| ADL | Write data of next page | | | | | | | |
| BDL | Write data of next page | | | | | | | |
| XDL | Write data of next page | | | | | | | |

F I G. 132

Assignment of latch circuits
when 6-value write is performed

|  | Z | A | B | C | D | E |
|---|---|---|---|---|---|---|
| SDL | H | QPW | data | | | L |
| ADL | H | L | H | L | H | L |
| BDL | H | L | H | | | L |
| XDL | H | | L | | | |

FIG. 133

(1) After A-state write to
B-state write are finished

|  | Z | A | B | C | D | E |
|---|---|---|---|---|---|---|
| SDL | H | QPW | data | | | L |
| ADL | H | | | L | H | L |
| BDL | H | | | H | L | |
| XDL | | Next page | | | | |

(2) After A-state write to
C-state write are finished

|  | Z | A | B | C | D | E |
|---|---|---|---|---|---|---|
| SDL | H | QPW | data | | | L |
| ADL | H | | | | L | H |
| BDL | | Next page | | | | |
| XDL | | Next page | | | | |

(3) After A-state write to
D-state write are finished

|  | Z | A | B | C | D | E |
|---|---|---|---|---|---|---|
| SDL | H | QPW | data | | | L |
| ADL | | Next page | | | | |
| BDL | | Next page | | | | |
| XDL | | Next page | | | | |

FIG. 134

Assignment of latch circuits when
4-value write is performed

|     | Z | A | B | C |
|-----|---|---|---|---|
| SDL | H | QPW | | L |
| ADL | H | L | H | L |
| XDL | H | | L | |

FIG. 135

(1) After A-state
write is finished

|     | Z | A | B | C |
|-----|---|---|---|---|
| SDL | H | QPW | | L |
| ADL | H | | L | H |
| XDL | Next page | | | |

⇩

(2) After B-state
write is finished

|     | Z | A | B | C |
|-----|---|---|---|---|
| SDL | H | QPW | | L |
| ADL | Next page | | | |
| XDL | Next page | | | |

FIG. 136

Assignment of latch circuits
when 3-value write is performed

|  | Z | A | B |
|---|---|---|---|
| SDL | H | QPW | L |
| XDL | H | L | H |

F I G. 137

After A-state write is finished

|  | Z | A | B |
|---|---|---|---|
| SDL | H | QPW | L |
| XDL | Next page | | |

F I G. 138

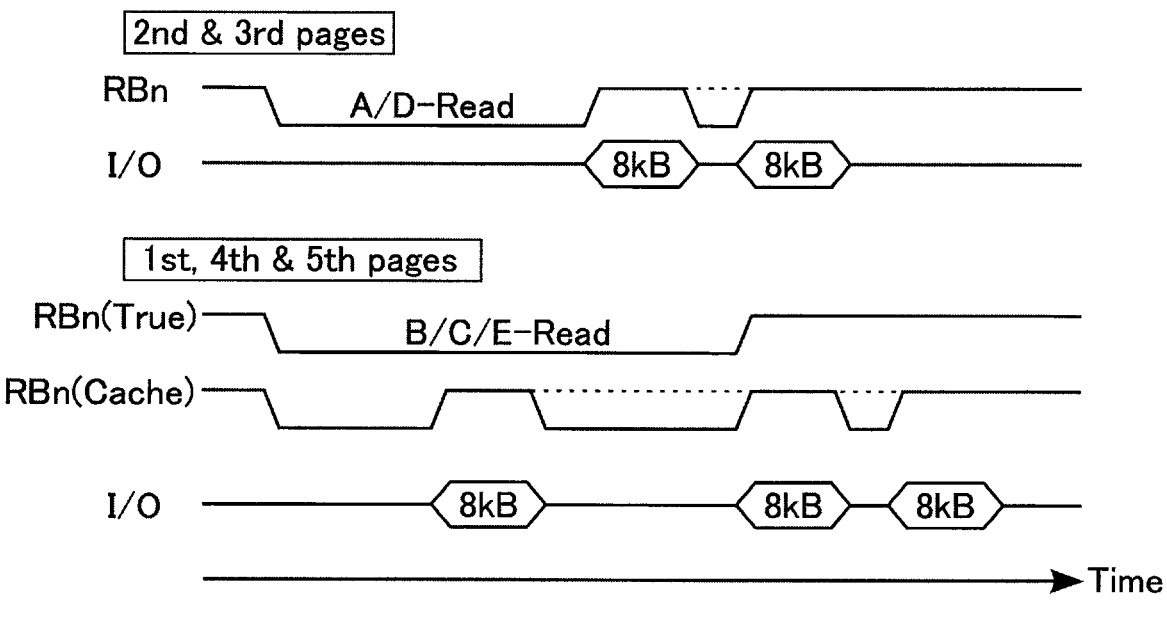
F I G. 139

Page size = 8 kB + 16 kB × 3 (in non-WL-divided case)
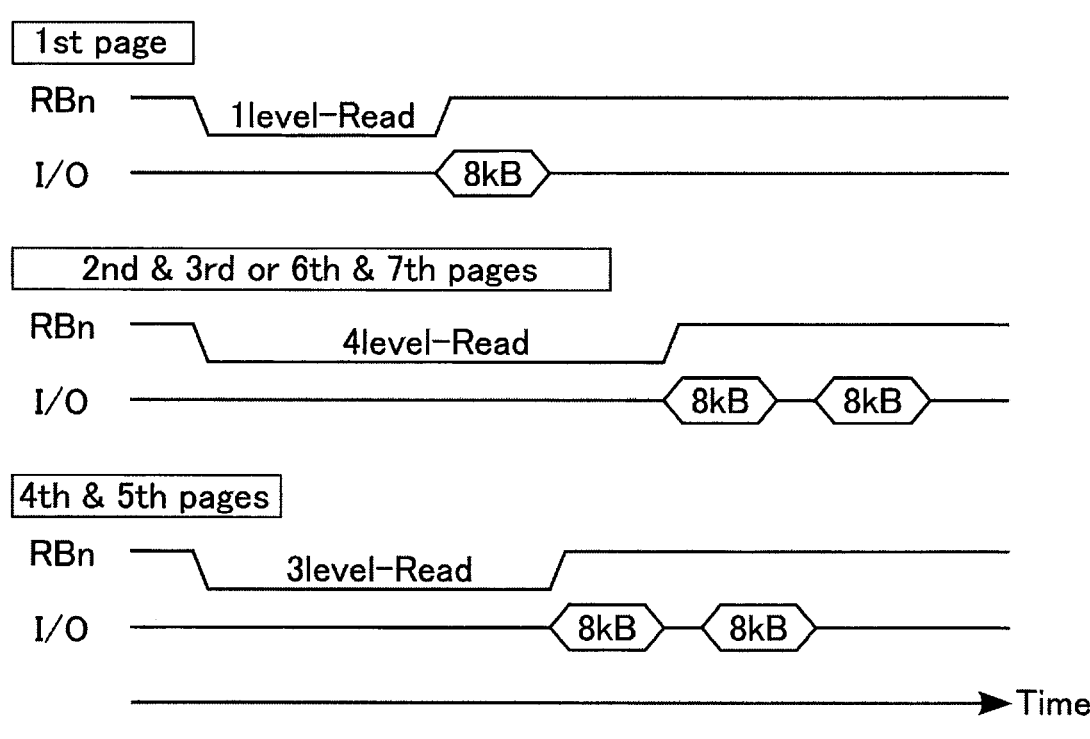
F I G. 140

Page size = 24 kB + 16 kB × 2 (in non-WL-divided case)
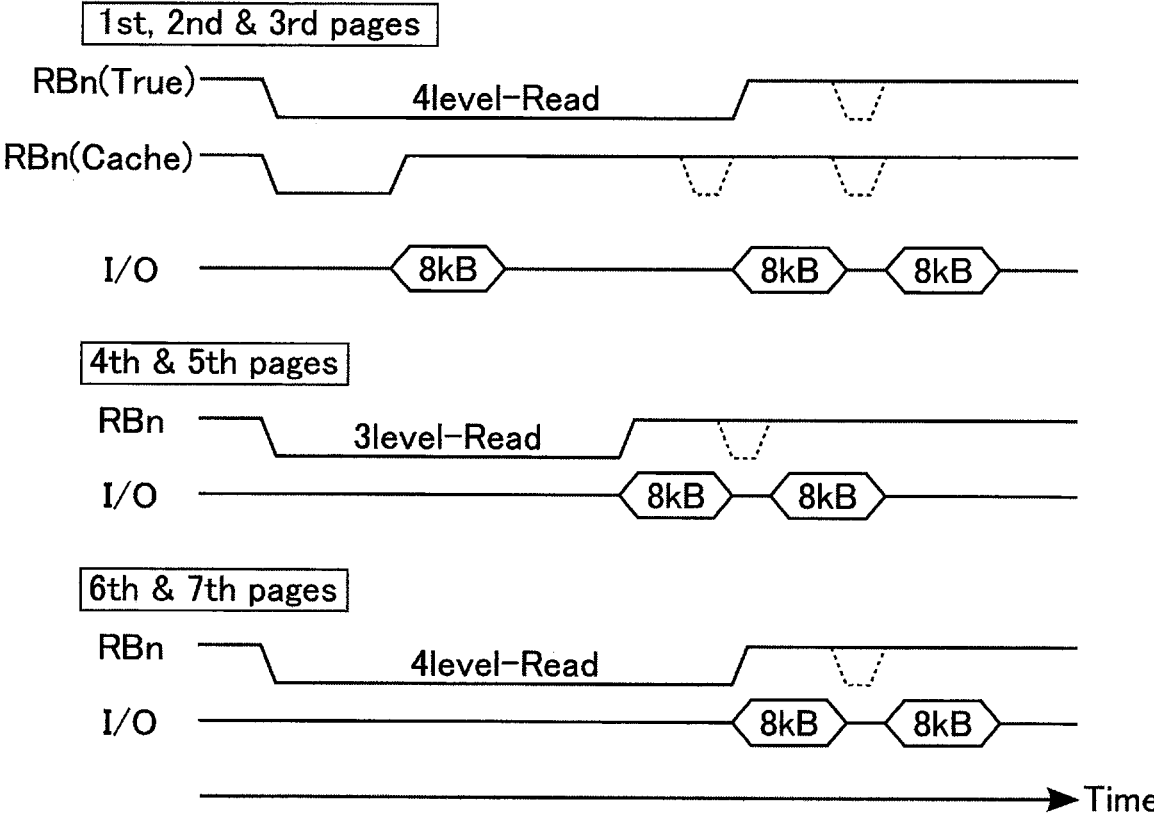
F I G. 141

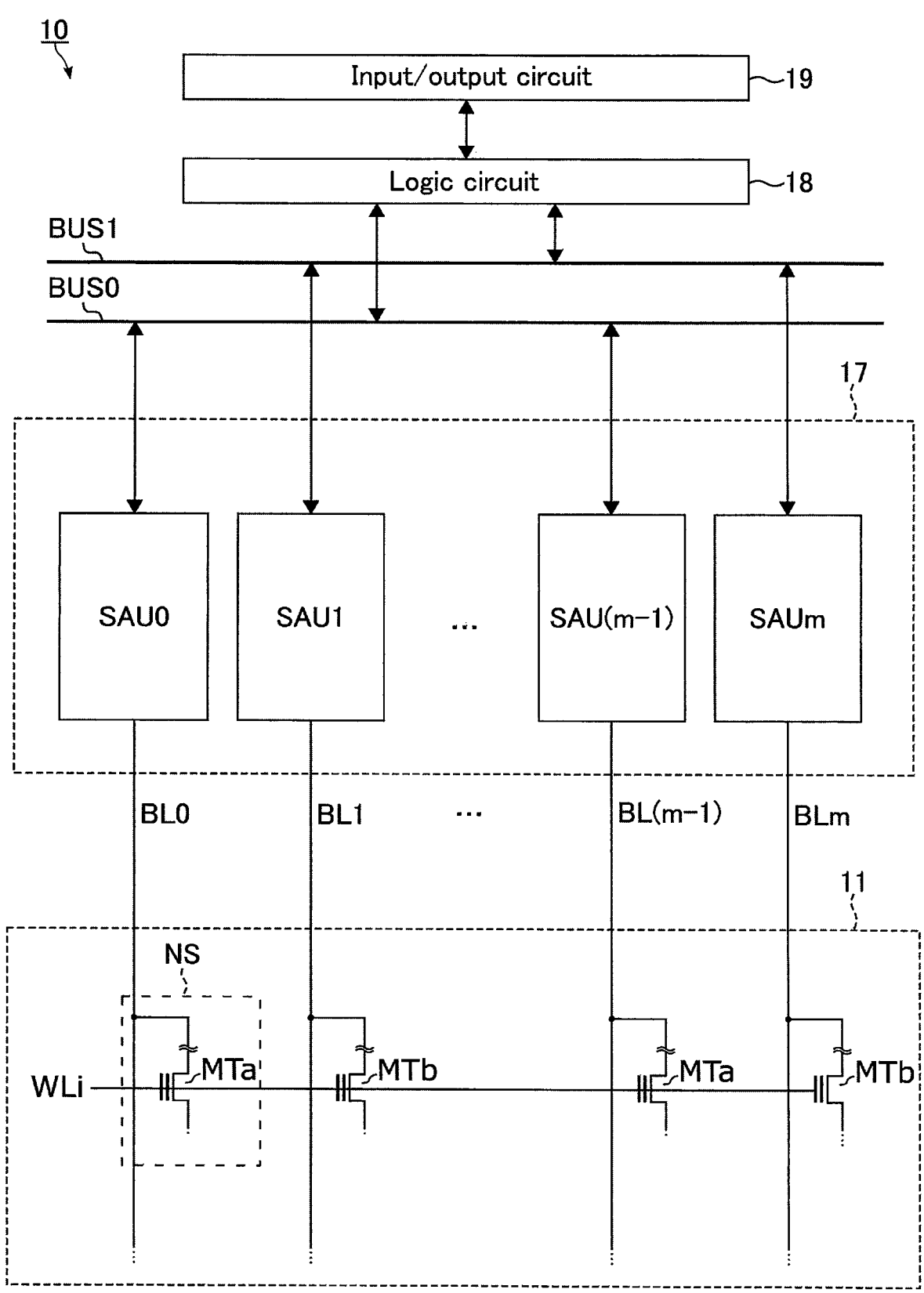
F I G. 142

Data allocation (5th Modification of 10th embodiment)

| | Vth of memory cells | | Data | | | | |
|---|---|---|---|---|---|---|---|
| | 1st plane | 2nd plane | 1st page | 2nd page | 3rd page | 4th page | 5th page |
| (1) | Z | Z | 0 | 0 | 0 | 0 | 0 |
| (2) | Z | A | 0 | 0 | 0 | 1 | 0 |
| (3) | Z | B | 0 | 0 | 1 | 1 | 0 |
| (4) | Z | C | 0 | 0 | 1 | 0 | 0 |
| (5) | Z | D | 0 | 1 | 1 | 0 | 0 |
| (6) | Z | E | 0 | 1 | 1 | 1 | 0 |
| (7) | A | Z | 0 | 0 | 0 | 0 | 1 |
| (8) | A | A | 0 | 0 | 0 | 1 | 1 |
| (9) | A | B | 0 | 0 | 1 | 1 | 1 |
| (10) | A | C | 0 | 0 | 1 | 0 | 1 |
| (11) | A | D | 0 | 1 | 1 | 0 | 1 |
| (12) | A | E | 0 | 1 | 1 | 1 | 1 |
| (13) | B | Z | 0 | 1 | 0 | 0 | 1 |
| (14) | B | A | 0 | 1 | 0 | 1 | 1 |
| (15) | B | B | 1 | 1 | 1 | 1 | 1 |
| (16) | B | C | 1 | 1 | 1 | 0 | 1 |
| (17) | B | D | 1 | 0 | 1 | 0 | 1 |
| (18) | B | E | 1 | 0 | 1 | 1 | 1 |
| (19) | C | Z | 0 | 1 | 0 | 0 | 0 |
| (20) | C | A | 0 | 1 | 0 | 1 | 0 |
| (21) | C | B | 1 | 1 | 1 | 1 | 0 |
| (22) | C | C | 1 | 1 | 1 | 0 | 0 |
| (23) | C | D | 1 | 0 | 1 | 0 | 0 |
| (24) | C | E | 1 | 0 | 1 | 1 | 0 |
| (25) | D | Z | 0 | 1 | 1 | 0 | 0 |
| (26) | D | A | 0 | 1 | 1 | 1 | 0 |
| (27) | D | B | 1 | 1 | 0 | 1 | 0 |
| (28) | D | C | 1 | 1 | 0 | 0 | 0 |
| (29) | D | D | 1 | 0 | 0 | 0 | 0 |
| (30) | D | E | 1 | 0 | 0 | 1 | 0 |
| (31) | E | Z | 0 | 1 | 1 | 0 | 1 |
| (32) | E | A | 0 | 1 | 1 | 1 | 1 |
| (33) | E | B | 1 | 1 | 0 | 1 | 1 |
| (34) | E | C | 1 | 1 | 0 | 0 | 1 |
| (35) | E | D | 1 | 0 | 0 | 0 | 1 |
| (36) | E | E | 1 | 0 | 0 | 1 | 1 |

F I G. 143

Data definitions (5th Modification of 10th embodiment)

| Read operation | Read voltages | | Read data | | | |
|---|---|---|---|---|---|---|
| | PL1 | PL2 | PL1:PL2 (0:0) | PL1:PL2 (1:0) | PL1:PL2 (0:1) | PL1:PL2 (1:1) |
| 1st page | BR | BR | 0 | 0 | 0 | 1 |
| 2nd page | BR | DR | 0 | 1 | 1 | 0 |
| 3rd page | DR | BR | 0 | 1 | 1 | 0 |
| 4th page | – | AR,CR,ER | 0 | 0 | 1 | 1 |
| 5th page | AR,CR,ER | – | 0 | 1 | 0 | 1 |

F I G. 144

Page size = 16 kB/24 kB (in non-WL-divided case)
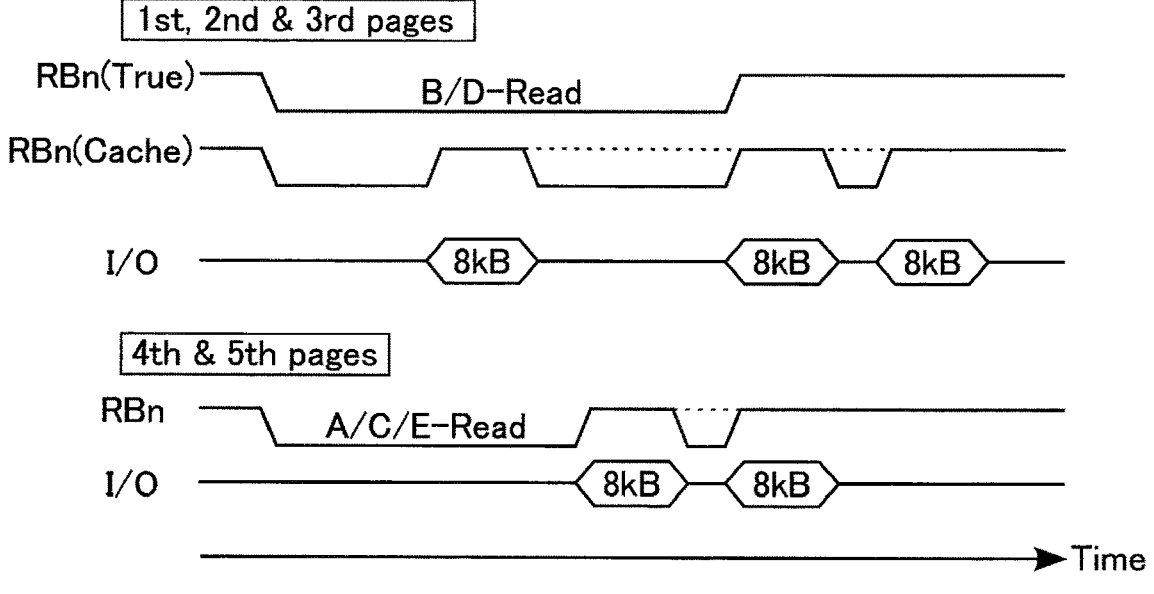
F I G. 145
Page size = 16 kB × 3 (in non-WL-divided case)
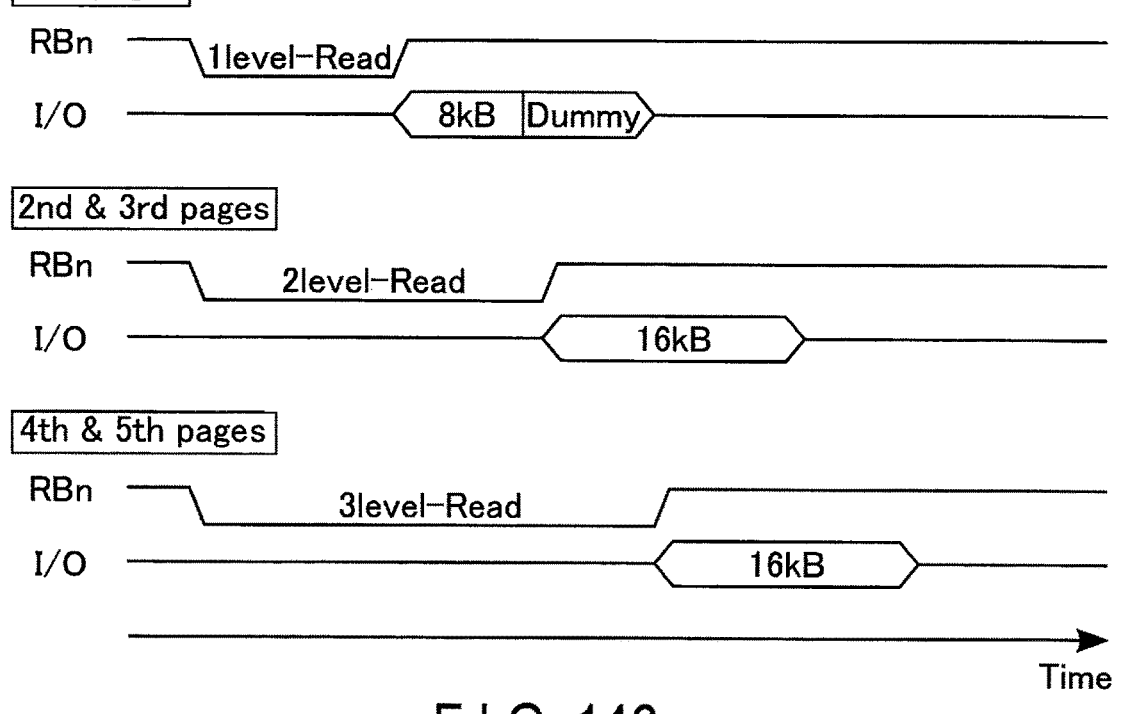
F I G. 146

Write sequence (Page size = 16 kB × 3)
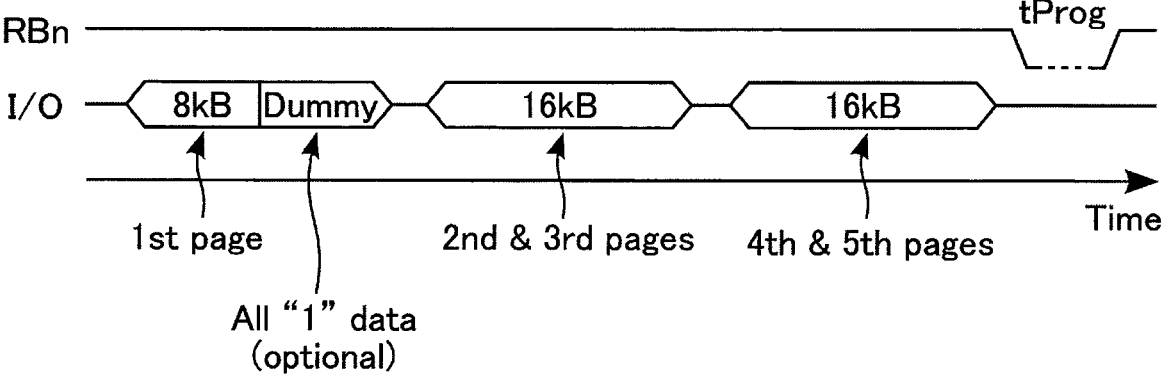
F I G. 147

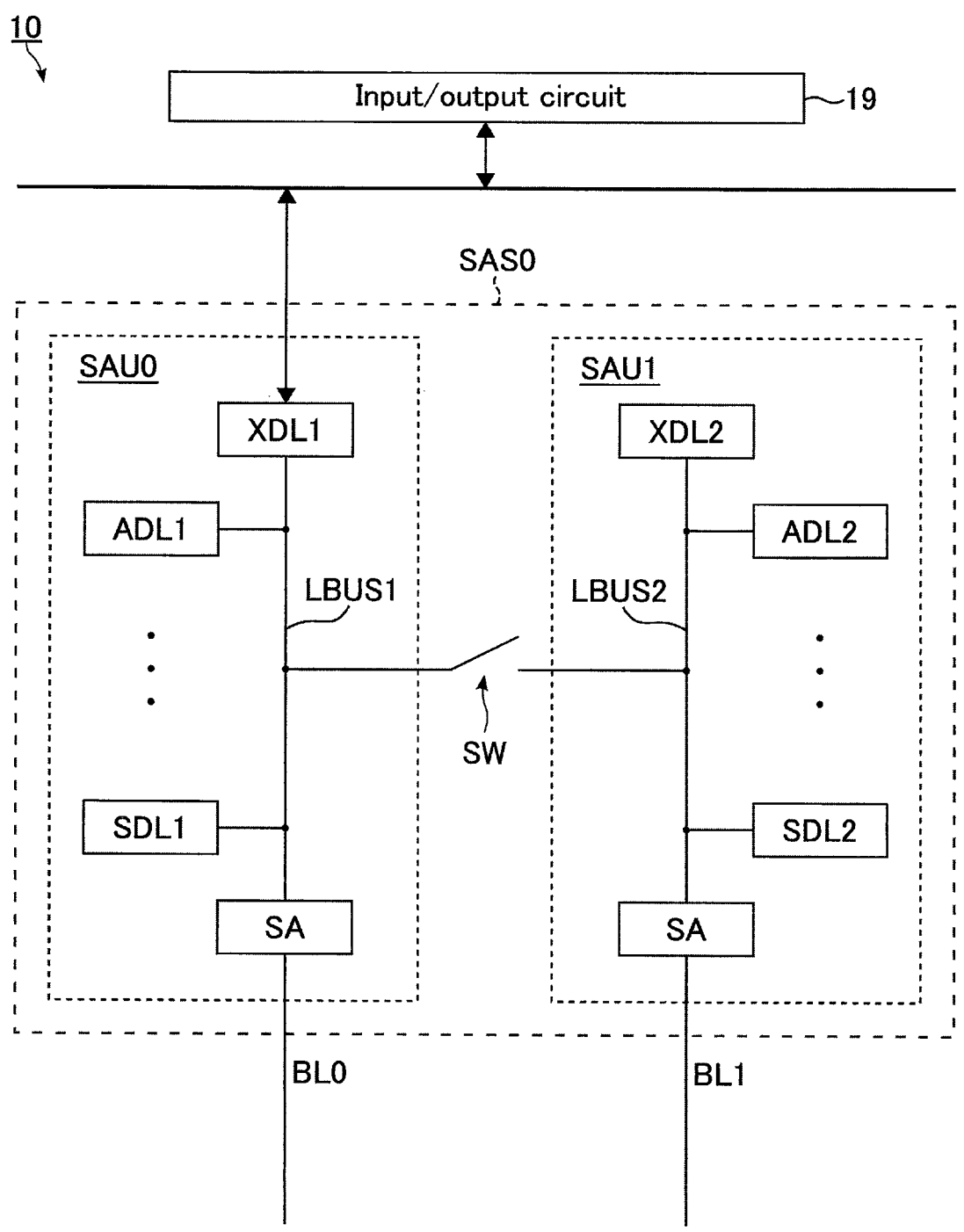
F I G. 148

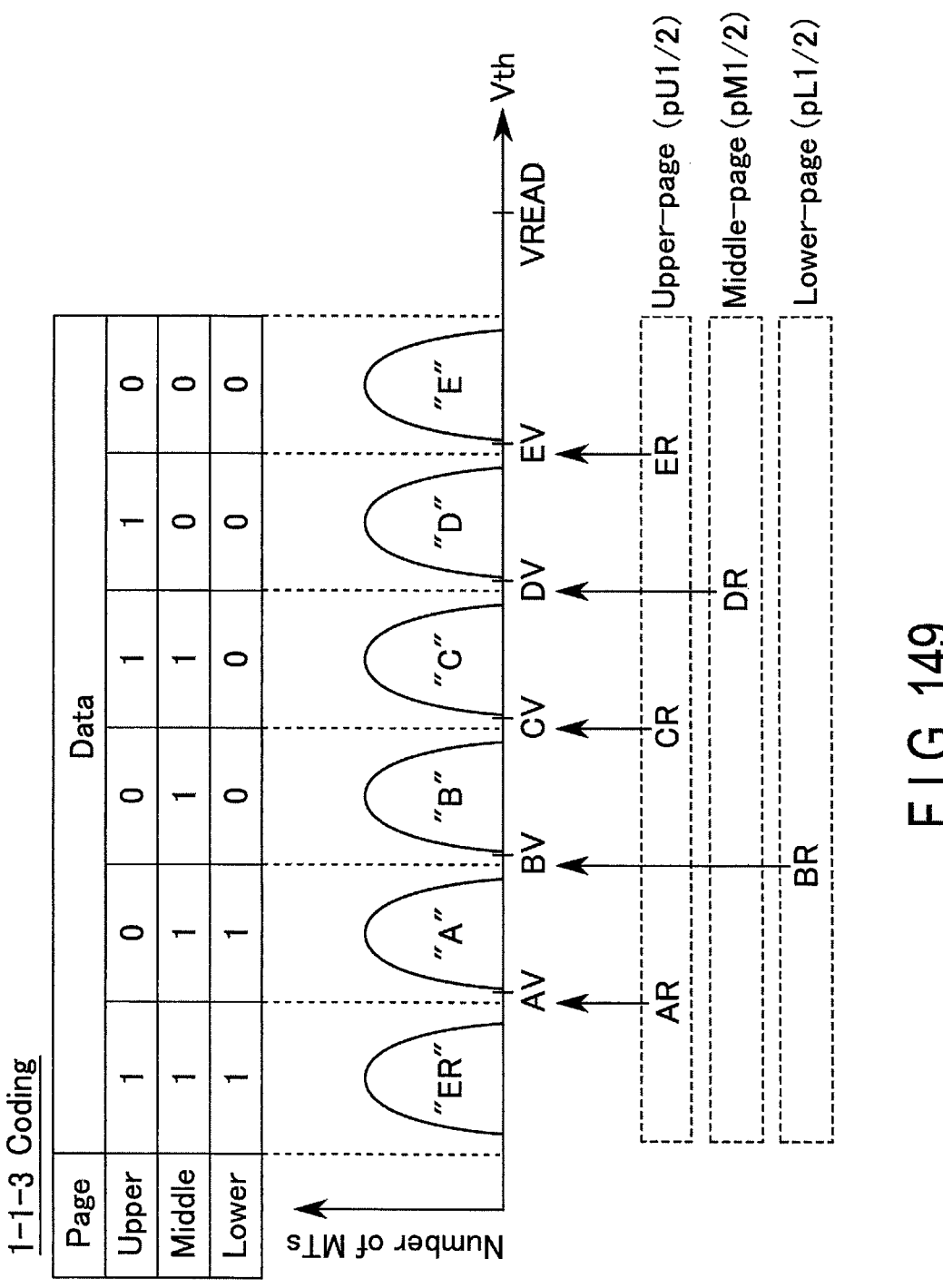
F I G. 149

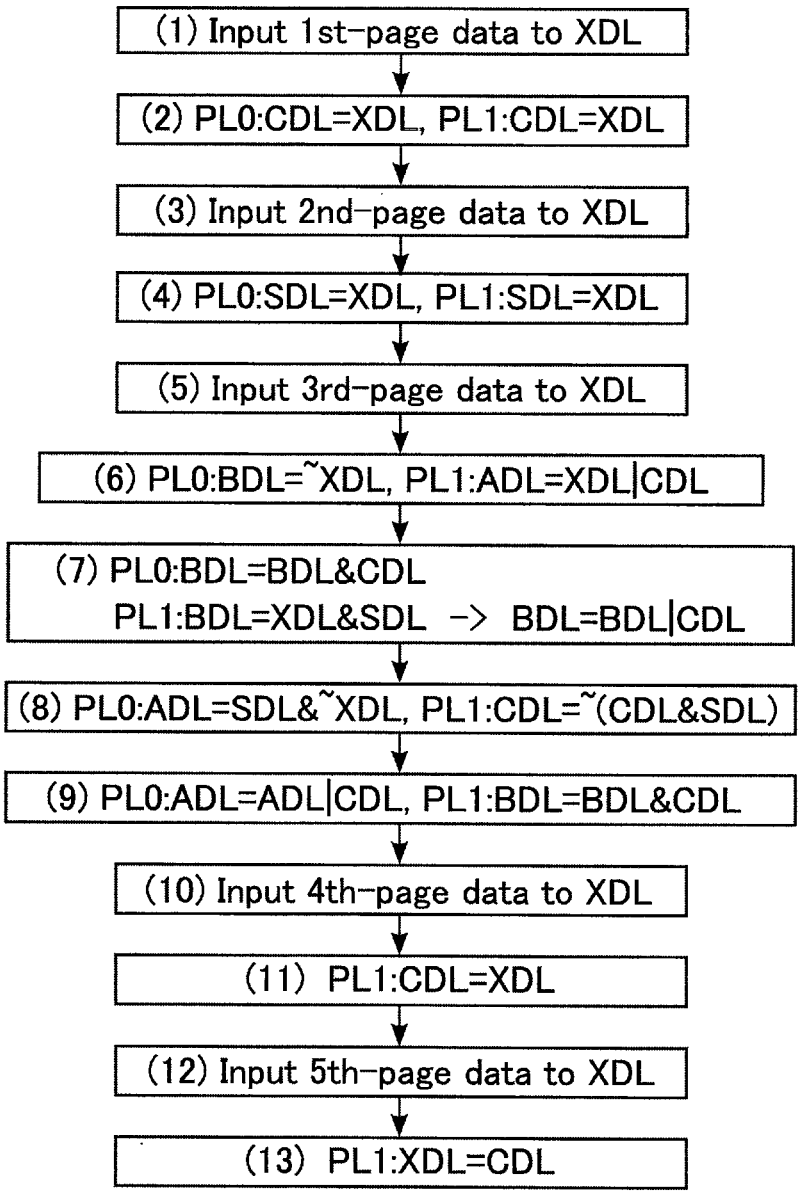
F I G. 150

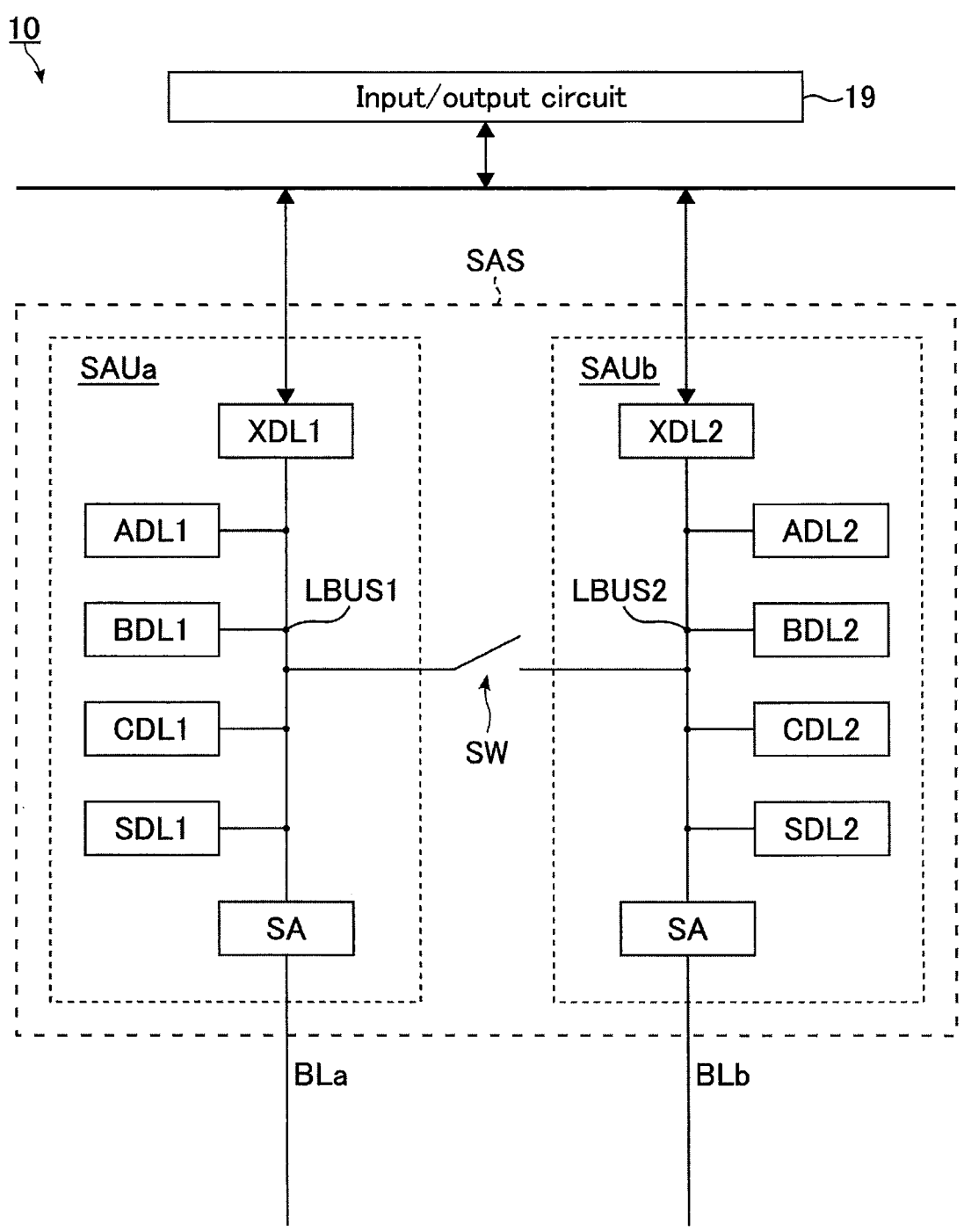
F I G. 151

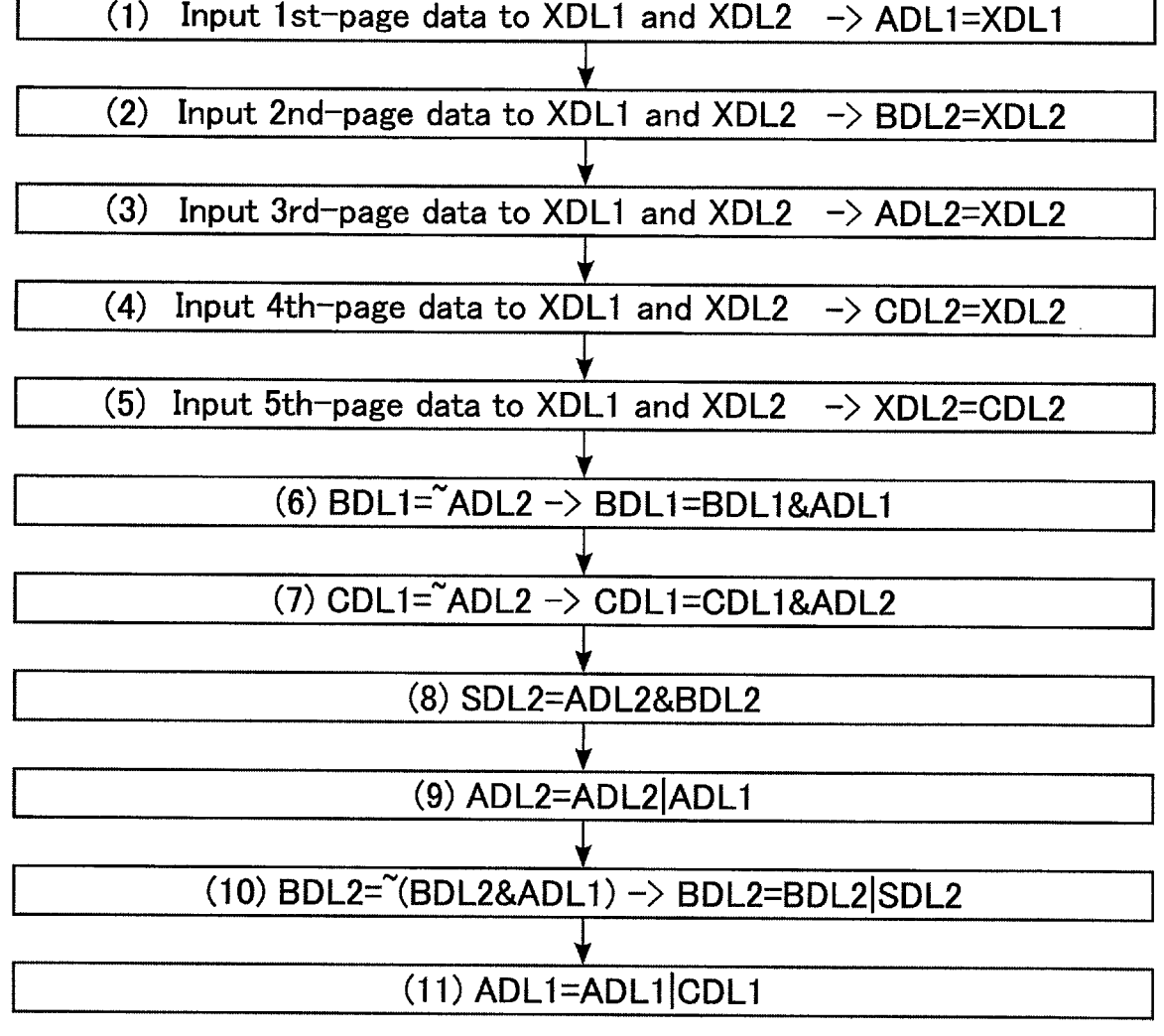
(1)   Input 1st-page data to XDL1 and XDL2   -> ADL1=XDL1
(2)   Input 2nd-page data to XDL1 and XDL2   -> BDL2=XDL2
(3)   Input 3rd-page data to XDL1 and XDL2   -> ADL2=XDL2
(4)   Input 4th-page data to XDL1 and XDL2   -> CDL2=XDL2
(5)   Input 5th-page data to XDL1 and XDL2   -> XDL2=CDL2
(6) BDL1=~ADL2 -> BDL1=BDL1&ADL1
(7) CDL1=~ADL2 -> CDL1=CDL1&ADL2
(8) SDL2=ADL2&BDL2
(9) ADL2=ADL2|ADL1
(10) BDL2=~(BDL2&ADL1) -> BDL2=BDL2|SDL2
(11) ADL1=ADL1|CDL1
F I G. 152

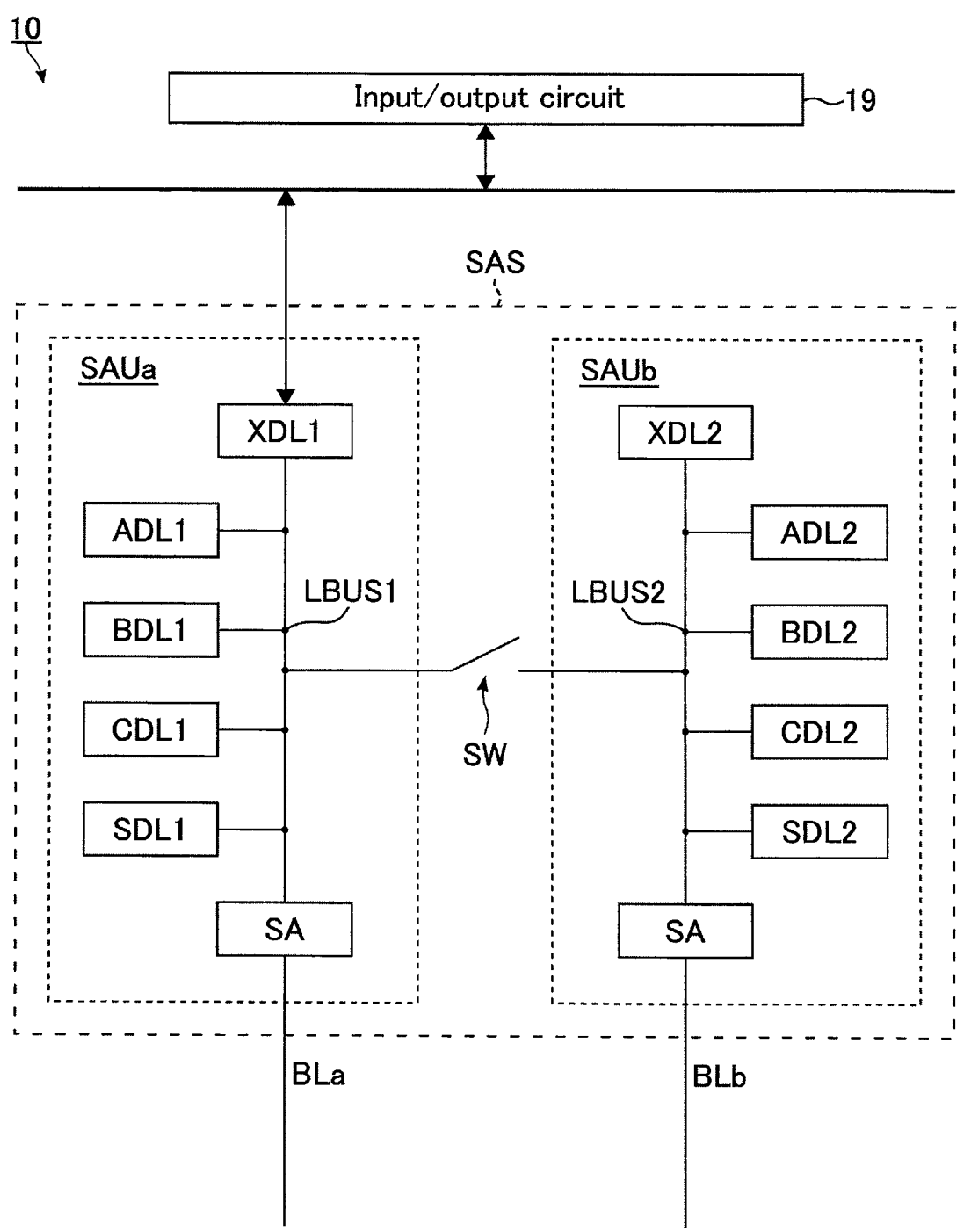
F I G. 153

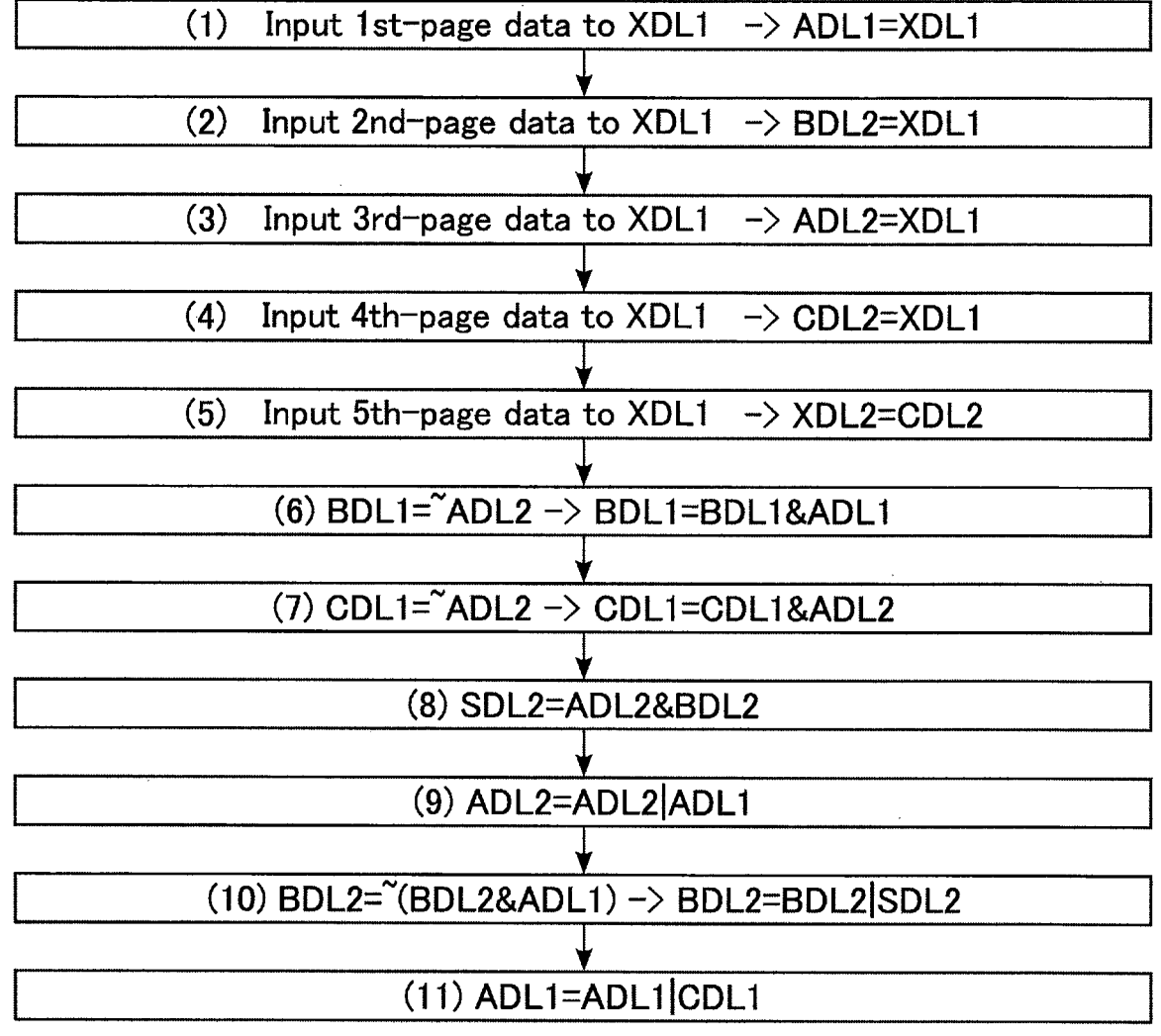
(1)   Input 1st-page data to XDL1   -> ADL1=XDL1
(2)   Input 2nd-page data to XDL1   -> BDL2=XDL1
(3)   Input 3rd-page data to XDL1   -> ADL2=XDL1
(4)   Input 4th-page data to XDL1   -> CDL2=XDL1
(5)   Input 5th-page data to XDL1   -> XDL2=CDL2
(6) BDL1=~ADL2 -> BDL1=BDL1&ADL1
(7) CDL1=~ADL2 -> CDL1=CDL1&ADL2
(8) SDL2=ADL2&BDL2
(9) ADL2=ADL2|ADL1
(10) BDL2=~(BDL2&ADL1) -> BDL2=BDL2|SDL2
(11) ADL1=ADL1|CDL1
F I G. 154

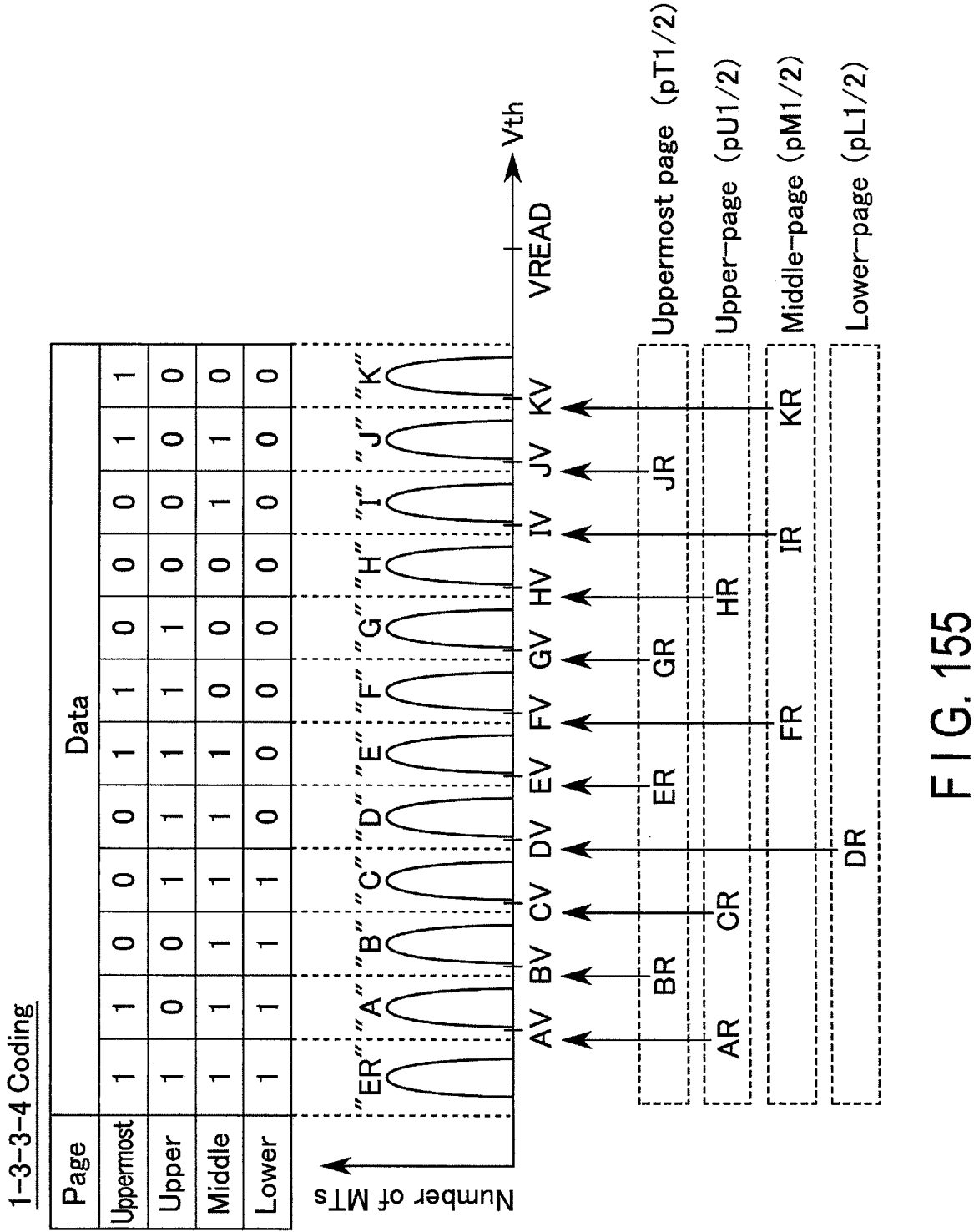
F I G. 155

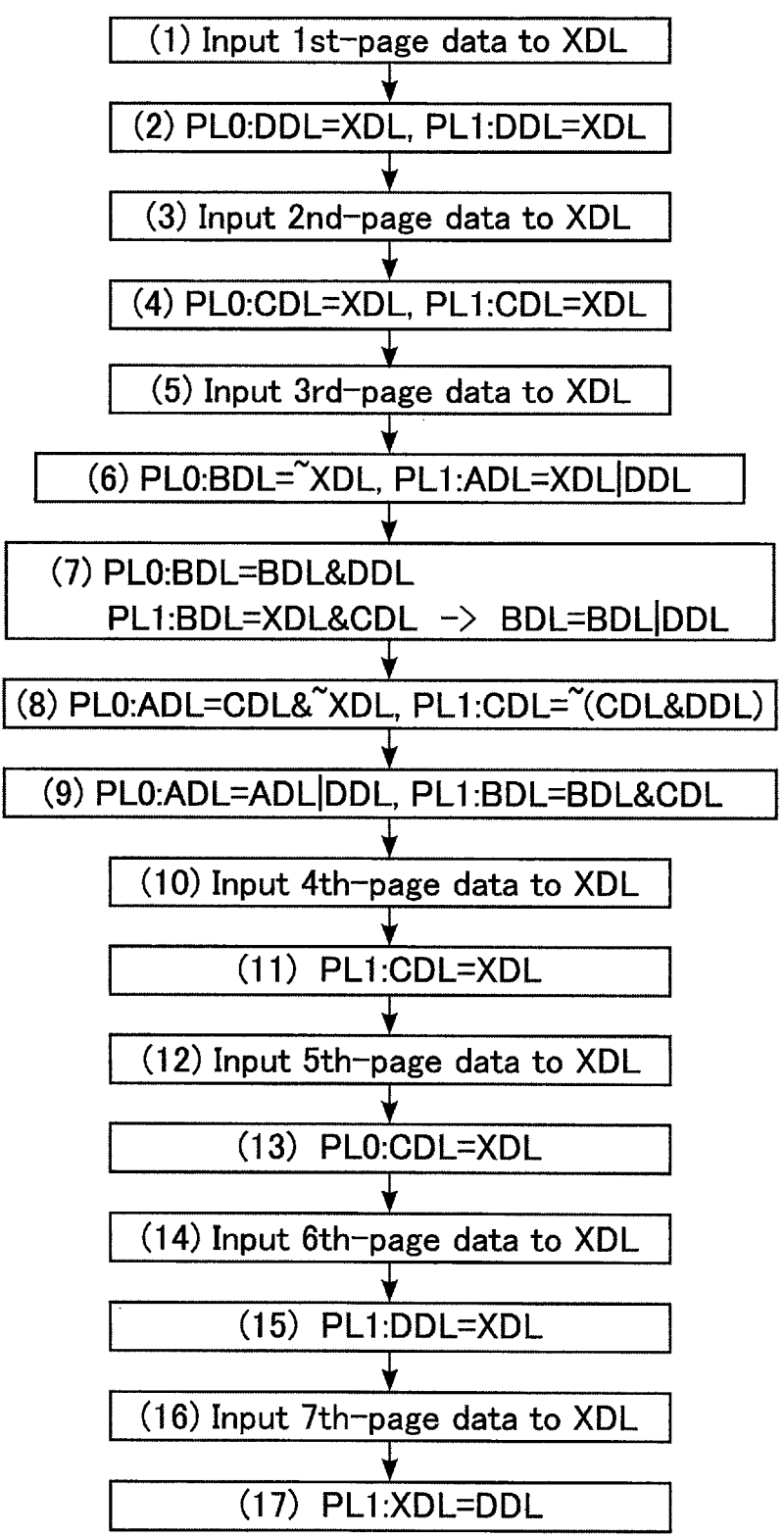
F I G. 156

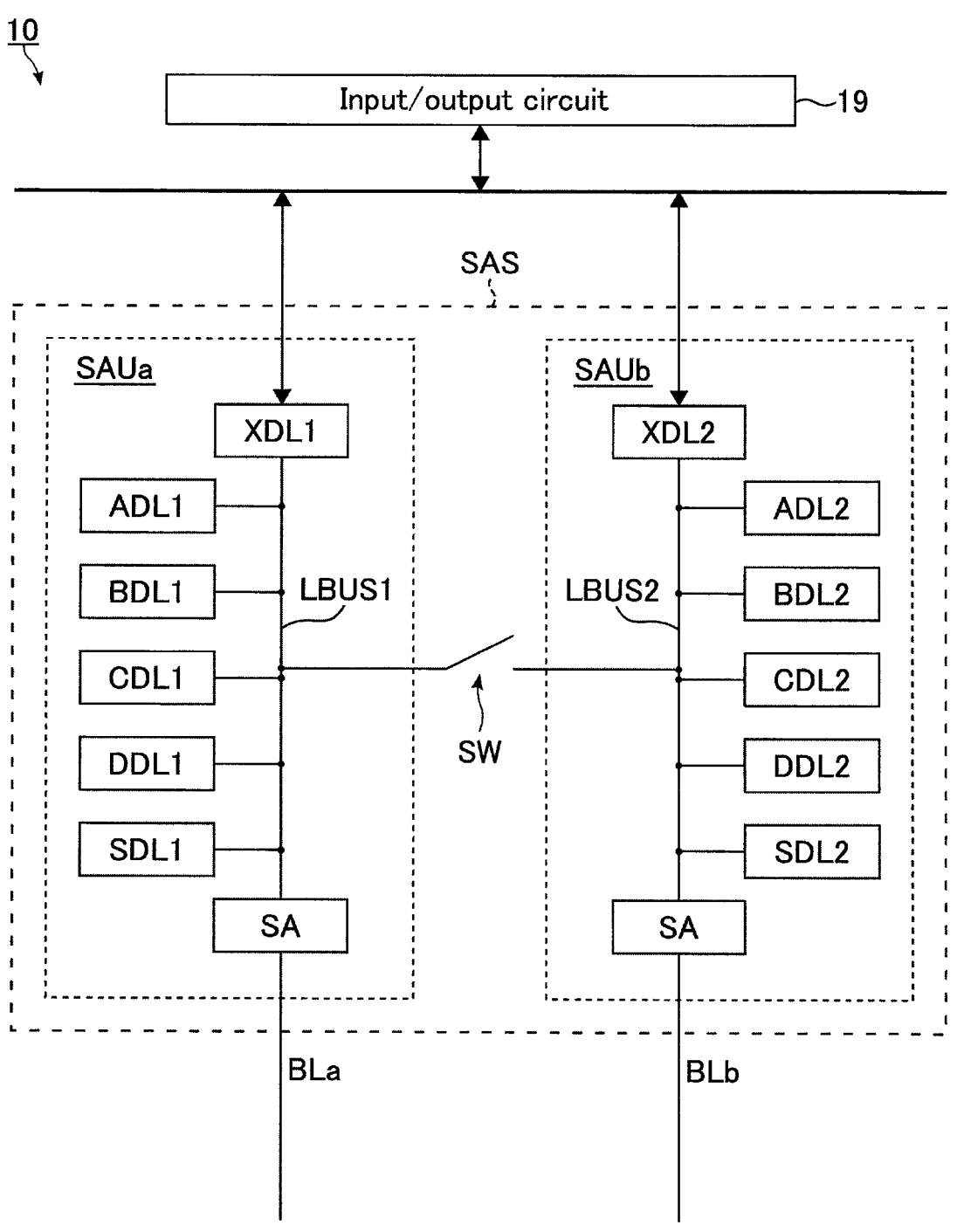
F I G. 157

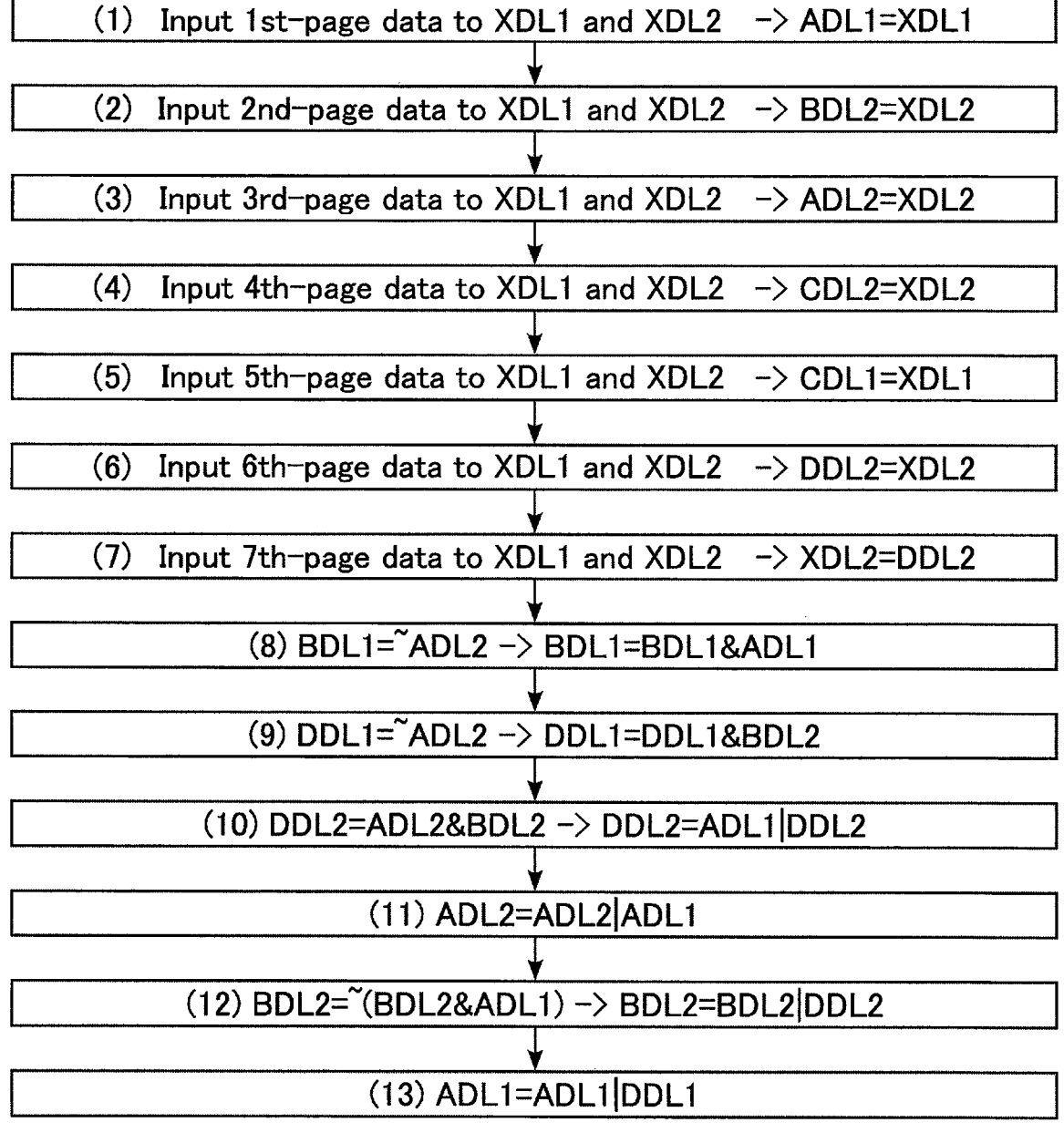

(1)　Input 1st-page data to XDL1 and XDL2　-> ADL1=XDL1

(2)　Input 2nd-page data to XDL1 and XDL2　-> BDL2=XDL2

(3)　Input 3rd-page data to XDL1 and XDL2　-> ADL2=XDL2

(4)　Input 4th-page data to XDL1 and XDL2　-> CDL2=XDL2

(5)　Input 5th-page data to XDL1 and XDL2　-> CDL1=XDL1

(6)　Input 6th-page data to XDL1 and XDL2　-> DDL2=XDL2

(7)　Input 7th-page data to XDL1 and XDL2　-> XDL2=DDL2

(8) BDL1=~ADL2 -> BDL1=BDL1&ADL1

(9) DDL1=~ADL2 -> DDL1=DDL1&BDL2

(10) DDL2=ADL2&BDL2 -> DDL2=ADL1|DDL2

(11) ADL2=ADL2|ADL1

(12) BDL2=~(BDL2&ADL1) -> BDL2=BDL2|DDL2

(13) ADL1=ADL1|DDL1

F I G. 158

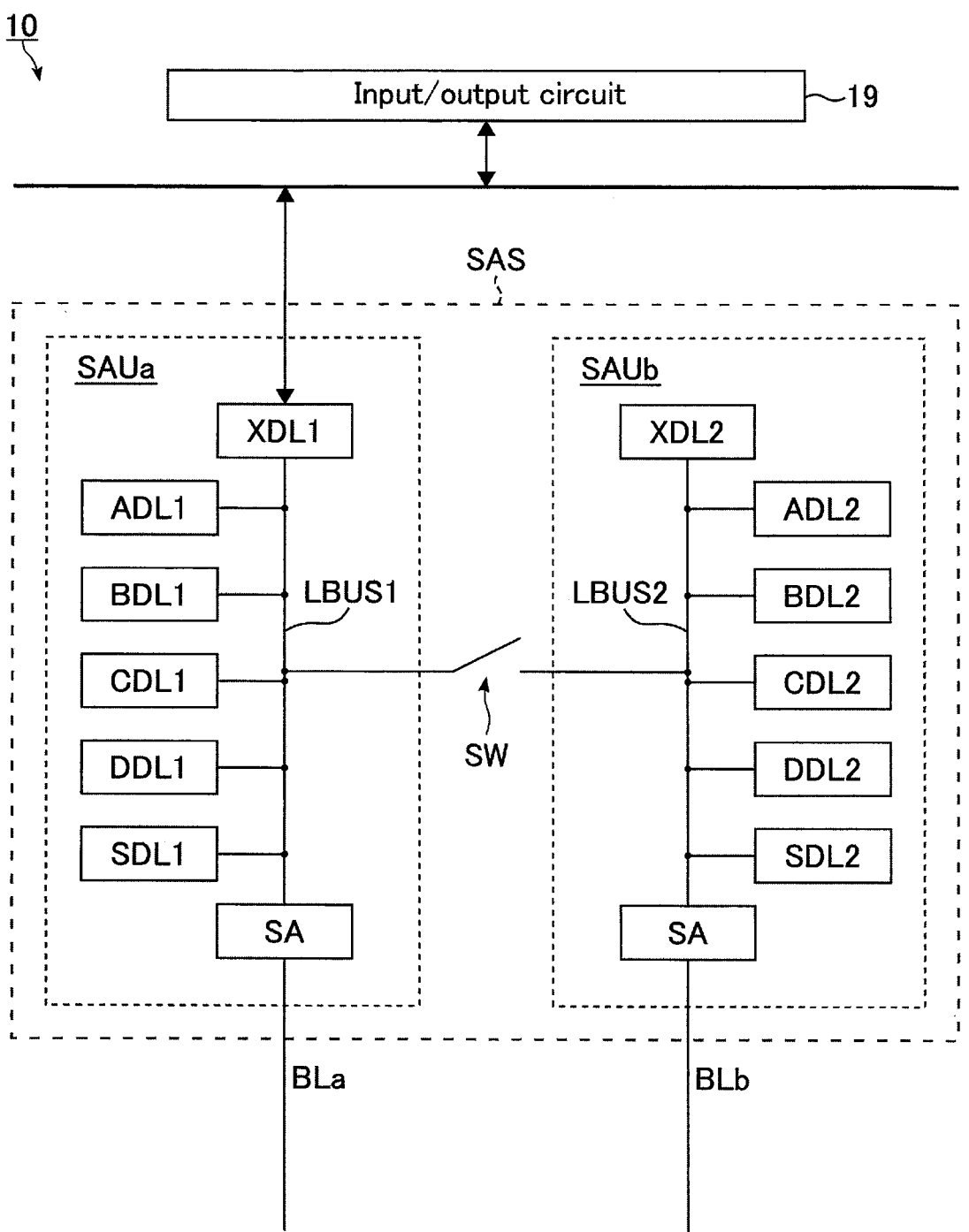
F I G. 159

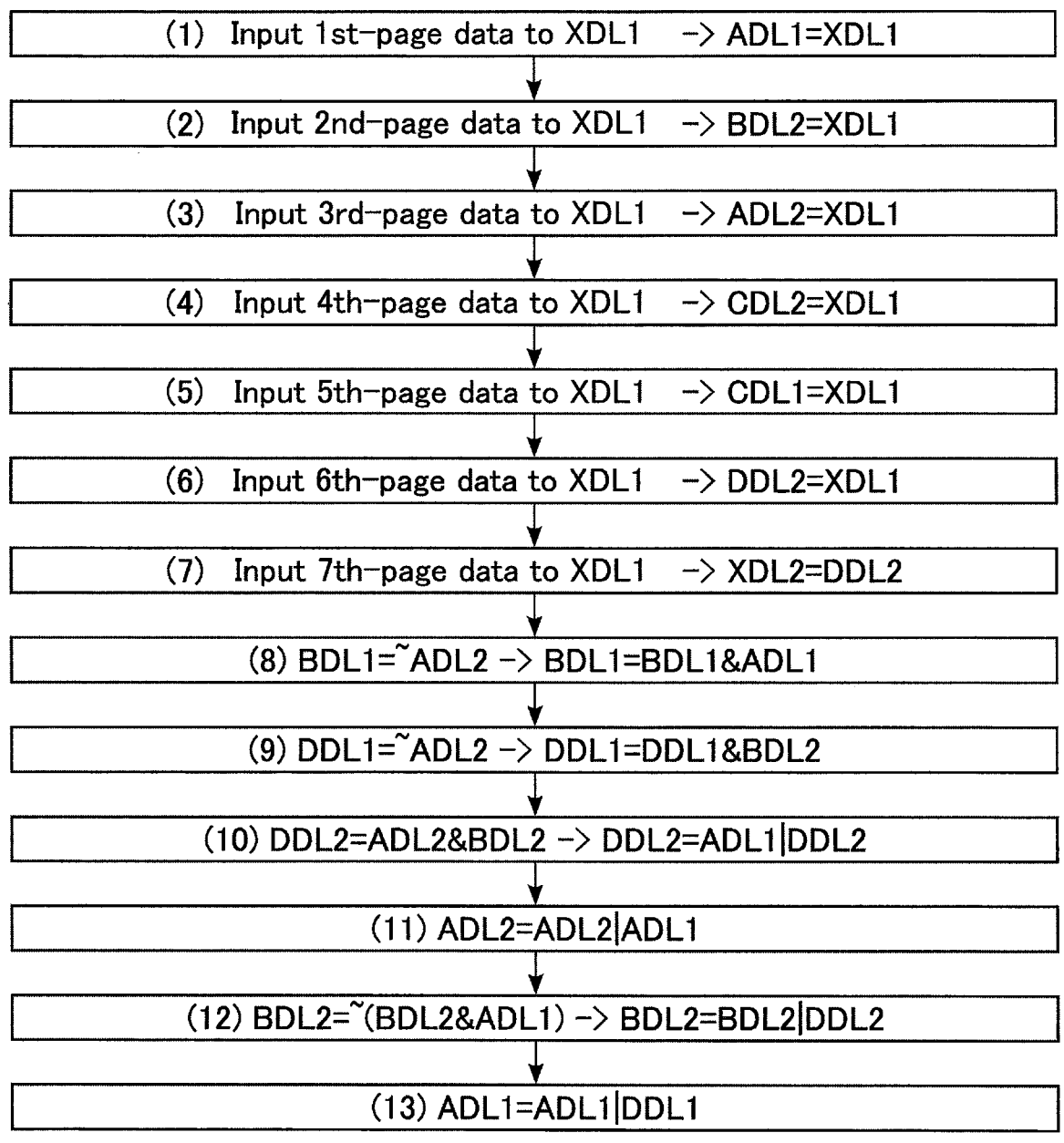
(1)   Input 1st-page data to XDL1    -> ADL1=XDL1
(2)   Input 2nd-page data to XDL1    -> BDL2=XDL1
(3)   Input 3rd-page data to XDL1    -> ADL2=XDL1
(4)   Input 4th-page data to XDL1    -> CDL2=XDL1
(5)   Input 5th-page data to XDL1    -> CDL1=XDL1
(6)   Input 6th-page data to XDL1    -> DDL2=XDL1
(7)   Input 7th-page data to XDL1    -> XDL2=DDL2
(8) BDL1=~ADL2 -> BDL1=BDL1&ADL1
(9) DDL1=~ADL2 -> DDL1=DDL1&BDL2
(10) DDL2=ADL2&BDL2 -> DDL2=ADL1|DDL2
(11) ADL2=ADL2|ADL1
(12) BDL2=~(BDL2&ADL1) -> BDL2=BDL2|DDL2
(13) ADL1=ADL1|DDL1
F I G. 160

Data allocation(1/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (1) | Z | Z | 0 | 0 | 0 | 0 | 0 | 0 | 0 | 0 | 0 |
| (2) | Z | A | 0 | 0 | 0 | 1 | 0 | 0 | 0 | 0 | 0 |
| (3) | Z | B | 0 | 0 | 0 | 1 | 0 | 1 | 0 | 0 | 0 |
| (4) | Z | C | 0 | 0 | 0 | 1 | 0 | 1 | 0 | 1 | 0 |
| (5) | Z | D | 0 | 0 | 0 | 1 | 0 | 0 | 0 | 1 | 0 |
| (6) | Z | E | 0 | 0 | 0 | 0 | 0 | 0 | 0 | 1 | 0 |
| (7) | Z | F | 0 | 0 | 0 | 0 | 0 | 1 | 0 | 1 | 0 |
| (8) | Z | G | 0 | 0 | 0 | 0 | 0 | 1 | 0 | 0 | 0 |
| (9) | Z | H | 0 | 0 | 1 | 0 | 0 | 1 | 0 | 0 | 0 |
| (10) | Z | I | 0 | 0 | 1 | 0 | 0 | 1 | 0 | 1 | 0 |
| (11) | Z | J | 0 | 1 | 1 | 0 | 0 | 1 | 0 | 1 | 0 |
| (12) | Z | K | 0 | 1 | 1 | 1 | 0 | 1 | 0 | 1 | 0 |
| (13) | Z | L | 0 | 1 | 1 | 1 | 0 | 0 | 0 | 1 | 0 |
| (14) | Z | M | 0 | 1 | 1 | 0 | 0 | 0 | 0 | 1 | 0 |
| (15) | Z | N | 0 | 0 | 1 | 0 | 0 | 0 | 0 | 1 | 0 |
| (16) | Z | O | 0 | 0 | 1 | 0 | 0 | 0 | 0 | 0 | 0 |
| (17) | Z | P | 0 | 1 | 1 | 0 | 0 | 0 | 0 | 0 | 0 |
| (18) | Z | Q | 0 | 1 | 1 | 0 | 0 | 1 | 0 | 0 | 0 |
| (19) | Z | R | 0 | 1 | 1 | 1 | 0 | 1 | 0 | 0 | 0 |
| (20) | Z | S | 0 | 0 | 1 | 1 | 0 | 1 | 0 | 0 | 0 |
| (21) | Z | T | 0 | 0 | 1 | 1 | 0 | 1 | 0 | 1 | 0 |
| (22) | Z | U | 0 | 0 | 1 | 1 | 0 | 0 | 0 | 1 | 0 |
| (23) | Z | V | 0 | 0 | 1 | 1 | 0 | 0 | 0 | 0 | 0 |
| (24) | Z | W | 0 | 1 | 1 | 1 | 0 | 0 | 0 | 0 | 0 |
| (25) | A | Z | 0 | 0 | 0 | 0 | 1 | 0 | 0 | 0 | 0 |
| (26) | A | A | 0 | 0 | 0 | 1 | 1 | 0 | 0 | 0 | 0 |
| (27) | A | B | 0 | 0 | 0 | 1 | 1 | 1 | 0 | 0 | 0 |
| (28) | A | C | 0 | 0 | 0 | 1 | 1 | 1 | 0 | 1 | 0 |
| (29) | A | D | 0 | 0 | 0 | 1 | 1 | 0 | 0 | 1 | 0 |
| (30) | A | E | 0 | 0 | 0 | 0 | 1 | 0 | 0 | 1 | 0 |
| (31) | A | F | 0 | 0 | 0 | 0 | 1 | 1 | 0 | 1 | 0 |
| (32) | A | G | 0 | 0 | 0 | 0 | 1 | 1 | 0 | 0 | 0 |
| (33) | A | H | 0 | 0 | 1 | 0 | 1 | 1 | 0 | 0 | 0 |
| (34) | A | I | 0 | 0 | 1 | 0 | 1 | 1 | 0 | 1 | 0 |
| (35) | A | J | 0 | 1 | 1 | 0 | 1 | 1 | 0 | 1 | 0 |
| (36) | A | K | 0 | 1 | 1 | 1 | 1 | 1 | 0 | 1 | 0 |

F I G. 162

Data allocation(2/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (37) | A | L | 0 | 1 | 1 | 1 | 1 | 0 | 0 | 1 | 0 |
| (38) | A | M | 0 | 1 | 1 | 0 | 1 | 0 | 0 | 1 | 0 |
| (39) | A | N | 0 | 0 | 1 | 0 | 1 | 0 | 0 | 1 | 0 |
| (40) | A | O | 0 | 0 | 1 | 0 | 1 | 0 | 0 | 0 | 0 |
| (41) | A | P | 0 | 1 | 1 | 0 | 1 | 0 | 0 | 0 | 0 |
| (42) | A | Q | 0 | 1 | 1 | 0 | 1 | 1 | 0 | 0 | 0 |
| (43) | A | R | 0 | 1 | 1 | 1 | 1 | 1 | 0 | 0 | 0 |
| (44) | A | S | 0 | 0 | 1 | 1 | 1 | 1 | 0 | 0 | 0 |
| (45) | A | T | 0 | 0 | 1 | 1 | 1 | 1 | 0 | 1 | 0 |
| (46) | A | U | 0 | 0 | 1 | 1 | 1 | 0 | 0 | 1 | 0 |
| (47) | A | V | 0 | 0 | 1 | 1 | 1 | 0 | 0 | 0 | 0 |
| (48) | A | W | 0 | 1 | 1 | 1 | 1 | 0 | 0 | 0 | 0 |
| (49) | B | Z | 0 | 0 | 0 | 0 | 1 | 0 | 1 | 0 | 0 |
| (50) | B | A | 0 | 0 | 0 | 1 | 1 | 0 | 1 | 0 | 0 |
| (51) | B | B | 0 | 0 | 0 | 1 | 1 | 1 | 1 | 0 | 0 |
| (52) | B | C | 0 | 0 | 0 | 1 | 1 | 1 | 1 | 1 | 0 |
| (53) | B | D | 0 | 0 | 0 | 1 | 1 | 0 | 1 | 1 | 0 |
| (54) | B | E | 0 | 0 | 0 | 0 | 1 | 0 | 1 | 1 | 0 |
| (55) | B | F | 0 | 0 | 0 | 0 | 1 | 1 | 1 | 1 | 0 |
| (56) | B | G | 0 | 0 | 0 | 0 | 1 | 1 | 1 | 0 | 0 |
| (57) | B | H | 0 | 0 | 1 | 0 | 1 | 1 | 1 | 0 | 0 |
| (58) | B | I | 0 | 0 | 1 | 0 | 1 | 1 | 1 | 1 | 0 |
| (59) | B | J | 0 | 1 | 1 | 0 | 1 | 1 | 1 | 1 | 0 |
| (60) | B | K | 0 | 1 | 1 | 1 | 1 | 1 | 1 | 1 | 0 |
| (61) | B | L | 0 | 1 | 1 | 1 | 1 | 0 | 1 | 1 | 0 |
| (62) | B | M | 0 | 1 | 1 | 0 | 1 | 0 | 1 | 1 | 0 |
| (63) | B | N | 0 | 0 | 1 | 0 | 1 | 0 | 1 | 1 | 0 |
| (64) | B | O | 0 | 0 | 1 | 0 | 1 | 0 | 1 | 0 | 0 |
| (65) | B | P | 0 | 1 | 1 | 0 | 1 | 0 | 1 | 0 | 0 |
| (66) | B | Q | 0 | 1 | 1 | 0 | 1 | 1 | 1 | 0 | 0 |
| (67) | B | R | 0 | 1 | 1 | 1 | 1 | 1 | 1 | 0 | 0 |
| (68) | B | S | 0 | 0 | 1 | 1 | 1 | 1 | 1 | 0 | 0 |
| (69) | B | T | 0 | 0 | 1 | 1 | 1 | 1 | 1 | 1 | 0 |
| (70) | B | U | 0 | 0 | 1 | 1 | 1 | 0 | 1 | 1 | 0 |
| (71) | B | V | 0 | 0 | 1 | 1 | 1 | 0 | 1 | 0 | 0 |
| (72) | B | W | 0 | 1 | 1 | 1 | 1 | 0 | 1 | 0 | 0 |

F I G. 163

Data allocation(3/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (73) | C | Z | 0 | 0 | 0 | 0 | 1 | 0 | 1 | 0 | 1 |
| (74) | C | A | 0 | 0 | 0 | 1 | 1 | 0 | 1 | 0 | 1 |
| (75) | C | B | 0 | 0 | 0 | 1 | 1 | 1 | 1 | 0 | 1 |
| (76) | C | C | 0 | 0 | 0 | 1 | 1 | 1 | 1 | 1 | 1 |
| (77) | C | D | 0 | 0 | 0 | 1 | 1 | 0 | 1 | 1 | 1 |
| (78) | C | E | 0 | 0 | 0 | 0 | 1 | 0 | 1 | 1 | 1 |
| (79) | C | F | 0 | 0 | 0 | 0 | 1 | 1 | 1 | 1 | 1 |
| (80) | C | G | 0 | 0 | 0 | 0 | 1 | 1 | 1 | 0 | 1 |
| (81) | C | H | 0 | 0 | 1 | 0 | 1 | 1 | 1 | 0 | 1 |
| (82) | C | I | 0 | 0 | 1 | 0 | 1 | 1 | 1 | 1 | 1 |
| (83) | C | J | 0 | 1 | 1 | 0 | 1 | 1 | 1 | 1 | 1 |
| (84) | C | K | 0 | 1 | 1 | 1 | 1 | 1 | 1 | 1 | 1 |
| (85) | C | L | 0 | 1 | 1 | 1 | 1 | 0 | 1 | 1 | 1 |
| (86) | C | M | 0 | 1 | 1 | 0 | 1 | 0 | 1 | 1 | 1 |
| (87) | C | N | 0 | 0 | 1 | 0 | 1 | 0 | 1 | 1 | 1 |
| (88) | C | O | 0 | 0 | 1 | 0 | 1 | 0 | 1 | 0 | 1 |
| (89) | C | P | 0 | 1 | 1 | 0 | 1 | 0 | 1 | 0 | 1 |
| (90) | C | Q | 0 | 1 | 1 | 0 | 1 | 1 | 1 | 0 | 1 |
| (91) | C | R | 0 | 1 | 1 | 1 | 1 | 1 | 1 | 0 | 1 |
| (92) | C | S | 0 | 0 | 1 | 1 | 1 | 1 | 1 | 0 | 1 |
| (93) | C | T | 0 | 0 | 1 | 1 | 1 | 1 | 1 | 1 | 1 |
| (94) | C | U | 0 | 0 | 1 | 1 | 1 | 0 | 1 | 1 | 1 |
| (95) | C | V | 0 | 0 | 1 | 1 | 1 | 0 | 1 | 0 | 1 |
| (96) | C | W | 0 | 1 | 1 | 1 | 1 | 0 | 1 | 0 | 1 |
| (97) | D | Z | 0 | 0 | 0 | 0 | 1 | 0 | 0 | 0 | 1 |
| (98) | D | A | 0 | 0 | 0 | 1 | 1 | 0 | 0 | 0 | 1 |
| (99) | D | B | 0 | 0 | 0 | 1 | 1 | 1 | 0 | 0 | 1 |
| (100) | D | C | 0 | 0 | 0 | 1 | 1 | 1 | 0 | 1 | 1 |
| (101) | D | D | 0 | 0 | 0 | 1 | 1 | 0 | 0 | 1 | 1 |
| (102) | D | E | 0 | 0 | 0 | 0 | 1 | 0 | 0 | 1 | 1 |
| (103) | D | F | 0 | 0 | 0 | 0 | 1 | 1 | 0 | 1 | 1 |
| (104) | D | G | 0 | 0 | 0 | 0 | 1 | 1 | 0 | 0 | 1 |
| (105) | D | H | 0 | 0 | 1 | 0 | 1 | 1 | 0 | 0 | 1 |
| (106) | D | I | 0 | 0 | 1 | 0 | 1 | 1 | 0 | 1 | 1 |
| (107) | D | J | 0 | 1 | 1 | 0 | 1 | 1 | 0 | 1 | 1 |
| (108) | D | K | 0 | 1 | 1 | 1 | 1 | 1 | 0 | 1 | 1 |

FIG. 164

Data allocation(4/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (109) | D | L | 0 | 1 | 1 | 1 | 1 | 0 | 0 | 1 | 1 |
| (110) | D | M | 0 | 1 | 1 | 0 | 1 | 0 | 0 | 1 | 1 |
| (111) | D | N | 0 | 0 | 1 | 0 | 1 | 0 | 0 | 1 | 1 |
| (112) | D | O | 0 | 0 | 1 | 0 | 1 | 0 | 0 | 0 | 1 |
| (113) | D | P | 0 | 1 | 1 | 0 | 1 | 0 | 0 | 0 | 1 |
| (114) | D | Q | 0 | 1 | 1 | 0 | 1 | 1 | 0 | 0 | 1 |
| (115) | D | R | 0 | 1 | 1 | 1 | 1 | 1 | 0 | 0 | 1 |
| (116) | D | S | 0 | 0 | 1 | 1 | 1 | 1 | 0 | 0 | 1 |
| (117) | D | T | 0 | 0 | 1 | 1 | 1 | 1 | 0 | 1 | 1 |
| (118) | D | U | 0 | 0 | 1 | 1 | 1 | 0 | 0 | 1 | 1 |
| (119) | D | V | 0 | 0 | 1 | 1 | 1 | 0 | 0 | 0 | 1 |
| (120) | D | W | 0 | 1 | 1 | 1 | 1 | 0 | 0 | 0 | 1 |
| (121) | E | Z | 0 | 0 | 0 | 0 | 0 | 0 | 0 | 0 | 1 |
| (122) | E | A | 0 | 0 | 0 | 1 | 0 | 0 | 0 | 0 | 1 |
| (123) | E | B | 0 | 0 | 0 | 1 | 0 | 1 | 0 | 0 | 1 |
| (124) | E | C | 0 | 0 | 0 | 1 | 0 | 1 | 0 | 1 | 1 |
| (125) | E | D | 0 | 0 | 0 | 1 | 0 | 0 | 0 | 1 | 1 |
| (126) | E | E | 0 | 0 | 0 | 0 | 0 | 0 | 0 | 1 | 1 |
| (127) | E | F | 0 | 0 | 0 | 0 | 0 | 1 | 0 | 1 | 1 |
| (128) | E | G | 0 | 0 | 0 | 0 | 0 | 1 | 0 | 0 | 1 |
| (129) | E | H | 0 | 0 | 1 | 0 | 0 | 1 | 0 | 0 | 1 |
| (130) | E | I | 0 | 0 | 1 | 0 | 0 | 1 | 0 | 1 | 1 |
| (131) | E | J | 0 | 1 | 1 | 0 | 0 | 1 | 0 | 1 | 1 |
| (132) | E | K | 0 | 1 | 1 | 1 | 0 | 1 | 0 | 1 | 1 |
| (133) | E | L | 0 | 1 | 1 | 1 | 0 | 0 | 0 | 1 | 1 |
| (134) | E | M | 0 | 1 | 1 | 0 | 0 | 0 | 0 | 1 | 1 |
| (135) | E | N | 0 | 0 | 1 | 0 | 0 | 0 | 0 | 1 | 1 |
| (136) | E | O | 0 | 0 | 1 | 0 | 0 | 0 | 0 | 0 | 1 |
| (137) | E | P | 0 | 1 | 1 | 0 | 0 | 0 | 0 | 0 | 1 |
| (138) | E | Q | 0 | 1 | 1 | 0 | 0 | 1 | 0 | 0 | 1 |
| (139) | E | R | 0 | 1 | 1 | 1 | 0 | 1 | 0 | 0 | 1 |
| (140) | E | S | 0 | 0 | 1 | 1 | 0 | 1 | 0 | 0 | 1 |
| (141) | E | T | 0 | 0 | 1 | 1 | 0 | 1 | 0 | 1 | 1 |
| (142) | E | U | 0 | 0 | 1 | 1 | 0 | 0 | 0 | 1 | 1 |
| (143) | E | V | 0 | 0 | 1 | 1 | 0 | 0 | 0 | 0 | 1 |
| (144) | E | W | 0 | 1 | 1 | 1 | 0 | 0 | 0 | 0 | 1 |

F I G. 165

Data allocation(5/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (145) | F | Z | 0 | 0 | 0 | 0 | 0 | 0 | 1 | 0 | 1 |
| (146) | F | A | 0 | 0 | 0 | 1 | 0 | 0 | 1 | 0 | 1 |
| (147) | F | B | 0 | 0 | 0 | 1 | 0 | 1 | 1 | 0 | 1 |
| (148) | F | C | 0 | 0 | 0 | 1 | 0 | 1 | 1 | 1 | 1 |
| (149) | F | D | 0 | 0 | 0 | 1 | 0 | 0 | 1 | 1 | 1 |
| (150) | F | E | 0 | 0 | 0 | 0 | 0 | 0 | 1 | 1 | 1 |
| (151) | F | F | 0 | 0 | 0 | 0 | 0 | 1 | 1 | 1 | 1 |
| (152) | F | G | 0 | 0 | 0 | 0 | 0 | 1 | 1 | 0 | 1 |
| (153) | F | H | 0 | 0 | 1 | 0 | 0 | 1 | 1 | 0 | 1 |
| (154) | F | I | 0 | 0 | 1 | 0 | 0 | 1 | 1 | 1 | 1 |
| (155) | F | J | 0 | 1 | 1 | 0 | 0 | 1 | 1 | 1 | 1 |
| (156) | F | K | 0 | 1 | 1 | 1 | 0 | 1 | 1 | 1 | 1 |
| (157) | F | L | 0 | 1 | 1 | 1 | 0 | 0 | 1 | 1 | 1 |
| (158) | F | M | 0 | 1 | 1 | 0 | 0 | 0 | 1 | 1 | 1 |
| (159) | F | N | 0 | 0 | 1 | 0 | 0 | 0 | 1 | 1 | 1 |
| (160) | F | O | 0 | 0 | 1 | 0 | 0 | 0 | 1 | 0 | 1 |
| (161) | F | P | 0 | 1 | 1 | 0 | 0 | 0 | 1 | 0 | 1 |
| (162) | F | Q | 0 | 1 | 1 | 0 | 0 | 1 | 1 | 0 | 1 |
| (163) | F | R | 0 | 1 | 1 | 1 | 0 | 1 | 1 | 0 | 1 |
| (164) | F | S | 0 | 0 | 1 | 1 | 0 | 1 | 1 | 0 | 1 |
| (165) | F | T | 0 | 0 | 1 | 1 | 0 | 1 | 1 | 1 | 1 |
| (166) | F | U | 0 | 0 | 1 | 1 | 0 | 0 | 1 | 1 | 1 |
| (167) | F | V | 0 | 0 | 1 | 1 | 0 | 0 | 1 | 0 | 1 |
| (168) | F | W | 0 | 1 | 1 | 1 | 0 | 0 | 1 | 0 | 1 |
| (169) | G | Z | 0 | 0 | 0 | 0 | 0 | 0 | 1 | 0 | 0 |
| (170) | G | A | 0 | 0 | 0 | 1 | 0 | 0 | 1 | 0 | 0 |
| (171) | G | B | 0 | 0 | 0 | 1 | 0 | 1 | 1 | 0 | 0 |
| (172) | G | C | 0 | 0 | 0 | 1 | 0 | 1 | 1 | 1 | 0 |
| (173) | G | D | 0 | 0 | 0 | 1 | 0 | 0 | 1 | 1 | 0 |
| (174) | G | E | 0 | 0 | 0 | 0 | 0 | 0 | 1 | 1 | 0 |
| (175) | G | F | 0 | 0 | 0 | 0 | 0 | 1 | 1 | 1 | 0 |
| (176) | G | G | 0 | 0 | 0 | 0 | 0 | 1 | 1 | 0 | 0 |
| (177) | G | H | 0 | 0 | 1 | 0 | 0 | 1 | 1 | 0 | 0 |
| (178) | G | I | 0 | 0 | 1 | 0 | 0 | 1 | 1 | 1 | 0 |
| (179) | G | J | 0 | 1 | 1 | 0 | 0 | 1 | 1 | 1 | 0 |
| (180) | G | K | 0 | 1 | 1 | 1 | 0 | 1 | 1 | 1 | 0 |

F I G. 166

Data allocation(6/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (181) | G | L | 0 | 1 | 1 | 1 | 0 | 0 | 1 | 1 | 0 |
| (182) | G | M | 0 | 1 | 1 | 0 | 0 | 0 | 1 | 1 | 0 |
| (183) | G | N | 0 | 0 | 1 | 0 | 0 | 0 | 1 | 1 | 0 |
| (184) | G | O | 0 | 0 | 1 | 0 | 0 | 0 | 1 | 0 | 0 |
| (185) | G | P | 0 | 1 | 1 | 0 | 0 | 0 | 1 | 0 | 0 |
| (186) | G | Q | 0 | 1 | 1 | 0 | 0 | 1 | 1 | 0 | 0 |
| (187) | G | R | 0 | 1 | 1 | 1 | 0 | 1 | 1 | 0 | 0 |
| (188) | G | S | 0 | 0 | 1 | 1 | 0 | 1 | 1 | 0 | 0 |
| (189) | G | T | 0 | 0 | 1 | 1 | 0 | 1 | 1 | 1 | 0 |
| (190) | G | U | 0 | 0 | 1 | 1 | 0 | 0 | 1 | 1 | 0 |
| (191) | G | V | 0 | 0 | 1 | 1 | 0 | 0 | 1 | 0 | 0 |
| (192) | G | W | 0 | 1 | 1 | 1 | 0 | 0 | 1 | 0 | 0 |
| (193) | H | Z | 0 | 1 | 0 | 0 | 0 | 0 | 1 | 0 | 0 |
| (194) | H | A | 0 | 1 | 0 | 1 | 0 | 0 | 1 | 0 | 0 |
| (195) | H | B | 0 | 1 | 0 | 1 | 0 | 1 | 1 | 0 | 0 |
| (196) | H | C | 0 | 1 | 0 | 1 | 0 | 1 | 1 | 1 | 0 |
| (197) | H | D | 0 | 1 | 0 | 1 | 0 | 0 | 1 | 1 | 0 |
| (198) | H | E | 0 | 1 | 0 | 0 | 0 | 0 | 1 | 1 | 0 |
| (199) | H | F | 0 | 1 | 0 | 0 | 0 | 1 | 1 | 1 | 0 |
| (200) | H | G | 0 | 1 | 0 | 0 | 0 | 1 | 1 | 0 | 0 |
| (201) | H | H | 1 | 1 | 1 | 0 | 0 | 1 | 1 | 0 | 0 |
| (202) | H | I | 1 | 1 | 1 | 0 | 0 | 1 | 1 | 1 | 0 |
| (203) | H | J | 1 | 0 | 1 | 0 | 0 | 1 | 1 | 1 | 0 |
| (204) | H | K | 1 | 0 | 1 | 1 | 0 | 1 | 1 | 1 | 0 |
| (205) | H | L | 1 | 0 | 1 | 1 | 0 | 0 | 1 | 1 | 0 |
| (206) | H | M | 1 | 0 | 1 | 0 | 0 | 0 | 1 | 1 | 0 |
| (207) | H | N | 1 | 1 | 1 | 0 | 0 | 0 | 1 | 1 | 0 |
| (208) | H | O | 1 | 1 | 1 | 0 | 0 | 0 | 1 | 0 | 0 |
| (209) | H | P | 1 | 0 | 1 | 0 | 0 | 0 | 1 | 0 | 0 |
| (210) | H | Q | 1 | 0 | 1 | 0 | 0 | 1 | 1 | 0 | 0 |
| (211) | H | R | 1 | 0 | 1 | 1 | 0 | 1 | 1 | 0 | 0 |
| (212) | H | S | 1 | 1 | 1 | 1 | 0 | 1 | 1 | 0 | 0 |
| (213) | H | T | 1 | 1 | 1 | 1 | 0 | 1 | 1 | 1 | 0 |
| (214) | H | U | 1 | 1 | 1 | 1 | 0 | 0 | 1 | 1 | 0 |
| (215) | H | V | 1 | 1 | 1 | 1 | 0 | 0 | 1 | 0 | 0 |
| (216) | H | W | 1 | 0 | 1 | 1 | 0 | 0 | 1 | 0 | 0 |

F I G. 167

Data allocation(7/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (217) | I | Z | 0 | 1 | 0 | 0 | 0 | 0 | 1 | 0 | 1 |
| (218) | I | A | 0 | 1 | 0 | 1 | 0 | 0 | 1 | 0 | 1 |
| (219) | I | B | 0 | 1 | 0 | 1 | 0 | 1 | 1 | 0 | 1 |
| (220) | I | C | 0 | 1 | 0 | 1 | 0 | 1 | 1 | 1 | 1 |
| (221) | I | D | 0 | 1 | 0 | 1 | 0 | 0 | 1 | 1 | 1 |
| (222) | I | E | 0 | 1 | 0 | 0 | 0 | 0 | 1 | 1 | 1 |
| (223) | I | F | 0 | 1 | 0 | 0 | 0 | 1 | 1 | 1 | 1 |
| (224) | I | G | 0 | 1 | 0 | 0 | 0 | 1 | 1 | 0 | 1 |
| (225) | I | H | 1 | 1 | 1 | 0 | 0 | 1 | 1 | 0 | 1 |
| (226) | I | I | 1 | 1 | 1 | 0 | 0 | 1 | 1 | 1 | 1 |
| (227) | I | J | 1 | 0 | 1 | 0 | 0 | 1 | 1 | 1 | 1 |
| (228) | I | K | 1 | 0 | 1 | 1 | 0 | 1 | 1 | 1 | 1 |
| (229) | I | L | 1 | 0 | 1 | 1 | 0 | 0 | 1 | 1 | 1 |
| (230) | I | M | 1 | 0 | 1 | 0 | 0 | 0 | 1 | 1 | 1 |
| (231) | I | N | 1 | 1 | 1 | 0 | 0 | 0 | 1 | 1 | 1 |
| (232) | I | O | 1 | 1 | 1 | 0 | 0 | 0 | 1 | 0 | 1 |
| (233) | I | P | 1 | 0 | 1 | 0 | 0 | 0 | 1 | 0 | 1 |
| (234) | I | Q | 1 | 0 | 1 | 0 | 0 | 1 | 1 | 0 | 1 |
| (235) | I | R | 1 | 0 | 1 | 1 | 0 | 1 | 1 | 0 | 1 |
| (236) | I | S | 1 | 1 | 1 | 1 | 0 | 1 | 1 | 0 | 1 |
| (237) | I | T | 1 | 1 | 1 | 1 | 0 | 1 | 1 | 1 | 1 |
| (238) | I | U | 1 | 1 | 1 | 1 | 0 | 0 | 1 | 1 | 1 |
| (239) | I | V | 1 | 1 | 1 | 1 | 0 | 0 | 1 | 0 | 1 |
| (240) | I | W | 1 | 0 | 1 | 1 | 0 | 0 | 1 | 0 | 1 |
| (241) | J | Z | 0 | 1 | 1 | 0 | 0 | 0 | 1 | 0 | 1 |
| (242) | J | A | 0 | 1 | 1 | 1 | 0 | 0 | 1 | 0 | 1 |
| (243) | J | B | 0 | 1 | 1 | 1 | 0 | 1 | 1 | 0 | 1 |
| (244) | J | C | 0 | 1 | 1 | 1 | 0 | 1 | 1 | 1 | 1 |
| (245) | J | D | 0 | 1 | 1 | 1 | 0 | 0 | 1 | 1 | 1 |
| (246) | J | E | 0 | 1 | 1 | 0 | 0 | 0 | 1 | 1 | 1 |
| (247) | J | F | 0 | 1 | 1 | 0 | 0 | 1 | 1 | 1 | 1 |
| (248) | J | G | 0 | 1 | 1 | 0 | 0 | 1 | 1 | 0 | 1 |
| (249) | J | H | 1 | 1 | 0 | 0 | 0 | 1 | 1 | 0 | 1 |
| (250) | J | I | 1 | 1 | 0 | 0 | 0 | 1 | 1 | 1 | 1 |
| (251) | J | J | 1 | 0 | 0 | 0 | 0 | 1 | 1 | 1 | 1 |
| (252) | J | K | 1 | 0 | 0 | 1 | 0 | 1 | 1 | 1 | 1 |

F I G. 168

Data allocation(8/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (253) | J | L | 1 | 0 | 0 | 1 | 0 | 0 | 1 | 1 | 1 |
| (254) | J | M | 1 | 0 | 0 | 0 | 0 | 0 | 1 | 1 | 1 |
| (255) | J | N | 1 | 1 | 0 | 0 | 0 | 0 | 1 | 1 | 1 |
| (256) | J | O | 1 | 1 | 0 | 0 | 0 | 0 | 1 | 0 | 1 |
| (257) | J | P | 1 | 0 | 0 | 0 | 0 | 0 | 1 | 0 | 1 |
| (258) | J | Q | 1 | 0 | 0 | 0 | 0 | 1 | 1 | 0 | 1 |
| (259) | J | R | 1 | 0 | 0 | 1 | 0 | 1 | 1 | 0 | 1 |
| (260) | J | S | 1 | 1 | 0 | 1 | 0 | 1 | 1 | 0 | 1 |
| (261) | J | T | 1 | 1 | 0 | 1 | 0 | 1 | 1 | 1 | 1 |
| (262) | J | U | 1 | 1 | 0 | 1 | 0 | 0 | 1 | 1 | 1 |
| (263) | J | V | 1 | 1 | 0 | 1 | 0 | 0 | 1 | 0 | 1 |
| (264) | J | W | 1 | 0 | 0 | 1 | 0 | 0 | 1 | 0 | 1 |
| (265) | K | Z | 0 | 1 | 1 | 0 | 1 | 0 | 1 | 0 | 1 |
| (266) | K | A | 0 | 1 | 1 | 1 | 1 | 0 | 1 | 0 | 1 |
| (267) | K | B | 0 | 1 | 1 | 1 | 1 | 1 | 1 | 0 | 1 |
| (268) | K | C | 0 | 1 | 1 | 1 | 1 | 1 | 1 | 1 | 1 |
| (269) | K | D | 0 | 1 | 1 | 1 | 1 | 0 | 1 | 1 | 1 |
| (270) | K | E | 0 | 1 | 1 | 0 | 1 | 0 | 1 | 1 | 1 |
| (271) | K | F | 0 | 1 | 1 | 0 | 1 | 1 | 1 | 1 | 1 |
| (272) | K | G | 0 | 1 | 1 | 0 | 1 | 1 | 1 | 0 | 1 |
| (273) | K | H | 1 | 1 | 0 | 0 | 1 | 1 | 1 | 0 | 1 |
| (274) | K | I | 1 | 1 | 0 | 0 | 1 | 1 | 1 | 1 | 1 |
| (275) | K | J | 1 | 0 | 0 | 0 | 1 | 1 | 1 | 1 | 1 |
| (276) | K | K | 1 | 0 | 0 | 1 | 1 | 1 | 1 | 1 | 1 |
| (277) | K | L | 1 | 0 | 0 | 1 | 1 | 0 | 1 | 1 | 1 |
| (278) | K | M | 1 | 0 | 0 | 0 | 1 | 0 | 1 | 1 | 1 |
| (279) | K | N | 1 | 1 | 0 | 0 | 1 | 0 | 1 | 1 | 1 |
| (280) | K | O | 1 | 1 | 0 | 0 | 1 | 0 | 1 | 0 | 1 |
| (281) | K | P | 1 | 0 | 0 | 0 | 1 | 0 | 1 | 0 | 1 |
| (282) | K | Q | 1 | 0 | 0 | 0 | 1 | 1 | 1 | 0 | 1 |
| (283) | K | R | 1 | 0 | 0 | 1 | 1 | 1 | 1 | 0 | 1 |
| (284) | K | S | 1 | 1 | 0 | 1 | 1 | 1 | 1 | 0 | 1 |
| (285) | K | T | 1 | 1 | 0 | 1 | 1 | 1 | 1 | 1 | 1 |
| (286) | K | U | 1 | 1 | 0 | 1 | 1 | 0 | 1 | 1 | 1 |
| (287) | K | V | 1 | 1 | 0 | 1 | 1 | 0 | 1 | 0 | 1 |
| (288) | K | W | 1 | 0 | 0 | 1 | 1 | 0 | 1 | 0 | 1 |

F I G. 169

Data allocation(9/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (289) | L | Z | 0 | 1 | 1 | 0 | 1 | 0 | 0 | 0 | 1 |
| (290) | L | A | 0 | 1 | 1 | 1 | 1 | 0 | 0 | 0 | 1 |
| (291) | L | B | 0 | 1 | 1 | 1 | 1 | 1 | 0 | 0 | 1 |
| (292) | L | C | 0 | 1 | 1 | 1 | 1 | 1 | 0 | 1 | 1 |
| (293) | L | D | 0 | 1 | 1 | 1 | 1 | 0 | 0 | 1 | 1 |
| (294) | L | E | 0 | 1 | 1 | 0 | 1 | 0 | 0 | 1 | 1 |
| (295) | L | F | 0 | 1 | 1 | 0 | 1 | 1 | 0 | 1 | 1 |
| (296) | L | G | 0 | 1 | 1 | 0 | 1 | 1 | 0 | 0 | 1 |
| (297) | L | H | 1 | 1 | 0 | 0 | 1 | 1 | 0 | 0 | 1 |
| (298) | L | I | 1 | 1 | 0 | 0 | 1 | 1 | 0 | 1 | 1 |
| (299) | L | J | 1 | 0 | 0 | 0 | 1 | 1 | 0 | 1 | 1 |
| (300) | L | K | 1 | 0 | 0 | 1 | 1 | 1 | 0 | 1 | 1 |
| (301) | L | L | 1 | 0 | 0 | 1 | 1 | 0 | 0 | 1 | 1 |
| (302) | L | M | 1 | 0 | 0 | 0 | 1 | 0 | 0 | 1 | 1 |
| (303) | L | N | 1 | 1 | 0 | 0 | 1 | 0 | 0 | 1 | 1 |
| (304) | L | O | 1 | 1 | 0 | 0 | 1 | 0 | 0 | 0 | 1 |
| (305) | L | P | 1 | 0 | 0 | 0 | 1 | 0 | 0 | 0 | 1 |
| (306) | L | Q | 1 | 0 | 0 | 0 | 1 | 1 | 0 | 0 | 1 |
| (307) | L | R | 1 | 0 | 0 | 1 | 1 | 1 | 0 | 0 | 1 |
| (308) | L | S | 1 | 1 | 0 | 1 | 1 | 1 | 0 | 0 | 1 |
| (309) | L | T | 1 | 1 | 0 | 1 | 1 | 1 | 0 | 1 | 1 |
| (310) | L | U | 1 | 1 | 0 | 1 | 1 | 0 | 0 | 1 | 1 |
| (311) | L | V | 1 | 1 | 0 | 1 | 1 | 0 | 0 | 0 | 1 |
| (312) | L | W | 1 | 0 | 0 | 1 | 1 | 0 | 0 | 0 | 1 |
| (313) | M | Z | 0 | 1 | 1 | 0 | 0 | 0 | 0 | 0 | 1 |
| (314) | M | A | 0 | 1 | 1 | 1 | 0 | 0 | 0 | 0 | 1 |
| (315) | M | B | 0 | 1 | 1 | 1 | 0 | 1 | 0 | 0 | 1 |
| (316) | M | C | 0 | 1 | 1 | 1 | 0 | 1 | 0 | 1 | 1 |
| (317) | M | D | 0 | 1 | 1 | 1 | 0 | 0 | 0 | 1 | 1 |
| (318) | M | E | 0 | 1 | 1 | 0 | 0 | 0 | 0 | 1 | 1 |
| (319) | M | F | 0 | 1 | 1 | 0 | 0 | 1 | 0 | 1 | 1 |
| (320) | M | G | 0 | 1 | 1 | 0 | 0 | 1 | 0 | 0 | 1 |
| (321) | M | H | 1 | 1 | 0 | 0 | 0 | 1 | 0 | 0 | 1 |
| (322) | M | I | 1 | 1 | 0 | 0 | 0 | 1 | 0 | 1 | 1 |
| (323) | M | J | 1 | 0 | 0 | 0 | 0 | 1 | 0 | 1 | 1 |
| (324) | M | K | 1 | 0 | 0 | 1 | 0 | 1 | 0 | 1 | 1 |

F I G. 170

Data allocation(10/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (325) | M | L | 1 | 0 | 0 | 1 | 0 | 0 | 0 | 1 | 1 |
| (326) | M | M | 1 | 0 | 0 | 0 | 0 | 0 | 0 | 1 | 1 |
| (327) | M | N | 1 | 1 | 0 | 0 | 0 | 0 | 0 | 1 | 1 |
| (328) | M | O | 1 | 1 | 0 | 0 | 0 | 0 | 0 | 0 | 1 |
| (329) | M | P | 1 | 0 | 0 | 0 | 0 | 0 | 0 | 0 | 1 |
| (330) | M | Q | 1 | 0 | 0 | 0 | 0 | 1 | 0 | 0 | 1 |
| (331) | M | R | 1 | 0 | 0 | 1 | 0 | 1 | 0 | 0 | 1 |
| (332) | M | S | 1 | 1 | 0 | 1 | 0 | 1 | 0 | 0 | 1 |
| (333) | M | T | 1 | 1 | 0 | 1 | 0 | 1 | 0 | 1 | 1 |
| (334) | M | U | 1 | 1 | 0 | 1 | 0 | 0 | 0 | 1 | 1 |
| (335) | M | V | 1 | 1 | 0 | 1 | 0 | 0 | 0 | 0 | 1 |
| (336) | M | W | 1 | 0 | 0 | 1 | 0 | 0 | 0 | 0 | 1 |
| (337) | N | Z | 0 | 1 | 0 | 0 | 0 | 0 | 0 | 0 | 1 |
| (338) | N | A | 0 | 1 | 0 | 1 | 0 | 0 | 0 | 0 | 1 |
| (339) | N | B | 0 | 1 | 0 | 1 | 0 | 1 | 0 | 0 | 1 |
| (340) | N | C | 0 | 1 | 0 | 1 | 0 | 1 | 0 | 1 | 1 |
| (341) | N | D | 0 | 1 | 0 | 1 | 0 | 0 | 0 | 1 | 1 |
| (342) | N | E | 0 | 1 | 0 | 0 | 0 | 0 | 0 | 1 | 1 |
| (343) | N | F | 0 | 1 | 0 | 0 | 0 | 1 | 0 | 1 | 1 |
| (344) | N | G | 0 | 1 | 0 | 0 | 0 | 1 | 0 | 0 | 1 |
| (345) | N | H | 1 | 1 | 1 | 0 | 0 | 1 | 0 | 0 | 1 |
| (346) | N | I | 1 | 1 | 1 | 0 | 0 | 1 | 0 | 1 | 1 |
| (347) | N | J | 1 | 0 | 1 | 0 | 0 | 1 | 0 | 1 | 1 |
| (348) | N | K | 1 | 0 | 1 | 1 | 0 | 1 | 0 | 1 | 1 |
| (349) | N | L | 1 | 0 | 1 | 1 | 0 | 0 | 0 | 1 | 1 |
| (350) | N | M | 1 | 0 | 1 | 0 | 0 | 0 | 0 | 1 | 1 |
| (351) | N | N | 1 | 1 | 1 | 0 | 0 | 0 | 0 | 1 | 1 |
| (352) | N | O | 1 | 1 | 1 | 0 | 0 | 0 | 0 | 0 | 1 |
| (353) | N | P | 1 | 0 | 1 | 0 | 0 | 0 | 0 | 0 | 1 |
| (354) | N | Q | 1 | 0 | 1 | 0 | 0 | 1 | 0 | 0 | 1 |
| (355) | N | R | 1 | 0 | 1 | 1 | 0 | 1 | 0 | 0 | 1 |
| (356) | N | S | 1 | 1 | 1 | 1 | 0 | 1 | 0 | 0 | 1 |
| (357) | N | T | 1 | 1 | 1 | 1 | 0 | 1 | 0 | 1 | 1 |
| (358) | N | U | 1 | 1 | 1 | 1 | 0 | 0 | 0 | 1 | 1 |
| (359) | N | V | 1 | 1 | 1 | 1 | 0 | 0 | 0 | 0 | 1 |
| (360) | N | W | 1 | 0 | 1 | 1 | 0 | 0 | 0 | 0 | 1 |

F I G. 171

Data allocation(11/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (361) | O | Z | 0 | 1 | 0 | 0 | 0 | 0 | 0 | 0 | 0 |
| (362) | O | A | 0 | 1 | 0 | 1 | 0 | 0 | 0 | 0 | 0 |
| (363) | O | B | 0 | 1 | 0 | 1 | 0 | 1 | 0 | 0 | 0 |
| (364) | O | C | 0 | 1 | 0 | 1 | 0 | 1 | 0 | 1 | 0 |
| (365) | O | D | 0 | 1 | 0 | 1 | 0 | 0 | 0 | 1 | 0 |
| (366) | O | E | 0 | 1 | 0 | 0 | 0 | 0 | 0 | 1 | 0 |
| (367) | O | F | 0 | 1 | 0 | 0 | 0 | 1 | 0 | 1 | 0 |
| (368) | O | G | 0 | 1 | 0 | 0 | 0 | 1 | 0 | 0 | 0 |
| (369) | O | H | 1 | 1 | 1 | 0 | 0 | 1 | 0 | 0 | 0 |
| (370) | O | I | 1 | 1 | 1 | 0 | 0 | 1 | 0 | 1 | 0 |
| (371) | O | J | 1 | 0 | 1 | 0 | 0 | 1 | 0 | 1 | 0 |
| (372) | O | K | 1 | 0 | 1 | 1 | 0 | 1 | 0 | 1 | 0 |
| (373) | O | L | 1 | 0 | 1 | 1 | 0 | 0 | 0 | 1 | 0 |
| (374) | O | M | 1 | 0 | 1 | 0 | 0 | 0 | 0 | 1 | 0 |
| (375) | O | N | 1 | 1 | 1 | 0 | 0 | 0 | 0 | 1 | 0 |
| (376) | O | O | 1 | 1 | 1 | 0 | 0 | 0 | 0 | 0 | 0 |
| (377) | O | P | 1 | 0 | 1 | 0 | 0 | 0 | 0 | 0 | 0 |
| (378) | O | Q | 1 | 0 | 1 | 0 | 0 | 1 | 0 | 0 | 0 |
| (379) | O | R | 1 | 0 | 1 | 1 | 0 | 1 | 0 | 0 | 0 |
| (380) | O | S | 1 | 1 | 1 | 1 | 0 | 1 | 0 | 0 | 0 |
| (381) | O | T | 1 | 1 | 1 | 1 | 0 | 1 | 0 | 1 | 0 |
| (382) | O | U | 1 | 1 | 1 | 1 | 0 | 0 | 0 | 1 | 0 |
| (383) | O | V | 1 | 1 | 1 | 1 | 0 | 0 | 0 | 0 | 0 |
| (384) | O | W | 1 | 0 | 1 | 1 | 0 | 0 | 0 | 0 | 0 |
| (385) | P | Z | 0 | 1 | 1 | 0 | 0 | 0 | 0 | 0 | 0 |
| (386) | P | A | 0 | 1 | 1 | 1 | 0 | 0 | 0 | 0 | 0 |
| (387) | P | B | 0 | 1 | 1 | 1 | 0 | 1 | 0 | 0 | 0 |
| (388) | P | C | 0 | 1 | 1 | 1 | 0 | 1 | 0 | 1 | 0 |
| (389) | P | D | 0 | 1 | 1 | 1 | 0 | 0 | 0 | 1 | 0 |
| (390) | P | E | 0 | 1 | 1 | 0 | 0 | 0 | 0 | 1 | 0 |
| (391) | P | F | 0 | 1 | 1 | 0 | 0 | 1 | 0 | 1 | 0 |
| (392) | P | G | 0 | 1 | 1 | 0 | 0 | 1 | 0 | 0 | 0 |
| (393) | P | H | 1 | 1 | 0 | 0 | 0 | 1 | 0 | 0 | 0 |
| (394) | P | I | 1 | 1 | 0 | 0 | 0 | 1 | 0 | 1 | 0 |
| (395) | P | J | 1 | 0 | 0 | 0 | 0 | 1 | 0 | 1 | 0 |
| (396) | P | K | 1 | 0 | 0 | 1 | 0 | 1 | 0 | 1 | 0 |

F I G. 172

Data allocation(12/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (397) | M | L | 1 | 0 | 0 | 1 | 0 | 0 | 0 | 1 | 0 |
| (398) | M | M | 1 | 0 | 0 | 0 | 0 | 0 | 0 | 1 | 0 |
| (399) | M | N | 1 | 1 | 0 | 0 | 0 | 0 | 0 | 1 | 0 |
| (400) | M | O | 1 | 1 | 0 | 0 | 0 | 0 | 0 | 0 | 0 |
| (401) | M | P | 1 | 0 | 0 | 0 | 0 | 0 | 0 | 0 | 0 |
| (402) | M | Q | 1 | 0 | 0 | 0 | 0 | 1 | 0 | 0 | 0 |
| (403) | M | R | 1 | 0 | 0 | 1 | 0 | 1 | 0 | 0 | 0 |
| (404) | M | S | 1 | 1 | 0 | 1 | 0 | 1 | 0 | 0 | 0 |
| (405) | M | T | 1 | 1 | 0 | 1 | 0 | 1 | 0 | 1 | 0 |
| (406) | M | U | 1 | 1 | 0 | 1 | 0 | 0 | 0 | 1 | 0 |
| (407) | M | V | 1 | 1 | 0 | 1 | 0 | 0 | 0 | 0 | 0 |
| (408) | M | W | 1 | 0 | 0 | 1 | 0 | 0 | 0 | 0 | 0 |
| (409) | Q | Z | 0 | 1 | 1 | 0 | 0 | 0 | 1 | 0 | 0 |
| (410) | Q | A | 0 | 1 | 1 | 1 | 0 | 0 | 1 | 0 | 0 |
| (411) | Q | B | 0 | 1 | 1 | 1 | 0 | 1 | 1 | 0 | 0 |
| (412) | Q | C | 0 | 1 | 1 | 1 | 0 | 1 | 1 | 1 | 0 |
| (413) | Q | D | 0 | 1 | 1 | 1 | 0 | 0 | 1 | 1 | 0 |
| (414) | Q | E | 0 | 1 | 1 | 0 | 0 | 0 | 1 | 1 | 0 |
| (415) | Q | F | 0 | 1 | 1 | 0 | 0 | 1 | 1 | 1 | 0 |
| (416) | Q | G | 0 | 1 | 1 | 0 | 0 | 1 | 1 | 0 | 0 |
| (417) | Q | H | 1 | 1 | 0 | 0 | 0 | 1 | 1 | 0 | 0 |
| (418) | Q | I | 1 | 1 | 0 | 0 | 0 | 1 | 1 | 1 | 0 |
| (419) | Q | J | 1 | 0 | 0 | 0 | 0 | 1 | 1 | 1 | 0 |
| (420) | Q | K | 1 | 0 | 0 | 1 | 0 | 1 | 1 | 1 | 0 |
| (421) | Q | L | 1 | 0 | 0 | 1 | 0 | 0 | 1 | 1 | 0 |
| (422) | Q | M | 1 | 0 | 0 | 0 | 0 | 0 | 1 | 1 | 0 |
| (423) | Q | N | 1 | 1 | 0 | 0 | 0 | 0 | 1 | 1 | 0 |
| (424) | Q | O | 1 | 1 | 0 | 0 | 0 | 0 | 1 | 0 | 0 |
| (425) | Q | P | 1 | 0 | 0 | 0 | 0 | 0 | 1 | 0 | 0 |
| (426) | Q | Q | 1 | 0 | 0 | 0 | 0 | 1 | 1 | 0 | 0 |
| (427) | Q | R | 1 | 0 | 0 | 1 | 0 | 1 | 1 | 0 | 0 |
| (428) | Q | S | 1 | 1 | 0 | 1 | 0 | 1 | 1 | 0 | 0 |
| (429) | Q | T | 1 | 1 | 0 | 1 | 0 | 1 | 1 | 1 | 0 |
| (430) | Q | U | 1 | 1 | 0 | 1 | 0 | 0 | 1 | 1 | 0 |
| (431) | Q | V | 1 | 1 | 0 | 1 | 0 | 0 | 1 | 0 | 0 |
| (432) | Q | W | 1 | 0 | 0 | 1 | 0 | 0 | 1 | 0 | 0 |

F I G. 173

Data allocation(13/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (433) | R | Z | 0 | 1 | 1 | 0 | 1 | 0 | 1 | 0 | 0 |
| (434) | R | A | 0 | 1 | 1 | 1 | 1 | 0 | 1 | 0 | 0 |
| (435) | R | B | 0 | 1 | 1 | 1 | 1 | 1 | 1 | 0 | 0 |
| (436) | R | C | 0 | 1 | 1 | 1 | 1 | 1 | 1 | 1 | 0 |
| (437) | R | D | 0 | 1 | 1 | 1 | 1 | 0 | 1 | 1 | 0 |
| (438) | R | E | 0 | 1 | 1 | 0 | 1 | 0 | 1 | 1 | 0 |
| (439) | R | F | 0 | 1 | 1 | 0 | 1 | 1 | 1 | 1 | 0 |
| (440) | R | G | 0 | 1 | 1 | 0 | 1 | 1 | 1 | 0 | 0 |
| (441) | R | H | 1 | 1 | 0 | 0 | 1 | 1 | 1 | 0 | 0 |
| (442) | R | I | 1 | 1 | 0 | 0 | 1 | 1 | 1 | 1 | 0 |
| (443) | R | J | 1 | 0 | 0 | 0 | 1 | 1 | 1 | 1 | 0 |
| (444) | R | K | 1 | 0 | 0 | 1 | 1 | 1 | 1 | 1 | 0 |
| (445) | R | L | 1 | 0 | 0 | 1 | 1 | 0 | 1 | 1 | 0 |
| (446) | R | M | 1 | 0 | 0 | 0 | 1 | 0 | 1 | 1 | 0 |
| (447) | R | N | 1 | 1 | 0 | 0 | 1 | 0 | 1 | 1 | 0 |
| (448) | R | O | 1 | 1 | 0 | 0 | 1 | 0 | 1 | 0 | 0 |
| (449) | R | P | 1 | 0 | 0 | 0 | 1 | 0 | 1 | 0 | 0 |
| (450) | R | Q | 1 | 0 | 0 | 0 | 1 | 1 | 1 | 0 | 0 |
| (451) | R | R | 1 | 0 | 0 | 1 | 1 | 1 | 1 | 0 | 0 |
| (452) | R | S | 1 | 1 | 0 | 1 | 1 | 1 | 1 | 0 | 0 |
| (453) | R | T | 1 | 1 | 0 | 1 | 1 | 1 | 1 | 1 | 0 |
| (454) | R | U | 1 | 1 | 0 | 1 | 1 | 0 | 1 | 1 | 0 |
| (455) | R | V | 1 | 1 | 0 | 1 | 1 | 0 | 1 | 0 | 0 |
| (456) | R | W | 1 | 0 | 0 | 1 | 1 | 0 | 1 | 0 | 0 |
| (457) | S | Z | 0 | 1 | 0 | 0 | 1 | 0 | 1 | 0 | 0 |
| (458) | S | A | 0 | 1 | 0 | 1 | 1 | 0 | 1 | 0 | 0 |
| (459) | S | B | 0 | 1 | 0 | 1 | 1 | 1 | 1 | 0 | 0 |
| (460) | S | C | 0 | 1 | 0 | 1 | 1 | 1 | 1 | 1 | 0 |
| (461) | S | D | 0 | 1 | 0 | 1 | 1 | 0 | 1 | 1 | 0 |
| (462) | S | E | 0 | 1 | 0 | 0 | 1 | 0 | 1 | 1 | 0 |
| (463) | S | F | 0 | 1 | 0 | 0 | 1 | 1 | 1 | 1 | 0 |
| (464) | S | G | 0 | 1 | 0 | 0 | 1 | 1 | 1 | 0 | 0 |
| (465) | S | H | 1 | 1 | 1 | 0 | 1 | 1 | 1 | 0 | 0 |
| (466) | S | I | 1 | 1 | 1 | 0 | 1 | 1 | 1 | 1 | 0 |
| (467) | S | J | 1 | 0 | 1 | 0 | 1 | 1 | 1 | 1 | 0 |
| (468) | S | K | 1 | 0 | 1 | 1 | 1 | 1 | 1 | 1 | 0 |

F I G. 174

Data allocation(14/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (469) | S | L | 1 | 0 | 1 | 1 | 1 | 0 | 1 | 1 | 0 |
| (470) | S | M | 1 | 0 | 1 | 0 | 1 | 0 | 1 | 1 | 0 |
| (471) | S | N | 1 | 1 | 1 | 0 | 1 | 0 | 1 | 1 | 0 |
| (472) | S | O | 1 | 1 | 1 | 0 | 1 | 0 | 1 | 0 | 0 |
| (473) | S | P | 1 | 0 | 1 | 0 | 1 | 0 | 1 | 0 | 0 |
| (474) | S | Q | 1 | 0 | 1 | 0 | 1 | 1 | 1 | 0 | 0 |
| (475) | S | R | 1 | 0 | 1 | 1 | 1 | 1 | 1 | 0 | 0 |
| (476) | S | S | 1 | 1 | 1 | 1 | 1 | 1 | 1 | 0 | 0 |
| (477) | S | T | 1 | 1 | 1 | 1 | 1 | 1 | 1 | 1 | 0 |
| (478) | S | U | 1 | 1 | 1 | 1 | 1 | 0 | 1 | 1 | 0 |
| (479) | S | V | 1 | 1 | 1 | 1 | 1 | 0 | 1 | 0 | 0 |
| (480) | S | W | 1 | 0 | 1 | 1 | 1 | 0 | 1 | 0 | 0 |
| (481) | T | Z | 0 | 1 | 0 | 0 | 1 | 0 | 1 | 0 | 1 |
| (482) | T | A | 0 | 1 | 0 | 1 | 1 | 0 | 1 | 0 | 1 |
| (483) | T | B | 0 | 1 | 0 | 1 | 1 | 1 | 1 | 0 | 1 |
| (484) | T | C | 0 | 1 | 0 | 1 | 1 | 1 | 1 | 1 | 1 |
| (485) | T | D | 0 | 1 | 0 | 1 | 1 | 0 | 1 | 1 | 1 |
| (486) | T | E | 0 | 1 | 0 | 0 | 1 | 0 | 1 | 1 | 1 |
| (487) | T | F | 0 | 1 | 0 | 0 | 1 | 1 | 1 | 1 | 1 |
| (488) | T | G | 0 | 1 | 0 | 0 | 1 | 1 | 1 | 0 | 1 |
| (489) | T | H | 1 | 1 | 1 | 0 | 1 | 1 | 1 | 0 | 1 |
| (490) | T | I | 1 | 1 | 1 | 0 | 1 | 1 | 1 | 1 | 1 |
| (491) | T | J | 1 | 0 | 1 | 0 | 1 | 1 | 1 | 1 | 1 |
| (492) | T | K | 1 | 0 | 1 | 1 | 1 | 1 | 1 | 1 | 1 |
| (493) | T | L | 1 | 0 | 1 | 1 | 1 | 0 | 1 | 1 | 1 |
| (494) | T | M | 1 | 0 | 1 | 0 | 1 | 0 | 1 | 1 | 1 |
| (495) | T | N | 1 | 1 | 1 | 0 | 1 | 0 | 1 | 1 | 1 |
| (496) | T | O | 1 | 1 | 1 | 0 | 1 | 0 | 1 | 0 | 1 |
| (497) | T | P | 1 | 0 | 1 | 0 | 1 | 0 | 1 | 0 | 1 |
| (498) | T | Q | 1 | 0 | 1 | 0 | 1 | 1 | 1 | 0 | 1 |
| (499) | T | R | 1 | 0 | 1 | 1 | 1 | 1 | 1 | 0 | 1 |
| (500) | T | S | 1 | 1 | 1 | 1 | 1 | 1 | 1 | 0 | 1 |
| (501) | T | T | 1 | 1 | 1 | 1 | 1 | 1 | 1 | 1 | 1 |
| (502) | T | U | 1 | 1 | 1 | 1 | 1 | 0 | 1 | 1 | 1 |
| (503) | T | V | 1 | 1 | 1 | 1 | 1 | 0 | 1 | 0 | 1 |
| (504) | T | W | 1 | 0 | 1 | 1 | 1 | 0 | 1 | 0 | 1 |

F I G. 175

Data allocation(15/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (505) | U | Z | 0 | 1 | 0 | 0 | 1 | 0 | 0 | 0 | 1 |
| (506) | U | A | 0 | 1 | 0 | 1 | 1 | 0 | 0 | 0 | 1 |
| (507) | U | B | 0 | 1 | 0 | 1 | 1 | 1 | 0 | 0 | 1 |
| (508) | U | C | 0 | 1 | 0 | 1 | 1 | 1 | 0 | 1 | 1 |
| (509) | U | D | 0 | 1 | 0 | 1 | 1 | 0 | 0 | 1 | 1 |
| (510) | U | E | 0 | 1 | 0 | 0 | 1 | 0 | 0 | 1 | 1 |
| (511) | U | F | 0 | 1 | 0 | 0 | 1 | 1 | 0 | 1 | 1 |
| (512) | U | G | 0 | 1 | 0 | 0 | 1 | 1 | 0 | 0 | 1 |
| (513) | U | H | 1 | 1 | 1 | 0 | 1 | 1 | 0 | 0 | 1 |
| (514) | U | I | 1 | 1 | 1 | 0 | 1 | 1 | 0 | 1 | 1 |
| (515) | U | J | 1 | 0 | 1 | 0 | 1 | 1 | 0 | 1 | 1 |
| (516) | U | K | 1 | 0 | 1 | 1 | 1 | 1 | 0 | 1 | 1 |
| (517) | U | L | 1 | 0 | 1 | 1 | 1 | 0 | 0 | 1 | 1 |
| (518) | U | M | 1 | 0 | 1 | 0 | 1 | 0 | 0 | 1 | 1 |
| (519) | U | N | 1 | 1 | 1 | 0 | 1 | 0 | 0 | 1 | 1 |
| (520) | U | O | 1 | 1 | 1 | 0 | 1 | 0 | 0 | 0 | 1 |
| (521) | U | P | 1 | 0 | 1 | 0 | 1 | 0 | 0 | 0 | 1 |
| (522) | U | Q | 1 | 0 | 1 | 0 | 1 | 1 | 0 | 0 | 1 |
| (523) | U | R | 1 | 0 | 1 | 1 | 1 | 1 | 0 | 0 | 1 |
| (524) | U | S | 1 | 1 | 1 | 1 | 1 | 1 | 0 | 0 | 1 |
| (525) | U | T | 1 | 1 | 1 | 1 | 1 | 1 | 0 | 1 | 1 |
| (526) | U | U | 1 | 1 | 1 | 1 | 1 | 0 | 0 | 1 | 1 |
| (527) | U | V | 1 | 1 | 1 | 1 | 1 | 0 | 0 | 0 | 1 |
| (528) | U | W | 1 | 0 | 1 | 1 | 1 | 0 | 0 | 0 | 1 |
| (529) | V | Z | 0 | 1 | 0 | 0 | 1 | 0 | 0 | 0 | 0 |
| (530) | V | A | 0 | 1 | 0 | 1 | 1 | 0 | 0 | 0 | 0 |
| (531) | V | B | 0 | 1 | 0 | 1 | 1 | 1 | 0 | 0 | 0 |
| (532) | V | C | 0 | 1 | 0 | 1 | 1 | 1 | 0 | 1 | 0 |
| (533) | V | D | 0 | 1 | 0 | 1 | 1 | 0 | 0 | 1 | 0 |
| (534) | V | E | 0 | 1 | 0 | 0 | 1 | 0 | 0 | 1 | 0 |
| (535) | V | F | 0 | 1 | 0 | 0 | 1 | 1 | 0 | 1 | 0 |
| (536) | V | G | 0 | 1 | 0 | 0 | 1 | 1 | 0 | 0 | 0 |
| (537) | V | H | 1 | 1 | 1 | 0 | 1 | 1 | 0 | 0 | 0 |
| (538) | V | I | 1 | 1 | 1 | 0 | 1 | 1 | 0 | 1 | 0 |
| (539) | V | J | 1 | 0 | 1 | 0 | 1 | 1 | 0 | 1 | 0 |
| (540) | V | K | 1 | 0 | 1 | 1 | 1 | 1 | 0 | 1 | 0 |

F I G. 176

Data allocation(16/16) (17th Embodiment)

| | Vth of MT | | Data (pages) | | | | | | | | |
|---|---|---|---|---|---|---|---|---|---|---|---|
| | PL1 | PL2 | 1st page | 2nd page | 3rd page | 4th page | 5th page | 6th page | 7th page | 8th page | 9th page |
| (541) | V | L | 1 | 0 | 1 | 1 | 1 | 0 | 0 | 1 | 0 |
| (542) | V | M | 1 | 0 | 1 | 0 | 1 | 0 | 0 | 1 | 0 |
| (543) | V | N | 1 | 1 | 1 | 0 | 1 | 0 | 0 | 1 | 0 |
| (544) | V | O | 1 | 1 | 1 | 0 | 1 | 0 | 0 | 0 | 0 |
| (545) | V | P | 1 | 0 | 1 | 0 | 1 | 0 | 0 | 0 | 0 |
| (546) | V | Q | 1 | 0 | 1 | 0 | 1 | 1 | 0 | 0 | 0 |
| (547) | V | R | 1 | 0 | 1 | 1 | 1 | 1 | 0 | 0 | 0 |
| (548) | V | S | 1 | 1 | 1 | 1 | 1 | 1 | 0 | 0 | 0 |
| (549) | V | T | 1 | 1 | 1 | 1 | 1 | 1 | 0 | 1 | 0 |
| (550) | V | U | 1 | 1 | 1 | 1 | 1 | 0 | 0 | 1 | 0 |
| (551) | V | V | 1 | 1 | 1 | 1 | 1 | 0 | 0 | 0 | 0 |
| (552) | V | W | 1 | 0 | 1 | 1 | 1 | 0 | 0 | 0 | 0 |
| (553) | W | Z | 0 | 1 | 1 | 0 | 1 | 0 | 0 | 0 | 0 |
| (554) | W | A | 0 | 1 | 1 | 1 | 1 | 0 | 0 | 0 | 0 |
| (555) | W | B | 0 | 1 | 1 | 1 | 1 | 1 | 0 | 0 | 0 |
| (556) | W | C | 0 | 1 | 1 | 1 | 1 | 1 | 0 | 1 | 0 |
| (557) | W | D | 0 | 1 | 1 | 1 | 1 | 0 | 0 | 1 | 0 |
| (558) | W | E | 0 | 1 | 1 | 0 | 1 | 0 | 0 | 1 | 0 |
| (559) | W | F | 0 | 1 | 1 | 0 | 1 | 1 | 0 | 1 | 0 |
| (560) | W | G | 0 | 1 | 1 | 0 | 1 | 1 | 0 | 0 | 0 |
| (561) | W | H | 1 | 1 | 0 | 0 | 1 | 1 | 0 | 0 | 0 |
| (562) | W | I | 1 | 1 | 0 | 0 | 1 | 1 | 0 | 1 | 0 |
| (563) | W | J | 1 | 0 | 0 | 0 | 1 | 1 | 0 | 1 | 0 |
| (564) | W | K | 1 | 0 | 0 | 1 | 1 | 1 | 0 | 1 | 0 |
| (565) | W | L | 1 | 0 | 0 | 1 | 1 | 0 | 0 | 1 | 0 |
| (566) | W | M | 1 | 0 | 0 | 0 | 1 | 0 | 0 | 1 | 0 |
| (567) | W | N | 1 | 1 | 0 | 0 | 1 | 0 | 0 | 1 | 0 |
| (568) | W | O | 1 | 1 | 0 | 0 | 1 | 0 | 0 | 0 | 0 |
| (569) | W | P | 1 | 0 | 0 | 0 | 1 | 0 | 0 | 0 | 0 |
| (570) | W | Q | 1 | 0 | 0 | 0 | 1 | 1 | 0 | 0 | 0 |
| (571) | W | R | 1 | 0 | 0 | 1 | 1 | 1 | 0 | 0 | 0 |
| (572) | W | S | 1 | 1 | 0 | 1 | 1 | 1 | 0 | 0 | 0 |
| (573) | W | T | 1 | 1 | 0 | 1 | 1 | 1 | 0 | 1 | 0 |
| (574) | W | U | 1 | 1 | 0 | 1 | 1 | 0 | 0 | 1 | 0 |
| (575) | W | V | 1 | 1 | 0 | 1 | 1 | 0 | 0 | 0 | 0 |
| (576) | W | W | 1 | 0 | 0 | 1 | 1 | 0 | 0 | 0 | 0 |

F I G. 177

Data Definitions (17th Embodiment)

| Read operation | Read voltages | | Read data | | | |
|---|---|---|---|---|---|---|
| | PL1 | PL2 | PL1:PL2 (0:0) | PL1:PL2 (1:0) | PL1:PL2 (0:1) | PL1:PL2 (1:1) |
| 1st page | HR | HR | 0 | 0 | 0 | 1 |
| 2nd page | HR | JR,NR,PR,SR,WR | 0 | 1 | 1 | 0 |
| 3rd page | JR,NR,PR,SR,WR | HR | 0 | 1 | 1 | 0 |
| 4th page | - | AR,ER,KR,MR,RR | 0 | 0 | 1 | 1 |
| 5th page | AR,ER,KR,MR,RR | - | 0 | 1 | 0 | 1 |
| 6th page | - | BR,DR,FR,LR,QR,UR | 0 | 0 | 1 | 1 |
| 7th page | BR,DR,FR,LR,QR,UR | - | 0 | 1 | 0 | 1 |
| 8th page | - | CR,GR,IR,OR,TR,VR | 0 | 0 | 1 | 1 |
| 9th page | CR,GR,IR,OR,TR,VR | - | 0 | 1 | 0 | 1 |

F I G. 178

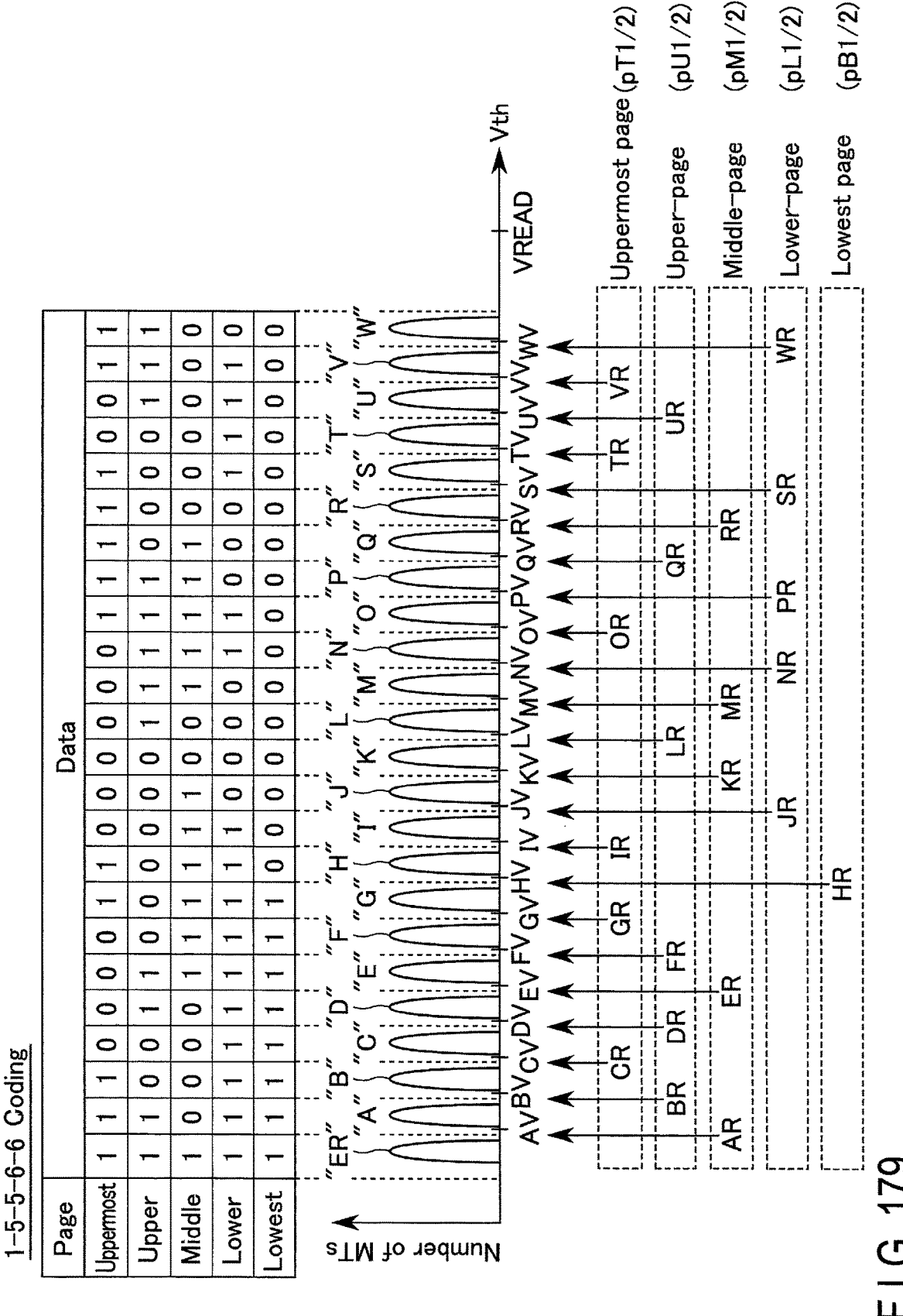
F I G. 179

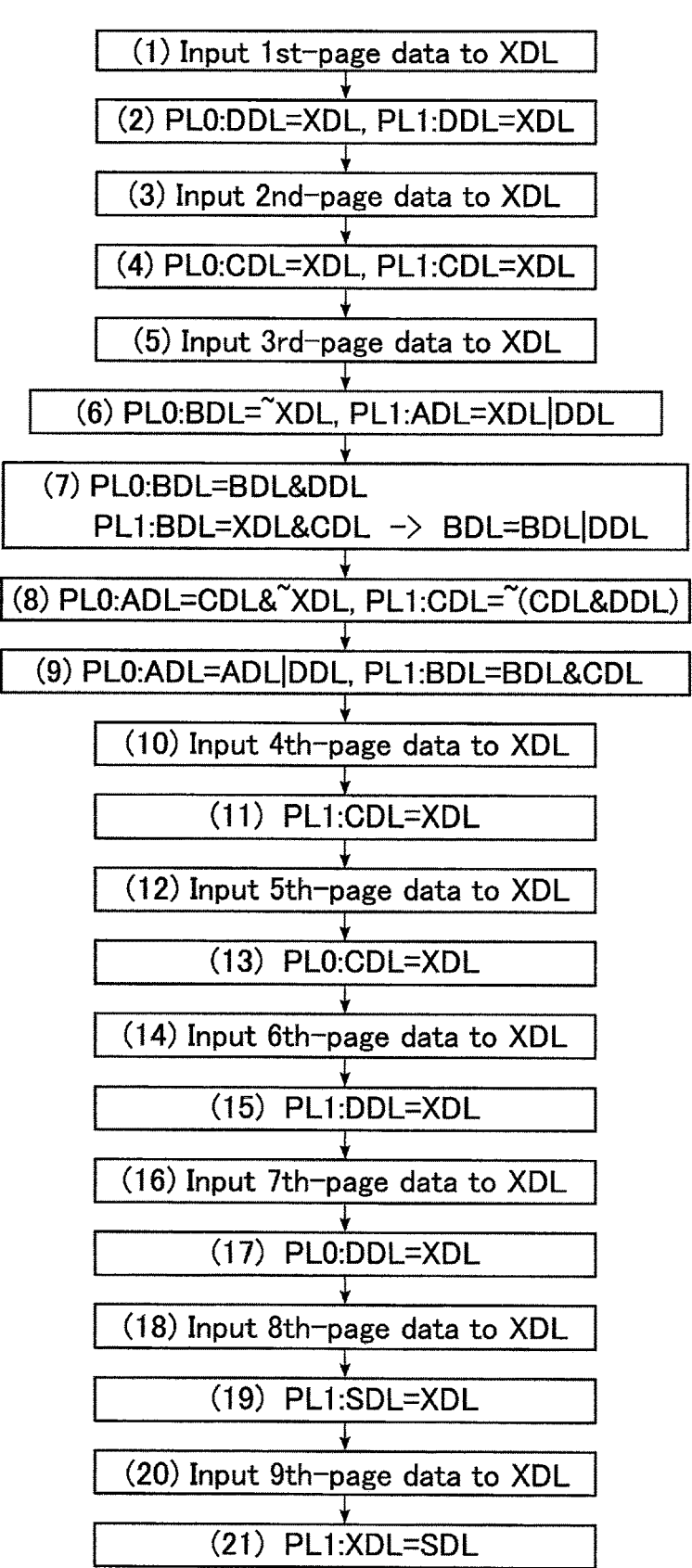

| (1) Input 1st-page data to XDL |
| (2) PL0:DDL=XDL, PL1:DDL=XDL |
| (3) Input 2nd-page data to XDL |
| (4) PL0:CDL=XDL, PL1:CDL=XDL |
| (5) Input 3rd-page data to XDL |
| (6) PL0:BDL=~XDL, PL1:ADL=XDL|DDL |
| (7) PL0:BDL=BDL&DDL<br>PL1:BDL=XDL&CDL  ->  BDL=BDL|DDL |
| (8) PL0:ADL=CDL&~XDL, PL1:CDL=~(CDL&DDL) |
| (9) PL0:ADL=ADL|DDL, PL1:BDL=BDL&CDL |
| (10) Input 4th-page data to XDL |
| (11) PL1:CDL=XDL |
| (12) Input 5th-page data to XDL |
| (13) PL0:CDL=XDL |
| (14) Input 6th-page data to XDL |
| (15) PL1:DDL=XDL |
| (16) Input 7th-page data to XDL |
| (17) PL0:DDL=XDL |
| (18) Input 8th-page data to XDL |
| (19) PL1:SDL=XDL |
| (20) Input 9th-page data to XDL |
| (21) PL1:XDL=SDL |

F I G. 180

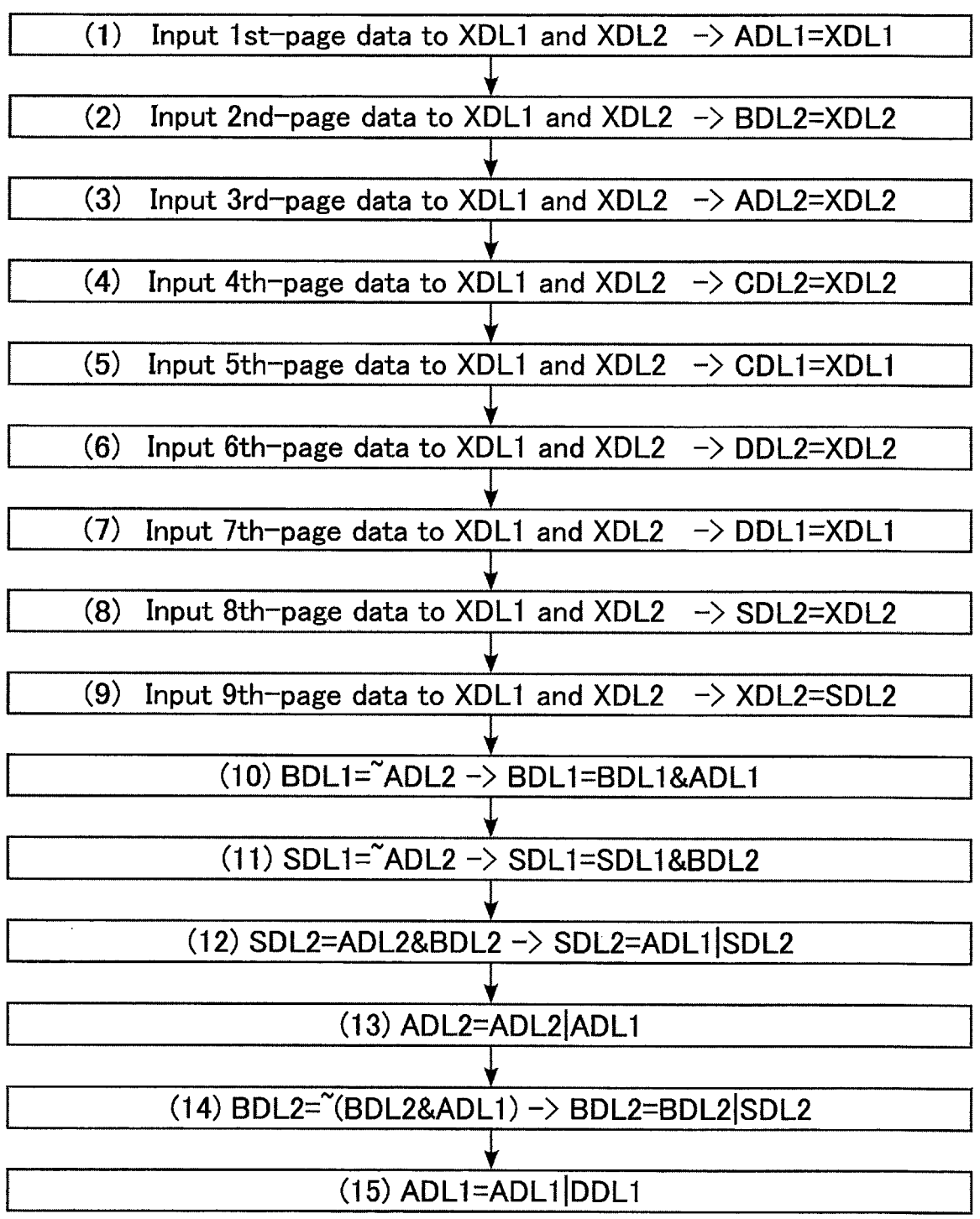

(1)   Input 1st-page data to XDL1 and XDL2   -> ADL1=XDL1

(2)   Input 2nd-page data to XDL1 and XDL2   -> BDL2=XDL2

(3)   Input 3rd-page data to XDL1 and XDL2   -> ADL2=XDL2

(4)   Input 4th-page data to XDL1 and XDL2   -> CDL2=XDL2

(5)   Input 5th-page data to XDL1 and XDL2   -> CDL1=XDL1

(6)   Input 6th-page data to XDL1 and XDL2   -> DDL2=XDL2

(7)   Input 7th-page data to XDL1 and XDL2   -> DDL1=XDL1

(8)   Input 8th-page data to XDL1 and XDL2   -> SDL2=XDL2

(9)   Input 9th-page data to XDL1 and XDL2   -> XDL2=SDL2

(10) BDL1=~ADL2 -> BDL1=BDL1&ADL1

(11) SDL1=~ADL2 -> SDL1=SDL1&BDL2

(12) SDL2=ADL2&BDL2 -> SDL2=ADL1|SDL2

(13) ADL2=ADL2|ADL1

(14) BDL2=~(BDL2&ADL1) -> BDL2=BDL2|SDL2

(15) ADL1=ADL1|DDL1

F I G. 181

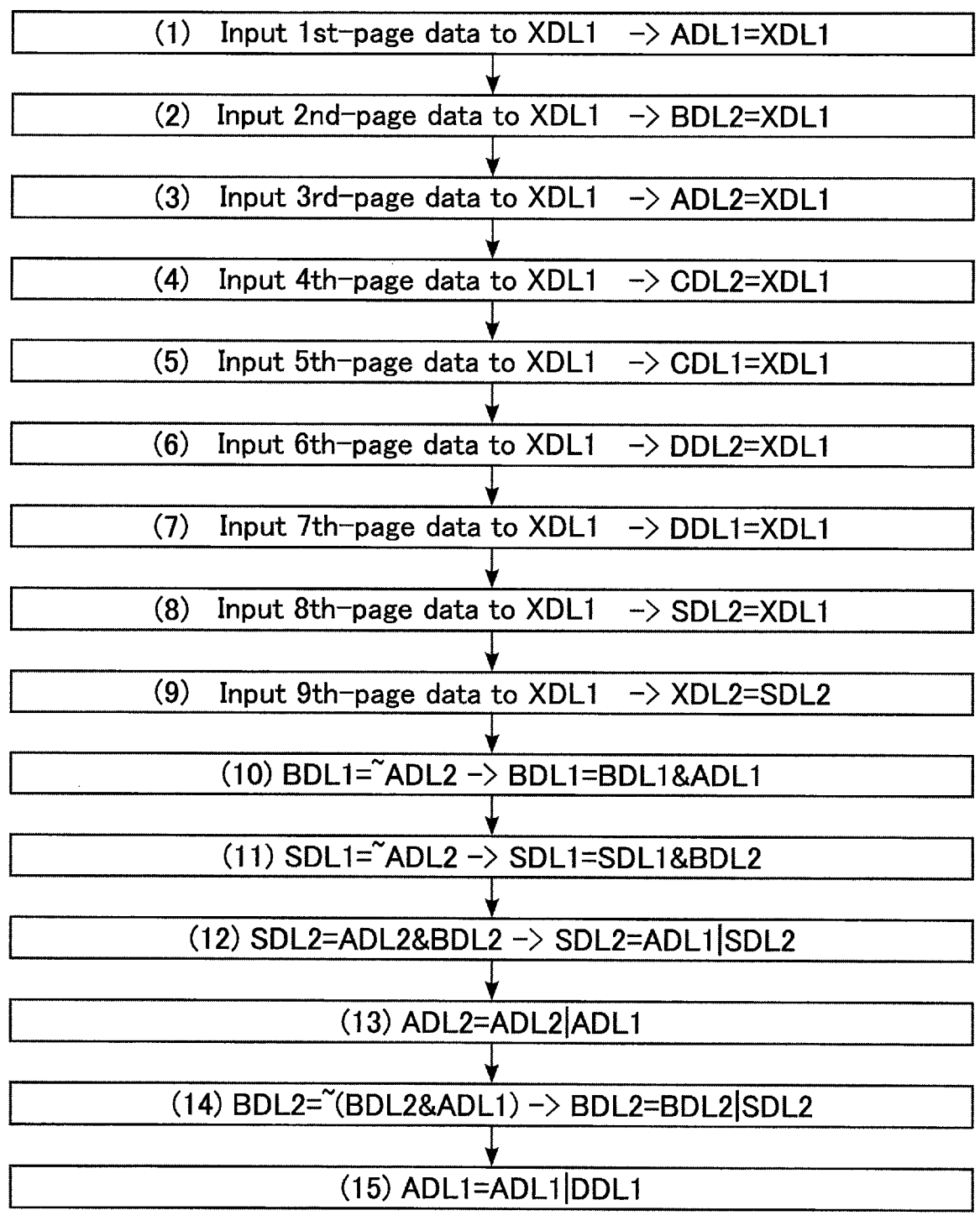

(1)  Input 1st-page data to XDL1    -> ADL1=XDL1

(2)  Input 2nd-page data to XDL1    -> BDL2=XDL1

(3)  Input 3rd-page data to XDL1    -> ADL2=XDL1

(4)  Input 4th-page data to XDL1    -> CDL2=XDL1

(5)  Input 5th-page data to XDL1    -> CDL1=XDL1

(6)  Input 6th-page data to XDL1    -> DDL2=XDL1

(7)  Input 7th-page data to XDL1    -> DDL1=XDL1

(8)  Input 8th-page data to XDL1    -> SDL2=XDL1

(9)  Input 9th-page data to XDL1    -> XDL2=SDL2

(10) BDL1=~ADL2 -> BDL1=BDL1&ADL1

(11) SDL1=~ADL2 -> SDL1=SDL1&BDL2

(12) SDL2=ADL2&BDL2 -> SDL2=ADL1|SDL2

(13) ADL2=ADL2|ADL1

(14) BDL2=~(BDL2&ADL1) -> BDL2=BDL2|SDL2

(15) ADL1=ADL1|DDL1

F I G. 182

| Input data | | Data definitions |
|---|---|---|
| 1st data | 2nd data | |
| 1 | 1 | w |
| 1 | 0 | x |
| 0 | 1 | y |
| 0 | 0 | z |

F I G. 184

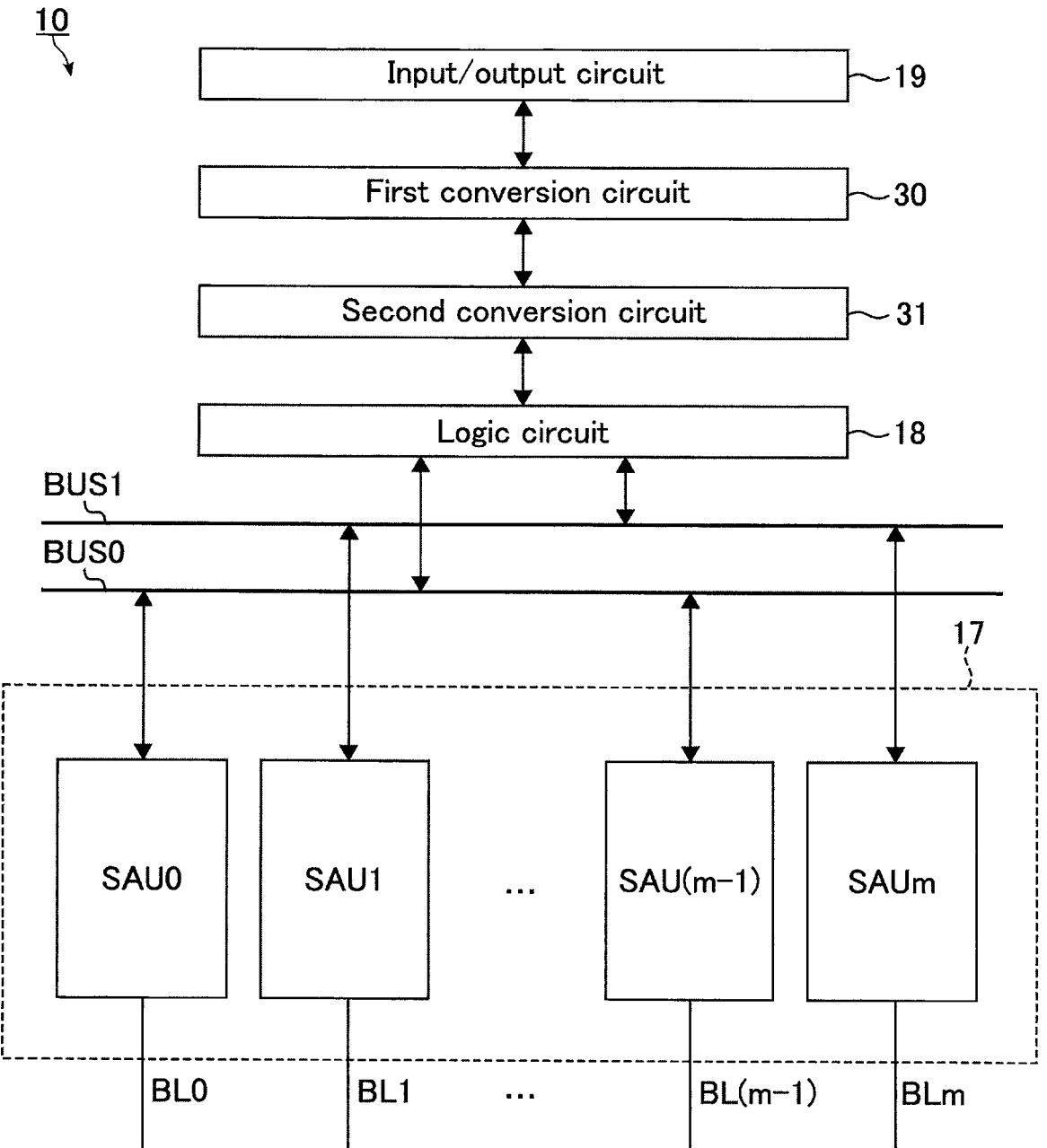
F I G. 185

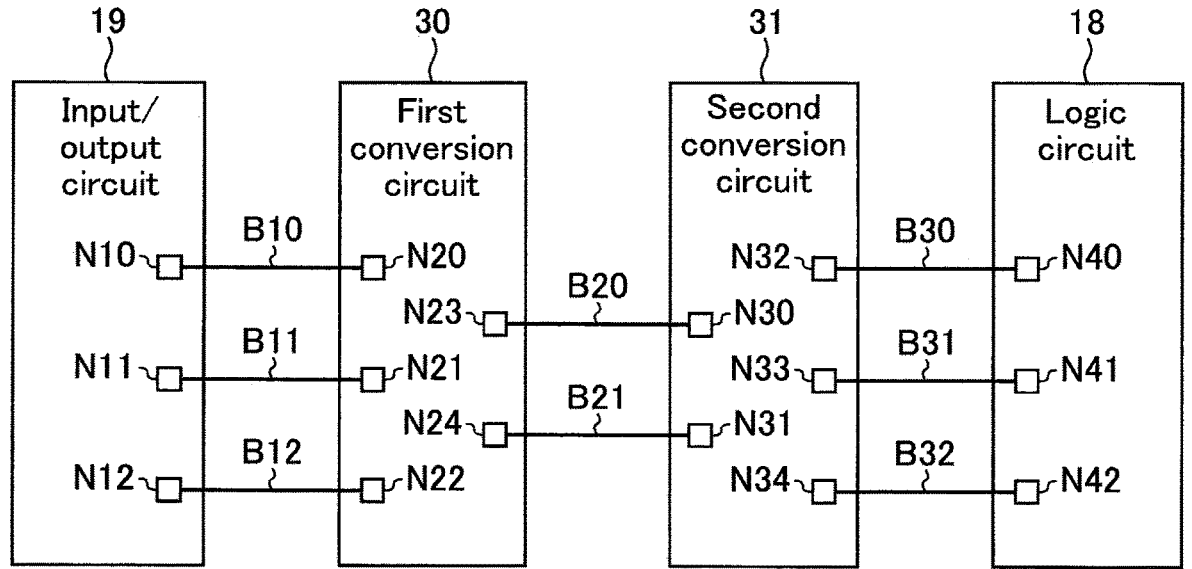
F I G. 186

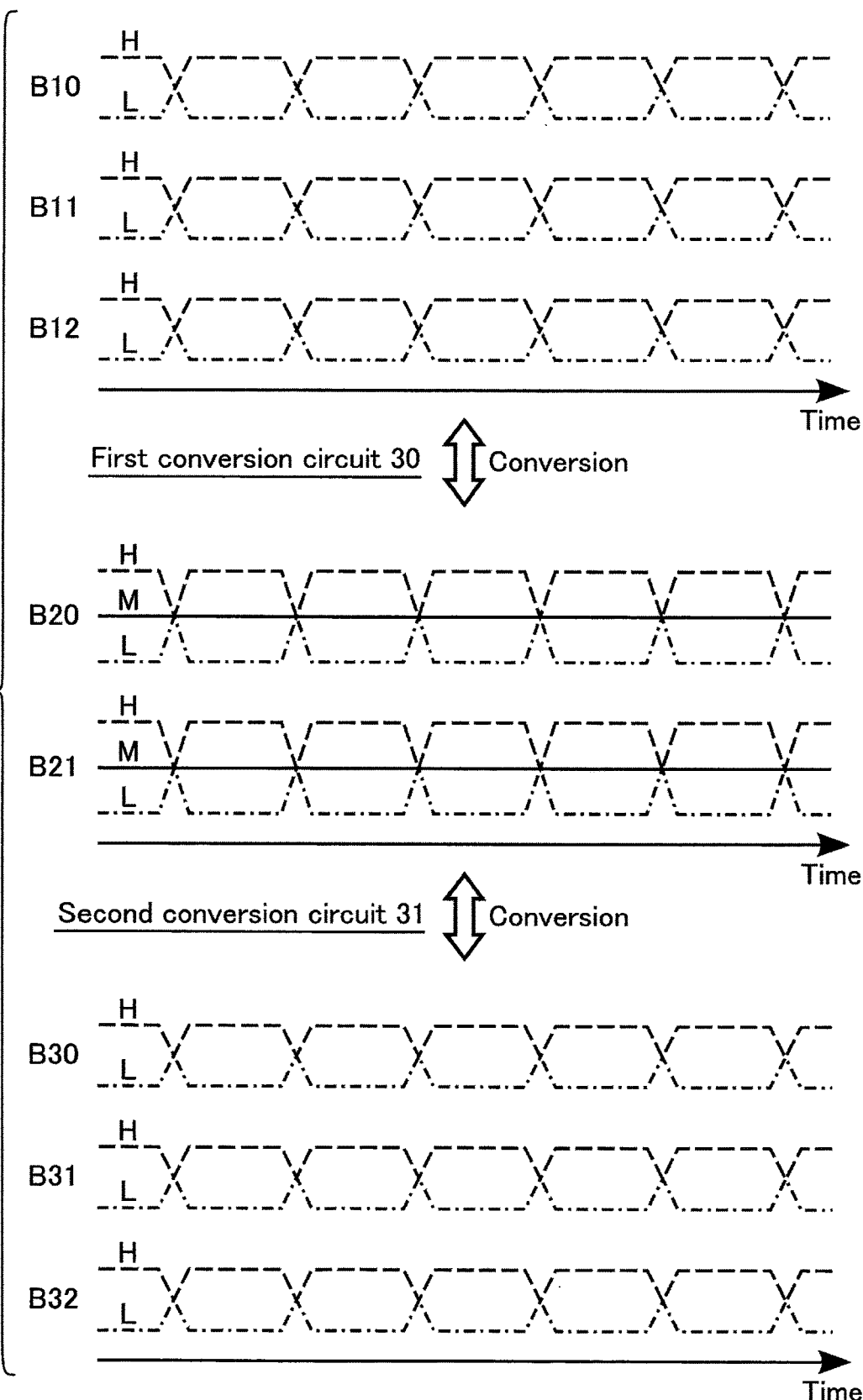
F I G. 187

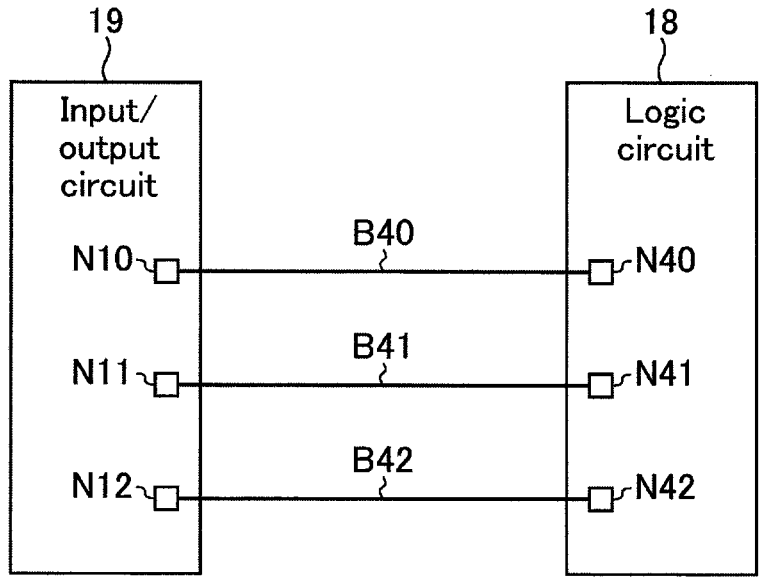
F I G. 188
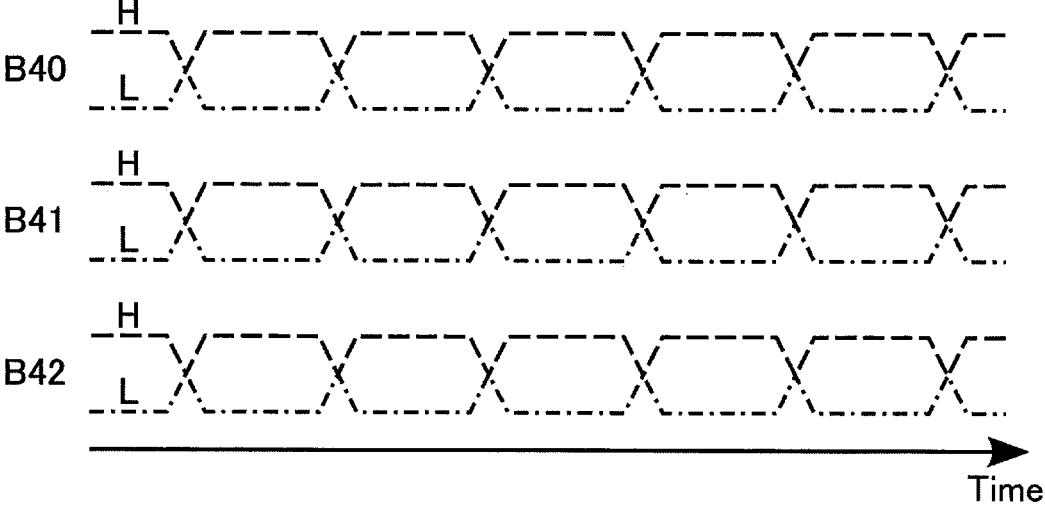
F I G. 189

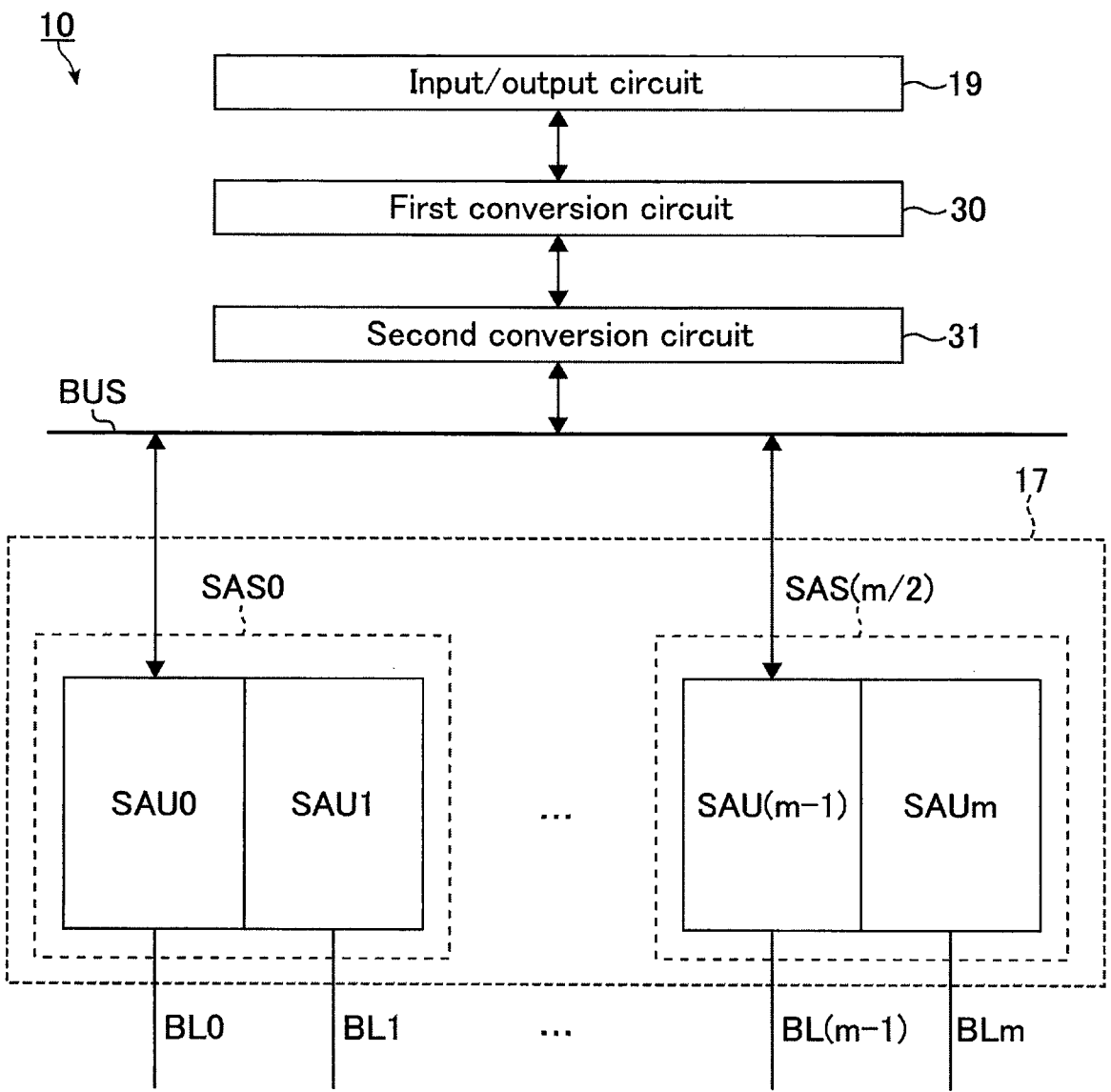
F I G. 190

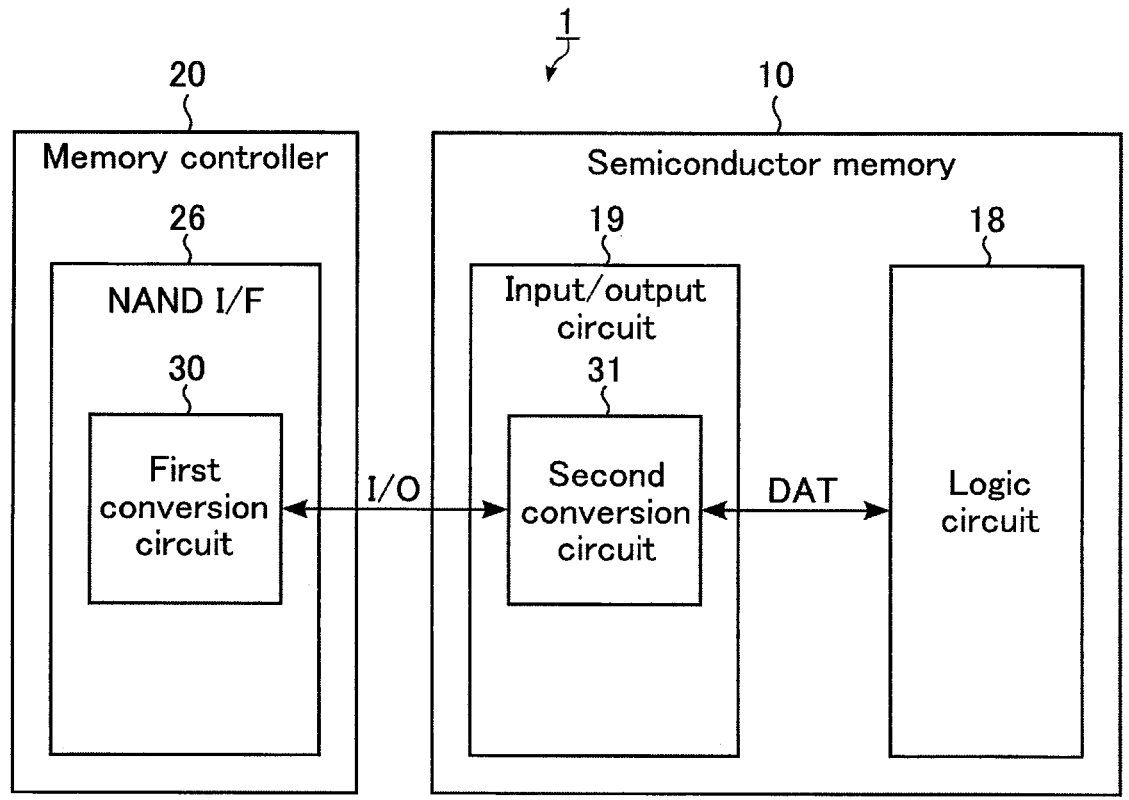
F I G. 191

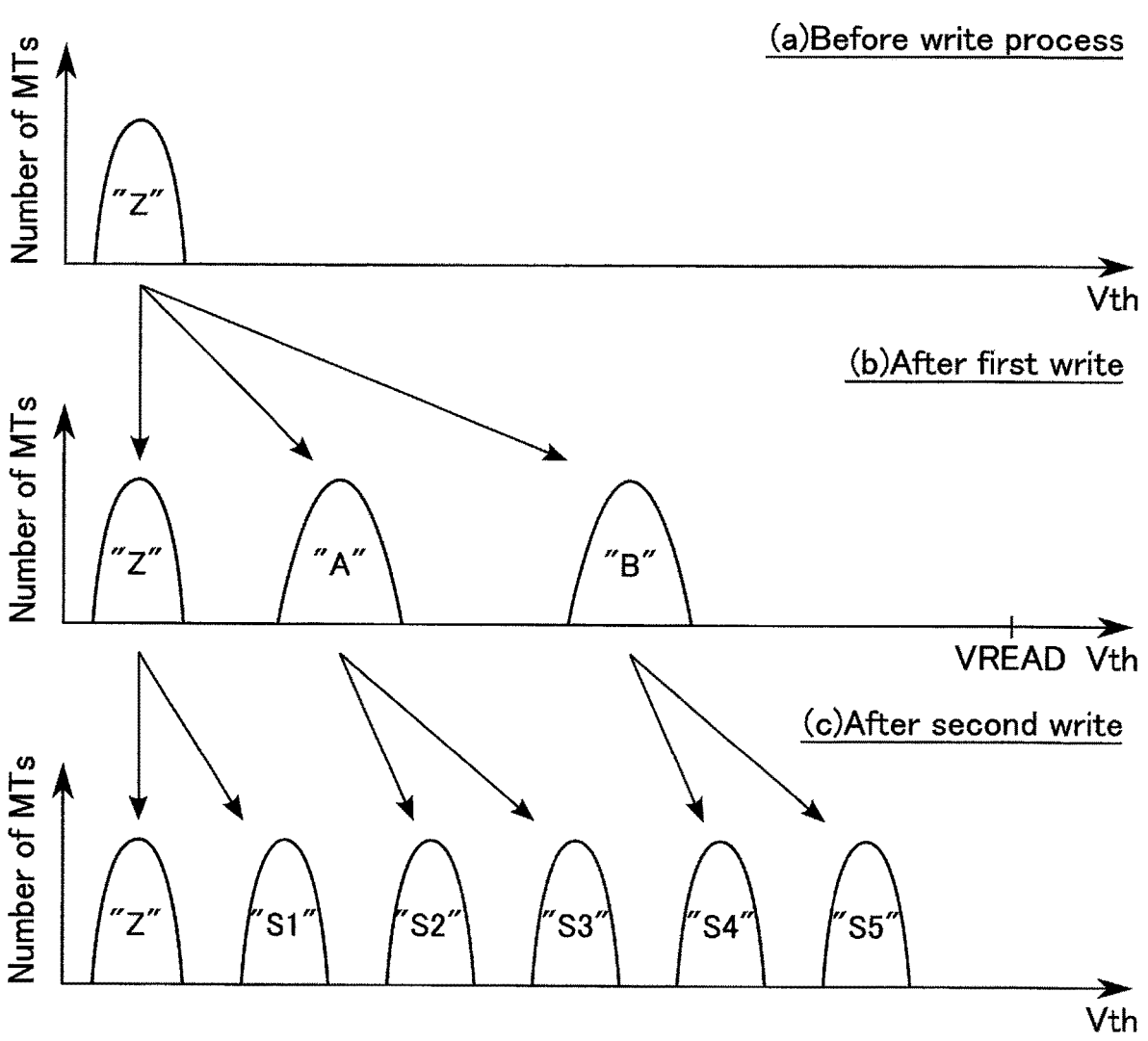
F I G. 192

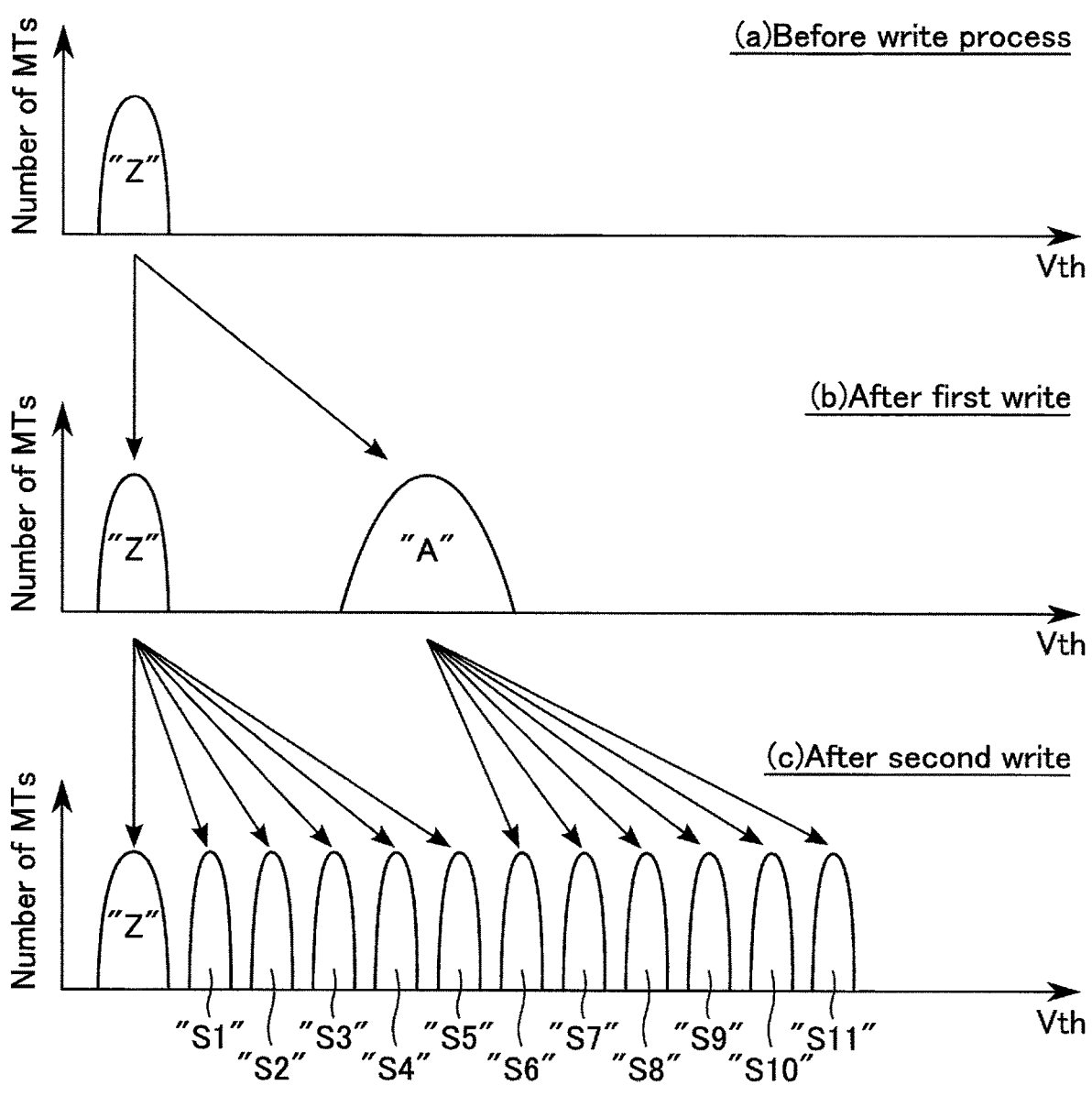
F I G. 193

SEMICONDUCTOR MEMORY

CROSS-REFERENCE TO RELATED APPLICATIONS

This application is a Continuation application of U.S. application Ser. No. 18/134,719, filed on Apr. 14, 2023, which is a Continuation application of U.S. application Ser. No. 17/244,246, filed on Apr. 29, 2021, and issued as U.S. Pat. No. 11,657,879, on May 23, 2023, which is a Continuation application of U.S. application Ser. No. 16/724,100, filed on Dec. 20, 2019, and issued as U.S. Pat. No. 11,011, 239, on May 18, 2021, which is based upon and claims the benefit of priority from prior Japanese Patent Application No. 2018-245746, filed Dec. 27, 2018, and No. 2019-026045, filed Feb. 15, 2019, the entire contents of all of which are incorporated herein by reference.

FIELD

Embodiments described herein relate generally to a semiconductor memory device.

BACKGROUND

A NAND-type flash memory capable of storing data in a non-volatile manner is known.

BRIEF DESCRIPTION OF THE DRAWINGS

FIG. 1 is a block diagram showing a configuration example of a memory system that includes a semiconductor memory according to the first embodiment.

FIG. 2 is a circuit diagram showing a circuit configuration example of a memory cell array of the semiconductor memory according to the first embodiment.

FIG. 3 is a plan view showing an example of a flat layout of memory cell arrays of the semiconductor memory according to the first embodiment.

FIG. 4 is a cross-sectional view showing an example of a cross-section structure of the memory cell array of the semiconductor memory according to the first embodiment.

FIG. 5 is a circuit diagram showing an example of a circuit configuration of a row decoder module of the semiconductor memory according to the first embodiment.

FIG. 6 is a circuit diagram showing an example of a circuit configuration of a sense amplifier module of the semiconductor memory according to the first embodiment.

FIG. 9 is a table showing an example of data allocation for the threshold distributions of the memory cell transistors according to the first embodiment.

FIG. 10 is a table showing an example of data allocation for the threshold distributions of the memory cell transistors according to the first embodiment.

FIG. 11 is a table showing definitions of read data for read results in the first embodiment.

FIGS. 12, 13, 14, and 15 are tables showing examples of combinations of read results in the first embodiment.

FIG. 16 is a timing chart showing an example of a command sequence, and voltages to be applied to a selected word line in a write operation in the semiconductor memory according to the first embodiment.

FIG. 17 is a diagram showing an example of an operation of the sequencer if the number of latch circuits is reduced in a write operation of a semiconductor memory according to the first embodiment.

FIG. 18 is a timing chart showing an example of a command sequence, and voltages to be applied to a selected word line in a first-page read in the semiconductor memory according to the first embodiment.

FIG. 19 is a timing chart showing an example of a command sequence, and voltages to be applied to a selected word line in a second-page read in the semiconductor memory according to the first embodiment.

FIG. 20 is a timing chart showing an example of a command sequence, and voltages to be applied to a selected word line in a third-page read in the semiconductor memory according to the first embodiment.

FIG. 21 is a timing chart showing an example of a command sequence, and voltages to be applied to a selected word line in a fourth-page read in the semiconductor memory according to the first embodiment.

FIG. 22 is a timing chart showing an example of a command sequence, and voltages to be applied to a selected word line in a fifth-page read in the semiconductor memory according to the first embodiment.

FIG. 24 is a diagram showing an example of a data allocation for the threshold distributions of the memory cell transistors and voltages used in a read operation in a comparative example of the first embodiment.

FIG. 25 is a timing chart showing an example of a command sequence, and voltages to be applied to a selected word line in a sequential read for first and second pages in the semiconductor memory according to a second embodiment.

FIG. 26 is a timing chart showing an example of a command sequence, and voltages to be applied to a selected word line in a sequential read for third and sixth pages in the semiconductor memory according to the second embodiment.

FIG. 27 is a timing chart showing an example of a command sequence, and voltages to be applied to a selected word line in a sequential read for fourth and fifth pages in the semiconductor memory of the second embodiment.

FIG. 30 is a timing chart showing an example of a command sequence, and voltages to be applied to a selected word line in a sequential read for first, fourth, and fifth pages in the semiconductor memory of a fourth embodiment.

FIG. 31 is a timing chart showing an example of a command sequence, and voltages to be applied to a selected word line in a sequential read for second, third, and sixth pages in the semiconductor memory according to the fourth embodiment.

FIG. 32 is a flow chart showing an example of a method of selecting a sequential read in the semiconductor memory according to a fifth embodiment.

FIG. 33 is a threshold distribution diagram showing an example of the distribution of threshold voltages of memory cell transistors in a write operation in the semiconductor memory according to a sixth embodiment.

FIG. 34 is a table showing an example of a data allocation in a first-stage write in the semiconductor memory according to the sixth embodiment.

FIG. 35 is a timing chart showing an example of a command sequence, and voltages to be applied to a selected word line in a first-stage write in the semiconductor memory according to the sixth embodiment.

FIG. 36 is a timing chart showing an example of a command sequence, and voltages to be applied to a selected word line in a second-stage write in the semiconductor memory according to the sixth embodiment.

FIG. 37 is a diagram showing an example of an operation of the sequencer if the number of latch circuits is reduced in a second-stage write operation of the semiconductor memory according to the sixth embodiment.

FIG. 38 is a flow chart showing a write operation in the semiconductor memory according to the sixth embodiment.

FIGS. 39 and 40 are tables showing an example of data allocation for the threshold distributions of the memory cell transistors according to a seventh embodiment.

FIG. 41 is a table showing definitions of read data for read results in the seventh embodiment.

FIG. 42 is a diagram showing an example of an operation of the sequencer if the number of latch circuits is reduced in a write operation of a semiconductor memory according to the seventh embodiment.

FIG. 43 is a timing chart showing an example of a command sequence, and voltages to be applied to a selected word line in a sequential read for first and second pages in the semiconductor memory according to the seventh embodiment.

FIG. 44 is a timing chart showing an example of a command sequence, and voltages to be applied to a selected word line in a sequential read for third and fourth pages in the semiconductor memory according to the seventh embodiment.

FIG. 46 is a threshold distribution diagram showing an example of the distribution of threshold voltages of memory cell transistors according to an eighth embodiment.

FIGS. 47, 48, 49, 50, 51, 52, 53, and 54 are tables showing an example of data allocation for threshold distributions of the memory cell transistors in the eighth embodiment.

FIG. 55 is a table showing definitions of read data for read results in the eighth embodiment.

FIG. 56 is a timing chart showing an example of a command sequence, and voltages to be applied to a selected word line in a write operation in the semiconductor memory according to the eighth embodiment.

FIG. 58 is a timing chart showing an example of a command sequence, and voltages to be applied to a selected word line in a first-page read in the semiconductor memory according to the eighth embodiment.

FIG. 59 is a timing chart showing an example of a command sequence, and voltages to be applied to a selected word line in a second-page read in the semiconductor memory according to the eighth embodiment.

FIG. 60 is a timing chart showing an example of a command sequence, and voltages to be applied to a selected word line in a third-page read in the semiconductor memory according to the eighth embodiment.

FIG. 61 is a timing chart showing an example of a command sequence, and voltages to be applied to a selected word line in a fourth-page read in the semiconductor memory according to the eighth embodiment.

FIG. 62 is a timing chart showing an example of a command sequence, and voltages to be applied to a selected word line in a fifth-page read in the semiconductor memory according to the eighth embodiment.

FIG. 63 is a timing chart showing an example of a command sequence, and voltages to be applied to a selected word line in a sixth-page read in the semiconductor memory according to the eighth embodiment.

FIG. 64 is a timing chart showing an example of a command sequence, and voltages to be applied to a selected word line in a seventh-page read in the semiconductor memory according to the eighth embodiment.

FIG. 65 is a timing chart showing an example of a command sequence, and voltages to be applied to a selected word line in a eighth-page read in the semiconductor memory according to the eighth embodiment.

FIG. 66 is a diagram showing an example of a data allocation for the threshold distributions of the memory cell transistors and voltages used in a read operation in a comparative example of the eighth embodiment.

FIGS. 67, 68, 69, 70, 71, 72, 73, and 74 are tables showing an example of data allocation for threshold distributions of the memory cell transistors in a ninth embodiment.

FIG. 75 is a table showing definitions of read data for read results in the ninth embodiment.

FIG. 76 is a diagram showing an example of an operation of the sequencer if the number of latch circuits is reduced in a write operation of a semiconductor memory according to the ninth embodiment.

FIG. 77 is a threshold distribution diagram showing an example of the distribution of threshold voltages of memory cell transistors according to a 10th embodiment.

FIG. 78 is a table showing an example of data allocation for the threshold distributions of the memory cell transistors according to the 10th embodiment.

FIG. 79 is a table showing definitions of read data for read results in the 10th embodiment.

FIG. 80 is a timing chart showing an example of a command sequence, and voltages to be applied to a selected word line in a first-page read in the semiconductor memory according to the 10th embodiment.

FIG. 81 is a timing chart showing an example of a command sequence, and voltages to be applied to a selected word line in a sequential read for second and third pages in the semiconductor memory according to the 10th embodiment.

FIG. 82 is a timing chart showing an example of a command sequence, and voltages to be applied to a selected word line in a sequential read for fourth and fifth pages in the semiconductor memory according to the 10th embodiment.

FIG. 83 is a block diagram showing a configuration example of a semiconductor memory according to a modification of the 10th embodiment.

FIG. 84 is a timing chart showing an example of a read operation in a semiconductor memory in a non-WL-divided case according to the 10th embodiment.

FIG. 85 is a timing chart showing an example of a read operation in a semiconductor memory in a WL-divided case according to the 10th embodiment.

FIG. 86 is a table showing an example of data allocation for the threshold distributions of the memory cell transistors according a first modification of the 10th embodiment.

FIG. 87 is a table showing definitions of read data for read results in the first modification of the 10th embodiment.

FIG. 88 is a table showing an example of data allocation for the threshold distributions of the memory cell transistors according to a second modification of the 10th embodiment.

FIG. 89 is a table showing definitions of read data for results of read in the second modification of the 10th embodiment.

FIG. 90 is a table showing an example of data allocation for the threshold distributions of the memory cell transistors according a third modification of the 10th embodiment.

FIG. 91 is a table showing definitions of read data for read results in the third modification of the 10th embodiment.

FIG. 93 is a table showing an example of data allocation for the threshold distributions of the memory cell transistors according a fourth modification of the 10th embodiment.

FIG. 94 is a table showing definitions of read data for read results in the fourth modification of the 10th embodiment.

FIG. 95 is a table showing the number of time that read is performed in the 10th embodiment and each modification of the 10th embodiment.

FIG. 96 is a threshold distribution diagram showing an example of the distribution of threshold voltages of memory cell transistors according to an 11th embodiment.

FIGS. 97, 98, 99, and 100 are tables showing an example of data allocation for the threshold distributions of the memory cell transistors according to the 11th embodiment.

FIG. 101 is a table showing definitions of read data for read results in the 11th embodiment.

FIG. 102 is a table showing an example of data allocation for the threshold distributions of the memory cell transistors according to the 11th embodiment.

FIG. 103 is a table showing definitions of read data for read results in a 12th embodiment.

FIGS. 104 and 105 are tables showing an example of data allocation for the threshold distributions of the memory cell transistors according to a 13th embodiment.

FIG. 106 is a table showing definitions of read data for read results in the 13th embodiment.

FIG. 107 is a block diagram showing a configuration example of a semiconductor memory according to a 14th embodiment.

FIG. 109 is a table showing an example of data allocation for the threshold distributions of the memory cell transistors according to the 14th embodiment.

FIG. 110 is a table showing definitions of read data for read results in the 14th embodiment.

FIG. 111 is a timing chart showing an example of a command sequence, and voltages to be applied to a selected word line in a read operation in the semiconductor memory according to the 14th embodiment.

FIG. 112 is a block diagram showing a configuration example of a semiconductor memory according to a modification of the 14th embodiment.

FIG. 113 is a threshold distribution diagram showing an example of the distribution of threshold voltages of memory cell transistors in a write operation in the semiconductor memory according to a 15th embodiment.

FIGS. 114 and 115 are tables showing an example of a data allocation in a first write in a semiconductor memory according to the 15th embodiment.

FIG. 116 is a table showing an example of a data allocation in a second write in the semiconductor memory according to the 15th embodiment.

FIG. 117 is a table showing an example of read voltage settings after the first write and before the second write in the semiconductor memory according to the 15th embodiment.

FIG. 118 is a table showing an example of read voltages settings after the second write in a semiconductor memory according to the 15th embodiment.

FIG. 119 is a threshold distribution diagram showing an example of the distribution of threshold voltages of memory cell transistors in a write operation in the semiconductor memory according to a 16th embodiment.

FIGS. 120 and 121 are tables showing an example of data allocation in the second write in the semiconductor memory according to the 16th embodiment.

FIG. 122 is a table showing an example of read voltages settings after the second write in the semiconductor memory according to the 16th embodiment.

FIG. 123 is a flow chart showing an example of a method of selecting a sequential read in the semiconductor memory according to a modification of the sixth embodiment.

FIG. 124 is a circuit diagram showing an example of a detailed circuit configuration of the driver circuit of the semiconductor memory according to the first embodiment.

FIG. 125 is a circuit diagram showing an example of a detailed circuit configuration of the driver circuit of the semiconductor memory according to a modification of the first embodiment.

FIG. 126 is a block diagram showing a semiconductor memory according to a modification of the first embodiment.

FIG. 127 is a table showing an example of assignment of latch circuits when 16-value data is written.

FIG. 128 is a table showing an example of changes in the assignment shown in FIG. 127 caused by the progress of a write operation.

FIG. 129 is a table showing an example of assignment of latch circuits when 12-value data is written.

FIG. 130 is a table showing an example of changes in the assignment shown in FIG. 129 caused by the progress of a write operation.

FIG. 131 is a table showing an example of assignment of latch circuits when 8-value data is written.

FIG. 132 is a table showing an example of changes in the assignment shown in FIG. 131 caused by the progress of a write operation.

FIG. 133 is a table showing an example of assignment of latch circuits when 6-value data is written.

FIG. 134 is a table showing an example of changes in the assignment shown in FIG. 133 caused by the progress of a write operation.

FIG. 135 is a table showing an example of assignment of latch circuits when 4-value data is written.

FIG. 136 is a table showing an example of changes in the assignment shown in FIG. 135 caused by the progress of a write operation.

FIG. 137 is a table showing an example of assignment of latch circuits when 3-value data is written.

FIG. 138 is a table showing an example of changes in the assignment shown in FIG. 137 caused by the progress of a write operation.

FIG. 139 is a timing chart showing an example of a read operation in a semiconductor memory in a non-WL-divided case according to a fourth modification of the 10th embodiment.

FIGS. 140 and 141 are timing charts showing an example of a read operation in a semiconductor memory in a non-WL-divided case according to a second modification of the 11th embodiment.

FIG. 142 is a block diagram showing a configuration example of a semiconductor memory according to a modification of the 10th embodiment.

FIG. 143 is a table showing an example of data allocation for the threshold distributions of the memory cell transistors according a fifth modification of the 10th embodiment.

FIG. 144 is a table showing definitions of read data for read results in the fifth modification of the 10th embodiment.

FIG. 145 are timing charts showing an example of a read operation in a semiconductor memory in a non-WL-divided case according to a fifth modification of the 10th embodiment.

FIG. 146 is a timing chart showing an example of a read operation in the semiconductor memory device according to the 10th embodiment.

FIG. 147 is a timing chart showing an example of a write operation in the semiconductor memory device 10 according to the 10th embodiment.

FIG. 148 is a block diagram showing a configuration example of a semiconductor memory according to the 14th embodiment.

FIG. 149 is a diagram showing an example of threshold distributions and data allocation used in a write operation in a semiconductor memory according to a fifth modification of the 10th embodiment.

FIG. 150 is a drawing showing the operation performed by the sequencer in the write operation in the semiconductor memory according to the fifth modification of the 10th embodiment.

FIG. 151 is a block diagram showing a configuration example of a semiconductor memory according to the fifth modification of the 10th embodiment.

FIG. 152 is a drawing showing the operation performed by the sequencer in the write operation in the semiconductor memory according to the fifth modification of the 10th embodiment.

FIG. 153 is a block diagram showing a configuration example of a semiconductor memory according to the fifth modification of the 10th embodiment.

FIG. 154 is a drawing showing the operation performed by the sequencer in the write operation in the semiconductor memory according to the fifth modification of the 10th embodiment.

FIG. 155 is a diagram showing an example of threshold distributions and data allocation used in a write operation in a semiconductor memory according to a second modification of the 11th embodiment.

FIG. 156 is a flowchart showing the operation performed by the sequencer in the write operation in the semiconductor memory according to the second modification of the 11th embodiment.

FIG. 157 is a block diagram showing a configuration example of a semiconductor memory according to the second modification of the 11th embodiment.

FIG. 158 is a flowchart showing the operation performed by the sequencer in the write operation in the semiconductor memory according to the second modification of the 11th embodiment.

FIG. 159 is a block diagram showing a configuration example of a semiconductor memory according to the second modification of the 11th embodiment.

FIG. 160 is a flowchart showing the operation performed by the sequencer in the write operation in the semiconductor memory according to the second modification of the 11th embodiment.

Figure 161:
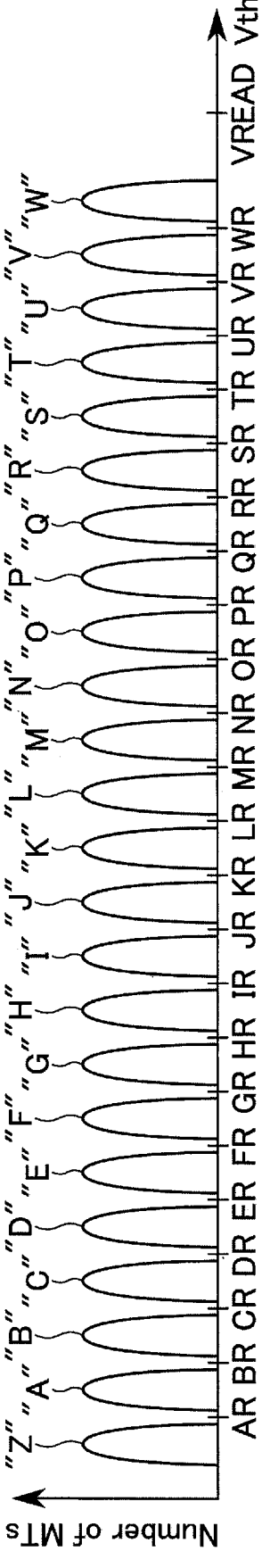

FIG. 161 is a threshold distribution diagram showing an example of the distributions of threshold voltages of memory cell transistors according to a 17th embodiment.

FIGS. 162, 163, 164, 165, 166, 167, 168, 169, 170, 171, 172, 173, 174, 175, 176, and 177 are tables showing an example of data allocation for threshold distributions of the memory cell transistors in the 17th embodiment.

FIG. 178 is a table showing definitions of read data for read results in the 17th embodiment.

FIG. 179 is a diagram showing an example of threshold distributions and data allocation used in a write operation in a semiconductor memory according to the 17th embodiment.

FIGS. 180, 181, and 182 are diagrams showing the operation performed by the sequencer in a write operation in the semiconductor memory according to the 17th embodiment.

Figure 183:
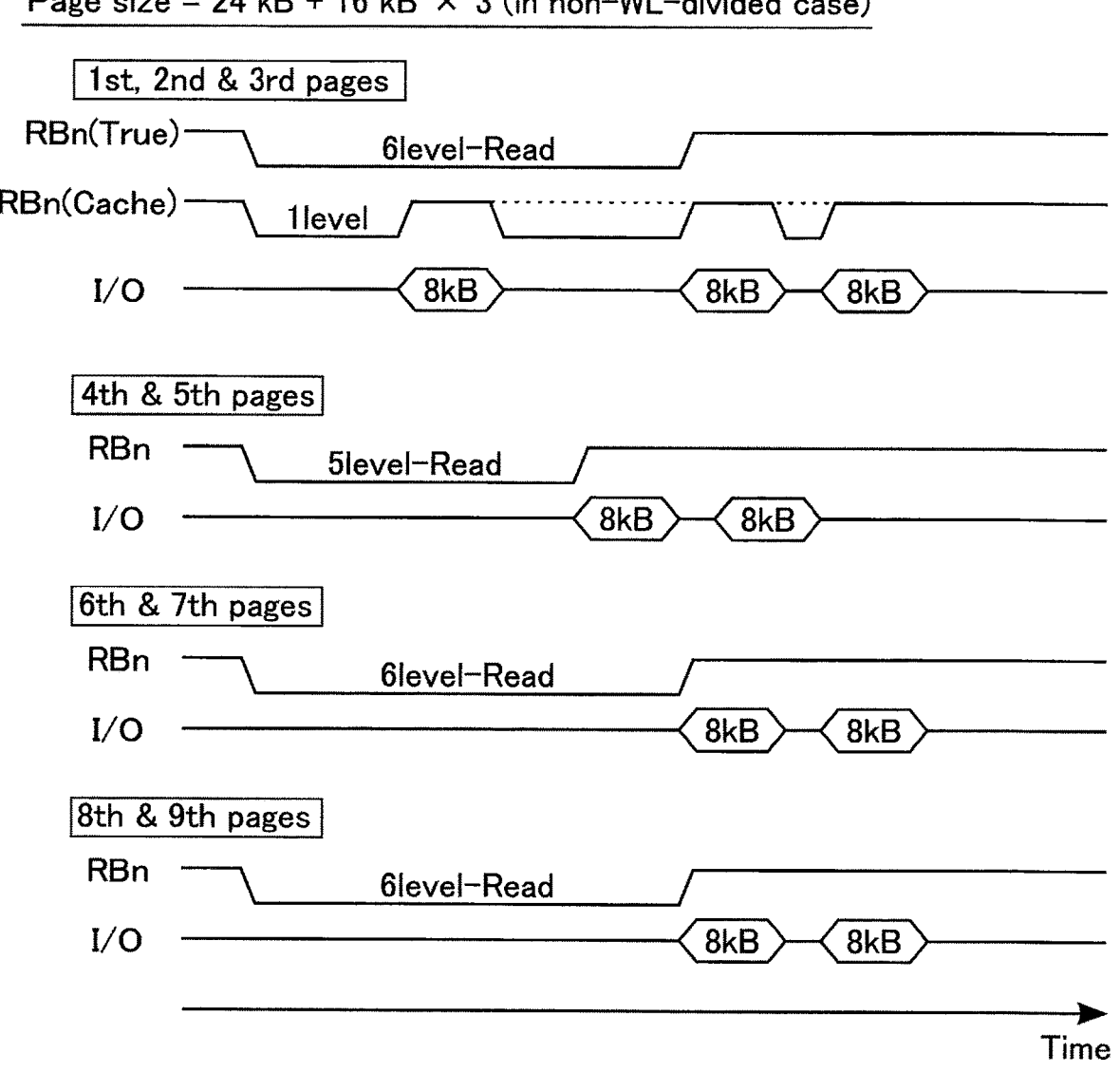

FIG. 183 is a timing chart showing an example of a read operation in the semiconductor memory according to the 17th embodiment.

FIG. 184 is a table showing an example of a relationship between the input data and data in a read operation in the semiconductor memory according to the 14th embodiment.

FIG. 185 is a block diagram showing a configuration example of a semiconductor memory according to an 18th embodiment.

FIG. 186 is a circuit diagram showing an example of a coupling between the input/output circuit and a logic circuit in the semiconductor memory according to the 18th embodiment.

FIG. 187 is a timing chart showing an example of a method of inputting and outputting data in a semiconductor memory according to the 18th embodiment.

FIG. 188 is a circuit diagram showing an example of a coupling between the input/output circuit and a logic circuit in the semiconductor memory according to a comparative example of the 18th embodiment.

FIG. 189 is a timing chart showing an example of a method of a method of inputting and outputting data in the semiconductor memory according to the comparative example of the 18th embodiment.

FIG. 190 is a block diagram showing a configuration example of a semiconductor memory according to a first modification of the 18th embodiment.

FIG. 191 is a block diagram showing a configuration example of a memory system that includes a semiconductor memory according to a second modification of the 18th embodiment.

FIG. 192 is a threshold distribution diagram showing an example of the distribution of threshold voltages of memory cell transistors according to a fifth modification of the 10th embodiment.

FIG. 193 is a threshold distribution diagram showing an example of the distribution of threshold voltages of memory cell transistors according to twenty-second to thirtieth modifications of the 16th embodiment.

DETAILED DESCRIPTION

In general, according to one embodiment, a semiconductor memory includes a plurality of first and second memory cells, first and second memory cell arrays, first and second word lines, and controller. Each of the first and second memory cells is configured to have any one of first, second, third, fourth, fifth, sixth, seventh, or eighth threshold voltages. The second threshold voltage is higher than the first threshold voltage. The third threshold voltage is higher than the second threshold voltage. The fourth threshold voltage is higher than the third threshold voltage. The fifth threshold voltage is higher than the fourth threshold voltage. The sixth threshold voltage is higher than the fifth threshold voltage. The seventh threshold voltage is higher than the sixth threshold voltage. The eighth threshold voltage is higher than the seventh threshold voltage. The first memory cell array includes the first memory cells. The second memory cell array includes the second memory cells. The first word line is coupled to the first memory cells. The second word line is coupled to the second memory cells. Data of six or more bits including a first bit, a second bit, a third bit, a fourth bit, a fifth bit, and a sixth bit is stored with the use of a combination of a threshold voltage of the first memory cell and a threshold voltage of the second memory cell. In a read operation for a first page which includes the first bit, the controller reads first data from the first memory cells by applying at least one type of read voltage to the first word line, and externally outputs data of the first page which is confirmed based on the first data. In a read operation for a second page which includes the second bit, the controller reads second data from the second memory cells by applying at least one type of read voltage to the second word line, and externally outputs data of the second page which is confirmed based on the second data. In a read operation for a third page which includes the third bit, the controller reads third data from the first memory cells by applying at least one type of read voltage to the first word line, and reads fourth data from the second memory cells by applying at least one type of read voltage to the second word line, and externally outputs data of the third page which is confirmed based on the third data and the fourth data.

Hereinafter, the embodiments will be described with reference to the accompanying drawings. Each of the embodiments is an example of an apparatus and a method to embody a technical idea of the invention. The drawings are schematic or conceptual, and the dimensions and ratios, etc. in the drawings are not always the same as the actual ones. The technical ideas of the present invention are not limited by shapes, structures, or arrangements, etc. of the structural elements.

In the explanation below, structural elements having substantially the same functions and configurations will be denoted by the same reference symbols. The numbers after the letters constituting the reference symbols, and the letters after the numbers constituting the reference symbols, are used to discriminate between elements denoted by the reference symbols including the same letters or numbers and which have similar configurations. If there is no requirement to mutually distinguish the elements denoted by the reference symbols including the same letters, the same elements are denoted by the reference symbols that include only the same letters.

[1] First Embodiment

A semiconductor memory system 1 according to the first embodiment will be described.

[1-1] Configuration

[1-1-1] Overall Configuration of Memory System 1

FIG. 1 shows a configuration example of the memory system 1 in the first embodiment.

As shown in FIG. 1, the memory system 1 includes a semiconductor memory 10 and a memory controller 20, for example. An example of a configuration for each of the semiconductor memory 10 and the memory controller 20 will be described in detail.

(Configuration of Semiconductor Memory 10)

The semiconductor memory 10 is a NAND-type flash memory capable of storing data in a non-volatile manner.

As shown in FIG. 1, the semiconductor memory 10 includes, for example: memory cell arrays 11A and 11B, a command register 12, an address register 13, a sequencer 14, a driver circuit 15, row decoder modules 16A and 16B, sense amplifier modules 17A and 17B, and a logic circuit 18.

Each of the memory cell arrays 11A and 11B includes a plurality of blocks BLK0 to BLKn (n is an integer greater than 1). A block BLK is a group of non-volatile memory cells, and is used as, for example, a unit of data erasure. In each of the memory cell arrays 11A and 11B, a plurality of bit lines and a plurality of word lines are provided, and each memory cell is associated with a single bit line and a single word line.

The command register 12 retains a command CMD received by the semiconductor memory 10 from the memory controller 20. The command CMD includes instructions to cause the sequencer 14 to execute a read operation and a write operation, for example.

The address register 13 retains address information ADD received by the semiconductor memory 10 from the memory controller 20. The address information ADD includes, for example, a block address BA, a page address PA, and a column address CA.

A block address BA is used, for example, to select a block BLK that includes a memory cell that is a target for operations. A page address PA is used, for example, to select a word line associated with a memory cell that is a target for various operations. Hereinafter, a selected word line WL will be referred to as a "selected word line WLsel". A column address CA is used, for example, to select a bit line as a target for various operations.

The sequencer 14 controls the operation of the entire semiconductor memory 10 based on a command CMD retained in the command register 12. For example, the sequencer 14 controls the driver circuit 15, the row decoder modules 16A and 16B, and the sense amplifier modules 17A and 17B, to perform an operation of writing data DAT received from the memory controller 20, and an operation of reading data DAT stored in the memory cell arrays 11A and 11B.

The driver circuit 15 generates a desired voltage based on the control of the sequencer 14. Subsequently, the driver circuit 15 respectively applies, to corresponding signal lines, a voltage to be applied to a selected word line WLsel of the memory cell array 11A, and a voltage to be applied to a selected word line WLsel of the memory cell array 11B, based on a page address PA retained in the address register 13.

Each of the row decoder modules 16A and 16B selects one block BLK in the memory cell arrays 11A and 11B based on, for example, a block address BA retained in the address register 13. Then, each of the row decoder modules 16A and 16B transfers, for example, a voltage generated by the driver circuit 15 to the lines provided in the selected block BLK in each of the memory cell arrays 11A and 11B.

The sense amplifier modules 17A and 17B respectively apply desired voltages to bit lines corresponding to the memory cell arrays 11A and 11B in accordance with, for example, write data DAT received from the memory controller 20. Each of the sense amplifier modules 17A and 17B determines data stored in a memory cell based on a voltage of a corresponding bit line, and sends the determined read data DAT to the memory controller 20.

The logic circuit 18 is coupled between the input/output circuit of the semiconductor memory 10 and the sense amplifier module 17. When a read operation is performed for example, the logic circuit 18 confirms read data based on a read result of the sense amplifier module 17A and a read result of the sense amplifier module 17B. The logic circuit 18 is also capable of transferring received data between the input/output circuit of the semiconductor memory 10 and the sense amplifier module 17.

Hereinafter, a set of the memory cell array 11, the row decoder module 16, and the sense amplifier module 17 will be referred to as a "plane". The semiconductor memory 10 according to the first embodiment includes plane PL1 which comprises the memory cell array 11A, the row decoder module 16A, and the sense amplifier module 17A, and plane PL2 which comprises the memory cell array 11B, the row decoder module 16B, and the sense amplifier module 17B.

Planes PL1 and PL2 may be independently controlled by the sequencer 14. In the semiconductor memory 10 according to the first embodiment, data is stored by a set of blocks BLK associated between planes PL1 and PL2. For example, block BLK0 through block BLKn in plane PL1 are respectively associated with block BLK0 through block BLKn in plane PL2. An association of blocks BLK between planes PL1 and PL2 can be designed with a freely-selected combination. How data is stored will be described in detail later. (Configuration of Memory Controller 20)

The memory controller 20 instructs the semiconductor memory 10 to read, write, and erase data in response to a command sent from an external host device.

As shown in FIG. 1, the memory controller 20 includes, for example, a host interface circuit 21, a central processing unit (CPU) 22, a random access memory (RAM) 23, a buffer memory 24, an error correction code (ECC) circuit 25, and a NAND interface circuit 26.

The host interface circuit 21 is coupled to the external host device, and controls transfer of data, commands, and addresses between the memory controller 20 and the host device. The host interface circuit 21 supports communication interface standards, for example, SATA (Serial Advanced Technology Attachment), SAS (Serial Attached SCSI), PCIe (PCI Express) (registered trademark), etc.

The CPU 22 controls the operation of the entire memory controller 20. For example, the CPU 22 issues a write command in response to a write instruction received from the host device. The CPU 22 executes various types of processing to manage a memory space of the semiconductor memory 10, such as wear leveling, etc.

The RAM 23 is a volatile memory, such as a dynamic random access memory (DRAM), for example. The RAM 23 may be used as a working area of the CPU 22. The RAM 23, for example, retains a firmware for managing the semiconductor memory 10, various types of management tables, and count results at the time of various operations, and so on.

The buffer memory 24 temporarily retains, for example, read data received by the memory controller 20 from the semiconductor memory 10, and write data received from the host device.

The ECC circuit 25 executes processing related to error correction. Specifically, at the time of a write operation, the ECC circuit 25 generates parity based on write data received from the host device, and adds the generated parity to the write data. At the time of a read operation, the ECC circuit 25 generates a syndrome based on read data received from the semiconductor memory 10, and detects and corrects errors in the read data based on the generated syndrome.

The NAND interface circuit 26 controls the transfer of data, commands, addresses between the memory controller 20 and the semiconductor memory 10. Communications between the semiconductor memory 10 and the memory controller 20 support a NAND interface standard, for example.

Specifically, for communications between the semiconductor memory 10 and the memory controller 20, a command latch enable signal CLE, an address latch enable signal ALE, a write enable signal WEn, a read enable signal REn, a ready/busy signal RBn, and an input/output signal I/O are used, for example.

The command latch enable signal CLE is a signal notifying that an input/output signal I/O received by the semiconductor memory 10 is a command CMD. The address latch enable signal ALE is a signal notifying that an input/output signal I/O received by the semiconductor memory 10 is address information ADD. The write enable signal WEn is a signal instructing the semiconductor memory 10 to input an input/output signal I/O. The read enable signal REn is a signal instructing the semiconductor memory 10 to output an input/output signal I/O.

The ready/busy signal RBn is a signal for notifying the memory controller 20 of whether the semiconductor memory 10 is in a ready state, in which the semiconductor memory 10 receives a command from the controller 20, or in a busy state, in which the semiconductor memory 10 does not receive an instruction from the controller 20. The input/output signal I/O is, for example, an 8-bit signal, and may include a command CMD, address information ADD, and data DAT.

The semiconductor memory 10 and the memory controller 20, as explained in the above, may constitute a single semiconductor device by a combination thereof. Such a semiconductor device may be a memory card, such as an SD™ card, and an SSD (solid state drive), for example.

The memory controller 20 may be provided with a counter. In this case, the memory controller 20 controls the order, etc., of the word lines WL for which a write operation is performed based on, for example, the number of counts retained in the counter.

[1-1-2] Configuration of Memory Cell Array 11
(Circuit Configuration)

FIG. 2 shows an example of a circuit configuration of the memory cell array 11 included in the semiconductor memory 10 according to the first embodiment, taking one block BLK from a plurality of blocks BLK included in the memory cell array 11 as an example.

As shown in FIG. 2, a block BLK includes, for example, four string units SU0 through SU3.

Each of the string units SU includes a plurality of NAND strings NS. A plurality of NAND strings NS are respectively associated with bit lines BL0 through BLm (m is an integer equal to or greater than 1). Each NAND string NS includes, for example, memory cell transistors MT0 to MT7 and select transistors ST1 and ST2.

Each memory cell transistor MT includes a control gate and a charge storage layer, and stores data in a non-volatile manner. Each of select transistors ST1 and ST2 is used to select a string unit SU at the time of performing various operations.

In each NAND string NS, memory cell transistors MT0 to MT7 are coupled in series between select transistors ST1 and ST2. The control gates of memory cell transistors MT0 through MT7 in the same block BLK are respectively coupled to word lines WL0 through WL7.

In each NAND string NS, the drain of select transistor ST1 is coupled to an associated bit line BL, and the source of select transistor ST1 is coupled to one ends of memory cell transistors MT0 through MT7, which are coupled in series. The gates of select transistors ST1 respectively included in string units SU0 through SU3 in the same block BLK are respectively coupled in common to select gate lines SGD0 through SGD3.

In each NAND string NS, the drain of select transistor ST2 is coupled to the other ends of memory cell transistors MT0 through MT7, which are coupled in series. In the same block BLK, the sources of select transistors ST2 are coupled in common to source line SL, and the gates of select transistors ST2 are coupled in common to select gate line SGS.

In the above-described circuit configuration of the memory cell array 11, a bit line BL is coupled in common between corresponding NAND strings NS in each block BLK, for example. The source line SL is coupled in common between a plurality of blocks BLK, for example.

In the semiconductor memory 10 according to the first embodiment, 6-bit data can be stored by a set of one memory cell transistor MT in plane PL1 and one memory cell transistor MT in plane PL2.

In the present specification, a plurality of memory cell transistors MT coupled to a common word line WL in a single string unit SU is called "cell unit CU". In a set of one cell unit CU in plane PL1 and one cell unit CU in plane PL2, if each of the sets of memory cell transistors MT in planes PL1 and PL2 stores 1-bit data, a total amount of data stored in said set of cell units CU is defined as "1-page data".

In other words, in the semiconductor memory 10 according to the first embodiment, a combination of one cell unit CU included in plane PL1 and one cell unit CU included in plane PL2 is capable of storing 6-page data.

Six-page data stored in a set of cell units CU in planes PL1 and PL2 includes first page data, second page data, third page data, fourth page data, fifth page data, and sixth page data. In the present specification, first page data, second page data, third page data, fourth page data, fifth page data, sixth page data respectively include first bit data, second bit data, third bit data, fourth bit data, fifth bit data, and sixth bit data.

(Two-Dimensional Layout)

FIG. 3 shows an example of a two-dimensional layout of the memory cell array 11 in the first embodiment. In the drawings that will be referred to hereafter, an X-axis direction corresponds to a direction in which a bit line BL extends, a Y-axis direction corresponds to a direction in which a word line WL extends, and a Z-axis direction corresponds to a vertical direction with respect to the surface of the semiconductor substrate 30 where the semiconductor memory 10 is formed.

As shown in FIG. 3 as an example, a plurality of string units SU are arranged along the X-axis direction, each extending in the Y-axis direction.

Each of the string units SU includes a plurality of memory pillars MH. Each of the memory pillars MH corresponds to one NAND string NS, for example. A plurality of memory pillars MH are arranged in a staggered manner in the Y-axis direction, for example. Each memory pillar MH is overlain by at least one bit line BL. Each memory pillar MH is coupled to one bit line BL via a contact plug CP.

A plurality of slits SLT are provided in the memory cell array 11, for example. The slits SLT are arranged in the X-axis direction, each extending in the Y-axis direction, for example. An insulating material, for example, is embedded in each slit SLT. One string unit SU, for example, is provided between adjacent slits SLT. A plurality of string units SU may be provided between adjacent slits SLT.

(Cross-Sectional Structure)

FIG. 4 shows an example of a cross-sectional structure of the memory cell array 11 included in the semiconductor memory 10 according to the first embodiment. In the cross-sectional views that will be referred to hereafter, structural elements, such as insulating layers (interlayer insulating films), lines, and contacts, are omitted for better visibility.

As shown in FIG. 4, in the region where the memory cell array 11 is formed, a semiconductor substrate 30, conductors 31-42, memory pillars MH, and contacts CP are included.

The surface of the semiconductor substrate 30 is arranged in parallel to the X-Y plane. Conductor 31 is provided above the semiconductor substrate 30, with an insulating layer being interposed therebetween. Conductor 31 is formed in a plate-like shape along the X-Y plane for example, and is used as a source line SL. Although illustration is omitted, circuits, such as a sense amplifier module 17, are provided in the region between the semiconductor substrate 30 and the conductor 31.

Conductor 32 is provided above conductor 31, with an insulating film being interposed therebetween. Conductor 32 is formed in a plate-like shape along the X-Y plane for example, and is used as a select gate line SGS.

Conductors 33 to 40 are stacked above conductor 32. Of conductors 33-40, the neighboring conductors with respect to the Z-axis direction are stacked, with an insulating layer being interposed therebetween. Each of conductors 33-40 is formed in, for example, a plate-like shape along with the X-Y plane. For example, conductors 33-40 are used as word lines WL0 through WL7, respectively.

Conductor 41 is provided above conductor 40, with an insulating film being interposed therebetween. Conductor 41 is formed in a plate-like shape along the X-Y plane for example, and is used as a select gate line SGD.

Conductor 42 is provided above conductor 41, with an insulating film being interposed therebetween. Conductor 42 is formed in the shape of a line extending in the X-axis direction for example, and is used as a bit line BL. In other words, a plurality of conductors 42 are arranged along the Y-axis direction in a not-shown region.

The slits SLT are formed in the shape of a plate along the Y-Z plane for example, and divide conductors 32-41. The top end of the slit SLT is included in a layer between the layer in which the top ends of the memory pillars MH are included and the layer in which conductor 42 is provided, for example. The bottom end of the slit SLT is in contact with conductor 31, for example.

The memory pillar MH is formed in the shape of a pillar extending in the Z-axis direction for example, and passes through conductors 32-41. The top ends of the memory pillars MH are included in a layer between the layer in which conductor 41 is provided and the layer in which conductors 42 are provided, for example. The bottom end of the memory pillar MH is in contact with conductor 31, for example.

The memory pillar MH includes, for example, a block insulating film 43, an insulating film 44, a tunnel oxide film 45, and a semiconductor material 46.

The block insulating film 43 is provided on the inner wall of the memory hall extending in the Z-axis direction. The insulating film 44 is provided on the inner wall of the block insulating film 43. The tunnel oxide film 45 is provided on the inner wall of the insulating film 44. The semiconductor material 46 is provided on the inner wall of the tunnel oxide film 45. The lower portion of the semiconductor material 46 is in contact with the conductor 31. On the inner wall of the semiconductor material 46, another different material may be formed, or an air gap may be formed.

A pillar-shaped contact CP is provided on the semiconductor material 46. A single conductor 42, namely a single bit line BL is in contact with the upper surface of the contact CP. The memory pillar MH and the conductor 42 may be electrically coupled via two or more contacts, or via other lines.

In the configuration of the above-described memory pillar MH, a part where the memory pillar MH crosses the conductor 32 for example, functions as select transistor ST2. The parts where the memory pillar MH crosses conductors 33-40 respectively function as memory cell transistors MT0 through MT7. A part where the memory pillar MH crosses conductor 41 functions as select transistor ST1.

Thus, in the present example, the insulating film 44 functions as a charge storage layer of each memory cell transistor MT. The semiconductor material 46 functions as a channel of a memory cell transistor MT and each of select transistors ST1 and ST2.

The configuration of the memory cell array 11 is not limited to the above-described configuration. For example, the number of string units SU included in each block BLK may be determined as appropriate. The number of the memory cell transistors MT and select transistors ST1 and ST2 included in each NAND string NS may be determined as appropriate.

The number of the word lines WL and the number of select gate lines SGD and SGS may be changed based on the number of the memory cell transistors MT and select transistors ST1 and ST2. A plurality of conductors 32 respectively provided in a plurality of layers may be allocated to select gate line SGS, and a plurality of conductors 41 respectively provided in a plurality of layers may be allocated to select gate line SGD.

[1-1-3] Configuration of Row Decoder Module 16

FIG. 5 shows a configuration example of the row decoder module 16 of the semiconductor memory 10 according to the first embodiment.

As shown in FIG. 5, the row decoder module 16 includes row decoders RD0 through RDn.

The row decoders RD are used to select a block BLK. Row decoders RD0 through RDn are respectively associated with block BLK0 through BLKn. In the following, the circuit configuration of the row decoder RD will be described in detail, taking row decoder RD0 corresponding to block BLK0 as an example.

The row decoder RD includes, for example, a block decoder BD and high-voltage n-channel MOS transistors TR1 through TR13.

The block decoder BD decodes a block address BA. The block decoder BD applies a predetermined voltage to a transfer gate line TG based on a result of the decoding. Transfer gate line TG is coupled in common to the gates of transistors TR1 through TR13. Transistors TR1 through TR13 are coupled between signal lines extending from the voltage generation circuit 15 and the lines provided in the associated block BLK.

Specifically, signal lines SGDD0 through SGDD3, signal lines CG0 through CG7, and signal line SGSD are coupled to the driver circuit 15. Signal lines SGDD0 through SGDD3 respectively correspond to select gate lines SGD0 through SGD3. Signal lines CG0 through CG7 respectively correspond to word lines WL0 through WL7. Signal line SGSD corresponds to select gate line SGS.

For example, one end of transistor TR1 is coupled to signal line SGSD, and the other end of transistor TR1 is coupled to select gate line SGS. One ends of transistors TR2 through TR9 are respectively coupled to signal lines CG0 through CG7, and the other ends of transistors TR2 through TR9 are respectively coupled to word lines WL0 through WL7. One ends of transistors TR10 through TR13 are respectively coupled to signal lines SGDD0 through SGDD3, and the other ends of transistors TR10 through TR13 are respectively coupled to select gate lines SGD0 through SGD3.

With the above-described configuration, the row decoder module 16 can select a block BLK for which various operations are performed.

Specifically, at each operation, the block decoder BD corresponding to the selected block BLK applies an "H"-level voltage to transfer gate line TG, and the block decoder BD corresponding to the non-selected blocks BLK applies an "L"-level voltage to transfer gate line TG.

For example, if block BLK0 is selected, transistors TR1 through TR13 included in row decoder RD0 are turned on, and transistors TR1 through TR13 included in the other row decoders RD are turned off.

In this case, an electric current path is formed between each of the lines provided in block BLK0 and a corresponding signal line, and an electric current path between each of the lines in the other blocks BLK and a corresponding signal line is cut off. As a result, voltages respectively applied to the signal lines by the driver circuit 15 are applied via row decoder RD0 to the lines provided in selected block BLK0. The row decoder module 16 can be similarly operated when other blocks BLK are selected.

[1-1-4] Configuration of Sense Amplifier Module 17

FIG. 6 shows a configuration example of the sense amplifier module 17 included in the semiconductor memory 10 according to the first embodiment.

As shown in FIG. 6, the sense amplifier module 17 includes, for example, sense amplifier units SAU0 through SAUm. Sense amplifier units SAU0 through SAUm are respectively associated with bit lines BL0 through BLm.

Each sense amplifier unit SAU includes a sense amplifier SA, and latch circuits SDL, ADL, BDL, CDL, DDL, EDL, and XDL. The sense amplifier SA and the latch circuits SDL, ADL, BDL, CDL, DDL, EDL, and XDL are coupled to each other, so that data can be sent and received therebetween.

In a read operation, for example, the sense amplifier SA determines whether the read data is "0" or "1" based on a voltage of a corresponding bit line BL. In other words, the sense amplifier SA determines data stored in the selected memory cell by sensing data that is read and output to the corresponding bit line BL.

Each of the latch circuits SDL, ADL, BDL, CDL, DDL, EDL, and XDL temporarily stores read data and write data. The latch circuit XDL is coupled to an input/output circuit (not shown), and may be used to input and output data between the sense amplifier unit SAU and the input/output circuit.

The latch circuit XDL can function as a cache memory of the semiconductor memory 10. For example, the semiconductor memory 10 can be in a ready state as long as the latch circuit XDL is available, even when the latch circuits SDL, ADL, BDL, CDL, DDL, and EDL are occupied.

Figure 7:
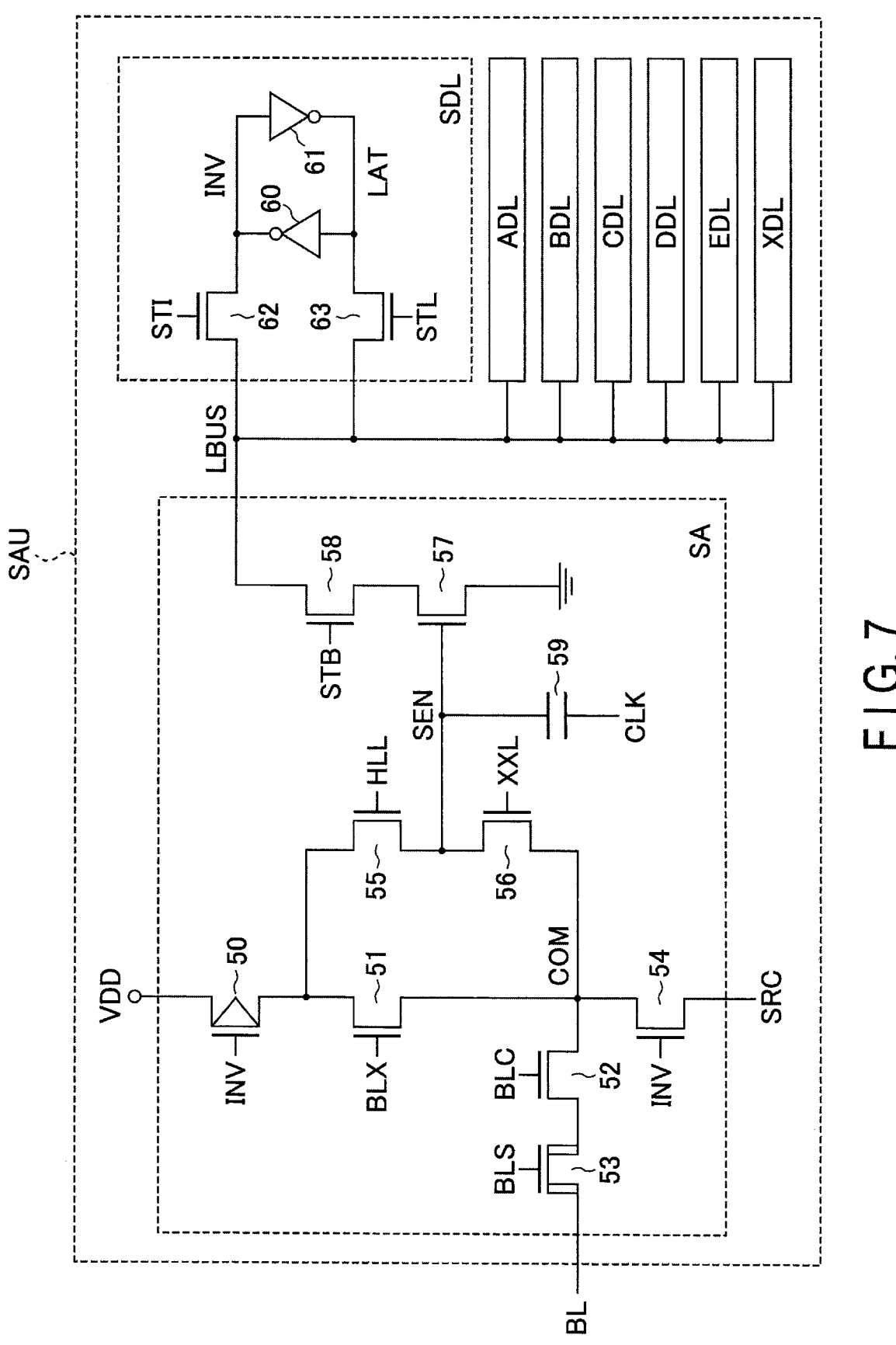
FIG. 7 is a circuit diagram showing an example of a detailed circuit configuration of the sense amplifier module of the semiconductor memory according to the first embodiment.

FIG. 7 shows an example of a circuit configuration of the sense amplifier module 17 of the semiconductor memory in detail according to the first embodiment, taking one sense amplifier unit SAU among the plurality of sense amplifier units SAU included in the sense amplifier module 17 as an example.

As shown in FIG. 7, the sense amplifier SA includes a p-channel MOS transistor 50, n-channel MOS transistors 51-58, and a capacitor 59, for example. The latch circuit SDL includes, for example, inverters 60 and 61, and n-channel MOS transistors 62 and 63. Since the circuit configuration of the latch circuits ADL, BDL, CDL, DDL, EDL, and XDL are similar to, for example, the circuit configuration of the latch circuit SDL, descriptions thereof are omitted.

One end of the transistor 50 is coupled to a power source line. The gate of the transistor 50 is coupled to node INV. A power source voltage VDD for example is applied to a power source line coupled to the one end of the transistor 50. One end of the transistor 51 is coupled to the other end of the transistor 50. The other end of the transistor 51 is coupled to node COM. A control signal BLX is input to the gate of the transistor 51.

One end of the transistor 52 is coupled to node COM. A control signal BLC is input to the gate of the transistor 52. The transistor 53 is for example a high-voltage n-channel MOS transistor. One end of the transistor 53 is coupled to the other end of the transistor 52. The other end of the transistor 53 is coupled to a corresponding bit line BL. A control signal BLS is input to the gate of the transistor 53.

One end of the transistor 54 is coupled to node COM. The other end of the transistor 54 is coupled to node SRC. The gate of the transistor 54 is coupled to node INV. A ground voltage VSS for example is applied to node SRC. One end of the transistor 55 is coupled to the other end of the transistor 50. The other end of the transistor 55 is coupled to node SEN. A control signal HLL is input to the gate of the transistor 55.

One end of the transistor 56 is coupled to node SEN. The other end of the transistor 56 is coupled to node COM. A control signal XXL is input to the gate of the transistor 56. One end of the transistor 57 is grounded. The gate of the transistor 57 is coupled to node SEN.

One end of the transistor 58 is coupled to the other end of the transistor 57. The other end of the transistor 58 is coupled to bus LBUS. A control signal STB is input to the gate of the transistor 58. One end of the capacitor 59 is coupled to node SEN. The other end of the capacitor 59 is input to clock CLK.

The input node of the inverter 60 is coupled to node LAT. The output node of the inverter 60 is coupled to node INV. The input node of the inverter 61 is coupled to node INV. The output node of the inverter 61 is coupled to node LAT.

One end of the transistor 62 is coupled to node INV. The other end of the transistor 62 is coupled to bus LBUS. A control signal STI is input to the gate of the transistor 62. One end of the transistor 63 is coupled to node LAT. The other end of the transistor 63 is coupled to bus LBUS. A control signal STL is input to the gate of the transistor 63.

The above-explained control signals BLX, BLC, BLS, HLL, XXL, and STB are generated by, for example, the sequencer 14. A timing for determining data that is read and output to a bit line BL by each sense amplifier SA is based on the timing when a control signal STB is asserted.

In the description below, the expression "to assert the control signal STB" should be construed to mean that the sequencer 14 temporarily changes the control signal STB from an "L"-level to an "H"-level. Depending on the configuration of the sense amplifier module 17, the operation of asserting the control signal STB may correspond to temporarily changing the control signal STB from an "H"-level to an "L"-level by the sequencer 14.

The configuration of the sense amplifier module 17 is not limited to the above-described configuration, and may be changed in various ways. For example, the number of latch circuits in the sense amplifier unit SAU can be changed as appropriate based on the number of pages stored in a set of one cell unit CU in plane PL1 and one cell unit CU in plane PL2. FIG. 6 shows an example where the sense amplifier unit SAU is provided with six latch circuits (latch circuits ADL to EDL and XDL); however, the number of latch circuits can be reduced.

Furthermore, the logic circuit 18 may confirm read data based on a read result by the sense amplifier unit SAUi (i is a variable) in the sense amplifier module 17, and a read result by a sense amplifier unit SAUj (j is a variable), which differs from the sense amplifier unit SAUi. A read result by the sense amplifier unit SAUi can be transferred to the sense amplifier unit SAUj, which differs from the sense amplifier unit SAUi. The sense amplifier unit SAUj may perform calculation similar to the calculation performed by the logic circuit 18, through calculation using node SEN as a dynamic latch, for example. The read data thus confirmed is transferred from the latch circuit XDL in the sense amplifier unit SAUj to an input/output circuit of the semiconductor memory 10.

[1-1-5] Threshold Distributions of Memory Cell Transistor MT

Figure 8:
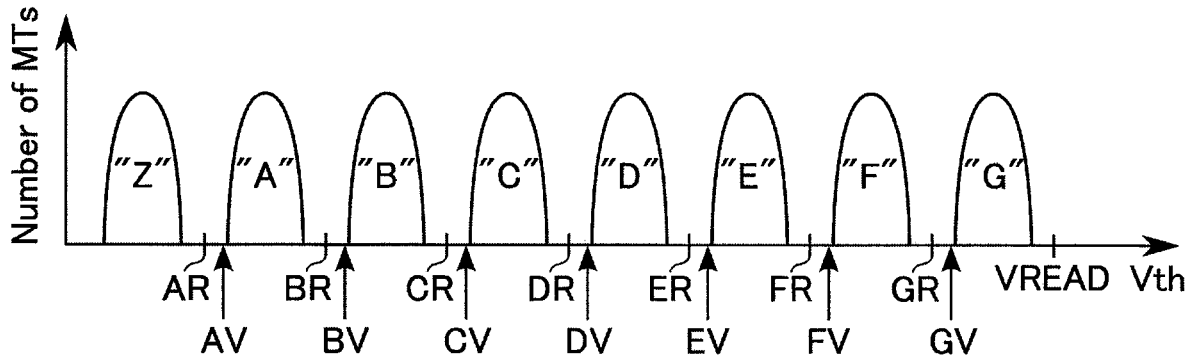
FIG. 8 is a threshold distribution diagram showing an example of the distribution of threshold voltages of memory cell transistors according to the first embodiment.

FIG. 8 shows an example of threshold distributions of the memory cell transistors MT, read voltages, and verify voltages in the semiconductor memory 10 according to the first embodiment. The vertical axis of the threshold distributions shown in FIG. 8 indicates the number of the memory cell transistors MT, and the horizontal axis indicates threshold voltages Vth of the memory cell transistors MT.

As shown in FIG. 8, in the semiconductor memory 10 according to the first embodiment, eight threshold distributions are formed depending on the threshold voltages of the memory cell transistors MT included in one cell unit CU, for example.

In the present specification, these eight threshold distributions (write states) are respectively called "Z" state, "A" state, "B" state, "C" state, "D" state, "E" state, "F" state, and "G" state, from lower to higher threshold voltages.

A read voltage used for each read operation is set between neighboring threshold distributions. For example, a read voltage AR is set between a maximum threshold voltage in the "Z" state and a minimum threshold voltage in the "A" state.

Similarly, a read voltage BR is set between the "A" state and the "B" state. A read voltage CR is set between the "B" state and the "C" state. A read voltage DR is set between the "C" state and the "D" state. A read voltage ER is set between the "D" state and the "E" state. A read voltage FR is set between the "E" state and the "F" state. A read voltage GR is set between the "F" state and the "G" state.

For example, when the read voltage AR is applied to a gate, a memory cell transistor MT is turned on if its threshold voltage is distributed in the "Z" state, and turned off if its threshold voltage is distributed in the "A" state or higher.

Similarly, when the read voltage BR is applied to a gate, a memory cell transistor MT is turned on if its threshold voltage is distributed in the "A" state or lower, and turned off if its threshold voltage is distributed in "B" or higher. Even in a case where other read voltage is applied to a gate, a memory cell transistor MT is turned off or on, depending on its threshold voltage.

A read pass voltage VREAD is set to a voltage higher than the voltages in the highest threshold distribution. More specifically, the read pass voltage VREAD is set to a voltage higher than a maximum threshold voltage in the "G" state. When the read pass voltage VREAD is applied to a gate, a memory cell transistor MT is turned on, regardless of data stored therein.

A verify voltage used for each write operation is set between neighboring threshold distributions. Specifically, verify voltages AV, BV, CV, DV, EV, FV, and GV are respectively set in correspondence with the "A", "B", "C", "D", "E", "F", and "G" states.

The verify voltage AV is set between a maximum threshold voltage in the "Z" state and a minimum threshold voltage in the "A" state, and in the vicinity of the "A" state. The verify voltage BV is set between a maximum threshold voltage in the "A" state and a minimum threshold voltage in the "B" state, and in the vicinity of the "B" state. The other verify voltages are also set in the vicinity of a corresponding write state, for example. In other words, the verify voltages AV, BV, CV, DV, EV, FV, and GV are set to voltages higher than the read voltages AR, BR, CR, DR, ER, FR, and GR, respectively.

[1-1-6] Data Allocation

FIGS. 9 and 10 show an example of data allocation for the threshold distributions of the memory cell transistors MT in the semiconductor memory 10 according to the first embodiment.

As shown in FIGS. 9 and 10, in the semiconductor memory 10 according to the first embodiment, 64 combinations are possible by combining eight threshold voltages in the memory cell transistors MT in plane PL1 with eight threshold voltages in the memory cell transistors MT in plane PL2. Furthermore, in the first embodiment, 6-bit data is allocated to each of the 64 combinations, as shown below:

(Example) "Threshold voltage of memory cell transistors MT in plane PL1", "threshold voltage of memory cell transistors MT in plane PL2": "first bit/second bit/third bit/fourth bit/fifth bit/sixth bit" data (1) "Z" state, "Z" state: "110000" data
(2) "Z" state, "A" state: "110100" data
(3) "Z" state, "B" state: "111101" data
(4) "Z" state, "C" state: "111001" data
(5) "Z" state, "D" state: "101001" data
(6) "Z" state, "E" state: "101011" data
(7) "Z" state, "F" state: "100010" data
(8) "Z" state, "G" state: "100000" data
(9) "A" state, "Z" state: "111000" data
(10) "A" state, "A" state: "111100" data
(11) "A" state, "B" state: "110101" data
(12) "A" state, "C" state: "110001" data
(13) "A" state, "D" state: "100001" data
(14) "A" state, "E" state: "100011" data

(15) "A" state, "F" state: "101010" data
(16) "A" state, "G" state: "101000" data
(17) "B" state, "Z" state: "111110" data
(18) "B" state, "A" state: "111010" data
(19) "B" state, "B" state: "110011" data
(20) "B" state, "C" state: "110111" data
(21) "B" state, "D" state: "100111" data
(22) "B" state, "E" state: "100101" data
(23) "B" state, "F" state: "101100" data
(24) "B" state, "G" state: "101110" data
(25) "C" state, "Z" state: "110110" data
(26) "C" state, "A" state: "110010" data
(27) "C" state, "B" state: "111011" data
(28) "C" state, "C" state: "111111" data
(29) "C" state, "D" state: "101111" data
(30) "C" state, "E" state: "101101" data
(31) "C" state, "F" state: "100100" data
(32) "C" state, "G" state: "100110" data
(33) "D" state, "Z" state: "010110" data
(34) "D" state, "A" state: "010010" data
(35) "D" state, "B" state: "011011" data
(36) "D" state, "C" state: "011111" data
(37) "D" state, "D" state: "001111" data
(38) "D" state, "E" state: "001101" data
(39) "D" state, "F" state: "000100" data
(40) "D" state, "G" state: "000110" data
(41) "E" state, "Z" state: "010111" data
(42) "E" state, "A" state: "010011" data
(43) "E" state, "B" state: "011010" data
(44) "E" state, "C" state: "011110" data
(45) "E" state, "D" state: "001110" data
(46) "E" state, "E" state: "001100" data
(47) "E" state, "F" state: "000101" data
(48) "E" state, "G" state: "000111" data
(49) "F" state, "Z" state: "010001" data
(50) "F" state, "A" state: "010101" data
(51) "F" state, "B" state: "011100" data
(52) "F" state, "C" state: "011000" data
(53) "F" state, "D" state: "001000" data
(54) "F" state, "E" state: "001010" data
(55) "F" state, "F" state: "000011" data
(56) "F" state, "G" state: "000001" data
(57) "G" state, "Z" state: "010000" data
(58) "G" state, "A" state: "010100" data
(59) "G" state, "B" state: "011101" data
(60) "G" state, "C" state: "011001" data
(61) "G" state, "D" state: "001001" data
(62) "G" state, "E" state: "001011" data
(63) "G" state, "F" state: "000010" data
(64) "G" state, "G" state: "000000" data FIG. 11 shows read voltages that are set for the data allocation shown in FIGS. 9 and 10, and definitions of read data to be applied to the read results of the pages. In the following description, read operations respectively targeting the first page, the second page, the third page, the fourth page, the fifth page, and the sixth page will be referred to as "first-page read", "second-page read", "third-page read", "fourth-page read", "fifth-page read", and "sixth-page read", respectively.

As shown in FIG. 11, the first page data is confirmed as a result of reading performed to plane PL1 with the use of the read voltage DR.

The second page data is confirmed as a result of reading performed to plane PL2 with the use of the read voltage DR.

The third page data is confirmed as a result of reading performed to plane PL1 with the use of the read voltages AR and CR, and as a result of reading performed to plane PL2 with the use of the read voltages BR and FR.

The fourth page data is confirmed as a result of reading performed to plane PL1 with the use of the read voltages BR and FR, and as a result of reading performed to plane PL2 with the use of the read voltages AR and CR.

The fifth page data is confirmed as a result of reading performed to plane PL1 with the use of the read voltages BR and FR, and as a result of reading performed to plane PL2 with the use of the read voltages ER and GR.

The sixth page data is confirmed as a result of reading performed to plane PL1 with the use of the read voltages ER and GR, and as a result of reading performed to plane PL2 with the use of the read voltages BR and FR.

In the semiconductor memory 10 of the first embodiment, the read data based on results of a read operation in each of plane PL1 and plane PL2 is defined as follows:

(Example) Read operation: (result of reading plane PL1, result of reading plane PL2, read data)×4 types First-page read: (0, 0, 0), (1, 0, 1), (0, 1, 0), (1, 1, 1)
Second-page read: (0, 0, 0), (1, 0, 0), (0, 1, 1), (1, 1, 1)
Third-page read: (0, 0, 0), (1, 0, 1), (0, 1, 1), (1, 1, 0)
Fourth-page read: (0, 0, 0), (1, 0, 1), (0, 1, 1), (1, 1, 0)
Fifth-page read: (0, 0, 0), (1, 0, 1), (0, 1, 1), (1, 1, 0)
Sixth-page read: (0, 0, 0), (1, 0, 1), (0, 1, 1), (1, 1, 0)

FIG. 12 through FIG. 15 show a list of read results of PL1 and read results of PL2 in a case where a read operation is performed to the foregoing 64 combinations of the threshold voltages with the use of the read voltages shown in FIG. 11.

In FIGS. 12 to 15, the portions where hatching is not applied in the combinations of the read results in planes PL1 and PL2 indicate that read data is "1", and the portions where hatching is applied indicate that read data is "0". Thus, it is possible to derive the data allocation shown in FIGS. 9 and 10 from the data definitions shown in FIG. 11 and the 64 combinations of the threshold voltages.

[1-2] Operation

Next, a write operation and a read operation of the semiconductor memory 10 according to the first embodiment will be described.

In the following description, let us suppose that, before the semiconductor memory 10 commences an operation, a ready/busy signal RBn is set at "H"-level (a ready state), and a voltage of a selected word line WLsel of each of plane PL1 and plane PL2 is a ground voltage VSS.

Let us further suppose that a voltage is applied by the driver circuit 15 and the row decoder module 16A to the selected word line WLsel of plane PL1, and a voltage is applied by the driver circuit 15 and the row decoder module 16B to the selected word line WLsel of plane PL2.

[1-2-1] Write Operation

During a write operation, the semiconductor memory 10 repeatedly performs a program loop. The program loop includes a program operation and a verify operation.

The program operation is an operation for raising a threshold voltage of the memory cell transistors MT. In the program operation in each program loop, if a threshold voltage of a memory cell transistor MT has already reached a desired value, the memory cell transistor MT is set to a write-inhibited state. In a write-inhibited memory cell transistor MT, a rise of a threshold voltage is suppressed by, for example, a self-boost technique.

The verify operation is a read operation to determine whether or not a threshold voltage of a memory cell transistor MT reaches a desired threshold voltage. In a verify operation, a write state at which verification is performed is determined for each sense amplifier unit SAU based on write data. In a verify operation, if a threshold voltage of a memory cell transistor MT has reached a desired threshold voltage, it is determined that the memory cell transistor MT passes verification at the determined level.

FIG. 16 is a diagram showing an example of a command sequence, and voltages to be applied to a selected word line WLsel in a write operation in the semiconductor memory 10 according to the first embodiment. In the following description, a write target bit line BL refers to a bit line BL coupled to a write target memory cell transistor MT, and a write-inhibited bit line BL refers to a bit line BL coupled to a write-inhibited memory cell transistor MT.

As shown in FIG. 16, the memory controller 20 first sends a command set CS1 to the semiconductor memory 10. The command set CS1 includes a command for instructing a write operation, an address of a cell unit CU to which data is written, and write data corresponding to a first bit (first-page data). The first-page data received by the semiconductor memory 10 is retained in the latch circuit XDL of the sense amplifier unit SAU of each of the sense amplifier modules 17A and 17B.

After receiving the command set CS1, the semiconductor memory 10 temporarily switches to a busy state, for example. Then, the sequencer 14 causes each of the sense amplifier modules 17A and 17B to transfer the first-page data retained in the latch circuit XDL to, for example, the latch circuit ADL.

Next, the memory controller 20 sends a command set CS2 to the semiconductor memory 10. The command set CS2 includes a command for instructing a write operation, an address of a cell unit CU to which data is written, and write data corresponding to a second bit (second-page data). The second-page data received by the semiconductor memory 10 is retained in the latch circuit XDL of the sense amplifier unit SAU of each of the sense amplifier modules 17A and 17B.

After receiving the command set CS2, the semiconductor memory 10 is temporarily changed to a busy state, for example. Then, the sequencer 14 causes each of the sense amplifier modules 17A and 17B to transfer the second-page data retained in the latch circuit XDL to, for example, the latch circuit BDL.

Next, the memory controller 20 sends a command set CS3 to the semiconductor memory 10. The command set CS3 includes a command for instructing a write operation, an address of a cell unit CU to which data is written, and write data corresponding to a third bit (third-page data). The third-page data received by the semiconductor memory 10 is retained in the latch circuit XDL of the sense amplifier unit SAU of each of the sense amplifier modules 17A and 17B.

After receiving the command set CS3, the semiconductor memory 10 temporarily switches to a busy state, for example. Then, the sequencer 14 causes each of the sense amplifier modules 17A and 17B to transfer the third-page data retained in the latch circuit XDL to, for example, the latch circuit CDL.

Next, the memory controller 20 sends a command set CS4 to the semiconductor memory 10. The command set CS4 includes a command for instructing a write operation, an address of a cell unit CU to which data is written, and write data corresponding to a fourth bit (fourth-page data). The fourth-page data received by the semiconductor memory 10 is retained in the latch circuit XDL of the sense amplifier unit SAU of each of the sense amplifier modules 17A and 17B.

After receiving the command set CS4, the semiconductor memory 10 is temporarily changed to a busy state, for example. Then, the sequencer 14 causes each of the sense amplifier modules 17A and 17B to transfer the fourth-page data retained in the latch circuit XDL to, for example, the latch circuit DDL.

Next, the memory controller 20 sends a command set CS5 to the semiconductor memory 10. The command set CS5 includes a command for instructing a write operation, an address of a cell unit CU to which data is written, and write data corresponding to a fifth bit (fifth-page data). The fifth-page data received by the semiconductor memory 10 is retained in the latch circuit XDL of the sense amplifier unit SAU of each of the sense amplifier modules 17A and 17B.

After receiving the command set CS5, the semiconductor memory 10 temporarily switches to a busy state, for example. Then, the sequencer 14 causes each of the sense amplifier modules 17A and 17B to transfer the fifth-page data retained in the latch circuit XDL to, for example, the latch circuit EDL.

Next, the memory controller 20 sends a command set CS6 to the semiconductor memory 10. The command set CS6 includes a command for instructing a write operation, an address of a cell unit CU to which data is written, and write data corresponding to a sixth bit (sixth-page data). The sixth-page data received by the semiconductor memory 10 is retained in the latch circuit XDL of the sense amplifier unit SAU of each of the sense amplifier modules 17A and 17B.

After receiving the command set CS6, the semiconductor memory 10 temporarily switches to a busy state, for example. Then the sequencer 14 performs a write operation based on the first-to-sixth page data respectively retained in the latch circuits ADL, BDL, CDL, DDL, EDL, and XDL in each of the sense amplifier modules 17A and 17B.

In the write operation in the semiconductor memory 10 according to the first embodiment, the sequencer 14 simultaneously performs a write operation for plane PL1 and a write operation for plane PL2 in parallel. Hereinafter, the write operation to plane PL1 will be called "first plane write", and the write operation to plane PL2 will be called "second plane write".

In a first plane write, the sequencer 14 first performs a program operation.

In the program operation, a program voltage VPGM is applied to a selected word line WLsel of plane PL1. The program voltage VPGM is a high voltage capable of raising threshold voltages of the memory cell transistors MT.

When the program voltage VPGM is applied to the selected word line WLsel, electrons are injected into the charge storage layer of a memory cell transistor MT, which is included in a NAND string NS coupled to a write-targeted bit line BL and is coupled to the selected word line WLsel, and the threshold voltage of the memory cell transistor MT rises.

At this time, in a memory cell transistor MT included in a NAND string NS coupled to a write-inhibited bit line BL and coupled to the selected word line WLsel, a rise of the threshold voltage is suppressed by, for example, a self-boost technique.

The sequencer 14 then lowers the voltage of the selected word line WLsel to VSS and performs a verify operation.

During the verify operation, a verify voltage AV is applied to selected word line WLsel, for example. While the verify voltage AV is being applied to the selected word line WLsel, each sense amplifier unit SAU in the sense amplifier module 17A determines, based on a voltage of a corresponding bit line BL, whether or not the threshold voltage of the memory cell transistor MT coupled to the selected word line WLsel exceeds the verify voltage AV.

A set of the above-explained program operation and verify operation corresponds to a single program loop. Subsequently, the sequencer 14 steps up the program voltage VPGM, and performs the program loop once again.

The voltage DVPGM, which is a step-up width of the program voltage VPGM, can be set at a value as appropriate. The types and the number of the write states at which verification is performed during a verify operation in each program loop may be changed as appropriate, as the program loop proceeds.

During the verify operation in each program loop, when the sequencer 14 detects that, for example, the number of the memory cell transistors MT that have passed the verification exceeds a predetermined number, the sequencer 14 regards this as completion of data write at the level. The sequencer 14 then omits a verification process at a write state at which a write process has been completed in future program loops. When the sequencer 14 detects the completion of a write process in all the write states, the sequencer 14 finishes the first-plane write.

The details of the second plane write are similar to those of the first plane write, for example. When each of the first plane write and the second plane write is completed, the sequencer 14 finishes the write operation, and changes the semiconductor memory 10 from a busy state to a ready state.

In a cell unit CU in which first plane write and second plane write have been performed as described above, the threshold distributions of the memory cell transistors MT as described above with reference to FIG. 8, are formed based on the write data for six pages and the data allocation which was described with reference to FIGS. 9 and 10.

In the foregoing description, six latch circuits are provided in a sense amplifier unit SAU for the write operation in the semiconductor memory 10 according to the first embodiment; however, the number of the latch circuits can be reduced.

In the following, with respect to a case where four latch circuits (latch circuits ADL, BDL, CDL, and XDL) are provided, an example of the operation performed by the sequencer 14 when command sets CS1 through CS6 shown in FIG. 16 are sent to the semiconductor memory 10 by the memory controller 20, will be described with reference to FIGS. 16 and 17. FIG. 17 is a flowchart showing an example of an operation performed by the sequencer 14 during a write operation in the semiconductor memory device 10 according to the first embodiment.

As shown in FIG. 16, the memory controller 20 first sends a command set CS1 to the semiconductor memory 10. The command set CS1 includes commands for instructing an operation for the first page, and includes write data DAT corresponding to the first page. The first-page data received by the semiconductor memory 10 is retained in the latch circuit XDL of the sense amplifier unit SAU of each of the sense amplifier modules 17A and 17B (FIG. 17, (1)).

After receiving the command set CS1, the semiconductor memory 10 temporarily switches to a busy state, for example. Then, the sequencer 14 causes the sense amplifier module 17A to transfer the first-page data retained in the latch circuit XDL to, for example, the latch circuit ADL. Then, the sequencer 14 causes the sense amplifier module 17B to transfer the first-page data retained in the latch circuit XDL to, for example, the latch circuit SDL (FIG. 17, (2)).

Next, the memory controller 20 sends a command set CS2 to the semiconductor memory 10. The command set CS2 includes commands for instructing an operation for the second page, and includes write data DAT corresponding to the second page. The second-page data received by the semiconductor memory 10 is retained in the latch circuit XDL of the sense amplifier unit SAU of each of the sense amplifier modules 17A and 17B (FIG. 17, (3)).

After receiving the command set CS2, the semiconductor memory 10 temporarily switches to a busy state, for example. Then, the sequencer 14 causes the sense amplifier module 17A to transfer the second-page data retained in the latch circuit XDL to, for example, the latch circuit SDL. Then, the sequencer 14 causes the sense amplifier module 17B to transfer the second-page data retained in the latch circuit XDL to, for example, the latch circuit ADL (FIG. 17, (4)).

Next, the memory controller 20 sends a command set CS3 to the semiconductor memory 10. The command set CS3 includes commands for instructing an operation for the third page, and includes write data DAT corresponding to the third page. The third-page data received by the semiconductor memory 10 is retained in the latch circuit XDL of the sense amplifier unit SAU of each of the sense amplifier modules 17A and 17B (FIG. 17, (5)).

After receiving the command set CS3, the semiconductor memory 10 temporarily switches to a busy state, for example. Then, the sequencer 14 causes the sense amplifier module 17A to transfer the third-page data retained in the latch circuit XDL to, for example, the latch circuit CDL. The sequencer 14 causes the sense amplifier module 17B to transfer, to the latch circuit BDL for example, data "XDL&~SDL", which is obtained by performing an AND operation on the data retained in the latch circuit XDL and the data obtained by inverting the data retained in the latch circuit SDL (FIG. 17, (6)). As a dynamic latch used for this operation, node SEN, a bit line BL, and a memory pillar MP, may be used, for example.

Next, the memory controller 20 sends a command set CS4 to the semiconductor memory 10. The command set CS4 includes commands for instructing an operation for the fourth page, and includes write data DAT corresponding to the fourth page. The fourth-page data received by the semiconductor memory 10 is retained in the latch circuit XDL of the sense amplifier unit SAU of each of the sense amplifier modules 17A and 17B (FIG. 17, (7)).

After receiving the command set CS4, the semiconductor memory 10 is temporarily changed to a busy state, for example. The sequencer 14 causes the sense amplifier module 17A to transfer, to the latch circuit CDL for example, data "~(XDL^CDL)", which is obtained by performing an XNOR operation on the data retained in the latch circuit XDL and the data retained in the latch circuit CDL. The sequencer 14 causes the sense amplifier module 17B to transfer, to the latch circuit SDL for example, data "XDL&SDL", which is obtained by performing an AND operation on the data retained in the latch circuit XDL and the data retained in the latch circuit SDL. Subsequently, the sequencer 14 causes the sense amplifier module 17B to transfer, to the latch circuit BDL for example, data "BDL|SDL", which is obtained by performing an OR operation on the data retained in the latch circuit BDL and the data retained in the latch circuit SDL (FIG. 17, (8)).

Next, the memory controller 20 sends a command set CS5 to the semiconductor memory 10. The command set CS5 includes commands for instructing an operation for the fifth page, and includes write data DAT corresponding to the fifth page. The fifth-page data received by the semiconductor memory 10 is retained in the latch circuit XDL of the sense amplifier unit SAU of each of the sense amplifier modules 17A and 17B (FIG. 17, (9)).

After receiving the command set CS5, the semiconductor memory 10 temporarily switches to a busy state, for example. The sequencer 14 causes the sense amplifier module 17A to transfer, to the latch circuit BDL for example, data "XDL&~SDL", which is obtained by performing an AND operation on the data retained in the latch circuit XDL and the data obtained by inverting the data retained in the latch circuit SDL. Then, the sequencer 14 causes the sense amplifier module 17B to transfer the data retained in the latch circuit XDL to, for example, the latch circuit CDL (FIG. 17, (10)).

Next, the memory controller 20 sends a command set CS6 to the semiconductor memory 10. The command set CS6 includes commands for instructing an operation for the sixth page, and includes write data DAT corresponding to the sixth page. The sixth-page data received by the semiconductor memory 10 is retained in the latch circuit XDL of the sense amplifier unit SAU of each of the sense amplifier modules 17A and 17B (FIG. 17, (11)).

After receiving the command set CS6, the semiconductor memory 10 temporarily switches to a busy state, for example. The sequencer 14 causes the sense amplifier module 17A to transfer, to the latch circuit SDL for example, data "XDL&SDL", which is obtained by performing an AND operation on the data retained in the latch circuit XDL and the data retained in the latch circuit SDL. Subsequently, the sequencer 14 causes the sense amplifier module 17A to transfer, to the latch circuit BDL for example, data "BDL|SDL", which is obtained by performing an OR operation on the data retained in the latch circuit BDL and the data retained in the latch circuit SDL. The sequencer 14 causes the sense amplifier module 17B to transfer, to the latch circuit CDL for example, data "~(XDL^CDL)", which is obtained by performing an XNOR operation on the data retained in the latch circuit XDL and the data retained in the latch circuit CDL (FIG. 17 (12)).

Then the sequencer 14 performs a write operation based on the data respectively retained in the latch circuits ADL, BDL, and CDL in each of the sense amplifier modules 17A and 17B.

The data retained in the latch circuits ADL, BDL, and CDL for each threshold voltage of the memory cell transistors MT in the example shown in FIG. 17 are shown below. Similarly, different data is allocated to each of the threshold voltages in each of plane PL1 and plane PL2.

(Example) "Threshold voltage of memory cell transistors MT": data retained in ADL/data retained in BDL/data retained in CDL"

(1) "Z" state: "111" data
(2) "A" state: "110" data
(3) "B" state: "100" data
(4) "C" state: "101" data
(5) "D" state: "001" data
(6) "E" state: "000" data
(7) "F" state: "010" data
(8) "G" state: "011" data

[1-2-2] Read Operation

The semiconductor memory 10 of the first embodiment is capable of performing a read operation within a page unit. In the following, the first-page read, the second-page read, the third-page read, the fourth-page read, the fifth-page read, and the sixth-page read in the semiconductor memory 10 according to the first embodiment will be described.

(First-Page Read)

FIG. 18 is a diagram showing an example of a command sequence, and voltages to be applied to a selected word line WLsel in first-page read in the semiconductor memory 10 according to the first embodiment.

As shown in FIG. 18, first, the memory controller 20 sequentially sends, for example, a command "01h", a command "00h", address information ADD, and a command "30h" to the semiconductor memory 10.

The command "01h" is a command for instructing performing an operation for the first page. The command "00h" is a command for instructing a read operation. The command "30h" is a command for instructing the semiconductor memory 10 to start a read operation based on a received command and address. Upon receipt of the command "30h", the semiconductor memory 10 switches from a ready state to a busy state, and commences the first-page read.

The sequencer 14 in the first-page read performs a read operation to plane PL1 but not to plane PL2. Hereinafter, the read operation to plane PL1 will be called "first plane read", and the read operation to plane PL2 will be called "second plane read".

In the first plane read in the first-page read, the read voltage DR is applied to the selected word line WLsel in plane PL1. Then, the sequencer 14 asserts the control signal STB corresponding to plane PL1 while the read voltage DR is being applied to the selected word line WLsel in plane PL1.

Then, each sense amplifier unit SAU in the sense amplifier module 17A determines, based on a voltage of a corresponding bit line BL, whether or not the threshold voltage of the memory cell transistors MT coupled to the selected word line WLsel exceeds the read voltage DR.

A read result obtained with the use of the read voltage DR is retained in the latch circuit ADL in the sense amplifier module 17A, for example. When the read result is thus retained in any of the latch circuits, the sequencer 14 finishes the first plane read.

When the first plane read is finished, the sequencer 14 causes the sense amplifier unit 17 to transfer the read result of the first plane read to the latch circuit XDL of the sense amplifier unit SAU in plane PL1, for example, and changes the semiconductor memory 10 from a busy state to a ready state.

Upon detection of a change in the semiconductor memory 10 from a busy state to a ready state, the memory controller 20 causes the semiconductor memory 10 to output the read data DAT by toggling for example, the read enable signal REn.

Specifically, the data retained in the latch circuit XDL in plane PL1 is transferred to the logic circuit 18 based on the control of the memory controller 20. Then, the logic circuit 18 confirms the read data of the first page based on the transferred data of plane PL1 and the definitions of the data shown in FIG. 11, and outputs the confirmed read data DAT to the memory controller 20.

In the first-page read of the semiconductor memory 10 according to the first embodiment, read data is confirmed only from the read result of plane PL1; accordingly, the logic circuit 18 may transfer the data transferred from plane PL1 to the memory controller 20 without changing.

In the description hereunder, whenever a read voltage is applied, the control signal STB is asserted within a period during which the read voltage is applied. When more than one read voltage is applied, "0" data or "1" data is confirmed by performing a logic operation on a plurality of read results.
(Second-Page Read)

FIG. 19 is a diagram showing an example of a command sequence, and voltages to be applied to a selected word line WLsel in second-page read in the semiconductor memory 10, according to the first embodiment.

As shown in FIG. 19, first, the memory controller 20 sequentially sends, for example, a command "02h", a command "00h", address information ADD, and a command "30h" to the semiconductor memory 10. The command "02h" is a command for instructing the performance of an operation for the second page. Upon receipt of the command "30h", the semiconductor memory 10 switches from a ready state to a busy state, and commences the second-page read.

The sequencer 14 in the second-page read performs a second plane read operation to plane PL2, and does not perform first plane read to plane PL1.

In the second plane read in the second-page read, a read operation using the read voltage DR, for example, is performed. The read result obtained by using the read voltage DR is retained in the latch circuit ADL in the sense amplifier module 17B, for example.

When the second plane read is finished, the sequencer 14 causes the sense amplifier module 17 to transfer the read result of the second plane read to the latch circuit XDL of the sense amplifier unit SAU in plane PL2, for example, and changes the semiconductor memory 10 from a busy state to a ready state.

Upon detection of a change in the semiconductor memory 10 from a busy state to a ready state, the memory controller 20 causes the semiconductor memory 10 to output the read data DAT by toggling for example, the read enable signal REn.

Specifically, the data retained in the latch circuit XDL in plane PL2 is transferred to the logic circuit 18 based on the control of the memory controller 20. Then, the logic circuit 18 confirms the read data of the second page based on the transferred data of plane PL2 and the definitions of the data shown in FIG. 11, and outputs the confirmed read data DAT to the memory controller 20.

In the second-page read of the semiconductor memory 10 according to the first embodiment, read data is confirmed only by the read result of plane PL1; accordingly, the logic circuit 18 may transfer the data transferred from plane PL2 to the memory controller 20 without changing.
(Third-Page Read)

FIG. 20 is a diagram showing an example of a command sequence, and voltages to be applied to a selected word line WLsel in third-page read in the semiconductor memory 10 according to the first embodiment.

As shown in FIG. 20, first, the memory controller 20 sequentially sends, for example, a command "03h", a command "00h", address information ADD, and a command "30h" to the semiconductor memory 10. The command "03h" is a command for instructing performing an operation for the third page. Upon receipt of the command "30h", the semiconductor memory 10 switches to a busy state, and commences the third-page read.

In the third-page read, the sequencer 14 performs the first plane read to plane PL1 and the second plane read to plane PL2 simultaneously and in parallel.

In the present specification, "simultaneously performing first plane read and second plane read in parallel" means that the timing and period in which a single type of read voltage is applied in plane PL1 is approximately the same as the timing and period in which a single type of read voltage is applied in plane PL2.

In the first plane read in the third-page read, a read operation using the read voltages AR and CR, for example, is performed. The read result obtained by using the read voltages AR and CR is retained in the latch circuit ADL in the sense amplifier module 17A, for example.

In the second plane read in the third-page read, a read operation using the read voltages BR and FR, for example, is performed. The read result obtained by using the read voltages BR and FR is retained in the latch circuit ADL in the sense amplifier module 17B, for example.

When each of the first plane read and the second plane read is finished, the sequencer 14 causes the sense amplifier module 17A to transfer the read result of the first plane read to the latch circuit XDL in plane PL1, and the sense amplifier module 17B to transfer the read result of the second plane read to the latch circuit XDL in plane PL2. Thereafter, the sequencer 14 changes the semiconductor memory 10 from a busy state to a ready state.

Upon detection of a change in the semiconductor memory 10 from a busy state to a ready state, the memory controller 20 causes the semiconductor memory 10 to output the read data DAT by toggling for example, the read enable signal REn.

Specifically, the data retained in the latch circuit XDL in each of plane PL1 and plane PL2 is transferred to the logic circuit 18 based on the control of the memory controller 20. Then, the logic circuit 18 confirms the read data of the third page based on the transferred data of plane PL1 and plane PL2 and the definitions of the data shown in FIG. 11, and outputs the confirmed read data DAT to the memory controller 20.

(Fourth-Page Read)

FIG. 21 is a diagram showing an example of a command sequence, and voltages to be applied to a selected word line WLsel in fourth-page read in the semiconductor memory 10 according to the first embodiment.

As shown in FIG. 21, first, the memory controller 20 sequentially sends, for example, a command "04h", a command "00h", address information ADD, and a command "30h" to the semiconductor memory 10. The command "04h" is a command for instructing the performance of an operation for the fourth page. Upon receipt of the command "30h", the semiconductor memory 10 switches to a busy state, and commences the fourth-page read.

In the fourth-page read, the sequencer 14 performs the first plane read to plane PL1 and the second plane read to plane PL2 simultaneously and in parallel.

In the first plane read in the fourth-page read, a read operation using the read voltages BR and FR, for example, is performed. The read result obtained by using the read voltages BR and FR is retained in the latch circuit ADL in the sense amplifier module 17A, for example.

In the second plane read in the fourth-page read, a read operation using the read voltages AR and CR, for example, is performed. The read result obtained by using the read voltages AR and CR is retained in the latch circuit ADL in the sense amplifier module 17B, for example.

When each of the first plane read and the second plane read is finished, the sequencer 14 causes the sense amplifier module 17 to transfer the read result is transferred to the latch circuit XDL in each of plane PL1 and plane PL2 by, and changes the semiconductor memory 10 from a busy state to a ready state.

The operation hereafter is the same as that for the third-page read; the logic circuit 18 confirms the read data of the fourth page based on the definitions of the data shown in FIG. 11, and outputs the confirmed read data DAT to the memory controller 20.

(Fifth-Page Read)

FIG. 22 is a diagram showing an example of a command sequence, and voltages to be applied to a selected word line WLsel in fifth-page read in the semiconductor memory 10 according to the first embodiment.

As shown in FIG. 22, first, the memory controller 20 sequentially sends, for example, a command "05h", a command "00h", address information ADD, and a command "30h" to the semiconductor memory 10. The command "05h" is a command for instructing the performance of an operation for the fifth page. Upon receipt of the command "30h", the semiconductor memory 10 switches to a busy state, and commences the fifth-page read.

In the fifth-page read, the sequencer 14 performs the first plane read to plane PL1 and the second plane read to plane PL2 simultaneously and in parallel.

In the first plane read in the fifth-page read, a read operation using the read voltages BR and FR, for example, is performed. The read result obtained by using the read voltages BR and FR is retained in the latch circuit ADL in the sense amplifier module 17A, for example.

In the second plane read in the fifth-page read, a read operation using the read voltages ER and GR, for example, is performed. The read result obtained by using the read voltages ER and GR is retained in the latch circuit ADL in the sense amplifier module 17B, for example.

When each of the first plane read and the second plane read is finished, the sequencer 14 causes the sense amplifier module 17 to transfer the read result to the latch circuit XDL in each of plane PL1 and plane PL2, changes the semiconductor memory 10 from a busy state to a ready state.

The operation hereafter is the same as the third-page read; the logic circuit 18 confirms the read data of the fifth page based on the definitions of the data shown in FIG. 11, and outputs the confirmed read data DAT to the memory controller 20.

(Sixth-Page Read)

Figure 23:
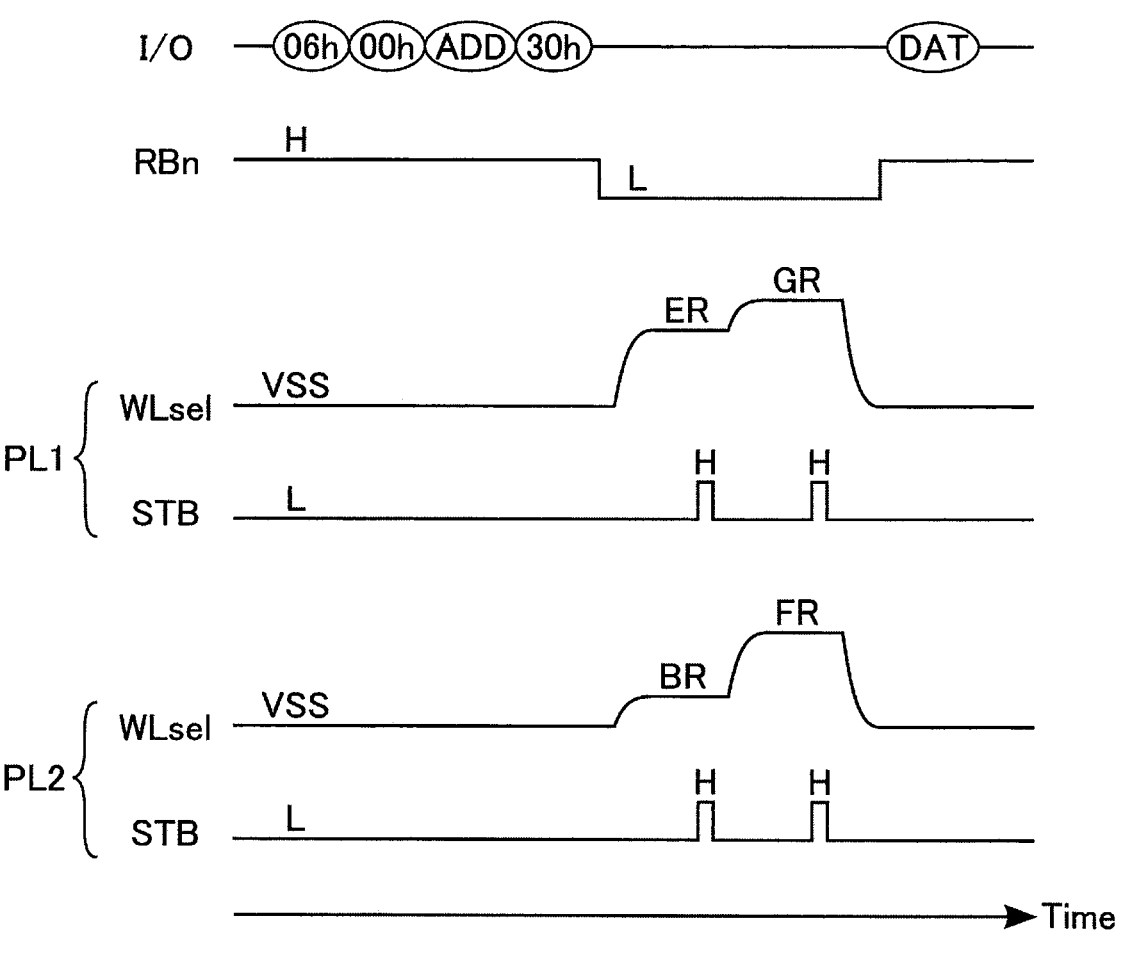
FIG. 23 is a timing chart showing an example of a command sequence, and voltages to be applied to a selected word line in a sixth-page read in the semiconductor memory according to the first embodiment.

FIG. 23 is a diagram showing an example of a command sequence, and voltages to be applied to a selected word line WLsel in the sixth-page read in the semiconductor memory 10 according to the first embodiment.

As shown in FIG. 23, first, the memory controller 20 sequentially sends, for example, a command "06h", a command "00h", address information ADD, and a command "30h" to the semiconductor memory 10. The command "06h" is a command for instructing the performance of an operation for the sixth page. Upon receipt of the command "30h", the semiconductor memory 10 switches to a busy state, and commences the sixth-page read.

In the sixth-page read, the sequencer 14 performs the first plane read to plane PL1 and the second plane read to plane PL2 simultaneously and in parallel.

For the first plane read in the sixth-page read, a read operation using the read voltages ER and GR, for example, is performed. The read result obtained by using the read voltages ER and GR is retained in the latch circuit ADL in the sense amplifier module 17A, for example.

For the second plane read in the sixth-page read, a read operation using the read voltages BR and FR, for example, is performed. The read result obtained by using the read voltages BR and FR is retained in the latch circuit ADL in the sense amplifier module 17B, for example.

When each of the first plane read and the second plane read is finished, the sequencer 14 causes the sense amplifier module 17 to transfer the read result to the latch circuit XDL in each of plane PL1 and plane PL2, and changes the semiconductor memory 10 from a busy state to a ready state by the sequencer 14.

The operation hereafter is the same as the third-page read; the logic circuit 18 confirms the read data of the sixth page based on the definitions of the data shown in FIG. 11, and outputs the confirmed read data DAT to the memory controller 20.

[1-3] Advantageous Effects of First Embodiment

According to the above-described semiconductor memory 10 in the first embodiment, the speed of operations of reading multiple-bit data stored in the memory cells can be enhanced. Advantageous effects of the semiconductor memory 10 according to the first embodiment will be described in detail below.

As comparative examples of the first embodiment, an example where 3-bit data is stored per memory cell transistor MT will be explained. FIG. 24 shows an example of a data allocation and read voltages in a comparative example of the first embodiment.

As shown in FIG. 24, in the comparative example of the first embodiment, "111 (upper bit/middle bit/lower bit)" data, "110" data, "100" data, "000" data, "010" data, "011" data, "001" data, "101" data are respectively allocated to the threshold distributions of the "ER" state, the "A" state, the "B" state, the "C" state, the "D" state, the "E" state, the "F" state, and the "G" state.

In the comparative example of the first embodiment, similar to the explanation of FIG. 8, a read voltage and a verify voltage are set to each of the "A" state through the "G" state. Lower-page data is confirmed by a read result obtained by the use of each of the read voltages AR and ER. Middle-page data is confirmed by a read result obtained by the use of each of the read voltages BR, DR, and FR. Upper-page data is confirmed by a read result obtained by the use of each of the read voltages CR and GR. Such a data allocation is called, for example, "2-3-2 code" based on the number of times of page read. In the comparative example of the first embodiment, the number of times that read is performed per page is $(2+3+2)/3=2.33$.

Furthermore, in the semiconductor memory 10 according to the first embodiment, 6-bit data can be stored in a set of two memory cell transistors MT. In the semiconductor memory 10 according to the first embodiment, the number of times that read is performed per page is $(1+1+2+2+2+2)/6=1.67$.

Thus, in the semiconductor memory 10 in the first embodiment, storage capacity per memory cell transistor MT is similar to that in the comparative example of the first embodiment. On the other hand, the number of times that read is performed per page in the semiconductor memory 10 of the first embodiment is lower than that in the comparative example of the first embodiment.

It is thus possible to reduce the number of times that read is performed in a read operation performed within a page unit, in the semiconductor memory 10 in the first embodiment. Accordingly, the semiconductor memory 10 according to the first embodiment can realize storage capacity similar to that of the comparative example, and can enhance the speed of the read operation compared to the speed in the comparative example.

In the semiconductor memory 10 according to the first embodiment, since the data is confirmed only by the read result of plane PL1 in the first-page read, the read operation to plane PL2 is omitted. Similarly, since the data is confirmed only from the read result of plane PL2 in the second-page read, the read operation to plane PL1 is omitted.

Thus, in a per-page read operation performed in the semiconductor memory 10 of the first embodiment, it is possible to omit a read operation to either one of the planes as appropriate. As a result, the semiconductor memory 10 according to the first embodiment can reduce power consumption in a read operation.

[1-4] Modifications of First Embodiment

In the first embodiment, an example where the data allocation shown in FIGS. 9 and 10 is used was described; however, other data allocations may be adopted.

Combinations of read voltages and data definitions in the first to fourth modifications of the first embodiment are listed below. A data allocation for each of the following combinations is set as appropriate based on a combination of read voltages and data definitions.

(Example) Read voltages: [first-page read ((x) read voltage of PL1, (y) read voltage of PL2), second-page read ((x), (y)), third-page read ((x), (y)), fourth-page read ((x), (y)), fifth-page read ((x), (y)), sixth-page read ((x), (y))]; Data definitions: [first-page read [(a) read data when "0", "0" (=read result of PL1, read result of PL2), (b) read data when "1", "0", (c) read data when "0", "1", (d) read data when "1", "1"], second-page read [(a), (b), (c), (d)], third-page read [(a), (b), (c), (d)], fourth-page read [(a), (b), (c), (d)], fifth-page read [(a), (b), (c), (d)], sixth-page read [(a), (b), (c), (d)]]

First Modification of First Embodiment

Read voltages: [((AR, CR), (BR, FR)), ((BR, FR), (AR, ER)), ((BR, FR), (CR, GR)), ((ER, GR), (BR, FR)), ((omitted), (DR)), ((DR), (omitted))]; data definitions: [[0, 1, 1, 0], [0, 1, 1, 0], [0, 1, 1, 0], [0, 1, 1, 0], [0, 0, 1, 1], [0, 1, 0, 1]]

Second Modification of First Embodiment

Read voltages: [((AR, CR), (BR, FR)), ((BR, FR), (AR, GR)), ((BR, FR), (CR, ER)), ((ER, GR), (BR, FR)), ((omitted), (DR)), ((DR), (omitted))]; data definitions: [[0, 1, 1, 0], [0, 1, 1, 0], [0, 1, 1, 0], [0, 1, 1, 0], [0, 0, 1, 1], [0, 1, 0, 1]]

Third Modification of First Embodiment

Read voltages: [((AR, ER), (BR, FR)), ((BR, FR), (AR, CR)), ((BR, FR), (ER, GR)), ((CR, GR), (BR, FR)), ((omitted), (DR)), ((DR), (omitted))]; data definitions: [[0, 1, 1, 0], [0, 1, 1, 0], [0, 1, 1, 0], [0, 1, 1, 0], [0, 0, 1, 1], [0, 1, 0, 1]]

Fourth Modification of First Embodiment

Read voltages: [((AR, GR), (BR, FR)), ((BR, FR), (AR, CR)), ((BR, FR), (ER, GR)), ((CR, ER), (BR, FR)), ((omitted), (DR)), ((DR), (omitted))]; data definitions: [[0, 1, 1, 0], [0, 1, 1, 0], [0, 1, 1, 0], [0, 1, 1, 0], [0, 0, 1, 1], [0, 1, 0, 1]]

Fifth Modification of First Embodiment

Read voltages: [((DR), (AR, GR), ((DR), (CR, ER)), ((BR), (DR)), ((FR), (DR)), ((AR, GR), (BR, FR)), ((CR, ER), (BR, FR))]; data definitions: [[0, 1, 1, 0], [0, 1, 1, 0], [0, 1, 1, 0], [0, 1, 1, 0], [0, 1, 1, 0], [0, 1, 1, 0]]

The semiconductor memory 10 of each of the above-described first through fifth modifications of the first embodiment is capable of performing the same operation as that of the first embodiment, and can achieve similar advantageous effects.

[2] Second Embodiment

The configuration of the semiconductor memory 10 of the second embodiment is similar to that of the semiconductor memory 10 of the first embodiment. The semiconductor memory 10 of the second embodiment performs the sequential read for two-page data. In the following, differences apparent in the semiconductor memory 10 between the second and first embodiments will be described.

[2-1] Read Operation

In the semiconductor memory 10 of the second embodiment, as the sequential read for two-page data, the sequential read may be performed for, for example, the first and second pages, the third and sixth pages, and the fourth and fifth pages, respectively.
(Sequential Read for First and Second Pages)
FIG. 25 is a diagram showing an example of a command sequence, and voltages to be applied to a selected word line WLsel in the sequential read for the first and second pages in the semiconductor memory 10 of the second embodiment.

As shown in FIG. 25, first, the memory controller 20 sequentially sends, for example, a command "xxh", a command "00h", address information ADD, and a command "30h" to the semiconductor memory 10.

The command "xxh" is a command instructing the performance of the sequential read for, for example, the first page and the second page. Upon receipt of the command "30h", the semiconductor memory 10 switches from a ready state to a busy state, and commences the sequential read for the first and second pages.

In the sequential read for the first and second pages, the sequencer 14 performs the first plane read to plane PL1 and the second plane read to plane PL2 simultaneously and in parallel.

In the first plane read in the sequential read, the read voltage DR, for example, is applied to the selected word line WLsel in plane PL1. The read result obtained by using the read voltage DR is retained in the latch circuit ADL in the sense amplifier module 17A, for example.

In the second plane read in the sequential read, the read voltage DR, for example, is applied to the selected word line WLsel in plane PL2. The read result obtained by using the read voltage DR is retained in the latch circuit ADL in the sense amplifier module 17B, for example.

When each of the first plane read and the second plane read is finished, the sequencer 14 causes the sense amplifier module to transfer the read result to the latch circuit XDL in each of plane PL1 and plane PL2, and changes the semiconductor memory 10 from a busy state to a ready state.

At this time, in the semiconductor memory 10, the read result related to the first-page data is retained in the latch circuit XDL in plane PL1, and the read result related to the second-page data is retained in the latch circuit XDL in plane PL2.

Upon detection of a change from a busy state to a ready state in the semiconductor memory 10, the memory controller 20 causes the semiconductor memory 10 to output the read data DAT by toggling, for example, the read enable signal REn.

Specifically, similar to the first-page read described in the first embodiment, the read result retained in the latch circuit XDL in plane PL1 is transferred to the logic circuit 18, and the logic circuit 18 outputs the first-page data which is confirmed based on the read result to the memory controller 20. When the output of the first-page data is finished, similar to the second-page read described in the first embodiment, the read result retained in the latch circuit XDL in plane PL2 is transferred to the logic circuit 18, and the logic circuit 18 outputs the second-page data which is confirmed based on the read result to the memory controller 20.

The order of pages to be output from the semiconductor memory 10 to the memory controller 20 may be set as appropriate. For example, in the sequential read for the first and second pages, the semiconductor memory 10 may output the first-page data after outputting the second page data. Specifically, an input command or address may be changed to output the second-page data and the first-page data in this order. A set of the first-page data and the second-page data may be treated as one page by increasing the page size.
(Sequential Read for Third and Sixth Pages)
FIG. 26 is a diagram showing an example of a command sequence, and voltages to be applied to a selected word line WLsel in the sequential read for the third and sixth pages in the semiconductor memory 10 according to the second embodiment.

As shown in FIG. 26, first, the memory controller 20 sequentially sends, for example, a command "xyh", a command "00h", address information ADD, and a command "30h" to the semiconductor memory 10.

The command "xyh" is a command instructing the performance of the sequential read for, for example, the third page and the sixth page. Upon receipt of the command "30h", the semiconductor memory 10 switches from a ready state to a busy state, and commences the sequential read for the third and sixth pages.

In the sequential read for the third and sixth pages, the sequencer 14 performs the first plane read to plane PL1 and the second plane read to plane PL2 simultaneously and in parallel.

In the first plane read of the sequential read, the read voltages AR, CR, ER, and GR, for example, are applied in this order to the selected word line WLsel in plane PL1. For example, the read results obtained by using the read voltages AR and CR are retained in the latch circuit ADL in the sense amplifier module 17A, and the read results obtained by using the read voltages ER and GR are retained in the latch circuit BDL in the sense amplifier module 17A.

In the second plane read of the sequential read, the read voltages BR and FR, for example, are applied in this order to the selected word line WLsel in plane PL2. For example, the read results obtained by using the read voltages BR and FR are retained in the latch circuit ADL in the sense amplifier module 17B, for example.

At the time when the read results obtained by using the read voltages AR and CR are confirmed in the first plane read, and the read results obtained by using the read voltages BR and FR are confirmed in the second plane read, the sequencer 14 transfers the data to the latch circuit XDL, and changes the semiconductor memory 10 from a busy state to a ready state.

In other words, the sequencer 14 changes the semiconductor memory 10 from a busy state to a ready state at the time when the read result related to the third-page data is confirmed in plane PL1 and plane PL2, and the output of the third-page data is ready.

Upon detection of the change to a ready state in the semiconductor memory 10, the memory controller 20 outputs the third-page data from the semiconductor memory 10, in a manner similar to the third-page read of the first embodiment.

At this time, in the semiconductor memory 10, the output of the third-page data to the memory controller 20 and the first plane read are processed in parallel. Specifically, for example in plane PL1, a read operation using the read voltages ER and GR is performed, while the third-page data is being output.

When the sequencer 14 detects the completion of the output of the third-page data, the sequencer 14 changes the semiconductor memory 10 from a ready state to a busy state. When the sequencer 14 then detects the completion of the first plane read which has been processed in parallel, the sequencer 14 changes the semiconductor memory 10 from a busy state to a ready state.

Upon detection of the change to a ready state in the semiconductor memory 10 after receiving the third-page data, the memory controller 20 causes the semiconductor memory 10 to output the sixth-page data, in a manner similar to the sixth-page read of the first embodiment.

If the first plane read is finished while the semiconductor memory 10 is outputting the third-page data to the memory controller 20, the semiconductor memory 10 may remain in a ready state after the output of the third-page data, and subsequently output the sixth-page data.

The read results obtained by using the read voltages BR and FR in the second plane read are used when the third-page data is output and when the sixth-page data is output. For example, when the third-page data is output, the read results obtained by using the read voltages BR and FR, retained in the latch circuit XDL in plane PL2, may be retained in the latch circuit XDL after being transferred to the logic circuit 18, or alternatively evacuated in another latch circuit.

In the sequential read for the third and sixth pages, the semiconductor memory 10 may output the third-page data after outputting the sixth-page data. Specifically, an input command or address may be changed to output the sixth-page data and the third-page data in this order. A set of the third-page data and the sixth-page data may be treated as one page by increasing the page size. In this case, in the first plane read, the read process may be performed using the read voltages ER, GR, AR, and CR, or GR, ER, CR, and AR in this order. In the second plane read, the read process may be performed using the read voltages FR and BR in this order.

(Sequential Read for Fourth and Fifth Pages)

FIG. 27 is a diagram showing an example of a command sequence, and voltages to be applied to a selected word line WLsel in the sequential read for the fourth and fifth pages in the semiconductor memory 10 of the second embodiment.

As shown in FIG. 27, first, the memory controller 20 sequentially sends, for example, a command "xzh", a command "00h", address information ADD, a command "30h" to the semiconductor memory 10.

The command "xzh" is a command instructing the performance of a sequential read for, for example, the fourth page and the fifth page. Upon receipt of the command "30h", the semiconductor memory 10 switches to a busy state from a ready state, and commences the sequential read for the fourth and fifth pages.

In the sequential read for the fourth and fifth pages, the sequencer 14 performs the first plane read to plane PL1, and the second plane read to plane PL2, simultaneously and in parallel.

In the first plane read of the sequential read, the read voltages BR and FR, for example, are applied in this order to the selected word line WLsel in plane PL1. For example, the read results obtained by using the read voltages BR and FR are retained in the latch circuit ADL in the sense amplifier module 17A.

In the second plane read of the sequential read, the read voltages AR, CR, ER, and GR, for example, are applied to the selected word line WLsel in plane PL2. For example, the read result obtained by using the read voltages AR and CR are retained in the latch circuit ADL in the sense amplifier module 17B, and the read results obtained by using the read voltages ER and GR are retained in the latch circuit BDL in the sense amplifier module 17B.

At the time when the read results obtained by using the read voltages BR and FR are confirmed in the first plane read, and the read results obtained by using the read voltages AR and CR are confirmed in the second plane read, for example, the sequencer 14 causes the sense amplifier module 17 to transfer the data to the latch circuit XDL, and changes the semiconductor memory 10 from a busy state to a ready state.

In other words, the sequencer 14 changes the semiconductor memory 10 from a busy state to a ready state at the time when the read result related to the fourth-page data in plane PL1 and plane PL2 is confirmed, and the output of the fourth-page data is ready.

Upon detection of the change to a ready state in the semiconductor memory 10, the memory controller 20 causes the semiconductor memory 10 to output the fourth-page data, in a manner similar to the fourth-page read described in the first embodiment.

At this time, the semiconductor memory 10 processes the output of the fourth-page data to the memory controller 20 and the second plane read in parallel. Specifically, in plane PL2 for example, a read operation using the read voltages ER and GR is performed while the fourth-page data is being output.

When the sequencer 14 detects the completion of the output of the fourth-page data, for example, the sequencer 14 changes the semiconductor memory 10 from a ready state to a busy state. Then, upon detection of the completion of the second plane read which has been processed in parallel, the sequencer 14 changes the semiconductor memory 10 from a busy state to a ready state.

Upon detection of the change to a ready state in the semiconductor memory 10 after receipt of the fourth-page data, the memory controller 20 causes the semiconductor memory 10 to output the fifth-page data, in a manner similar to the fifth-page read described in the first embodiment.

If the second plane read is finished while the semiconductor memory 10 is outputting the fourth-page data to the memory controller 20, the semiconductor memory 10 may remain in a ready state after the output of the fourth-page data, and subsequently output the fifth-page data.

The read results obtained by using the read voltages BR and FR in the first plane read are used when the fourth-page data is output and when the fifth-page data is output. For example, when the fourth-page data is output, the read results obtained by using the read voltages BR and FR, retained in the latch circuit XDL in plane PL1, may be retained in the latch circuit XDL after being transferred to the logic circuit 18, or may be evacuated to other latch circuit.

In the sequential read for the fourth and fifth pages, the semiconductor memory 10 may output the fourth-page data after outputting the fifth-page data. Specifically, an input command or address may be changed to output the fifth-page data and the fourth-page data in this order. A set of the fourth-page data and the fifth-page data may be treated as one page by increasing the page size. In this case, in the second plane read, the read process may be performed using the read voltages ER, GR, AR, and CR, or GR, ER, CR, and AR, in this order. In the first plane read, the read process may be performed in the order of the voltages FR and BR.

[2-2] Advantageous Effects of Second Embodiment

The semiconductor memory 10 of the second embodiment can perform a sequential read for two-page data, as described above. The semiconductor memory 10 of the second embodiment can achieve advantageous effects as will be described below.

In the sequential read for the two-page data according to the second embodiment, a first page in which a read result of plane PL1 is used, and a second page in which only a read result of plane PL2 is used, are combined. In this case, one read voltage is used in each of plane PL1 and plane PL2 in the sequential read for the first and second pages.

As a result, in the sequential read for the first and second pages, the semiconductor memory 10 of the second embodiment can confirm the first-page and second-page data by a single read operation performed to plane PL1 and plane PL2 in parallel.

Accordingly, the semiconductor memory 10 of the second embodiment can enhance the speed of a read operation in the sequential read for the first and second pages.

In the sequential read for two-page data according to the second embodiment, the third page and sixth pages for which a same read result is used in plane PL1 are combined. In plane PL2, the fourth and fifth for which a same read result is used are combined.

In each of the sequential read for the third and sixth pages and the sequential read for the fourth and fifth pages, the semiconductor memory 10 of the second embodiment can thus omit a read operation for which redundant read voltages are used.

In other words, the semiconductor memory 10 of the second embodiment, power consumption can be reduced in each of the sequential read for the third and sixth pages and the sequential read for the fourth and fifth pages.

In the second embodiment, the sequential read for two-page data is performed respectively for a set of the first and second pages, a set of the third and sixth pages, and a set of the fourth and fifth pages; however, the embodiment is not limited to this example. The combination of pages in the sequential read for two-page data may be set as appropriate.

[3] Third Embodiment

The configuration of the semiconductor memory 10 of the third embodiment is similar to that of the semiconductor memory 10 of the first embodiment. The semiconductor memory 10 of the third embodiment performs the sequential read for three-page data. In the following, differences of the semiconductor memory 10 between the third embodiment and the first and second embodiments will be described.

[3-1] Read Operation

In the semiconductor memory 10 of the third embodiment, the sequential read for the first, fourth, and fifth pages, and the sequential read for the second, third, and sixth pages, for example, may be performed respectively as a sequential read for the three-page data.

(Sequential Read for First, Fourth, and Fifth Pages)

Figure 28:
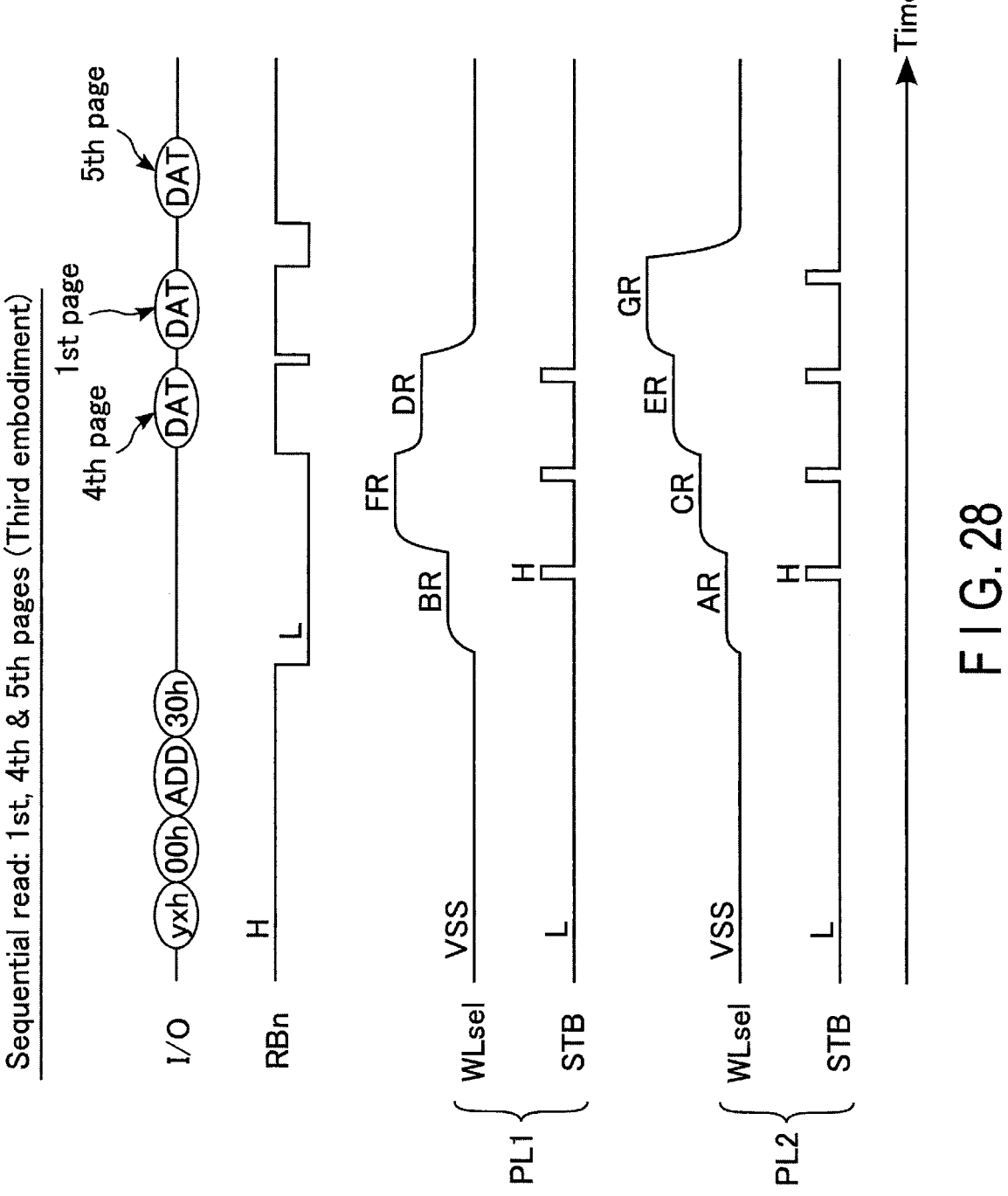
FIG. 28 is a timing chart showing an example of a command sequence, and voltages to be applied to a selected word line in a sequential read for first, fourth, and fifth pages in the semiconductor memory of a third embodiment.

FIG. 28 shows an example of a command sequence, and voltages to be applied to a selected word line WLsel in the sequential read for the first, fourth, and fifth pages in the semiconductor memory 10 of the third embodiment.

As shown in FIG. 28, first, the memory controller 20 sequentially sends, for example, a command "yxh", a command "00h", address information ADD, and a command "30h" to the semiconductor memory 10.

The command "yxh" is a command instructing the performance of the sequential read for the first, fourth, and fifth pages. Upon receipt of the command "30h", the semiconductor memory 10 switches to a busy state from a ready state, and commences the sequential read for the first, fourth, and fifth pages.

In the sequential read for the first, fourth, and fifth pages, the sequencer 14 performs the first plane read to plane PL1, and the second plane read to plane PL2, simultaneously and in parallel.

In the first plane read in the sequential read, the read voltages BR, FR, and DR, for example, are applied in this order to the selected word line WLsel in plane PL1. For example, the read results obtained by using the read voltages BR and FR are retained in the latch circuit ADL in the sense amplifier module 17A, and the read result obtained by using the read voltage DR is retained in the latch circuit BDL in the sense amplifier module 17A.

In the second plane read in the sequential read, the read voltages AR, CR, ER, and GR, for example, are applied to the selected word line WLsel in plane PL2. For example, the read result obtained by using the read voltages AR and CR is retained in the latch circuit ADL in the sense amplifier module 17B, and the read result obtained by using the read voltages ER and GR is retained in the latch circuit BDL in the sense amplifier module 17B.

At the time when the read results obtained by using the read voltages BR and FR are confirmed in the first plane read, and the read results obtained by using the read voltages AR and CR are confirmed in the second plane read, for example, the sequencer 14 causes the sense amplifier module 17 to transfer the relevant data to the latch circuit XDL and changes the semiconductor memory 10 from a busy state to a ready state.

In other words, the sequencer 14 changes the semiconductor memory 10 from a busy state to a ready state at the time when the read result related to the fourth-page data in plane PL1 and plane PL2 is confirmed, and the output of the fourth-page data is ready.

In the sequential read for the first, fourth, and fifth pages, the read results obtained by using the read voltages BR and FR in the first plane read are used when the fourth-page data is output and when the fifth-page data is output. For this reason, when the fourth-page data is output, the read results obtained by using the read voltages BR and FR in plane PL1 are retained in a latch circuit in the sense amplifier module 17A, for example, even after the read results are transferred to the logic circuit 18.

Upon detection of the change to a ready state in the semiconductor memory 10, the memory controller 20 causes the semiconductor memory 10 to output the fourth-page data, in a manner similar to the fourth-page read described in the first embodiment.

At this time, in the semiconductor memory 10, the output of the fourth-page data to the memory controller 20, the first plane read, and the second plane read are processed in parallel. Specifically, while the fourth-page data is being output, for example, a read operation using the read voltage DR is performed in plane PL1, and a read operation using the read voltages ER and GR is performed in plane PL2.

When the sequencer 14 detects the completion of the output of the fourth-page data, for example, the sequencer 14 changes the semiconductor memory 10 from a ready state to a busy state. The sequencer 14 then transfers the data to the latch circuit XDL at the time when the read result obtained by using the read voltage DR is confirmed in the first plane read, and changes the semiconductor memory 10 from a busy state to a ready state.

Upon detection of the change to a ready state in the semiconductor memory 10 after receipt of the fourth-page data, the memory controller 20 causes the semiconductor memory 10 to output the first-page data, in a manner similar to the first-page read described in the first embodiment.

At this time, the semiconductor memory 10 processes the output of the first-page data to the memory controller 20 and the second plane read in parallel. Specifically, while the first-page data is being output for example, a read operation using the read voltage GR is performed in plane PL2.

When the sequencer 14 detects the completion of the output of the first-page data, for example, the sequencer 14 changes the semiconductor memory 10 from a ready state to a busy state. Then, at the time when the read results obtained by using the read voltages ER and GR are confirmed in the second plane read, the sequencer 14 causes the sense amplifier module 17A to transfer the read results obtained by using the read voltages BR and FR to the latch circuit XDL, and causes the sense amplifier module 17B to transfer the read results obtained by using the read voltage ER and GR to the latch circuit XDL. It also changes the semiconductor memory 10 from a busy state to a ready state.

Upon detection of the change to a ready state in the semiconductor memory 10 after receiving the first-page data, the memory controller 20 causes the semiconductor memory 10 to output the fifth-page data, in a manner similar to the fifth-page read described in the first embodiment.

If the first plane read is finished while the semiconductor memory 10 is outputting the fourth-page data to the memory controller 20, the semiconductor memory 10 may remain in a ready state after the output of the fourth-page data, and subsequently output the first-page data. If the second plane read is finished while the semiconductor memory 10 is outputting the first-page data to the memory controller 20, the semiconductor memory 10 may remain in a ready state after the output of the first-page data, and subsequently output the fifth-page data.

(Sequential Read for Second, Third, and Sixth Pages)

Figure 29:
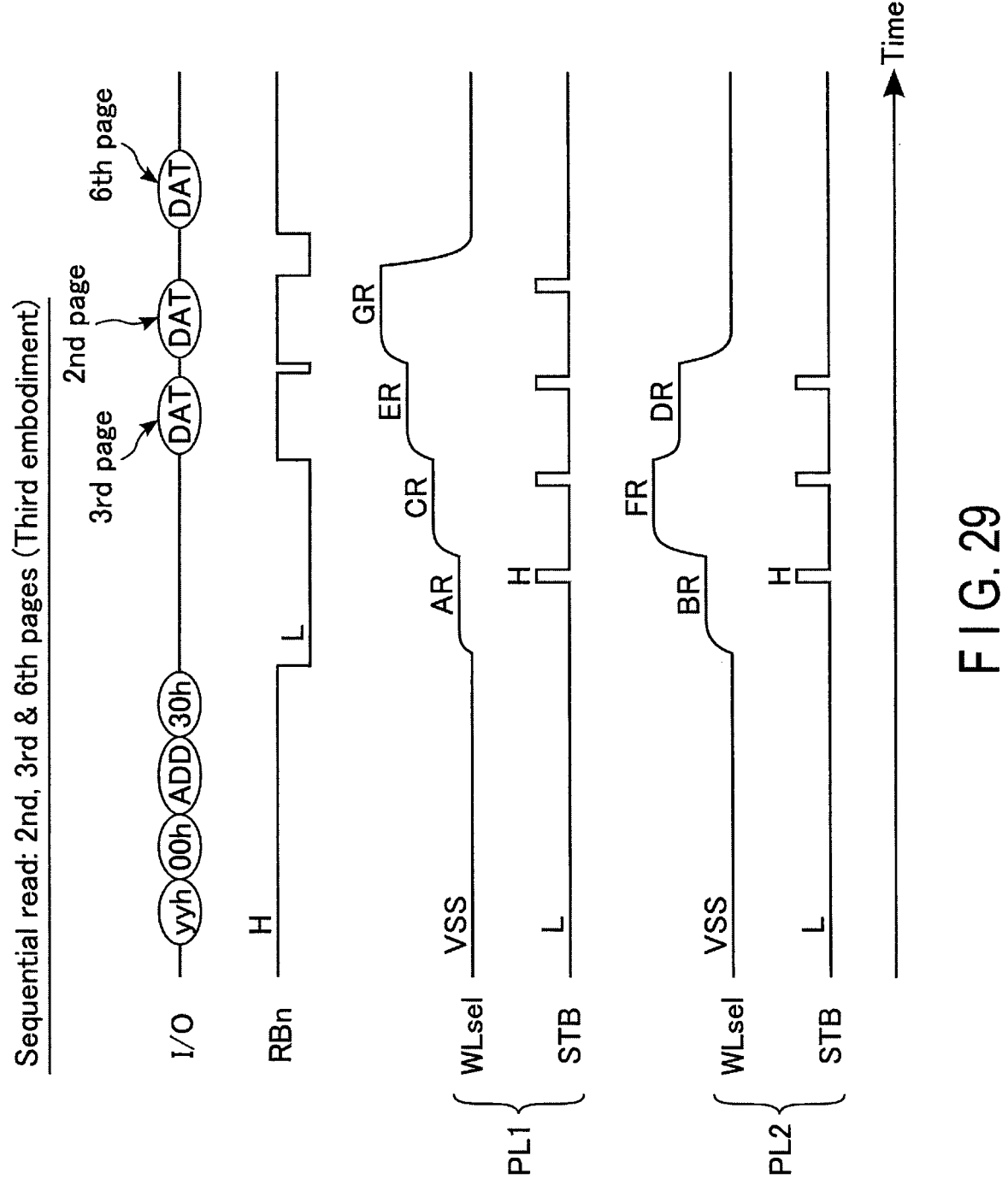
FIG. 29 is a timing chart showing an example of a command sequence, and voltages to be applied to a selected word line in a sequential read for second, third, and sixth pages in the semiconductor memory of the third embodiment.

FIG. 29 shows an example of a command sequence, and voltages to be applied to a selected word line WLsel in the sequential read for the second, third, and sixth pages in the semiconductor memory 10 of the third embodiment.

As shown in FIG. 29, first, the memory controller 20 sequentially sends, for example, a command "yyh", a command "00h", address information ADD, a command "30h" to the semiconductor memory 10.

The command "yyh" is a command instructing the performance of the sequential read for the second, third, and sixth pages. Upon receipt of the command "30h", the semiconductor memory 10 switches from a ready state to a busy state, and commences the sequential read for the second, third, and sixth pages.

In the sequential read for the second, third, and sixth pages, the sequencer 14 performs the first plane read to plane PL1 and the second plane read to plane PL2 simultaneously and in parallel.

In the first plane read in the sequential read, the read voltages AR, CR, ER, and GR, for example, are applied in this order to the selected word line WLsel in plane PL1. For example, the read result obtained by using the read voltages AR and CR is retained in the latch circuit ADL in the sense amplifier module 17A, and the read results obtained by using the read voltages ER and GR are retained in the latch circuit BDL in the sense amplifier module 17A.

In the second plane read in the sequential read, the read voltages BR, FR, and DR, for example, are applied in this order to the selected word line WLsel in plane PL2. For example, the read results obtained by using the read voltages BR and FR are retained in the latch circuit ADL in the sense amplifier module 17B, and the read result obtained by using the read voltage DR is retained in the latch circuit BDL in the sense amplifier module 17B.

For example, at the time when the read results obtained by using the read voltages AR and CR are confirmed in the first plane read, and the read results obtained by using the read voltages BR and FR are confirmed in the second plane read, the sequencer 14 causes the sense amplifier module 17 to transfer the data to the latch circuit XDL, and changes the semiconductor memory 10 from a busy state to a ready state.

In other words, the sequencer 14 changes the semiconductor memory 10 from a busy state to a ready state at the time when the read result related to the third-page data in plane PL1 and plane PL2 is confirmed, and the output of the third-page data is ready.

In the sequential read for the second, third, and sixth pages, the read results obtained by using the read voltages BR and FR in the second plane read are used when the third-page data is output and when the sixth-page data is output. For this reason, when the third-page data is output, the read results obtained by using the read voltages BR and FR in plane PL2 are retained in a latch circuit in the sense amplifier module 17B, for example, even after the read results are transferred to the logic circuit 18.

Upon detection of the change to a ready state in the semiconductor memory 10, the memory controller 20 causes the semiconductor memory 10 to output the third-page data, in a manner similar to the third-page read of the first embodiment.

At this time, in the semiconductor memory 10, the output of the third-page data to the memory controller 20, the first plane read, and the second plane read are processed in parallel. Specifically, while the third-page data is being output for example, a read operation using the read voltages ER and GR is performed in plane PL1, and a read operation using the read voltage DR is performed in plane PL2.

When the sequencer 14 detects the completion of the output of the third-page data, the sequencer 14 changes the semiconductor memory 10 from a ready state to a busy state. Then, at the time when the read result obtained by using the read voltage DR is confirmed in the second plane read, the sequencer 14 causes the sense amplifier module 17 to transfer the data to the latch circuit XDL, and changes the semiconductor memory 10 from a busy state to a ready state.

Upon detection of the change to a ready state in the semiconductor memory 10 after receipt of the third-page data, the memory controller 20 causes the semiconductor memory 10 to output the second-page data, in a manner similar to the second-page read of the first embodiment.

At this time, the semiconductor memory 10 processes the output of the second-page data to the memory controller 20 and the first plane read in parallel. Specifically, while the second-page data is being output for example, a read operation using the read voltage GR is performed in plane PL1.

When the sequencer 14 detects the completion of the output of the first-page data, for example, the sequencer 14 changes the semiconductor memory 10 from a ready state to a busy state. Then, at the time when the read results obtained by using the read voltages ER and GR are confirmed in the second plane read, the sequencer 14 causes the sense amplifier module 17A to transfer the read results obtained by using the read voltages ER and GR to the latch circuit XDL and the sense amplifier module 17B to transfer the read results obtained by using the read voltages BR and FR to the latch circuit XDL, and changes the semiconductor memory 10 from a busy state to a ready state.

Upon detection of the change to a ready state in the semiconductor memory 10 after receipt of the second-page data, the memory controller 20 causes the semiconductor memory 10 to output the sixth-page data, in a manner similar to the sixth-page read of the first embodiment.

If the second plane read is finished while the semiconductor memory 10 is outputting the third-page data to the memory controller 20, the semiconductor memory 10 may remain in a ready state after the output of the third-page data, and subsequently output the second-page data. If the first plane read is finished while the semiconductor memory 10 is outputting the second-page data to the memory controller 20, the semiconductor memory 10 may remain in a ready state after the output of the second-page data, and subsequently output the sixth-page data.

[3-2] Advantageous Effects of Third Embodiment

The semiconductor memory 10 of the third embodiment can perform a sequential read for third-page data, as described above. The semiconductor memory 10 of the third embodiment can achieve advantageous effects as will be described below.

In the sequential read for the three-page data according to the third embodiment, a first page in which data is confirmed by a single read operation in plane PL1, and second and sixth pages in which the same read result is used in plane PL1, are combined. Similarly, a second page in which data is confirmed by a single read operation in plane PL2, and third and fourth pages in which the same read result is used in plane PL2, are combined.

In each of the sequential read for the first, third, and sixth pages and the sequential read for the second, fourth, and fifth pages, the semiconductor memory 10 of the third embodiment can thus omit a read operation for which redundant read voltages are used. Thus, the sequential read for three-page data in the semiconductor memory 10 of the third embodiment can reduce power consumption, similarly to the second embodiment.

In the sequential read for the three-page data in the third embodiment, it is possible to process a read operation on different pages in plane PL1 and plane PL2 in parallel courtesy of omitting redundant read operations.

Specifically, in the sequential read for the first, third, and sixth pages, the read operation in plane PL2 corresponding to the second page, and the read operation in plane PL1 corresponding to the sixth page, can be processed in parallel. As a result, it is possible to enhance the speed of a read operation of the sequential read for three-page data in the semiconductor memory 10 of the third embodiment.

In the third embodiment, the sequential read for three-page data is performed respectively for a set of the first, third, and sixth pages and a set of the second, fourth, and fifth pages; however, the embodiment is not limited to this example. The combination of pages in the sequential read for three-page data may be set as appropriate.

In the above-described third embodiment, the semiconductor memory 10 may first read data of the fourth or third page, then read data of the first or second page, and lastly read data of the fifth or sixth page.

The embodiment is not limited to this example; the semiconductor memory 10 may first read data of the fifth or sixth page, then read data of the first or second page, and lastly read data of the fourth or third page.

In this case, in the sequential read for the first, fourth, and fifth pages, the read process in plane PL1 is performed using the read voltages BR, FR, and DR in this order, similarly to the third embodiment, and the read process in plane PL2 is performed using the read voltages ER, GR, AR, and CR, in this order.

In the sequential read for the second, third, and sixth pages, the read process in plane PL1 is performed using the read voltages BR, FR, and DR in this order, similarly to the third embodiment, and the read process in plane PL2 is performed using the read voltages ER, GR, AR, and CR in this order.

Hereinafter, such a method of the sequential read for three-page data will be referred to as "a modification of the third embodiment". The sequential data for the three-page data in the modification of the third embodiment can deliver advantageous effects similar to those in the third embodiment.

[4] Fourth Embodiment

The configuration of the semiconductor memory 10 of the fourth embodiment is similar to that of the semiconductor memory 10 of the first embodiment. The fourth embodiment is a modification of the sequential read process for three-page data, which is described in the third embodiment. In the following, differences of the semiconductor memory 10 between the fourth embodiment and first to third embodiments will be described.

[4-1] Read Operation (Sequential Read for First, Fourth, and Fifth Pages)

FIG. 30 shows an example of a command sequence, and voltages to be applied to a selected word line WLsel in the sequential read for the first, fourth, and fifth pages in the semiconductor memory 10 of the fourth embodiment.

As shown in FIG. 30, first, the memory controller 20 sequentially sends, for example, a command "zxh", a command "00h", address information ADD, and a command "30h" to the semiconductor memory 10.

The command "zxh" is a command instructing the performance of the sequential read for the first, fourth, and fifth pages. Upon receipt of the command "30h", the semiconductor memory 10 switches from a ready state to a busy state, and commences the sequential read for the first, fourth, and fifth pages.

In the sequential read for the first, fourth, and fifth pages, the sequencer 14 performs the first plane read to plane PL1 and the second plane read to plane PL2 simultaneously and in parallel.

In the first plane read in the sequential read, the read voltages DR, BR, and FR, for example, are applied in this order to the selected word line WLsel in plane PL1. For example, the read results obtained by using the read voltage DR are retained in the latch circuit ADL in the sense amplifier module 17A, and the read results obtained by using the read voltages BR and FR are retained in the latch circuit BDL in the sense amplifier module 17A.

In the second plane read in the sequential read, the read voltages AR, CR, ER, and GR, for example, are applied in this order to the selected word line WLsel in plane PL2. For example, the read results obtained by using the read voltages AR and CR are retained in the latch circuit ADL in the sense amplifier module 17B, and the read results obtained by using the read voltages ER and GR are retained in the latch circuit BDL in the sense amplifier module 17B.

At the time when the read result obtained by using the read voltage DR is confirmed in the first plane read, for example, the sequencer 14 causes the sense amplifier module 17 to transfer the data to the latch circuit XDL, and changes the semiconductor memory 10 from a busy state to a ready state.

In other words, the sequencer 14 changes the semiconductor memory 10 from a busy state to a ready state at the time when the read result related to the first-page data in plane PL1 is confirmed, and the output of the first-page data is ready.

Upon detection of the change to a ready state in the semiconductor memory 10, the memory controller 20 causes the semiconductor memory 10 to output the first-page data, in a manner similar to the first-page read of the first embodiment.

At this time, in the semiconductor memory 10, the output of the first-page data to the memory controller 20, the first plane read, and the second plane read are processed in parallel. Specifically, while the first page data is being output, for example, a read operation using the read voltages BR and FR is performed in plane PL1, and a read operation using the read voltages CR, ER, and GR is performed in plane PL2.

When the sequencer 14 detects the completion of the output of the first-page data, for example, the sequencer 14 changes the semiconductor memory 10 from a ready state to a busy state. Then, at the time when the read results of the read voltages BR and FR are confirmed in the first plane read, the sequencer 14 causes the sense amplifier module 17A to transfer the read result of the read voltage BR and FR to the latch circuit XDL, and the sense amplifier module 17B to transfer the read result of the read voltages AR and CR to the latch circuit XDL, and changes the semiconductor memory 10 from a busy state to a ready state.

Upon detection of the change to a ready state in the semiconductor memory 10 after receipt of the first-page data, the memory controller 20 causes the semiconductor memory 10 to output the fourth-page data, in a manner similar to the fourth-page read described in the first embodiment.

At this time, the semiconductor memory 10 processes the output of the fourth-page data to the memory controller 20 and the second plane read in parallel. Specifically, while the fourth-page data is being output for example, a read operation using the read voltage GR is performed in plane PL2.

When the sequencer 14 detects the completion of the output of the fourth-page data, for example, the sequencer 14 changes the semiconductor memory 10 from a ready state to a busy state. Then, at the time when the read results obtained by using the read voltages ER and GR are confirmed in the second plane read, for example, the sequencer 14 causes the sense amplifier module 17A to transfer the read results obtained by using the read voltages BR and FR to the latch circuit XDL, and the sense amplifier module 17B to transfer the read results obtained by using the read voltage ER and GR to the latch circuit XDL, and changes the semiconductor memory 10 from a busy state to a ready state.

Upon detection of the change to a ready state in the semiconductor memory 10 after receipt of the fourth-page data, the memory controller 20 causes the semiconductor memory 10 to output the fifth-page data, in a manner similar to the fifth-page read described in the first embodiment.

If the first plane read is finished while the semiconductor memory 10 is outputting the first-page data to the memory controller 20, the semiconductor memory 10 may remain in a ready state after the output of the first-page data, and subsequently output the fourth-page data. If the second plane read is finished while the semiconductor memory 10 is outputting the fourth-page data to the memory controller 20, the semiconductor memory 10 may remain in a ready state after the output of the fourth-page data, and subsequently output the fifth-page data.

(Sequential Read for Second, Third, and Sixth Pages)

FIG. 31 shows an example of a command sequence, and voltages to be applied to a selected word line WLsel in the sequential read for the second, third, and sixth pages in the semiconductor memory 10 of the fourth embodiment.

As shown in FIG. 31, first, the memory controller 20 sequentially sends, for example, a command "zyh", a command "00h", address information ADD, and a command "30h" to the semiconductor memory 10.

The command "zyh" is a command instructing the performance of a sequential read for the second, third, and sixth pages. Upon receipt of the command "30h", the semiconductor memory 10 switches from a ready state to a busy state, and commences the sequential read for the second, third, and sixth pages.

In the sequential read for the second, third, and sixth pages, the sequencer 14 performs the first plane read to plane PL1 and the second plane read to plane PL2 simultaneously and in parallel.

In the first plane read in the sequential read, the read voltages AR, CR, ER, and GR, for example, are applied in this order to the selected word line WLsel in plane PL1. For example, the read results obtained by using the read voltages AR and CR are retained in the latch circuit ADL in the sense amplifier module 17A, and the read results obtained by using the read voltages ER and GR are retained in the latch circuit BDL in the sense amplifier module 17A.

In the second plane read in the sequential read, the read voltages DR, BR, and FR, for example, are applied in this order to the selected word line WLsel in plane PL2. For example, the read result obtained by using the read voltage DR is retained in the latch circuit ADL in the sense amplifier module 17B, and the read results obtained by using the read voltages BR and FR are retained in the latch circuit BDL in the sense amplifier module 17B.

At the time when the read result obtained by using the read voltage DR is confirmed in the second plane read, for example, the sequencer 14 causes the sense amplifier module 17 to transfer the data to the latch circuit XDL, and changes the semiconductor memory 10 from a busy state to a ready state.

In other words, the sequencer 14 changes the semiconductor memory 10 from a busy state to a ready state at the time when the read result related to the second-page data in plane PL2 is confirmed, and the output of the second-page data is ready.

Upon detection of the change to a ready state in the semiconductor memory 10, the memory controller 20 causes the semiconductor memory 10 to output the second-page data, in a manner similar to the second-page read described in the first embodiment.

At this time, in the semiconductor memory 10, the output of the second-page data to the memory controller 20, the first plane read, and the second plane read are processed in parallel. Specifically, while the second-page data is being output for example, a read operation using the read voltages CR, ER, and GR is performed in plane PL1, and a read operation using the read voltages BR and FR is performed in plane PL2.

When the sequencer 14 detects the completion of the output of the second-page data, for example, the sequencer 14 changes the semiconductor memory 10 from a ready state to a busy state. Then, at the time when the read results of the read voltages BR and FR are confirmed in the second plane read, the sequencer 14 causes the sense amplifier module 17A to transfer the read results obtained by using the read voltage AR and CR to the latch circuit XDL, and the sense amplifier module 17B to cause the read results obtained by using the read voltages BR and FR to the latch circuit XDL, and changes the semiconductor memory 10 from a busy state to a ready state.

Upon detection of the change to a ready state in the semiconductor memory 10 after receiving the second-page data, the memory controller 20 causes the semiconductor memory 10 to output the third-page data from the semiconductor memory 10, in a manner similar to the third-page read of the first embodiment.

At this time, the semiconductor memory 10 processes the output of the third-page data to the memory controller 20 and the first plane read in parallel. Specifically, while the third-page data is being output for example, a read operation using the read voltage GR is performed in plane PL1.

When the sequencer 14 detects the completion of the output of the third-page data, the sequencer 14 changes the semiconductor memory 10 from a ready state to a busy state. Then, at the time when the read results of the read voltages ER and GR are confirmed in the first plane read, the sequencer 14 causes the sense amplifier module 17A to transfer the read results obtained by using the read voltage ER and GR to the latch circuit XDL, and the sense amplifier module 17B to transfer the read results obtained by using the read voltages BR and FR to the latch circuit XDL, and changes the semiconductor memory 10 from a busy state to a ready state.

Upon detection of the change to a ready state in the semiconductor memory 10 after receipt of the fourth-page data, the memory controller 20 causes the semiconductor memory 10 to output the sixth-page data, in a manner similar to the sixth-page read described in the first embodiment.

If the second plane read is finished while the semiconductor memory 10 is outputting the second-page data to the memory controller 20, the semiconductor memory 10 may remain in a ready state after the output of the second-page data, and subsequently output the third-page data. If the first plane read is finished while the semiconductor memory 10 is outputting the third-page data to the memory controller 20, the semiconductor memory 10 remains in a ready state after the output of the third-page data, and subsequently outputs the six-page data

[4-2] Advantageous Effects of Fourth Embodiment

The order of pages to be output differs between the sequential read for the three-page data in the fourth embodiment and the sequential read for the three-page data in the third embodiment.

Even in such a case, with the semiconductor memory 10 of the fourth embodiment, it is possible to perform the sequential read of the third-page data, and deliver advantageous effects similar to those of the third embodiment, and similarly to those of the semiconductor memory 10 of the third embodiment

[5] Fifth Embodiment

The configuration of the semiconductor system 1 of the fifth embodiment is similar to that of the semiconductor system 1 of the first embodiment. In the memory system 1 of the fifth embodiment, in the sequential read for three-page data, the method in the third embodiment, the method in the modification of the third embodiment, and the method in the fourth embodiment are used properly. In the following, differences between the semiconductor system 1 of the fifth embodiment and that of the first to fourth embodiments will be described.

[5-1] Read Operation

FIG. 32 shows an example of a method of selecting a sequential read process in the semiconductor system 1 of the fifth embodiment.

As shown in FIG. 32, in the memory system 1 of the fifth embodiment, an operation to be performed in the sequential read for three-page data is selected in accordance with whether or not priorities are set for the order of outputting data.

Specifically, the memory controller 20, for example, checks if the priority of the first page or the second page is set to "high" in the data requested by an external host device (step S10).

If the priority of the first page or the second page is set to "high", the memory controller 20 instructs the semiconductor memory 10 to perform the sequential read of the fourth embodiment (step S11).

If the priority of the first page or the second page is not set to "high", the memory controller 20 checks if the priority of the third page or the fourth page is set to "high" in the data requested by the external host device (step S12).

If the priority of the third page or the fourth page is set to "high", the memory controller 20 instructs the semiconductor memory 10 to perform the sequential read of the third embodiment (step S13).

If the priority of the third page or the fourth page is not set to "high", the memory controller 20 instructs the semiconductor memory 10 to perform the sequential read of the modification of the third embodiment (step S14).

As described above, if the method in the third embodiment, the method in the modification of the third embodiment, and the method in the fourth embodiment are used properly, the order of data output in the sequential read for three-page data differs depending on the priority in the order of data outputting.

For example, if the sequential read in step S13 is performed in the sequential read for the first, fourth, and fifth pages, the data of the fourth page, the first page, and the fifth page is sequentially output in this order. On the other hand, when the sequential read in step S11 is performed, the data of the first page, the fourth page, and the fifth page is sequentially output in this order.

[5-2] Advantageous Effects of Fifth Embodiment

As described above, in the sequential read for three-page data, the memory system 1 of the fifth embodiment can alter the order of read in accordance with priorities. The memory system 1 of the fifth embodiment can thereby improve latency.

[6] Sixth Embodiment

The configuration of the semiconductor memory 10 of the sixth embodiment is similar to that of the semiconductor memory 10 of the first embodiment. The semiconductor memory 10 of the sixth embodiment performs the sixth-page data write, which is described in the first embodiment, in two stages. In the following, differences between the semiconductor memory 10 of the sixth embodiment and that of the first to fifth embodiments will be described.

[6-1] Configuration

[6-1-1] Threshold Distributions of Memory Cell Transistor MT

The semiconductor memory 10 of the sixth embodiment performs a rough write operation (the first stage write) to form two threshold distributions before forming the eight threshold distributions explained in the first embodiment with reference to FIG. 8. Thereafter, the semiconductor memory 10 of the sixth embodiment performs a precise write operation (the second stage write) for the memory cell transistors MT in which data has been roughly written, and thereby forms the eight threshold distributions.

FIG. 33 shows an example of threshold distributions of the memory cell transistors MT, read voltages, and verify voltages in the semiconductor memory 10 of the sixth embodiment. In FIG. 33, (a) shows the threshold distributions of the memory cell transistors MT before the write (in other words, in an erase state); (b) shows the threshold distributions of the memory cell transistors MT after the first stage write is performed; and (c) shows the threshold distributions of the memory cell transistors MT after the second stage write is performed.

The semiconductor memory 10 of the sixth embodiment performs the first stage write to form the "Z"- and "LM"-state threshold distributions as shown in (b) of FIG. 33 from the "Z"-state threshold distribution shown in (a) of FIG. 33.

Thereafter, the semiconductor memory 10 of the sixth embodiment performs the second stage write process to form the "Z"-, "A"-, "B"-, and "C"-state threshold distributions as shown in (c) of FIG. 33 from the "Z"-state threshold distribution as shown in (b) of FIG. 33, and to form the "D"-, "E"-, "F"-, and "G"-state threshold distributions as shown in (c) of FIG. 33 from the "LM"-state threshold distribution as shown in (b) of FIG. 33.

The memory cell transistors MT included in the "LM"-state have threshold voltages higher than the "A" state and lower than the "D" state, for example. Specifically, the threshold voltages of the memory cell transistors MT included in the "LM"-state threshold distribution are set between a minimum threshold voltage in the "A"-state threshold distribution and a maximum threshold voltage in the "D"-state threshold distribution.

Then, a read voltage LMR is set between the "Z" state and the "LM" state, and a verify voltage LMV is set in accordance with the "LM" state. Specifically, the read voltage LMR is set between a maximum threshold voltage in the "Z" state and a minimum threshold voltage in the "LM" state.

The verify voltage LMV is set between a maximum threshold voltage in the "Z" state and a minimum threshold voltage in the "LM" state, and in the vicinity of the "E" state. The read pass voltage VREAD after the first stage write and before the second stage write is set higher than the maximum threshold voltage in the "LM" state.

The threshold voltages of the memory-cell transistors MT included in the "LM" state may be changed as appropriate based on a data allocation used for storing 6-bit data. Thus, the threshold distribution of the "LM" state is set based on the lowest read voltage among the read voltages used in the first page read and the second page read.

[6-1-2] Data Allocation

FIG. 34 shows an example of data allocation for the first stage write in the sixth embodiment.

As shown in FIG. 34, in the first stage write according to the sixth embodiment, four combinations are possible by combining two threshold voltages in the memory cell transistors MT in plane PL1 with two threshold voltages in the memory cell transistors MT in plane PL2. Furthermore, in the sixth embodiment, 2-bit data is allocated to each of the four combinations, as shown below:

(Example) "Threshold voltage of memory cell transistors MT in plane PL1", "threshold voltage of memory cell transistors MT in plane PL2": "first bit/second bit" data (1) "Z" state, "Z" state: "11" data (2) "Z" state, "LM" state: "10" data (3) "LM" state, "Z" state: "01" data (4) "LM" state, "LM" state: "00" data Since the data allocation for the second stage write in the sixth embodiment is the same as the data allocation described in the first embodiment with reference to FIGS. 9 and 10, descriptions thereof are omitted.

[6-2] Write Operation (First Stage of Write)

FIG. 35 shows an example of a command sequence, and voltages to be applied to a selected word line WLsel in the first stage write in the semiconductor memory 10 according to the sixth embodiment. In the first stage write in the sixth embodiment, the write operations to the first page and the second page are performed in a batch, for example.

Specifically, as shown in FIG. 35, first, the memory controller 20 sequentially sends a command set CS1 and a command set CS2 to the semiconductor memory 10. The command sets CS1 and CS2 include commands for instructing an operation for the first and second pages respectively, and include write data DAT to be written in the first and second pages respectively.

After receiving the command set CS1, the semiconductor memory 10 temporarily switches to a busy state, and transfers the received write data DAT to each of the latch circuits within the sense amplifier modules 17A and 17B.

The semiconductor memory 10 switches to a busy state after receiving the command set CS2, and performs the first stage write based on the write data of the first and second pages retained in each of the latch circuits within the sense amplifier modules 17A and 17B.

In the first stage write, the sequencer 14 performs first plane write to plane PL1 and second plane write to plane PL2 based on the write data of the first and second pages.

In each of the first plane write and the second plane write, write-targeted memory cell transistors MT and write-inhibited memory cell transistors MT are set based on the data allocation shown in FIG. 34, and a program loop is performed.

In this example, since an "LM"-state write is performed in each of the first plane write and the second plane write, the verify voltage LMV is applied to a selected word line WLsel in the verify operation in each program loop.

Since the details of each of the first plane write operation and the second plane write operation in the first stage write are the same as those of the first plane write described with reference to FIG. 11 in the first embodiment, descriptions thereof are omitted. When each of the first plane write and the second plane write is completed, the sequencer 14 finishes the write operation, and changes the semiconductor memory 10 from a busy state to a ready state.

In a cell unit CU in which the first plane write or the second plane write has been performed, the threshold distributions of the memory cell transistors MT as shown in FIG. 33 (*b*), based on the write data for two pages and the data allocation which was described with reference to FIG. 34.

An initial value of the program voltage VPGM used in the first stage write may be set higher than an initial value of the program value VPGM used in the second stage write, which will be described later. A step-up width of the program voltage VPGM in the first state of the write may be set wider than a step-up width of the program voltage VPGM in the second stage write.

In FIG. 35, the semiconductor memory 10 temporarily switches to a busy state after receiving the command set CS1; however, the embodiment is not limited to this example. For example, the semiconductor memory 10 may commence the first stage write after the first and second page data is input, without temporarily changing to a busy state after receiving the command set CS1.

(Second Stage of Write)

FIG. 36 shows an example of a command sequence, and voltages to be applied to a selected word line WLsel in the second stage write in the semiconductor memory 10 according to the sixth embodiment. In the second stage write in the sixth embodiment, the write operations for the third through sixth pages, for example, are performed in a batch.

Specifically, as shown in FIG. 36, first, the memory controller 20 sequentially sends command sets CS3 through CS6 to the semiconductor memory 10. The command sets CS3 through CS6 include commands for instructing an operation for the third to sixth pages respectively, and include write data DAT to be written in the third to sixth pages respectively.

The semiconductor memory 10 temporarily switches to a busy state every time when a command set CS is received for example, and transfers the write data to the latch circuit of each sense amplifier unit SAU in each of the sense amplifier modules 17A and 17B. The write data corresponding to the third through fifth bits are respectively retained in the corresponding circuit within each sense amplifier unit SAU.

Next, the memory controller 20 sends a command set CS6 to the semiconductor memory 10. The command set CS6 includes a command for instructing a write operation, an address of a cell unit CU to which data is written, and write data corresponding to a sixth bit (sixth-page data). The sixth-page data received by the semiconductor memory 10 is retained in any of the latch circuits of the sense amplifier modules 17A and 17B.

The semiconductor memory 10 temporarily switches to a busy state after receiving the command set CS6. Then, the sequencer 14 performs internal data load (IDL) to each of plane PL1 and plane PL2 simultaneously and in parallel. The IDL is a read operation for restoring data, which has already been written in a selected cell unit CU, in a latch circuit in a corresponding sense amplifier unit SAU.

For example, in the IDL to plane PL1, a read operation using the read voltage LMR or AR is performed, and a read result corresponding to the write data for the first page is restored in, for example, the latch circuits of the sense amplifier units SAU in the sense amplifier module 17A. The restored data for the first page is copied to the latch circuits of the sense amplifier units SAU in the sense amplifier module 17B.

In the IDL to plane PL2, a read operation using the read voltage LMR or AR is performed, and a read result corresponding to the write data for the second page is restored in, for example, the latch circuit of the sense amplifier units SAU in the sense amplifier module 17B. The restored write data of the second page is copied to the latch circuits of the sense amplifier units SAU in the sense amplifier module 17A.

When the IDL to plane PL1 and the IDL to plane PL2 are finished, the first-to-sixth page data is retained in the sense amplifier units SAU in the sense amplifier module 17A and the sense amplifier units SAU in the sense amplifier module 17B, respectively.

The sequencer 14 then performs the first plane write to plane PL1 and the second plane write to plane PL2 simultaneously and in parallel. Since the details of each of the first plane write and the second plane write are the same as those of the first plane write described in the first embodiment, descriptions thereof are omitted.

In a cell unit CU in which first plane write or second plane write has been performed as described above, similarly to the first embodiment, the threshold distributions of the memory cell transistors MT are formed as described above with reference to FIG. 8, based on the write data for six pages and the data allocation which was described with reference to FIGS. 9 and 10.

In the foregoing description, six latch circuits are provided in each sense amplifier unit SAU in the write operation in the semiconductor memory 10 of the sixth embodiment; however, the number of the latch circuits can be reduced.

In the following, with respect to a case where four latch circuits (latch circuits ADL, BDL, CDL, and XDL) are provided, an example of the operation performed by the sequencer 14 when command sets CS1 and CS2, and command sets CS3 through CS6 shown in FIGS. 35 and 36 are sent to the semiconductor memory 10 by the memory controller 20 will be described with reference to FIGS. 36 and 37. FIG. 37 is a flowchart showing an example of an operation performed by the sequencer 14 during a write operation in the semiconductor memory device 10 according to the first embodiment. Since the operation performed by the sequencer 14 in the first stage write in this example is the same as the operation described with reference to FIG. 35, descriptions thereof are omitted.

As shown in FIG. 36, the memory controller 20 first sends a command set CS3 to the semiconductor memory 10. The command set CS3 includes commands for instructing an operation for the third page, and includes write data DAT corresponding to the third page. The third-page data received by the semiconductor memory 10 is retained in the latch circuit XDL of the sense amplifier unit SAU of each of the sense amplifier modules 17A and 17B (FIG. 37, (1)).

After receiving the command set CS3, the semiconductor memory 10 temporarily switches to a busy state, for example. Then, the sequencer 14 causes the sense amplifier module 17A to transfer the third-page data retained in the latch circuit XDL to, for example, the latch circuit CDL. Then, the sequencer 14 causes the sense amplifier module 17B to transfer the third-page data retained in the latch circuit XDL to, for example, the latch circuit SDL (FIG. 37, (2)).

Next, the memory controller 20 sends a command set CS4 to the semiconductor memory 10. The command set CS4 includes commands for instructing an operation for the fourth page, and includes write data DAT corresponding to the fourth page. The fourth-page data received by the semiconductor memory 10 is retained in the latch circuit XDL of the sense amplifier unit SAU of each of the sense amplifier modules 17A and 17B (FIG. 37, (3)).

After receiving the command set CS4, the semiconductor memory 10 temporarily switches to a busy state, for example. The sequencer 14 causes the sense amplifier module 17A to transfer data, to the latch circuit CDL for example, "~(XDL^CDL)" obtained by performing an XNOR operation on the data retained in the latch circuit XDL and the data retained in the latch circuit CDL. Then, the sequencer 14 causes the sense amplifier module 17B to transfer the fourth-page data retained in the latch circuit XDL to, for example, the latch circuit BDL (FIG. 37, (4)).

Next, the memory controller 20 sends a command set CS5 to the semiconductor memory 10. The command set CS5 includes commands for instructing an operation for the fifth page, and includes write data DAT corresponding to the fifth page. The fifth-page data received by the semiconductor memory 10 is retained in the latch circuit XDL of the sense amplifier unit SAU of each of the sense amplifier modules 17A and 17B (FIG. 37, (5)).

After receiving the command set CS5, the semiconductor memory 10 temporarily switches to a busy state, for example. Then, the sequencer 14 causes the sense amplifier module 17A to transfer the fifth-page data retained in the latch circuit XDL to, for example, the latch circuit SDL. Then, the sequencer 14 causes the sense amplifier module 17B to transfer the fifth-page data retained in the latch circuit XDL to, for example, the latch circuit CDL (FIG. 37, (6)).

Next, the memory controller 20 sends a command set CS6 to the semiconductor memory 10. The command set CS6 includes commands for instructing an operation for the sixth page, and includes write data DAT corresponding to the sixth page. The sixth-page data received by the semiconductor memory 10 is retained in the latch circuit XDL of the sense amplifier unit SAU of each of the sense amplifier modules 17A and 17B (FIG. 37, (7)).

After receiving the command set CS6, the semiconductor memory 10 temporarily switches to a busy state, for example. Then, the sequencer 14 causes the sense amplifier module 17A to transfer the sixth-page data retained in the latch circuit XDL to, for example, the latch circuit BDL. The sequencer 14 causes the sense amplifier module 17B to transfer data, to the latch circuit CDL for example, "~(XDL^CDL)" obtained by performing an XNOR operation on the data retained in the latch circuit XDL and the data retained in the latch circuit CDL (FIG. 37, (8)).

After receiving the command set CS6, the semiconductor memory 10 temporarily switches to a busy state, for example. Then, the sequencer 14 performs IDL (internal data load) to each of plane PL1 and plane PL2 simultaneously and in parallel (FIG. 37, (9)).

For example, in the IDL to plane PL1, a read operation using the read voltage LMR or AR is performed, and a read result corresponding to the write data for the first page is restored in, for example, a latch circuit ADL in the sense amplifier module 17A. The restored write data for the first page is copied to the latch circuit XDL of the sense amplifier module 17B. In the IDL to plane PL2, a read operation using the read voltage LMR or AR is performed, and a read result corresponding to the write data for the second page is restored in, for example, the latch circuit ADL of the sense amplifier module 17B. The restored write data of the second page is copied to the latch circuit XDL of the sense amplifier module 17A (FIGS. 37, (10) and (11)).

The sequencer 14 then causes the sense amplifier modules 17A and 17B to transfer, to the latch circuit SDL for example, data "SDL&~XDL", to which an AND operation is performed on the data retained in the latch circuit SDL and the data obtained by inverting the data retained in the latch circuit XDL. Subsequently, the sequencer 14 causes the sense amplifier modules 17A and 17B to transfer, to the latch circuit BDL for example, data "BDL&XDL|SDL", to which an OR operation is performed on the data obtained by an AND operation to the data retained in the latch circuits BDL and XDL, and the data retained in the latch circuit SDL (FIG. 37, (12)).

Then the sequencer 14 performs the second stage write based on the data respectively retained in the latch circuits ADL, BDL, and CDL in each of the sense amplifier modules 17A and 17B. The data retained in the latch circuits ADL, BDL, and CDL corresponding to each threshold voltage of the memory cell transistor MT in the example shown in FIG. 37 is the same as the data described with reference to FIG. 17 in the first embodiment.

In FIG. 36, the semiconductor memory 10 temporarily switches to a busy state after receiving command sets CS3, CS4, and CS5; however, the embodiment is not limited to this example. For example, the semiconductor memory 10 may commence the second stage write after the third, fourth, fifth, and sixth page data is input, without temporarily switching to a busy state after receiving the command sets CS3, CS4, and CS5.

(Order of Writing)

FIG. 38 is a flowchart showing an example of an order of write in a write operation in the semiconductor memory device 10 according to the sixth embodiment. In the following explanation, variables "i" and "j" will be used for the sake of brevity. The variables "i" and "j" are retained in a counter of the memory counter 20, for example, and are incremented by the control of the memory controller 20.

As shown in FIG. 38, first, the memory controller 20 instructs the semiconductor memory 10 to perform the first stage write on a selected word line WLi (i=0) in selected string units SU0 through SU3 in order (step S20).

When the first stage write in step S20 is finished, the variable "i" is incremented, and the variable "j" is reset (j=0) (step S21). Then, the memory controller 20 instructs the semiconductor memory 10 to perform the first stage write on the selected word line WLi in the selected string unit SUj (step S22). For example, the semiconductor memory 10 performs the first stage write in which word line WL1 is selected and string unit SU0 is selected.

Next, the memory controller 20 instructs the semiconductor memory 10 to perform the second stage write on a selected word line WL(i−1) in selected string unit SUj (step S23). For example, the semiconductor memory 10 performs the second stage write in which word line WL0 is selected and string unit SU0 is selected.

If j=3 does not hold true at the time when the second stage write in step S23 is finished (No in step S24), the variable j is incremented (step S25), and the operation in step S22 and thereafter is repeated. If j=3 (Yes, step S24), the value of the variable i is checked (step S26).

If I=7 does not hold true (No in step S26), the process returns to step S21, and after the variable i is incremented and the variable j is reset, the operation in step S22 and thereafter is repeated. If i=7 (Yes in step S26), the memory controller 20 instructs the semiconductor memory 10 to perform the second stage write in which word line WLi (i=7) is selected and string units SU0 through SU3 are selected in order (step S27).

Thus, after the first stage write is performed for the string unit SU corresponding to word line WL0, the semiconductor memory 10 according to the sixth embodiment alternately performs the first stage write in which word line WL1 is selected and the second stage write in which word line WL0 is selected. This operation is performed for string units SU0 to SU3 in order, for example.

Then, after the second stage write is performed for string unit SU3 corresponding to word line WL0, the semiconductor memory 10 alternately performs the first stage write in which, for example, word line WL2 is selected and the second stage write in which word line WL1 is selected. Similarly, the first stage and the second stage write are performed hereafter.

[6-3] Advantageous Effects of Sixth Embodiment

With the above-described semiconductor memory 10 according to the sixth embodiment, reliability of written data can be improved. The details of the advantageous effects will be described hereafter.

In a semiconductor memory, a threshold voltage of a memory cell adjusted to a desired threshold voltage by a write operation may fluctuate after the write operation is performed on the memory cell. For example, there is a phenomenon called an initial fall in which a certain amount of electrons, which are injected into a charge storage layer of a memory cell by a write operation, is drawn out of the charge storage layer and a threshold voltage of the memory cell drops down. An amount of fluctuation in a threshold voltage due to this initial fall is based on an amount of electrons injected into a charge storage layer of a memory cell by a write operation.

If a write operation to a memory cell adjacent to a memory cell in which data has been written is performed, along with a rise of the threshold voltage of the adjacent memory cell, the threshold voltage of the memory cell in which data has already been written also rises. This phenomenon is caused by a change in a parasitic capacitance between the memory cells that are adjacent, and the greater the amount of fluctuation in a threshold voltage in the adjacent memory cell becomes, the greater the amount of fluctuation in a threshold voltage in the memory cell becomes.

Thus, if a threshold voltage of the memory cell due to an initial fall of a threshold distribution, or due to a parasitic capacitance between the memory cells that are adjacent, the threshold distribution of the memory cell may become wider, and the number of error bits in a read operation may increase.

Accordingly, when six-page data is written by the method explained in the first embodiment, the semiconductor memory 10 according to the sixth embodiment adopts a two-stage write operation. Specifically, the semiconductor memory 10 writes 2-page data including the first and second bits in the first stage of a write operation (the first stage write), writes 4-page data including the third through sixth bits in the second stage write operation (the second stage write).

In the semiconductor memory 10 of the sixth embodiment, the first stage write in which an adjacent word line WL is selected is performed between the first stage and the second stage. Specifically, if the first stage write in which word line WL0 is selected performed, for example, the first stage write in which adjacent selected word line WL1 is selected is performed, and then the second stage write in which word line WL0 is selected is performed.

In this case, an initial fall occurs in a memory cell corresponding to word line WL0 while the first stage write in which word line WL1 is selected is being performed. Then, the second stage write in which word line WL0 is selected is performed under the influence of a change in a parasitic capacitance between the adjacent memory cells caused by the first stage write in which word line WL1 is selected. As a result, those influences can be ignored in a finally-obtained threshold distribution.

Furthermore, the second stage write corresponds to a write operation performed to a memory cell transistor MT in which a threshold voltage is raised for a certain level as a result of the first stage write. As a result, an amount of fluctuation in the threshold voltage of the memory cell transistor MT due to the second stage write becomes smaller. In other words, an amount of electrons injected into a charge storage layer of the memory cell transistor MT in the second stage write becomes less than an amount of injected electrons in the case of writing data in a batch of 6 bits.

Thus, the semiconductor memory 10 according to the sixth embodiment can suppress the influence due to the initial fall of a threshold voltage and the influence due to a parasitic capacitance between adjacent memory cells, which both occur after data is written to the memory cells. Accordingly, the semiconductor memory 10 according to the sixth embodiment can inhibit a widened threshold distribution in a write operation, thereby improving reliability of data.

The first stage write in the sixth embodiment is a write operation using only the first and second page data. Since the threshold distributions are finely formed in the second stage, those should be at least roughly formed in the first stage.

For this reason, the semiconductor memory 10 according to the sixth embodiment can set an initial value of the program voltage VPGM used in the first stage write and the voltage DVPGM that is stepped up every program loop higher than those voltages in the second stage write. As a result, the semiconductor memory 10 according to the sixth embodiment can enhance the speed of the first stage write.

In the above-explained example, the first and second page write is performed in the first stage write, and the third to sixth page write is performed in the second stage; however, the number of pages targeted in the first stage and the number of pages targeted in the second stage can be determined as appropriate in the sixth embodiment.

[7] Seventh Embodiment

The semiconductor memory 10 of the seventh embodiment is a modification of the second embodiment, and performs a sequential read for two-page data by using data allocation which differs from that in the second embodiment. In the following, differences between the semiconductor memory 10 of the seventh embodiment and that of the first to sixth embodiments will be described.

[7-1] Data Allocation

FIGS. 39 and 40 show an example of data allocation for the threshold distributions of the memory cell transistors MT in the semiconductor memory 10 according to the seventh embodiment.

As shown in FIGS. 39 and 40, in the semiconductor memory 10 according to the seventh embodiment, 64 combinations are possible by combining the threshold voltages in the memory cell transistors MT in plane PL1 with the threshold voltages in the memory cell transistors MT in plane PL2, similarly to the first embodiment. Furthermore, in the seventh embodiment, 6-bit data is allocated to each of the 64 combinations, as shown below:

(Example) "Threshold voltage of memory cell transistors MT in plane PL1", "threshold voltage of memory cell transistors MT in plane PL2": "first bit/second bit/third bit/fourth bit/fifth bit/sixth bit" data (1) "Z" state, "Z" state: "110000" data
(2) "Z" state, "A" state: "111000" data
(3) "Z" state, "B" state: "101000" data
(4) "Z" state, "C" state: "101010" data
(5) "Z" state, "D" state: "101111" data
(6) "Z" state, "E" state: "100111" data
(7) "Z" state, "F" state: "110111" data
(8) "Z" state, "G" state: "110101" data
(9) "A" state, "Z" state: "110100" data
(10) "A" state, "A" state: "111100" data
(11) "A" state, "B" state: "101100" data
(12) "A" state, "C" state: "101110" data
(13) "A" state, "D" state: "101011" data
(14) "A" state, "E" state: "100011" data
(15) "A" state, "F" state: "110011" data
(16) "A" state, "G" state: "110001" data
(17) "B" state, "Z" state: "010100" data
(18) "B" state, "A" state: "011100" data
(19) "B" state, "B" state: "001100" data
(20) "B" state, "C" state: "001110" data
(21) "B" state, "D" state: "001011" data
(22) "B" state, "E" state: "000011" data
(23) "B" state, "F" state: "010011" data
(24) "B" state, "G" state: "010001" data
(25) "C" state, "Z" state: "010101" data
(26) "C" state, "A" state: "011101" data
(27) "C" state, "B" state: "001101" data
(28) "C" state, "C" state: "001111" data
(29) "C" state, "D" state: "001010" data
(30) "C" state, "E" state: "000010" data
(31) "C" state, "F" state: "010010" data
(32) "C" state, "G" state: "010000" data
(33) "D" state, "Z" state: "011111" data
(34) "D" state, "A" state: "010111" data
(35) "D" state, "B" state: "000111" data
(36) "D" state, "C" state: "000101" data
(37) "D" state, "D" state: "000000" data
(38) "D" state, "E" state: "001000" data
(39) "D" state, "F" state: "011000" data
(40) "D" state, "G" state: "011010" data
(41) "E" state, "Z" state: "011110" data
(42) "E" state, "A" state: "010110" data
(43) "E" state, "B" state: "000110" data
(44) "E" state, "C" state: "000100" data
(45) "E" state, "D" state: "000001" data
(46) "E" state, "E" state: "001001" data
(47) "E" state, "F" state: "011001" data
(48) "E" state, "G" state: "011011" data
(49) "F" state, "Z" state: "111110" data
(50) "F" state, "A" state: "110110" data
(51) "F" state, "B" state: "100110" data
(52) "F" state, "C" state: "100100" data
(53) "F" state, "D" state: "100001" data
(54) "F" state, "E" state: "101001" data
(55) "F" state, "F" state: "111001" data
(56) "F" state, "G" state: "111011" data
(57) "G" state, "Z" state: "111010" data
(58) "G" state, "A" state: "110010" data

(59) "G" state, "B" state: "100010" data
(60) "G" state, "C" state: "100000" data
(61) "G" state, "D" state: "100101" data
(62) "G" state, "E" state: "101101" data
(63) "G" state, "F" state: "111101" data
(64) "G" state, "G" state: "111111" data FIG. 41 shows read voltages that are set for the data allocation shown in FIGS. 39 and 40, and definitions of read data to be applied to the read results of the pages.

As shown in FIG. 41, the first-page data is confirmed as a result of reading performed to plane PL1 with the use of the read voltages BR and FR.

The second-page data is confirmed as a result of reading performed to plane PL2 with the use of the read voltages BR and FR.

The third-page data is confirmed as a result of reading performed to plane PL1 with the use of the read voltage DR, and as a result of reading performed to plane PL2 with the use of the read voltages AR and ER.

The fourth-page data is confirmed as a result of reading performed to plane PL1 with the use of the read voltages AR and GR, and as a result of reading performed to plane PL2 with the use of the read voltage DR.

The fifth-page data is confirmed as a result of reading performed to plane PL1 with the use of the read voltage DR, and as a result of reading performed to plane PL2 with the use of the read voltages CR and GR.

The sixth-page data is confirmed as a result of reading performed to plane PL1 with the use of the read voltages CR and ER, and as a result of reading performed to plane PL2 with the use of the read voltage DR.

The read data based on results of a read operation in each of plane PL1 and plane PL2 is defined as follows:

(Example) Read operation: (result of reading plane PL1, result of reading plane PL2, read data)×4 types First-page read: (0, 0, 0), (1, 0, 1), (0, 1, 0), (1, 1, 1)
Second-page read: (0, 0, 0), (1, 0, 0), (0, 1, 1), (1, 1, 1)
Third-page read: (0, 0, 0), (1, 0, 1), (0, 1, 1), (1, 1, 0)
Fourth-page read: (0, 0, 0), (1, 0, 1), (0, 1, 1), (1, 1, 0)
Fifth-page read: (0, 0, 0), (1, 0, 1), (0, 1, 1), (1, 1, 0)
Sixth-page read: (0, 0, 0), (1, 0, 1), (0, 1, 1), (1, 1, 0)

Since the rest of the configuration of the semiconductor memory 10 according to the seventh embodiment is the same as that in the semiconductor memory 10 according to the first embodiment, detailed descriptions of the rest of the configuration are omitted.

[7-2] Operation

Next, a write operation and a read operation of the semiconductor memory 10 according to the seventh embodiment will be described.

[7-2-1] Write Operation

Since a write operation in the seventh embodiment in a case where six or more latch circuits are included is the same as that in the first embodiment, descriptions of the write operation are omitted. In the following, with respect to a case where four latch circuits (latch circuits ADL, BDL, CDL, and XDL) are provided, an example of the operation performed by the sequencer 14 when command sets CS1 through CS6 are sent to the semiconductor memory 10 by the memory controller 20 will be described with reference to FIGS. 16 and 42. FIG. 42 is a flowchart showing an example of an operation performed by the sequencer 14 during a write operation in the semiconductor memory device 10 according to the seventh embodiment.

As shown in FIG. 16, the memory controller 20 first sends a command set CS1 to the semiconductor memory 10. The command set CS1 includes commands for instructing an operation for the first page, and includes write data DAT corresponding to the first page. The first-page data received by the semiconductor memory 10 is retained in the latch circuit XDL of the sense amplifier unit SAU within the sense amplifier modules 17A and 17B (FIG. 42, (1)).

After receiving the command set CS1, the semiconductor memory 10 temporarily switches to a busy state, for example. Then, the sequencer 14 causes the sense amplifier module 17A to transfer the first-page data retained in the latch circuit XDL to, for example, the latch circuit ADL. Then, the sequencer 14 causes the sense amplifier module 17B to transfer the first-page data retained in the latch circuit XDL to, for example, the latch circuit SDL (FIG. 42, (2)).

Next, the memory controller 20 sends a command set CS2 to the semiconductor memory 10. The command set CS2 includes commands for instructing an operation for the second page, and includes write data DAT corresponding to the second page. The second-page data received by the semiconductor memory 10 is retained in the latch circuit XDL of the sense amplifier unit SAU of each of the sense amplifier modules 17A and 17B (FIG. 42, (3)).

After receiving the command set CS2, the semiconductor memory 10 temporarily switches to a busy state, for example. Then, the sequencer 14 causes the sense amplifier module 17A to transfer the second-page data retained in the latch circuit XDL to, for example, the latch circuit SDL. Then, the sequencer 14 causes the sense amplifier module 17B to transfer the second-page data retained in the latch circuit XDL to, for example, the latch circuit ADL (FIG. 42, (4)).

Next, the memory controller 20 sends a command set CS3 to the semiconductor memory 10. The command set CS3 includes commands for instructing an operation for the third page, and includes write data DAT corresponding to the third page. The third-page data received by the semiconductor memory 10 is retained in the latch circuit XDL of the sense amplifier unit SAU of each of the sense amplifier modules 17A and 17B (FIG. 42, (5)).

After receiving the command set CS3, the semiconductor memory 10 temporarily switches to a busy state, for example. Then, the sequencer 14 causes the sense amplifier module 17A to transfer the third-page data retained in the latch circuit XDL to, for example, the latch circuit CDL. The sequencer 14 causes the sense amplifier module 17B to transfer, to the latch circuit BDL for example, data "~XDL&~SDL", which is obtained by performing an AND operation on the data obtained by inverting the data retained in the latch circuit XDL and the data obtained by inverting the data retained in the latch circuit SDL (FIG. 42, (6)). As a dynamic latch used for this operation, node SEN, a bit line BL, and a memory pillar MP, may be used, for example.

Next, the memory controller 20 sends a command set CS4 to the semiconductor memory 10. The command set CS4 includes commands for instructing an operation for the fourth page, and includes write data DAT corresponding to the fourth page. The fourth-page data received by the semiconductor memory 10 is retained in the latch circuit XDL of the sense amplifier unit SAU of each of the sense amplifier modules 17A and 17B (FIG. 42, (7)).

After receiving the command set CS4, the semiconductor memory 10 temporarily switches to a busy state, for example. The sequencer 14 causes the sense amplifier module 17A to transfer, to the latch circuit CDL for example, data "~(XDL^CDL)", which is obtained by performing an XNOR operation on the data retained in the latch circuit XDL and the data retained in the latch circuit CDL. The sequencer 14 causes the sense amplifier module 17B to transfer, to the latch circuit SDL for example, data "XDL&SDL", which is obtained by performing an AND operation on the data retained in the latch circuit XDL and the data retained in the latch circuit SDL. Subsequently, the sequencer 14 causes the sense amplifier module 17B to transfer, to the latch circuit BDL for example, data "BDL|SDL", which is obtained by performing an OR operation on the data retained in the latch circuit BDL and the data retained in the latch circuit SDL (FIG. 42, (8)).

Next, the memory controller 20 sends a command set CS5 to the semiconductor memory 10. The command set CS5 includes commands for instructing an operation for the fifth page, and includes write data DAT corresponding to the fifth page. The fifth-page data received by the semiconductor memory 10 is retained in the latch circuit XDL of the sense amplifier unit SAU of each of the sense amplifier modules 17A and 17B (FIG. 42, (9)).

After receiving the command set CS5, the semiconductor memory 10 temporarily switches to a busy state, for example. The sequencer 14 causes the sense amplifier module 17A to transfer, to the latch circuit BDL for example, data "~XDL&~SDL", which is obtained by performing an AND operation on both the data obtained by inverting the data retained in the latch circuit XDL and the data obtained by inverting the data retained in the latch circuit SDL. Then, the sequencer 14 causes the sense amplifier module 17B to transfer the data retained in the latch circuit XDL to, for example, the latch circuit CDL (FIG. 42, (9)).

Next, the memory controller 20 sends a command set CS6 to the semiconductor memory 10. The command set CS6 includes commands for instructing an operation for the sixth page, and includes write data DAT corresponding to the sixth page. The sixth-page data received by the semiconductor memory 10 is retained in the latch circuit XDL of the sense amplifier unit SAU of each of the sense amplifier modules 17A and 17B (FIG. 42, (11)).

After receiving the command set CS6, the semiconductor memory 10 temporarily switches to a busy state, for example. The sequencer 14 causes the sense amplifier module 17A to transfer, to the latch circuit SDL for example, data "XDL&SDL", which is obtained by performing an AND operation on the data retained in the latch circuit XDL and the data retained in the latch circuit SDL. Subsequently, the sequencer 14 causes the sense amplifier module 17A to transfer, to the latch circuit BDL for example, data "BDL|SDL", which is obtained by performing an OR operation on the data retained in the latch circuit BDL and the data retained in the latch circuit SDL. The sequencer 14 causes the sense amplifier module 17B to transfer data, to the latch circuit CDL for example, "~(XDL^CDL)" obtained by performing an XNOR operation on the data retained in the latch circuit XDL and the data retained in the latch circuit CDL (FIG. 42, (12)).

Then the sequencer 14 performs a write operation based on the data respectively retained in the latch circuits ADL, BDL, and CDL in each of the sense amplifier modules 17A and 17B.

The data retained in the latch circuits ADL, BDL, and CDL for each threshold voltage of the memory cell transistors MT in the example shown in FIG. 42 are shown below. Similarly, different data is allocated to each of the threshold voltages in each of plane PL1 and plane PL2.

(Example) "Threshold voltage of memory cell transistors MT": data retained in ADL/data retained in BDL/data retained in CDL"

(1) "Z" state: "111" data
(2) "A" state: "110" data
(3) "B" state: "100" data
(4) "C" state: "101" data
(5) "D" state: "001" data
(6) "E" state: "000" data
(7) "F" state: "010" data
(8) "G" state: "011" data

[7-2-2] Read Operation

In the semiconductor memory 10 of the seventh embodiment, as sequential read for two-page data, the sequential read may be performed for, for example, the first and second pages, the third and fourth pages, and the fifth and sixth pages, respectively.

(Sequential Read for First and Second Pages)

FIG. 43 is a diagram showing an example of a command sequence, and voltages to be applied to a selected word line WLsel in the sequential read for the first and second pages in the semiconductor memory 10 of the seventh embodiment.

As shown in FIG. 43, first, the memory controller 20 sequentially sends, for example, a command "xxh", a command "00h", address information ADD, and a command "30h" to the semiconductor memory 10.

In the seventh embodiment, the command "xxh" is used as a command for instruction to perform the sequential read for the first and second pages. Upon receipt of the command "30h", the semiconductor memory 10 switches from a ready state to a busy state, and commences the sequential read for the first and second pages.

In the sequential read for the first and second pages, the sequencer 14 performs the first plane read to plane PL1 and the second plane read to plane PL2 simultaneously and in parallel.

In the first plane read in the sequential read, the read voltages BR and FR, for example, are applied in this order to the selected word line WLsel in plane PL1. The read result is retained in the latch circuit ADL in the sense amplifier module 17A, for example.

In the second plane read in the sequential read, the read voltages BR and FR, for example, are applied in this order to the selected word line WLsel in plane PL2. The read result is retained in the latch circuit ADL in the sense amplifier module 17B, for example.

When each of the first plane read and the second plane read is finished, the sequencer 14 causes the sense amplifier module to transfer the read result to the latch circuit XDL in each of plane PL1 and plane PL2, and changes the semiconductor memory 10 from a busy state to a ready state.

At this time, in the semiconductor memory 10, the read result related to the first-page data is retained in the latch circuit XDL in plane PL1, and the read result related to the second-page data is retained in the latch circuit XDL in plane PL2.

Specifically, in plane PL1, the read result obtained by using the read voltages BR and FR retained in the sense amplifier module 17A is first transferred to the logic circuit 18. Then, the logic circuit 18 confirms the read data of the first page based on the transferred data of plane PL1 and the definitions of the data shown in FIG. 41, and outputs the confirmed read data DAT to the memory controller 20.

Next, in plane PL2, the read result obtained by using the read voltages BR and FR retained in the sense amplifier module 17B is transferred to the logic circuit 18. Then, the logic circuit 18 confirms the read data of the second page based on the transferred data of plane PL2 and the definitions of the data shown in FIG. 41, and outputs the confirmed read data DAT to the memory controller 20.

The order of pages to be output from the semiconductor memory 10 to the memory controller 20 may be set as appropriate. For example, in the sequential read for the first and second pages, the semiconductor memory 10 may output the first-page data after outputting the second page data.

(Sequential Read for Third and Fourth Pages)

FIG. 44 shows an example of a command sequence, and voltages to be applied to a selected word line WLsel in sequential read for the third and fourth pages in the semiconductor memory 10 of the seventh embodiment.

As shown in FIG. 44, first, the memory controller 20 sequentially sends, for example, a command "xyh", a command "00h", address information ADD, and a command "30h" to the semiconductor memory 10.

In the seventh embodiment, the command "xyh" is used as a command for instruction to perform the sequential read for the third and fourth pages. Upon receipt of the command "30h", the semiconductor memory 10 switches from a ready state to a busy state, and commences the sequential read for the third and fourth pages.

In the sequential read for the third and fourth pages, the sequencer 14 performs the first plane read to plane PL1 and the second plane read to plane PL2 simultaneously and in parallel.

In the first plane read in the sequential read, the read voltages AR, DR, and GR, for example, are applied in this order to the selected word line WLsel in plane PL1. For example, the read results obtained by using the read voltages AR and GR are retained in the latch circuit ADL in the sense amplifier module 17A, and the read result obtained by using the read voltage DR is retained in the latch circuit BDL in the sense amplifier module 17A.

In the second plane read in the sequential read, the read voltages AR, DR, and GR, for example, are applied in this order to the selected word line WLsel in plane PL2. For example, the read results obtained by using the read voltages AR and GR are retained in the latch circuit ADL in the sense amplifier module 17B, and the read result obtained by using the read voltage DR is retained in the latch circuit BDL in the sense amplifier module 17B.

When each of the first plane read and the second plane read is completed, the sequencer 14 finishes the write operation, and changes the semiconductor memory 10 from a busy state to a ready state.

At this time, in the semiconductor memory 10, the read result related to the third-to-fourth page data is retained in the latch circuit within plane PL1 and in the latch circuit within plane PL2. The memory controller 20 then causes the semiconductor memory 10 to output the third-page data and the fourth-page data in this order.

Specifically, the read result obtained by using the read voltage DR retained in the sense amplifier module 17A in plane PL1, and the read result obtained by using the read voltages AR and ER retained in the sense amplifier module 17B in plane PL2 are first transferred to the logic circuit 18. Then, the logic circuit 18 confirms the read data of the third page based on the transferred data of plane PL1 and plane PL2 and the definitions of the data shown in FIG. 41, and outputs the confirmed read data DAT to the memory controller 20.

Next, the read result obtained by using the read voltages AR and GR retained in the sense amplifier module 17A in plane PL1, and the read result obtained by using the read voltage DR retained in the sense amplifier module 17B in plane PL2 are transferred to the logic circuit 18. Then, the logic circuit 18 confirms the read data of the fourth page based on the transferred data of plane PL1 and plane PL2 and the definitions of the data shown in FIG. 41, and outputs the confirmed read data DAT to the memory controller 20.

The order of pages to be output from the semiconductor memory 10 to the memory controller 20 may be set as appropriate. For example, in the sequential read for the third and fourth pages, the semiconductor memory 10 may output the third-page data after outputting the fourth-page data.

The sequential read for the third and fourth pages may be performed in a manner as follows: a read is performed with the use of the read voltages DR, AR, and GR in this order in plane PL1; a read is performed with the use of the read voltages AR, ER, and DR in this order in plane PL2; the third-page data is output after the read with the use of the read voltage ER in plane PL2; and the fourth-page data is output after the read with the use of the read voltage DR in plane PL2.

Furthermore, the sequential read for the third and fourth pages may be performed in a manner as follows: a read is performed with the use of the read voltages AR, GR, and DR in this order in plane PL1; a read is performed with the use of the read voltages DR, AR, and ER in this order in plane PL2; the fourth-page data is output after the read with the use of the read voltage GR in plane PL1; and the third-page data is output after the read with the use of the read voltage DR in plane PL1.

(Sequential Read for Fifth and Sixth Pages)

Figure 45:
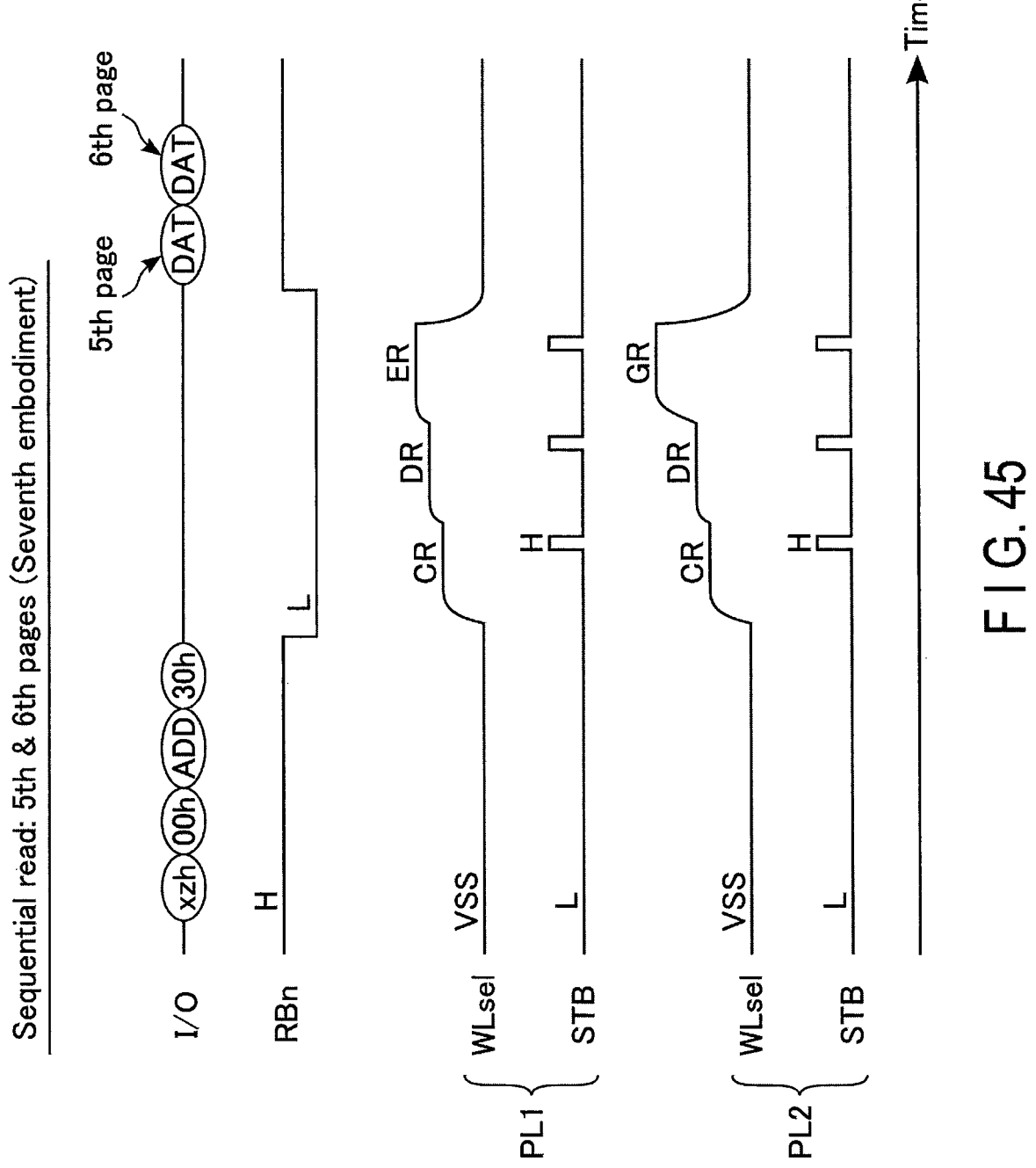
FIG. 45 is a timing chart showing an example of a command sequence, and voltages to be applied to a selected word line in a sequential read for fifth and sixth pages in the semiconductor memory according to the seventh embodiment.

FIG. 45 is a diagram showing an example of a command sequence, and voltages to be applied to a selected word line WLsel in the sequential read for the fifth and sixth pages in the semiconductor memory 10 according to the seventh embodiment.

As shown in FIG. 45, first, the memory controller 20 sequentially sends, for example, a command "xzh", a command "00h", address information ADD, a command "30h" to the semiconductor memory 10.

In the seventh embodiment, the command "xzh" is used as a command for instruction to perform the sequential read for the fifth and sixth pages. Upon receipt of the command "30h", the semiconductor memory 10 switches from a ready state to a busy state, and commences sequential read for the fifth and sixth pages.

In the sequential read for the fifth and sixth pages, the sequencer 14 performs the first plane read to plane PL1 and the second plane read to plane PL2 simultaneously and in parallel.

In the first plane read in the sequential read, the read voltages CR, DR, and ER, for example, are applied in this order to the selected word line WLsel in plane PL1. For example, the read results obtained by using the read voltages CR and ER are retained in the latch circuit ADL in the sense amplifier module 17A, and the read result obtained by using the read voltage DR is retained in the latch circuit BDL in the sense amplifier module 17A, for example.

In the second plane read in the sequential read, the read voltages CR, DR, and GR, for example, are applied in this order to the selected word line WLsel in plane PL2. For example, the read results obtained by using the read voltages CR and GR are retained in the latch circuit ADL in the sense amplifier module 17B, and the read result obtained by using the read voltage DR is retained in the latch circuit BDL in the sense amplifier module 17B, for example.

When each of the first plane read and the second plane read is completed, the sequencer 14 finishes the write operation, and changes the semiconductor memory 10 from a busy state to a ready state.

At this time, in the semiconductor memory 10, the read result related to the fifth-to-sixth page data is retained in the latch circuit within plane PL1 and in the latch circuit within plane PL2. The memory controller 20 then causes the semiconductor memory 10 to output the fifth page data and the sixth-page data in this order.

Specifically, the read result obtained by using the read voltage DR retained in the sense amplifier module 17A in plane PL1, and the read result obtained by using the read voltages CR and GR retained in a latch circuit within the sense amplifier module 17B in plane PL2 are first transferred to the logic circuit 18.

Then, the logic circuit 18 confirms the read data of the fifth page based on the transferred data of plane PL1 and plane PL2 and the definitions of the data shown in FIG. 41, and outputs the confirmed read data DAT to the memory controller 20.

Next, the read result obtained by using the read voltages CR and ER retained in a latch circuit within the sense amplifier module 17A in plane PL1, and the read result obtained by using the read voltage DR retained in a latch circuit within the sense amplifier module 17B in plane PL2 are transferred to the logic circuit 18.

Then, the logic circuit 18 confirms the read data of the sixth page based on the transferred data of plane PL1 and plane PL2 and the definitions of the data shown in FIG. 41, and outputs the confirmed read data DAT to the memory controller 20.

The order of pages to be output from the semiconductor memory 10 to the memory controller 20 may be set as appropriate. For example, in the sequential read for the fifth and sixth pages, the semiconductor memory 10 may output the fifth-page data after outputting the sixth-page data.

The sequential read for the fifth and sixth pages may be performed in a manner as follows: a read is performed with the use of the read voltages DR, CR, and ER in this order in plane PL1; a read is performed with the use of the read voltages CR, GR, and DR in this order in plane PL2; the fifth-page data is output after the read with the use of the read voltage GR in plane PL2; and the sixth-page data is output after the read with the use of the read voltage DR in plane PL2.

The sequential read for the fifth and sixth pages may be performed in a manner as follows: a read is performed with the use of the read voltages CR, ER, and DR in this order in plane PL1; a read is performed with the use of the read voltages DR, CR, and GR in this order in plane PL2; the sixth-page data is output after the read with the use of the read voltage ER in plane PL1; and the fifth-page data is output after the read with the use of the read voltage DR in plane PL1.

[7-3] Advantageous Effects of Seventh Embodiment

As described above, in the semiconductor memory 10 of the seventh embodiment, the data allocation differing from that in the second embodiment is used, and a sequential read for two-page data is performed.

According to the data allocation used by the semiconductor memory 10 in the second embodiment, in the sequential read for two-page data, a combination of two pages in which four read operations are included in at least one of plane PL1 or plane PL2 is selected.

For example, in the semiconductor memory 10 of the second embodiment, a read operation is performed once in each of plane PL1 and plane PL2 during the sequential read for the first and second pages. In the sequential read for the third and sixth pages, a read operation is performed four times in plane PL1 and twice in plane PL2. The sequential read for the fourth and fifth pages, a read operation is performed twice in plane PL1 and four times in plane PL2. In the second embodiment, the number of times that read is performed per two pages is (1+4+4)/3=3.

On the other hand, according to the data allocation used by the semiconductor memory 10 of the seventh embodiment, a combination of two pages in which four read operations are not included in both of plane PL1 and plane PL2 is selected in the sequential read for the two-page data.

Specifically, in the semiconductor memory 10 of the seventh embodiment, a read operation is performed twice in each of plane PL1 and plane PL2 for the sequential read for the first and second pages. A read operation is performed three times in plane PL1 and plane PL2 in the sequential read for the third and fourth pages.

A read operation is performed three times in plane PL1 and plane PL2 in the sequential read for the fifth and sixth pages. Thus, the number of times that read is performed per page in the seventh embodiment is (2+3+3)/6=1.33. In the first embodiment on the other hand, the number of times that read is performed per page is (1+1+2+2+2+2)/6=1.667. In the second embodiment, the number of times that read is performed per page is (2+2+2+2+2+2)/6=2

Thus, in the semiconductor memory 10 of the seventh embodiment, the number of times that read is performed for the sequential read for two-page data is lower than that in the second embodiment, and the number of times that read is performed per page is lower than that in the second embodiment. Accordingly, the semiconductor memory 10 of the seventh embodiment can enhance the speed of the sequential read for two-page data, compared to the second embodiment.

In the semiconductor memory 10 of the seventh embodiment, the order of data outputting can be altered through the change of an input command or address, similarly to the second embodiment. For example, in the sequential read for the first and second pages, the second-page data and the first-page data may be output in this order. In the sequential read for the third and fourth pages, the fourth-page data and the third-page data may be output in this order. In the sequential read for the fifth and sixth pages, the sixth-page data and the fifth-page data may be output in this order.

Similarly to the second embodiment, in the semiconductor memory 10 of the seventh embodiment, data of multiple pages may be treated as one page through the increase of a page size. For example, each of the set of the first and second pages, the set of the third and fourth pages, and the set of the fifth and sixth pages may be treated as one page.

[7-4] Modification of Seventh Embodiment

In the seventh embodiment, an example where the data allocation shown in FIGS. 39 and 40 is used is described; however, other data allocations may be adopted.

Combinations of read voltages and data definitions in the first to fourth modifications of the seventh embodiment are listed below. A data allocation for each of the following combinations is set as appropriate based on a combination of read voltages and data definitions.

(Example) Read voltage: [first-page read ((x) read voltage of PL1, (y) read voltage of PL2), second-page read ((x), (y)), third-page read ((x), (y)), fourth-page read ((x), (y)), fifth-page read ((x), (y)), sixth-page read ((x), (y))]; Data definitions: [first-page read [(a) read data when "0", "0" (="read result of PL1", "read result of PL2"), (b) read data when "1", "0", (c) read data when "0", "1", (d) read data when "1", "1"], second-page read [(a), (b), (c), (d)], third-page read [(a), (b), (c), (d)], fourth-page read [(a), (b), (c), (d)], fifth-page read [(a), (b), (c), (d)], sixth-page read [(a), (b), (c), (d)]]

First Modification of Seventh Embodiment

Read voltages: [((omitted), (BR, FR), ((DR), (AR, CR)), ((DR), (ER, GR)), ((BR, FR), (omitted)), ((AR, GR), (DR)), ((CR, ER), (DR)); data definitions: [[0, 0, 1, 1], [0, 1, 1, 0], [0, 1, 1, 0], [0, 1, 1, 0], [0, 1, 1, 0], [0, 1, 1, 0]

Second Modification of Seventh Embodiment

Read voltages: [((omitted), (BR, FR), ((DR), (AR, GR)), ((DR), (CR, ER)), ((BR, FR), (omitted)), ((AR, GR), (DR)), ((CR, ER), (DR)); data definitions: [[0, 0, 1, 1], [0, 1, 1, 0], [0, 1, 1, 0], [0, 1, 1, 0], [0, 1, 1, 0], [0, 1, 1, 0]

Third Modification of Seventh Embodiment

Read voltages: [((omitted), (BR, FR), ((DR), (AR, GR)), ((DR), (CR, ER)), ((AR, CR), (DR)), ((BR, FR), (AR)), ((ER, GR), (DR)); data definitions: [[0, 0, 1, 1], [0, 1, 1, 0], [0, 1, 1, 0], [0, 1, 1, 0], [0, 1, 1, 0], [0, 1, 1, 0]

Fourth Modification of Seventh Embodiment

Read voltages: [((omitted), (BR, FR), ((DR), (AR, GR)), ((DR), (CR, ER)), ((AR, CR), (DR)), ((BR, FR), (BR)), ((ER, GR), (DR)); data definitions: [[0, 0, 1, 1], [0, 1, 1, 0], [0, 1, 1, 0], [0, 1, 1, 0], [0, 1, 1, 0], [0, 1, 1, 0]

Fifth Modification of Seventh Embodiment

Read voltage: [((omitted), (BR, FR), ((DR), (AR, GR)), ((DR), (CR, ER)), ((AR, CR), (DR)), ((BR, FR), (CR)), ((ER, GR), (DR)); data definitions: [[0, 0, 1, 1], [0, 1, 1, 0], [0, 1, 1, 0], [0, 1, 1, 0], [0, 1, 1, 0], [0, 1, 1, 0]

Sixth Modification of Seventh Embodiment

Read voltages: [((omitted), (BR, FR), ((DR), (AR, GR)), ((DR), (CR, ER)), ((AR, CR), (DR)), ((BR, FR), (DR)), ((ER, GR), (DR)); data definitions: [[0, 0, 1, 1], [0, 1, 1, 0], [0, 1, 1, 0], [0, 1, 1, 0], [0, 1, 1, 0], [0, 1, 1, 0]

Seventh Modification of Seventh Embodiment

Read voltages: [((omitted), (BR, FR), ((DR), (AR, GR)), ((DR), (CR, ER)), ((AR, CR), (DR)), ((BR, FR), (ER)), ((ER, GR), (DR)); data definitions: [[0, 0, 1, 1], [0, 1, 1, 0], [0, 1, 1, 0], [0, 1, 1, 0], [0, 1, 1, 0], [0, 1, 1, 0]

Eighth Modification of Seventh Embodiment

Read voltages: [((omitted), (BR, FR), ((DR), (AR, GR)), ((DR), (CR, ER)), ((AR, CR), (DR)), ((BR, FR), (FR)), ((ER, GR), (DR)); data definitions: [[0, 0, 1, 1], [0, 1, 1, 0], [0, 1, 1, 0], [0, 1, 1, 0], [0, 1, 1, 0], [0, 1, 1, 0]

Ninth Modification of Seventh Embodiment

Read voltages: [((omitted), (BR, FR), ((DR), (AR, GR)), ((DR), (CR, ER)), ((AR, CR), (DR)), ((BR, FR), (GR)), ((ER, GR), (DR)); data definitions: [[0, 0, 1, 1], [0, 1, 1, 0], [0, 1, 1, 0], [0, 1, 1, 0], [0, 1, 1, 0], [0, 1, 1, 0]

10th Modification of Seventh Embodiment

Read voltages: [((BR), (BR, FR)), ((DR), (AR, CR)), ((DR), (ER, GR)), ((FR), (BR, FR)), ((AR, GR), (DR)), ((CR, ER), (DR))]; data definitions: [[0, 1, 1, 0], [0, 1, 1, 0], [0, 1, 1, 0], [0, 1, 1, 0], [0, 0, 1, 1], [0, 1, 0, 1]]

11th Modification of Seventh Embodiment

Read voltages: [((DR), (BR, ER), ((DR), (DR, GR)), ((AR, ER), (AR)), ((BR, FR), (ER)), ((CR, GR), (AR)), ((BR, FR), (CR, FR)); data definitions: [[0, 1, 1, 0], [0, 1, 1, 0], [0, 1, 1, 0], [0, 1, 1, 0], [0, 1, 1, 0], [0, 1, 1, 0]

12th Modification of Seventh Embodiment

Read voltages: [((DR), (AR, DR), ((DR), (CR, FR)), ((AR, ER), (AR)), ((CR, GR), (GR)), ((BR, FR), (BR, ER)), ((BR, FR), (DR, GR)); data definitions: [[0, 1, 1, 0], [0, 1, 1, 0], [0, 1, 1, 0], [0, 1, 1, 0], [0, 1, 1, 0], [0, 1, 1, 0]

13th Modification of Seventh Embodiment

Read voltages: [((AR, CR), (CR, GR), ((AR, GR), (AR, ER)), ((BR, FR), (DR, FR)), ((ER, FR), (CR, GR)), ((DR), (AR, ER)), ((BR, FR), (BR)); data definitions: [[0, 1, 1, 0], [0, 1, 1, 0], [0, 1, 1, 0], [0, 1, 1, 0], [0, 1, 1, 0], [0, 1, 1, 0]

The semiconductor memory 10 of each of the above-described first through thirteenth modifications of the seventh embodiment is capable of performing the same operation as that of the seventh embodiment, and can achieve similar advantageous effects.

[8] Eighth Embodiment

In the semiconductor memory 10 according to the eighth embodiment, 8-bit data can be stored by a set of one memory cell transistor MT in plane PL1 and one memory cell transistor MT in plane PL2. In the following, differences between the semiconductor memory 10 of the eighth embodiment and that of the first to seventh embodiments will be described.

[8-1] Configuration

[8-1-1] Threshold Distributions of Memory Cell Transistor MT

FIG. 46 shows an example of threshold distributions of the memory cell transistors MT, and read voltages in the semiconductor memory 10 according to the eighth embodiment.

As shown in FIG. 46, in the threshold distributions of the memory cell transistors MT in the eighth embodiment, eight threshold distributions, which are higher than the "G" state, are added to the threshold distributions described with reference to FIG. 8 in the first embodiment.

In the present specification, the eight threshold distributions higher than the "G" state are respectively called "H" state, "I" state, "J" state, "K" state, "L" state, "M" state, "N" state, and "O" state, from lower to higher threshold voltages.

A read voltage HR is set between the "G" state and the "H" state. A read voltage IR is set between the "H" state and the "I" state. A read voltage JR is set between the "I" state and the "J" state. A read voltage KR is set between the "J" state and the "K" state. A read voltage LR is set between the "K" state and the "L" state.

A read voltage MR is set between the "L" state and the "M" state. A read voltage NR is set between the "M" state and the "N" state. A read voltage OR is set between the "N" state and the "O" state. In the eighth embodiment, the read pass voltage VREAD is set to a voltage higher than a maximum threshold voltage in the "O" state.

Similarly to the "A" through "G" states, the verify voltages HV, IV, JV, KV, LV, MV, NV, and OV are set in correspondence with the "H" state, "I" state, "J" state, "K" state, "L" state, "M" state, "N" state, and "O" state, respectively.

[8-1-2] Data Allocation

FIGS. 47 through 54 show an example of data allocation for the threshold distributions of the memory cell transistors MT in the semiconductor memory 10 according to the eighth embodiment.

As shown in FIGS. 47 through 54, in the semiconductor memory 10 according to the eighth embodiment, 256 combinations are possible by combining 16 threshold voltages in the memory cell transistors MT in plane PL1 with 16 threshold voltages in the memory cell transistors MT in plane PL2. Furthermore, 8-bit data is allocated to each of the 256 combinations, as shown below:

(Example) "Threshold voltage of memory cell transistors MT in plane PL1", "threshold voltage of memory cell transistors MT in plane PL2": "first bit/second bit/third bit/fourth bit/fifth bit/sixth bit/seventh bit/eighth bit" data (1) "Z" state, "Z" state: "11110000" data
(2) "Z" state, "A" state: "11110100" data
(3) "Z" state, "B" state: "11111110" data
(4) "Z" state, "C" state: "11111010" data
(5) "Z" state, "D" state: "11101010" data
(6) "Z" state, "E" state: "11101011" data
(7) "Z" state, "F" state: "11100001" data
(8) "Z" state, "G" state: "11100000" data
(9) "Z" state, "H" state: "10100000" data
(10) "Z" state, "I" state: "10100100" data
(11) "Z" state, "J" state: "10101110" data
(12) "Z" state, "K" state: "10101010" data
(13) "Z" state, "L" state: "10111010" data
(14) "Z" state, "M" state: "10111011" data
(15) "Z" state, "N" state: "10110001" data
(16) "Z" state, "O" state: "10110000" data
(17) "A" state, "Z" state: "11111000" data
(18) "A" state, "A" state: "11111100" data
(19) "A" state, "B" state: "11110110" data
(20) "A" state, "C" state: "11110010" data
(21) "A" state, "D" state: "11100010" data
(22) "A" state, "E" state: "11100011" data
(23) "A" state, "F" state: "11101001" data
(24) "A" state, "G" state: "11101000" data
(25) "A" state, "H" state: "10101000" data
(26) "A" state, "I" state: "10101100" data
(27) "A" state, "J" state: "10100110" data
(28) "A" state, "K" state: "10100010" data
(29) "A" state, "L" state: "10110010" data
(30) "A" state, "M" state: "10110011" data
(31) "A" state, "N" state: "10111001" data
(32) "A" state, "O" state: "10111000" data
(33) "B" state, "Z" state: "11111101" data
(34) "B" state, "A" state: "11111001" data
(35) "B" state, "B" state: "11110011" data
(36) "B" state, "C" state: "11110111" data
(37) "B" state, "D" state: "11100111" data

(38) "B" state, "E" state: "11100110" data
(39) "B" state, "F" state: "11101100" data
(40) "B" state, "G" state: "11101101" data
(41) "B" state, "H" state: "10101101" data
(42) "B" state, "I" state: "10101001" data
(43) "B" state, "J" state: "10100011" data
(44) "B" state, "K" state: "10100111" data
(45) "B" state, "L" state: "10110111" data
(46) "B" state, "M" state: "10110110" data
(47) "B" state, "N" state: "10111100" data
(48) "B" state, "O" state: "10111101" data
(49) "C" state, "Z" state: "11110101" data
(50) "C" state, "A" state: "11110001" data
(51) "C" state, "B" state: "11111011" data
(52) "C" state, "C" state: "11111111" data
(53) "C" state, "D" state: "11101111" data
(54) "C" state, "E" state: "11101110" data
(55) "C" state, "F" state: "11100100" data
(56) "C" state, "G" state: "11100101" data
(57) "C" state, "H" state: "10100101" data
(58) "C" state, "I" state: "10100001" data
(59) "C" state, "J" state: "10101011" data
(60) "C" state, "K" state: "10101111" data
(61) "C" state, "L" state: "10111111" data
(62) "C" state, "M" state: "10111110" data
(63) "C" state, "N" state: "10110100" data
(64) "C" state, "O" state: "10110101" data
(65) "D" state, "Z" state: "11010101" data
(66) "D" state, "A" state: "11010001" data
(67) "D" state, "B" state: "11011011" data
(68) "D" state, "C" state: "11011111" data
(69) "D" state, "D" state: "11001111" data
(70) "D" state, "E" state: "11001110" data
(71) "D" state, "F" state: "11000100" data
(72) "D" state, "G" state: "11000101" data
(73) "D" state, "H" state: "10000101" data
(74) "D" state, "I" state: "10000001" data
(75) "D" state, "J" state: "10001011" data
(76) "D" state, "K" state: "10001111" data
(77) "D" state, "L" state: "10011111" data
(78) "D" state, "M" state: "10011110" data
(79) "D" state, "N" state: "10010100" data
(80) "D" state, "O" state: "10010101" data
(81) "E" state, "Z" state: "11010111" data
(82) "E" state, "A" state: "11010011" data
(83) "E" state, "B" state: "11011001" data
(84) "E" state, "C" state: "11011101" data
(85) "E" state, "D" state: "11001101" data
(86) "E" state, "E" state: "11001100" data
(87) "E" state, "F" state: "11000110" data
(88) "E" state, "G" state: "11000111" data
(89) "E" state, "H" state: "10000111" data
(90) "E" state, "I" state: "10000011" data
(91) "E" state, "J" state: "10001001" data
(92) "E" state, "K" state: "10001101" data
(93) "E" state, "L" state: "10011101" data
(94) "E" state, "M" state: "10011100" data
(95) "E" state, "N" state: "10010110" data
(96) "E" state, "O" state: "10010111" data
(97) "F" state, "Z" state: "11010010" data
(98) "F" state, "A" state: "11010110" data
(99) "F" state, "B" state: "11011100" data
(100) "F" state, "C" state: "11011000" data
(101) "F" state, "D" state: "11001000" data
(102) "F" state, "E" state: "11001001" data
(103) "F" state, "F" state: "11000011" data
(104) "F" state, "G" state: "11000010" data (105) "F" state, "H" state: "10000010" data
(106) "F" state, "I" state: "10000110" data
(107) "F" state, "J" state: "10001100" data
(108) "F" state, "K" state: "10001000" data
(109) "F" state, "L" state: "10011000" data
(110) "F" state, "M" state: "10011001" data
(111) "F" state, "N" state: "10010011" data
(112) "F" state, "O" state: "10010010" data
(113) "G" state, "Z" state: "11010000" data
(114) "G" state, "A" state: "11010100" data
(115) "G" state, "B" state: "11011110" data
(116) "G" state, "C" state: "11011010" data
(117) "G" state, "D" state: "11001010" data
(118) "G" state, "E" state: "11001011" data
(119) "G" state, "F" state: "11000001" data
(120) "G" state, "G" state: "11000000" data
(121) "G" state, "H" state: "10000000" data
(122) "G" state, "I" state: "10000100" data
(123) "G" state, "J" state: "10001110" data
(124) "G" state, "K" state: "10001010" data
(125) "G" state, "L" state: "10011010" data
(126) "G" state, "M" state: "10011011" data
(127) "G" state, "N" state: "10010001" data
(128) "G" state, "O" state: "10010000" data
(129) "H" state, "Z" state: "01010000" data
(130) "H" state, "A" state: "01010100" data
(131) "H" state, "B" state: "01011110" data
(132) "H" state, "C" state: "01011010" data
(133) "H" state, "D" state: "01001010" data
(134) "H" state, "E" state: "01001011" data
(135) "H" state, "F" state: "01000001" data
(136) "H" state, "G" state: "01000000" data
(137) "H" state, "H" state: "00000000" data
(138) "H" state, "I" state: "00000100" data
(139) "H" state, "J" state: "00001110" data
(140) "H" state, "K" state: "00001010" data
(141) "H" state, "L" state: "00011010" data
(142) "H" state, "M" state: "00011011" data
(143) "H" state, "N" state: "00010001" data
(144) "H" state, "O" state: "00010000" data
(145) "I" state, "Z" state: "01010010" data
(146) "I" state, "A" state: "01010110" data
(147) "I" state, "B" state: "01011100" data
(148) "I" state, "C" state: "01011000" data
(149) "I" state, "D" state: "01001000" data
(150) "I" state, "E" state: "01001001" data
(151) "I" state, "F" state: "01000011" data
(152) "I" state, "G" state: "01000010" data
(153) "I" state, "H" state: "00000010" data
(154) "I" state, "I" state: "00000110" data
(155) "I" state, "J" state: "00001100" data
(156) "I" state, "K" state: "00001000" data
(157) "I" state, "L" state: "00011000" data
(158) "I" state, "M" state: "00011001" data
(159) "I" state, "N" state: "00010011" data
(160) "I" state, "O" state: "00010010" data
(161) "J" state, "Z" state: "01010111" data
(162) "J" state, "A" state: "01010011" data
(163) "J" state, "B" state: "01011001" data
(164) "J" state, "C" state: "01011101" data
(165) "J" state, "D" state: "01001101" data
(166) "J" state, "E" state: "01001100" data
(167) "J" state, "F" state: "01000110" data
(168) "J" state, "G" state: "01000111" data
(169) "J" state, "H" state: "00000111" data
(170) "J" state, "I" state: "00000011" data
(171) "J" state, "J" state: "00001001" data (172) "J" state, "K" state: "00001101" data
(173) "J" state, "L" state: "00011101" data
(174) "J" state, "M" state: "00011100" data
(175) "J" state, "N" state: "00010110" data
(176) "J" state, "O" state: "00010111" data
(177) "K" state, "Z" state: "01010101" data
(178) "K" state, "A" state: "01010001" data
(179) "K" state, "B" state: "01011011" data
(180) "K" state, "C" state: "01011111" data
(181) "K" state, "D" state: "01001111" data
(182) "K" state, "E" state: "01001110" data
(183) "K" state, "F" state: "01000100" data
(184) "K" state, "G" state: "01000101" data
(185) "K" state, "H" state: "00000101" data
(186) "K" state, "I" state: "00000001" data
(187) "K" state, "J" state: "00001011" data
(188) "K" state, "K" state: "00001111" data
(189) "K" state, "L" state: "00011111" data
(190) "K" state, "M" state: "00011110" data
(191) "K" state, "N" state: "00010100" data
(192) "K" state, "O" state: "00010101" data
(193) "L" state, "Z" state: "01110101" data
(194) "L" state, "A" state: "01110001" data
(195) "L" state, "B" state: "01111011" data
(196) "L" state, "C" state: "01111111" data
(197) "L" state, "D" state: "01101111" data
(198) "L" state, "E" state: "01101110" data
(199) "L" state, "F" state: "01100100" data
(200) "L" state, "G" state: "01100101" data
(201) "L" state, "H" state: "00100101" data
(202) "L" state, "I" state: "00100001" data
(203) "L" state, "J" state: "00101011" data
(204) "L" state, "K" state: "00101111" data
(205) "L" state, "L" state: "00111111" data
(206) "L" state, "M" state: "00111110" data
(207) "L" state, "N" state: "00110100" data
(208) "L" state, "O" state: "00110101" data
(209) "M" state, "Z" state: "01111101" data
(210) "M" state, "A" state: "01111001" data
(211) "M" state, "B" state: "01110011" data
(212) "M" state, "C" state: "01110111" data
(213) "M" state, "D" state: "01100111" data
(214) "M" state, "E" state: "01100110" data
(215) "M" state, "F" state: "01101100" data
(216) "M" state, "G" state: "01101101" data
(217) "M" state, "H" state: "00101101" data
(218) "M" state, "I" state: "00101001" data
(219) "M" state, "J" state: "00100011" data
(220) "M" state, "K" state: "00100111" data
(221) "M" state, "L" state: "00110111" data
(222) "M" state, "M" state: "00110110" data
(223) "M" state, "N" state: "00111100" data
(224) "M" state, "O" state: "00111101" data
(225) "N" state, "Z" state: "01111000" data
(226) "N" state, "A" state: "01111100" data
(227) "N" state, "B" state: "01110110" data
(228) "N" state, "C" state: "01110010" data
(229) "N" state, "D" state: "01100010" data
(230) "N" state, "E" state: "01100011" data
(231) "N" state, "F" state: "01101001" data
(232) "N" state, "G" state: "01101000" data
(233) "N" state, "H" state: "00101000" data
(234) "N" state, "I" state: "00101100" data
(235) "N" state, "J" state: "00100110" data
(236) "N" state, "K" state: "00100010" data
(237) "N" state, "L" state: "00110010" data
(238) "N" state, "M" state: "00110011" data (239) "N" state, "N" state: "00111001" data
(240) "N" state, "O" state: "00111000" data
(241) "O" state, "Z" state: "01110000" data
(242) "O" state, "A" state: "01110100" data
(243) "O" state, "B" state: "01111110" data
(244) "O" state, "C" state: "01111010" data
(245) "O" state, "D" state: "01101010" data
(246) "O" state, "E" state: "01101011" data
(247) "O" state, "F" state: "01100001" data
(248) "O" state, "G" state: "01100000" data
(249) "O" state, "H" state: "00100000" data
(250) "O" state, "I" state: "00100100" data
(251) "O" state, "J" state: "00101110" data
(252) "O" state, "K" state: "00101010" data
(253) "O" state, "L" state: "00111010" data
(254) "O" state, "M" state: "00111011" data
(255) "O" state, "N" state: "00110001" data
(256) "O" state, "O" state: "00110000" data FIG. 55 shows read voltages that are set for the data allocation shown in FIGS. 47 through 54, and definitions of read data to be applied to the read results of the pages. Hereinafter, the read operation targeting the seventh page and the eighth page will be referred to as "seventh-page read" and "eighth-page read", respectively.

As shown in FIG. 55, the first-page data is confirmed as a result of reading performed to plane PL1 with the use of the read voltage HR.

The second-page data is confirmed as a result of reading performed to plane PL2 with the use of the read voltage HR.

The third-page data is confirmed as a result of reading performed to plane PL1 with the use of the read voltages DR and LR.

The fourth-page data is confirmed as a result of reading performed to plane PL2 with the use of the read voltages DR and LR.

The fifth-page data is confirmed as a result of reading performed to plane PL1 with the use of the read voltages AR, CR, MR, and OR, and as a result of reading performed to plane PL2 with the use of the read voltages BR, FR, JR, and NR.

The sixth-page data is confirmed as a result of reading performed to plane PL1 with the use of the read voltages BR, FR, JR, and NR, and as a result of reading performed to plane PL2 with the use of the read voltages AR, CR, IR, and KR.

The seventh-page data is confirmed as a result of reading performed to plane PL1 with the use of the read voltages ER, GR, IR, and KR, and as a result of reading performed to plane PL2 with the use of the read voltages BR, FR, JR, and NR.

The eighth-page data is confirmed as a result of reading performed to plane PL1 with the use of the read voltages BR, FR, JR, and NR, and as a result of reading performed to plane PL2 with the use of the read voltages ER, GR, MR, and OR.

The read data based on results of a read operation in each of plane PL1 and plane PL2 is defined as follows:

(Example) Read operation: (result of reading plane PL1, result of reading plane PL2, read data)×4 types First-page read: (0, 0, 0), (1, 0, 1), (0, 1, 0), (1, 1, 1)
Second-page read: (0, 0, 0), (1, 0, 0), (0, 1, 1), (1, 1, 1)
Third-page read: (0, 0, 0), (1, 0, 1), (0, 1, 0), (1, 1, 1)
Fourth-page read: (0, 0, 0), (1, 0, 0), (0, 1, 1), (1, 1, 1)
Fifth-page read: (0, 0, 0), (1, 0, 1), (0, 1, 1), (1, 1, 0)
Sixth-page read: (0, 0, 0), (1, 0, 1), (0, 1, 1), (1, 1, 0)
Seventh-page read: (0, 0, 0), (1, 0, 1), (0, 1, 1), (1, 1, 1)
Eighth-page read: (0, 0, 0), (1, 0, 1), (0, 1, 1), (1, 1, 0)

Since the rest of the configuration of the semiconductor memory 10 according to the eighth embodiment is the same as that of the semiconductor memory 10 according to the first embodiment, detailed descriptions of the rest of the configuration are omitted.

[8-2] Operation

Next, a write operation and a read operation of the semiconductor memory 10 according to the eighth embodiment will be described. Let us suppose that eight or more latch circuits are included in each sense amplifier unit SAU in the semiconductor memory 10 of the eighth embodiment.

[8-2-1] Write Operation

FIG. 56 shows an example of a command sequence, and voltages to be applied to a selected word line WLsel in a write operation in the semiconductor memory 10 according to the eighth embodiment.

As shown in FIG. 56, the memory controller 20 first sends command sets CS1 through CS7 to the semiconductor memory 10. Each command set CS includes a command for instructing a write operation, an address of a cell unit CU to which data is written, and the command sets CS1 through CS7 include write data corresponding to a first bit through a seventh bit (first-to-seventh page data).

The semiconductor memory 10 temporarily switches to a busy state every time when it receives a command set CS, and transfers the write data to the latch circuits of each sense amplifier unit SAU of the sense amplifier modules 17A and 17B. The write data corresponding to the first bit through the seventh bit is retained in the corresponding latch circuit within each sense amplifier unit SAU.

Next, the memory controller 20 sends a command set CS8 to the semiconductor memory 10. The command set CS8 includes a command for instructing a write operation, an address of a cell unit CU to which data is written, and write data corresponding to an eighth bit (eighth-page data). The eighth-page data received by the semiconductor memory 10 is retained in the latch circuit XDL of each sense amplifier unit SAU of the sense amplifier modules 17A and 17B.

After receiving the command set CS8, the semiconductor memory 10 temporarily switches to a busy state, for example. Then the sequencer 14 performs a write operation based on the first-to-eighth-page data respectively retained in the latch circuits in each of the sense amplifier modules 17A and 17B.

In the write operation in the semiconductor memory 10 according to the eighth embodiment, the sequencer 14 simultaneously performs a first plane write for plane PL1 and a second plane write for plane PL2 in parallel.

Since the details of the first plane write and the second plane write are the same as those of the first plane write in the first embodiment, except that the number of write states is increased, descriptions of the first plane write and the second write plane in the present embodiment are omitted. When each of the first plane write and the second plane write is completed, the sequencer 14 finishes the write operation, and changes the semiconductor memory 10 from a busy state to a ready state.

In a cell unit CU in which first plane write and second plane write have been performed as described above, the threshold distributions of the memory cell transistors MT as described above with reference to FIG. 46 are formed, based on the write data for the eight pages and the data allocation which was described with reference to FIGS. 47 through 54.

Figure 57:
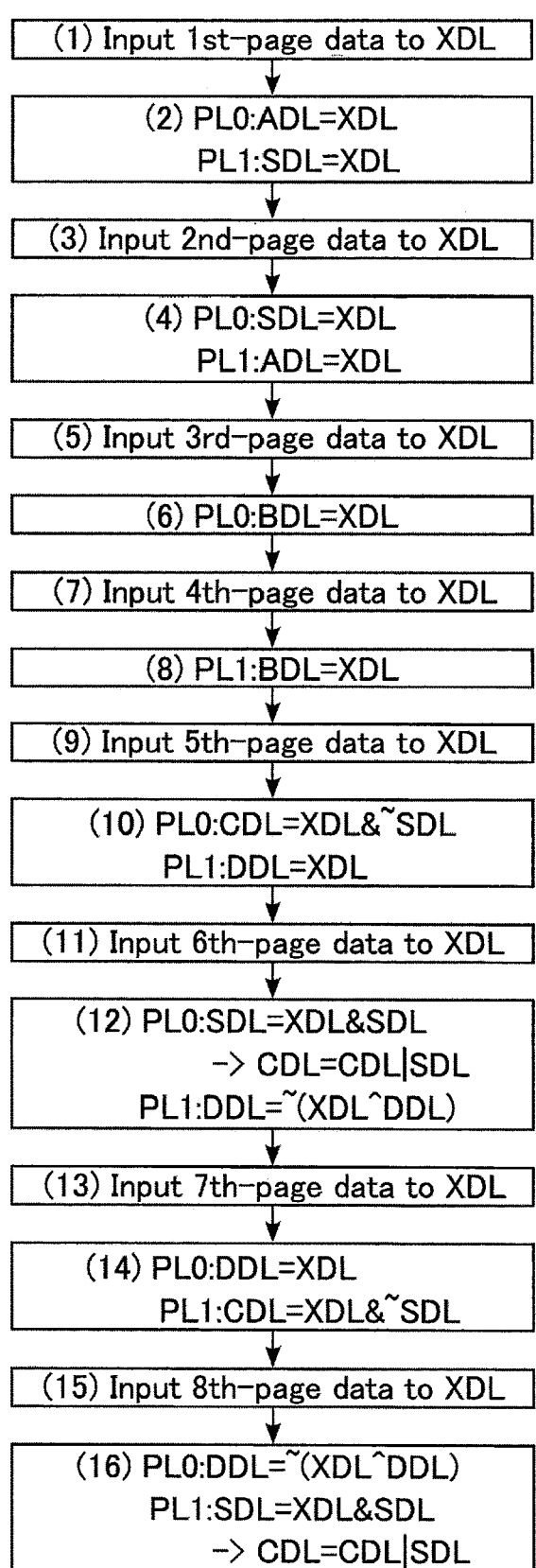
FIG. 57 is a diagram showing an example of an operation of the sequencer if the number of latch circuits is reduced in a write operation of the semiconductor memory according to the eighth embodiment.

In the foregoing description, eight latch circuits are provided in a sense amplifier unit SAU in the write operation in the semiconductor memory 10 according to the eighth embodiment; however, the number of the latch circuits can be reduced. In the following, with respect to a case where five latch circuits (latch circuits ADL through DDL, and XDL) are provided, an example of the operation performed by the sequencer 14 when command sets CS1 through CS8 are sent to the semiconductor memory 10 by the memory controller 20 will be described with reference to FIGS. 56 and 57. FIG. 57 is a flowchart showing an example of an operation performed by the sequencer 14 during a write operation in the semiconductor memory device 10 according to the eighth embodiment.

As shown in FIG. 56, the memory controller 20 first sends a command set CS1 to the semiconductor memory 10. The command set CS1 includes commands for instructing an operation for the first page, and includes write data DAT corresponding to the first page. The first-page data received by the semiconductor memory 10 is retained in the latch circuit XDL of the sense amplifier unit SAU belonging to each of the sense amplifier modules 17A and 17B (FIG. 57, (1)).

After receiving the command set CS1, the semiconductor memory 10 temporarily switches to a busy state, for example. Then, the sequencer 14 causes the sense amplifier module 17A to transfer the first-page data retained in the latch circuit XDL to, for example, the latch circuit ADL. Then, the sequencer 14 causes the sense amplifier module 17B to transfer the first-page data retained in the latch circuit XDL to, for example, the latch circuit SDL (FIG. 57, (2)).

Next, the memory controller 20 sends a command set CS2 to the semiconductor memory 10. The command set CS2 includes commands for instructing an operation for the second page, and includes write data DAT corresponding to the second page. The second-page data received by the semiconductor memory 10 is retained in the latch circuit XDL of the sense amplifier unit SAU within the sense amplifier modules 17A and 17B (FIG. 57, (3)).

After receiving the command set CS2, the semiconductor memory 10 temporarily switches to a busy state, for example. Then, the sequencer 14 causes the sense amplifier module 17A to transfer the second-page data retained in the latch circuit XDL to, for example, the latch circuit SDL. Then, the sequencer 14 causes the sense amplifier module 17B to transfer the second-page data retained in the latch circuit XDL to, for example, the latch circuit ADL (FIG. 57, (4)).

Next, the memory controller 20 sends a command set CS3 to the semiconductor memory 10. The command set CS3 includes commands for instructing an operation for the third page, and includes write data DAT corresponding to the third page. The third-page data received by the semiconductor memory 10 is retained in the latch circuit XDL of the sense amplifier unit SAU of each of the sense amplifier modules 17A and 17B (FIG. 57, (5)).

After receiving the command set CS3, the semiconductor memory 10 temporarily switches to a busy state, for example. Then, the sequencer 14 causes the sense amplifier module 17A to transfer the third-page data retained in the latch circuit XDL to, for example, the latch circuit BDL (FIG. 57, (6)).

Next, the memory controller 20 sends a command set CS4 to the semiconductor memory 10. The command set CS4 includes commands for instructing an operation for the fourth page, and includes write data DAT corresponding to the fourth page. The fourth-page data received by the semiconductor memory 10 is retained in the latch circuit XDL of the sense amplifier unit SAU of each of the sense amplifier modules 17A and 17B (FIG. 57, (7)).

After receiving the command set CS4, the semiconductor memory 10 temporarily switches to a busy state, for example. Then, the sequencer 14 causes the sense amplifier module 17B to transfer the fourth-page data retained in the latch circuit XDL to, for example, the latch circuit BDL (FIG. 57, (8)).

Next, the memory controller 20 sends a command set CS5 to the semiconductor memory 10. The command set CS5 includes commands for instructing an operation for the fifth page, and includes write data DAT corresponding to the fifth page. The fifth-page data received by the semiconductor memory 10 is retained in the latch circuit XDL of the sense amplifier unit SAU of each of the sense amplifier modules 17A and 17B (FIG. 57, (9)).

After receiving the command set CS5, the semiconductor memory 10 temporarily switches to a busy state, for example. The sequencer 14 causes the sense amplifier module 17A to transfer, to the latch circuit CDL for example, data "XDL&~SDL", which is obtained by performing an AND operation on the data retained in the latch circuit XDL and the data obtained by inverting the data retained in the latch circuit SDL. Then, the sequencer 14 causes the sense amplifier module 17B to transfer the data retained in the latch circuit XDL to, for example, the latch circuit DDL (FIG. 57, (10)). As a dynamic latch used for this operation, node SEN, a bit line BL, and a memory pillar MP, may be used, for example.

Next, the memory controller 20 sends a command set CS6 to the semiconductor memory 10. The command set CS6 includes commands for instructing an operation for the sixth page, and includes write data DAT corresponding to the sixth page. The sixth-page data received by the semiconductor memory 10 is retained in the latch circuit XDL of the sense amplifier unit SAU of each of the sense amplifier modules 17A and 17B (FIG. 57, (11)).

After receiving the command set CS6, the semiconductor memory 10 temporarily switches to a busy state, for example. The sequencer 14 causes the sense amplifier module 17A to transfer, to the latch circuit SDL for example, data "XDL&SDL", which is obtained by performing an AND operation on the data retained in the latch circuit XDL and the data retained in the latch circuit SDL. Subsequently, the sequencer 14 causes the sense amplifier module 17A to transfer, to the latch circuit CDL for example, data "CDL|SDL", which is obtained by performing an OR operation on the data retained in the latch circuit CDL and the data retained in the latch circuit SDL. The sequencer 14 causes the sense amplifier module 17B to transfer, to the latch circuit DDL for example, data "~(XDL^DDL)", which is obtained by performing an XNOR operation on the data retained in the latch circuit XDL and the data retained in the latch circuit DDL (FIG. 57, (12)).

Next, the memory controller 20 sends a command set CS7 to the semiconductor memory 10. The command set CS7 includes commands for instructing an operation for the seventh page, and includes write data DAT corresponding to the seventh page. The seventh-page data received by the semiconductor memory 10 is retained in the latch circuit XDL of the sense amplifier unit SAU of each of the sense amplifier modules 17A and 17B (FIG. 57, (13)).

After receiving the command set CS7, the semiconductor memory 10 temporarily switches to a busy state, for example. Then, the sequencer 14 causes the sense amplifier module 17A to transfer the seventh-page data retained in the latch circuit XDL to, for example, the latch circuit DDL. The sequencer 14 causes the sense amplifier module 17B to transfer, to the latch circuit CDL for example, data "XDL&~SDL", which is obtained by performing an AND operation on the data retained in the latch circuit XDL and the data obtained by inverting the data retained in the latch circuit SDL (FIG. 57, (14)).

Next, the memory controller 20 sends a command set CS8 to the semiconductor memory 10. The command set CS8 includes commands for instructing an operation for the eighth page, and includes write data DAT corresponding to the eighth page. The eighth-page data received by the semiconductor memory 10 is retained in the latch circuit XDL of the sense amplifier unit SAU of each of the sense amplifier modules 17A and 17B (FIG. 57, (15)).

After receiving the command set CS8, the semiconductor memory 10 temporarily switches to a busy state, for example. The sequencer 14 causes the sense amplifier module 17A to transfer, to the latch circuit DDL for example, data "~(XDL^DDL)", which is obtained by performing an XNOR operation on the data retained in the latch circuit XDL and the data retained in the latch circuit DDL. The sequencer 14 causes the sense amplifier module 17B to transfer, to the latch circuit SDL for example, data "XDL&SDL", which is obtained by performing an AND operation on the data retained in the latch circuit XDL and the data retained in the latch circuit SDL. Subsequently, the sequencer 14 causes the sense amplifier module 17B to transfer, to the latch circuit CDL for example, data "CDL|SDL", which is obtained by performing an OR operation on the data retained in the latch circuit CDL and the data retained in the latch circuit SDL (FIG. 57, (16)).

Then the sequencer 14 performs a write operation based on the data respectively retained in the latch circuits ADL, BDL, CDL, and DDL in each of the sense amplifier modules 17A and 17B.

The data retained in the latch circuits ADL, BDL, CDL, and DDL for each threshold voltage of the memory cell transistors MT in the example shown in FIG. 57 are shown below. Similarly, different data is allocated to each of the threshold voltages in each of plane PL1 and plane PL2.

(Example) "Threshold voltage of memory cell transistors MT": data retained in ADL/data retained in BDL/data retained in CDL/data retained in DDL"

(1) "Z" state: "1111" data
(2) "A" state: "1110" data
(3) "B" state: "1100" data
(4) "C" state: "1101" data
(5) "D" state: "1001" data
(6) "E" state: "1000" data
(7) "F" state: "1010" data
(8) "G" state: "1011" data
(9) "H" state: "0011" data
(10) "I" state: "0010" data
(11) "J" state: "0000" data
(12) "K" state: "0001" data
(13) "L" state: "0101" data
(14) "M" state: "0100" data
(15) "N" state: "0110" data
(16) "O" state: "0111" data

[8-2-2] Read Operation

The semiconductor memory 10 of the eighth embodiment is capable of performing a read operation within a unit of page. In the following, the read operations in which the first page, the second page, the third page, the fourth page, the fifth page, the sixth page, the seventh page, and the eighth page are respectively selected in the semiconductor memory 10 according to the eighth embodiment will be described.

In the explanation below, read operations for which the seventh and eighth pages are respectively selected will be referred to as a seventh-page read and an eighth-page read, respectively.

(First-Page Read)

FIG. 58 shows an example of a command sequence, and voltages to be applied to a selected word line WLsel in the first-page read in the semiconductor memory 10 according to the eighth embodiment.

As shown in FIG. 58, first, the memory controller 20 sequentially sends, for example, a command "01h", a command "00h", address information ADD, and a command "30h" to the semiconductor memory 10. Upon receipt of the command "30h", the semiconductor memory 10 changes to a busy state, and commences the first-page read.

The sequencer 14 in the first-page read performs a first plane read to plane PL1 but not to plane PL2.

For the first plane read in the first-page read, a read operation using the read voltage HR, for example, is performed. The read result obtained by using the read voltage HR is retained in the latch circuit ADL in the sense amplifier module 17A, for example.

When the first plane read is finished, the sequencer 14 causes the sense amplifier module to transfer the read result of the first plane read to the latch circuit XDL in plane PL1, and changes the semiconductor memory 10 from a busy state to a ready state.

The operation hereafter is the same as that of the first-page read described in the first embodiment; the logic circuit 18 confirms the read data of the first page based on the definitions of the data shown in FIG. 55, and outputs the confirmed read data DAT to the memory controller 20.

(Second-Page Read)

FIG. 59 shows an example of a command sequence, and voltages to be applied to a selected word line WLsel in the second-page read in the semiconductor memory 10 according to the eighth embodiment.

As shown in FIG. 59, first, the memory controller 20 sequentially sends, for example, a command "02h", a command "00h", address information ADD, and a command "30h" to the semiconductor memory 10. Upon receipt of the command "30h", the semiconductor memory 10 changes to a busy state, and commences the second-page read.

The sequencer 14 in the second-page read performs a second plane read operation to plane PL2 but not to plane PL1.

In the second plane read in the second-page read, a read operation using the read voltage HR, for example, is performed. The read result obtained by using the read voltage HR is retained in the latch circuit ADL in the sense amplifier module 17B, for example.

When the second plane read is finished, the sequencer 14 causes the sense amplifier module to transfer the read result of the second plane read to the latch circuit XDL in plane PL2, and changes the semiconductor memory 10 from a busy state to a ready state.

The operation hereafter is the same as that of the second-page read described in the first embodiment; the logic circuit 18 confirms the read data of the second page based on the definitions of the data shown in FIG. 55, and outputs the confirmed read data DAT to the memory controller 20.

(Third-Page Read)

FIG. 60 shows an example of a command sequence, and voltages to be applied to a selected word line WLsel in the third-page read in the semiconductor memory 10 according to the eighth embodiment.

As shown in FIG. 60, first, the memory controller 20 sequentially sends, for example, a command "03h", a command "00h", address information ADD, and a command "30h" to the semiconductor memory 10. Upon receipt of the command "30h", the semiconductor memory 10 changes to a busy state, and commences the third-page read.

The sequencer 14 in the third-page read performs a first plane read to plane PL1 but not to plane PL2.

In the first plane read in the third-page read, a read operation using the read voltages DR and LR, for example, is performed. The read result obtained by using the read voltages DR and LR is retained in the latch circuit ADL in the sense amplifier module 17A, for example.

When the first plane read is finished, the sequencer 14 causes the sense amplifier module 17 to transfer the read result of the first plane read to the latch circuit XDL in plane PL1, and changes the semiconductor memory 10 from a busy state to a ready state.

The operation hereafter is the same as that for the first-page read described in the first embodiment; the logic circuit 18 confirms the read data of the third page based on the definitions of the data shown in FIG. 55, and outputs the confirmed read data DAT to the memory controller 20.

(Fourth-Page Read)

FIG. 61 shows an example of a command sequence, and voltages to be applied to a selected word line WLsel in the fourth-page read in the semiconductor memory 10 according to the eighth embodiment.

As shown in FIG. 61, first, the memory controller 20 sequentially sends, for example, a command "04h", a command "00h", address information ADD, and a command "30h" to the semiconductor memory 10. Upon receipt of the command "30h", the semiconductor memory 10 changes to a busy state, and commences the fourth-page read.

The sequencer 14 in the fourth-page read performs a second plane read to plane PL2 but not to plane PL1.

In the second plane read in the fourth-page read, a read operation using the read voltages DR and LR, for example, is performed. The read result obtained by using the read voltages DR and LR is retained in the latch circuit ADL in the sense amplifier module 17B, for example.

When the second plane read is finished, the sequencer 14 causes the sense amplifier module 17 to transfer the read result of the second plane read to the latch circuit XDL in plane PL2, and changes the semiconductor memory 10 from a busy state to a ready state.

The operation hereafter is the same as that for the second-page read described in the first embodiment; the logic circuit 18 confirms the read data of the fourth page based on the definitions of the data shown in FIG. 55, and outputs the confirmed read data DAT to the memory controller 20.

(Fifth-Page Read)

Figure 62:
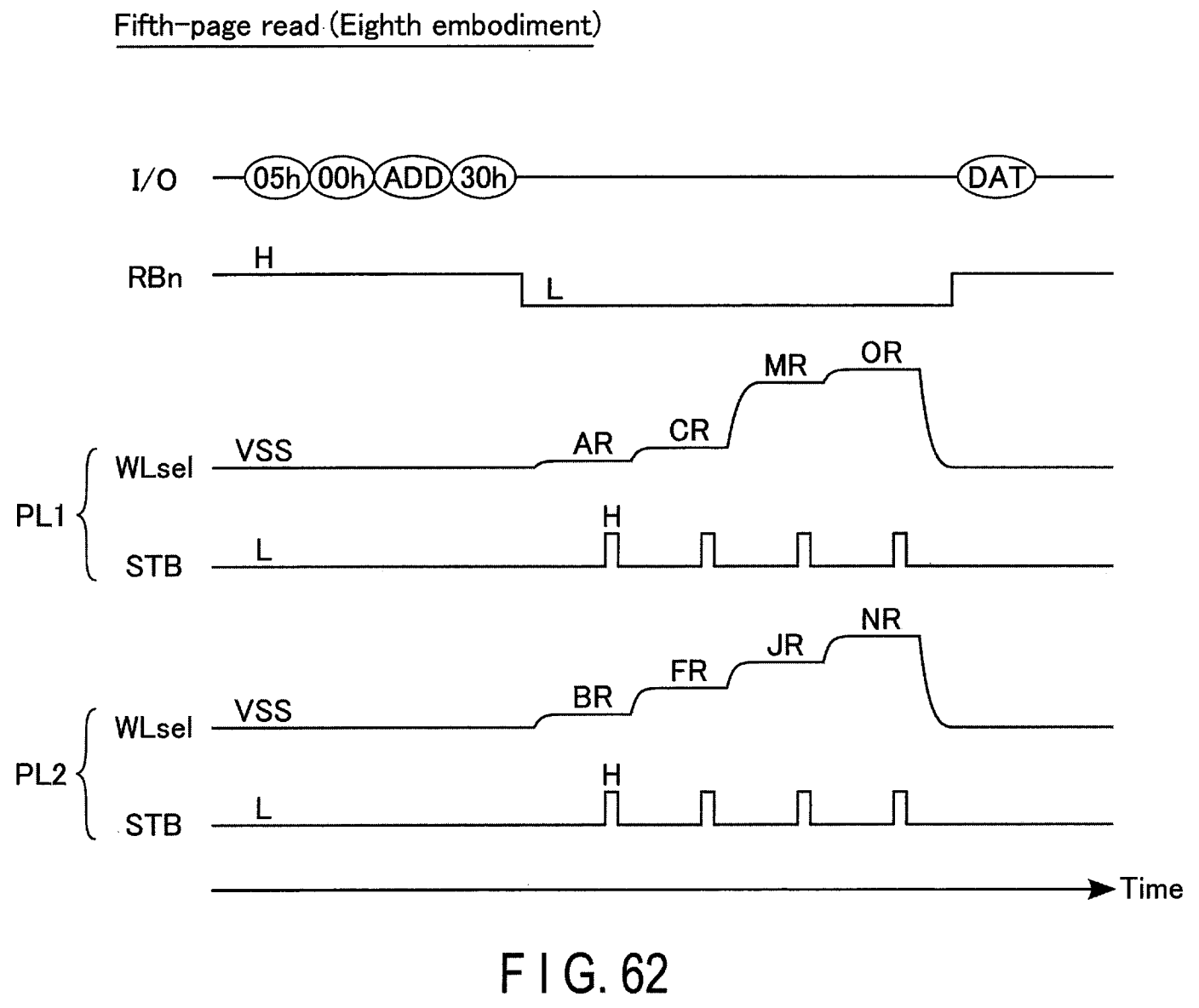

FIG. 62 shows an example of a command sequence, and voltages to be applied to a selected word line WLsel in the fifth-page read in the semiconductor memory 10 according to the eighth embodiment.

As shown in FIG. 62, first, the memory controller 20 sequentially sends, for example, a command "05h", a command "00h", address information ADD, and a command "30h" to the semiconductor memory 10. Upon receipt of the command "30h", the semiconductor memory 10 changes to a busy state, and commences the fifth-page read.

In the fifth-page read, the sequencer 14 performs the first plane read to plane PL1 and the second plane read to plane PL2 simultaneously and in parallel.

In the first plane read in the fifth-page read, a read operation using the read voltages AR, CR, MR and OR, for example, is performed. The read result obtained by using the read voltages AR, CR, MR, and OR is retained in the latch circuit ADL in the sense amplifier module 17A, for example.

For the second plane read in the fifth-page read, a read operation using the read voltages BR, FR, JR, and NR, for example, is performed. The read result obtained by using the read voltages BR, FR, JR, and NR is retained in the latch circuit ADL in the sense amplifier module 17B, for example.

When each of the first plane read and the second plane read is finished, the sequencer 14 causes the sense amplifier module to transfer the read result to the latch circuit XDL in each of plane PL1 and plane PL2, and changes the semiconductor memory 10 from busy state to a ready state.

The operation hereafter is the same as that for the third-page read described in the first embodiment; the logic circuit 18 confirms the read data of the fifth page based on the definitions of the data shown in FIG. 55, and outputs the confirmed read data DAT to the memory controller 20.

(Sixth-Page Read)

FIG. 63 shows an example of a command sequence, and voltages to be applied to a selected word line WLsel in the sixth-page read in the semiconductor memory 10 according to the eighth embodiment.

As shown in FIG. 62, first, the memory controller 20 sequentially sends, for example, a command "06h", a command "00h", address information ADD, and a command "30h" to the semiconductor memory 10. Upon receipt of the command "30h", the semiconductor memory 10 changes to a busy state, and commences the sixth-page read.

In the sixth-page read, the sequencer 14 performs the first plane read to plane PL1 and the second plane read to plane PL2 simultaneously and in parallel.

For the first plane read in the sixth-page read, a read operation using the read voltages BR, FR, JR, and NR, for example, is performed. The read result obtained by using the read voltages BR, FR, JR, and NR is retained in the latch circuit ADL in the sense amplifier module 17A, for example.

In the second plane read in the sixth-page read, a read operation using the read voltages AR, CR, IR, and KR, for example, is performed. The read result obtained by using the read voltages AR, CR, IR, and KR is retained in the latch circuit ADL in the sense amplifier module 17B, for example.

When each of the first plane read and the second plane read is finished, the sequencer 14 causes the sense amplifier module to transfer the read result to the latch circuit XDL in each of plane PL1 and plane PL2, and changes the semiconductor memory 10 from a busy state to a ready state.

The operation hereafter is the same as that for the third-page read described in the first embodiment; the logic circuit 18 confirms the read data of the sixth page based on the definitions of the data shown in FIG. 55, and outputs the confirmed read data DAT to the memory controller 20.

(Seventh-Page Read)

FIG. 64 shows an example of a command sequence, and voltages to be applied to a selected word line WLsel in the seventh-page read in the semiconductor memory 10 according to the eighth embodiment.

As shown in FIG. 64, first, the memory controller 20 sequentially sends, for example, a command "07h", a command "00h", address information ADD, and a command "30h" to the semiconductor memory 10. The command "07h" is a command for instructing the performance of an operation for the seventh page. Upon receipt of the command "30h", the semiconductor memory 10 changes to a busy state, and commences the seventh-page read.

In the seventh-page read, the sequencer 14 performs the first plane read to plane PL1 and the second plane read to plane PL2 simultaneously and in parallel.

For the first plane read in the seventh-page read, a read operation using the read voltages ER, GR, IR, and KR, for example, is performed. The read result obtained by using the read voltages ER, GR, IR, and KR is retained in the latch circuit ADL in the sense amplifier module 17A, for example.

For the second plane read in the seventh-page read, a read operation using the read voltages BR, FR, JR, and NR, for example, is performed. The read result obtained by using the read voltages BR, FR, JR, and NR is retained in the latch circuit ADL in the sense amplifier module 17B, for example.

When each of the first plane read and the second plane read is finished, the sequencer 14 causes the sense amplifier module 17 to transfer the read result to the latch circuit XDL in each of plane PL1 and plane PL2, and changes the semiconductor memory 10 from a busy state to a ready state.

The operation hereafter is the same as that for the third-page read described in the first embodiment; the logic circuit 18 confirms the read data of the seventh page based on the definitions of the data shown in FIG. 55, and outputs the confirmed read data DAT to the memory controller 20.

(Eighth-Page Read)

Figure 65:
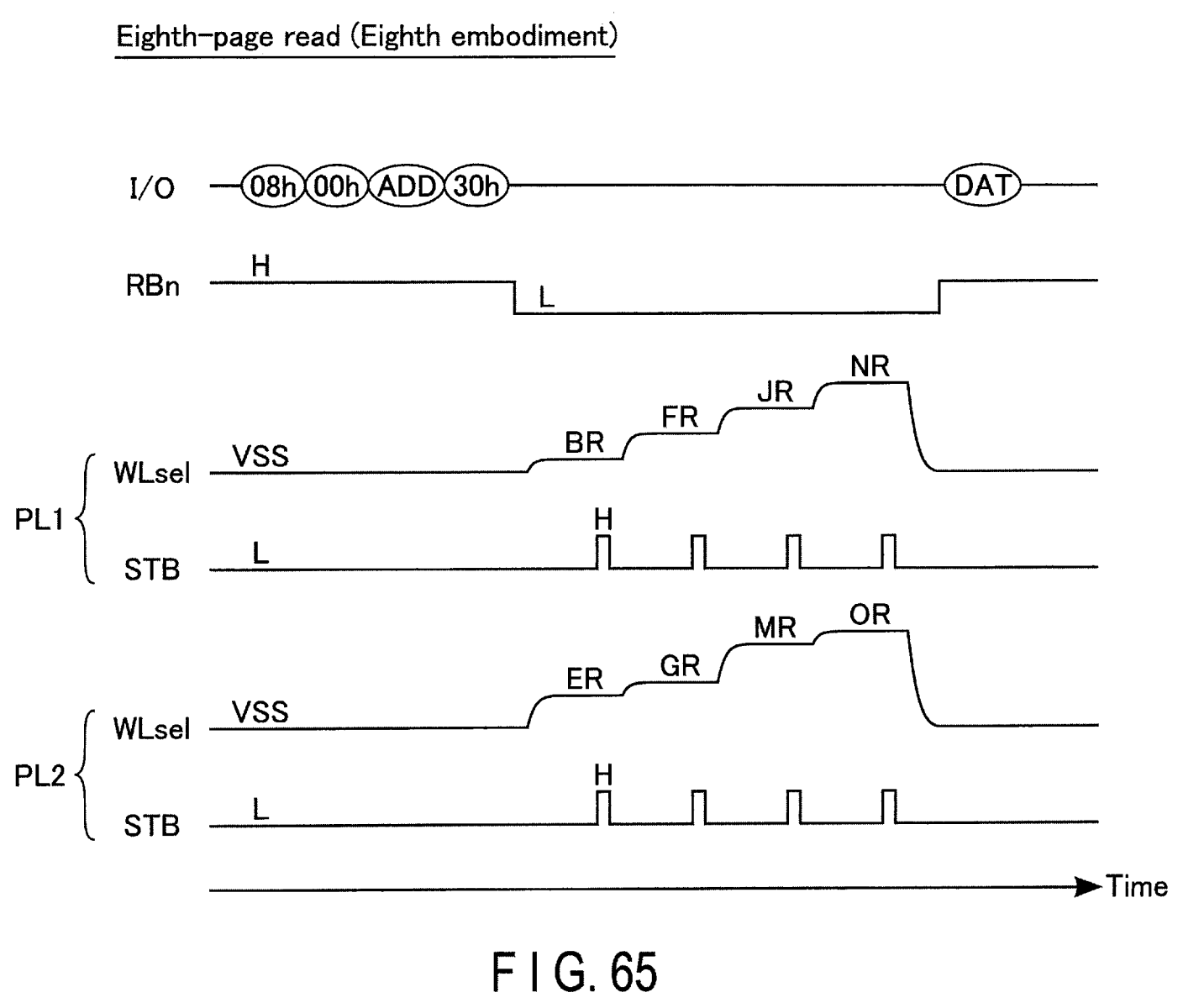

FIG. 65 is a diagram showing an example of a command sequence, and voltages to be applied to a selected word line WLsel in the eighth-page read in the semiconductor memory 10 according to the eighth embodiment.

As shown in FIG. 65, first, the memory controller 20 sequentially sends, for example, a command "08h", a command "00h", address information ADD, and a command "30h" to the semiconductor memory 10. The command "08h" is a command for instructing the performance of an operation for the eighth page. Upon receipt of the command "30h", the semiconductor memory 10 switches to a busy state, and commences the eighth-page read.

In the eighth-page read, the sequencer 14 performs the first plane read to plane PL1 and the second plane read to plane PL2 simultaneously and in parallel.

In the first plane read in the eighth-page read, a read operation using the read voltages BR, FR, JR and NR, for example, is performed. The read result obtained by using the read voltages BR, FR, JR, and NR is retained in the latch circuit ADL in the sense amplifier module 17A, for example.

In the second plane read in the eighth-page read, a read operation using the read voltages ER, GR, MR, and CR, for example, is performed. The read result obtained by using the read voltages ER, GR, MR, and OR is retained in the latch circuit ADL in the sense amplifier module 17B, for example.

The operation hereafter is the same as that for the third-page read described in the first embodiment; the logic circuit 18 confirms the read data of the eighth page based on the definitions of the data shown in FIG. 55, and outputs the confirmed read data DAT to the memory controller 20.

[8-3] Advantageous Effects of Eighth Embodiment

According to the above-described semiconductor memory 10 in the eighth embodiment, the speed of operations of reading multiple-bit data stored in the memory cells can be enhanced. Advantageous effects of the semiconductor memory 10 according to the eighth embodiment will be described in detail below.

As comparative examples of the eighth embodiment, an example where 4-bit data is stored per memory cell transistor MT will be described. FIG. 66 shows an example of a data allocation and read voltages in a comparative example of the eighth embodiment.

As shown in FIG. 66, in the comparative example of the eighth embodiment, to the threshold distributions at the "ER" state, the "A" state, the "B" state, the "C" state, the "D" state, the "E" state, the "F" state, the "G" state, the "H" state, the "I" state, the "J" state, the "K" state, the "L" state, the "M" state, the "N" state, and the "O" state, "1111 (uppermost bit/upper bit/middle bit/lower bit)" data, "1110" data, "1010" data, "1000" data, "1001" data, "0001" data, "0000" data, "0010" data, "0110" data, "0100" data, "1100" data, "1101" data, "0101" data, "0111" data, "0011" data, and "1011" data are respectively allocated.

In the comparative example of the eighth embodiment, similar to the explanation of FIG. 46, a read voltage and a verify voltage are set to each of the "A" state through the "O" state. Lower-page data is confirmed by a read result obtained by the use of each of the read voltages AR, DR, FR, and KR. Middle-page data is confirmed by a read result obtained by the use of each of the read voltages CR, GR, IR, and MR. Upper-page data is confirmed by a read result obtained by the use of each of the read voltages BR, HR, and NR. Uppermost-page data is confirmed by a read result obtained by the use of each of the read voltages ER, JR, LR, and OR. Such a data allocation is called, for example, "4-4-3-4 code" based on the number of times of page read. In the comparative example of the eighth embodiment, the number of times that read is performed per page is (4+4+3+4)/4=3.75.

Furthermore, in the semiconductor memory 10 according to the eighth embodiment, 8-bit data can be stored in a set of two memory cell transistors MT. In the semiconductor memory 10 according to the eighth embodiment, the number of times that read is performed per page is (1+1+2+2+4+4+4+4)/8=2.75.

Thus, in the semiconductor memory 10 in the eighth embodiment, storage capacity per memory cell transistor MT is similar to that in the comparative example of the eighth embodiment. On the other hand, the number of times that read is performed per page in the semiconductor memory 10 of the eighth embodiment is lower than that in the comparative example of the eighth embodiment.

It is thus possible to reduce the number of times that read is performed in a read operation performed within a unit of page in the semiconductor memory 10 in the eighth embodiment. Accordingly, the semiconductor memory 10 according to the eighth embodiment can realize storage capacity similar to that of the comparative example, and can enhance the speed of the read operation compared to the speed in the comparative example.

In the semiconductor memory 10 according to the eighth embodiment, since the data is confirmed only by the read result of plane PL1 in each of the first-page read and the third-page read, the read operation to plane PL2 is omitted. Similarly, since the data is confirmed only by the read result of plane PL2 in each of the second-page read and the fourth-page read, the read operation to plane PL1 is omitted.

Thus, in a per-page read operation performed in the semiconductor memory 10 of the eighth embodiment, it is possible to omit a read operation to either one of the planes as appropriate. As a result, the semiconductor memory 10 according to the eighth embodiment can reduce power consumption in a read operation, similarly to the first embodiment.

The semiconductor memory 10 of the eighth embodiment can perform the sequential read for two-page data, just as it can in the second embodiment and the seventh embodiment. Hereinafter, an example of four types of the sequential read for two-page data will be briefly described below.

In the sequential read for the first and second pages, the semiconductor memory 10 performs the first plane read to plane PL1 and the second plane read to plane PL2 simultaneously and in parallel. In this case, the semiconductor memory 10 can read two-page data by performing a read operation at one state to each of planes PL1 and PL2.

In the sequential read for the third and fourth pages, the semiconductor memory 10 performs the first plane read to plane PL1 and the second plane read to plane PL2 simultaneously and in parallel. In this case, the semiconductor memory 10 can read two-page data by performing a read operation at two states to each of planes PL1 and PL2.

In the sequential read for the fifth and seventh pages, the semiconductor memory 10 performs the first plane read to plane PL1 and the second plane read to plane PL2 simultaneously and in parallel. In this case, the semiconductor memory 10 is required to perform a read operation at eight states in plane PL1, but can read two-page data by performing a read operation at four states in plane PL2; therefore, it is possible to reduce power consumption.

In the sequential read for the sixth and eighth pages, the semiconductor memory 10 performs the first plane read to plane PL1 and the second plane read to plane PL2 simultaneously and in parallel. In this case, the semiconductor memory 10 is required the performance of a read operation at eight states in plane PL2, but can read two-page data by performing a read operation at four states in plane PL1; therefore, it is possible to reduce power consumption.

[9] Ninth Embodiment

The semiconductor memory 10 of the ninth embodiment is a modification of the eighth embodiment. The semiconductor memory 10 of the ninth embodiment performs a read operation with the maximum number of times that read is performed per page, said number of times being lower than that in the eighth embodiment, through the use of a data allocation different from that of the eighth embodiment. In the following, differences between the semiconductor memory 10 of the ninth embodiment and that of the eighth embodiment will be described.

[9-1] Data Allocation

FIGS. 67 through 74 show an example of data allocation for the threshold distributions of the memory cell transistors MT in the semiconductor memory 10 according to the ninth embodiment.

As shown in FIGS. 67 through 74, in the semiconductor memory 10 according to the ninth embodiment, 256 combinations are possible by combining the threshold voltages in the memory cell transistors MT in plane PL1 with the threshold voltages in the memory cell transistors MT in plane PL2, similarly to the eighth embodiment. Furthermore, in the ninth embodiment, 8-bit data is allocated to each of the 256 combinations, as shown below:

(Example) "Threshold voltage of memory cell transistors MT in plane PL1", "threshold voltage of memory cell transistors MT in plane PL2": "first bit/second bit/third bit/fourth bit/fifth bit/sixth bit/seventh bit/eighth bit" data (1) "Z" state, "Z" state: "00000000" data
(2) "Z" state, "A" state: "10100000" data
(3) "Z" state, "B" state: "10100001" data
(4) "Z" state, "C" state: "10110001" data (5) "Z" state, "D" state: "10110101" data
(6) "Z" state, "E" state: "10111111" data
(7) "Z" state, "F" state: "10111011" data
(8) "Z" state, "G" state: "11111011" data
(9) "Z" state, "H" state: "11111010" data
(10) "Z" state, "I" state: "01011010" data
(11) "Z" state, "J" state: "01011011" data
(12) "Z" state, "K" state: "00011011" data
(13) "Z" state, "L" state: "00000001" data
(14) "Z" state, "M" state: "00010001" data
(15) "Z" state, "N" state: "00010101" data
(16) "Z" state, "O" state: "00011111" data
(17) "A" state, "Z" state: "01010000" data
(18) "A" state, "A" state: "11110000" data
(19) "A" state, "B" state: "11110001" data
(20) "A" state, "C" state: "11100001" data
(21) "A" state, "D" state: "11100101" data
(22) "A" state, "E" state: "11101111" data
(23) "A" state, "F" state: "11101011" data
(24) "A" state, "G" state: "10101011" data
(25) "A" state, "H" state: "10101010" data
(26) "A" state, "I" state: "00001010" data
(27) "A" state, "J" state: "00001011" data
(28) "A" state, "K" state: "01001011" data
(29) "A" state, "L" state: "01010001" data
(30) "A" state, "M" state: "01000001" data
(31) "A" state, "N" state: "01000101" data
(32) "A" state, "O" state: "01001111" data
(33) "B" state, "Z" state: "01010010" data
(34) "B" state, "A" state: "11110010" data
(35) "B" state, "B" state: "11110011" data
(36) "B" state, "C" state: "11100011" data
(37) "B" state, "D" state: "11100111" data
(38) "B" state, "E" state: "11101101" data
(39) "B" state, "F" state: "11101001" data
(40) "B" state, "G" state: "10101001" data
(41) "B" state, "H" state: "10101000" data
(42) "B" state, "I" state: "00001000" data
(43) "B" state, "J" state: "00001001" data
(44) "B" state, "K" state: "01001001" data
(45) "B" state, "L" state: "01010011" data
(46) "B" state, "M" state: "01000011" data
(47) "B" state, "N" state: "01000111" data
(48) "B" state, "O" state: "01001101" data
(49) "C" state, "Z" state: "01110010" data
(50) "C" state, "A" state: "11010010" data
(51) "C" state, "B" state: "11010011" data
(52) "C" state, "C" state: "11000011" data
(53) "C" state, "D" state: "11000111" data
(54) "C" state, "E" state: "11001101" data
(55) "C" state, "F" state: "11001001" data
(56) "C" state, "G" state: "10001001" data
(57) "C" state, "H" state: "10001000" data
(58) "C" state, "I" state: "00101000" data
(59) "C" state, "J" state: "00101001" data
(60) "C" state, "K" state: "01101001" data
(61) "C" state, "L" state: "01110011" data
(62) "C" state, "M" state: "01100011" data
(63) "C" state, "N" state: "01100111" data
(64) "C" state, "O" state: "01101101" data
(65) "D" state, "Z" state: "01111010" data
(66) "D" state, "A" state: "11011010" data
(67) "D" state, "B" state: "11011011" data
(68) "D" state, "C" state: "11001011" data
(69) "D" state, "D" state: "11001111" data
(70) "D" state, "E" state: "11000101" data
(71) "D" state, "F" state: "11000001" data

(72) "D" state, "G" state: "10000001" data
(73) "D" state, "H" state: "10000000" data
(74) "D" state, "I" state: "00100000" data
(75) "D" state, "J" state: "00100001" data
(76) "D" state, "K" state: "01100001" data
(77) "D" state, "L" state: "01111011" data
(78) "D" state, "M" state: "01101011" data
(79) "D" state, "N" state: "01101111" data
(80) "D" state, "O" state: "01100101" data
(81) "E" state, "Z" state: "01111111" data
(82) "E" state, "A" state: "11011111" data
(83) "E" state, "B" state: "11011110" data
(84) "E" state, "C" state: "11001110" data
(85) "E" state, "D" state: "11001010" data
(86) "E" state, "E" state: "11000000" data
(87) "E" state, "F" state: "11000100" data
(88) "E" state, "G" state: "10000100" data
(89) "E" state, "H" state: "10000101" data
(90) "E" state, "I" state: "00100101" data
(91) "E" state, "J" state: "00100100" data
(92) "E" state, "K" state: "01100100" data
(93) "E" state, "L" state: "01111110" data
(94) "E" state, "M" state: "01101110" data
(95) "E" state, "N" state: "01101010" data
(96) "E" state, "O" state: "01100000" data
(97) "F" state, "Z" state: "01110111" data
(98) "F" state, "A" state: "11010111" data
(99) "F" state, "B" state: "11010110" data
(100) "F" state, "C" state: "11000110" data
(101) "F" state, "D" state: "11000010" data
(102) "F" state, "E" state: "11001000" data
(103) "F" state, "F" state: "11001100" data
(104) "F" state, "G" state: "10001100" data
(105) "F" state, "H" state: "10001101" data
(106) "F" state, "I" state: "00101101" data
(107) "F" state, "J" state: "00101100" data
(108) "F" state, "K" state: "01101100" data
(109) "F" state, "L" state: "01110110" data
(110) "F" state, "M" state: "01100110" data
(111) "F" state, "N" state: "01100010" data
(112) "F" state, "O" state: "01101000" data
(113) "G" state, "Z" state: "11110111" data
(114) "G" state, "A" state: "01010111" data
(115) "G" state, "B" state: "01010110" data
(116) "G" state, "C" state: "01000110" data
(117) "G" state, "D" state: "01000010" data
(118) "G" state, "E" state: "01001000" data
(119) "G" state, "F" state: "01001100" data
(120) "G" state, "G" state: "00001100" data
(121) "G" state, "H" state: "00001101" data
(122) "G" state, "I" state: "10101101" data
(123) "G" state, "J" state: "10101100" data
(124) "G" state, "K" state: "11101100" data
(125) "G" state, "L" state: "11110110" data
(126) "G" state, "M" state: "11100110" data
(127) "G" state, "N" state: "11100010" data
(128) "G" state, "O" state: "11101000" data
(129) "H" state, "Z" state: "11110101" data
(130) "H" state, "A" state: "01010101" data
(131) "H" state, "B" state: "01010100" data
(132) "H" state, "C" state: "01000100" data
(133) "H" state, "D" state: "01000000" data
(134) "H" state, "E" state: "01001010" data
(135) "H" state, "F" state: "01001110" data
(136) "H" state, "G" state: "00001110" data
(137) "H" state, "H" state: "00001111" data
(138) "H" state, "I" state: "10101111" data (139) "H" state, "J" state: "10101110" data
(140) "H" state, "K" state: "11101110" data
(141) "H" state, "L" state: "11110100" data
(142) "H" state, "M" state: "11100100" data
(143) "H" state, "N" state: "11100000" data
(144) "H" state, "O" state: "11101010" data
(145) "I" state, "Z" state: "10100101" data
(146) "I" state, "A" state: "00000101" data
(147) "I" state, "B" state: "00000100" data
(148) "I" state, "C" state: "00010100" data
(149) "I" state, "D" state: "00010000" data
(150) "I" state, "E" state: "00011010" data
(151) "I" state, "F" state: "00011110" data
(152) "I" state, "G" state: "01011110" data
(153) "I" state, "H" state: "01011111" data
(154) "I" state, "I" state: "11111111" data
(155) "I" state, "J" state: "11111110" data
(156) "I" state, "K" state: "10111110" data
(157) "I" state, "L" state: "10100100" data
(158) "I" state, "M" state: "10110100" data
(159) "I" state, "N" state: "10110000" data
(160) "I" state, "O" state: "10111010" data
(161) "J" state, "Z" state: "10100111" data
(162) "J" state, "A" state: "00000111" data
(163) "J" state, "B" state: "00000110" data
(164) "J" state, "C" state: "00010110" data
(165) "J" state, "D" state: "00010010" data
(166) "J" state, "E" state: "00011000" data
(167) "J" state, "F" state: "00011100" data
(168) "J" state, "G" state: "01011100" data
(169) "J" state, "H" state: "01011101" data
(170) "J" state, "I" state: "11111101" data
(171) "J" state, "J" state: "11111100" data
(172) "J" state, "K" state: "10111100" data
(173) "J" state, "L" state: "10100110" data
(174) "J" state, "M" state: "10110110" data
(175) "J" state, "N" state: "10110010" data
(176) "J" state, "O" state: "10111000" data
(177) "K" state, "Z" state: "00100111" data
(178) "K" state, "A" state: "10000111" data
(179) "K" state, "B" state: "10000110" data
(180) "K" state, "C" state: "10010110" data
(181) "K" state, "D" state: "10010010" data
(182) "K" state, "E" state: "10011000" data
(183) "K" state, "F" state: "10011100" data
(184) "K" state, "G" state: "11011100" data
(185) "K" state, "H" state: "11011101" data
(186) "K" state, "I" state: "01111101" data
(187) "K" state, "J" state: "01111100" data
(188) "K" state, "K" state: "00111100" data
(189) "K" state, "L" state: "00100110" data
(190) "K" state, "M" state: "00110110" data
(191) "K" state, "N" state: "00110010" data
(192) "K" state, "O" state: "00111000" data
(193) "L" state, "Z" state: "00000010" data
(194) "L" state, "A" state: "10100010" data
(195) "L" state, "B" state: "10100011" data
(196) "L" state, "C" state: "10110011" data
(197) "L" state, "D" state: "10110111" data
(198) "L" state, "E" state: "10111101" data
(199) "L" state, "F" state: "10111001" data
(200) "L" state, "G" state: "11111001" data
(201) "L" state, "H" state: "11111100" data
(202) "L" state, "I" state: "01011000" data
(203) "L" state, "J" state: "01011001" data
(204) "L" state, "K" state: "00011001" data
(205) "L" state, "L" state: "00000011" data (206) "L" state, "M" state: "00010011" data
(207) "L" state, "N" state: "00010111" data
(208) "L" state, "O" state: "00011101" data
(209) "M" state, "Z" state: "00100010" data
(210) "M" state, "A" state: "10000010" data
(211) "M" state, "B" state: "10000011" data
(212) "M" state, "C" state: "10010011" data
(213) "M" state, "D" state: "10010111" data
(214) "M" state, "E" state: "10011101" data
(215) "M" state, "F" state: "10011001" data
(216) "M" state, "G" state: "11011001" data
(217) "M" state, "H" state: "11011000" data
(218) "M" state, "I" state: "01111000" data
(219) "M" state, "J" state: "01111001" data
(220) "M" state, "K" state: "00111001" data
(221) "M" state, "L" state: "00100011" data
(222) "M" state, "M" state: "00110011" data
(223) "M" state, "N" state: "00110111" data
(224) "M" state, "O" state: "00111101" data
(225) "N" state, "Z" state: "00101010" data
(226) "N" state, "A" state: "10001010" data
(227) "N" state, "B" state: "10001011" data
(228) "N" state, "C" state: "10011011" data
(229) "N" state, "D" state: "10011111" data
(230) "N" state, "E" state: "10010101" data
(231) "N" state, "F" state: "10010001" data
(232) "N" state, "G" state: "11010001" data
(233) "N" state, "H" state: "11010000" data
(234) "N" state, "I" state: "01110000" data
(235) "N" state, "J" state: "01110001" data
(236) "N" state, "K" state: "00110001" data
(237) "N" state, "L" state: "00101011" data
(238) "N" state, "M" state: "00111011" data
(239) "N" state, "N" state: "00111111" data
(240) "N" state, "O" state: "00110101" data
(241) "O" state, "Z" state: "00101111" data
(242) "O" state, "A" state: "10001111" data
(243) "O" state, "B" state: "10001110" data
(244) "O" state, "C" state: "10011110" data
(245) "O" state, "D" state: "10011010" data
(246) "O" state, "E" state: "10010000" data
(247) "O" state, "F" state: "10010100" data
(248) "O" state, "G" state: "11010100" data
(249) "O" state, "H" state: "11010101" data
(250) "O" state, "I" state: "01110101" data
(251) "O" state, "J" state: "01110100" data
(252) "O" state, "K" state: "00110100" data
(253) "O" state, "L" state: "00101110" data
(254) "O" state, "M" state: "00111110" data
(255) "O" state, "N" state: "00111010" data
(256) "O" state, "O" state: "00110000" data FIG. 75 shows read voltages that are set for the data allocation shown in FIGS. 67 through 74, and definitions of read data to be applied to the read results of the pages.

As shown in FIG. 75, the first-page data is confirmed as a result of reading performed to plane PL1 with the use of the read voltages GR and KR, and as a result of reading performed to plane PL2 with the use of the read voltages AR and IR.

The second-page data is confirmed as a result of reading performed to plane PL1 with the use of the read voltages AR and IR, and as a result of reading performed to plane PL2 with the use of the read voltages GR and KR.

The third-page data is confirmed as a result of reading performed to plane PL1 with the use of the read voltages CR, LR, and MR, and as a result of reading performed to plane PL2 with the use of the read voltages AR and IR.

The fourth-page data is confirmed as a result of reading performed to plane PL1 with the use of the read voltages AR and IR, and as a result of reading performed to plane PL2 with the use of the read voltages CR, LR, and MR.

The fifth-page data is confirmed as a result of reading performed to plane PL1 with the use of the read voltages DR, FR, and NR, and as a result of reading performed to plane PL2 with the use of the read voltages ER, LR, and OR.

The sixth-page data is confirmed as a result of reading performed to plane PL1 with the use of the read voltages ER, LR, and OR, and as a result of reading performed to plane PL2 with the use of the read voltages DR, FR, and NR.

The seventh-page data is confirmed as a result of reading performed to plane PL1 with the use of the read voltages BR, HR, and JR, and as a result of reading performed to plane PL2 with the use of the read voltages ER, LR, and OR.

The eighth-page data is confirmed as a result of reading performed to plane PL1 with the use of the read voltages ER, LR, and OR, and as a result of reading performed to plane PL2 with the use of the read voltages BR, HR, and JR.

The read data based on results of a read operation in each of plane PL1 and plane PL2 is defined as follows:

(Example) Read operation: (result of reading plane PL1, result of reading plane PL2, read data)×4 types First-page read: (0, 0, 0), (1, 0, 1), (0, 1, 1), (1, 1, 0)
Second-page read: (0, 0, 0), (1, 0, 1), (0, 1, 1), (1, 1, 0)
Third-page read: (0, 0, 0), (1, 0, 1), (0, 1, 1), (1, 1, 0)
Fourth-page read: (0, 0, 0), (1, 0, 1), (0, 1, 1), (1, 1, 0)
Fifth-page read: (0, 0, 0), (1, 0, 1), (0, 1, 1), (1, 1, 0)
Sixth-page read: (0, 0, 0), (1, 0, 1), (0, 1, 1), (1, 1, 0)
Seventh-page read: (0, 0, 0), (1, 0, 1), (0, 1, 1), (1, 1, 0)
Eighth-page read: (0, 0, 0), (1, 0, 1), (0, 1, 1), (1, 1, 0)

Since the rest of the configuration of the semiconductor memory 10 according to the ninth embodiment is the same as that of the semiconductor memory 10 according to the first embodiment, detailed descriptions of the rest of the configuration are omitted.

[9-2] Write Operation

Next, a write operation of the semiconductor memory 10 according to the ninth embodiment will be described. Since the read operation of the ninth embodiment is the same as that of the eighth embodiment, except that the read voltages shown in FIG. 75 are used in a read operation for each page, descriptions of the read operation are omitted.

Since the write operation in a case where eight or more latch circuits are included in the semiconductor memory 10 of the ninth embodiment is the same as that of the eighth embodiment, descriptions of the write operation are omitted. In the following, with respect to a case where the number of the latch circuits is decreased to five (latch circuits ADL through DDL, and XDL) are provided, an example of the operation performed by the sequencer 14 when command sets CS1 through CS8 are sent to the semiconductor memory 10 by the memory controller 20, will be described with reference to FIGS. 56 and 76. FIG. 76 is a flowchart showing an example of an operation performed by the sequencer 14 during a write operation in the semiconductor memory device 10 according to the ninth embodiment.

As shown in FIG. 56, the memory controller 20 first sends a command set CS1 to the semiconductor memory 10. The command set CS1 includes commands for instructing an operation for the first page, and includes write data DAT corresponding to the first page. The first-page data received by the semiconductor memory 10 is retained in the latch circuit XDL of the sense amplifier unit SAU of each of the sense amplifier modules 17A and 17B (FIG. 76, (1)).

After receiving the command set CS1, the semiconductor memory 10 temporarily switches to a busy state, for example. Then, the sequencer 14 causes the sense amplifier module 17A to transfer the first-page data retained in the latch circuit XDL to, for example, the latch circuit CDL. Then, the sequencer 14 causes the sense amplifier module 17B to transfer the first-page data retained in the latch circuit XDL to, for example, the latch circuit ADL (FIG. 76, (2)).

Next, the memory controller 20 sends a command set CS2 to the semiconductor memory 10. The command set CS2 includes commands for instructing an operation for the second page, and includes write data DAT corresponding to the second page. The second-page data received by the semiconductor memory 10 is retained in the latch circuit XDL of the sense amplifier unit SAU of each of the sense amplifier modules 17A and 17B (FIG. 76, (3)).

After receiving the command set CS2, the semiconductor memory 10 temporarily switches to a busy state, for example. Then, the sequencer 14 causes the sense amplifier module 17A to transfer the second-page data retained in the latch circuit XDL to, for example, the latch circuit ADL. Then, the sequencer 14 causes the sense amplifier module 17B to transfer the second-page data retained in the latch circuit XDL to, for example, the latch circuit CDL (FIG. 76, (4)).

Next, the memory controller 20 sends a command set CS3 to the semiconductor memory 10. The command set CS3 includes commands for instructing an operation for the third page, and includes write data DAT corresponding to the third page. The third-page data received by the semiconductor memory 10 is retained in the latch circuit XDL of the sense amplifier unit SAU of each of the sense amplifier modules 17A and 17B (FIG. 76, (5)).

After receiving the command set CS3, the semiconductor memory 10 temporarily switches to a busy state, for example. The sequencer 14 causes the sense amplifier module 17A to transfer, to the latch circuit CDL for example, data "XDL^CDL", which is obtained by performing an XOR operation on the data retained in the latch circuit XDL and the data obtained by inverting the data retained in the latch circuit CDL. The sequencer 14 causes the sense amplifier module 17B to transfer, to the latch circuit SDL for example, data "XDL^ADL", which is obtained by performing an XOR operation on the data retained in the latch circuit XDL and the data obtained by inverting the data retained in the latch circuit ADL (FIG. 76, (6)). As a dynamic latch used for this operation, node SEN, a bit line BL, and a memory pillar MP, may be used, for example.

Next, the memory controller 20 sends a command set CS4 to the semiconductor memory 10. The command set CS4 includes commands for instructing an operation for the fourth page, and includes write data DAT corresponding to the fourth page. The fourth-page data received by the semiconductor memory 10 is retained in the latch circuit XDL of the sense amplifier unit SAU of each of the sense amplifier modules 17A and 17B (FIG. 76, (7)).

After receiving the command set CS4, the semiconductor memory 10 temporarily switches to a busy state, for example. The sequencer 14 causes the sense amplifier module 17A to transfer, to the latch circuit BDL for example, data "XDL^ADL", which is obtained by performing an XOR operation on the data retained in the latch circuit XDL and the data obtained by inverting the data retained in the latch circuit ADL. The sequencer 14 causes the sense amplifier module 17B to transfer, to the latch circuit CDL for example, data "XDL^CDL", which is obtained by performing an XOR operation on the data retained in the latch circuit XDL and the data obtained by inverting the data retained in the latch circuit CDL (FIG. 76, (8)).

Next, the memory controller 20 sends a command set CS5 to the semiconductor memory 10. The command set CS5 includes commands for instructing an operation for the fifth page, and includes write data DAT corresponding to the fifth page. The fifth-page data received by the semiconductor memory 10 is retained in the latch circuit XDL of the sense amplifier unit SAU of each of the sense amplifier modules 17A and 17B (FIG. 76, (9)).

After receiving the command set CS5, the semiconductor memory 10 temporarily switches to a busy state, for example. Then, the sequencer 14 causes each of the sense amplifier modules 17A and 17B to transfer the fifth-page data retained in the latch circuit XDL to, for example, the latch circuit DDL (FIG. 76, (10)).

Next, the memory controller 20 sends a command set CS6 to the semiconductor memory 10. The command set CS6 includes commands for instructing an operation for the sixth page, and includes write data DAT corresponding to the sixth page. The sixth-page data received by the semiconductor memory 10 is retained in the latch circuit XDL of the sense amplifier unit SAU of each of the sense amplifier modules 17A and 17B (FIG. 76, (11)).

After receiving the command set CS6, the semiconductor memory 10 temporarily switches to a busy state, for example. The sequencer 14 causes the sense amplifier module 17A to transfer, to the latch circuit DDL for example, data "~(XDL^DDL)", which is obtained by performing an XNOR operation on the data retained in the latch circuit XDL and the data retained in the latch circuit DDL. Subsequently, the sequencer 14 causes the sense amplifier module 17A to transfer data "(XDL^CDL) &~DDL|XDL&DDL" to the latch circuit SDL for example. Said data is obtained by performing an OR operation on: the data obtained through performance of an AND operation on the data obtained by execution of an XOR operation on the data retained in the latch circuit XDL and on the data retained in the latch circuit CDL, and on the data obtained by inverting the data retained in the latch circuit DDL; and on the data obtained by performing an AND operation on the data retained in the latch circuit XDL and the data retained in the latch circuit DDL. The sequencer 14 further causes the sense amplifier module 17A to transfer data "(ADL^SDL) &~BDL|ADL&BDL" to the latch circuit ADL for example. Said data is obtained by performing an OR operation on: the data obtained through performance of an AND operation on the data obtained by execution of an XOR operation on the data retained in the latch circuit ADL and the data retained in the latch circuit SDL, and on the data obtained by inverting the data retained in the latch circuit BDL; and on the data obtained by performing an AND operation on the data retained in the latch circuit ADL and the data retained in the latch circuit BDL.

The sequencer 14 causes the sense amplifier module 17B to transfer, to the latch circuit DDL for example, data "~(XDL^DDL)", which is obtained by performing an XNOR operation on the data retained in the latch circuit XDL and the data retained in the latch circuit DDL. Subsequently, the sequencer 14 causes the sense amplifier module 17B to transfer data "(XDL^SDL) &~DDL|XDL&DDL" to the latch circuit BDL for example. Said data is obtained by performing an OR operation on: the data obtained through performance of an AND operation on the data obtained by execution of an XOR operation on the data retained in the latch circuit XDL and the data retained in the latch circuit SDL, and on the data obtained by inverting the data retained in the latch circuit DDL; and on the data obtained by performing an AND operation to the data retained in the latch circuit XDL and the data retained in the latch circuit DDL (FIG. 76, (12)).

Next, the memory controller 20 sends a command set CS7 to the semiconductor memory 10. The command set CS7 includes commands for instructing an operation for the seventh page, and includes write data DAT corresponding to the seventh page. The seventh-page data received by the semiconductor memory 10 is retained in the latch circuit XDL of the sense amplifier unit SAU of each of the sense amplifier modules 17A and 17B (FIG. 76, (13)).

After receiving the command set CS7, the semiconductor memory 10 temporarily switches to a busy state, for example. Then, the sequencer 14 causes the sense amplifier module 17A to transfer the seventh-page data retained in the latch circuit XDL to, for example, the latch circuit SDL. Then, the sequencer 14 causes the sense amplifier module 17B to transfer the seventh-page data retained in the latch circuit XDL to, for example, the latch circuit DDL (FIG. 76, (14)).

Next, the memory controller 20 sends a command set CS8 to the semiconductor memory 10. The command set CS8 includes commands for instructing an operation for the eighth page, and includes write data DAT corresponding to the eighth page. The eighth-page data received by the semiconductor memory 10 is retained in the latch circuit XDL of the sense amplifier unit SAU of each of the sense amplifier modules 17A and 17B (FIG. 76, (15)).

After receiving the command set CS8, the semiconductor memory 10 temporarily switches to a busy state, for example. The sequencer 14 causes the sense amplifier module 17A to transfer, to the latch circuit SDL for example, data "~(XDL^SDL)", which is obtained by performing an XOR operation on the data retained in the latch circuit XDL and the data retained in the latch circuit SDL. Subsequently, the sequencer 14 causes the sense amplifier module 17A to transfer data "(XDL^BDL)&~SDL|XDL&SDL" to the latch circuit BDL for example. Said data is obtained by performing an OR operation on: the data obtained through performance of an AND operation on the data obtained by execution of an XOR operation on the data retained in the latch circuit XDL and the data retained in the latch circuit BDL, and on the data obtained by inverting the data retained in the latch circuit SDL; and on the data obtained by performing an AND operation to the data retained in the latch circuit XDL and the data retained in the latch circuit SDL.

The sequencer 14 causes the sense amplifier module 17B to transfer, to the latch circuit DDL for example, data "~(XDL^DDL)", which is obtained by performing an XNOR operation on the data retained in the latch circuit XDL and the data retained in the latch circuit DDL. Subsequently, the sequencer 14 causes the sense amplifier module 17B to transfer data "(XDL^CDL) &~DDL|XDL&DDL" to the latch circuit ADL for example. Said data is obtained by performing an OR operation on: the data obtained through performance of an AND operation on the data obtained by execution of an XOR operation on the data retained in the latch circuit XDL and the data retained in the latch circuit CDL, and on the data obtained by inverting the data retained in the latch circuit DDL; and on the data obtained by performing an AND operation to the data retained in the latch circuit XDL and the data retained in the latch circuit DDL. Subsequently, the sequencer 14 causes the sense amplifier module 17B to transfer data "(ADL^XDL)&~SDL|ADL&SDL" to the latch circuit ADL for example. Said data is obtained by performing an OR operation on: the data obtained through performance of an AND operation on the data obtained by execution of an XOR operation on the data retained in the latch circuit ADL and the data retained in the latch circuit XDL, and on the data obtained by inverting the data retained in the latch circuit SDL; and on the data obtained by performing an AND operation to the data retained in the latch circuit ADL and the data retained in the latch circuit SDL (FIG. 76, (16)).

Then the sequencer 14 performs a write operation based on the data respectively retained in the latch circuits ADL, BDL, CDL, and DDL in each of the sense amplifier modules 17A and 17B.

The data retained in the latch circuits ADL, BDL, CDL, and DDL for each threshold voltage of the memory cell transistors MT in the example shown in FIG. 76 is shown below. Similarly, different data is allocated to each of the threshold voltages in each of plane PL1 and plane PL2.

(Example) "Threshold voltage of memory cell transistors MT": data retained in ADL/data retained in BDL/data retained in CDL/data retained in DDL"

(1) "Z" state: "1111" data
(2) "A" state: "0111" data
(3) "B" state: "0110" data
(4) "C" state: "0100" data
(5) "D" state: "0101" data
(6) "E" state: "0001" data
(7) "F" state: "0000" data
(8) "G" state: "0010" data
(9) "H" state: "0011" data
(10) "I" state: "1011" data
(11) "J" state: "1010" data
(12) "K" state: "1000" data
(13) "L" state: "1110" data
(14) "M" state: "1100" data
(15) "N" state: "1101" data
(16) "O" state: "1001" data

[9-3] Advantageous Effects of Ninth Embodiment

According to the semiconductor memory 10 of the foregoing ninth embodiment, the data allocation differing from that of the eighth embodiment is used, and the maximum number of times that read is performed per page can be thereby decreased compared to that in the semiconductor memory 10 of the eighth embodiment. Hereinafter, advantageous effects of the semiconductor memory 10 according to the ninth embodiment will be described in detail, using the semiconductor memory 10 of the eighth embodiment as a comparative example.

In the semiconductor memory 10 according to the ninth embodiment, the number of times that read is performed per page is (2+2+3+3+3+3+3+3)/8=2.75. The number of times that read is performed per page in the semiconductor memory 10 of the ninth embodiment is similar to that in the semiconductor memory 10 of the eighth embodiment.

In the semiconductor memory 10 of the ninth embodiment, the maximum number of times that read is performed per page is three. In contrast, in the semiconductor memory 10 of the eighth embodiment, the maximum number of times that read is performed per page is four.

Thus, the number of times that read is performed per page in the semiconductor memory 10 of the ninth embodiment is lower than that in the semiconductor memory 10 of the eighth embodiment.

It is thus possible to reduce the maximum number of times that read is performed in a read operation executed within a page unit in the semiconductor memory 10 of the ninth embodiment. It is thereby possible to reduce the maximum number of times that read is performed per page in the semiconductor memory 10 of the ninth embodiment, compared to the eighth embodiment.

The semiconductor memory 10 of the ninth embodiment can perform sequential read for two-page data, as in the second embodiment and the seventh embodiment. Hereinafter, an example of four types of the sequential read for two-page data is briefly described.

In the sequential read for the first and third pages, the semiconductor memory 10 performs the first plane read to plane PL1 and the second plane read to plane PL2 simultaneously and in parallel. In this case, the semiconductor memory 10 requires performing a read operation at five states in plane PL1 but can read two-page data by a read operation at two states in plane PL2; therefore, it is possible to reduce power consumption.

In the sequential read for the second and fourth pages, the semiconductor memory 10 performs the first plane read to plane PL1 and the second plane read to plane PL2 simultaneously and in parallel. In this case, the semiconductor memory 10 requires performing a read operation at five state in plane PL2, but can read two-page data by a read operation at two states in plane PL1; therefore, it is possible to reduce power consumption.

In the sequential read for the fifth and seventh pages, the semiconductor memory 10 performs the first plane read to plane PL1 and the second plane read to plane PL2 simultaneously and in parallel. In this case, the semiconductor memory 10 requires performing a read operation at six states in plane PL1, but can read two-page data by performing a read operation at three states in plane PL2; therefore, it is possible to reduce power consumption.

In the sequential read for the sixth and eighth pages, the semiconductor memory 10 performs the first plane read to plane PL1 and the second plane read to plane PL2 simultaneously and in parallel. In this case, the semiconductor memory 10 requires performing a read operation at six states in plane PL2, but can read two-page data by performing a read operation at three states in plane PL1; therefore, it is possible to reduce power consumption.

[9-4] Modifications of Ninth Embodiment

In the ninth embodiment, an example where the data allocation shown in FIGS. 67 through 74 is used was described; however, other data allocations may be adopted.

Combinations of read voltages and data definitions in the first to third modifications of the ninth embodiment are listed below. A data allocation for each of the following combinations is set as appropriate based on a combination of read voltages and data definitions.

(Example) Read voltages: [first-page read ((x) read voltage of PL1, (y) read voltage of PL2), second-page read ((x), (y)), third-page read ((x), (y)), fourth-page read ((x), (y)), fifth-page read ((x), (y)), sixth-page read ((x), (y)), seventh-page read ((x), (y)), eighth-page read ((x), (y))]; Data definitions: [first-page read [(a) read data when "0", "0" (="read result of PL1", "read result of PL2"), (b) read data when "1", "0", (c) read data when "0", "1", (d) read data when "1", "1"], second-page read [(a), (b), (c), (d)], third-page read [(a), (b), (c), (d)], fourth-page read [(a), (b), (c), (d)], fifth-page read [(a), (b), (c), (d)], sixth-page read [(a), (b), (c), (d)], seventh-page read [(a), (b), (c), (d)], eighth-page read [(a), (b), (c), (d)]]

First Modification of Ninth Embodiment

Read voltages: [((GR, KR), (AR, IR)), ((AR, IR), (GR, KR)), ((CR, MR, NR), (AR, IR)), ((AR, IR), (CR, MR, NR)), ((DR, FR, NR), (ER, LR, OR)), ((ER, LR, OR), (DR, FR, NR)), ((BR, HR, JR), (ER, LR, OR)), ((ER, LR, OR), (BR, HR, JR))]; data definitions: [[0, 1, 1, 0], [0, 1, 1, 0], [0, 1, 1, 0], [0, 1, 1, 0], [0, 0, 1, 1], [0, 1, 0, 1], [0, 1, 1, 0], [0, 1, 1, 0]]

Second Modification of Ninth Embodiment

Read voltages: [((GR, OR), (ER, IR)), ((ER, IR), (GR, OR)), ((BR, CR, MR), (GR, OR)), ((GR, OR), (BR, CR, MR)), ((AR, DR, KR), (FR, HR, NR)), ((FR, HR, NR), (AR, DR, KR)), ((AR, DR, KR), (BR, JR, LR)), ((BR, JR, LR), (AR, DR, KR))]; data definitions: [[0, 1, 1, 0], [0, 1, 1, 0], [0, 1, 1, 0], [0, 1, 1, 0], [0, 0, 1, 1], [0, 1, 0, 1], [0, 1, 1, 0], [0, 1, 1, 0]]

Third Modification of Ninth Embodiment

Read voltages: [((GR, OR), (ER, IR)), ((ER, IR), (GR, OR)), ((CR, DR, MR), (GR, OR)), ((GR, OR), (CR, DR, MR)), ((AR, DR, KR), (FR, HR, NR)), ((FR, HR, NR), (AR, DR, KR)), ((AR, DR, KR), (BR, JR, LR)), ((BR, JR, LR), (AR, DR, KR))]; data definitions: [[0, 1, 1, 0], [0, 1, 1, 0], [0, 1, 1, 0], [0, 1, 1, 0], [0, 0, 1, 1], [0, 1, 0, 1], [0, 1, 1, 0], [0, 1, 1, 0]]

The semiconductor memory 10 of each of the above-described first through third modifications of the ninth embodiment is capable of performing the same operation as that of the ninth embodiment, and can achieve similar advantageous effects.

[10] 10th Embodiment

In the semiconductor memory 10 according to the 10th embodiment, 5-bit data can be stored by a set of one memory cell transistor MT in plane PL1 and one memory cell transistor MT in plane PL2. In the following, differences between the semiconductor memory 10 according to the 10th embodiment and that of the first to ninth embodiments will be described.

[10-1] Data Allocation

FIG. 77 shows an example of threshold distributions of the memory cell transistors MT, and read voltages in the semiconductor memory 10 according to the 10th embodiment. As shown in FIG. 77, six threshold distributions of the memory cell transistors MT may be formed in the 10th embodiment. Compared to the threshold distributions in the first embodiment described with reference to FIG. 8, two threshold distributions higher than the "E" state have been removed.

FIG. 78 shows an example of data allocation for the threshold distributions of the memory cell transistors MT in the semiconductor memory 10 according to the 10th embodiment.

As shown in FIGS. 78, in the semiconductor memory 10 according to the 10th embodiment, 36 combinations are possible by combining six threshold voltages in the memory cell transistors MT in plane PL1 with six threshold voltages in the memory cell transistors MT in plane PL2. Furthermore, in the 10th embodiment, 5-bit data is allocated to each of the 36 combinations, as shown below. In the 10th embodiment, either one of the combinations to which the same 5-bit data is allocated is used.

(Example) "Threshold voltage of memory cell transistors MT in plane PL1", "threshold voltage of memory cell transistors MT in plane PL2": "first bit/second bit/third bit/fourth bit/fifth bit" data (1) "Z" state, "Z" state: "00000" data
(2) "Z" state, "A" state: "01000" data
(3) "Z" state, "B" state: "01000" data
(4) "Z" state, "C" state: "01010" data
(5) "Z" state, "D" state: "00010" data
(6) "Z" state, "E" state: "00010" data
(7) "A" state, "Z" state: "00100" data
(8) "A" state, "A" state: "01100" data
(9) "A" state, "B" state: "01100" data
(10) "A" state, "C" state: "01110" data
(11) "A" state, "D" state: "00110" data
(12) "A" state, "E" state: "00110" data
(13) "B" state, "Z" state: "00101" data
(14) "B" state, "A" state: "01101" data
(15) "B" state, "B" state: "11101" data
(16) "B" state, "C" state: "11110" data
(17) "B" state, "D" state: "10110" data
(18) "B" state, "E" state: "10111" data
(19) "C" state, "Z" state: "00111" data
(20) "C" state, "A" state: "01111" data
(21) "C" state, "B" state: "11111" data
(22) "C" state, "C" state: "11100" data
(23) "C" state, "D" state: "10100" data
(24) "C" state, "E" state: "10101" data
(25) "D" state, "Z" state: "00011" data
(26) "D" state, "A" state: "01011" data
(27) "D" state, "B" state: "11011" data
(28) "D" state, "C" state: "11000" data
(29) "D" state, "D" state: "10000" data
(30) "D" state, "E" state: "10001" data
(31) "E" state, "Z" state: "00001" data
(32) "E" state, "A" state: "01001" data
(33) "E" state, "B" state: "11001" data
(34) "E" state, "C" state: "11010" data
(35) "E" state, "D" state: "10010" data
(36) "E" state, "E" state: "10011" data FIG. 79 shows read voltages that are set for the data allocation shown in FIG. 78, and definitions of read data to be applied to the read results of the pages.

As shown in FIG. 79, the first-page data is confirmed as a result of reading performed to plane PL1 with the use of the read voltage BR, and as a result of reading performed to plane PL2 with the use of the read voltage BR.

The second-page data is confirmed as a result of reading performed to plane PL2 with the use of the read voltages AR and DR.

The third-page data is confirmed as a result of reading performed to plane PL1 with the use of the read voltages AR and DR.

The fourth-page data is confirmed as a result of reading performed to plane PL1 with the use of the read voltages CR and ER, and as a result of reading performed to plane PL2 with the use of the read voltage CR.

The fifth-page data is confirmed as a result of reading performed to plane PL1 with the use of the read voltage BR, and as a result of reading performed to plane PL2 with the use of the read voltages CR and ER.

The read data based on results of a read operation in each of plane PL1 and plane PL2 is defined as follows:

(Example) Read operation: (result of reading plane PL1, result of reading plane PL2, read data)×4 types First-page read: (0, 0, 0), (1, 0, 0), (0, 1, 0), (1, 1, 1)
Second-page read: (0, 0, 0), (1, 0, 0), (0, 1, 1), (1, 1, 1)
Third-page read: (0, 0, 0), (1, 0, 1), (0, 1, 0), (1, 1, 1)
Fourth-page read: (0, 0, 0), (1, 0, 1), (0, 1, 1), (1, 1, 0)
Fifth-page read: (0, 0, 0), (1, 0, 1), (0, 1, 0), (1, 1, 0)

Since the rest of the configuration of the semiconductor memory 10 according to the 10th embodiment is the same as that of the semiconductor memory 10 according to the first embodiment, detailed descriptions of the rest of the configuration are omitted.

[10-2] Read Operation

In the semiconductor memory 10 of the 10th embodiment, as a sequential read for two-page data except for the first page, the sequential read for the second and third pages, and the sequential read for the fourth and fifth pages, for example, may be performed respectively.

(First-Page Read)

FIG. 80 shows an example of a command sequence, and voltages to be applied to a selected word line WLsel in the first-page read in the semiconductor memory 10, according to the 10th embodiment.

As shown in FIG. 80, first, the memory controller 20 sequentially sends, for example, a command "01h", a command "00h", address information ADD, and a command "30h" to the semiconductor memory 10. Upon receipt of the command "30h", the semiconductor memory 10 switches to a busy state, and commences the first-page read.

The first plane read to plane PL1 and the second plane read to plane PL2 are performed simultaneously and in parallel.

For the first plane read and second plane read in the first-page read, a read operation using the read voltage BR, for example, is performed. The read result obtained by using the read voltage BR is retained in the latch circuit ADL within the sense amplifier modules 17A and 17B, for example.

When each of the first plane read and the second plane read is finished, the sequencer 14 causes the sense amplifier module 17 to transfer the read result to the latch circuit XDL in each of plane PL1 and plane PL2, and changes the semiconductor memory 10 from a busy state to a ready state.

The operation hereafter is the same as that for the first-page read described in the first embodiment; the logic circuit 18 confirms the read data of the first page based on the definitions of the data shown in FIG. 79, and outputs the confirmed read data DAT to the memory controller 20.

(Sequential Read for Second and Third Pages)

FIG. 81 shows an example of a command sequence, and voltages to be applied to a selected word line WLsel in the sequential read for the second and third pages in the semiconductor memory 10 of the 10th embodiment.

As shown in FIG. 81, first, the memory controller 20 sequentially sends, for example, a command "02h", a command "00h", address information ADD, and a command "30h" to the semiconductor memory 10.

Upon receipt of the command "30h", the semiconductor memory 10 switches from a ready state to a busy state, and commences the sequential read for the second and third pages.

In the sequential read for the second and third pages, the sequencer 14 performs the first plane read to plane PL1 and the second plane read to plane PL2 simultaneously and in parallel.

In the first plane read in the sequential read, the read voltages AR and DR, for example, are applied in this order to the selected word line WLsel in plane PL1. The read results obtained by using the read voltages AR and DR are retained in the latch circuit ADL in the sense amplifier module 17A, for example.

In the second plane read in the sequential read, the read voltages AR and DR, for example, are applied in this order to the selected word line WLsel in plane PL2. The read results obtained by using the read voltages AR and DR are retained in the latch circuit ADL in the sense amplifier module 17B, for example.

When each of the first plane read and the second plane read is finished, the sequencer 14 causes the sense amplifier module to transfer the read result to the latch circuit XDL in each of plane PL1 and plane PL2, and changes the semiconductor memory 10 from a busy state to a ready state.

At this time, in the semiconductor memory 10, the read result related to the third-page data is retained in the latch circuit XDL in plane PL1, and the read result related to the second-page data is retained in the latch circuit XDL in plane PL2.

Upon detection of the change of the semiconductor memory 10 to a ready state, the memory controller 20 causes the semiconductor memory 10 to output the second-page data. Specifically, the read result retained in the latch circuit XDL in plane PL2 is transferred to the logic circuit 18, and the logic circuit 18 outputs the second-page data which has been confirmed based on the read result to the memory controller 20. When the output of the second-page data is finished, the read result retained in the latch circuit XDL in plane PL1 is transferred to the logic circuit 18, and the logic circuit 18 outputs the third-page data which has been confirmed based on the read result to the memory controller 20.

The order of pages to be output from the semiconductor memory 10 to the memory controller 20 may be set as appropriate. For example, in the sequential read for the second and third pages, the semiconductor memory 10 may output the second-page data after outputting the third-page data.

(Sequential Read for Fourth and Fifth Pages)

FIG. 82 shows a command sequence, and voltages to be applied to a selected word line WLsel in the sequential read for the fourth and fifth pages in the semiconductor memory 10 of the 10th embodiment.

As shown in FIG. 82, first, the memory controller 20 sequentially sends, for example, a command "03h", a command "00h", address information ADD, and a command "30h" to the semiconductor memory 10.

Upon receipt of the command "30h", the semiconductor memory 10 changes from a ready state to a busy state, and commences sequential read for the fourth and fifth pages.

In the sequential read for the fourth and fifth pages, the sequencer 14 performs the first plane read to plane PL1 and the second plane read to plane PL2 simultaneously and in parallel.

In the first plane read in the sequential read, the read voltages CR, ER, and BR, for example, are applied in this order to the selected word line WLsel in plane PL1. For example, the read results obtained by using the read voltage BR are retained in the latch circuit ADL in the sense amplifier module 17A, and the read results obtained by using the read voltages CR and ER are retained in the latch circuit BDL in the sense amplifier module 17A for example.

In the second plane read in the sequential read, the read voltages CR and ER, for example, are applied in this order to the selected word line WLsel in plane PL2. For example, the read result obtained by using the read voltage CR is retained in the latch circuit ADL in the sense amplifier module 17B, and the read results obtained by using the read voltages CR and ER are retained in the latch circuit ADL in the sense amplifier module 17B.

At the time when the read result obtained by using the read voltage BR is confirmed in the first plane read, and the read results obtained by using the read voltages CR and ER are confirmed in the second plane read, for example, the sequencer 14 causes the sense amplifier module 17 to transfer the data to the latch circuit XDL, and changes the semiconductor memory 10 from a busy state to a ready state.

In other words, the sequencer 14 changes the semiconductor memory 10 from a busy state to a ready state at the time when the read result related to the fifth-page data is confirmed in plane PL1 and plane PL2, and the output of the fifth-page data is ready.

Upon detection of the change of the semiconductor memory 10 to a ready state, the memory controller 20 causes the semiconductor memory 10 to output the fifth-page data.

At this time, the semiconductor memory 10 processes the output of the fifth-page data to the memory controller 20 and the first plane read in parallel. Specifically, for example in plane PL1, a read operation using the read voltage ER is performed, while the fifth-page data is being output.

When the sequencer 14 detects the completion of the output of the fifth-page data, the sequencer 14 changes the semiconductor memory 10 from a ready state to a busy state. When the sequencer 14 then detects the completion of the first plane read which has been being processed in parallel, the sequencer 14 changes the semiconductor memory 10 from a busy state to a ready state.

Upon detection of the change of the semiconductor memory 10 to a ready state after receiving the fifth-page data, the memory controller 20 causes the semiconductor memory 10 to output the fourth-page data.

If the first plane read is finished while the semiconductor memory 10 is outputting the fifth-page data to the memory controller 20, the semiconductor memory 10 may remain in a ready state after the output of the third-page data, and subsequently output the fourth-page data.

[10-3] Advantageous Effects of 10th Embodiment

According to the above-described semiconductor memory 10 in the 10th embodiment, it is possible to store 5-bit data in two memory cells. Advantageous effects of the semiconductor memory 10 according to the 10th embodiment will be described in detail below.

In the semiconductor memory 10 of the first embodiment, 6-bit data is stored in two memory cell transistors MT by forming eight threshold distributions. The number of times that read is performed per page in the first embodiment is (1+1+2+2+2+2)/6=1.67.

In contrast, in the semiconductor memory 10 of the 10th embodiment, 5-bit data is stored in two memory cell transistors MT by forming six threshold distributions. The number of times that read is performed per page in the 10th embodiment is (1+2+2+2+2)/5=1.8.

Thus, the number of times that read is performed in the semiconductor memory 10 of the 10th embodiment is lower than that in the first embodiment. Since the number of the threshold distributions formed in the 10th embodiment is lower than that in the first embodiment, it is possible to reduce the number of times that verification is performed during a write process, and increase an amount of steps of a write voltage in the semiconductor memory 10 according to the 10th embodiment. For this reason, the semiconductor memory 10 of the 10th embodiment can enhance the speed of the read operation similarly to the foregoing embodiments, and improve performance in data writing compared to the first embodiment.

[10-4] Modifications of 10th Embodiment

In the 10th embodiment, the same read voltage is applied to the memory cell transistors MT in plane PL1 and the memory cell transistors MT in plane PL2, as described above with reference to FIGS. 80 through 82. For this reason, the memory cell array 11 and the word lines WL are configured in a manner which does not necessarily see them divided, as shown in FIG. 1; rather, they can be configured as shown in FIG. 83.

FIG. 83 is a block diagram showing a configuration example of the semiconductor memory 10 of a modification of the 10th embodiment, and the memory cell array 11 and the sense amplifier module 17 are partially shown therein. As shown in FIG. 83, the semiconductor memory 10 includes an input/output circuit 19. The input/output circuit 19 is a circuit that can input and output data DAT to and from the memory controller 20, and is coupled to the logic circuit 18. Note that the input/output circuit 19 is omitted in FIG. 1, which illustrates the first embodiment.

As shown in FIG. 83, there may be a case where the semiconductor memory 10 has more than one bus between the sense amplifier module 17 and the logic circuit 18 within a single plane PL. Specifically, the semiconductor memory 10 includes bus BUS0 and bus BUS1, for example. Each of bus BUS0 and bus BUS1 is coupled to the logic circuit 18. Bus BUS0 is coupled to sense amplifier units SAU0 through SAU(k−1) (k is the number corresponding to 2/m). Bus BUS1 is coupled to sense amplifier unit SAUk through SAUm.

In the sense amplifier module 17 in a modification of the 10th embodiment, a single sense amplifier unit SAU coupled to bus BUS0 and a single sense amplifier unit SAU coupled to bus BUS1 are used in combination. Specifically, sense amplifier units SAU0 and SAUk are combined, and sense amplifier units SAU (k−1) and SAUm are combined, for example. As a result, m/2 sets of two sense amplifier units SAU are provided in the sense amplifier module 17.

Hereinafter, the memory cell transistors MT coupled to one of the two sense amplifier units SAU constituting a set will be referred to as "memory cell transistors MTa", and the memory cell transistors MT coupled to the other sense amplifier unit SAU in the set will be referred to as "memory cell transistors MTb".

In the configuration according to a modification of the 10th embodiment, a group of the memory cell transistors MTa and a group of the memory cell transistors MTb respectively correspond to plane PL1 and plane PL2 in the foregoing embodiments. Furthermore, in the configuration according to a modification of the 10th embodiment, the coding similar to the foregoing embodiments is applied to a combination of a memory cell transistor MTa and a memory cell transistor MTb coupled to a common word line WL.

Multiple-bit data can thereby be stored by a combination of memory cell transistors MTa and MTb in a modification of the 10th embodiment. The operation in a modification of the 10th embodiment is the same as that in the foregoing embodiments, except that only the same voltage can be applied to the memory cell transistors MTa and MTb coupled to a common word line WL.

In a modification of the 10th embodiment, as shown in FIG. 83, the memory cell transistors MTa, the bit lines BL and sense amplifier units SAU coupled to the memory cell transistors MTa are arranged together on the left side of word line WLi, and the memory cell transistors MTb, the bit lines BL and sense amplifier units SAU coupled to the memory cell transistors MTb are arranged together on the right side of word line WLi. For example, each of a group of memory cell transistors MTa and a group of memory cell transistors MTb are not necessarily arranged together, and the memory cell transistors MTa and MTb may be arranged at any locations as appropriate, as long as they are coupled to word line WLi.

For example, as in the configuration example of the semiconductor memory 10 shown in FIG. 142, a set of memory cell transistors MTa, and a bit line BL and a sense amplifier unit SAU coupled to said memory cell transistors MTa, and a set of memory cell transistors MTb, and a bit line BL and a sense amplifier unit SAU coupled to said memory cell transistors MTb, may be arranged alternately.

The bit line BL and sense amplifier unit SAU coupled to the memory cell transistors MTa, and the bit line BL and sense amplifier unit SAU coupled to the memory cell transistors MTb may be arranged at a place as appropriate, in accordance with the arrangement of corresponding memory cell transistors MT. For example, a set of memory cell transistors MTa, and a bit line BL and a sense amplifier unit SAU coupled to said memory cell transistors MTa, and a set of memory cell transistors MTb, and a bit line BL and a sense amplifier unit SAU coupled to said memory cell transistors MTb, may be alternately arranged. Multiple sets of memory cell transistors MTa, and a bit line BL and a sense amplifier unit SAU coupled to said memory cell transistor MTa, and multiple sets of memory cell transistors MTb, and a bit line BL and a sense amplifier unit SAU coupled to said memory cell transistors MTb, may be alternately arranged. In this configuration, the sense amplifier unit SAU corresponding to the memory cell transistor MTa and the sense amplifier unit SAU corresponding to the memory cell transistor MTb may be coupled each other, thereby performing a part or whole of the logic operation instead of the logic operation.

Hereinafter, a case where only a single read voltage can be applied to two memory cell transistors MT sharing a coding scheme will be referred to as "a WL-shared case". In contrast, a case where different read voltages, as shown in FIG. 1, can be applied will be referred to as "a WL-divided case". An example of the configuration of the semiconductor memory 10 in the WL-shared case will be described in detail in the 14th embodiment.

FIG. 84 is a timing chart showing an example of a read operation in a non-WL-divided (WL-shared) case. More specifically, FIG. 84 shows an example of a read operation when a page size of 8 kB and a page size of 16 kB (i.e., the double of 8 kB), for example, are combined. In the following description, let us suppose that a size of single-page data is 8 kB. A page size of the semiconductor memory 10 is not limited to this example, and may be set as appropriate.

As shown in FIG. 84, in the read operation for the first page, a read operation using the read voltage BR is performed. The single-page data is thereby confirmed, and read data of 8 kB is output from the semiconductor memory 10. If the sequential read for the second and third pages is performed, a read operation using the read voltages AR and DR is performed. The two-page data is thereby confirmed, and the read data of 16 kB is output from the semiconductor memory 10. If the sequential read for the fourth and fifth pages is performed, a read operation using the read voltages CR, ER, and BR is performed. The two-page data is thereby confirmed, and the read data of 16 kB is output from the semiconductor memory 10. The semiconductor memory 10 may output a short busy signal between the outputs of the 8 kB data.

FIG. 85 is a timing chart showing an example of a read operation in a WL-divided case. As shown in FIG. 85, in the read operation for the first page, a read operation using the read voltage BR is performed. The single-page data is thereby confirmed, and read data of 8 kB is output from the semiconductor memory 10. If any of the second through fifth pages is read, a read operation using two types of read voltages ("2Level-Read") is performed. The single-page data is thereby confirmed, and read data of 8 kB is output from the semiconductor memory 10.

If any of the second through fifth pages is read, a read operation using two types of read voltages among those shown in FIG. 79 ("2Level-Read") is performed. Specifically, in the second-page read, a read operation is performed not to plane PL1 but to plane PL2 with the use of the read voltages AR and DR. In the third-page read, a read operation is performed not to plane PL2 but to plane PL2 with the use of the read voltages AR and DR. In the fourth-page read, a read operation using the read voltages CR and ER is performed in plane PL1, and a read operation using the read voltage CR is performed in plane PL2. In the fifth-page read, a read operation using the read voltage BR is performed in plane PL1, and a read operation using the read voltages CR and ER is performed in plane PL2.

In the example shown in FIG. 84, the read operations shown in FIGS. 80 to 82 are performed, for example. In the read operation to the first page, the read voltage used in each of plane PL1 and plane PL2 is the same. The read voltages used in plane PL2, in the read operation performed to the second page, are the same as those used in plane PL1 in the read operation performed to the third page. Some or all of the read voltages used in plane PL1 and PL2 are the same in the read operation performed to the fourth and fifth pages. Thus, the semiconductor memory 10 can reduce the number of times that read is performed by courtesy of the performance of a sequential read for multiple pages as appropriate, and enhance the speed of a read operation.

In the example shown in FIG. 85 on the other hand, the number of times that read is performed during the first-page read is one, and that during the second-page read through fifth-page read is two. It is thereby possible to enhance the speed of random read for a single page. In the WL-divided case as shown in FIG. 1, the semiconductor memory 10 can appropriately switch between an operation for the WL-divided case and an operation for the non-WL-divided case, through the use of a command or a ROM fuse within the semiconductor memory 10. The semiconductor memory 10 can also switch between the operation described with reference to FIG. 84 and the operation described with reference to FIG. 85.

In the 10th embodiment, an example where the data allocation shown in FIGS. 78 and 79 is used is described; however, other data allocations may be adopted.

Combinations of read voltages and data definitions in the first to 17th modifications of the 10th embodiment are listed below. A data allocation for each of the following combinations is set as appropriate based on a combination of read voltages and data definitions.

(Example) Read voltages: [first-page read ((x) read voltage of PL1, (y) read voltage of PL2), second-page read ((x), (y)), third-page read ((x), (y)), fourth-page read ((x), (y)), fifth-page read ((x), (y))]; Data definitions: [first-page read [(a) read data when "0", "0"=read result of PL1, read result of PL2, (b) read data when "1", "0", (c) read data when "0", "1", (d) read data when "1", "1"], second-page read [(a), (b), (c), (d)], third-page read [(a), (b), (c), (d)], fourth-page read [(a), (b), (c), (d)], fifth-page read [(a), (b), (c), (d)]

First Modification of 10th Embodiment

FIG. 86 shows an example of data allocation for the threshold distributions of the memory cell transistors MT in the first modification of the 10th embodiment. As shown in FIG. 86, in the first modification of the 10th embodiment, different 5-bit data is allocated to each of 36 combinations of the threshold voltages of two memory cell transistors MT.

(1) "Z" state, "Z" state: "00000" data
(2) "Z" state, "A" state: "00011" data
(3) "Z" state, "B" state: "01011" data
(4) "Z" state, "C" state: "01111" data
(5) "Z" state, "D" state: "11101" data
(6) "Z" state, "E" state: "11100" data
(7) "A" state, "Z" state: "00010" data
(8) "A" state, "A" state: "00001" data
(9) "A" state, "B" state: "01001" data
(10) "A" state, "C" state: "01101" data
(11) "A" state, "D" state: "11111" data
(12) "A" state, "E" state: "11110" data
(13) "B" state, "Z" state: "00111" data
(14) "B" state, "A" state: "00100" data
(15) "B" state, "B" state: "01100" data
(16) "B" state, "C" state: "01000" data
(17) "B" state, "D" state: "11010" data
(18) "B" state, "E" state: "11011" data
(19) "C" state, "Z" state: "00101" data
(20) "C" state, "A" state: "00110" data
(21) "C" state, "B" state: "01110" data
(22) "C" state, "C" state: "01010" data
(23) "C" state, "D" state: "11000" data
(24) "C" state, "E" state: "11001" data
(25) "D" state, "Z" state: "10101" data
(26) "D" state, "A" state: "10110" data
(27) "D" state, "B" state: "10110" data
(28) "D" state, "C" state: "10010" data
(29) "D" state, "D" state: "10000" data
(30) "D" state, "E" state: "10001" data
(31) "E" state, "Z" state: "10100" data
(32) "E" state, "A" state: "10111" data
(33) "E" state, "B" state: "10111" data
(34) "E" state, "C" state: "10011" data
(35) "E" state, "D" state: "10001" data
(36) "E" state, "E" state: "10000" data FIG. 87 shows read voltages that are set for the data allocation shown in FIG. 86, and definitions of read data to be applied to the read results of the pages.

As shown in FIG. 87, the first-page data is confirmed as a result of reading performed to plane PL1 with the use of the read voltage DR and as a result of reading performed to plane PL2 with the use of the read voltage DR.

The second-page data is confirmed as a result of reading performed to plane PL1 with the use of the read voltage DR and as a result of reading performed to plane PL2 with the use of the read voltage BR.

The third-page data is confirmed as a result of reading performed to plane PL1 with the use of the read voltage BR and as a result of reading performed to plane PL2 with the use of the read voltage CR.

The fourth-page data is confirmed as a result of reading performed to plane PL1 with the use of the read voltages AR and CR and as a result of reading performed to plane PL2 with the use of the read voltages AR and DR.

The fifth-page data is confirmed as a result of reading performed to plane PL1 with the use of the read voltages BR and ER and as a result of reading performed to plane PL2 with the use of the read voltages AR and ER.

The read data based on results of a read operation in each of plane PL1 and plane PL2 is defined as follows:

(Example) Read operation: (result of reading plane PL1, result of reading plane PL2, read data)×4 types
First-page read: (0, 0, 0), (1, 0, 1), (0, 1, 1), (1, 1, 1)
Second-page read: (0, 0, 0), (1, 0, 1), (0, 1, 0), (1, 1, 0)
Third-page read: (0, 0, 0), (1, 0, 1), (0, 1, 1), (1, 1, 0)
Fourth-page read: (0, 0, 0), (1, 0, 0), (0, 1, 1), (1, 1, 0)
Fifth-page read: (0, 0, 0), (1, 0, 1), (0, 1, 1), (1, 1, 0)

In the semiconductor memory 10 of the 10th embodiment, if a sequential read is not performed, the number of times that read is performed per page is $(1+2+2+2+2)/5=1.8$. In the semiconductor memory 10 of the first modification of the 10th embodiment on the other hand, the number of times that read is performed per page is $(1+1+1+2+2)/5=1.4$.

Thus, the number of times that read is performed per page in the semiconductor memory 10 of the first modification of the 10th embodiment is lower than that in the semiconductor memory 10 of the 10th embodiment.

Second Modification of 10th Embodiment

FIG. 88 shows an example of data allocation for the threshold distributions of the memory cell transistors MT in the second modification of the 10th embodiment. As shown in FIG. 88, in the second modification of the 10th embodiment, different 5-bit data is allocated to 36 combinations of threshold voltages of two memory cell transistors MT.

(1) "Z" state, "Z" state: "00000" data
(2) "Z" state, "A" state: "00010" data
(3) "Z" state, "B" state: "00011" data
(4) "Z" state, "C" state: "00111" data
(5) "Z" state, "D" state: "01101" data
(6) "Z" state, "E" state: "01001" data
(7) "A" state, "Z" state: "00010" data
(8) "A" state, "A" state: "00000" data
(9) "A" state, "B" state: "00001" data
(10) "A" state, "C" state: "00101" data
(11) "A" state, "D" state: "01111" data
(12) "A" state, "E" state: "01011" data
(13) "B" state, "Z" state: "00010" data
(14) "B" state, "A" state: "00000" data
(15) "B" state, "B" state: "10001" data
(16) "B" state, "C" state: "10101" data
(17) "B" state, "D" state: "11111" data
(18) "B" state, "E" state: "11011" data
(19) "C" state, "Z" state: "00110" data
(20) "C" state, "A" state: "00100" data
(21) "C" state, "B" state: "10100" data
(22) "C" state, "C" state: "10000" data
(23) "C" state, "D" state: "11010" data

(24) "C" state, "E" state: "11110" data

(25) "D" state, "Z" state: "01110" data

(26) "D" state, "A" state: "01100" data

(27) "D" state, "B" state: "11100" data

(28) "D" state, "C" state: "11000" data

(29) "D" state, "D" state: "10010" data

(30) "D" state, "E" state: "10110" data

(31) "E" state, "Z" state: "01010" data

(32) "E" state, "A" state: "01000" data

(33) "E" state, "B" state: "11001" data

(34) "E" state, "C" state: "11101" data

(35) "E" state, "D" state: "10111" data

(36) "E" state, "E" state: "10011" data

FIG. 89 shows read voltages that are set for the data allocation shown in FIG. 88, and definitions of read data to be applied to the read results of the pages.

As shown in FIG. 89, the first-page data is confirmed as a result of reading performed to plane PL1 with the use of the read voltage BR, and as a result of reading performed to plane PL2 with the use of the read voltage BR.

The second-page data is confirmed as a result of reading performed to plane PL1 with the use of the read voltage DR, and as a result of reading performed to plane PL2 with the use of the read voltage DR.

The third-page data is confirmed as a result of reading performed to plane PL1 with the use of the read voltages AR and CR, and as a result of reading performed to plane PL2 with the use of the read voltages AR and CR.

The fourth-page data is confirmed as a result of reading performed to plane PL1 with the use of the read voltage AR, and as a result of reading performed to plane PL2 with the use of the read voltage DR.

The fifth-page data is confirmed as a result of reading performed to plane PL1 with the use of the read voltages CR and ER, and as a result of reading performed to plane PL2 with the use of the read voltage BR.

The read data based on results of a read operation in each of plane PL1 and plane PL2 is defined as follows:

(Example) Read operation: (result of reading plane PL1, result of reading plane PL2, read data)×4 types First-page read: (0, 0, 0), (1, 0, 0), (0, 1, 0), (1, 1, 1)

Second-page read: (0, 0, 0), (1, 0, 1), (0, 1, 1), (1, 1, 0)

Third-page read: (0, 0, 0), (1, 0, 1), (0, 1, 1), (1, 1, 0)

Fourth-page read: (0, 0, 0), (1, 0, 1), (0, 1, 1), (1, 1, 0)

Fifth-page read: (0, 0, 0), (1, 0, 1), (0, 1, 0), (1, 1, 0)

In the semiconductor memory 10 according to the second modification of the 10th embodiment, a first memory cell and a second memory cell to which a read process is performed may belong to a selected word line WLsel that gives a same read voltage to each of the memory cells. For example, the first and second memory cells may be coupled to the same word line WL within the same plane. Alternatively, for example, the first memory cell and the second memory cell may be respectively present in different planes, and these planes may be under control to simultaneously give a single read voltage to both of the selected word lines WLsel corresponding to the first memory cell and the second memory cell.

In such a case, in the fifth-page read in the semiconductor memory 10 of the 10th embodiment, the read voltages BR, CR, and ER are applied to the selected word lines WLsel. As for sense amplifier unit SAU1 relating to the first memory cell, a read result obtained by using the read voltage BR is retained in the latch circuit ADL of SAU1 for example. As for sense amplifier unit SAU2 relating to the second memory cell, read results obtained by using the read voltages CR and ER are retained in the latch circuit ADL in SAU2, for example.

In the fifth-page read according to the semiconductor memory 10 of the 10th embodiment, the number of times that read is performed is two. In contrast, if the same read voltage is applied to the first and second memory cells, the number of times that read is performed is three.

In the first through fifth pages of the semiconductor memory 10 according to the 10th embodiment, the average number of times that read is performed per page when the same read voltage is applied to the first and second memory cells is (1+2+2+2+3)/5=2.0. In the first through fifth pages in the semiconductor memory 10 of the first modification of the 10th embodiment, the average number of times that read is performed per page when the same read voltage is applied to the first and second memory cells is (1+2+2+3+3)/5=2.2.

In the first through fifth pages in the semiconductor memory 10 of the second modification of the 10th embodiment on the other hand, the average number of times that read is performed per page when the same read voltage is applied to the first and second memory cells is (1+1+2+2+3)/5=1.8.

Thus, the number of times that read is performed per page in the second modification is lower than that in the comparative example of the 10th embodiment.

Third Modification of 10th Embodiment

FIG. 90 shows an example of data allocation for the threshold distributions of the memory cell transistors MT in the third modification of the 10th embodiment. As shown in FIG. 90, in the third modification of the 10th embodiment, different 5-bit data is allocated to each of the 36 combinations of the threshold voltages of two memory cell transistors MT.

(1) "Z" state, "Z" state: "00000" data (2) "Z" state, "A" state: "10000" data (3) "Z" state, "B" state: "10011" data (4) "Z" state, "C" state: "10111" data (5) "Z" state, "D" state: "00111" data (6) "Z" state, "E" state: "00010" data (7) "A" state, "Z" state: "01000" data (8) "A" state, "A" state: "11000" data (9) "A" state, "B" state: "11011" data

(10) "A" state, "C" state: "11111" data

(11) "A" state, "D" state: "01111" data

(12) "A" state, "E" state: "01010" data

(13) "B" state, "Z" state: "01001" data

(14) "B" state, "A" state: "11001" data

(15) "B" state, "B" state: "11010" data

(16) "B" state, "C" state: "11110" data

(17) "B" state, "D" state: "01110" data

(18) "B" state, "E" state: "01011" data

(19) "C" state, "Z" state: "01101" data

(20) "C" state, "A" state: "11101" data

(21) "C" state, "B" state: "11100" data

(22) "C" state, "C" state: "11100" data

(23) "C" state, "D" state: "01100" data

(24) "C" state, "E" state: "01101" data

(25) "D" state, "Z" state: "00101" data

(26) "D" state, "A" state: "10101" data

(27) "D" state, "B" state: "10100" data

(28) "D" state, "C" state: "10100" data

(29) "D" state, "D" state: "00100" data

(30) "D" state, "E" state: "00101" data

(31) "E" state, "Z" state: "00001" data

(32) "E" state, "A" state: "10001" data

(33) "E" state, "B" state: "10010" data

(34) "E" state, "C" state: "10110" data

(35) "E" state, "D" state: "00110" data

(36) "E" state, "E" state: "00011" data

FIG. 91 shows read voltages that are set for the data allocation shown in FIG. 90, and definitions of read data to be applied to the read results of the pages.

As shown in FIG. 91, the first-page data is confirmed as a result of reading performed to plane PL2 with the use of the read voltages AR and DR.

The second-page data is confirmed as a result of reading performed to plane PL1 with the use of the read voltages AR and DR.

The third-page data is confirmed as a result of reading performed to plane PL1 with the use of the read voltages CR and ER, and as a result of reading performed to plane PL2 with the use of the read voltages CR and ER.

The fourth-page data is confirmed as a result of reading performed to plane PL1 with the use of the read voltages CR and ER, and as a result of reading performed to plane PL2 with the use of the read voltage BR.

The fifth-page data is confirmed as a result of reading performed to plane PL1 with the use of the read voltage BR, and as a result of reading performed to plane PL2 with the use of the read voltages BR and ER.

The read data based on results of a read operation in each of plane PL1 and plane PL2 is defined as follows:

(Example) Read operation: (result of reading plane PL1, result of reading plane PL2, read data)×4 types First-page read: (0, 0, 0), (1, 0, 0), (0, 1, 1), (1, 1, 1)

Second-page read: (0, 0, 0), (1, 0, 1), (0, 1, 0), (1, 1, 1)

Third-page read: (0, 0, 0), (1, 0, 1), (0, 1, 1), (1, 1, 1)

Fourth-page read: (0, 0, 0), (1, 0, 0), (0, 1, 1), (1, 1, 0)

Fifth-page read: (0, 0, 0), (1, 0, 1), (0, 1, 1), (1, 1, 0)

Figure 92:
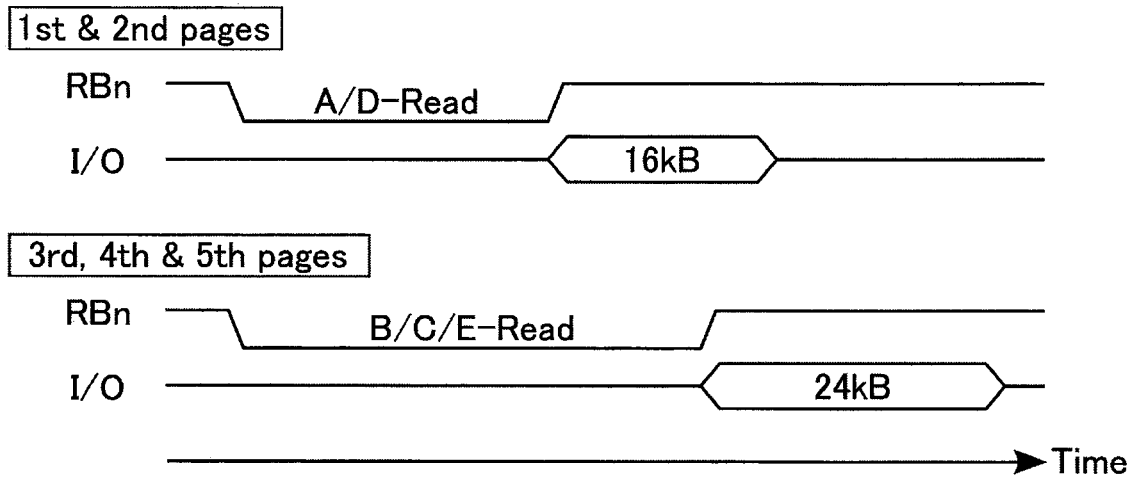
FIG. 92 is a timing chart showing an example of a read operation in a semiconductor memory in a non-WL-divided case according to the third modification of the 10th embodiment.

FIG. 92 is a timing chart showing an example of a read operation in a non-WL-divided (WL-shared) case. As shown in FIG. 92, the sequential read for the first and second pages entails a read operation using the read voltages AR and DR. The two-page data is thereby confirmed, and read data of 16 kB is output from the semiconductor memory 10. If the sequential read for the third, fourth, and fifth pages is performed, a read operation using the read voltages BR, CR, and ER is performed. The three-page data is thereby confirmed, and read data of 24 kB is output from the semiconductor memory 10.

Thus, read is performed twice in the sequential read for the first and second pages in the third modification of the 10th embodiment, and three times in the sequential read for the third, fourth, and fifth pages. In the third modification of the 10th embodiment, the sequential read for the first and second pages, and the sequential read for the third, fourth, and fifth pages are performed, so that the number of times that read is performed per page can be (2+3)/5=1 if one page is converted to 8 kB.

Fourth Modification of 10th Embodiment

FIG. 93 shows an example of data allocation for the threshold distributions of the memory cell transistors MT in the fourth modification of the 10th embodiment. As shown in FIG. 93, in the fourth modification of the 10th embodiment, different 5-bit data is allocated to each of the 36 combinations of the threshold voltages of two memory cell transistors MT.

(1) "Z" state, "Z" state: "00000" data (2) "Z" state, "A" state: "01000" data (3) "Z" state, "B" state: "01010" data (4) "Z" state, "C" state: "01010" data (5) "Z" state, "D" state: "00010" data (6) "Z" state, "E" state: "00010" data (7) "A" state, "Z" state: "00100" data (8) "A" state, "A" state: "01100" data (9) "A" state, "B" state: "01110" data

(10) "A" state, "C" state: "01110" data

(11) "A" state, "D" state: "00110" data

(12) "A" state, "E" state: "00110" data

(13) "B" state, "Z" state: "00101" data

(14) "B" state, "A" state: "01101" data

(15) "B" state, "B" state: "11111" data

(16) "B" state, "C" state: "11110" data

(17) "B" state, "D" state: "10110" data

(18) "B" state, "E" state: "10111" data

(19) "C" state, "Z" state: "00111" data

(20) "C" state, "A" state: "01111" data

(21) "C" state, "B" state: "11101" data

(22) "C" state, "C" state: "11100" data

(23) "C" state, "D" state: "10100" data

(24) "C" state, "E" state: "10101" data

(25) "D" state, "Z" state: "00011" data

(26) "D" state, "A" state: "01011" data

(27) "D" state, "B" state: "11001" data

(28) "D" state, "C" state: "11000" data

(29) "D" state, "D" state: "10000" data

(30) "D" state, "E" state: "10001" data

(31) "E" state, "Z" state: "00001" data

(32) "E" state, "A" state: "01001" data

(33) "E" state, "B" state: "11011" data

(34) "E" state, "C" state: "11010" data

(35) "E" state, "D" state: "10010" data

(36) "E" state, "E" state: "10011" data

As shown in FIG. 94, the first-page data is confirmed as a result of reading performed to plane PL1 with the use of the read voltage BR, and as a result of reading performed to plane PL2 with the use of the read voltage BR.

The second-page data is confirmed as a result of reading performed to plane PL2 with the use of the read voltages AR and DR.

The third-page data is confirmed as a result of reading performed to plane PL1 with the use of the read voltages AR and DR.

The fourth-page data is confirmed as a result of reading performed to plane PL1 with the use of the read voltages CR, and ER and as a result of reading performed to plane PL2 with the use of the read voltage BR.

The fifth-page data is confirmed as a result of reading performed to plane PL1 with the use of the read voltage BR, and as a result of reading performed to plane PL2 with the use of the read voltages CR and ER.

The read data based on results of a read operation in each of plane PL1 and plane PL2 is defined as follows:

(Example) Read operation: (result of reading plane PL1, result of reading plane PL2, read data)×4 types First-page read: (0, 0, 0), (1, 0, 0), (0, 1, 0), (1, 1, 1)

Second-page read: (0, 0, 0), (1, 0, 0), (0, 1, 1), (1, 1, 1)

Third-page read: (0, 0, 0), (1, 0, 1), (0, 1, 0), (1, 1, 1)

Fourth-page read: (0, 0, 0), (1, 0, 1), (0, 1, 1), (1, 1, 0)

Fifth-page read: (0, 0, 0), (1, 0, 1), (0, 1, 0), (1, 1, 0)

The number of times that read is performed per page when the sequential read is not performed in the semiconductor memory 10 according to the fourth modification of the 10th embodiment is (1+2+2+2+2)/5=1.8. The number of times that read is performed in the semiconductor memory according to the fourth modification of the 10th embodiment is the same as that in the example described in the 10th embodiment.

FIG. 139 is a timing chart showing an example of a read operation in a non-WL-divided (WL-shared) case in the fourth modification of the 10th embodiment. As shown in FIG. 139, the performance of the sequential read for the second and third pages entails the performance of a read operation using the read voltages AR and DR. The two-page data is thereby confirmed, and the read data of 16 kB is output from the semiconductor memory 10. The performance of the sequential read for the first, fourth, and fifth pages entails the performance of a read operation using the read voltages BR, CR, and ER. The three-page data is thereby confirmed, and read data of 24 kB is output from the semiconductor memory 10.

In the sequential read for the first, fourth, and fifth pages, the read result of the first page is confirmed upon the end of reading using the read voltage BR. For this reason, even if a ready/busy signal RBn (True) is in a busy state, the semiconductor memory 10 may first output the confirmed read data of the first page, based on a ready state of a ready/busy signal RBn (Cache). It is thereby possible to output data more quickly from the semiconductor memory 10. In the specification, RBn (True), for example, is a signal indicating whether or not the operation of the semiconductor memory 10 is completed, and RBn (Cache) is a signal indicating whether or not the semiconductor memory 10 can output confirmed read data. In the example shown in FIG. 139, the semiconductor memory 10 outputs data in units of 8 kB. Thus, the semiconductor memory 10 may temporarily switch to a busy state when completing the output of 8 kB data and before outputting subsequent data.

Fifth Modification of 10th Embodiment

FIG. 143 shows an example of data allocation for the threshold distributions of the memory cell transistors MT in the fifth modification of the 10th embodiment. As shown in FIG. 143, in the fifth modification of the 10th embodiment, different 5-bit data is allocated to each of the 36 combinations of the threshold voltages of two memory cell transistors MT.

(1) "Z" state, "Z" state: "00000" data
(2) "Z" state, "A" state: "00010" data
(3) "Z" state, "B" state: "00110" data
(4) "Z" state, "C" state: "00100" data
(5) "Z" state, "D" state: "01100" data
(6) "Z" state, "E" state: "01110" data
(7) "A" state, "Z" state: "00001" data
(8) "A" state, "A" state: "00011" data
(9) "A" state, "B" state: "00111" data
(10) "A" state, "C" state: "00101" data
(11) "A" state, "D" state: "01101" data
(12) "A" state, "E" state: "01111" data
(13) "B" state, "Z" state: "01001" data
(14) "B" state, "A" state: "01011" data
(15) "B" state, "B" state: "11111" data
(16) "B" state, "C" state: "11101" data
(17) "B" state, "D" state: "10101" data
(18) "B" state, "E" state: "10111" data
(19) "C" state, "Z" state: "01000" data
(20) "C" state, "A" state: "01010" data
(21) "C" state, "B" state: "11110" data
(22) "C" state, "C" state: "11100" data
(23) "C" state, "D" state: "10100" data
(24) "C" state, "E" state: "10110" data

(25) "D" state, "Z" state: "01100" data
(26) "D" state, "A" state: "01110" data
(27) "D" state, "B" state: "11010" data
(28) "D" state, "C" state: "11000" data
(29) "D" state, "D" state: "10000" data
(30) "D" state, "E" state: "10010" data
(31) "E" state, "Z" state: "01101" data
(32) "E" state, "A" state: "01111" data
(33) "E" state, "B" state: "11011" data
(34) "E" state, "C" state: "11001" data
(35) "E" state, "D" state: "10001" data
(36) "E" state, "E" state: "10011" data FIG. 144 shows read voltages that are set for the data allocation shown in FIG. 143, and definitions of read data to be applied to the read results of the pages.

As shown in FIG. 144, the first-page data is confirmed as a result of reading performed to plane PL1 with the use of the read voltage BR, and as a result of reading performed to plane PL2 with the use of the read voltage BR.

The second-page data is confirmed as a result of reading performed to plane PL1 with the use of the read voltage BR, and as a result of reading performed to plane PL2 with the use of the read voltage DR.

The third-page data is confirmed as a result of reading performed to plane PL1 with the use of the read voltage DR, and as a result of reading performed to plane PL2 with the use of the read voltage BR.

The fourth-page data is confirmed as a result of reading performed to plane PL2 with the use of the read voltages AR, CR, and ER.

The fifth-page data is confirmed as a result of reading performed to plane PL1 with the use of the read voltages AR, CR, and ER.

The read data based on results of a read operation in each of plane PL1 and plane PL2 is defined as follows:

(Example) Read operation: (result of reading plane PL1, result of reading plane PL2, read data)×4 types First-page read: (0, 0, 0), (1, 0, 0), (0, 1, 0), (1, 1, 1)
Second-page read: (0, 0, 0), (1, 0, 1), (0, 1, 1), (1, 1, 0)
Third-page read: (0, 0, 0), (1, 0, 1), (0, 1, 1), (1, 1, 0)
Fourth-page read: (0, 0, 0), (1, 0, 0), (0, 1, 1), (1, 1, 1)
Fifth-page read: (0, 0, 0), (1, 0, 1), (0, 1, 0), (1, 1, 1)

The number of times that read is performed per page when the sequential read is not performed in the semiconductor memory 10 according to the fifth modification of the 10th embodiment is (1+1+1+3+3)/5=1.8.

FIG. 145 is a timing chart showing an example of a read operation in a non-WL-divided (WL-shared) case in the fifth modification of the 10th embodiment. As shown in FIG. 145, the performance of the sequential read for the first, second, and third pages entails the performance of a read operation using the read voltages BR and DR. The three-page data is thereby confirmed, and read data of 24 kB is output from the semiconductor memory 10. The performance of the sequential read for the fourth and fifth pages entails the performance of a read operation using the read voltages AR, CR, and ER. The two-page data is thereby confirmed, and the read data of 16 kB is output from the semiconductor memory 10.

In the sequential read for the first, second, and third pages, the read result of the first page is confirmed upon the end of reading using the read voltage BR. For this reason, even if a ready/busy signal RBn (True) is in a busy state, the semiconductor memory 10 may first output the confirmed read data of the first page, based on a ready state of a ready/busy signal RBn (Cache). It is thereby possible to output data more quickly from the semiconductor memory 10. In the example shown in FIG. 145, the semiconductor memory 10 outputs data in units of 8 kB. Thus, the semiconductor memory 10 may temporarily switch to a busy state when completing the output of 8 kB data and before outputting subsequent data.

Prior to the formation of six threshold distributions as shown in FIG. 77, the semiconductor memory 10 of the fifth modification of the 10th embodiment may form three threshold distributions by performing a write operation for three-page data ("first write"). In addition, thereafter, the semiconductor memory 10 of the fifth modification of the 10th embodiment may further form six threshold distributions by performing a write operation for four-page data ("second write") to the memory cell transistors MT to which the first write has been performed.

FIG. 192 shows an example of threshold distributions of the memory cell transistors MT in the semiconductor memory 10 according to the fifth modification of the 10th embodiment. In FIG. 192, (a) shows the threshold distributions of the memory cell transistors MT before the write (in other words, in an erase state); (b) shows the threshold distributions of the memory cell transistors MT after the first write is performed; and (c) shows the threshold distributions of the memory cell transistors MT after the second write is performed.

The semiconductor memory 10 according to the fifth modification of the 10th embodiment performs the first write to form the "Z"-, "A"-, and "B"-state threshold distributions as shown in (b) of FIG. 192 from the "Z"-state threshold distribution shown in (a) of FIG. 192.

Then, the semiconductor memory 10 according to the fifth modification of the 10th embodiment performs the second write to form the "Z"-, and "S1"-state threshold distributions as shown in (c) of FIG. 192 from the "Z"-state threshold distribution shown in (b) of FIG. 192. From the "A"-state threshold distribution shown in FIG. 192 (*b*), "S2"-, and "S3"-state threshold distributions are formed as shown in FIG. 192 (*c*). From the "B"-state threshold distribution shown in FIG. 192 (*b*), "4"-, and "S5"-state threshold distributions are formed as shown in FIG. 192 (*c*).

Similarly to the six embodiment, between the first write and the second write in which a word line WL is selected, the first write in which an adjacent word line WL is selected may be performed.

Sixth Modification of 10th Embodiment

Read voltages: [((DR), (DR)), ((DR), (BR)), ((BR), (CR)), ((AR, CR), (AR, ER)), ((BR, ER), (AR, ER))]; data definitions: [[0, 1, 1, 1], [0, 0, 1, 0], [0, 1, 1, 0], [0, 1, 1, 0], [0, 1, 1, 0]]

Seventh Modification of 10th Embodiment

Read voltages: [((BR), (BR)), ((BR), (DR)), ((DR), (CR)), ((AR, DR), (AR, ER)), ((CR, ER), (AR, ER))]; data definitions: [[0, 0, 0, 1], [0, 1, 0, 0], [0, 1, 1, 0], [0, 1, 1, 0], [0, 1, 1, 0]]

Eighth Modification of 10th Embodiment

Read voltages: [((BR), (BR)), ((BR), (DR)), ((DR), (CR)), ((AR, DR), (AR, ER)), ((CR, ER), (BR, ER))]; data definitions: [[0, 0, 0, 1], [0, 1, 0, 0], [0, 1, 1, 0], [0, 1, 1, 0], [0, 1, 1, 0]]

The semiconductor memory 10 of each of the above-described sixth through eighth modifications of the 10th embodiment is capable of performing the same operation as that of the first modification of the 10th embodiment, and can achieve similar advantageous effects.

Ninth Modification of 10th Embodiment

Read voltages: [((DR), (DR)), ((BR), (BR)), ((ER), (BR, ER)), ((AR, CR), (AR, CR)), ((DR), (AR, CR))]; data definitions: [[0, 1, 1, 1], [0, 1, 1, 0], [0, 1, 1, 0], [0, 1, 1, 0], [0, 1, 1, 1]]

10th Modification of 10th Embodiment

Read voltages: [((DR), (DR)), ((BR), (BR)), ((BR, ER), (ER)), ((AR, CR), (AR, CR)), ((DR), (AR, CR))]; data definitions: [[0, 1, 1, 1], [0, 1, 1, 0], [0, 1, 1, 0], [0, 1, 1, 0], [0, 1, 1, 1]]

11th Modification of 10th Embodiment

Read voltages: [((DR), (DR)), ((BR), (BR)), ((ER), (BR, ER)), ((AR, CR), (AR, CR)), ((DR), (AR, CR))]; data definitions: [[0, 1, 1, 0], [0, 1, 1, 0], [0, 1, 1, 0], [0, 1, 1, 0], [0, 1, 1, 1]]

12th Modification of 10th Embodiment

Read voltages: [((DR), (DR)), ((BR), (BR)), ((BR, ER), (ER)), ((AR, CR), (AR, CR)), ((DR), (AR, CR))]; data definitions: [[0, 1, 1, 0], [0, 1, 1, 0], [0, 1, 1, 0], [0, 1, 1, 0], [0, 1, 1, 1]]

13th Modification of 10th Embodiment

Read voltages: [((BR), (BR)), ((DR), (DR)), ((CR, ER), (CR, ER)), ((AR), (AR, DR)), ((BR), (CR, ER))]; data definitions: [[0, 0, 0, 1], [0, 1, 1, 0], [0, 1, 1, 0], [0, 1, 1, 0], [0, 1, 0, 0]]

14th Modification of 10th Embodiment

Read voltages: [((BR), (BR)), ((DR), (DR)), ((CR, ER), (CR, ER)), ((AR), (AR, DR)), ((CR, ER), (BR))]; data definitions: [[0, 0, 0, 1], [0, 1, 1, 0], [0, 1, 1, 0], [0, 1, 1, 0], [0, 0, 1, 0]]

15th Modification of 10th Embodiment

Read voltages: [((BR), (BR)), ((DR), (DR)), ((CR, ER), (CR, ER)), ((AR), (AR, DR)), ((BR), (CR, ER))]; data definitions: [[0, 1, 1, 0], [0, 1, 1, 0], [0, 1, 1, 0], [0, 1, 1, 0], [0, 1, 0, 0]]

16th Modification of 10th Embodiment

Read voltages: [((BR), (BR)), ((DR), (DR)), ((CR, ER), (CR, ER)), ((AR), (AR, DR)), ((CR, ER), (BR))]; data definitions: [[0, 1, 1, 0], [0, 1, 1, 0], [0, 1, 1, 0], [0, 1, 1, 0], [0, 0, 1, 0]]

The semiconductor memory 10 of each of the above-described 9th through 16th modifications of the 10th embodiment is capable of performing the same operation as that of the second modification of the 10th embodiment, and can achieve similar advantageous effects.

17th Modification of 10th Embodiment

Read voltages: [((omitted), (BR, ER)), ((BR, ER), (omitted)), ((AR, CR), (AR, CR)), ((AR, CR), (DR)), ((DR), (AR, DR))]; data definitions: [[0, 0, 1, 1], [0, 1, 0, 1], [0, 1, 1, 0], [0, 1, 1, 0], [0, 1, 1, 0], [0, 1, 1, 0]] The semiconductor memory 10 of the 17th modification of the 10th embodiment is capable of performing the same operation as that of the third modification of the 10th embodiment, and can achieve similar advantageous effects.

18th Modification of 10th Embodiment

Read voltages: [((BR), (BR)), ((omitted), (AR, DR)), ((AR, DR), (omitted)), ((CR, ER), (BR)), ((BR), (CR, ER))]; data definitions: [[1, 1, 1, 0], [1, 0, 1, 0], [1, 1, 0, 0], [1, 0, 1, 1], [1, 0, 0, 1]]

19th Modification of 10th Embodiment

Read voltages: [((BR), (BR)), ((omitted), (AR, DR)), ((AR, DR), (omitted)), ((CR, ER), (BR)), ((BR), (CR, ER))]; data definitions: [[1, 1, 1, 0], [1, 0, 1, 0], [1, 1, 0, 0], [1, 0, 0, 1], [1, 1, 0, 1]]

20th Modification of 10th Embodiment

Read voltages: [((DR), (DR)), ((omitted), (BR, ER)), ((BR, ER), (omitted)), ((DR), (AR, CR)), ((AR, CR), (DR))]; data definitions: [[1, 0, 0, 0], [1, 0, 1, 0], [1, 1, 0, 0], [1, 0, 0, 1], [1, 0, 0, 1]]

21st Modification of 10th Embodiment

Read voltages: [((DR), (DR)), ((omitted), (BR, ER)), ((BR, ER), (omitted)), ((DR), (AR, CR)), ((AR, CR), (DR))]; data definitions: [[1, 0, 0, 0], [1, 0, 1, 0], [1, 1, 0, 0], [1, 0, 0, 1], [1, 0, 0, 0]]

22nd Modification of 10th Embodiment

Read voltages: [((DR), (DR)), ((omitted), (BR, ER)), ((BR, ER), (omitted)), ((DR), (AR, CR)), ((AR, CR), (DR))]; data definitions: [[1, 0, 0, 0], [1, 0, 1, 0], [1, 1, 0, 0], [1, 0, 0, 0], [1, 0, 0, 1]]

The semiconductor memory 10 of each of the 18th to 22nd modifications of the 10th embodiment is capable of performing the same operation as that of the fourth modification of the 10th embodiment, and can achieve similar advantageous effects.

23rd Modification of 10th Embodiment

Read voltages: [((BR), (BR)), ((BR), (DR)), ((DR), (BR)), ((omitted), (AR, CR, ER)), ((AR, CR, ER), (omitted))]; data definitions: [[1, 1, 1, 0], [1, 1, 0, 1], [1, 0, 0, 1], [1, 0, 1, 0], [1, 1, 0, 0]]

24th Modification of 10th Embodiment

Read voltages: [((BR), (BR)), ((BR), (DR)), ((DR), (DR)), ((omitted), (AR, CR, ER)), ((AR, CR, ER), (omitted))]; data definitions: [[1, 1, 1, 0], [1, 1, 0, 1], [1, 0, 0, 1], [1, 0, 1, 0], [1, 1, 0, 0]]

25th Modification of 10th Embodiment

Read voltages: [((BR), (BR)), ((BR), (DR)), ((DR), (BR)), ((omitted), (AR, CR, ER)), ((AR, CR, ER), (omitted))]; data definitions: [[1, 1, 1, 0], [1, 0, 0, 1], [1, 0, 1, 1], [1, 0, 1, 0], [1, 1, 0, 0]]

26th Modification of 10th Embodiment

Read voltages: [((BR), (BR)), ((DR), (BR)), ((DR), (DR)), ((omitted), (AR, CR, ER)), ((AR, CR, ER), (omitted))]; data definitions: [[1, 1, 1, 0], [1, 0, 1, 1], [1, 0, 0, 1], [1, 0, 1, 0], [1, 1, 0, 0]]

27th Modification of 10th Embodiment

Read voltages: [((BR), (BR)), ((BR), (DR)), ((DR), (DR)), ((omitted), (AR, CR, ER)), ((AR, CR, ER), (omitted))]; data definitions: [[1, 0, 0, 1], [1, 1, 0, 1], [1, 0, 0, 1], [1, 0, 1, 0], [1, 1, 0, 0]]

28th Modification of 10th Embodiment

Read voltages: [((BR), (BR)), ((BR), (DR)), ((DR), (DR)), ((omitted), (AR, CR, ER)), ((AR, CR, ER), (omitted))]; data definitions: [[1, 0, 0, 1], [1, 1, 0, 1], [1, 0, 0, 0], [1, 0, 1, 0], [1, 1, 0, 0]]

29th Modification of 10th Embodiment

Read voltages: [((BR), (BR)), ((DR), (BR)), ((DR), (DR)), ((omitted), (AR, CR, ER)), ((AR, CR, ER), (omitted))]; data definitions: [[1, 0, 0, 1], [1, 0, 1, 1], [1, 0, 0, 1], [1, 0, 1, 0], [1, 1, 0, 0]]

30th Modification of 10th Embodiment

Read voltages: [((BR), (BR)), ((DR), (BR)), ((DR), (DR)), ((omitted), (AR, CR, ER)), ((AR, CR, ER), (omitted))]; data definitions: [[1, 0, 0, 1], [1, 0, 1, 1], [1, 0, 0, 0], [1, 0, 1, 0], [1, 1, 0, 0]]

31st Modification of 10th Embodiment

Read voltages: [((BR), (DR)), ((DR), (BR)), ((DR), (DR)), ((omitted), (AR, CR, ER)), ((AR, CR, ER), (omitted))]; data definitions: [[1, 1, 0, 1], [1, 0, 0, 1], [1, 0, 0, 0], [1, 0, 1, 0], [1, 1, 0, 0]]

32nd Modification of 10th Embodiment

Read voltages: [((BR), (DR)), ((DR), (BR)), ((DR), (DR)), ((omitted), (AR, CR, ER)), ((AR, CR, ER), (omitted))]; data definitions: [[1, 0, 0, 1], [1, 0, 1, 1], [1, 0, 0, 0], [1, 0, 1, 0], [1, 1, 0, 0]]

33rd Modification of 10th Embodiment

Read voltages: [((BR), (DR)), ((DR), (BR)), ((DR), (DR)), ((omitted), (AR, CR, ER)), ((AR, CR, ER), (omitted))]; data definitions: [[1, 0, 0, 1], [1, 0, 0, 1], [1, 0, 0, 0], [1, 0, 1, 0], [1, 1, 0, 0]]

The semiconductor memory 10 of each of the 23rd to 33rd modifications of the 10th embodiment is capable of performing the same operation as that of the fifth modification of the 10th embodiment, and can achieve similar advantageous effects.

FIG. 95 is a table showing the number of times that read is performed in each of the 10th embodiment and the first through fifth modifications thereof. As shown in FIG. 95, the number of times that read is performed in the 10th embodiment and each of the first through fifth modifications of the 10th embodiment is different in WL-divided and non-WL-divided cases. The number of times that read is performed in the 10th embodiment and each of the first to fifth modifications of the 10th embodiment is different between the cases when the sequential read in which a page size is doubled is combined (for example, 8 kB×1page+1 kB×two pages), and the sequential read in which a page size is doubled is combined with the sequential read in which a page size is tripled (for example, 16 kB×1page+24 kB×1page). The semiconductor memory 10 of the 10th embodiment can use any of the operations shown in FIG. 95 and the operations in the fifth through 17th modifications as appropriate, through the use of a command or a ROM fuse within the semiconductor memory 10.

The foregoing descriptions describe the case where semiconductor memory 10 handles data in units of 8 kB; however, the embodiment is not limited this example. The semiconductor memory 10 of the 10th embodiment may handle the data in units of 16 kB, for example.

FIG. 146 is a timing chart showing an example of a read operation in the semiconductor memory device 10 according to the 10th embodiment. As shown in FIG. 146, the first-page read entails the performance of a read operation using a single type of read voltage ("1Level-Read"). Specifically, a read operation using the read voltage BR is performed. The single-page data is thereby confirmed, and the read data of 16 kB is output from the semiconductor memory 10. The 16 kB output data in the first-page read includes first-page data of 8 kB and dummy data of 8 kB. The dummy data is fixed to "0" data or "1" data, for example. The dummy data is not limited thereto, and may be set as appropriate.

The performance of the sequential read for the second and third pages entails the performance of a read operation using two types of read voltages ("2Level-Read"). Specifically, a read operation using the read voltages AR and DR is performed. The two-page data is thereby confirmed, and the read data of 16 kB is output from the semiconductor memory 10. The performance of the sequential read for the fourth and fifth pages entails the performance of a read operation using three types of read voltages ("3Level-Read"). Specifically, a read operation using the read voltages BR, CR and ER is performed. The two-page data is thereby confirmed, and the read data of 16 kB is output from the semiconductor memory 10.

As described above, in the semiconductor memory 10 of the 10th embodiment, dummy data may be included in the output data, in accordance with a unit of size for a page to be handled and a page to be read. Such dummy data may be similarly used in a write operation as well.

FIG. 147 is a timing chart showing an example of a read sequence in the semiconductor memory device 10 according to the 10th embodiment. As shown in FIG. 147, if the write operation for the first through five pages is performed, write data of 16 kB which includes first-page data of 8 kB and dummy data of 8 kB is first sent to the semiconductor memory 10, for example. Whole dummy data consists of "1" data. The sending of this dummy data may be omitted.

Next, the write data that includes second-page data of 8 kB and third-page data of 16 kB is sent to the semiconductor memory 10. Subsequently, write data that includes fourth-page data of 8 kB and fifth-page data of 16 kB is sent to the semiconductor memory 10. Upon receipt of the first-to-fifth page data, the semiconductor memory 10 switches to a busy state and performs a write operation for the five-page data. FIG. 147 shows a period "tProg" during which a write operation is performed.

As described above, in the semiconductor memory 10 of the 10th embodiment, dummy data may be included in the input data of 16 kB, in accordance with a design of a page size. In the foregoing descriptions, the example where the first-page data through the fifth-page data are sent to the semiconductor memory 10 in this order was illustrated; however, the order may be changed as appropriate. The foregoing descriptions describe the example where the dummy data is used in the read operation and the write operation; however, the dummy data may be similarly used in the read operation and the write operation of the other embodiments.

[11] 11th Embodiment

In the semiconductor memory 10 according to the 11th embodiment, 7-bit data can be stored by a set of one memory cell transistor MT in plane PL1 and one memory cell transistor MT in plane PL2. In the following, differences between the semiconductor memory 10 of the 11th embodiment and the first to 10th embodiments will be described.

[11-1] Data Allocation

FIG. 96 shows an example of threshold distributions of the memory cell transistors MT, and read voltages in the semiconductor memory 10 according to the 11th embodiment. As shown in FIG. 96, 12 threshold distributions of the memory cell transistors MT may be formed in the 11th embodiment. Compared to the threshold distributions described in the eighth embodiment with reference to FIG. 46, four threshold distributions higher than the "L" state have been removed.

FIGS. 97 through 100 show an example of data allocation for the threshold distributions of the memory cell transistors MT in the semiconductor memory 10 according to the 11th embodiment.

As shown in FIGS. 97 through 100, in the semiconductor memory 10 according to the 11th embodiment, 144 combinations are possible by combining 12 threshold voltages in the memory cell transistors MT in plane PL1 with 12 threshold voltages in the memory cell transistors MT in plane PL2. Furthermore, in the 11th embodiment, 7-bit data is allocated to each of the 144 combinations, as shown below. In the 11th embodiment, either one of the combinations to which the same 7-bit data is allocated is used.

(1) "Z" state, "Z" state: "0000000" data
    (2) "Z" state, "A" state: "0010010" data
    (3) "Z" state, "B" state: "0010100" data
    (4) "Z" state, "C" state: "0011101" data
    (5) "Z" state, "D" state: "0111101" data
    (6) "Z" state, "E" state: "0111001" data
    (7) "Z" state, "F" state: "0101011" data
    (8) "Z" state, "G" state: "0101111" data
    (9) "Z" state, "H" state: "1101111" data
    (10) "Z" state, "I" state: "1101110" data
    (11) "Z" state, "J" state: "1100110" data
    (12) "Z" state, "K" state: "1100111" data
    (13) "A" state, "Z" state: "0010000" data
    (14) "A" state, "A" state: "0000010" data
    (15) "A" state, "B" state: "0000100" data
    (16) "A" state, "C" state: "0001101" data
    (17) "A" state, "D" state: "0101101" data
    (18) "A" state, "E" state: "0101001" data
    (19) "A" state, "F" state: "0111011" data
    (20) "A" state, "G" state: "0111111" data
    (21) "A" state, "H" state: "1111111" data
    (22) "A" state, "I" state: "1111110" data
    (23) "A" state, "J" state: "1110110" data
    (24) "A" state, "K" state: "1110111" data

(25) "B" state, "Z" state: "0011100" data
(26) "B" state, "A" state: "0001110" data
(27) "B" state, "B" state: "0001000" data
(28) "B" state, "C" state: "0000001" data
(29) "B" state, "D" state: "0100001" data
(30) "B" state, "E" state: "0100101" data
(31) "B" state, "F" state: "0110111" data
(32) "B" state, "G" state: "0110011" data
(33) "B" state, "H" state: "1110011" data
(34) "B" state, "I" state: "1110010" data
(35) "B" state, "J" state: "1111010" data
(36) "B" state, "K" state: "1111011" data
(37) "C" state, "Z" state: "0011110" data
(38) "C" state, "A" state: "0001100" data
(39) "C" state, "B" state: "0001010" data
(40) "C" state, "C" state: "0000011" data
(41) "C" state, "D" state: "0100011" data
(42) "C" state, "E" state: "0100111" data
(43) "C" state, "F" state: "0110101" data
(44) "C" state, "G" state: "0110001" data
(45) "C" state, "H" state: "1110001" data
(46) "C" state, "I" state: "1110000" data
(47) "C" state, "J" state: "1111000" data
(48) "C" state, "K" state: "1111001" data
(49) "D" state, "Z" state: "0011011" data
(50) "D" state, "A" state: "0001001" data
(51) "D" state, "B" state: "0001111" data
(52) "D" state, "C" state: "0000110" data
(53) "D" state, "D" state: "0100110" data
(54) "D" state, "E" state: "0100010" data
(55) "D" state, "F" state: "0110000" data
(56) "D" state, "G" state: "0110100" data
(57) "D" state, "H" state: "1110100" data
(58) "D" state, "I" state: "1110101" data
(59) "D" state, "J" state: "1111101" data
(60) "D" state, "K" state: "1111100" data
(61) "E" state, "Z" state: "0001011" data
(62) "E" state, "A" state: "0011001" data
(63) "E" state, "B" state: "0011111" data
(64) "E" state, "C" state: "0010110" data
(65) "E" state, "D" state: "0110110" data
(66) "E" state, "E" state: "0110010" data
(67) "E" state, "F" state: "0100000" data
(68) "E" state, "G" state: "0100100" data
(69) "E" state, "H" state: "1100100" data
(70) "E" state, "I" state: "1100101" data
(71) "E" state, "J" state: "1101101" data
(72) "E" state, "K" state: "1101100" data
(73) "F" state, "Z" state: "0000111" data
(74) "F" state, "A" state: "0010101" data
(75) "F" state, "B" state: "0010011" data
(76) "F" state, "C" state: "0011010" data
(77) "F" state, "D" state: "0111010" data
(78) "F" state, "E" state: "0111110" data
(79) "F" state, "F" state: "0101100" data
(80) "F" state, "G" state: "0101000" data
(81) "F" state, "H" state: "1101000" data
(82) "F" state, "I" state: "1101001" data
(83) "F" state, "J" state: "1100001" data
(84) "F" state, "K" state: "1100000" data
(85) "G" state, "Z" state: "0000101" data
(86) "G" state, "A" state: "0010111" data
(87) "G" state, "B" state: "0010001" data
(88) "G" state, "C" state: "0011000" data
(89) "G" state, "D" state: "0111000" data
(90) "G" state, "E" state: "0111100" data
(91) "G" state, "F" state: "0101110" data

(92) "G" state, "G" state: "0101010" data
(93) "G" state, "H" state: "1101010" data
(94) "G" state, "I" state: "1101011" data
(95) "G" state, "J" state: "1100011" data
(96) "G" state, "K" state: "1100010" data
(97) "H" state, "Z" state: "1000101" data
(98) "H" state, "A" state: "1010111" data
(99) "H" state, "B" state: "1010001" data
(100) "H" state, "C" state: "1011000" data
(101) "H" state, "D" state: "1011000" data
(102) "H" state, "E" state: "1011100" data
(103) "H" state, "F" state: "1001110" data
(104) "H" state, "G" state: "1001010" data
(105) "H" state, "H" state: "1001010" data
(106) "H" state, "I" state: "1001011" data
(107) "H" state, "J" state: "1000011" data
(108) "H" state, "K" state: "1000010" data
(109) "I" state, "Z" state: "1000100" data
(110) "I" state, "A" state: "1010110" data
(111) "I" state, "B" state: "1010000" data
(112) "I" state, "C" state: "1011001" data
(113) "I" state, "D" state: "1011001" data
(114) "I" state, "E" state: "1011101" data
(115) "I" state, "F" state: "1001111" data
(116) "I" state, "G" state: "1001011" data
(117) "I" state, "H" state: "1001011" data
(118) "I" state, "I" state: "1001010" data
(119) "I" state, "J" state: "1000010" data
(120) "I" state, "K" state: "1000011" data
(121) "J" state, "Z" state: "1000110" data
(122) "J" state, "A" state: "1010100" data
(123) "J" state, "B" state: "1010010" data
(124) "J" state, "C" state: "1011011" data
(125) "J" state, "D" state: "1011011" data
(126) "J" state, "E" state: "1011111" data
(127) "J" state, "F" state: "1001101" data
(128) "J" state, "G" state: "1001001" data
(129) "J" state, "H" state: "1001001" data
(130) "J" state, "I" state: "1001000" data
(131) "J" state, "J" state: "1000000" data
(132) "J" state, "K" state: "1000001" data
(133) "K" state, "Z" state: "1000111" data
(134) "K" state, "A" state: "1010101" data
(135) "K" state, "B" state: "1010011" data
(136) "K" state, "C" state: "1011010" data
(137) "K" state, "D" state: "1011010" data
(138) "K" state, "E" state: "1011110" data
(139) "K" state, "F" state: "1001100" data
(140) "K" state, "G" state: "1001000" data
(141) "K" state, "H" state: "1001000" data
(142) "K" state, "I" state: "1001001" data
(143) "K" state, "J" state: "1000001" data
(144) "K" state, "K" state: "1000000" data FIG. 101 shows read voltages that are set for the data allocation shown in FIGS. 97 through 100, and definitions of read data to be applied to the read results of the pages.

As shown in FIG. 101, the first-page data is confirmed as a result of reading performed to plane PL1 with the use of the read voltage HR, and as a result of reading performed to plane PL2 with the use of the read voltage HR.

The second-page data is confirmed as a result of reading performed to plane PL1 with the use of the read voltage HR, and as a result of reading performed to plane PL2 with the use of the read voltage DR.

The third-page data is confirmed as a result of reading performed to plane PL1 with the use of the read voltages AR and ER, and as a result of reading performed to plane PL2 with the use of the read voltages AR and FR.

The fourth-page data is confirmed as a result of reading performed to plane PL1 with the use of the read voltages BR and FR, and as a result of reading performed to plane PL2 with the use of the read voltages CR and JR.

The fifth-page data is confirmed as a result of reading performed to plane PL1 with the use of the read voltages BR, DR, and FR, and as a result of reading performed to plane PL2 with the use of the read voltages BR, ER and GR.

The sixth-page data is confirmed as a result of reading performed to plane PL1 with the use of the read voltages CR, GR, and JR, and as a result of reading performed to plane PL2 with the use of the read voltages AR, BR, and FR.

The seventh-page data is confirmed as a result of reading performed to plane PL1 with the use of the read voltages DR, IR, and KR, and as a result of reading performed to plane PL2 with the use of the read voltages CR, IR, and KR.

The read data based on results of a read operation in each of plane PL1 and plane PL2 is defined as follows:

(Example) Read operation: (result of reading plane PL1, result of reading plane PL2, read data)×4 types First-page read: (0, 0, 0), (1, 0, 1), (0, 1, 1), (1, 1, 1)
Second-page read: (0, 0, 0), (1, 0, 1), (0, 1, 0), (1, 1, 0)
Third-page read: (0, 0, 0), (1, 0, 1), (0, 1, 1), (1, 1, 0)
Fourth-page read: (0, 0, 0), (1, 0, 1), (0, 1, 1), (1, 1, 0)
Fifth-page read: (0, 0, 0), (1, 0, 1), (0, 1, 1), (1, 1, 1)
Sixth-page read: (0, 0, 0), (1, 0, 1), (0, 1, 1), (1, 1, 0)
Seventh-page read: (0, 0, 0), (1, 0, 1), (0, 1, 1), (1, 1, 0)

Since the rest of the configuration of the semiconductor memory 10 according to the 11th embodiment, and the details of the write operation therein are the same as those in the semiconductor memory 10 according to the first embodiment, descriptions of the rest of the configuration and the write operation are omitted. As for the read operation, descriptions thereof are omitted, as it is the same as the read operation in the first example, except that the read voltages shown in FIG. 101 are used in the read operation performed to each page.

[11-2] Advantageous Effects of 11th Embodiment

According to the above-described semiconductor memory 10 of the 11th embodiment, it is possible to store 7-bit data in two memory cells. Advantageous effects of the semiconductor memory 10 according to the 11th embodiment will be described in detail below.

In the semiconductor memory 10 of the first embodiment, 6-bit data is stored in two memory cell transistors MT by forming eight threshold distributions. The number of times that read is performed per page in the first embodiment is $(1+1+2+2+2+2)/6=1.67$. In the semiconductor memory 10 of the eighth embodiment, 8-bit data is stored in two memory cell transistors MT by forming 16 threshold distributions. The number of times that read is performed per page in the eighth embodiment is $(1+1+2+2+4+4+4+4)/8=2.75$.

In contrast, in the semiconductor memory 10 of the 11th embodiment, 7-bit data is stored in two memory cell transistors MT by forming 12 threshold distributions. The number of times that read is performed per page in the 11th embodiment is $(1+1+2+2+3+3+3)/7=2.14$.

Thus, the number of times that read is performed in the semiconductor memory 10 of the 11th embodiment is greater than that for the first embodiment and fewer than that for the eighth embodiment. The semiconductor memory 10 of the 11th embodiment is characterized in that the storage capacity is larger than that of the first embodiment and the number of times that read is performed is lower than that in the eighth embodiment. Thus, the semiconductor memory 10 of the 11th embodiment can enhance the speed of the read operation similarly to the foregoing embodiments, and can obtain characteristics which lie somewhere between those of the first and eighth embodiments.

[11-3] Modifications of 11th Embodiment

In the 11th embodiment, an example where the data allocation shown in FIGS. 97 through 100 is used was described; however, other data allocations may be adopted.

Combinations of read voltages and data definitions in the first to 27th modifications of the 11th embodiment are listed below. A data allocation for each of the following combinations is set as appropriate based on a combination of read voltages and data definitions.

(Example) Read voltages: [first-page read ((x) read voltage of PL1, (y) read voltage of PL2), second-page read ((x), (y)), third-page read ((x), (y)), fourth-page read ((x), (y)), fifth-page read ((x), (y)), sixth-page read ((x), (y)), seventh-page read ((x), (y))]; Data definitions: [first-page read [(a) read data when "0", "0" (="read result of PL1", "read result of PL2"), (b) read data when "1", "0", (c) read data when "0", "1", (d) read data when "1", "1"], second-page read [(a), (b), (c), (d)], third-page read [(a), (b), (c), (d)], fourth-page read [(a), (b), (c), (d)], fifth-page read [(a), (b), (c), (d)], sixth-page read [(a), (b), (c), (d)], seventh-page read [(a), (b), (c), (d)]]

First Modification of 11th Embodiment

Read voltages: [((DR), (DR)), ((DR), (ER, IR)), ((omitted), (BR, GR, KR)), ((BR, GR, KR), (omitted)), ((FR, HR, JR), (FR, HR, JR)), ((AR, ER, IR), (AR, DR, JR)), ((CR, ER, IR), (CR, FR, HR))]; data definitions: [[0, 0, 0, 1], [0, 0, 1, 0], [0, 0, 1, 1], [0, 1, 0, 1], [0, 1, 1, 0], [0, 1, 1, 0], [0, 1, 1, 0]]

The number of times that read is performed per page in the non-WL-divided case in the semiconductor memory 10 according to the first modification of the 11th embodiment is $(1+3+3+3+3+5+5)/7=3.29$. In the semiconductor memory 10 according to the 11th embodiment, the number of times that read is performed per page in the non-WL-divided case is $(1+2+3+4+5+6+5)/7=3.71$.

Thus, the number of times that read is performed per page in the second modification of the 11th embodiment is lower than that of the 11th embodiment.

Second Modification of 11th Embodiment

Read voltages: [((DR), (DR)), ((DR), (FR, IR, KR)), ((FR, IR, KR), (DR)), ((AR, CR, HR), (omitted)), ((omitted), (AR, CR, HR)), ((BR, ER, GR, JR), (omitted)), ((omitted), (BR, ER, GR, JR))]; data definitions: [[0, 0, 0, 1], [0, 1, 1, 0], [0, 1, 1, 0], [0, 1, 0, 1], [0, 0, 1, 1], [0, 1, 0, 1], [0, 0, 1, 1]]

In the semiconductor memory 10 according to the second modification of the 11th embodiment, in the case where the non-WL-divided configuration and the first sequential read are adopted, the number of times that read per page in the first read sequence (for example, the first page (8 kB), the second and third pages (16 kB), the fourth and fifth pages (16 kB), and the sixth and seventh pages (16 kB)) is $(1+4+3+4)/7=1.71$.

In the semiconductor memory 10 according to the second modification of the 11th embodiment, in the case where the non-WL-divided configuration and the second sequential read are adopted, the number of times that read per page in the first read sequence (for example, the first, second, and third pages (24 kB), the fourth and fifth pages (16 kB), and the sixth and seventh pages (16 kB)) is (4+3+4)/7=1.57.

In contrast, in the semiconductor memory 10 according to the 11th embodiment in the case where the non-WL-divided configuration and the sequential read are adopted, the number of times that read per page in the first read sequence (for example, the first page (8 kB), the second and third pages (16 kB), the fourth and fifth pages (16 kB), and the sixth and seventh pages (16 kB)) is (1+3+5+6)/7=2.14.

Thus, the number of times that read is performed per page in the second modification is lower than that in the 11th embodiment.

FIGS. 140 and 141 are timing charts showing examples of a read operation in a non-WL-divided (WL-shared) case in the second modification of the 11th embodiment. FIG. 140 corresponds to an operation in the case where the page size is (8 kB+16 kB×3), and FIG. 141 corresponds to an operation in the case where the page size is (8 kB+16 kB×3), As shown in FIG. 140, the performance of the first-page read entails the performance of a read operation using a single type of read voltage (1Level-Read). Specifically, a read operation using the read voltage DR is performed. The single-page data is thereby confirmed, and read data of 8 kB is output from the semiconductor memory 10. The performance of the sequential read for the second and third pages and the sequential read for the sixth and seventh pages entails the performance of a read operation using four types of read voltages (4Level-Read). Specifically, in the sequential read for the second and third pages, a read operation using the read voltages DR, FR, IR, and KR is performed, and in the sequential read for the sixth and seventh pages, a read operation using the read voltages BR, ER, GR, and JR is performed. The two-page data is thereby confirmed, and read data of 16 kB is output from the semiconductor memory 10. If the sequential read for the fourth and fifth pages is performed, a read operation using three types of read voltages (3Level-Read) is performed. Specifically, a read operation using the read voltages AR, CR, and HR is performed. The two-page data is thereby confirmed, and read data of 16 kB is output from the semiconductor memory 10.

In the example shown in FIG. 141, the performance of the sequential read for the first, second, and third pages entails the performance of a read operation using four types of read voltages (4Level-Read). Specifically, a read operation using the read voltages DR, FR, IR, and KR is performed. The four-page data is thereby confirmed, and read data of 24 kB is output from the semiconductor memory 10. If the sequential read for the fourth and fifth pages is performed, a read operation using three types of read voltages (3Level-Read) is performed. Specifically, a read operation using the read voltages AR, CR, and HR is performed. The two-page data is thereby confirmed, and read data of 16 kB is output from the semiconductor memory 10. The performance of the sequential read for the sixth and seventh pages entails the performance of a read operation using four types of read voltages (4Level-Read). Specifically, a read operation using the read voltages BR, ER, GR, and JR is performed. The two-page data is thereby confirmed, and read data of 16 kB is output from the semiconductor memory 10.

In the example shown in FIG. 141, the semiconductor memory 10 outputs data in units of 8 kB. The semiconductor memory 10 may temporarily switch to a busy state when completing the output of 8 kB data and before outputting subsequent data. In the sequential read for the first, second, and third pages, the read result of the first page is confirmed upon end of reading using the read voltage DR. For this reason, even if a ready/busy signal RBn (True) is in a busy state, the semiconductor memory 10 may first output the confirmed read data of the first page, based on a ready state of a ready/busy signal RBn (Cache). It is thereby possible to enhance the speed of the data output from the semiconductor memory 10.

Third Modification of 11th Embodiment

Read voltages: [((DR), (DR)), ((DR), (FR, HR, JR)), ((FR, HR, JR), (DR)), ((BR, GR, KR), (omitted)), ((omitted), (BR, GR, KR)), ((AR, CR, ER, HR), (omitted)), ((omitted), (AR, CR, ER, HR))]; data definitions: [[0, 0, 0, 1], [0, 1, 0, 0], [0, 1, 1, 0], [0, 1, 0, 1], [0, 0, 1, 1], [0, 1, 0, 1], [0, 0, 1, 1]]

Fourth Modification of 11th Embodiment

Read voltages: [((DR), (DR)), ((DR), (FR, HR, JR)), ((FR, HR, JR), (DR)), ((BR, GR, KR), (omitted)), ((omitted), (BR, GR, KR)), ((AR, CR, ER, HR), (omitted)), ((omitted), (AR, CR, ER, HR))]; data definitions: [[0, 0, 0, 1], [0, 1, 1, 0], [0, 1, 1, 0], [0, 1, 0, 1], [0, 0, 1, 1], [0, 1, 0, 1], [0, 0, 1, 1]]

Fifth Modification of 11th Embodiment

Read voltages: [((HR), (HR)), ((HR), (BR, ER, GR)), ((BR, ER, GR), (HR)), ((DR, IR, KR), (omitted)), ((omitted), (DR, IR, KR)), ((AR, CR, FR, JR), (omitted)), ((omitted), (AR, CR, FR, JR))]; data definitions: [[0, 1, 1, 1], [0, 0, 1, 0], [0, 1, 1, 0], [0, 1, 0, 1], [0, 0, 1, 1], [0, 1, 0, 1], [0, 0, 1, 1]]

Sixth Modification of 11th Embodiment

Read voltages: [((HR), (HR)), ((HR), (BR, ER, GR)), ((BR, ER, GR), (HR)), ((DR, IR, KR), (omitted)), ((omitted), (DR, IR, KR)), ((AR, CR, FR, JR), (omitted)), ((omitted), (AR, CR, FR, JR))]; data definitions: [[0, 1, 1, 1], [0, 1, 1, 0], [0, 1, 1, 0], [0, 1, 0, 1], [0, 0, 1, 1], [0, 1, 0, 1], [0, 0, 1, 1]]

Seventh Modification of 11th Embodiment

Read voltages: [((DR), (DR)), ((DR), (FR, HR, JR)), ((FR, HR, JR), (DR)), ((BR, ER, IR), (omitted)), ((omitted), (BR, ER, IR)), ((AR, CR, GR, KR), (omitted)), ((omitted), (AR, CR, GR, KR))]; data definitions: [[0, 0, 0, 1], [0, 1, 0, 0], [0, 1, 1, 0], [0, 1, 0, 1], [0, 0, 1, 1], [0, 1, 0, 1], [0, 0, 1, 1]]

Eighth Modification of 11th Embodiment

Read voltages: [((DR), (DR)), ((DR), (FR, HR, JR)), ((FR, HR, JR), (DR)), ((BR, ER, IR), (omitted)), ((omitted), (BR, ER, IR)), ((AR, CR, GR, KR), (omitted)), ((omitted), (AR, CR, GR, KR))]; data definitions: [[0, 0, 0, 1], [0, 1, 1, 0], [0, 1, 1, 0], [0, 1, 0, 1], [0, 0, 1, 1], [0, 1, 0, 1], [0, 0, 1, 1]]

Ninth Modification of 11th Embodiment

Read voltages: [((HR), (HR)), ((HR), (BR, DR, FR)), ((BR, DR, FR), (HR)), ((CR, GR, JR), (omitted)), ((omitted), (CR, GR, JR)), ((AR, ER, IR, KR), (omitted)), ((omitted), (AR, ER, IR, KR))]; data definitions: [[0, 1, 1, 1], [0, 0, 1, 0], [0, 1, 1, 0], [0, 1, 0, 1], [0, 0, 1, 1], [0, 1, 0, 1], [0, 0, 1, 1]]

10th Modification of 11th Embodiment

Read voltages: [((HR), (HR)), ((HR), (BR, DR, FR)), ((BR, DR, FR), (HR)), ((CR, GR, JR), (omitted)), ((omitted), (CR, GR, JR)), ((AR, ER, IR, KR), (omitted)), ((omitted), (AR, ER, IR, KR))]; data definitions: [[0, 1, 1, 1], [0, 1, 1, 0], [0, 1, 1, 0], [0, 1, 0, 1], [0, 0, 1, 1], [0, 1, 0, 1], [0, 0, 1, 1]]

11th Modification of 11th Embodiment

Read voltages: [((DR), (DR)), ((DR), (FR, IR, KR)), ((FR, IR, KR), (DR)), ((AR, CR, HR), (omitted)), ((omitted), (AR, CR, HR)), ((BR, ER, GR, JR), (omitted)), ((omitted), (BR, ER, GR, JR))]; data definitions: [[0, 0, 0, 1], [0, 1, 0, 0], [0, 1, 1, 0], [0, 1, 0, 1], [0, 0, 1, 1], [0, 1, 0, 1], [0, 0, 1, 1]]

12th Modification of 11th Embodiment

Read voltages: [((DR), (DR)), ((DR), (ER, GR, JR)), ((ER, GR, JR), (DR)), ((AR, CR, HR), (omitted)), ((omitted), (AR, CR, HR)), ((BR, FR, IR, KR), (omitted)), ((omitted), (BR, FR, IR, KR))]; data definitions: [[0, 0, 0, 1], [0, 1, 0, 0], [0, 1, 1, 0], [0, 1, 0, 1], [0, 0, 1, 1], [0, 1, 0, 1], [0, 0, 1, 1]]

13th Modification of 11th Embodiment

Read voltages: [((DR), (DR)), ((DR), (ER, GR, JR)), ((ER, GR, JR), (DR)), ((AR, CR, HR), (omitted)), ((omitted), (AR, CR, HR)), ((BR, FR, IR, KR), (omitted)), ((omitted), (BR, FR, IR, KR))]; data definitions: [[0, 0, 0, 1], [0, 1, 1, 0], [0, 1, 1, 0], [0, 1, 0, 1], [0, 0, 1, 1], [0, 1, 0, 1], [0, 0, 1, 1]]

14th Modification of 11th Embodiment

Read voltages: [((HR), (HR)), ((HR), (BR, DR, FR)), ((BR, DR, FR), (HR)), ((AR, ER, JR), (omitted)), ((omitted), (AR, ER, JR)), ((CR, GR, IR, KR), (omitted)), ((omitted), (CR, GR, IR, KR))]; data definitions: [[0, 1, 1, 1], [0, 0, 1, 0], [0, 1, 1, 0], [0, 1, 0, 1], [0, 0, 1, 1], [0, 1, 0, 1], [0, 0, 1, 1]]

15th Modification of 11th Embodiment

Read voltages: [((HR), (HR)), ((HR), (BR, DR, FR)), ((BR, DR, FR), (HR)), ((AR, ER, JR), (omitted)), ((omitted), (AR, ER, JR)), ((CR, GR, IR, KR), (omitted)), ((omitted), (CR, GR, IR, KR))]; data definitions: [[0, 1, 1, 1], [0, 1, 1, 0], [0, 1, 1, 0], [0, 1, 0, 1], [0, 0, 1, 1], [0, 1, 0, 1], [0, 0, 1, 1]]

16th Modification of 11th Embodiment

Read voltages: [((DR), (DR)), ((DR), (GR, KR)), ((GR, KR), (DR)), ((AR, CR, ER, IR), (omitted)), ((omitted), (AR, CR, ER, IR)), ((BR, FR, HR, JR), (omitted)), ((omitted), (BR, FR, HR, JR))]; data definitions: [[0, 0, 0, 1], [0, 1, 1, 0], [0, 1, 1, 0], [0, 1, 0, 1], [0, 0, 1, 1], [0, 1, 0, 1], [0, 0, 1, 1]]

17th Modification of 11th Embodiment

Read voltages: [((DR), (DR)), ((DR), (GR, KR)), ((GR, KR), (DR)), ((AR, CR, ER, IR), (omitted)), ((omitted), (AR, CR, ER, IR)), ((BR, FR, HR, JR), (omitted)), ((omitted), (BR, FR, HR, JR))]; data definitions: [[0, 0, 0, 1], [0, 1, 0, 0], [0, 1, 1, 0], [0, 1, 0, 1], [0, 0, 1, 1], [0, 1, 0, 1], [0, 0, 1, 1]]

18th Modification of 11th Embodiment

Read voltages: [((DR), (DR)), ((DR), (GR, KR)), ((GR, KR), (DR)), ((AR, CR, ER, IR), (omitted)), ((omitted), (AR, CR, ER, IR)), ((BR, FR, HR, JR), (omitted)), ((omitted), (BR, FR, HR, JR))]; data definitions: [[0, 0, 0, 1], [0, 1, 1, 0], [0, 0, 1, 0], [0, 1, 0, 1], [0, 0, 1, 1], [0, 1, 0, 1], [0, 0, 1, 1]]

19th Modification of 11th Embodiment

Read voltages: [((DR), (DR)), ((DR), (ER, IR)), ((ER, IR), (DR)), ((AR, CR, GR, KR), (omitted)), ((omitted), (AR, CR, GR, KR)), ((BR, FR, HR, JR), (omitted)), ((omitted), (BR, FR, HR, JR))]; data definitions: [[0, 0, 0, 1], [0, 1, 1, 0], [0, 1, 1, 0], [0, 1, 0, 1], [0, 0, 1, 1], [0, 1, 0, 1], [0, 0, 1, 1]]

20th Modification of 11th Embodiment

Read voltages: [((DR), (DR)), ((DR), (ER, IR)), ((ER, IR), (DR)), ((AR, CR, GR, KR), (omitted)), ((omitted), (AR, CR, GR, KR)), ((BR, FR, HR, JR), (omitted)), ((omitted), (BR, FR, HR, JR))]; data definitions: [[0, 0, 0, 1], [0, 1, 0, 0], [0, 1, 1, 0], [0, 1, 0, 1], [0, 0, 1, 1], [0, 1, 0, 1], [0, 0, 1, 1]]

21st Modification of 11th Embodiment

Read voltages: [((DR), (DR)), ((DR), (ER, IR)), ((ER, IR), (DR)), ((AR, CR, GR, KR), (omitted)), ((omitted), (AR, CR, GR, KR)), ((BR, FR, HR, JR), (omitted)), ((omitted), (BR, FR, HR, JR))]; data definitions: [[0, 0, 0, 1], [0, 1, 1, 0], [0, 0, 1, 0], [0, 1, 0, 1], [0, 0, 1, 1], [0, 1, 0, 1], [0, 0, 1, 1]]

22nd Modification of 11th Embodiment

Read voltages: [((HR), (HR)), ((HR), (AR, ER)), ((AR, ER), (HR)), ((BR, DR, FR, JR), (omitted)), ((omitted), (BR, DR, FR, JR)), ((CR, GR, IR, KR), (omitted)), ((omitted), (CR, GR, IR, KR))]; data definitions: [[0, 1, 1, 1], [0, 1, 1, 0], [0, 1, 1, 0], [0, 1, 0, 1], [0, 0, 1, 1], [0, 1, 0, 1], [0, 0, 1, 1]]

23rd Modification of 11th Embodiment

Read voltages: [((HR), (HR)), ((HR), (AR, ER)), ((AR, ER), (HR)), ((BR, DR, FR, JR), (omitted)), ((omitted), (BR, DR, FR, JR)), ((CR, GR, IR, KR), (omitted)), ((omitted), (CR, GR, IR, KR))]; data definitions: [[0, 1, 1, 1], [0, 1, 1, 0], [0, 1, 1, 1], [0, 1, 0, 1], [0, 0, 1, 1], [0, 1, 0, 1], [0, 0, 1, 1]]

24th Modification of 11th Embodiment

Read voltages: [((HR), (HR)), ((HR), (AR, ER)), ((AR, ER), (HR)), ((BR, DR, FR, JR), (omitted)), ((omitted), (BR, DR, FR, JR)), ((CR, GR, IR, KR), (omitted)), ((omitted), (CR, GR, IR, KR))]; data definitions: [[0, 1, 1, 1], [0, 1, 1, 1], [0, 1, 1, 0], [0, 1, 0, 1], [0, 0, 1, 1], [0, 1, 0, 1], [0, 0, 1, 1]]

25th Modification of 11th Embodiment

Read voltages: [((HR), (HR)), ((HR), (CR, GR)), ((CR, GR), (HR)), ((AR, ER, IR, KR), (omitted)), ((omitted), (AR, ER, IR, KR)), ((BR, DR, FR, JR), (omitted)), ((omitted), (BR, DR, FR, JR))]; data definitions: [[0, 1, 1, 1], [0, 1, 1, 0], [0, 1, 1, 0], [0, 1, 0, 1], [0, 0, 1, 1], [0, 1, 0, 1], [0, 0, 1, 1]]

26th Modification of 11th Embodiment

Read voltages: [((HR), (HR)), ((HR), (CR, GR)), ((CR, GR), (HR)), ((AR, ER, IR, KR), (omitted)), ((omitted), (AR, ER, IR, KR)), ((BR, DR, FR, JR), (omitted)), ((omitted), (BR, DR, FR, JR))]; data definitions: [[0, 1, 1, 1], [0, 1, 1, 0], [0, 1, 1, 1], [0, 1, 0, 1], [0, 0, 1, 1], [0, 1, 0, 1], [0, 0, 1, 1]]

27th Modification of 11th Embodiment

Read voltages: [((HR), (HR)), ((HR), (CR, GR)), ((CR, GR), (HR)), ((AR, ER, IR, KR), (omitted)), ((omitted), (AR, ER, IR, KR)), ((BR, DR, FR, JR), (omitted)), ((omitted), (BR, DR, FR, JR))]; data definitions: [[0, 1, 1, 1], [0, 1, 1, 1], [0, 1, 1, 0], [0, 1, 0, 1], [0, 0, 1, 1], [0, 1, 0, 1], [0, 0, 1, 1]]

The semiconductor memory 10 of each of the above-described third through 27th modifications of the 11th embodiment is capable of performing the same operation as that of the second modification of the 11th embodiment, and can achieve similar advantageous effects.

[12] 12th Embodiment

The semiconductor memory 10 according to the 12th embodiment stores 4-bit data in two memory cell transistors MT with the use of a data allocation differing from that of the first embodiment. In the following, differences between the semiconductor memory 10 of the 12th embodiment and the first embodiment will be described.

[12-1] Data Allocation

FIG. 102 shows an example of data allocation for the threshold distributions of the memory cell transistors MT in the semiconductor memory 10 according to the 12th embodiment.

As shown in FIG. 102, in the semiconductor memory 10 according to the 12th embodiment, 16 combinations are possible by combining four threshold voltages in the memory cell transistors MT in plane PL1 with four threshold voltages in the memory cell transistors MT in plane PL2. Furthermore, in the 12th embodiment, 4-bit data is allocated to each of the 16 combinations, as shown below:

(Example) "Threshold voltage of memory cell transistors MT in plane PL1", "threshold voltage of memory cell transistors MT in plane PL2": "first bit/second bit/third bit/fourth bit" data (1) "Z" state, "Z" state: "1100" data
    (2) "Z" state, "A" state: "1110" data
    (3) "Z" state, "B" state: "1010" data
    (4) "Z" state, "C" state: "1011" data (5) "A" state, "Z" state: "0100" data
    (6) "A" state, "A" state: "0110" data
    (7) "A" state, "B" state: "0010" data
    (8) "A" state, "C" state: "0011" data
    (9) "B" state, "Z" state: "0111" data
    (10) "B" state, "A" state: "0101" data
    (11) "B" state, "B" state: "0001" data
    (12) "B" state, "C" state: "0000" data
    (13) "C" state, "Z" state: "1111" data
    (14) "C" state, "A" state: "1101" data
    (15) "C" state, "B" state: "1001" data
    (16) "C" state, "C" state: "1000" data FIG. 103 shows read voltages that are set for the data allocation shown in FIG. 102, and definitions of read data to be applied to the read results of the pages.

As shown in FIG. 103, the first-page data is confirmed as a result of reading performed to plane PL1 with the use of the read voltages AR and CR.

The second-page data is confirmed as a result of reading performed to plane PL2 with the use of the read voltage BR.

The third-page data is confirmed as a result of reading performed to plane PL1 with the use of the read voltage DR, and as a result of reading performed to plane PL2 with the use of the read voltage AR.

The fourth-page data is confirmed as a result of reading performed to plane PL1 with the use of the read voltage BR, and as a result of reading performed to plane PL2 with the use of the read voltage CR.

The read data based on results of a read operation in each of plane PL1 and plane PL2 is defined as follows:

(Example) Read operation: (result of reading plane PL1, result of reading plane PL2, read data)×4 types First-page read: (0, 0, 0), (1, 0, 1), (0, 1, 0), (1, 1, 1)
    Second-page read: (0, 0, 1), (1, 0, 0), (0, 1, 1), (1, 1, 0)
    Third-page read: (0, 0, 0), (1, 0, 1), (0, 1, 1), (1, 1, 0)
    Fourth-page read: (0, 0, 0), (1, 0, 1), (0, 1, 1), (1, 1, 0)

Since the rest of the configuration of the semiconductor memory 10 according to the 12th embodiment, and the details of the write operation therein are the same as those in the semiconductor memory 10 according to the first embodiment, descriptions of the rest of the configuration and the write operation are omitted. As for the read operation, descriptions thereof will be omitted, as it is the same as the read operation in the first example, except that the read voltages shown in FIG. 103 are used in the read operation performed to each page.

[12-2] Advantageous Effects of 12th Embodiment

As described above, in the semiconductor memory 10 according to the 12th embodiment, 4-bit data can be stored in a set of two memory cell transistors MT. In the semiconductor memory 10 according to the 12th embodiment, the number of times that read is performed per page is (2+1+1+1)/4=1.25.

Accordingly, the semiconductor memory 10 of the 12th embodiment can decrease the number of times that read is performed per page in a case where multiple-bit data is stored in the memory cells. Accordingly, the semiconductor memory 10 of the 12th embodiment can enhance the speed of a read operation, similarly to the first embodiment.

[12-3] Modifications of 12th Embodiment

In the 12th embodiment, an example where the data allocation shown in FIG. 102 is used is described; however, other data allocations may be adopted.

Combinations of read voltages and data definitions in the first to fifth modifications of the 12th embodiment are listed below. A data allocation for each of the following combinations is set as appropriate based on a combination of read voltages and data definitions.

(Example) Read voltages: [first-page read ((x) read voltage of PL1, (y) read voltage of PL2), second-page read ((x), (y)), third-page read ((x), (y)), fourth-page read ((x), (y))]; Data definitions: [first-page read [(a) read data when "0", "0" (="read result of PL1", "read result of PL2"), (b) read data when "1", "0", (c) read data when "0", "1", (d) read data when "1", "1"], second-page read [(a), (b), (c), (d)], third-page read [(a), (b), (c), (d)], fourth-page read [(a), (b), (c), (d)]]

First Modification of 12th Embodiment

Read voltages: [((AR, CR), (AR)), ((omitted), (BR)), ((BR), (AR)), ((BR), (CR))]; data definitions: [[0, 1, 1, 0], [0, 0, 1, 1], [0, 1, 1, 0], [0, 1, 1, 0]]

Second Modification of 12th Embodiment

Read voltages: [((AR, CR), (BR)), ((omitted), (BR)), ((BR), (AR)), ((BR), (CR))]; data definitions: [[0, 1, 1, 0], [0, 0, 1, 1], [0, 1, 1, 0], [0, 1, 1, 0]]

Third Modification of 12th Embodiment

Read voltages: [((AR, CR), (CR)), ((omitted), (BR)), ((BR), (AR)), ((BR), (CR))]; data definitions: [[0, 1, 1, 0], [0, 0, 1, 1], [0, 1, 1, 0], [0, 1, 1, 0]]

Fourth Modification of 12th Embodiment

Read voltages: [((AR, CR), (AR, BR)), ((omitted), (BR)), ((BR), (AR)), ((BR), (CR))]; data definitions: [[0, 1, 1, 0], [0, 0, 1, 1], [0, 1, 1, 0], [0, 1, 1, 0]]

Fifth Modification of 12th Embodiment

Read voltages: [((AR, CR), (AR, CR)), ((omitted), (BR)), ((BR), (AR)), ((BR), (CR))]; data definitions: [[0, 1, 1, 0], [0, 0, 1, 1], [0, 1, 1, 0], [0, 1, 1, 0]]

Sixth Modification of 12th Embodiment

Read voltages: [((AR, CR), (BR, CR)), ((omitted), (BR)), ((BR), (AR)), ((BR), (CR))]; data definitions: [[0, 1, 1, 0], [0, 0, 1, 1], [0, 1, 1, 0], [0, 1, 1, 0]]

The semiconductor memory 10 of each of the above-described first through fifth modifications of the 12th embodiment is capable of performing the same operation as that of the 12th embodiment, and can achieve similar advantageous effects.

[13] 13th Embodiment

The semiconductor memory 10 according to the 13th embodiment stores 6-bit data in two memory cell transistors MT with the use of a data allocation differing from that of the first embodiment. In the following, differences between the semiconductor memory 10 of the 13th embodiment and the first embodiment will be described.

[13-1] Data Allocation

FIGS. 104 and 105 show an example of data allocation for the threshold distributions of the memory cell transistors MT in the semiconductor memory 10 according to the 13th embodiment.

As shown in FIGS. 104 and 105, in the semiconductor memory 10 according to the 13th embodiment, 64 combinations are possible by combining eight threshold voltages in the memory cell transistors MT in plane PL1 with eight threshold voltages in the memory cell transistors MT in plane PL2. Furthermore, in the 13th embodiment, 6-bit data is allocated to each of the 64 combinations, as shown below:

(Example) "Threshold voltage of memory cell transistors MT in plane PL1", "threshold voltage of memory cell transistors MT in plane PL2": "first bit/second bit/third bit/fourth bit/fifth bit/sixth bit" data (1) "Z" state, "Z" state: "111000" data
(2) "Z" state, "A" state: "111010" data
(3) "Z" state, "B" state: "111111" data
(4) "Z" state, "C" state: "111101" data
(5) "Z" state, "D" state: "101101" data
(6) "Z" state, "E" state: "101100" data
(7) "Z" state, "F" state: "101010" data
(8) "Z" state, "G" state: "101011" data
(9) "A" state, "Z" state: "111011" data
(10) "A" state, "A" state: "111001" data
(11) "A" state, "B" state: "111100" data
(12) "A" state, "C" state: "111110" data
(13) "A" state, "D" state: "101110" data
(14) "A" state, "E" state: "101111" data
(15) "A" state, "F" state: "101001" data
(16) "A" state, "G" state: "101000" data
(17) "B" state, "Z" state: "110011" data
(18) "B" state, "A" state: "110001" data
(19) "B" state, "B" state: "110100" data
(20) "B" state, "C" state: "110110" data
(21) "B" state, "D" state: "100110" data
(22) "B" state, "E" state: "100111" data
(23) "B" state, "F" state: "100001" data
(24) "B" state, "G" state: "100000" data
(25) "C" state, "Z" state: "110000" data
(26) "C" state, "A" state: "110010" data
(27) "C" state, "B" state: "110111" data
(28) "C" state, "C" state: "110101" data
(29) "C" state, "D" state: "100101" data
(30) "C" state, "E" state: "100100" data
(31) "C" state, "F" state: "100010" data
(32) "C" state, "G" state: "100011" data
(33) "D" state, "Z" state: "010000" data
(34) "D" state, "A" state: "010010" data
(35) "D" state, "B" state: "010111" data
(36) "D" state, "C" state: "010101" data
(37) "D" state, "D" state: "000101" data
(38) "D" state, "E" state: "000100" data
(39) "D" state, "F" state: "000010" data
(40) "D" state, "G" state: "000011" data
(41) "E" state, "Z" state: "010011" data
(42) "E" state, "A" state: "010001" data
(43) "E" state, "B" state: "010100" data
(44) "E" state, "C" state: "010110" data
(45) "E" state, "D" state: "000110" data
(46) "E" state, "E" state: "000111" data
(47) "E" state, "F" state: "000001" data

(48) "E" state, "G" state: "000000" data
(49) "F" state, "Z" state: "011011" data
(50) "F" state, "A" state: "011001" data
(51) "F" state, "B" state: "011100" data
(52) "F" state, "C" state: "011110" data
(53) "F" state, "D" state: "001110" data
(54) "F" state, "E" state: "001111" data
(55) "F" state, "F" state: "001001" data
(56) "F" state, "G" state: "001000" data
(57) "G" state, "Z" state: "011111" data
(58) "G" state, "A" state: "011101" data
(59) "G" state, "B" state: "011000" data
(60) "G" state, "C" state: "011010" data
(61) "G" state, "D" state: "001010" data
(62) "G" state, "E" state: "001011" data
(63) "G" state, "F" state: "001101" data
(64) "G" state, "G" state: "001100" data FIG. 106 shows read voltages that are set for the data allocation shown in FIGS. 104 and 105, and definitions of read data to be applied to the read results of the pages.

As shown in FIG. 106, the first-page data is confirmed as a result of reading performed to plane PL1 with the use of the read voltage DR.

The second-page data is confirmed as a result of reading performed to plane PL2 with the use of the read voltage DR.

The third-page data is confirmed as a result of reading performed to plane PL1 with the use of the read voltages BR and FR.

The fourth-page data is confirmed as a result of reading performed to plane PL1 with the use of the read voltage GR, and as a result of reading performed to plane PL2 with the use of the read voltages BR and FR.

The fifth-page data is confirmed as a result of reading performed to plane PL1 with the use of the read voltages AR, CR, and ER, and as a result of reading performed to plane PL2 with the use of the read voltages AR, CR, and FR.

The sixth-page data is confirmed as a result of reading performed to plane PL1 with the use of the read voltages AR, CR, and ER, and as a result of reading performed to plane PL2 with the use of the read voltage BR, ER, and GR.

The read data based on results of a read operation in each of plane PL1 and plane PL2 is defined as follows:
(Example) Read operation: (result of reading plane PL1, result of reading plane PL2, read data)×4 types
First-page read: (0, 0, 0), (1, 0, 1), (0, 1, 0), (1, 1, 1)
Second-page read: (0, 0, 0), (1, 0, 0), (0, 1, 1), (1, 1, 1)
Third-page read: (0, 0, 0), (1, 0, 1), (0, 1, 0), (1, 1, 1)
Fourth-page read: (0, 0, 0), (1, 0, 1), (0, 1, 1), (1, 1, 0)
Fifth-page read: (0, 0, 0), (1, 0, 1), (0, 1, 1), (1, 1, 0)
Sixth-page read: (0, 0, 0), (1, 0, 1), (0, 1, 1), (1, 1, 0)

Since the rest of the configuration of the semiconductor memory 10 according to the 13th embodiment, and the details of the write operation therein are the same as those in the semiconductor memory 10 according to the first embodiment, descriptions of the rest of the configuration and the write operation are omitted. As for the read operation, descriptions thereof will be omitted, as it is the same as the read operation in the first example, except that the read voltages shown in FIG. 106 are used in the read operation performed to each page.

[13-2] Advantageous Effects of 13th Embodiment

As described above, in the semiconductor memory 10 according to the 13th embodiment, 6-bit data can be stored in a set of two memory cell transistors MT. In the semiconductor memory 10 according to the 13th embodiment, the number of times that read is performed per page is (1+1+2+2+3+3)/6=2.

Accordingly, the semiconductor memory 10 of the 13th embodiment can reduce the number of times that read is performed per page in a case where multiple-bit data is stored in the memory cells. Accordingly, the semiconductor memory 10 of the 13th embodiment can enhance the speed of a read operation, similarly to the first embodiment.

[13-3] Modifications of 13th Embodiment

In the 13th embodiment, an example where the data allocation shown in FIGS. 104 and 105 is used is described; however, other data allocations may be adopted.

Combinations of read voltages and data definitions in the first to fifth modifications of the 13th embodiment are listed below. A data allocation for each of the following combinations is set as appropriate based on a combination of read voltages and data definitions.

(Example) Read voltage: [first-page read ((x) read voltage of PL1, (y) read voltage of PL2), second-page read ((x), (y)), third-page read ((x), (y)), fourth-page read ((x), (y)), fifth-page read ((x), (y)), sixth-page read ((x), (y))]; Data definitions: [first-page read [(a) read data when "0", "0"=read result of PL1, read result of PL2, (b) read data when "1", "0", (c) read data when "0", "1", (d) read data when "1", "1"], second-page read [(a), (b), (c), (d)], third-page read [(a), (b), (c), (d)], fourth-page read [(a), (b), (c), (d)], fifth-page read [(a), (b), (c), (d)], sixth-page read [(a), (b), (c), (d)]]

First Modification of 13th Embodiment

Read voltages: [((AR), (BR, FR)), ((BR, FR), (AR)), ((DR), (AR)), ((AR), (DR)), ((CR, ER, GR), (AR, DR, GR)), ((CR, ER, GR), (CR, ER, FR)); data definitions: [[0, 0, 1, 1], [0, 1, 0, 1], [0, 1, 0, 1], [0, 1, 1, 0], [0, 1, 1, 0], [0, 1, 1, 0]

Second Modification of 13th Embodiment

Read voltages: [((AR), (BR, FR)), ((BR, FR), (AR)), ((AR), (DR)), ((DR), (AR)), ((AR, BR, ER), (CR, ER, GR)), ((CR, FR, GR), (CR, ER, GR)); data definitions: [[0, 0, 1, 1], [0, 1, 1, 0], [0, 0, 1, 1], [0, 1, 1, 0], [0, 1, 1, 0], [0, 1, 1, 0]

Third Modification of 13th Embodiment

Read voltages: [((BR, FR), (AR)), ((CR, FR), (DR)), ((DR), (BR)), ((FR), (FR)), ((AR, BR, GR), (CR, ER, FR)), ((AR, FR, GR), (AR, DR, GR)); data definitions: [[0, 1, 0, 1], [0, 1, 1, 0], [0, 1, 1, 0], [0, 1, 1, 0], [0, 1, 1, 0], [0, 1, 1, 0]

Fourth Modification of 13th Embodiment

Read voltage: [((BR), (CR, GR)), ((FR), (BR, FR)), ((DR), (AR)), ((FR), (DR)), ((AR, CR, DR), (AR, BR, ER)), ((BR, ER, GR), (AR, BR, ER)); data definitions: [[0, 1, 1, 0], [0, 1, 1, 0], [0, 1, 0, 1], [0, 1, 1, 0], [0, 1, 1, 0], [0, 1, 1, 0]

Fifth Modification of 13th Embodiment

Read voltages: [((DR), (CR, ER)), ((BR, FR), (AR)), ((DR), (BR)), ((DR), (FR)), ((AR, CR, DR), (AR, DR, GR)), ((ER, FR, GR), (AR, DR, GR)); data definitions: [[0, 1, 1, 0], [0, 1, 1, 0], [0, 1, 1, 0], [0, 1, 1, 0], [0, 1, 1, 0], [0, 1, 1, 0]

The semiconductor memory 10 of each of the above-described first through fifth modifications of the 13th embodiment is capable of performing the same operation as that of the 13th embodiment, and can achieve similar advantageous effects.

[14] 14th Embodiment

A semiconductor memory 10 of the 14th embodiment stores 3-bit data using two memory cell transistors MT within a same plane PL. In the following, differences between the semiconductor memory 10 according to the 14th embodiment and the first to 13th embodiments will be described.

[14-1] Configuration

[14-1-1] Configuration of Semiconductor Memory 10

FIG. 107 is a block diagram showing a configuration example of the semiconductor memory 10 of the 14th embodiment, and the memory cell array 11 and the sense amplifier module 17 are partially shown therein. As shown in FIG. 107, in the semiconductor memory 10 according to the 14th embodiment, the sense amplifier module 17 is coupled to the input/output circuit 19 via a bus, and the logic circuit 18, for example, is omitted.

In the sense amplifier module 17 of the 14th embodiment, two sense amplifier units SAU are used as one sense amplifier set SAS. Specifically, a set of sense amplifier unit SAU0 and sense amplifier unit SAU1 is used as sense amplifier set SAS0, and a set of sense amplifier units SAU (m−1) and SAUm is used as sense amplifier set SAS (m/2). The number of sense amplifier sets SAS is a half of the number of the bit lines, for example. Two sense amplifier units SAU included in a sense amplifier set SAS are coupled in such a manner that they can perform data communications to each other.

The semiconductor memory 10 of the 14th embodiment stores 3-bit data with the use of a set of two memory cell transistors MT corresponding to two sense amplifier units SAU included in a sense amplifier set SAS. In other words, the semiconductor memory 10 according to the 14th embodiment stores data of multiple in two memory cell transistors MT sharing word line WLi (i is a variable).

Hereinafter, the memory cell transistors MT coupled to one of the two sense amplifier units SAU included in a sense amplifier set SAS will be referred to as "memory cell transistors MTa", and the memory cell transistors MT coupled to the other sense amplifier unit SAU in the set will be referred to as "memory cell transistors MTb". FIG. 107 shows a case where sense amplifier units SAU0 and SAU1 are adjacent, and sense amplifier units SAU (m−1) and SAUm are adjacent; however, the present embodiment is not limited to this case. Two sense amplifier units SAU in a combination are only have to be placed closely, and configured to be capable of performing communications therebetween.

In the semiconductor memory 10, bus BUS0, bus BUS1, and the logic circuit 18 may be provided between the sense amplifier units SAU and the input/output circuit 19 as shown in FIG. 83, even if the semiconductor memory 10 has the sense amplifier units SAU and the input/output circuit 19, as shown in FIG. 107. In this case, the computation in the semiconductor memory 10 is partially executed by the logic circuit 18.

[14-1-2] Threshold Distributions of Memory Cell Transistor MT

Figure 108:
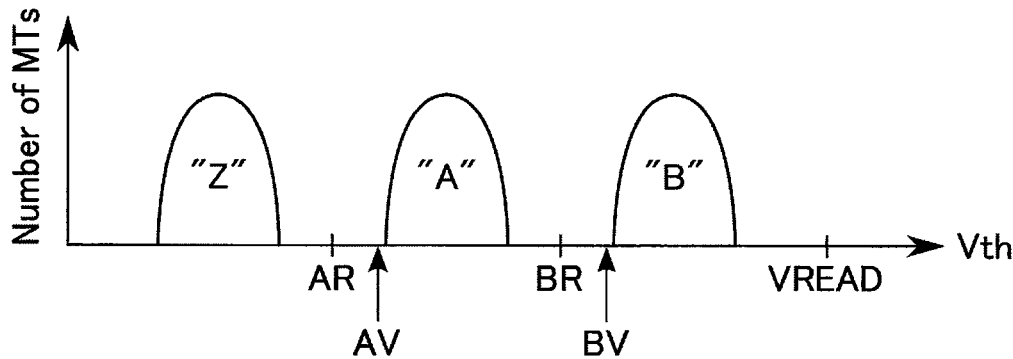
FIG. 108 is a threshold distribution diagram showing an example of the distribution of threshold voltages of memory cell transistors according to the 14th embodiment.

FIG. 108 shows an example of threshold distributions of the memory cell transistors MT, read voltages, and verify voltages in the semiconductor memory 10 according to the 14th embodiment. The vertical axis of the threshold distributions shown in FIG. 108 indicates the number of the memory cell transistors MT, and the horizontal axis indicates threshold voltages Vth of the memory cell transistors MT.

In the 14th embodiment, a plurality of memory cell transistors MT included in one cell unit CU form three threshold distributions as shown in FIG. 108. For example, these three distributions (write states) are called "Z" state, "A" state, and "B" state, from lower to higher threshold voltage. Since the setting of the read voltages and verify voltages corresponding to the "Z" state, "A" state, and "B" state are the same as those in the first embodiment, descriptions thereof are omitted.

[14-1-3] Data Allocation

FIG. 109 shows an example of data allocation for the threshold distributions of the memory cell transistors MT in the semiconductor memory 10 according to the 14th embodiment.

As shown in FIG. 109, in the semiconductor memory 10 according to the 14th embodiment, nine combinations are possible by combining three threshold voltages in the memory cell transistors MTa with three threshold voltages in the memory cell transistors MTb. Furthermore, in the 14th embodiment, 3-bit data is allocated to each of the nine combinations, as shown below:

(Example) "Threshold voltage of memory cell transistors MTa", threshold voltage of memory cell transistors MTb": "first bit/second bit/third bit" data (1) "Z" state, "Z" state: "111" data
(2) "Z" state, "A" state: "101" data
(3) "Z" state, "B" state: "100" data
(4) "A" state, "Z" state: "111" data
(5) "A" state, "A" state: "001" data
(6) "A" state, "B" state: "000" data
(7) "B" state, "Z" state: "110" data
(8) "B" state, "A" state: "010" data
(9) "B" state, "B" state: "011" data Thus, in the 14th embodiment, eight types of 3-bit data are allocated to the nine combinations; accordingly, the same 3-bit data is allocated to the combinations (1) and (4). In the 14th embodiment, either one of the combinations to which the same 3-bit data is allocated is used.

FIG. 110 shows read voltages that are set for the data allocation shown in FIG. 109, and definitions of read data to be applied to the read results of the pages.

As shown in FIG. 110, the first-page data is confirmed as a result of reading with the use of the read voltage AR in the memory cell transistor MTa, and as a result of reading with the use of the read voltage AR in the memory cell transistor MTb.

The second-page data is confirmed as a result of reading with the use of the read voltage BR in the memory cell transistor MTa, and as a result of reading with the use of the read voltage AR in the memory cell transistor MTb.

The third-page data is confirmed as a result of reading with the use of the read voltage BR in the memory cell transistor MTa, and as a result of reading with the use of the read voltage BR in the memory cell transistor MTb.

In the semiconductor memory 10 of the first embodiment, the read data based on results of reading in each of the memory cell transistors MTa and MTb is defined as follows:

(Example) Read operation: (read result of memory cell transistors MTa, read result of memory cell transistors MTb, read data)×4 types First-page read: (0, 0, 0), (1, 0, 1), (0, 1, 1), (1, 1, 1)

Second-page read: (0, 0, 1), (1, 0, 0), (0, 1, 1), (1, 1, 1)

Third-page read: (0, 0, 1), (1, 0, 0), (0, 1, 0), (1, 1, 1)

Since the rest of the configuration in the semiconductor memory 10 according to the 14th embodiment is the same as those in the semiconductor memory 10 according to the first embodiment, detailed descriptions of the rest of the configuration are omitted.

[14-2] Read Operations

The three-page read operation of the semiconductor memory 10 according to the 14th embodiment will be described below. FIG. 111 shows an example of a command sequence, and voltages to be applied to a selected word line WLsel in third-page read operation in the semiconductor memory 10 according to the 14th embodiment.

As shown in FIG. 111, first, the memory controller 20 sequentially sends, for example, a command "00h", address information ADD, and a command "30h" to the semiconductor memory 10. Upon receipt of the command "30h", the semiconductor memory 10 switches from a ready state to a busy state, and commences the sequential read for the first and second pages. In the command sequence shown in FIG. 111, a command indicating a read operation for three-page data may be added prior to the commend "00h".

In a read operation for three-page data, the sequencer 14 applies the read voltages AR and BR to a selected word line WLsel, and a control signal STB is asserted while each read voltage is being applied. For example, a read result obtained by using the read voltage AR is retained in the latch circuit ADL, and a read result obtained by using the read voltage BR is retained in the latch circuit BDL.

After the read results obtained by using the read voltages AR and BR are retained in the latch circuits of the sense amplifier unit SAU, the sequencer 14 performs calculation processing in each sense amplifier unit SAS, like the calculation performed by the logic circuit 18. Specifically, the sequencer 14 confirms a 1-bit read result in sense amplifier set SAS0 based on, for example, a read result of the memory cell transistors MTa retained in sense amplifier unit SAU0, a read result of the memory cell transistors MTb retained in sense amplifier unit SAU1, and the data definitions shown in FIG. 110. The same operation is performed to the other sense amplifier sets SAS.

Then, the sequencer 14 causes the sense amplifier unit SAU to transfer the read result for the first page to the latch circuit XDL, and changes the semiconductor memory 10 from a busy state to a ready state. Thereafter, upon detection of a change in the semiconductor memory 10 from a busy state to a ready state, the memory controller 20 causes the semiconductor memory 10 to output the first-page data by toggling for example, the read enable signal REn.

When the transfer of the first-page data is finished, the memory controller 20 instructs the semiconductor memory 10 to transfer the second-page data to the latch circuit XDL. In this case, the semiconductor memory 10 temporarily switches to a busy state, and confirms the second-page data by performing a calculation in each sense amplifier set SAS, similarly to the confirmation of the first-page data. The sequencer 14 then causes the sense amplifier unit SAU to transfer the confirmed second-page data to the latch circuit XDL. Thereafter, upon detection of the change of the semiconductor memory 10 to a ready state, the memory controller 20 causes the semiconductor memory 10 to output the second-page data.

When the transfer of the second-page data is finished, the memory controller 20 instructs the semiconductor memory 10 to transfer the third-page data to the latch circuit XDL. In this case, the semiconductor memory 10 temporarily switches to a busy state, and confirms the third-page data by performing a calculation in each sense amplifier set SAS, similarly to the confirmation of the first-page data. The sequencer 14 then causes the sense amplifier unit SAU to transfer the confirmed third-page data to the latch circuit XDL. Upon detection of the change of the semiconductor memory 10 to a ready state, the memory controller 20 causes the semiconductor memory 10 to output the third-page data.

The order of pages to be output from the semiconductor memory 10 to the memory controller 20 may be set as appropriate. For example, in the read operation for three-page data, the semiconductor memory 10 may output the first-page data after outputting the second-page data. The details of the write operation are omitted, as the method adopted in the semiconductor memory 10 of the first embodiment, for example, is used for the write operation in the present embodiment.

In the example shown in FIG. 111, the first-page data is confirmed after the reading with the use of the read voltage AR; accordingly, the first-page data may be externally output during the reading with the use of the read voltage BR. Furthermore, in the 14th embodiment, two read voltages, AR and BR, are used to read data from the memory cell transistors MT, and the first-to-third page data is externally output; however, the semiconductor memory 10 may perform reading within a unit of page. Specifically, in the first-page read, for example, the first-page data is externally output by courtesy of a read operation with the use of the read voltage AR. In the second-page read, the second-page data is externally output by courtesy of a read operation with the use of the read voltages AR and BR. In the third-page read, the third-page data is externally output by courtesy of a read operation with the use of the read voltage BR.

[14-3] Advantageous Effects of 14th Embodiment

As described above, the semiconductor memory 10 of the 14th embodiment stores 3-bit data using two memory cell transistors MT within a same plane PL. In other words, the semiconductor memory 10 according to the 14th embodiment, multiple-bit data is stored with the use of two memory cell transistors MT coupled to a word line WL in common.

In the foregoing first through 13th embodiments, an example where multiple-bit data is stored in a combination of a memory cell transistor MT in plane PL1 and a memory cell transistor MT in plane PL2. On the other hand, like the semiconductor 10 of the 14th embodiment, multiple-bit data can be stored in a combination of two WL-sharing memory cell transistors MT. Even in such a case, the semiconductor memory 10 of the 14th embodiment can enhance the speed of a read operation in a case where multiple-bit data is stored in the memory cells.

In the semiconductor memory 10 of the 14th embodiment, an example where each sense amplifier unit SAU is coupled to the input/output circuit 19 as shown in FIG. 107 is described; however, the present embodiment is not limited to this example. FIG. 112 is a block diagram showing a configuration example of the semiconductor memory 10 according to a modification of the 14th embodiment. As shown in FIG. 112, either one of two sense amplifier units SAU included in a sense amplifier set SAS should be coupled to the input/output circuit 19. In this case, the latch circuit XDL in the sense amplifier unit SAU coupled to the input/output circuit 19 is used for data transfer in a read operation.

The more detailed configuration of the sense amplifier set SAS shown in FIG. 112 is described with reference to FIG. 148. FIG. 148 shows sense amplifier set SAS0 as an example among a plurality of sense amplifier sets SAS in the sense amplifier module 17.

As shown in FIG. 148, in sense amplifier set SAS0, sense amplifier unit SAU0 includes a sense amplifier SA and the latch circuits SDL1, ADL1, and XDL1 coupled to bus LBUS1 in common, and sense amplifier unit SAU1 includes a sense amplifier SA and the latch circuits SDL2, ADL2, and XDL2 coupled to bus LBUS2 in common. Each of sense amplifier units SAU0 and SAU1 may include other latch circuits, etc. Bus LBUS1 and bus LBUS2 are coupled with a switch SW. The switch SW switches between on and off under the control of the sequencer 14. In this example, in sense amplifier set SAS0, the latch circuit XDL1 is coupled to the input/output circuit 19. Since the configuration example of the other sense amplifier set SAS is the same as that of sense amplifier set SAS0, descriptions are omitted.

FIG. 112 shows a case where sense amplifier units SAU0 and SAU1 are adjacent, and sense amplifier units SAU (m−1) and SAUm are adjacent; however, the present embodiment is not limited to this case. Two sense amplifier units SAU to be combined may be placed closely, and coupled in such a manner that the sense amplifier units SAU can communicate with each other. In the semiconductor memory 10, a bus BUS and the logic circuit 18 may be provided between the sense amplifier units SAU and the input/output circuit 19 as shown in FIG. 83, even if the semiconductor memory 10 has the sense amplifier units SAU and the input/output circuit 19, as shown in FIG. 112. In this case, the computation in the semiconductor memory 10 is partially executed by the logic circuit 18.

In the 14th embodiment, an example where each sense amplifier unit SAU is coupled to the input/output circuit 19 as shown in FIGS. 107 and 112 is described; however, the present embodiment is not limited to this example. For example, the semiconductor memory 10 of the 14th embodiment may be configured to store multiple-bit data using two memory cell transistors MT coupled to a word line WL in common, and to use the logic circuit 18, as described in the 10th embodiment with reference to FIG. 83. In this case, in a read operation, the semiconductor memory 10 externally outputs data through calculation processing performed by the logic circuit 18.

[15] 15th Embodiment

The configuration of the semiconductor memory 10 of the 15th embodiment is similar to that of the semiconductor memory 10 of the first embodiment, for example. The semiconductor memory 10 according to the 15th embodiment stores 7-bit data in a set of two memory cell transistors MT through a two-stage write operation similar to the one described in the sixth embodiment. In the following, differences between the semiconductor memory 10 of the 15th embodiment and that of the first to 14th embodiments will be described.

[15-1] Threshold Distributions of Memory Cell Transistors MT

In the semiconductor memory 10 of the 15th embodiment, 12 threshold distributions are formed, and 7-bit data is stored in two memory cell transistors MT each belonging to any one of the threshold distributions. Prior to the formation of the 12 threshold distributions, the semiconductor memory 10 forms four threshold distributions by performing a write operation for four-page data ("first write"). Thereafter, the semiconductor memory 10 of the 15th embodiment forms 12 threshold distributions by performing a write operation for three-page data ("second write") to the memory cell transistors MT to which the first write has been performed.

FIG. 113 shows an example of threshold distributions of the memory cell transistors MT in the semiconductor memory 10 according to the 15th embodiment. In FIG. 113, (a) shows the threshold distributions of the memory cell transistors MT before the write (in other words, in an erase state); (b) shows the threshold distributions of the memory cell transistors MT after the first write is performed; and (c) shows the threshold distributions of the memory cell transistors MT after the second write is performed.

The semiconductor memory 10 according to the 15th embodiment performs the first write to form the "Z"-, "A"-, "B"-, and "C"-state threshold distributions (as shown in (b) of FIG. 113) from the "Z"-state threshold distribution shown in (a) of FIG. 113.

Then, the semiconductor memory 10 according to the 15th embodiment performs the second write to form the "Z"-, "S1"-, and "S2"-state threshold distributions (as shown in (c) of FIG. 113) from the "Z"-state threshold distribution shown in (b) of FIG. 113. From the "A"-state threshold distribution shown in FIG. 113 (*b*), "S3"-, "S4"-, and "S5"-state threshold distributions are formed as shown in FIG. 113 (*c*). From the "B"-state threshold distribution shown in FIG. 113 (*b*), "S6"-, "S7"-, and "S8"-state threshold distributions are formed as shown in FIG. 113 (*c*). From the "C"-state threshold distribution shown in FIG. 113 (*b*), "S9"-, "S10"-, and "S11"-state threshold distributions are formed as shown in FIG. 113 (*c*).

The threshold voltages of the memory cell transistors MT are, from lower to higher voltages: "Z" state, "S1" state, "S2" state, "S3" state, "S4" state, "S5" state, "S6" state, "S7" state, "S8" state, "S9" state, "S10" state, and "S11" state. Read voltages S1R through S11R are set to the "S1" through "S11" states, respectively. Similarly, verify voltages S1V through S11V are set to the "S1" through "S11" states, respectively.

Thus, for the semiconductor memory 10 of the 15th embodiment, three threshold distributions are formed from each of the four threshold distributions already formed as a result of the first write. Hereinafter, the write processes respectively corresponding to the three threshold distributions will be referred to as "lower-state write" ("L" in FIG. 113), "middle-state write" ("M" in FIG. 113), and "higher-state write" ("H" in FIG. 113), from lower to higher states.

For example, if the lower-state write is performed to the "Z" state obtained as a result of the first write, the "Z"-state threshold distribution is formed; if the middle-state write is performed, the "S1"-state threshold distribution is formed; and if the higher-state write is performed, the "S2"-state threshold distribution is formed. The same formation is applicable to the other threshold states obtained as a result of the first write.

[15-2] Operation

[15-2-1] Write Operation

In the first write in the semiconductor memory 10 according to the 15th embodiment, the first-to-fourth page data is input to the semiconductor memory 10, and a write operation of four-page data is performed. For example, of the write data for four pages to be input by the first write, the first-page and third-page data is transferred to plane PL1, and the second-page and fourth-page data is transferred to plane PL2. The semiconductor memory 10 then performs a write operation for the first-page and third-page data in plane PL1, and performs a write operation for the second-page and fourth-page data in plane PL2.

FIGS. 114 and 115 show an example of data allocation used in the first write performed to each of plane PL1 and PL2.

As shown in FIG. 114, in the first write, in plane PL1, the memory cell transistors MT corresponding to the sense amplifier unit SAU in which "11 (first bit/third bit)" data is stored are written at the "Z" state. The memory cell transistors MT corresponding to the sense amplifier unit SAU in which "01" data is stored are written at the "A" state. The memory cell transistors MT corresponding to the sense amplifier unit SAU in which "00" data is stored are written at the "B" state. The memory cell transistors MT corresponding to the sense amplifier unit SAU in which "10" data is stored are written at the "C" state.

As shown in FIG. 115, in the first write, in plane PL2, the memory cell transistors MT corresponding to the sense amplifier unit SAU in which "11 (second bit/fourth bit)" data is stored are written at the "Z" state. The memory cell transistors MT corresponding to the sense amplifier unit SAU in which "01" data is stored are written at the "A" state. The memory cell transistors MT corresponding to the sense amplifier unit SAU in which "00" data is stored are written at the "B" state. The memory cell transistors MT corresponding to the sense amplifier unit SAU in which "10" data is stored are written at the "C" state.

In the second write in the semiconductor memory 10 according to the 15th embodiment, the fifth-to-seventh page data is input to the semiconductor memory 10, and a write operation of three-page data is performed. The data of three pages to be input by the second write is transferred to both of plane PL1 and plane PL2. The semiconductor memory 10 then performs the second write, and subsequently reads data already written into plane PL1 and plane PL2 by the first write (this data reading is called "internal data load" (IDL)).

Upon the performance of the IDL, a read operation is performed with the use of the read voltages AR, BR, and CR, in plane PL1 and plane PL2. Then, data indicating which of the "Z" state, the "A" state, the "B" state, or the "C" state a corresponding memory cell transistor MT belongs to, is stored in each sense amplifier unit SAU in plane PL1 and plane PL2. The semiconductor memory 10 then performs a write operation based on the read result of the IDL and the fifth-to-seventh page data.

FIG. 116 shows an example of data allocation used in the second write. In the description hereafter, the memory cell transistors MT to which the "L"-, "M"-, and "H"-state writes are performed change to a different write state after the second write, depending on the data retained therein as a result of the first write.

As shown in FIG. 116, in the second write, in plane PL1, the lower-state write is performed to the memory cell transistors MT corresponding to the sense amplifier unit SAU in which any of "111 (fifth bit/sixth bit/seventh bit)", "101", or "100" data is stored; the middle-state write is performed to the memory cell transistors MT corresponding to the sense amplifier unit SAU in which any of "001" or "000" data is stored; and the higher-state write is performed to the memory cell transistors MT corresponding to the sense amplifier unit SAU in which any of "110", "010", or "011" data is stored.

In the second write, in plane PL2, the lower-state write is performed to the memory cell transistors MT corresponding to the sense amplifier unit SAU in which any of "111 (fifth bit/sixth bit/seventh bit)" or "110" data is stored; the middle-state write is performed to the memory cell transistors MT corresponding to the sense amplifier unit SAU in which any of "101", "001", or "010" data is stored; and the higher-state write is performed to the memory cell transistors MT corresponding to the sense amplifier unit SAU in which any of "100", "000", or "011" data is stored.

The 12 threshold distributions are thus formed by the above-described second write. Specifically, the threshold voltages of the memory cell transistors MT corresponding to the lower-state write belong to any one of the "Z" state, the "S3" state, the "S6" state, or the "S9" state. The threshold voltages of the memory cell transistors MT corresponding to the middle-state write belong to any one of the "S1" state, the "S4" state, the "S7" state, or the "S10" state. The threshold voltages of the memory cell transistors MT corresponding to the higher-state write belong to any one of the "S2" state, the "S5" state, the "S8" state, or the "S11" state.

[15-2-2] Read Operation

In the read operation by the semiconductor memory 10 of the 15th embodiment, the read voltages used therein are changed after the second write is performed.

FIG. 117 shows an example of read voltage settings after the first write and before the second write in the semiconductor memory 10 according to the 15th embodiment.

As shown in FIG. 117, in the first-page read, a read operation is performed with the use of the read voltages AR and CR to plane PL1. The sequencer 14 confirms the first-page data based on this read result.

In the second-page read, a read operation is performed with the use of the read voltages AR and CR is performed to plane PL2. The sequencer 14 confirms the second-page data based on this read result.

In the third-page read, a read operation is performed with the use of the read voltage BR is performed to plane PL1. The sequencer 14 confirms the third-page data based on this read result.

In the fourth-page read, a read operation is performed with the use of the read voltage BR is performed to plane PL2. The sequencer 14 confirms the fourth-page data based on this read result.

FIG. 118 shows an example of read voltage settings after the second write in the semiconductor memory 10 according to the 15th embodiment.

As shown in FIG. 118, in the first-page read, a read operation is performed with the use of the read voltages S3R and S9R to plane PL1. The sequencer 14 confirms the first-page data based on this read result.

In the second-page read, a read operation is performed with the use of the read voltages S3R and S9R to plane PL2. The sequencer 14 confirms the second-page data based on this read result.

In the third-page read, a read operation is performed with the use of the read voltage S6R to plane PL1. The sequencer 14 confirms the third-page data based on this read result.

In the fourth-page read, a read operation is performed with the use of the read voltage S6R to plane PL2. The sequencer 14 confirms the fourth-page data based on this read result.

In the fifth-page read, a read operation is performed with the use of the read voltages S3R, S6R, and S9R to each of plane PL1 and PL2. Thereafter, a read operation with the use of the read voltages S1R, S4R, S7R, and S10R is performed to each of plane PL1 and plane PL2. The sequencer 14 confirms the fifth-page data based on these read results.

In the sixth-page read, a read operation is performed with the use of the read voltages S3R, S6R, and S9R to each of plane PL1 and plane PL2. Thereafter, a read operation with the use of the read voltages S2R, S5R, S8R, and S11R is performed in plane PL1; and a read operation with the use of the read voltages S1R, S4R, S7R, and S10R is performed in plane PL2. The sequencer 14 confirms the sixth-page data based on these read results.

In the seventh-page read, a read operation is performed with the use of the read voltages S3R, S6R, and S9R is performed to each of plane PL1 and PL2. Thereafter, a read operation with the use of the read voltages S2R, S5R, S8R, and S11R is performed to each of plane PL1 and plane PL2. The sequencer 14 confirms the seventh-page data based on these read results.

As described above, in the fifth-page through seventh-page read, a read operation with the use of the read voltages S3R, S6R, and S9R is performed, and out of the following ("Z" state, "S1" state, "S2" state), ("S3" state, "S4" state, "S5" state), ("S6" state, "S7" state, "S8" state), ("S9" state, "S10" state, "S11" state), the set to which the threshold voltages of the memory cell transistors MT belong is distinguished.

Thereafter, when it is distinguished whether the memory cell transistor MT belongs to the lower-state write or the middle-state write in the second write, a read operation is performed with the use of the read voltages S1R, S4R, S7R, and S10R. To distinguish whether the memory cell transistor MT belongs to the middle-state write or the higher-state in the second write, a read operation is performed with the use of the read voltages S2R, S5R, S6R, and S11R.

[15-3] Advantageous Effects of 15th Embodiment

As described above, a two-stage write operation, similar to the one described in the sixth embodiment, is performed in the semiconductor memory 10 of the 15th embodiment. Specifically, the semiconductor memory 10 first performs the first-stage write operation (first write), and forms four threshold distributions, thereby writing 4-bit data. Thereafter, the semiconductor memory 10 performs a second-stage write operation (second write), and forms three threshold distributions from each of the four threshold distributions. Thus, 12 threshold distributions in total are formed in the 15th embodiment.

Even in this case, the semiconductor memory 10 of the 15th embodiment can have a set of two memory cell transistors MT storing 7-bit data. The method of reading the written data changes before and after the second write. The number of times that read is performed per page for seven-page data in the 15th embodiment is $(2+2+1+1+7+7+7)/7=3.86$. Accordingly, the semiconductor memory 10 of the 15th embodiment can enhance the speed of a read operation, similarly to the foregoing embodiments.

In the semiconductor memory 10 of the 15th embodiment, through the use of a sequential read, it is possible to reduce the number of times that read is performed per page. For example, the number of times that read is performed in the sequential read for the first and second pages is 2. The number of times that read is performed in the sequential read for the third and fourth pages is 1. The number of times that read is performed in the sequential read for the fifth, sixth, and seventh pages is 11.

Thus, the number of times that read is performed per page for the seven-page data is $(2+1+11)/7=2$. If the number of the latch circuits is not enough, the read operation for the fifth, sixth, and seventh pages may be performed separately. In this case, the number of times that the read is performed per page for the seven-page data is $(2+1+7+7+7)/7=3.42$.

The above-described number of times that read is performed in the 15th embodiment indicates the number of times for the WL-divided case. The operation described in the 15th embodiment may be performed for the non-WL-divided case. In this case, the number of times that read is performed per page for the seven-page data is, for example, $(2+2+1+1+7+11+7)/7=4.43$; on the other hand, if a sequential read is adopted, $(2+1+7+11+7)/7=4$.

Whether it is "before" or "after" the second write in the 15th embodiment may be distinguished on the memory controller side 20 or on the semiconductor memory 10 side. If whether it is "before" or "after" the second write is distinguished on the semiconductor memory 10 side, a flag cell is provided per page, for example. A flag cell is in an erase state before the second write, and is turned into a write state after the second write. In other words, the semiconductor memory 10 can distinguish whether it is "before" or "after" the second write by performing a write process to a flag cell along with the data write at the time of performing the second write. Then, in the read operation, the logic circuit 18, for example, checks a flag cell to determine whether it is "before" or "after" the second write.

[16] 16th Embodiment

The configuration of the semiconductor memory 10 of the 16th embodiment is similar to that of the semiconductor memory 10 of the first embodiment, for example. The semiconductor memory 10 according to the 16th embodiment is a modification of the 15th embodiment, and stores 7-bit data in a set of two memory cell transistors MT via a different method to that in the 15th embodiment. In the following, differences between the semiconductor memory 10 of the 16th embodiment and that of the first to 15th embodiments will be described.

[16-1] Threshold Distributions of Memory Cell Transistor MT

Prior to the formation of 12 threshold distributions, the semiconductor memory 10 of the 16th embodiment forms three threshold distributions by performing a write operation for three-page data ("first write"). Thereafter, the semiconductor memory 10 of the 16th embodiment forms 12 threshold distributions by performing a write operation for four-page data ("second write") to the memory cell transistors MT to which the first write has been performed.

FIG. 119 shows an example of threshold distributions of the memory cell transistors MT in the semiconductor memory 10 according to the 16th embodiment. In FIG. 119, (a) shows the threshold distributions of the memory cell transistors MT before the write (in other words, in an erase state); (b) shows the threshold distributions of the memory cell transistors MT after the first write is performed; and (c) shows the threshold distributions of the memory cell transistors MT after the second write is performed.

The semiconductor memory 10 according to the 16th embodiment performs the first write to form the "Z"-, "A"-, and "B"-state threshold distributions as shown in (b) of FIG. 119 from the "Z"-state threshold distribution shown in (a) of FIG. 119.

Then, the semiconductor memory 10 according to the 16th embodiment performs the second write to form the "Z"-, "S1"-, "S2"-, and "S3"-state threshold distributions as shown in (c) of FIG. 119. From the "Z"-state threshold distribution shown in (b) of FIG. 119. From the "A"-state threshold distribution shown in FIG. 119 (*b*), "S4"-, "S5"-, "S6"-, and "S7"-state threshold distributions are formed as shown in FIG. 119 (*c*). From the "B"-state threshold distribution shown in FIG. 119 (*b*), "S8"-, "S9"-, "S10"-, and "S11"-state threshold distributions are formed as shown in FIG. 119 (*c*).

The threshold voltages of the memory cell transistors MT increase from the "S1"-state threshold distribution toward the "S11"-state threshold distribution. Read voltages S1R through S11R are set to the "S1" through "S11" states, respectively. In a read operation with the use of the read voltages S1R through S11R respectively, it is determined whether or not the memory cell transistors MT have a threshold voltage higher than a threshold distribution corresponding to the read voltage used.

Thus, for the semiconductor memory 10 of the 16th embodiment, five threshold distributions are formed from each of the three threshold distributions already formed as a result of the first write. Hereinafter, write processes respectively corresponding to the five threshold distributions will be referred to as "lower-state write" ("L" in FIG. 119), "middle-state write" ("M" in FIG. 119), "higher-state write" ("H" in FIG. 119), and "highest-state write" ("T" in FIG. 119), from lower to higher states.

For example, if the lower-state write is performed to the "Z" state obtained as a result of the first write, the "Z"-state threshold distribution is formed; if the middle-state write is performed, the "S1"-state threshold distribution is formed; if the higher-state write is performed, the "S2"-state threshold distribution is formed; and if the highest-state write is performed, the "S3"-state threshold distribution is formed. The same formation is applicable to the other threshold states obtained as a result of the first write.

[16-2] Operation

[16-2-1] Write Operation

In the first write in the semiconductor memory 10 according to the 16th embodiment, the first-to-third page data is input to the semiconductor memory 10, and a write operation of three-page data is performed. The data of three pages to be input by the second write is transferred to both of plane PL1 and plane PL2. Then, the semiconductor memory 10 performs a write operation in plane PL1 and PL2 with the use of data allocation identical to that shown in FIG. 109, described in the 14th embodiment. The threshold distributions formed as a result of the first write are the same as those in the 14th embodiment, except that the memory cell transistors MTa and MTb are replaced with plane PL1 and plane PL2, respectively.

In the second write in the semiconductor memory 10 according to the 16th embodiment, the fourth-to-seventh page data is input to the semiconductor memory 10, and a write operation of four-page data is performed. For example, of the write data for four pages to be input by the second write, the fourth-page and sixth-page data is transferred to plane PL1, and the fifth-page and seventh-page data is transferred to plane PL2. The semiconductor memory 10 then performs a write operation for the fourth-page and sixth-page data in plane PL1, and performs a write operation for the fifth-page and seventh-page data in plane PL2. The semiconductor memory 10 then performs the second write, and subsequently reads data that has been written into each plane PL1 by the first write (this data reading is called "internal data load" (IDL)).

Upon the performance of the IDL, a read operation is performed with the use of the read voltages AR and BR in plane PL1 and plane PL2. Then, in each sense amplifier unit SAU in plane PL1 and plane PL2, data indicative of the "Z" state, the "A" state, or the "B" state to which a corresponding memory cell transistor MT belongs, is stored. The semiconductor memory 10 then performs a write operation based on the read result of the IDL and the fourth-to-seventh page data.

FIGS. 120 and 121 show an example of data allocation used in the second write performed to each of plane PL1 and PL2. In the description hereafter, the memory cell transistors MT to which the lower-state, middle-state, higher-state, and highest-state writes have been performed change in their write state after the second write, based on data retained therein as a result of the first write.

As shown in FIG. 120, in the second write, in plane PL1, the lower-state write is performed to the memory cell transistors MT corresponding to the sense amplifier unit SAU in which "11 (fourth bit/sixth bit)" data is stored; the middle-state write is performed to the memory cell transistors MT corresponding to the sense amplifier unit SAU in which "01" data is stored; the higher-state write is performed to the memory cell transistors MT corresponding to the sense amplifier unit SAU in which "00" data is stored; and the highest-state write is performed to the memory cell transistors MT corresponding to the sense amplifier unit SAU in which "10" data is stored.

As shown in FIG. 121, in the second write, in plane PL2, the lower-state write is performed to the memory cell transistors MT corresponding to the sense amplifier unit SAU in which "11 (fifth bit/sixth bit)" data is stored; the middle-state write is performed to the memory cell transistors MT corresponding to the sense amplifier unit SAU in which "01" data is stored; the higher-state write is performed to the memory cell transistors MT corresponding to the sense amplifier unit SAU in which "00" data is stored; and the highest-state write is performed to the memory cell transistors MT corresponding to the sense amplifier unit SAU in which "10" data is stored.

The 12 threshold distributions are thus formed by the above-described second write. Specifically, the threshold voltages of the memory cell transistors MT corresponding to the lower-state write belong to any one of the "Z" state, the "S4" state, and the "S8" state. The threshold voltages of the memory cell transistors MT corresponding to the middle-state write belong to any one of the "S1" state, the "S5" state, and the "S9" state. The threshold voltages of the memory cell transistors MT corresponding to the higher-state write belong to any one of the "S2" state, the "S6" state, and the "S10" state. Specifically, the threshold voltages of the memory cell transistors MT corresponding to the highest-state write belong to any one of the "S3" state, the "S7" state, and the "S11" state.

[16-2-2] Read Operation

In the read operation by the semiconductor memory 10 of the 16th embodiment, the read voltages used therein are changed after the second write is performed. Since the read operation by the semiconductor memory 10, after the first write and before the second write, is the same as the read operation in the 14th embodiment, except that the memory cell transistors MTa and MTb therein are respectively replaced with plane PL1 and plane PL2, descriptions are omitted.

FIG. 122 shows an example of read voltage settings after the second write in the semiconductor memory 10 according to the 16th embodiment.

As shown in FIG. 122, in the first-page read, a read operation using the read voltage S4R is performed in plane PL1, and a read operation using the read voltage S4R is performed in plane PL2. The sequencer 14 confirms the first-page data based on these read results.

In the second-page read, a read operation with the use of the read voltage S8R is performed in plane PL1, and a read operation using the read voltage S4R is performed in plane PL2. The sequencer 14 confirms the second-page data based on these read results.

In the third-page read, a read operation with the use of the read voltage S8R is performed in plane PL1, and a read operation using the read voltage S8R is performed in plane PL2. The sequencer 14 confirms the third-page data based on these read results.

In the fourth-page read, a read operation with the use of the read voltages S4R and S8R is performed to plane PL1. Thereafter, a read operation with the use of the read voltages S1R, S5R, and S9R, and a read operation with the use of the read voltages S3R, S7R, and S11R are performed to plane PL1. The sequencer 14 confirms the fourth-page data based on these read results.

In the fifth-page read, a read operation with the use of the read voltages S4R and S8R is performed to plane PL2. Thereafter, a read operation with the use of the read voltages S1R, S5R, and S9R, and a read operation with the use of the read voltages S3R, S7R, and S11R are performed to plane PL2. The sequencer 14 confirms the fifth-page data based on these read results.

In the sixth-page read, a read operation with the use of the read voltages S4R and S8R is performed to plane PL1. Thereafter, a read operation with the use of the read voltages S2R, S6R, and S10R is performed to plane PL1. The sequencer 14 confirms the sixth-page data based on these read results.

In the seventh-page read, a read operation with the use of the read voltages S4R and S8R is performed to plane PL2. Thereafter, a read operation with the use of the read voltages S2R, S6R, and S10R is performed to plane PL2. The sequencer 14 confirms the seventh-page data based on these read results.

As described above, in the fourth-page through seventh-page read, a read operation using the read voltages S4R and S8R is first performed, and it is distinguished which of the following sets, ("Z" state, "S1" state, "S2" state, "S3" state), ("S4" state, "S5" state, "S6" state, "S7" state), and ("S8" state, "S9" state, "S10" state, "S11" state), includes the threshold voltages of the memory cell transistors MT.

Thereafter, when it is distinguished whether the memory cell transistors MT belong to the lower-state write or the middle-state write, a read operation is performed with the use of the read voltages S1R, S5R, and S9R. To distinguish which of the middle-state write or the higher-state in the second write the memory cell transistors MT belong to, a read operation is performed with the use of the read voltages S2R, S6R, and S10R. To distinguish which of the higher-state write or the highest-state in the second write the memory cell transistors MT belong to, a read operation is performed with the use of the read voltages S3R, S7R, and S11R.

[16-3] Advantageous Effects of 16th Embodiment

As described above, a two-stage write operation, similar to the one described in the 15th embodiment, is performed in the semiconductor memory 10 of the 16th embodiment. Specifically, the semiconductor memory 10 first performs the first-stage write operation (first write), and forms three threshold distributions, thereby writing 3-bit data. Thereafter, the semiconductor memory 10 performs a second-stage write operation (second write), and forms four threshold distributions from each of the three threshold distributions. Thus, the 12 threshold distributions in total are formed in the 16th embodiment.

Even in this case, the semiconductor memory 10 of the 16th embodiment can have a set of two memory cell transistors MT storing 7-bit data. The method of reading the written data changes before and after the second write. The number of times that read is performed per page for the seven-page data in the 16th embodiment is $(1+1+1+8+8+5+5)/7=4.14$. Accordingly, the semiconductor memory 10 of the 16th embodiment can enhance the speed of a read operation, similarly to the foregoing embodiments.

In the semiconductor memory 10 of the 16th embodiment, it is possible to reduce the number of times that read is performed per page through the use of a sequential read. For example, the number of times that read is performed in the sequential read for the first, second, and third pages is 2. The number of times that read is performed in the sequential read for the fourth and fifth pages is 8. The number of times that read is performed in the sequential read for the sixth and seventh pages is 5. Thus, the number of times that read is performed per page for the seven-page data in this example is $(3+8+5)/7=2.28$.

The above-described number of times that read is performed in the 16th embodiment indicates the number of times for the WL-divided case; however, the operation described in the 16th embodiment may be performed for the non-WL-divided case. In the 16th embodiment, the read voltages applied to the memory cell transistors MTa in the fourth-page read are the same as the read voltages applied to the memory cell transistors MTb in the fifth-page read. The read voltages applied to the memory cell transistors MTa in the sixth-page read are the same as the read voltages applied to the memory cell transistors MTb in the seventh-page read.

For this reason, in the 16th embodiment, a sequential read similar to that in the WL-divided case is performed even in the non-WL-divided case. In other words, in the 16th embodiment, the number of times that read is performed per page for seven-page data in the non-WL-divided case may be the same as that in the WL-divided case.

Whether it is "before" or "after" the second write in the 16th embodiment may be distinguished on the memory controller side 20 or on the semiconductor memory 10 side, similarly to the 15th embodiment. When whether it is "before" or "after" the second write on the semiconductor memory 10 side, a flag cell is provided for each page, similarly to the 15th embodiment, for example.

[16-4] Modifications of 16th Embodiment

Combinations of read voltages and data definitions in the first to 30th modifications of the 16th embodiment are listed below. A data allocation for each of the following combinations is set as appropriate based on a combination of read voltages and data definitions.

(Example) Read voltages: [first-page read ((x) read voltage of PL1, (y) read voltage of PL2), second-page read ((x), (y)), third-page read ((x), (y)), fourth-page read ((x), (y)), fifth-page read ((x), (y)), sixth-page read ((x), (y)), seventh-page read ((x), (y))]; Data definitions: [first-page read [(a) read data when "0", "0" (="read result of PL1", "read result of PL2"), (b) read data when "1", "0", (c) read data when "0", "1", (d) read data when "1", "1"], second-page read [(a), (b), (c), (d)], third-page read [(a), (b), (c), (d)], fourth-page read [(a), (b), (c), (d)], fifth-page read [(a), (b), (c), (d)], sixth-page read [(a), (b), (c), (d)], seventh-page read [(a), (b), (c), (d)]]

First Modification of 16th Embodiment

Read voltages: [((S4R), (S4R)), ((S4R), (S8R)), ((S8R), (S4R)), ((omitted), (S1R, S3R, S6R, S10R)), ((S1R, S3R, S6R, S10R), (omitted)), ((omitted), (S2R, S5R, S7R, S9R, S11R)), ((S2R, S5R, S7R, S9R, S11R), (omitted))]; data definitions: [[0, 0, 0, 1], [0, 0, 1, 0], [0, 1, 1, 0], [0, 1, 0, 1], [0, 0, 1, 1], [0, 1, 0, 1], [0, 0, 1, 1]]

Second Modification of 16th Embodiment

Read voltages: [((S4R), (S4R)), ((S4R), (S8R)), ((S8R), (S8R)), ((omitted), (S1R, S3R, S6R, S10R)), ((S1R, S3R, S6R, S10R), (omitted)), ((omitted), (S2R, S5R, S7R, S9R, S11R)), ((S2R, S5R, S7R, S9R, S11R), (omitted))]; data definitions: [[0, 0, 0, 1], [0, 0, 1, 0], [0, 1, 1, 0], [0, 1, 0, 1], [0, 0, 1, 1], [0, 1, 0, 1], [0, 0, 1, 1]]

Third Modification of 16th Embodiment

Read voltages: [((S4R), (S4R)), ((S4R), (S8R)), ((S8R), (S4R)), ((omitted), (S1R, S3R, S6R, S10R)), ((S1R, S3R, S6R, S10R), (omitted)), ((omitted), (S2R, S5R, S7R, S9R, S11R)), ((S2R, S5R, S7R, S9R, S11R), (omitted))]; data definitions: [[0, 0, 0, 1], [0, 1, 1, 0], [0, 1, 1, 0], [0, 1, 0, 1], [0, 0, 1, 1], [0, 1, 0, 1], [0, 0, 1, 1]]

Fourth Modification of 16th Embodiment

Read voltages: [((S4R), (S4R)), ((S4R), (S8R)), ((S8R), (S8R)), ((omitted), (S1R, S3R, S6R, S10R)), ((S1R, S3R, S6R, S10R), (omitted)), ((omitted), (S2R, S5R, S7R, S9R, S11R)), ((S2R, S5R, S7R, S9R, S11R), (omitted))]; data definitions: [[0, 1, 1, 0], [0, 0, 1, 0], [0, 1, 1, 0], [0, 1, 0, 1], [0, 0, 1, 1], [0, 1, 0, 1], [0, 0, 1, 1]]

Fifth Modification of 16th Embodiment

Read voltages: [((S4R), (S4R)), ((S4R), (S8R)), ((S8R), (S8R)), ((omitted), (S1R, S3R, S6R, S10R)), ((S1R, S3R, S6R, S10R), (omitted)), ((omitted), (S2R, S5R, S7R, S9R, S11R)), ((S2R, S5R, S7R, S9R, S11R), (omitted))]; data definitions: [[0, 1, 1, 0], [0, 0, 1, 0], [0, 1, 1, 1], [0, 1, 0, 1], [0, 0, 1, 1], [0, 1, 0, 1], [0, 0, 1, 1]]

Sixth Modification of 16th Embodiment

Read voltages: [((S4R), (S8R)), ((S8R), (S4R)), ((S8R), (S8R)), ((omitted), (S1R, S3R, S6R, S10R)), ((S1R, S3R, S6R, S10R), (omitted)), ((omitted), (S2R, S5R, S7R, S9R, S11R)), ((S2R, S5R, S7R, S9R, S11R), (omitted))]; data definitions: [[0, 0, 1, 0], [0, 1, 1, 0], [0, 1, 1, 1], [0, 1, 0, 1], [0, 0, 1, 1], [0, 1, 0, 1], [0, 0, 1, 1]]

Seventh Modification of 16th Embodiment

Read voltages: [((S4R), (S8R)), ((S8R), (S4R)), ((S8R), (S8R)), ((omitted), (S1R, S3R, S6R, S10R)), ((S1R, S3R, S6R, S10R), (omitted)), ((omitted), (S2R, S5R, S7R, S9R, S11R)), ((S2R, S5R, S7R, S9R, S11R), (omitted))]; data definitions: [[0, 1, 1, 0], [0, 1, 1, 0], [0, 1, 1, 1], [0, 1, 0, 1], [0, 0, 1, 1], [0, 1, 0, 1], [0, 0, 1, 1]]

Eighth Modification of 16th Embodiment

Read voltages: [((S4R), (S4R)), ((S4R), (S8R)), ((S8R), (S4R)), ((omitted), (S2R, S5R, S7R, S10R)), ((S2R, S5R, S7R, S10R), (omitted)), ((omitted), (S1R, S3R, S6R, S9R, S11R)), ((S1R, S3R, S6R, S9R, S11R), (omitted))]; data definitions: [[0, 0, 0, 1], [0, 0, 1, 0], [0, 1, 1, 0], [0, 1, 0, 1], [0, 0, 1, 1], [0, 1, 0, 1], [0, 0, 1, 1]]

Ninth Modification of 16th Embodiment

Read voltages: [((S4R), (S4R)), ((S4R), (S8R)), ((S8R), (S8R)), ((omitted), (S2R, S5R, S7R, S10R)), ((S2R, S5R, S7R, S10R)), (omitted)), ((omitted), (S1R, S3R, S6R, S9R, S11R)), ((S1R, S3R, S6R, S9R, S11R), (omitted))]; data definitions: [[0, 0, 0, 1], [0, 0, 1, 0], [0, 1, 1, 0], [0, 1, 0, 1], [0, 0, 1, 1], [0, 1, 0, 1], [0, 0, 1, 1]]

10th Modification of 16th Embodiment

Read voltages: [((S4R), (S4R)), ((S4R), (S8R)), ((S8R), (S4R)), ((omitted), (S2R, S5R, S7R, S10R)), ((S2R, S5R, S7R, S10R), (omitted)), ((omitted), (S1R, S3R, S6R, S9R, S11R)), ((S1R, S3R, S6R, S9R, S11R), (omitted))]; data definitions: [[0, 0, 0, 1], [0, 1, 1, 0], [0, 1, 1, 0], [0, 1, 0, 1], [0, 0, 1, 1], [0, 1, 0, 1], [0, 0, 1, 1]]

11th Modification of 16th Embodiment

Read voltages: [((S4R), (S4R)), ((S4R), (S8R)), ((S8R), (S8R)), ((omitted), (S2R, S5R, S7R, S10R)), ((S2R, S5R, S7R, S10R), (omitted)), ((omitted), (S1R, S3R, S6R, S9R, S11R)), ((S1R, S3R, S6R, S9R, S11R), (omitted))]; data definitions: [[0, 1, 1, 0], [0, 0, 1, 0], [0, 1, 1, 0], [0, 1, 0, 1], [0, 0, 1, 1], [0, 1, 0, 1], [0, 0, 1, 1]]

12th Modification of 16th Embodiment

Read voltages: [((S4R), (S4R)), ((S4R), (S8R)), ((S8R), (S8R)), ((omitted), (S2R, S5R, S7R, S10R)), ((S2R, S5R, S7R, S10R), (omitted)), ((omitted), (S1R, S3R, S6R, S9R, S11R)), ((S1R, S3R, S6R, S9R, S11R), (omitted))]; data definitions: [[0, 1, 1, 0], [0, 0, 1, 0], [0, 1, 1, 1], [0, 1, 0, 1], [0, 0, 1, 1], [0, 1, 0, 1], [0, 0, 1, 1]]

13th Modification of 16th Embodiment

Read voltages: [((S4R), (S8R)), ((S8R), (S4R)), ((S8R), (S8R)), ((omitted), (S2R, S5R, S7R, S10R)), ((S2R, S5R, S7R, S10R), (omitted)), ((omitted), (S1R, S3R, S6R, S9R, S11R)), ((S1R, S3R, S6R, S9R, S11R), (omitted))]; data definitions: [[0, 0, 1, 0], [0, 1, 1, 0], [0, 1, 1, 1], [0, 1, 0, 1], [0, 0, 1, 1], [0, 1, 0, 1], [0, 0, 1, 1]]

14th Modification of 16th Embodiment

Read voltages: [((S4R), (S8R)), ((S8R), (S4R)), ((S8R), (S8R)), ((omitted), (S2R, S5R, S7R, S10R)), ((S2R, S5R, S7R, S10R), (omitted)), ((omitted), (S1R, S3R, S6R, S9R, S11R)), ((S1R, S3R, S6R, S9R, S11R), (omitted))]; data definitions: [[0, 1, 1, 0], [0, 1, 1, 0], [0, 1, 1, 1], [0, 1, 0, 1], [0, 0, 1, 1], [0, 1, 0, 1], [0, 0, 1, 1]]

15th Modification of 16th Embodiment

Read voltages: [((S4R), (S4R)), ((S4R), (S8R)), ((S8R), (S4R)), ((omitted), (S2R, S6R, S9R, S11R)), ((S2R, S6R, S9R, S11R), (omitted)), ((omitted), (S1R, S3R, S5R, S7R, S10R)), ((S1R, S3R, S5R, S7R, S10R), (omitted))]; data definitions: [[0, 0, 0, 1], [0, 0, 1, 0], [0, 1, 1, 0], [0, 1, 0, 1], [0, 0, 1, 1], [0, 1, 0, 1], [0, 0, 1, 1]]

16th Modification of 16th Embodiment

Read voltages: [((S4R), (S4R)), ((S4R), (S8R)), ((S8R), (S8R)), ((omitted), (S2R, S6R, S9R, S11R)), ((S2R, S6R, S9R, S11R), (omitted)), ((omitted), (S1R, S3R, S5R, S7R, S10R)), ((S1R, S3R, S5R, S7R, S10R), (omitted))]; data definitions: [[0, 0, 0, 1], [0, 0, 1, 0], [0, 1, 1, 0], [0, 1, 0, 1], [0, 0, 1, 1], [0, 1, 0, 1], [0, 0, 1, 1]]

17th Modification of 16th Embodiment

Read voltages: [((S4R), (S4R)), ((S4R), (S8R)), ((S8R), (S4R)), ((omitted), (S2R, S6R, S9R, S11R)), ((S2R, S6R, S9R, S11R), (omitted)), ((omitted), (S1R, S3R, S5R, S7R, S10R)), ((S1R, S3R, S5R, S7R, S10R), (omitted))]; data definitions: [[0, 0, 0, 1], [0, 1, 1, 0], [0, 1, 1, 0], [0, 1, 0, 1], [0, 0, 1, 1], [0, 1, 0, 1], [0, 0, 1, 1]]

18th Modification of 16th Embodiment

Read voltages: [((S4R), (S4R)), ((S4R), (S8R)), ((S8R), (S8R)), ((omitted), (S2R, S6R, S9R, S11R)), ((S2R, S6R, S9R, S11R), (omitted)), ((omitted), (S1R, S3R, S5R, S7R, S10R)), ((S1R, S3R, S5R, S7R, S10R), (omitted))]; data definitions: [[0, 1, 1, 0], [0, 0, 1, 0], [0, 1, 1, 0], [0, 1, 0, 1], [0, 0, 1, 1], [0, 1, 0, 1], [0, 0, 1, 1]]

19th Modification of 16th Embodiment

Read voltages: [((S4R), (S4R)), ((S4R), (S8R)), ((S8R), (S8R)), ((omitted), (S2R, S6R, S9R, S11R)), ((S2R, S6R, S9R, S11R), (omitted)), ((omitted), (S1R, S3R, S5R, S7R, S10R)), ((S1R, S3R, S5R, S7R, S10R), (omitted))]; data definitions: [[0, 1, 1, 0], [0, 0, 1, 0], [0, 1, 1, 1], [0, 1, 0, 1], [0, 0, 1, 1], [0, 1, 0, 1], [0, 0, 1, 1]]

20th Modification of 16th Embodiment

Read voltages: [((S4R), (S8R)), ((S8R), (S4R)), ((S8R), (S8R)), ((omitted), (S2R, S6R, S9R, S11R)), ((S2R, S6R, S9R, S11R), (omitted)), ((omitted), (S1R, S3R, S5R, S7R, S10R)), ((S1R, S3R, S5R, S7R, S10R), (omitted))]; data definitions: [[0, 0, 1, 0], [0, 1, 1, 0], [0, 1, 1, 1], [0, 1, 0, 1], [0, 0, 1, 1], [0, 1, 0, 1], [0, 0, 1, 1]]

21st Modification of 16th Embodiment

Read voltages: [((S4R), (S8R)), ((S8R), (S4R)), ((S8R), (S8R)), ((omitted), (S2R, S6R, S9R, S11R)), ((S2R, S6R, S9R, S11R), (omitted)), ((omitted), (S1R, S3R, S5R, S7R, S10R)), ((S1R, S3R, S5R, S7R, S10R), (omitted))]; data definitions: [[0, 1, 1, 0], [0, 1, 1, 0], [0, 1, 1, 1], [0, 1, 0, 1], [0, 0, 1, 1], [0, 1, 0, 1], [0, 0, 1, 1]]

22nd Modification of 16th Embodiment

Read voltages: [((omitted), (S6R)), ((S6R), (omitted)), ((S2R, S8R, S10R), (S4R, S7R, S11R)), ((S4R, S7R, S11R), (S2R, S8R, S10R)), ((S4R, S7R, S11R), (S4R, S7R, S11R)), ((omitted), (S1R, S3R, S5R, S9R)), ((S1R, S3R, S5R, S9R), (omitted))]; data definitions: [[0, 1, 0, 1], [0, 0, 1, 1], [0, 0, 1, 0], [0, 1, 1, 0], [0, 1, 1, 1], [0, 1, 0, 1], [0, 0, 1, 1]]

23rd Modification of 16th Embodiment

Read voltages: [((omitted), (S6R)), ((S6R), (omitted)), ((S2R, S8R, S10R), (S4R, S7R, S11R)), ((S4R, S7R, S11R), (S2R, S8R, S10R)), ((S4R, S7R, S11R), (S4R, S7R, S11R)), ((omitted), (S1R, S3R, S5R, S9R)), ((S1R, S3R, S5R, S9R), (omitted))]; data definitions: [[0, 1, 0, 1], [0, 0, 1, 1], [0, 1, 1, 0], [0, 1, 0, 0], [0, 1, 1, 1], [0, 1, 0, 1], [0, 0, 1, 1]]

24th Modification of 16th Embodiment

Read voltages: [((omitted), (S6R)), ((S6R), (omitted)), ((S2R, S8R, S10R), (S4R, S7R, S11R)), ((S4R, S7R, S11R), (S2R, S8R, S10R)), ((S4R, S7R, S11R), (S4R, S7R, S11R)), ((omitted), (S1R, S3R, S5R, S9R)), ((S1R, S3R, S5R, S9R), (omitted))]; data definitions: [[0, 1, 0, 1], [0, 0, 1, 1], [0, 1, 1, 0], [0, 1, 1, 1], [0, 1, 0, 1], [0, 0, 1, 1]]

25th Modification of 16th Embodiment

Read voltages: [((omitted), (S6R)), ((S6R), (omitted)), ((S2R, S7R, S9R), (S3R, S5R, S10R)), ((S3R, S5R, S10R), (S2R, S7R, S9R)), ((S3R, S5R, S10R), (S3R, S5R, S10R)), ((omitted), (S1R, S4R, S8R, S11R)), ((S1R, S4R, S8R, S11R), (omitted))]; data definitions: [[0, 1, 0, 1], [0, 0, 1, 1], [0, 0, 1, 0], [0, 1, 1, 0], [0, 1, 1, 1], [0, 1, 0, 1], [0, 0, 1, 1]]

26th Modification of 16th Embodiment

Read voltages: [((omitted), (S6R)), ((S6R), (omitted)), ((S2R, S7R, S9R), (S3R, S5R, S10R)), ((S3R, S5R, S10R), (S2R, S7R, S9R)), ((S3R, S5R, S10R), (S3R, S5R, S10R)), ((omitted), (S1R, S4R, S8R, S11R)), ((S1R, S4R, S8R, S11R), (omitted))]; data definitions: [[0, 1, 0, 1], [0, 0, 1, 1], [0, 1, 1, 0], [0, 1, 0, 0], [0, 1, 1, 1], [0, 1, 0, 1], [0, 0, 1, 1]]

27th Modification of 16th Embodiment

Read voltages: [((omitted), (S6R)), ((S6R), (omitted)), ((S2R, S7R, S9R), (S3R, S5R, S10R)), ((S3R, S5R, S10R), (S2R, S7R, S9R)), ((S3R, S5R, S10R), (S3R, S5R, S10R)), ((omitted), (S1R, S4R, S8R, S11R)), ((S1R, S4R, S8R, S11R), (omitted))]; data definitions: [[0, 1, 0, 1], [0, 0, 1, 1], [0, 1, 1, 0], [0, 1, 1, 0], [0, 1, 1, 1], [0, 1, 0, 1], [0, 0, 1, 1]]

28th Modification of 16th Embodiment

Read voltages: [((omitted), (S6R)), ((S6R), (omitted)), ((S1R, S5R, S8R), (S2R, S4R, S10R)), ((S2R, S4R, S10R), (S1R, S5R, S8R)), ((S2R, S4R, S10R), (S2R, S4R, S10R)), ((omitted), (S3R, S7R, S9R, S11R)), ((S3R, S7R, S9R, S11R), (omitted))]; data definitions: [[0, 1, 0, 1], [0, 0, 1, 1], [0, 0, 1, 0], [0, 1, 1, 0], [0, 1, 1, 1], [0, 1, 0, 1], [0, 0, 1, 1]]

29th Modification of 16th Embodiment

Read voltages: [((omitted), (S6R)), ((S6R), (omitted)), ((S1R, S5R, S8R), (S2R, S4R, S10R)), ((S2R, S4R, S10R), (S1R, S5R, S8R)), ((S2R, S4R, S10R), (S2R, S4R, S10R)), ((omitted), (S3R, S7R, S9R, S11R)), ((S3R, S7R, S9R, S11R), (omitted))]; data definitions: [[0, 1, 0, 1], [0, 0, 1, 1], [0, 1, 1, 0], [0, 1, 0, 0], [0, 1, 1, 1], [0, 1, 0, 1], [0, 0, 1, 1]]

30th Modification of 16th Embodiment

Read voltages: [((omitted), (S6R)), ((S6R), (omitted)), ((S1R, S5R, S8R), (S2R, S4R, S10R)), ((S2R, S4R, S10R), (S1R, S5R, S8R)), ((S2R, S4R, S10R), (S2R, S4R, S10R)), ((omitted), (S3R, S7R, S9R, S11R)), ((S3R, S7R, S9R, S11R), (omitted))]; data definitions: [[0, 1, 0, 1], [0, 0, 1, 1], [0, 1, 1, 0], [0, 1, 1, 0], [0, 1, 1, 1], [0, 1, 0, 1], [0, 0, 1, 1]]

In the semiconductor memory 10 according to the foregoing first to 21st modifications of the 16th embodiment, prior to the formation of 12 threshold distributions, three threshold distributions are formed through the performance of a write operation for three-page data ("first write"). Thereafter, 12 threshold distributions are formed through the performance of a write operation for four-page data ("second write") to the memory cell transistors MT, to which the first write has been performed.

The number of times that read is performed per page for the seven-page data in the semiconductor memory 10, according to the first through 21st modifications of the 16th embodiment, is (1+1+1+4+4+5+5)/7=3. Thus, the number of times that read is performed per page in the semiconductor memory 10, according to the first through 21st modifications of the 16th embodiment, is lower than that in the semiconductor memory 10 of the 16th embodiment.

In the semiconductor memory 10, according to the first through 21st modifications of the 16th embodiment, the number of times that read is performed per page is (2+4+5)/7=1.57 through the use of a sequential read, similarly to the semiconductor memory 10 of the 16th embodiment. Thus, through the use of a sequential read, the number of times that read is performed per page in the first through 21st modifications of the 16th embodiment is lower than that in the semiconductor memory 10 of the 16th embodiment.

In the semiconductor memory 10 according to the 22nd through 30th modifications of the 16th embodiment, prior to the formation of 12 threshold distributions, two threshold distributions are formed through the performance of a write operation for two-page data ("first write"). Thereafter, 12 threshold distributions are formed through the performance of a write operation for five-page data ("second write") to the memory cell transistors MT, to which the first write has been performed.

The number of times that read is performed per page for the seven-page data in the semiconductor memory 10, according to the 22nd through 30th modifications of the 16th embodiment, is (1+1+3+3+3+4+4)/7=2.71. Thus, the number of times that read is performed per page in the semiconductor memory 10, according to the 22nd through 30th modifications of the 16th embodiment, is lower than that in the semiconductor memory 10 of the 16th embodiment.

In the semiconductor memory 10 according to the 22nd through 30th modifications of the 16th embodiment, the number of times that read is performed per page can be reduced through the use of a sequential read. For example, the number of times that read is performed in the sequential read for the first and second pages is 1. The number of times that read is performed in the sequential read for the third, fourth, and fifth pages is 6. The number of times that read is performed in the sequential read for the sixth and seventh pages is 4. Thus, the number of times that read is performed per page for the seven-page data is (1+6+4)/7=1.57. Thus, through the use of a sequential read, the number of times that read is performed per page in the semiconductor memory 10, according to the 22nd through 30th modifications of the 16th embodiment, is lower than that in the semiconductor memory 10 of the 16th embodiment.

In the semiconductor memory 10 of the 11th embodiment, data of 7 bits are stored using two memory cell transistors MT as a result of the formation of twelve threshold distributions as shown in FIG. 96. In the semiconductor memory 10 of the first to twenty-first modifications of the 16th embodiment, similarly to that of the 16th embodiment, data of 7 bits are stored using two memory cell transistors MT after the formation of three threshold distributions by performing a write operation for three-page data ("first write") as shown in (b) of FIG. 119, and further after the formation of twelve threshold distributions by performing a write operation for four-page data ("second write") as shown in (c) of FIG. 119. Between the first write and the second write in which a word line WL is selected, the first write in which an adjacent word line WL is selected may be performed.

As to the read operations, in a first read sequence, read data of the first page is output after a read operation using one level (in the first modification of the 16th embodiment: S4R) of the read voltage is performed, and read data of the second page and the third page are output a read operation using two levels (in the first modification of the 16th embodiment: S4R and S8R) of the read voltages is performed. In a second read sequence, read data of the fourth page and the fifth page are output after a read operation using four levels (in the first modification of the 16th embodiment: S1R, S3R, S6R and S10R) of the read voltage is performed. In a third read sequence, read data of the sixth page and the seventh page are output after a read operation using five levels (in the first modification of the 16th embodiment: S2R, S5R, S7R, S9R and S11R) of the read voltage is performed.

In the semiconductor memory 10 of the twenty-second to thirtieth modifications of the 16th embodiment, data of 7 bits are stored using two memory cell transistors MT after the formation of two threshold distributions by performing a write operation for two-page data ("first write") as shown in (b) of FIG. 193, and further after the formation of twelve threshold distributions by performing a write operation for five-page data ("second write") as shown in (c) of FIG. 193. The two-page data used in the first write corresponds to the first and second pages. The five-page data used in the second write corresponds to the third to seventh pages.

As a result of the second write, "Z"-, "S0"-, "s1"-, "S2"-, "S3"-, "S4"-, and "S5"-state threshold distributions as shown in (c) of FIG. 193 are formed from the "Z"-state threshold distribution shown in (b) of FIG. 193. In addition, "S6"-, "S7"-, "S8"-, "S9"-, "S10"-, and "S11"-state threshold distributions as shown in (c) of FIG. 193 are formed from the "A"-state threshold distribution shown in (b) of FIG. 193. Between the first write and the second write in which a word line WL is selected, the first write in which an adjacent word line WL is selected may be performed.

As to the read operations, in a first read sequence, read data of the first page and the second page are output after a read operation using one level (in the twenty-second modification of the 16th embodiment: S6R) of the read voltage is performed. In a second read sequence, read data of the fifth page is output after a read operation using three levels (in the twenty-second modification of the 16th embodiment: S4R, S7R and S11R) of the read voltage is performed, and read data of the third page and the fourth data are output after a read operation using six levels (in the twenty-second modification of the 16th embodiment: S4R, S7R, S11R, S2R, S8R and S10R) of the read voltage is performed. In a third read sequence, read data of the sixth page and the seventh page are output after a read operation using four levels (in the twenty-second modification of the 16th embodiment: S1R, S3R, S5R and S9R) of the read voltage is performed.

[17] Details of Write Operation in 10th Embodiment

Details of the write operation in the semiconductor memory 10 of the fifth modification of the 10th embodiment will be described. Hereinafter, one of two memory cell transistors MT constituting a set for storing multiple-bit data will be called "memory cell transistor MTa", and the other will be called "memory cell transistor MTb". A sense amplifier unit SAU and a bit line BL coupled to a memory cell transistor MTa will be respectively referred to as "sense amplifier unit SAUa" and "bit line BLa", and a sense amplifier unit SAU and a bit line BL coupled to a memory cell transistor MTb will be respectively referred to as "sense amplifier unit SAUb" and "bit line BLb".

In the write operation according to the fifth modification of the 10th embodiment, corresponding write data is transferred to each of sense amplifier units SAUa and SAUb, based on the data definitions shown in FIG. 79. Specifically, in the write operation, coding conversion is performed to write data received by the semiconductor memory 10. The write data based on the converted coding is then stored in sense amplifier units SAUa and SAUb.

FIG. 149 shows an example of a data allocation after the coding conversion in the write operation according to the fifth modification of the 10th embodiment. As shown in FIG. 149, in a write operation according to the fifth modification of the 10th embodiment, a 1-1-3 coding is used wherein corresponding 3-bit data is allocated to each of six threshold distributions.

"ER" state: "111 (lower bit/middle bit/upper bit)" data
"A" state: "110" data
"B" state: "010" data
"C" state: "011" data
"D" state: "001" data
"E" state: "000" data In the present example, the lower-page data is confirmed by a read result obtained by using the read voltage BR. The middle-page data is confirmed by a read result obtained by using the read voltage DR. The upper-page data is confirmed by a read result by using the read voltages AR, CR, and ER. Hereinafter, in the coding after the conversion, the lower-page data stored in each of sense amplifier units SAUa and SAUb will be referred to as lower-page data pL1 and pL2, respectively. The middle-page data stored in each of sense amplifier unit SAUa and SAUb will be referred to as middle-page data pM1 and pM2, respectively. The upper-page data stored in sense amplifier units SAUa and SAUb will be referred to as upper-page data pU1 and pU2, respectively.

For example, according to the data allocation shown in FIG. 79, if "01010" data is stored, the threshold voltage of memory cell transistor MTa is included in the "B" state, and the threshold voltage of memory cell transistor MTb is included in the "D" state. In such a case, when "01010" data is input into the semiconductor memory 10 in the write operation, "010" data corresponding to the "B" state is stored in a latch circuit of sense amplifier unit SAUa, and "001" data corresponding to the "D" state is stored in a latch circuit of sense amplifier unit SAUb.

As for the other data, the data corresponding to the converted coding is respectively stored in sense amplifier units SAUa and SAUb, in a manner similar to the foregoing data storage. The computation processing for the coding conversion in the write operation may be altered based on a combination of the threshold voltages of memory cell transistors MTa and MTb, which are supposed to be unused.
(First Example of Write Operation)

In the first example of the write operation, data cannot be transferred between sense amplifier units SAUa and SAUb. The semiconductor memory 10 in the first example of the 10th embodiment has a configuration same as that of the first embodiment, for example, and sense amplifier unit SAUa corresponds to a sense amplifier unit SAU in plane PL0, and sense amplifier unit SAUb corresponds to a sense amplifier unit SAU in plane PL1.

FIG. 150 is a flowchart showing the operation performed by the sequencer 14 in the first example of the write operation in the semiconductor memory device 10 according to the fifth modification of the 10th embodiment. In the following, an example of the operation performed by the sequencer 14 when five latch circuits (latch circuits SDL, ADL, BDL, CDL, and XDL) are provided will be described, with reference to FIG. 150.

Upon receipt of the first-page data by the semiconductor memory 10, the sequencer 14 causes the latch circuit XDL in each of planes PL0 and PL1 (sense amplifier unit SAUa and SAUb) to store the received first-page data (FIG. 150, (1)).

Next, the sequencer 14 causes, in plane PL0, the latch circuit CDL to store the data stored in the latch circuit XDL, and causes, in plane PL1, the latch circuit CDL to store the data stored in the latch circuit XDL (FIG. 150, (2)).

Next, upon receipt of the second-page data by the semiconductor memory 10, the sequencer 14 causes the latch circuit XDL in each of planes PL0 and PL1 to store the received second-page data (FIG. 150, (3)).

Next, the sequencer 14 causes, in plane PL0, the latch circuit SDL to store the data stored in the latch circuit XDL, and causes, in plane PL1, the latch circuit SDL to store the data stored in the latch circuit XDL (FIG. 150 (4)).

Next, upon receipt of the third-page data by the semiconductor memory 10, the sequencer 14 causes each latch circuit XDL in planes PL0 and PL1 to store the received third-page data (FIG. 150 (5)).

next, the sequencer 14 causes, in plane PL0, the latch circuit BDL to store the data obtained by inverting the data stored in the latch circuit XDL, and causes, in plane PL1, the latch circuit ADL to store the data "XDL|CDL", which is obtained by an OR operation performed on the data stored in the latch circuit XDL and the data stored in the latch circuit CDL (FIG. 150 (6)). At this time, the data stored in the latch circuit ADL within plane PL1 corresponds to lower-page data pL2.

Next, the sequencer 14 causes, in plane PL0, the latch circuit BDL to store data "BDL&CDL", which is obtained by performing an AND operation on the data stored in the latch circuit BDL and the data stored in the latch circuit CDL, and causes, in plane PL1, the latch circuit BDL to store data "XDL&SDL", which is obtained by performing an AND operation on the data stored in the latch circuit XDL and the data stored in the latch circuit SDL. Subsequently, the sequencer 14 causes, in plane PL1, the latch circuit BDL to store data "BDL|CDL", which is obtained by performing an OR operation on the data retained in the latch circuit BDL and the data retained in the latch circuit CDL (FIG. 150, (7)). At this time, the data stored in the latch circuit BDL within plane PL0 corresponds to middle-page data pM1.

Subsequently, the sequencer 14 causes, in plane PL0, the latch circuit ADL to store the data "SDL&~XDL", which is obtained by an AND operation on the data stored in the latch circuit SDL and the data obtained by inverting the data stored in the latch circuit XDL, and causes, in plane PL1, the latch circuit CDL to store the data "(CDL&SDL)", which is obtained by an AND operation on the data stored in the latch circuit CDL and the data stored in the latch circuit SDL (FIG. 150, (8)).

Subsequently, the sequencer 14 causes, in plane PL0, the latch circuit ADL to store the data "ADL|CDL", which is obtained by an OR operation performed to the data stored in the lath circuit ADL and the data stored in the latch circuit CDL, and causes, in plane PL1, the latch circuit BDL to store the data "BDL&CDL", which is obtained by an AND operation performed to the data stored in the latch circuit BDL and the data stored in the latch circuit CDL (FIG. 150 (9)). At this time, the data stored in the latch circuit ADL within plane PL0 corresponds to the lower-page data pL1, and the data stored in the latch circuit BDL within plane PL1 corresponds to the middle-page data pM2.

Next, upon receipt of the fourth-page data by the semiconductor memory 10, the sequencer 14 causes the latch circuit XDL in each of planes PL0 and PL1 to store the received fourth-page data (FIG. 150 (10)). At this time, the data stored in the latch circuit XDL within plane PL1 corresponds to upper-page data pU2.

Next, the sequencer 14 causes, in plane PL1, the latch circuit CDL to store the data stored in the latch circuit XDL, namely the upper-page data pU2 (FIG. 150, (11)).

Next, upon receipt of the fifth-page data by the semiconductor memory 10, the sequencer 14 causes the latch circuit XDL in each of planes PL0 and PL1 to store the received fifth-page data (FIG. 150, (12)). At this time, the data stored in the latch circuit XDL within plane PL0 corresponds to upper-page data pU1.

Lastly, the sequencer 14 causes, in plane PL1, the latch circuit XDL to store the data stored in the latch circuit CDL, namely the upper-page data pU2 (FIG. 150, (13)).

If calculation processing is performed as described above, the sense amplifier unit SAUa is in a state of retaining the lower-page data pL1, the middle-page data pM1, and the upper-page data pU1, and the sense amplifier unit SAUb is in a state of retaining the lower-page data pL2, the middle-page data pM2, and the upper-page data pU2. Thereafter, the semiconductor memory 10 performs a write operation for 3-bit data based on the data stored in each of sense amplifier units SAUa and SAUb, and the converted coding.

(Second Example of Write Operation)

The second example of the write operation corresponds to an operation in a case where the data transfer between sense amplifier units SAUa and SAUb is possible, and two latch circuits XDL are coupled to the input/output circuit 19 within a sense amplifier set SAS.

FIG. 151 shows a configuration example of the semiconductor memory 10 in the second example of the write operation according to the 10th embodiment, and shows one sense amplifier set SAS as an example. As shown in FIG. 151, in the semiconductor memory 10 of the second example of the 10th embodiment, sense amplifier unit SAUa includes five latch circuits, SDL1, ADL1, BDL1, CDL1, and XDL1, and sense amplifier unit SAUb includes five latch circuits, SDL2, ADL2, BDL2, CDL2, and XDL2. Bus LBUS1 in sense amplifier unit SAUa and bus LBUS2 in sense amplifier unit SAUb are coupled with a switch SW. Each of the latch circuits XDL1 and XDL2 is coupled to the input/output circuit 19.

FIG. 152 is a flowchart showing the operation performed by the sequencer 14 in the second example of the write operation in the semiconductor memory device 10 according to the fifth modification of the 10th embodiment. In the following, an example of the operation performed by the sequencer 14 when five latch circuits are provided in each of sense amplifier units SAUa and SAUb will be described, with reference to FIG. 152.

Upon receipt of the first-page data by the semiconductor memory 10, the sequencer 14 causes the latch circuits XDL1 and XDL2 to store the received first-page data. Subsequently, the sequencer 14 causes the latch circuit ADL1 to store the data stored in the latch circuit XDL1 (FIG. 152 (1)).

Next, upon receipt of the second-page data by the semiconductor memory 10, the sequencer 14 causes each of the latch circuits XDL1 and XDL2 to store the received second-page data. Subsequently, the sequencer 14 causes the latch circuit BDL2 to store the data stored in the latch circuit XDL2 (FIG. 152 (2)).

Upon receipt of the third-page data by the semiconductor memory 10, the sequencer 14 causes the latch circuits XDL1 and XDL2 to store the received third-page data. Subsequently, the sequencer 14 causes the latch circuit ADL2 to store the data stored in the latch circuit XDL2 (FIG. 152 (3)).

Upon receipt of the fourth-page data by the semiconductor memory 10, the sequencer 14 causes the latch circuits XDL1 and XDL2 to store the received fourth-page data. Subsequently, the sequencer 14 causes the latch circuit CDL2 to store the data stored in the latch circuit XDL2 (FIG. 152, (4)). At this time, the data stored in the latch circuit CDL2 corresponds to the upper-page data pU2. Next, upon receipt of the fifth-page data by the semiconductor memory 10, the sequencer 14 causes each of the latch circuits XDL1 and XDL2 to store the received fifth-page data. Subsequently, the sequencer 14 causes the latch circuit XDL2 to store the data stored in the latch circuit CDL2 (FIG. 152, (5)). At this time, the data stored in the latch circuit XDL1 corresponds to the upper-page data pU1.

Next, the sequencer 14 causes the latch circuit BDL1 to store the data stored in the latch circuit ADL2. Subsequently, the sequencer 14 causes the latch circuit BDL1 to store data "BDL1&ADL1", which is obtained by performing an AND operation on the data stored in the latch circuit BDL1 and the data stored in the latch circuit ADL1 (FIG. 152, (6)). At this time, the data stored in the latch circuit BDL1 corresponds to the middle-page data pM1.

Next, the sequencer 14 causes the latch circuit CDL1 to store the data stored in the latch circuit ADL2. Subsequently, the sequencer 14 causes the latch circuit CDL1 to store data "CDL1&ADL2", which is obtained by performing an AND operation on the data stored in the latch circuit CDL1 and the data stored in the latch circuit ADL2 (FIG. 152, (7)).

Next, the sequencer 14 causes the latch circuit SDL2 to store data "ADL2&BDL2", which is obtained by performing an AND operation on the data stored in the latch circuit ADL2 and the data stored in the latch circuit BDL2 (FIG. 152, (8)).

Next, the sequencer 14 causes the latch circuit ADL2 to store data "ADL2|ADL1", which is obtained by performing an OR operation on the data stored in the latch circuit ADL2 and the data stored in the latch circuit ADL1 (FIG. 152, (9)). At this time, the data stored in the latch circuit ADL2 corresponds to the lower-page data pL2.

The sequencer 14 causes the latch circuit BDL2 to store the data "~(BDL2&ADL1)", which is obtained by inverting the data obtained by performing an AND operation on the data stored in the latch circuit BDL2 and the data stored in the latch circuit ADL1. Subsequently, the sequencer 14 causes the latch circuit BDL2 to store data "BDL2|SDL2", which is obtained by performing an OR operation on the data stored in the latch circuit BDL2 and the data stored in the latch circuit SDL2 (FIG. 152, (10)). At this time, the data stored in the latch circuit BDL2 corresponds to the middle-page data pM2.

Lastly, the sequencer 14 causes the latch circuit ADL1 to store data "ADL1|CDL1", which is obtained by performing an OR operation on the data stored in the latch circuit ADL1 and the data stored in the latch circuit CDL1 (FIG. 152, (11)). At this time, the data stored in the latch circuit ADL1 corresponds to the lower-page data pL1.

If calculation processing is performed as described above, the sense amplifier unit SAUa is in a state of retaining the lower-page data pL1, the middle-page data pM1, and the upper-page data pU1, and the sense amplifier unit SAUb is in a state of retaining the lower-page data pL2, the middle-page data pM2, and the upper-page data pU2. Thereafter, the semiconductor memory 10 performs a write operation for 3-bit data based on the data stored in each of sense amplifier units SAUa and SAUb, and the converted coding.

(Third Example of Write Operation)

The third example of the write operation corresponds to calculation processing in a case where the data transfer between sense amplifier units SAUa and SAUb is possible, and one latch circuit XDL is coupled to the input/output circuit 19 within a sense amplifier set SAS.

FIG. 153 shows a configuration example of the semiconductor memory 10 in the third example of the write operation according to the 10th embodiment, and shows one sense amplifier set SAS as an example. As shown in FIG. 153, compared to the semiconductor memory 10 in the second example of the 10th embodiment described with reference to FIG. 151, the semiconductor memory 10 in the third example has a configuration in which a coupling between the latch circuit XDL2 and the input/output circuit 19 is omitted, and only the latch circuit XDL1 is coupled to the input/output circuit 19.

FIG. 154 is a flowchart showing the operation performed by the sequencer 14 in the third example of the write operation in the semiconductor memory device 10 according to the fifth modification of the 10th embodiment. In the following, an example of the operation performed by the sequencer 14 when five latch circuits are provided in each of sense amplifier units SAUa and SAUb will be described, with reference to FIG. 154.

Upon receipt of the first-page data by the semiconductor memory 10, the sequencer 14 causes the latch circuit XDL1 to store the received first-page data. Subsequently, the sequencer 14 causes the latch circuit ADL1 to store the data stored in the latch circuit XDL1 (FIG. 154, (1)).

Next, upon receipt of the second-page data by the semiconductor memory 10, the sequencer 14 causes the latch circuit XDL1 to store the received second-page data. Subsequently, the sequencer 14 causes the latch circuit BDL2 to store the data stored in the latch circuit XDL1 (FIG. 154, (2)).

Next, upon receipt of the third-page data by the semiconductor memory 10, the sequencer 14 causes the latch circuit XDL1 to store the received third-page data. Subsequently, the sequencer 14 causes the latch circuit ADL2 to store the data stored in the latch circuit XDL1 (FIG. 154, (3)).

Next, upon receipt of the fourth-page data by the semiconductor memory 10, the sequencer 14 causes the latch circuit XDL1 to store the received fourth-page data. Subsequently, the sequencer 14 causes the latch circuit CDL2 to store the data stored in the latch circuit XDL1 (FIG. 154, (4)). At this time, the data stored in the latch circuit CDL2 corresponds to the upper-page data pU2.

Next, upon receipt of the fifth-page data by the semiconductor memory 10, the sequencer 14 causes each of the latch circuit XDL1 to store the received fifth-page data. Subsequently, the sequencer 14 causes the latch circuit XDL2 to store the data stored in the latch circuit CDL2 (FIG. 154, (5)). At this time, the data stored in the latch circuit XDL1 corresponds to the upper-page data pU1.

Next, the sequencer 14 causes the latch circuit BDL1 to store the data stored in the latch circuit ADL2. Subsequently, the sequencer 14 causes the latch circuit BDL1 to store data "BDL1&ADL1", which is obtained by performing an AND operation on the data stored in the latch circuit BDL1 and the data stored in the latch circuit ADL1 (FIG. 154, (6)). At this time, the data stored in the latch circuit BDL1 corresponds to the middle-page data pM1.

Next, the sequencer 14 causes the latch circuit CDL1 to store the data stored in the latch circuit ADL2. Subsequently, the sequencer 14 causes the latch circuit CDL1 to store data "CDL1&ADL2", which is obtained by performing an AND operation on the data stored in the latch circuit CDL1 and the data stored in the latch circuit ADL2 (FIG. 154, (7)).

Next, the sequencer 14 causes the latch circuit SDL2 to store data "ADL2&BDL2", which is obtained by performing an AND operation on the data stored in the latch circuit ADL2 and the data stored in the latch circuit BDL2 (FIG. 154, (8)).

Next, the sequencer 14 causes the latch circuit ADL2 to store data "ADL2|ADL1", which is obtained by performing an OR operation on the data stored in the latch circuit ADL2 and the data stored in the latch circuit ADL1 (FIG. 154, (9)). At this time, the data stored in the latch circuit ADL2 corresponds to the lower-page data pL2.

The sequencer 14 causes the latch circuit BDL2 to store the data "~(BDL2&ADL1)", which is obtained by inverting the data obtained by performing an AND operation on the data stored in the latch circuit BDL2 and the data stored in the latch circuit ADL1. Subsequently, the sequencer 14 causes the latch circuit BDL2 to store data "BDL2|SDL2", which is obtained by performing an OR operation on the data stored in the latch circuit BDL2 and the data stored in the latch circuit SDL2 (FIG. 154, (10)). At this time, the data stored in the latch circuit BDL2 corresponds to the middle-page data pM2.

Lastly, the sequencer 14 causes the latch circuit ADL1 to store data "ADL1|CDL1", which is obtained by performing an OR operation on the data stored in the latch circuit ADL1 and the data retained in the latch circuit CDL1 (FIG. 154, (11)). At this time, the data stored in the latch circuit ADL1 corresponds to the lower-page data pL1.

If calculation processing is performed as described above, the sense amplifier unit SAUa is in a state of retaining the lower-page data pL1, the middle-page data pM1, and the upper-page data pU1, and the sense amplifier unit SAUb is in a state of retaining the lower-page data pL2, the middle-page data pM2, and the upper-page data pU2. Thereafter, the semiconductor memory 10 performs a write operation for 3-bit data based on the data stored in each of sense amplifier units SAUa and SAUb, and the converted coding. The above-described method of the write operation in the fifth modification of the 10th embodiment may be similarly performed in the 10th embodiment, and each of the other modifications of the 10th embodiment.

[18] Details of Write Operation in 11th Embodiment

Details of the write operation in the semiconductor memory 10 of the second modification of the 11th embodiment will be described. In the write operation according to the second modification of the 11th embodiment, corresponding write data is transferred to each of sense amplifier units SAUa and SAUb, based on the data definitions shown in FIG. 101. Specifically, in the write operation, coding conversion is performed to write data received by the semiconductor memory 10. The write data based on the converted coding is then stored in sense amplifier units SAUa and SAUb.

FIG. 155 shows an example of a data allocation after the coding conversion in the write operation according to the second modification of the 11th embodiment. As shown in FIG. 155, in a write operation according to the second modification of the 11th embodiment, a 1-3-3-4 coding is used wherein corresponding 4-bit data is allocated to each of 12 threshold distributions.

"ER" state: "1111 (lower bit/middle bit/upper bit/upper-most bit)" data

"A" state: "1101" data

"B" state: "1100" data

"C" state: "1110" data

"D" state: "0110" data

"E" state: "0111" data

"F" state: "0011" data

"G" state: "0010" data

"H" state: "0000" data

"I" state: "0100" data

"J" state: "0101" data

"K" state: "0001" data

In the present example, the lower-page data is confirmed by a read result obtained by using the read voltage DR. The middle-page data is confirmed by a read result obtained by using the read voltages FR, IR, and KR. The upper-page data is confirmed by a read result obtained by using the read voltages AR, CR, and HR. The uppermost-page data is confirmed by a read result obtained by using the read voltages BR, ER, GR, and JR. Hereinafter, in the coding after the conversion, the uppermost-page data stored in each of sense amplifier units SAUa and SAUb will be referred to as uppermost-page data pT1 and pT2.

For example, according to the data allocation shown in FIGS. 97 through 100, if "1010100" data is stored, the threshold voltage of memory cell transistor MTa is included in the "J" state, and the threshold voltage of memory cell transistor MTb is included in the "A" state. In such a case, when "1010100" data is input into the semiconductor memory 10 in the write operation, "0101" data corresponding to the "J" state is stored in a latch circuit of sense amplifier unit SAUa, and "1101" data corresponding to the "A" state is stored in a latch circuit of sense amplifier unit SAUb.

As for the other data, the data corresponding to the converted coding is respectively stored in sense amplifier units SAUa and SAUb, in a manner similar to the foregoing data storage. The computation processing for the coding conversion in the write operation may be altered based on a combination of the threshold voltages of memory cell transistors MTa and MTb, which are supposed to be unused.

(First Example of Write Operation)

In the first example of the write operation, data cannot be transferred between sense amplifier units SAUa and SAUb. The semiconductor memory 10 in the first example of the 11th embodiment has a configuration same as that of the first embodiment, for example, and sense amplifier unit SAUa corresponds to a sense amplifier unit SAU in plane PL0, and sense amplifier unit SAUb corresponds to a sense amplifier unit SAU in plane PL1.

FIG. 156 is a flowchart showing the operation performed by the sequencer 14 in the first example of the write operation in the semiconductor memory device 10 according to the second modification of the 11th embodiment. In the following, an example of the operation performed by the sequencer 14 when six latch circuits (latch circuits SDL, ADL, BDL, CDL, DDL, and XDL) are provided will be described, with reference to FIG. 156.

Upon receipt of the first-page data by the semiconductor memory 10, the sequencer 14 causes the latch circuit XDL in each of planes PL0 and PL1 (sense amplifier unit SAUa and SAUb) to store the received first-page data (FIG. 156, (1)).

Next, the sequencer 14 causes the latch circuit DDL to store the data stored in the latch circuit XDL in plane PL0, and causes the latch circuit DDL in PL1 to store the data stored in the latch circuit XDL (FIG. 156, (2)).

Next, upon receipt of the second-page data by the semiconductor memory 10, the sequencer 14 causes the latch circuit XDL in each of planes PL0 and PL1 to store the received second-page data (FIG. 156 (3)).

Next, the sequencer 14 causes, in plane PL0, the latch circuit CDL to store the data stored in the latch circuit XDL, and causes, in plane PL1, the latch circuit CDL to store the data stored in the latch circuit XDL (FIG. 156, (4)).

Next, upon receipt of the third-page data by the semiconductor memory 10, the sequencer 14 causes each latch circuit XDL in planes PL0 and PL1 to store the received third-page data (FIG. 156, (5)).

Next, the sequencer 14 causes, in plane PL0, the latch circuit BDL to store the data obtained by inverting the data stored in the latch circuit XDL, and causes, in plane PL1, the latch circuit ADL to store the data "XDL|DDL", which is obtained by an OR operation performed on the data stored in the latch circuit XDL and the data stored in the latch circuit DDL (FIG. 156, (6)). At this time, the data stored in the latch circuit ADL within plane PL1 corresponds to lower-page data pL2.

Next, the sequencer 14 causes, in plane PL0, the latch circuit BDL to store data "BDL&DDL", which is obtained by performing an AND operation on the data stored in the latch circuit BDL and the data stored in the latch circuit DDL, and causes, in plane PL1, the latch circuit BDL to store data "XDL&CDL", which is obtained by performing an AND operation on the data stored in the latch circuit XDL and the data stored in the latch circuit CDL. Subsequently, the sequencer 14 causes, in plane PL1, the latch circuit BDL to store data "BDL|DDL", which is obtained by performing an OR operation on the data retained in the latch circuit BDL and the data retained in the latch circuit DDL (FIG. 156, (7)). At this time, the data stored in the latch circuit BDL within plane PL0 corresponds to middle-page data pM1.

Subsequently, the sequencer 14 causes, in plane PL0, the latch circuit ADL to store the data "CDL&~XDL", which is obtained by an AND operation performed to the data stored in the lath circuit CDL and the data obtained by inverting the data stored in the latch circuit XDL, and causes, in plane PL1, the latch circuit CDL to store the data "~(CDL&DDL)", which is obtained by inverting the data obtained by an AND operation performed to the data stored in the latch circuit CDL and the data stored in the latch circuit DDL (FIG. 156, (8)).

Subsequently, the sequencer 14 causes, in plane PL0, the latch circuit ADL to store the data "ADL|DDL", which is obtained by an OR operation performed to the data stored in the lath circuit ADL and the data stored in the latch circuit DDL, and causes, in plane PL1, the latch circuit BDL to store the data "BDL&CDL", which is obtained by an AND operation performed to the data stored in the latch circuit BDL and the data stored in the latch circuit CDL (FIG. 156, (9)). At this time, the data stored in the latch circuit ADL within plane PL0 corresponds to the lower-page data pL1, and the data stored in the latch circuit BDL within plane PL1 corresponds to the middle-page data pM2.

Next, upon receipt of the fourth-page data by the semiconductor memory 10, the sequencer 14 causes the latch circuit XDL in each of planes PL0 and PL1 to store the received fourth-page data (FIG. 156, (10)). At this time, the data stored in the latch circuit XDL within plane PL1 corresponds to upper-page data pU2.

Next, the sequencer 14 causes, in plane PL1, the latch circuit CDL to store the data stored in the latch circuit XDL, namely the upper-page data pU2 (FIG. 156, (11)).

Next, upon receipt of the fifth-page data by the semiconductor memory 10, the sequencer 14 causes each latch circuit XDL in planes PL0 and PL1 to store the received fifth-page data (FIG. 156, (12)). At this time, the data stored in the latch circuit XDL within plane PL0 corresponds to upper-page data pU1.

Next, the sequencer 14 causes, in plane PL0, the latch circuit CDL to store the data stored in the latch circuit XDL, namely the upper-page data pU1 (FIG. 156, (13)).

Next, upon receipt of the sixth-page data by the semiconductor memory 10, the sequencer 14 causes each latch circuit XDL in planes PL0 and PL1 to store the received sixth-page data (FIG. 156, (14)). At this time, the data stored in the latch circuit XDL within plane PL1 corresponds to uppermost-page data pT2.

Next, the sequencer 14 causes, in plane PL1, the latch circuit DDL to store the data stored in the latch circuit XDL, namely the uppermost-page data pT2 (FIG. 156, (15)).

Next, upon receipt of the seventh-page data by the semiconductor memory 10, the sequencer 14 causes each latch circuit XDL in planes PL0 and PL1 to store the received seventh-page data (FIG. 156, (16)). At this time, the data stored in the latch circuit XDL within plane PL0 corresponds to uppermost-page data pT1.

Lastly, the sequencer 14 causes, in plane PL1, the latch circuit XDL to store the data stored in the latch circuit DDL, namely the uppermost-page data pT2 (FIG. 156, (15)).

If calculation processing is performed as described above, the sense amplifier unit SAUa is in a state of retaining the lower-page data pL1, the middle-page data pM1, the upper-page data pU1, and the uppermost-page data pT1, and the sense amplifier unit SAUb is in a state of retaining the lower-page data pL2, the middle-page data pM2, the upper-page data pU2, and the uppermost-page data pT2. Thereafter, the semiconductor memory 10 performs a write operation for 4-bit data based on the data stored in each of sense amplifier units SAUa and SAUb, and the converted coding.

(Second Example of Write Operation)

The second example of the write operation corresponds to an operation in a case where the data transfer between sense amplifier units SAUa and SAUb is possible, and two latch circuits XDL are coupled to the input/output circuit 19 within a sense amplifier set SAS.

FIG. 157 shows a configuration example of the semiconductor memory 10 in the second example of the write operation according to the 11th embodiment, and shows one sense amplifier set SAS as an example. As shown in FIG. 157, in the semiconductor memory 10 of the second example of the 11th embodiment, sense amplifier unit SAUa includes six latch circuits, SDL1, ADL1, BDL1, CDL1, DDL1, and XDL1, and sense amplifier unit SAUb includes six latch circuits, SDL2, ADL2, BDL2, CDL2, DDL2, and XDL2. Bus LBUS1 in sense amplifier unit SAUa and bus LBUS2 in sense amplifier unit SAUb are coupled with a switch SW. Each of the latch circuits XDL1 and XDL2 is coupled to the input/output circuit 19.

In the following, an example of the operation performed by the sequencer 14 when six latch circuits are provided in each of sense amplifier units SAUa and SAUb will be described, with reference to FIG. 158. FIG. 158 is a flowchart showing the operation performed by the sequencer 14 in the second example of the write operation in the semiconductor memory device 10 according to the second modification of the 11th embodiment.

Upon receipt of the first-page data by the semiconductor memory 10, the sequencer 14 causes the latch circuits XDL1 and XDL2 to store the received first-page data. Subsequently, the sequencer 14 causes the latch circuit ADL1 to store the data stored in the latch circuit XDL1 (FIG. 158, (1)).

Next, upon receipt of the second-page data by the semiconductor memory 10, the sequencer 14 causes each of the latch circuits XDL1 and XDL2 to store the received second-page data. Subsequently, the sequencer 14 causes the latch circuit BDL2 to store the data stored in the latch circuit XDL2 (FIG. 158, (2)).

Next, upon receipt of the third-page data by the semiconductor memory 10, the sequencer 14 causes each of the latch circuits XDL1 and XDL2 to store the received third-page data. Subsequently, the sequencer 14 causes the latch circuit ADL2 to store the data stored in the latch circuit XDL2 (FIG. 158, (3)).

Next, upon receipt of the fourth-page data by the semiconductor memory 10, the sequencer 14 causes each of the latch circuits XDL1 and XDL2 to store the received fourth-page data. Subsequently, the sequencer 14 causes the latch circuit CDL2 to store the data stored in the latch circuit XDL2 (FIG. 158, (4)). At this time, the data stored in the latch circuit CDL2 corresponds to the upper-page data pU2.

Next, upon receipt of the fifth-page data by the semiconductor memory 10, the sequencer 14 causes each of the latch circuits XDL1 and XDL2 to store the received fifth-page data. Subsequently, the sequencer 14 causes the latch circuit CDL1 to store the data stored in the latch circuit XDL1 (FIG. 158, (5)). At this time, the data stored in the latch circuit CDL1 corresponds to the upper-page data pU1.

Next, upon receipt of the sixth-page data by the semiconductor memory 10, the sequencer 14 causes each of the latch circuits XDL1 and XDL2 to store the received sixth-page data. Subsequently, the sequencer 14 causes the latch circuit DDL2 to store the data stored in the latch circuit XDL2 (FIG. 158, (6)). At this time, the data stored in the latch circuit DDL2 corresponds to the uppermost-page data pT2.

Next, upon receipt of the seventh-page data by the semiconductor memory 10, the sequencer 14 causes each of the latch circuits XDL1 and XDL2 to store the received seventh-page data. Subsequently, the sequencer 14 causes the latch circuit XDL2 to store the data stored in the latch circuit DDL2, namely the uppermost-page data pT2 (FIG. 158, (7)). At this time, the data stored in the latch circuit XDL1 corresponds to the uppermost-page data pT1.

Next, the sequencer 14 causes the latch circuit BDL1 to store the data stored in the latch circuit ADL2. Subsequently, the sequencer 14 causes the latch circuit BDL1 to store data "BDL1&ADL1", which is obtained by performing an AND operation on the data stored in the latch circuit BDL1 and the data stored in the latch circuit ADL1 (FIG. 158, (8)). At this time, the data stored in the latch circuit BDL1 corresponds to the middle-page data pM1.

Next, the sequencer 14 causes the latch circuit DDL1 to store the data stored in the latch circuit ADL2. Subsequently, the sequencer 14 causes the latch circuit DDL1 to store data "DDL1&BDL2", which is obtained by performing an AND operation on the data stored in the latch circuit DDL1 and the data stored in the latch circuit BDL2 (FIG. 158, (9)).

Next, the sequencer 14 causes the latch circuit DDL2 to store data "ADL2&BDL2", which is obtained by performing an AND operation on the data stored in the latch circuit ADL2 and the data stored in the latch circuit BDL2. Subsequently, the sequencer 14 causes the latch circuit DDL2 to store data "ADL1|DDL2", which is obtained by performing an OR operation on the data stored in the latch circuit ADL1 and the data stored in the latch circuit DDL2 (FIG. 158, (10)).

Next, the sequencer 14 causes the latch circuit ADL2 to store data "ADL2|ADL1", which is obtained by performing an OR operation on the data stored in the latch circuit ADL2 and the data stored in the latch circuit ADL1 (FIG. 158, (11)). At this time, the data stored in the latch circuit ADL2 corresponds to the lower-page data pL2.

The sequencer 14 causes the latch circuit BDL2 to store the data "~(BDL2&ADL1)", which is obtained by inverting the data obtained by performing an AND operation on the data stored in the latch circuit BDL2 and the data stored in the latch circuit ADL1. Subsequently, the sequencer 14 causes the latch circuit BDL2 to store data "BDL2|DDL2", which is obtained by performing an OR operation on the data stored in the latch circuit BDL2 and the data stored in the latch circuit DDL2 (FIG. 158, (12)). At this time, the data stored in the latch circuit BDL2 corresponds to the middle-page data pM2.

Next, the sequencer 14 causes the latch circuit ADL1 to store data "ADL1|DDL1", which is obtained by performing an OR operation on the data stored in the latch circuit ADL1 and the data stored in the latch circuit DDL1 (FIG. 158, (13)). At this time, the data stored in the latch circuit ADL1 corresponds to the lower-page data pL1.

If calculation processing is performed as described above, the sense amplifier unit SAUa is in a state of retaining the lower-page data pL1, the middle-page data pM1, the upper-page data pU1, and the uppermost-page data pT1, and the sense amplifier unit SAUb is in a state of retaining the lower-page data pL2, the middle-page data pM2, the upper-page data pU2, and the uppermost-page data pT2. Thereafter, the semiconductor memory 10 performs a write operation for 4-bit data based on the data stored in each of sense amplifier units SAUa and SAUb, and the converted coding.

(Third Example of Write Operation)

The third example of the write operation corresponds to calculation processing in a case where the data transfer between sense amplifier units SAUa and SAUb is possible, and one latch circuit XDL is coupled to the input/output circuit 19 within a sense amplifier set SAS.

FIG. 159 shows a configuration example of the semiconductor memory 10 in the third example of the write operation according to the 11th embodiment, and shows one sense amplifier set SAS as an example. As shown in FIG. 159, compared to the semiconductor memory 10 in the second example of the 11th embodiment described with reference to FIG. 157, the semiconductor memory 10 in the third example has a configuration in which a coupling between the latch circuit XDL2 and the input/output circuit 19 is omitted, and only the latch circuit XDL1 is coupled to the input/output circuit 19.

In the following, an example of the operation performed by the sequencer 14 when six latch circuits are provided in each of sense amplifier units SAUa and SAUb will be described, with reference to FIG. 160. FIG. 160 is a flowchart showing the operation performed by the sequencer 14 in the third example of the write operation in the semiconductor memory device 10 according to the second modification of the 11th embodiment.

Upon receipt of the first-page data by the semiconductor memory 10, the sequencer 14 causes the latch circuit XDL1 to store the received first-page data. Subsequently, the sequencer 14 causes the latch circuit ADL1 to store the data stored in the latch circuit XDL1 (FIG. 160, (1)).

Next, upon receipt of the second-page data by the semiconductor memory 10, the sequencer 14 causes each of the latch circuit XDL1 to store the received second-page data. Subsequently, the sequencer 14 causes the latch circuit BDL2 to store the data stored in the latch circuit XDL1 (FIG. 160, (2)).

Next, upon receipt of the third-page data by the semiconductor memory 10, the sequencer 14 causes the latch circuit XDL1 to store the received third-page data. Subsequently, the sequencer 14 causes the latch circuit ADL2 to store the data stored in the latch circuit XDL1 (FIG. 160, (3)).

Next, upon receipt of the fourth-page data by the semiconductor memory 10, the sequencer 14 causes each of the latch circuit XDL1 to store the received fourth-page data. Subsequently, the sequencer 14 causes the latch circuit CDL2 to store the data stored in the latch circuit XDL1 (FIG. 160, (4)). At this time, the data stored in the latch circuit CDL2 corresponds to the upper-page data pU2.

Next, upon receipt of the fifth-page data by the semiconductor memory 10, the sequencer 14 causes each of the latch circuit XDL1 to store the received fifth-page data. Subsequently, the sequencer 14 causes the latch circuit CDL1 to store the data stored in the latch circuit XDL1 (FIG. 160, (5)). At this time, the data stored in the latch circuit CDL1 corresponds to the upper-page data pU1.

Next, upon receipt of the sixth-page data by the semiconductor memory 10, the sequencer 14 causes each of the latch circuit XDL1 to store the received sixth-page data. Subsequently, the sequencer 14 causes the latch circuit DDL2 to store the data stored in the latch circuit XDL1 (FIG. 160, (6)). At this time, the data stored in the latch circuit DDL2 corresponds to the uppermost-page data pT2.

Next, upon receipt of the seventh-page data by the semiconductor memory 10, the sequencer 14 causes the latch circuit XDL1 to store the received seventh-page data. Subsequently, the sequencer 14 causes the latch circuit XDL2 to store the data stored in the latch circuit DDL2, namely the uppermost-page data pT2 (FIG. 160, (7)). At this time, the data stored in the latch circuit XDL1 corresponds to the uppermost-page data pT1.

Next, the sequencer 14 causes the latch circuit BDL1 to store the data stored in the latch circuit ADL2. Subsequently, the sequencer 14 causes the latch circuit BDL1 to store data "BDL1&ADL1", which is obtained by performing an AND operation on the data stored in the latch circuit BDL1 and the data stored in the latch circuit ADL1 (FIG. 160, (8)). At this time, the data stored in the latch circuit BDL1 corresponds to the middle-page data pM1.

Next, the sequencer 14 causes the latch circuit DDL1 to store the data stored in the latch circuit ADL2. Subsequently, the sequencer 14 causes the latch circuit DDL1 to store data "DDL1&BDL2", which is obtained by performing an AND operation on the data stored in the latch circuit DDL1 and the data stored in the latch circuit BDL2 (FIG. 160, (9)).

Next, the sequencer 14 causes the latch circuit DDL2 to store data "ADL2&BDL2", which is obtained by performing an AND operation on the data stored in the latch circuit ADL2 and the data stored in the latch circuit BDL2. Subsequently, the sequencer 14 causes the latch circuit DDL2 to store data "ADL1|DDL2", which is obtained by performing an OR operation on the data stored in the latch circuit ADL1 and the data stored in the latch circuit DDL2 (FIG. 160, (10)).

Next, the sequencer 14 causes the latch circuit ADL2 to store data "ADL2|ADL1", which is obtained by performing an OR operation on the data stored in the latch circuit ADL2 and the data stored in the latch circuit ADL1 (FIG. 160, (11)). At this time, the data stored in the latch circuit ADL2 corresponds to the lower-page data pL2.

The sequencer 14 causes the latch circuit BDL2 to store the data "~(BDL2&ADL1)", which is obtained by inverting the data obtained by performing an AND operation on the data stored in the latch circuit BDL2 and the data stored in the latch circuit ADL1. Subsequently, the sequencer 14 causes the latch circuit BDL2 to store data "BDL2|DDL2", which is obtained by performing an OR operation on the data stored in the latch circuit BDL2 and the data stored in the latch circuit DDL2 (FIG. 160, (12)). At this time, the data stored in the latch circuit BDL2 corresponds to the middle-page data pM2.

Lastly, the sequencer 14 causes the latch circuit ADL1 to store data "ADL1|DDL1", which is obtained by performing an OR operation on the data stored in the latch circuit ADL1 and the data stored in the latch circuit DDL1 (FIG. 160, (13)). At this time, the data stored in the latch circuit ADL1 corresponds to the middle-page data pL1.

If calculation processing is performed as described above, the sense amplifier unit SAUa is in a state of retaining the lower-page data pL1, the middle-page data pM1, the upper-page data pU1, and the uppermost-page data pT1, and the sense amplifier unit SAUb is in a state of retaining the lower-page data pL2, the middle-page data pM2, the upper-page data pU2, and the uppermost-page data pT2. Thereafter, the semiconductor memory 10 performs a write operation for 4-bit data based on the data stored in each of sense amplifier units SAUa and SAUb, and the converted coding. The above-described method of the write operation in the second modification of the 11th embodiment may be similarly performed in the 11th embodiment and the other modifications of the 11th embodiment.

[19] 17th Embodiment

In the semiconductor memory 10 according to the 17th embodiment, 9-bit data can be stored by a set of one memory cell transistor MT in plane PL1 and one memory cell transistor MT in plane PL2. In the following, differences between the semiconductor memory 10 of the 17th embodiment and that of the first to 16th embodiments will be described.

[19-1] Configuration

[19-1-1] Threshold Distributions of Memory Cell Transistor MT

FIG. 161 shows an example of threshold distributions of the memory cell transistors MT, and read voltages in the semiconductor memory 10 according to the 17th embodiment.

As shown in FIG. 161, in the threshold distributions of the memory cell transistors MT in the 17th embodiment, eight threshold distributions, which are higher than the "O" state, are added to the threshold distributions described with reference to FIG. 8 in the first embodiment.

In the present specification, these eight threshold distributions higher than the "O" state are respectively called "P"

state, "Q" state, "R" state, "S" state, "T" state, "U" state, "V" state, and "W" state, from lower to higher threshold voltages.

A read voltage PR is set between the "O" state and the "P" state. A read voltage QR is set between the "P" state and the "Q" state. A read voltage RR is set between the "Q" state and the "R" state. A read voltage SR is set between the "R" state and the "S" state. A read voltage TR is set between the "S" state and the "T" state.

A read voltage UR is set between the "T" state and the "U" state. A read voltage VR is set between the "U" state and the "V" state. A read voltage WR is set between the "V" state and the "W" state. In the 17th embodiment, the read pass voltage VREAD is set to a voltage higher than a maximum threshold voltage in the "W" state.

Similarly to the "A" state through "O" state, verify voltages PV, QV, RV, SV, TV, UV, VV, and WV are set in correspond to the "P" state, "Q" state, "R" state, "S" state, "T" state, "U" state, "V" state, and "W" state.

[19-1-2] Data Allocation

FIGS. 162 through 177 show an example of data allocation for the threshold distributions of the memory cell transistors MT in the semiconductor memory 10 according to the 17th embodiment.

As shown in FIGS. 162 through 177, in the semiconductor memory 10 according to the 17th embodiment, 576 combinations are possible by combining 24 threshold voltages in the memory cell transistors MT in plane PL1 with 24 threshold voltages in the memory cell transistors MT in plane PL2. Furthermore, 9-bit data is allocated to each of the 576 combinations, as shown below:

(Example) "Threshold voltage of memory cell transistors MT in plane PL1", "threshold voltage of memory cell transistors MT in plane PL2": "first bit/second bit/third bit/fourth bit/fifth bit/sixth bit/seventh bit/eighth bit/ninth bit" data (1) "Z" state, "Z" state: "000000000" data
(2) "Z" state, "A" state: "000100000" data
(3) "Z" state, "B" state: "000101000" data
(4) "Z" state, "C" state: "000101010" data
(5) "Z" state, "D" state: "000100010" data
(6) "Z" state, "E" state: "000000010" data
(7) "Z" state, "F" state: "000001010" data
(8) "Z" state, "G" state: "000001000" data
(9) "Z" state, "H" state: "001001000" data
(10) "Z" state, "I" state: "001001010" data
(11) "Z" state, "J" state: "011001010" data
(12) "Z" state, "K" state: "011101010" data
(13) "Z" state, "L" state: "011100010" data
(14) "Z" state, "M" state: "011000010" data
(15) "Z" state, "N" state: "001000010" data
(16) "Z" state, "O" state: "001000000" data
(17) "Z" state, "P" state: "011000000" data
(18) "Z" state, "Q" state: "011001000" data
(19) "Z" state, "R" state: "011101000" data
(20) "Z" state, "S" state: "001101000" data
(21) "Z" state, "T" state: "001101010" data
(22) "Z" state, "U" state: "001100010" data
(23) "Z" state, "V" state: "001100000" data
(24) "Z" state, "W" state: "011100000" data
(25) "A" state, "Z" state: "000010000" data
(26) "A" state, "A" state: "000110000" data
(27) "A" state, "B" state: "000111000" data
(28) "A" state, "C" state: "000111010" data
(29) "A" state, "D" state: "000110010" data
(30) "A" state, "E" state: "000010010" data
(31) "A" state, "F" state: "000011010" data

(32) "A" state, "G" state: "000011000" data
(33) "A" state, "H" state: "001011000" data
(34) "A" state, "I" state: "001011010" data
(35) "A" state, "J" state: "011011010" data
(36) "A" state, "K" state: "011111010" data
(37) "A" state, "L" state: "011110010" data
(38) "A" state, "M" state: "011010010" data
(39) "A" state, "N" state: "001010010" data
(40) "A" state, "O" state: "001010000" data
(41) "A" state, "P" state: "011010000" data
(42) "A" state, "Q" state: "011011000" data
(43) "A" state, "R" state: "011111000" data
(44) "A" state, "S" state: "001111000" data
(45) "A" state, "T" state: "001111010" data
(46) "A" state, "U" state: "001110010" data
(47) "A" state, "V" state: "001110000" data
(48) "A" state, "W" state: "011110000" data
(49) "B" state, "Z" state: "000010100" data
(50) "B" state, "A" state: "000110100" data
(51) "B" state, "B" state: "000111100" data
(52) "B" state, "C" state, "C" state: "000111110" data
(53) "B" state, "D" state: "000110110" data
(54) "B" state, "E" state: "000010110" data
(55) "B" state, "F" state: "000011110" data
(56) "B" state, "G" state: "000011100" data
(57) "B" state, "H" state: "001011100" data
(58) "B" state, "I" state: "001011110" data
(59) "B" state, "J" state: "011011110" data
(60) "B" state, "K" state: "011111110" data
(61) "B" state, "L" state: "011110110" data
(62) "B" state, "M" state: "011010110" data
(63) "B" state, "N" state: "001010110" data
(64) "B" state, "O" state: "001010100" data
(65) "B" state, "P" state: "011010100" data
(66) "B" state, "Q" state: "011011100" data
(67) "B" state, "R" state: "011111100" data
(68) "B" state, "S" state: "001111100" data
(69) "B" state, "T" state: "001111110" data
(70) "B" state, "U" state: "001110110" data
(71) "B" state, "V" state: "001110100" data
(72) "B" state, "W" state: "011110100" data
(73) "C" state, "Z" state: "000010101" data
(74) "C" state, "A" state: "000110101" data
(75) "C" state, "B" state: "000111101" data
(76) "C" state, "C" state: "000111111" data
(77) "C" state, "D" state: "000110111" data
(78) "C" state, "E" state: "000010111" data
(79) "C" state, "F" state: "000011111" data
(80) "C" state, "G" state: "000011101" data
(81) "C" state, "H" state: "001011101" data
(82) "C" state, "I" state: "001011111" data
(83) "C" state, "J" state: "011011111" data
(84) "C" state, "K" state: "011111111" data
(85) "C" state, "L" state: "011110111" data
(86) "C" state, "M" state: "011010111" data
(87) "C" state, "N" state: "001010111" data
(88) "C" state, "O" state: "001010101" data
(89) "C" state, "P" state: "011010101" data
(90) "C" state, "Q" state: "011011101" data
(91) "C" state, "R" state: "011111101" data
(92) "C" state, "S" state: "001111101" data
(93) "C" state, "T" state: "001111111" data
(94) "C" state, "U" state: "001110111" data
(95) "C" state, "V" state: "001110101" data
(96) "C" state, "W" state: "011110101" data
(97) "D" state, "Z" state: "000010001" data
(98) "D" state, "A" state: "000110001" data

(99) "D" state, "B" state: "000111001" data
(100) "D" state, "C" state: "000111011" data
(101) "D" state, "D" state: "000110011" data
(102) "D" state, "E" state: "000010011" data
(103) "D" state, "F" state: "000011011" data
(104) "D" state, "G" state: "000011001" data
(105) "D" state, "H" state: "001011001" data
(106) "D" state, "I" state: "001011011" data
(107) "D" state, "J" state: "011011011" data
(108) "D" state, "K" state: "011111011" data
(109) "D" state, "L" state: "011110011" data
(110) "D" state, "M" state: "011010011" data
(111) "D" state, "N" state: "001010011" data
(112) "D" state, "O" state: "001010001" data
(113) "D" state, "P" state: "011010001" data
(114) "D" state, "Q" state: "011011001" data
(115) "D" state, "R" state: "011111001" data
(116) "D" state, "S" state: "001111001" data
(117) "D" state, "T" state: "001111011" data
(118) "D" state, "U" state: "001110011" data
(119) "D" state, "V" state: "001110001" data
(120) "D" state, "W" state: "011110001" data
(121) "E" state, "Z" state: "000000001" data
(122) "E" state, "A" state: "000100001" data
(123) "E" state, "B" state: "000101001" data
(124) "E" state, "C" state: "000101011" data
(125) "E" state, "D" state: "000100011" data
(126) "E" state, "E" state: "000000011" data
(127) "E" state, "F" state: "000001011" data
(128) "E" state, "G" state: "000001001" data
(129) "E" state, "H" state: "001001001" data
(130) "E" state, "I" state: "001001011" data
(131) "E" state, "J" state: "011001011" data
(132) "E" state, "K" state: "011101011" data
(133) "E" state, "L" state: "011100011" data
(134) "E" state, "M" state: "011000011" data
(135) "E" state, "N" state: "001000011" data
(136) "E" state, "O" state: "001000001" data
(137) "E" state, "P" state: "011000001" data
(138) "E" state, "Q" state: "011001001" data
(139) "E" state, "R" state: "011101001" data
(140) "E" state, "S" state: "001101001" data
(141) "E" state, "T" state: "001101011" data
(142) "E" state, "U" state: "001100011" data
(143) "E" state, "V" state: "001100001" data
(144) "E" state, "W" state: "011100001" data
(145) "F" state, "Z" state: "000000101" data
(146) "F" state, "A" state: "000100101" data
(147) "F" state, "B" state: "000101101" data
(148) "F" state, "C" state: "000101111" data
(149) "F" state, "D" state: "000100111" data
(150) "F" state, "E" state: "000000111" data
(151) "F" state, "F" state: "000001111" data
(152) "F" state, "G" state: "000001101" data
(153) "F" state, "H" state: "001001101" data
(154) "F" state, "I" state: "001001111" data
(155) "F" state, "J" state: "011001111" data
(156) "F" state, "K" state: "011101111" data
(157) "F" state, "L" state: "011100111" data
(158) "F" state, "M" state: "011000111" data
(159) "F" state, "N" state: "001000111" data
(160) "F" state, "O" state: "001000101" data
(161) "F" state, "P" state: "011000101" data
(162) "F" state, "Q" state: "011001101" data
(163) "F" state, "R" state: "011101101" data
(164) "F" state, "S" state: "001101101" data
(165) "F" state, "T" state: "001101111" data (166) "F" state, "U" state: "001100111" data
(167) "F" state, "V" state: "001100101" data
(168) "F" state, "W" state: "011100101" data
(169) "G" state, "Z" state: "000000100" data
(170) "G" state, "A" state: "000100100" data
(171) "G" state, "B" state: "000101100" data
(172) "G" state, "C" state: "000101110" data
(173) "G" state, "D" state: "000100110" data
(174) "G" state, "E" state: "000000110" data
(175) "G" state, "F" state: "000001110" data
(176) "G" state, "G" state: "000001100" data
(177) "G" state, "H" state: "001001100" data
(178) "G" state, "I" state: "001001110" data
(179) "G" state, "J" state: "011001110" data
(180) "G" state, "K" state: "011101110" data
(181) "G" state, "L" state: "011100110" data
(182) "G" state, "M" state: "011000110" data
(183) "G" state, "N" state: "001000110" data
(184) "G" state, "O" state: "001000100" data
(185) "G" state, "P" state: "011000100" data
(186) "G" state, "Q" state: "011001100" data
(187) "G" state, "R" state: "011101100" data
(188) "G" state, "S" state: "001101100" data
(189) "G" state, "T" state: "001101110" data
(190) "G" state, "U" state: "001100110" data
(191) "G" state, "V" state: "001100100" data
(192) "G" state, "W" state: "011100100" data
(193) "H" state, "Z" state: "010000100" data
(194) "H" state, "A" state: "010100100" data
(195) "H" state, "B" state: "010101100" data
(196) "H" state, "C" state: "010101110" data
(197) "H" state, "D" state: "010100110" data
(198) "H" state, "E" state: "010000110" data
(199) "H" state, "F" state: "010001110" data
(200) "H" state, "G" state: "010001100" data
(201) "H" state, "H" state: "111001100" data
(202) "H" state, "I" state: "111001110" data
(203) "H" state, "J" state: "101001110" data
(204) "H" state, "K" state: "101101110" data
(205) "H" state, "L" state: "101100110" data
(206) "H" state, "M" state: "101000110" data
(207) "H" state, "N" state: "111000110" data
(208) "H" state, "O" state: "111000100" data
(209) "H" state, "P" state: "101000100" data
(210) "H" state, "Q" state: "101001100" data
(211) "H" state, "R" state: "101101100" data
(212) "H" state, "S" state: "111101100" data
(213) "H" state, "T" state: "111101110" data
(214) "H" state, "U" state: "111100110" data
(215) "H" state, "V" state: "111100100" data
(216) "H" state, "W" state: "101100100" data
(217) "I" state, "Z" state: "010000101" data
(218) "I" state, "A" state: "010100101" data
(219) "I" state, "B" state: "010101101" data
(220) "I" state, "C" state: "010101111" data
(221) "I" state, "D" state: "010100111" data
(222) "I" state, "E" state: "010000111" data
(223) "I" state, "F" state: "010001111" data
(224) "I" state, "G" state: "010001101" data
(225) "I" state, "H" state: "111001101" data
(226) "I" state, "I" state: "111001111" data
(227) "I" state, "J" state: "101001111" data
(228) "I" state, "K" state: "101101111" data
(229) "I" state, "L" state: "101100111" data
(230) "I" state, "M" state: "101000111" data
(231) "I" state, "N" state: "111000111" data
(232) "I" state, "O" state: "111000101" data (233) "I" state, "P" state: "101000101" data
(234) "I" state, "Q" state: "101001101" data
(235) "I" state, "R" state: "101101101" data
(236) "I" state, "S" state: "111101101" data
(237) "I" state, "T" state: "111101111" data
(238) "I" state, "U" state: "111100111" data
(239) "I" state, "V" state: "111100101" data
(240) "I" state, "W" state: "101100101" data
(241) "J" state, "Z" state: "011000101" data
(242) "J" state, "A" state: "011100101" data
(243) "J" state, "B" state: "011101101" data
(244) "J" state, "C" state: "011101111" data
(245) "J" state, "D" state: "011100111" data
(246) "J" state, "E" state: "011000111" data
(247) "J" state, "F" state: "011001111" data
(248) "J" state, "G" state: "011001101" data
(249) "J" state, "H" state: "110001101" data
(250) "J" state, "I" state: "110001111" data
(251) "J" state, "J" state: "100001111" data
(252) "J" state, "K" state: "100101111" data
(253) "J" state, "L" state: "100100111" data
(254) "J" state, "M" state: "100000111" data
(255) "J" state, "N" state: "110000111" data
(256) "J" state, "O" state: "110000101" data
(257) "J" state, "P" state: "100000101" data
(258) "J" state, "Q" state: "100001101" data
(259) "J" state, "R" state: "100101101" data
(260) "J" state, "S" state: "110101101" data
(261) "J" state, "T" state: "110101111" data
(262) "J" state, "U" state: "110100111" data
(263) "J" state, "V" state: "110100101" data
(264) "J" state, "W" state: "100100101" data
(265) "K" state, "Z" state: "011010101" data
(266) "K" state, "A" state: "011110101" data
(267) "K" state, "B" state: "011111101" data
(268) "K" state, "C" state: "011111111" data
(269) "K" state, "D" state: "011110111" data
(270) "K" state, "E" state: "011010111" data
(271) "K" state, "F" state: "011011111" data
(272) "K" state, "G" state: "011011101" data
(273) "K" state, "H" state: "110011101" data
(274) "K" state, "I" state: "110011111" data
(275) "K" state, "J" state: "100011111" data
(276) "K" state, "K" state: "100111111" data
(277) "K" state, "L" state: "100110111" data
(278) "K" state, "M" state: "100010111" data
(279) "K" state, "N" state: "110010111" data
(280) "K" state, "O" state: "110010101" data
(281) "K" state, "P" state: "100010101" data
(282) "K" state, "Q" state: "100011101" data
(283) "K" state, "R" state: "100111101" data
(284) "K" state, "S" state: "110111101" data
(285) "K" state, "T" state: "110111111" data
(286) "K" state, "U" state: "110110111" data
(287) "K" state, "V" state: "110110101" data
(288) "K" state, "W" state: "100110101" data
(289) "L" state, "Z" state: "011010001" data
(290) "L" state, "A" state: "011110001" data
(291) "L" state, "B" state: "011111001" data
(292) "L" state, "C" state: "011111011" data
(293) "L" state, "D" state: "011110011" data
(294) "L" state, "E" state: "011010011" data
(295) "L" state, "F" state: "011011011" data
(296) "L" state, "G" state: "011011001" data
(297) "L" state, "H" state: "110011001" data
(298) "L" state, "I" state: "110011011" data
(299) "L" state, "J" state: "100011011" data (300) "L" state, "K" state: "100111011" data
(301) "L" state, "L" state: "100110011" data
(302) "L" state, "M" state: "100010011" data
(303) "L" state, "N" state: "110010011" data
(304) "L" state, "O" state: "110010001" data
(305) "L" state, "P" state: "100010001" data
(306) "L" state, "Q" state: "100011001" data
(307) "L" state, "R" state: "100111001" data
(308) "L" state, "S" state: "110111001" data
(309) "L" state, "T" state: "110111011" data
(310) "L" state, "U" state: "110110011" data
(311) "L" state, "V" state: "110110001" data
(312) "L" state, "W" state: "100110001" data
(313) "M" state, "Z" state: "011000001" data
(314) "M" state, "A" state: "011100001" data
(315) "M" state, "B" state: "011101001" data
(316) "M" state, "C" state: "011101011" data
(317) "M" state, "D" state: "011100011" data
(318) "M" state, "E" state: "011000011" data
(319) "M" state, "F" state: "011001011" data
(320) "M" state, "G" state: "011001001" data
(321) "M" state, "H" state: "110001001" data
(322) "M" state, "I" state: "110001011" data
(323) "M" state, "J" state: "100001011" data
(324) "M" state, "K" state: "100101011" data
(325) "M" state, "L" state: "100100011" data
(326) "M" state, "M" state: "100000011" data
(327) "M" state, "N" state: "110000011" data
(328) "M" state, "O" state: "110000001" data
(329) "M" state, "P" state: "100000001" data
(330) "M" state, "Q" state: "100001001" data
(331) "M" state, "R" state: "100101001" data
(332) "M" state, "S" state: "110101001" data
(333) "M" state, "T" state: "110101011" data
(334) "M" state, "U" state: "110100011" data
(335) "M" state, "V" state: "110100001" data
(336) "M" state, "W" state: "100100001" data
(337) "N" state, "Z" state: "010000001" data
(338) "N" state, "A" state: "010100001" data
(339) "N" state, "B" state: "010101001" data
(340) "N" state, "C" state: "010101011" data
(341) "N" state, "D" state: "010100011" data
(342) "N" state, "E" state: "010000011" data
(343) "N" state, "F" state: "010001011" data
(344) "N" state, "G" state: "010001001" data
(345) "N" state, "H" state: "111001001" data
(346) "N" state, "I" state: "111001011" data
(347) "N" state, "J" state: "101001011" data
(348) "N" state, "K" state: "101101011" data
(349) "N" state, "L" state: "101100011" data
(350) "N" state, "M" state: "101000011" data
(351) "N" state, "N" state: "111000011" data
(352) "N" state, "O" state: "111000001" data
(353) "N" state, "P" state: "101000001" data
(354) "N" state, "Q" state: "101001001" data
(355) "N" state, "R" state: "101101001" data
(356) "N" state, "S" state: "111101001" data
(357) "N" state, "T" state: "111101011" data
(358) "N" state, "U" state: "111100011" data
(359) "N" state, "V" state: "111100001" data
(360) "N" state, "W" state: "101100001" data
(361) "O" state, "Z" state: "010000000" data
(362) "O" state, "A" state: "010100000" data
(363) "O" state, "B" state: "010101000" data
(364) "O" state, "C" state: "010101010" data
(365) "O" state, "D" state: "010100010" data
(366) "O" state, "E" state: "010000010" data (367) "O" state, "F" state: "010001010" data
(368) "O" state, "G" state: "010001000" data
(369) "O" state, "H" state: "111001000" data
(370) "O" state, "I" state: "111001010" data
(371) "O" state, "J" state: "101001010" data
(372) "O" state, "K" state: "101101010" data
(373) "O" state, "L" state: "101100010" data
(374) "O" state, "M" state: "101000010" data
(375) "O" state, "N" state: "111000010" data
(376) "O" state, "O" state: "111000000" data
(377) "O" state, "P" state: "101000000" data
(378) "O" state, "Q" state: "101001000" data
(379) "O" state, "R" state: "101101000" data
(380) "O" state, "S" state: "111101000" data
(381) "O" state, "T" state: "111101010" data
(382) "O" state, "U" state: "111100010" data
(383) "O" state, "V" state: "111100000" data
(384) "O" state, "W" state: "101100000" data
(385) "P" state, "Z" state: "011000000" data
(386) "P" state, "A" state: "011100000" data
(387) "P" state, "B" state: "011101000" data
(388) "P" state, "C" state: "011101010" data
(389) "P" state, "D" state: "011100010" data
(390) "P" state, "E" state: "011000010" data
(391) "P" state, "F" state: "011001010" data
(392) "P" state, "G" state: "011001000" data
(393) "P" state, "H" state: "110001000" data
(394) "P" state, "I" state: "110001000" data
(395) "P" state, "J" state: "100001010" data
(396) "P" state, "K" state: "100101010" data
(397) "P" state, "L" state: "100100010" data
(398) "P" state, "M" state: "100000010" data
(399) "P" state, "N" state: "110000010" data
(400) "P" state, "O" state: "110000000" data
(401) "P" state, "P" state: "100000000" data
(402) "P" state, "Q" state: "100001000" data
(403) "P" state, "R" state: "100101000" data
(404) "P" state, "S" state: "110101000" data
(405) "P" state, "T" state: "110101010" data
(406) "P" state, "U" state: "110100010" data
(407) "P" state, "V" state: "110100000" data
(408) "P" state, "W" state: "100100000" data
(409) "Q" state, "Z" state: "011000100" data
(410) "Q" state, "A" state: "011100100" data
(411) "Q" state, "B" state: "011101100" data
(412) "Q" state, "C" state: "011101110" data
(413) "Q" state, "D" state: "011100110" data
(414) "Q" state, "E" state: "011000110" data
(415) "Q" state, "F" state: "011001110" data
(416) "Q" state, "G" state: "011001100" data
(417) "Q" state, "H" state: "110001100" data
(418) "Q" state, "I" state: "110001110" data
(419) "Q" state, "J" state: "100001110" data
(420) "Q" state, "K" state: "100101110" data
(421) "Q" state, "L" state: "100100110" data
(422) "Q" state, "M" state: "100000110" data
(423) "Q" state, "N" state: "110000110" data
(424) "Q" state, "O" state: "110000100" data
(425) "Q" state, "P" state: "100000100" data
(426) "Q" state, "Q" state: "100001100" data
(427) "Q" state, "R" state: "100101100" data
(428) "Q" state, "S" state: "110101100" data
(429) "Q" state, "T" state: "110101110" data
(430) "Q" state, "U" state: "110100110" data
(431) "Q" state, "V" state: "110100100" data
(432) "Q" state, "W" state: "100100100" data
(433) "R" state, "Z" state: "011010100" data (434) "R" state, "A" state: "011110100" data
(435) "R" state, "B" state: "011111100" data
(436) "R" state, "C" state: "011110110" data
(437) "R" state, "D" state: "011110110" data
(438) "R" state, "E" state: "011010110" data
(439) "R" state, "F" state: "011011110" data
(440) "R" state, "G" state: "011011100" data
(441) "R" state, "H" state: "110011100" data
(442) "R" state, "I" state: "110011110" data
(443) "R" state, "J" state: "100011110" data
(444) "R" state, "K" state: "100111110" data
(445) "R" state, "L" state: "100110110" data
(446) "R" state, "M" state: "100010110" data
(447) "R" state, "N" state: "110010110" data
(448) "R" state, "O" state: "110010100" data
(449) "R" state, "P" state: "100010100" data
(450) "R" state, "Q" state: "100011100" data
(451) "R" state, "R" state: "100111100" data
(452) "R" state, "S" state: "110111100" data
(453) "R" state, "T" state: "110111110" data
(454) "R" state, "U" state: "110110110" data
(455) "R" state, "V" state: "110110100" data
(456) "R" state, "W" state: "100110100" data
(457) "S" state, "Z" state: "010010100" data
(458) "S" state, "A" state: "010110100" data
(459) "S" state, "B" state: "010111100" data
(460) "S" state, "C" state: "010111110" data
(461) "S" state, "D" state: "010110110" data
(462) "S" state, "E" state: "010010110" data
(463) "S" state, "F" state: "010011110" data
(464) "S" state, "G" state: "010011100" data
(465) "S" state, "H" state: "111011100" data
(466) "S" state, "I" state: "111011110" data
(467) "S" state, "J" state: "101011110" data
(468) "S" state, "K" state: "101111110" data
(469) "S" state, "L" state: "101110110" data
(470) "S" state, "M" state: "101010110" data
(471) "S" state, "N" state: "111010110" data
(472) "S" state, "O" state: "111010100" data
(473) "S" state, "P" state: "101010100" data
(474) "S" state, "Q" state: "101011100" data
(475) "S" state, "R" state: "101111100" data
(476) "S" state, "S" state: "111111100" data
(477) "S" state, "T" state: "111111110" data
(478) "S" state, "U" state: "111110110" data
(479) "S" state, "V" state: "111110100" data
(480) "S" state, "W" state: "101110100" data
(481) "T" state, "Z" state: "010010101" data
(482) "T" state, "A" state: "010110101" data
(483) "T" state, "B" state: "010111101" data
(484) "T" state, "C" state: "010111111" data
(485) "T" state, "D" state: "010110111" data
(486) "T" state, "E" state: "010010111" data
(487) "T" state, "F" state: "010011111" data
(488) "T" state, "G" state: "010011101" data
(489) "T" state, "H" state: "111011101" data
(490) "T" state, "I" state: "111011111" data
(491) "T" state, "J" state: "101011111" data
(492) "T" state, "K" state: "101111111" data
(493) "T" state, "L" state: "101110111" data
(494) "T" state, "M" state: "101010111" data
(495) "T" state, "N" state: "111010111" data
(496) "T" state, "O" state: "111010101" data
(497) "T" state, "P" state: "101010101" data
(498) "T" state, "Q" state: "101011101" data
(499) "T" state, "R" state: "101111101" data
(500) "T" state, "S" state: "111111101" data (501) "T" state, "T" state: "111111111" data
(502) "T" state, "U" state: "111110111" data
(503) "T" state, "V" state: "111110101" data
(504) "T" state, "W" state: "101110101" data
(505) "U" state, "Z" state: "010010001" data
(506) "U" state, "A" state: "010110001" data
(507) "U" state, "B" state: "010111001" data
(508) "U" state, "C" state: "010111011" data
(509) "U" state, "D" state: "010110011" data
(510) "U" state, "E" state: "010010011" data
(511) "U" state, "F" state: "010011011" data
(512) "U" state, "G" state: "010011001" data
(513) "U" state, "H" state: "111011001" data
(514) "U" state, "I" state: "111011011" data
(515) "U" state, "J" state: "101011011" data
(516) "U" state, "K" state: "101111011" data
(517) "U" state, "L" state: "101110011" data
(518) "U" state, "M" state: "101010011" data
(519) "U" state, "N" state: "111010011" data
(520) "U" state, "O" state: "111010001" data
(521) "U" state, "P" state: "101010001" data
(522) "U" state, "Q" state: "101011001" data
(523) "U" state, "R" state: "101111001" data
(524) "U" state, "S" state: "111111001" data
(525) "U" state, "T" state: "111111011" data
(526) "U" state, "U" state: "111110011" data
(527) "U" state, "V" state: "111110001" data
(528) "U" state, "W" state: "101110001" data
(529) "V" state, "Z" state: "010010000" data
(530) "V" state, "A" state: "010110000" data
(531) "V" state, "B" state: "010111000" data
(532) "V" state, "C" state: "010111010" data
(533) "V" state, "D" state: "010110010" data
(534) "V" state, "E" state: "010010010" data
(535) "V" state, "F" state: "010011010" data
(536) "V" state, "G" state: "010011000" data
(537) "V" state, "H" state: "111011000" data
(538) "V" state, "I" state: "111011010" data
(539) "V" state, "J" state: "101011010" data
(540) "V" state, "K" state: "101111010" data
(541) "V" state, "L" state: "101110010" data
(542) "V" state, "M" state: "101010010" data
(543) "V" state, "N" state: "111010010" data
(544) "V" state, "O" state: "111010000" data
(545) "V" state, "P" state: "101010000" data
(546) "V" state, "Q" state: "101011000" data
(547) "V" state, "R" state: "101111000" data
(548) "V" state, "S" state: "111111000" data
(549) "V" state, "T" state: "111111010" data
(550) "V" state, "U" state: "111110010" data
(551) "V" state, "V" state: "111110000" data
(552) "V" state, "W" state: "101110000" data
(553) "W" state, "Z" state: "011010000" data
(554) "W" state, "A" state: "011110000" data
(555) "W" state, "B" state: "011111000" data
(556) "W" state, "C" state: "011111010" data
(557) "W" state, "D" state: "011110010" data
(558) "W" state, "E" state: "011010010" data
(559) "W" state, "F" state: "011011010" data
(560) "W" state, "G" state: "011011000" data
(561) "W" state, "H" state: "110011000" data
(562) "W" state, "I" state: "110011010" data
(563) "W" state, "J" state: "100011010" data
(564) "W" state, "K" state: "100111010" data
(565) "W" state, "L" state: "100110010" data
(566) "W" state, "M" state: "100010010" data
(567) "W" state, "N" state: "110010010" data (568) "W" state, "O" state: "110010000" data
(569) "W" state, "P" state: "100010000" data
(570) "W" state, "Q" state: "100011000" data
(571) "W" state, "R" state: "100111000" data
(572) "W" state, "S" state: "110111000" data
(573) "W" state, "T" state: "110111010" data
(574) "W" state, "U" state: "110110010" data
(575) "W" state, "V" state: "110110000" data
(576) "W" state, "W" state: "100110000" data FIG. 178 shows read voltages that are set for the data allocation shown in FIGS. 162 through 177, and definitions of read data to be applied to the read results of the pages. Hereinafter, the read operation performed for the ninth-page will be referred to as "ninth-page read".

As shown in FIG. 178, the first page data is confirmed as a result of reading performed to plane PL1 with the use of the read voltage HR.

The second-page data is confirmed as a result of reading performed to plane PL1 with the use of the read voltage HR, and as a result of reading performed to plane PL2 with the use of the read voltages JR, NR, PR, SR, and WR.

The third-page data is confirmed as a result of reading performed to plane PL1 with the use of the read voltages JR, NR, PR, SR, and WR, and as a result of reading performed to plane PL2 with the use of the read voltage HR.

The fourth-page data is confirmed as a result of reading performed to plane PL2 with the use of the read voltages AR, ER, KR, MR, and RR.

The fifth-page data is confirmed as a result of reading performed to plane PL1 with the use of the read voltages AR, ER, KR, MR, and RR.

The sixth-page data is confirmed as a result of reading performed to plane PL2 with the use of the read voltages BR, DR, FR, LR, QR, and UR.

The seventh-page data is confirmed as a result of reading performed to plane PL1 with the use of the read voltages BR, DR, FR, LR, QR, and UR.

The eighth-page data is confirmed as a result of reading performed to plane PL2 with the use of the read voltages CR, GR, IR, OR, TR, and VR.

The ninth-page data is confirmed as a result of reading performed to plane PL1 with the use of the read voltages CR, GR, IR, OR, TR, and VR.

The read data based on results of a read operation in each of plane PL1 and plane PL2 is defined as follows:

(Example) Read operation: (result of reading plane PL1, result of reading plane PL2, read data)×4 types
First-page read: (0, 0, 0), (1, 0, 0), (0, 1, 0), (1, 1, 1)
Second-page read: (0, 0, 0), (1, 0, 1), (0, 1, 1), (1, 1, 0)
Third-page read: (0, 0, 0), (1, 0, 1), (0, 1, 1), (1, 1, 0)
Fourth-page read: (0, 0, 0), (1, 0, 0), (0, 1, 1), (1, 1, 1)
Fifth-page read: (0, 0, 0), (1, 0, 1), (0, 1, 0), (1, 1, 1)
Sixth-page read: (0, 0, 0), (1, 0, 0), (0, 1, 1), (1, 1, 1)
Seventh-page read: (0, 0, 0), (1, 0, 1), (0, 1, 0), (1, 1, 1)
Eighth-page read: (0, 0, 0), (1, 0, 0), (0, 1, 1), (1, 1, 1)
Ninth-page read: (0, 0, 0), (1, 0, 1), (0, 1, 0), (1, 1, 1)

Since the rest of the configuration in the semiconductor memory 10 according to the 17th embodiment is the same as those in the semiconductor memory 10 according to the first embodiment for example, detailed descriptions of the rest of the configurations is omitted.

[19-2] Operation

[19-2-1] Write Operation
The write operation of the semiconductor memory 10 according to the 17th embodiment will be described below.

In the write operation according to the 17th embodiment, corresponding write data is transferred to each of sense amplifier units SAUa and SAUb, based on the data definitions shown in FIG. 178. Specifically, in a write operation, coding conversion is performed to write data received by the semiconductor memory 10. The write data based on the converted coding is then stored in sense amplifying units SAUa and SAUb.

FIG. 179 shows an example of a data allocation after the coding conversion in the write operation according to the 17th embodiment. As shown in FIG. 179, in the write operation according to the 17th embodiment, a 1-5-5-6-6 coding is used wherein corresponding 5-bit data is allocated to each of 24 threshold distributions.

"ER" state: "11111 (lowest bit/lower bit/middle bit/upper bit/uppermost bit)" data
"A" state: "11011" data
"B" state: "11001" data
"C" state: "11000" data
"D" state: "11010" data
"E" state: "11110" data
"F" state: "11100" data
"G" state: "11101" data
"H" state: "01101" data
"I" state: "01100" data
"J" state: "00100" data
"K" state: "00000" data
"L" state: "00010" data
"M" state: "00110" data
"N" state: "01110" data
"O" state: "01111" data
"P" state: "00111" data
"Q" state: "00101" data
"R" state: "00001" data
"S" state: "01001" data
"T" state: "01000" data
"U" state: "01010" data
"V" state: "01011" data
"W" state: "00011" data In the present example, the lowest-page data is confirmed by a read result obtained by using the read voltage HR. The lower-page data is confirmed by a read result by using the read voltages JR, NR, PR, SR, and WR. The middle-page data is confirmed by a read result obtained by using the read voltages AR, ER, KR, MR, and RR. The upper-page data is confirmed by a read result obtained by using the read voltages BR, DR, FR, LR, QR, and UR. The uppermost-page data is confirmed by a read result obtained by using the read voltages CR, GR, IR, OR, TR, and VR. Hereinafter, in the coding after the conversion, the lowest-page data stored in each of sense amplifier units SAUa and SAUb will be referred to as lower-page data pB1 and pB2, respectively.

For example, according to the data allocation shown in FIGS. 162 through 177, if "011110000" data is stored, the threshold voltage of memory cell transistor MTa is included in the "A" state, and the threshold voltage of memory cell transistor MTb is included in the "W" state. In such a case, when "011110000" data is input into the semiconductor memory 10 in the write operation, "11011" data corresponding to the "A" state is stored in a latch circuit of sense amplifier unit SAUa, and "00011" data corresponding to the "W" state is stored in a latch circuit of sense amplifier unit SAUb.

As for the other data, the data corresponding to the converted coding is respectively stored in sense amplifier units SAUa and SAUb, in a manner similar to the foregoing data storage. The computation processing for the coding conversion in the write operation may be altered based on a combination of the threshold voltages of memory cell transistors MTa and MTb, which are supposed to be unused.

(First Example of Write Operation)

In the first example of the write operation, data transfer between sense amplifier units SAUa and SAUb is impossible. The semiconductor memory 10 in the first example of the 17th embodiment has a configuration same as that of the first embodiment, for example, and sense amplifier unit SAUa corresponds to a sense amplifier unit SAU in plane PL0, and sense amplifier unit SAUb corresponds to a sense amplifier unit SAU in plane PL1.

FIG. 180 is a flowchart showing the operation performed by the sequencer 14 in the first example of the write operation in the semiconductor memory device 10 according to the 17th embodiment. In the following, an example of the operation performed by the sequencer 14 when six latch circuits (latch circuits SDL, ADL, BDL, CDL, DDL, and XDL) are provided will be described, with reference to FIG. 180.

Upon receipt of the first-page data by the semiconductor memory 10, the sequencer 14 causes the latch circuit XDL in each of planes PL0 and PL1 (sense amplifier unit SAUa and SAUb) to store the received first-page data (FIG. 180, (1)).

Next, the sequencer 14 causes the latch circuit DDL to store the data stored in the latch circuit XDL in plane PL0, and causes the latch circuit DDL in PL1 to store the data stored in the latch circuit XDL (FIG. 180, (2)).

Next, upon receipt of the second-page data by the semiconductor memory 10, the sequencer 14 causes the latch circuit XDL in each of planes PL0 and PL1 to store the received second-page data (FIG. 180, (3)).

Next, the sequencer 14 causes the latch circuit CDL to store the data stored in the latch circuit XDL in plane PL0, and causes the latch circuit CDL in PL1 to store the data stored in the latch circuit XDL (FIG. 180, (4)).

Next, upon receipt of the third-page data by the semiconductor memory 10, the sequencer 14 causes each latch circuit XDL in planes PL0 and PL1 to store the received third-page data (FIG. 180, (5)).

Next, the sequencer 14 causes, in plane PL0, the latch circuit BDL to store the data obtained by inverting the data stored in the latch circuit XDL, and causes, in plane PL1, the latch circuit ADL to store the data "XDL|DDL", which is obtained by an OR operation performed on the data stored in the latch circuit XDL and the data stored in the latch circuit DDL (FIG. 180, (6)). At this time, the data stored in the latch circuit ADL within plane PL1 corresponds to the lowest-page data pB2.

Next, the sequencer 14 causes, in plane PL0, the latch circuit BDL to store data "BDL&DDL", which is obtained by performing an AND operation on the data stored in the latch circuit BDL and the data stored in the latch circuit DDL, and causes, in plane PL1, the latch circuit BDL to store data "XDL&CDL", which is obtained by performing an AND operation on the data stored in the latch circuit XDL and the data stored in the latch circuit CDL. Subsequently, the sequencer 14 causes, in plane PL1, the latch circuit BDL to store data "BDL|DDL", which is obtained by performing an OR operation on the data stored in the latch circuit BDL and the data stored in the latch circuit DDL (FIG. 180, (7)). At this time, the data stored in the latch circuit BDL within plane PL0 corresponds to the lower-page data pL1.

Next, the sequencer 14 causes, in plane PL0, the latch circuit ADL to store the data "CDL&~XDL", which is obtained by an AND operation on the data stored in the latch circuit CDL and the data obtained by inverting the data stored in the latch circuit XDL, and causes, in plane PL1, the latch circuit CDL to store the data "(CDL&DDL)", which is obtained by an AND operation on the data stored in the latch circuit CDL and the data stored in the latch circuit DDL (FIG. 180, (8)).

Next, the sequencer 14 causes, in plane PL0, the latch circuit ADL to store the data "ADL|DDL", which is obtained by an OR operation performed to the data stored in the lath circuit ADL and the data stored in the latch circuit DDL, and causes, in plane PL1, the latch circuit BDL to store the data "BDL&CDL", which is obtained by an AND operation performed to the data stored in the latch circuits BDL and the data stored in the latch circuit CDL (FIG. 180, (9)). At this time, the data stored in the latch circuit ADL within plane PL0 corresponds to the lowest-page data pB1, and the data stored in the latch circuit BDL within plane PL1 corresponds to the lower-page data pL2.

Next, upon receipt of the fourth-page data by the semiconductor memory 10, the sequencer 14 causes the latch circuit XDL in each of planes PL0 and PL1 to store the received fourth-page data (FIG. 180, (10)). At this time, the data stored in the latch circuit XDL within plane PL1 corresponds to the middle-page data pM2.

Next, the sequencer 14 causes, in plane PL1, the latch circuit CDL to store the data stored in the latch circuit XDL, namely the middle-page data pM2 (FIG. 180, (11)).

Next, upon receipt of the fifth-page data by the semiconductor memory 10, the sequencer 14 causes each latch circuit XDL in planes PL0 and PL1 to store the received fifth-page data (FIG. 180, (12)). At this time, the data stored in the latch circuit XDL within plane PL0 corresponds to middle-page data pM1.

Next, the sequencer 14 causes, in plane PL0, the latch circuit CDL to store the data stored in the latch circuit XDL, namely the middle-page data pM1 (FIG. 180, (13)).

Next, upon receipt of the sixth-page data by the semiconductor memory 10, the sequencer 14 causes each latch circuit XDL in planes PL0 and PL1 to store the received sixth-page data (FIG. 180, (14)). At this time, the data stored in the latch circuit XDL within plane PL1 corresponds to upper-page data pU2.

Next, the sequencer 14 causes, in plane PL1, the latch circuit DDL to store the data stored in the latch circuit XDL, namely the upper-page data pU2 (FIG. 180, (15)).

Next, upon receipt of the seventh-page data by the semiconductor memory 10, the sequencer 14 causes each latch circuit XDL in planes PL0 and PL1 to store the received seventh-page data (FIG. 180, (16)). At this time, the data stored in the latch circuit XDL within plane PL0 corresponds to the upper-page data pU1.

Next, the sequencer 14 causes, in plane PL0, the latch circuit DDL to store the data stored in the latch circuit XDL, namely the upper-page data pU1 (FIG. 180, (17)).

Next, upon receipt of the eighth-page data by the semiconductor memory 10, the sequencer 14 causes each latch circuit XDL in planes PL0 and PL1 to store the received eighth-page data (FIG. 180, (18)). At this time, the data stored in the latch circuit XDL within plane PL1 corresponds to uppermost-page data pT2.

Next, the sequencer 14 causes, in plane PL1, the latch circuit SDL to store the data stored in the latch circuit XDL, namely the uppermost-page data pT2 (FIG. 180, (19)).

Next, upon receipt of the ninth-page data by the semiconductor memory 10, the sequencer 14 causes each latch circuit XDL in planes PL0 and PL1 to store the received ninth-page data (FIG. 180, (20)). At this time, the data stored in the latch circuit XDL within plane PL0 corresponds to uppermost-page data pT1.

Lastly, the sequencer 14 causes, in plane PL1, the latch circuit XDL to store the data stored in the latch circuit SDL, namely the uppermost-page data pT2 (FIG. 180, (15)).

If calculation processing is performed as described above, the sense amplifier unit SAUa is in a state of retaining the lowest-page data pB1, the lower-page data pL1, the middle-page data pM1, the upper-page data pU1, and the uppermost-page data pT1, and the sense amplifier unit SAUb is in a state of retaining the lowest-page data pB2, the lower-page data pL2, the middle-page data pM2, the upper-page data pU2, and the uppermost-page data pT2. Thereafter, the semiconductor memory 10 performs a write operation for 5-bit data based on the data stored in each of sense amplifier units SAUa and SAUb, and the converted coding.

(Second Example of Write Operation)

The second example of the write operation corresponds to an operation in a case where the data transfer between sense amplifier units SAUa and SAUb is possible, and two latch circuits XDL are coupled to the input/output circuit 19 within a sense amplifier set SAS. The semiconductor memory 10 in the second example of the 17th embodiment has the configuration similar to, for example, that of the semiconductor memory 10 in the second example of the 11th embodiment described with reference to FIG. 157, and each of sense amplifier units SAUa and SAUb includes six latch circuits.

In the following, an example of the operation performed by the sequencer 14 when six latch circuits are provided in each of sense amplifier units SAUa and SAUb will be described, with reference to FIG. 181. FIG. 181 is a flowchart showing the operation performed by the sequencer 14 in the second example of the write operation in the semiconductor memory device 10 according to the 17th embodiment.

Upon receipt of the first-page data by the semiconductor memory 10, the sequencer 14 causes the latch circuits XDL1 and XDL2 to store the received first-page data. Subsequently, the sequencer 14 causes the latch circuit ADL1 to store the data stored in the latch circuit XDL1 (FIG. 181 (1)).

Next, upon receipt of the second-page data by the semiconductor memory 10, the sequencer 14 causes each of the latch circuits XDL1 and XDL2 to store the received second-page data. Subsequently, the sequencer 14 causes the latch circuit BDL2 to store the data stored in the latch circuit XDL2 (FIG. 181, (2)).

Next, upon receipt of the third-page data by the semiconductor memory 10, the sequencer 14 causes each of the latch circuits XDL1 and XDL2 to store the received third-page data. Subsequently, the sequencer 14 causes the latch circuit ADL2 to store the data stored in the latch circuit XDL2 (FIG. 181, (3)).

Next, upon receipt of the fourth-page data by the semiconductor memory 10, the sequencer 14 causes each of the latch circuits XDL1 and XDL2 to store the received fourth-page data. Subsequently, the sequencer 14 causes the latch circuit CDL2 to store the data stored in the latch circuit XDL2 (FIG. 181, (4)). At this time, the data stored in the latch circuit CDL2 corresponds to the middle-page data pM2.

Next, upon receipt of the fifth-page data by the semiconductor memory 10, the sequencer 14 causes each of the latch circuits XDL1 and XDL2 to store the received fifth-page data. Subsequently, the sequencer 14 causes the latch circuit CDL1 to store the data stored in the latch circuit XDL1 (FIG.

181 (5)). At this time, the data stored in the latch circuit CDL1 corresponds to the middle-page data pM1.

Next, upon receipt of the sixth-page data by the semiconductor memory 10, the sequencer 14 causes each of the latch circuits XDL1 and XDL2 to store the received sixth-page data. Subsequently, the sequencer 14 causes the latch circuit DDL2 to store the data stored in the latch circuit XDL2 (FIG. 181, (6)). At this time, the data stored in the latch circuit DDL2 corresponds to the upper-page data pU2.

Next, upon receipt of the seventh-page data by the semiconductor memory 10, the sequencer 14 causes each of the latch circuits XDL1 and XDL2 to store the received seventh-page data. Subsequently, the sequencer 14 causes the latch circuit DDL1 to store the data stored in the latch circuit XDL1 (FIG. 181, (7)). At this time, the data stored in the latch circuit DDL1 corresponds to the upper-page data pU1.

Next, upon receipt of the eighth-page data by the semiconductor memory 10, the sequencer 14 causes each of the latch circuits XDL1 and XDL2 to store the received eighth-page data. Subsequently, the sequencer 14 causes the latch circuit SDL2 to store the data stored in the latch circuit XDL2 (FIG. 181, (8)). At this time, the data stored in the latch circuit SDL2 corresponds to the upper-page data pT2.

Next, upon receipt of the ninth-page data by the semiconductor memory 10, the sequencer 14 causes each of the latch circuits XDL1 and XDL2 to store the received ninth-page data. Subsequently, the sequencer 14 causes the latch circuit XDL2 to store the data stored in the latch circuit SDL2, namely the uppermost-page data pT2 (FIG. 181, (9)). At this time, the data stored in the latch circuit XDL1 corresponds to the upper-page data pT1.

Next, the sequencer 14 causes the latch circuit BDL1 to store the data stored in the latch circuit ADL2. Subsequently, the sequencer 14 causes the latch circuit BDL1 to store data "BDL1&ADL1", which is obtained by performing an AND operation on the data stored in the latch circuit BDL1 and the data stored in the latch circuit ADL1 (FIG. 181, (10)). At this time, the data stored in the latch circuit BDL1 corresponds to the lower-page data pL1.

Next, the sequencer 14 causes the latch circuit SDL1 to store the data stored in the latch circuit ADL2. Subsequently, the sequencer 14 causes the latch circuit SDL1 to store data "SDL1&BDL2", which is obtained by performing an AND operation on the data stored in the latch circuit SDL1 and the data stored in the latch circuit BDL2 (FIG. 181, (11)).

Next, the sequencer 14 causes the latch circuit SDL2 to store data "ADL2&BDL2", which is obtained by performing an AND operation on the data stored in the latch circuit ADL2 and the data stored in the latch circuit BDL2. Subsequently, the sequencer 14 causes the latch circuit SDL2 to store data "ADL1|SDL2", which is obtained by performing an OR operation on the data stored in the latch circuit ADL1 and the data stored in the latch circuit SDL2 (FIG. 181, (12)).

Next, the sequencer 14 causes the latch circuit ADL2 to store data "ADL2|ADL1", which is obtained by performing an OR operation on the data stored in the latch circuit ADL2 and the data stored in the latch circuit ADL1 (FIG. 181, (13)). At this time, the data stored in the latch circuit ADL2 corresponds to the uppermost-page data pB2.

The sequencer 14 causes the latch circuit BDL2 to store the data "~(BDL2&ADL1)", which is obtained by inverting the data obtained by performing an AND operation on the data stored in the latch circuit BDL2 and the data stored in the latch circuit ADL1. Subsequently, the sequencer 14 causes the latch circuit BDL2 to store data "BDL2|SDL2", which is obtained by performing an OR operation on the data stored in the latch circuit BDL2 and the data stored in the latch circuit SDL2 (FIG. 181, (14)). At this time, the data stored in the latch circuit BDL2 corresponds to the lower-page data pL2.

Lastly, the sequencer 14 causes the latch circuit ADL1 to store data "ADL1|DDL1", which is obtained by performing an OR operation on the data stored in the latch circuit ADL1 and the data stored in the latch circuit DDL1 (FIG. 181, (15)). At this time, the data stored in the latch circuit ADL1 corresponds to the lowest-page data pB1.

If calculation processing is performed as described above, the sense amplifier unit SAUa is in a state of retaining the lowest-page data pL1, the lower-page data pL1, the middle-page data pM1, the upper-page data pU1, and the uppermost-page data pT1, and the sense amplifier unit SAUb is in a state of retaining the lowest-page data pB2, the lower-page data pL2, the middle-page data pM2, the upper-page data pU2, and the uppermost-page data pT2. Thereafter, the semiconductor memory 10 performs a write operation for 5-bit data based on the data stored in each of sense amplifier units SAUa and SAUb, and the converted coding.

(Third Example of Write Operation)

The third example of the write operation corresponds to calculation processing in a case where the data transfer between sense amplifier units SAUa and SAUb is possible, and one latch circuit XDL is coupled to the input/output circuit 19 within a sense amplifier set SAS. The semiconductor memory 10 in the third example of the 17th embodiment has the configuration similar to, for example, that of the semiconductor memory 10 in the third example of the 11th embodiment described with reference to FIG. 159, and each of sense amplifier units SAUa and SAUb includes six latch circuits.

In the following, an example of the operation performed by the sequencer 14 when six latch circuit are provided in each of sense amplifier units SAUa and SAUb will be described, with reference to FIG. 182. FIG. 182 is a flowchart showing the operation performed by the sequencer 14 in the third example of the write operation in the semiconductor memory device 10 according to the 17th embodiment.

Upon receipt of the first-page data by the semiconductor memory 10, the sequencer 14 causes each of the latch circuit XDL1 to store the received first-page data. Subsequently, the sequencer 14 causes the latch circuit ADL1 to store the data stored in the latch circuit XDL1 (FIG. 182, (1)).

Next, upon receipt of the second-page data by the semiconductor memory 10, the sequencer 14 causes each of the latch circuit XDL1 to store the received second-page data. Subsequently, the sequencer 14 causes the latch circuit BDL2 to store the data stored in the latch circuit XDL1 (FIG. 182, (2)).

Next, upon receipt of the third-page data by the semiconductor memory 10, the sequencer 14 causes each of the latch circuit XDL1 to store the received third-page data. Subsequently, the sequencer 14 causes the latch circuit ADL2 to store the data stored in the latch circuit XDL1 (FIG. 182, (3)).

Next, upon receipt of the fourth-page data by the semiconductor memory 10, the sequencer 14 causes each of the latch circuit XDL1 to store the received fourth-page data. Subsequently, the sequencer 14 causes the latch circuit CDL2 to store the data stored in the latch circuit XDL1 (FIG. 182, (4)). At this time, the data stored in the latch circuit CDL2 corresponds to the middle-page data pM2.

Next, upon receipt of the fifth-page data by the semiconductor memory 10, the sequencer 14 causes each of the latch circuit XDL1 to store the received fifth-page data. Subsequently, the sequencer 14 causes the latch circuit CDL1 to store the data stored in the latch circuit XDL1 (FIG. 182, (5)). At this time, the data stored in the latch circuit CDL1 corresponds to the middle-page data pM1.

Next, upon receipt of the sixth-page data by the semiconductor memory 10, the sequencer 14 causes each of the latch circuit XDL1 to store the received sixth-page data. Subsequently, the sequencer 14 causes the latch circuit DDL2 to store the data stored in the latch circuit XDL1 (FIG. 182, (6)). At this time, the data stored in the latch circuit DDL2 corresponds to the upper-page data pU2.

Next, upon receipt of the seventh-page data by the semiconductor memory 10, the sequencer 14 causes each of the latch circuit XDL1 to store the received seventh-page data. Subsequently, the sequencer 14 causes the latch circuit DDL1 to store the data stored in the latch circuit XDL1 (FIG. 182, (7)). At this time, the data stored in the latch circuit DDL1 corresponds to the upper-page data pU1.

Next, upon receipt of the eighth-page data by the semiconductor memory 10, the sequencer 14 causes each of the latch circuit XDL1 to store the received eighth-page data. Subsequently, the sequencer 14 causes the latch circuit SDL2 to store the data stored in the latch circuit XDL1 (FIG. 182, (8)). At this time, the data stored in the latch circuit SDL2 corresponds to the upper-page data pT2.

Next, upon receipt of the ninth-page data by the semiconductor memory 10, the sequencer 14 causes each of the latch circuit XDL1 to store the received ninth-page data. Subsequently, the sequencer 14 causes the latch circuit XDL2 to store the data stored in the latch circuit SDL2, namely the uppermost-page data pT2 (FIG. 182 (9)). At this time, the data stored in the latch circuit XDL1 corresponds to the uppermost-page data pT1.

Next, the sequencer 14 causes the latch circuit BDL1 to store the data stored in the latch circuit ADL2. Subsequently, the sequencer 14 causes the latch circuit BDL1 to store data "BDL1&ADL1", which is obtained by performing an AND operation on the data stored in the latch circuit BDL1 and the data stored in the latch circuit ADL1 (FIG. 182, (10)). At this time, the data stored in the latch circuit BDL1 corresponds to the upper-page data pL1.

Next, the sequencer 14 causes the latch circuit SDL1 to store the data stored in the latch circuit ADL2. Subsequently, the sequencer 14 causes the latch circuit SDL1 to store data "SDL1&BDL2", which is obtained by performing an AND operation on the data stored in the latch circuit SDL1 and the data stored in the latch circuit BDL2 (FIG. 182, (11)).

Next, the sequencer 14 causes the latch circuit SDL2 to store data "ADL2&BDL2", which is obtained by performing an AND operation on the data stored in the latch circuit ADL2 and the data stored in the latch circuit BDL2. Subsequently, the sequencer 14 causes the latch circuit SDL2 to store data "ADL2|SDL2", which is obtained by performing an OR operation on the data stored in the latch circuit ADL2 and the data stored in the latch circuit SDL2 (FIG. 182, (12)).

Next, the sequencer 14 causes the latch circuit ADL2 to store data "ADL2|ADL1", which is obtained by performing an OR operation on the data stored in the latch circuit ADL2 and the data stored in the latch circuit ADL1 (FIG. 182, (13)). At this time, the data stored in the latch circuit ADL2 corresponds to the lowest-page data pB2.

The sequencer 14 causes the latch circuit BDL2 to store the data "~(BDL2&ADL1)", which is obtained by inverting the data obtained by performing an AND operation on the data stored in the latch circuit BDL2 and the data stored in the latch circuit ADL1. Subsequently, the sequencer 14 causes the latch circuit BDL2 to store data "BDL2|SDL2", which is obtained by performing an OR operation on the data stored in the latch circuit BDL2 and the data stored in the latch circuit SDL2 (FIG. 182, (14)). At this time, the data stored in the latch circuit BDL2 corresponds to the upper-page data pL2.

Lastly, the sequencer 14 causes the latch circuit ADL1 to store data "ADL1|DDL1", which is obtained by performing an OR operation on the data stored in the latch circuit ADL1 and the data stored in the latch circuit DDL1 (FIG. 182, (15)). At this time, the data stored in the latch circuit ADL1 corresponds to the lowest-page data pB1.

If calculation processing is performed as described above, the sense amplifier unit SAUa is in a state of retaining the lowest-page data pB1, the lower-page data pL1, the middle-page data pM1, the upper-page data pU1, and the uppermost-page data pT1, and the sense amplifier unit SAUb is in a state of retaining the lowest-page data pB2, the lower-page data pL2, the middle-page data pM2, the upper-page data pU2, and the uppermost-page data pT2. Thereafter, the semiconductor memory 10 performs a write operation for 5-bit data based on the data stored in each of sense amplifier units SAUa and SAUb, and the converted coding.

[19-2-2] Read Operation

FIG. 183 is a timing chart showing an example of the read operation in the non-WL-divided (WL-shared) case in the semiconductor memory 10 of the 17th embodiment, and corresponds to the operation when the page size is (24 kB+16 kB×3).

As shown in FIG. 183, the sequential read for the first, second, and third pages entails a read operation using six types of read voltages (6Level-Read). Specifically, a read operation using the read voltages HR, JR, NR, PR, SR, and WR is performed The three-page data is thereby confirmed, and read data of 24 kB is output from the semiconductor memory 10. If the sequential read for the fourth and fifth pages is performed, a read operation using five types of read voltages (5Level-Read) is performed. Specifically, a read operation using the read voltages AR, ER, KR, MR, and RR is performed. The two-page data is thereby confirmed, and the read data of 16 kB is output from the semiconductor memory 10. If the sequential read for the sixth and seventh pages is performed, a read operation using six types of read voltages (6Level-Read) is performed. Specifically, a read operation using the read voltages BR, DR, FR, LR, QR, and UR is performed The two-page data is thereby confirmed, and the read data of 16 kB is output from the semiconductor 50 memory 10. If the sequential read for the eighth and ninth pages is performed, a read operation using six types of read voltages (6Level-Read) is performed. Specifically, a read operation using the read voltages CR, GR, IR, OR, TR, and VR is performed. The two-page data is thereby confirmed, and the read data of 16 kB is output from the semiconductor memory 10.

In the example shown in FIG. 183, the semiconductor memory 10 outputs data in units of 8 kB. The semiconductor memory 10 may temporarily switches to a busy state when completing the output of 8 kB data and before outputting subsequent data. In the sequential read for the first, second, and third pages, the read result of the first page is confirmed upon end of reading using the read voltage DR (1Level-Read). For this reason, even if a ready/busy signal RBn (True) is in a busy state, the semiconductor memory 10 may output the confirmed read data of the first page first, based on a ready state of a ready/busy signal RBn (Cache). It is thereby possible to output data more quickly from the semiconductor memory 10.

[19-3] Advantageous Effects of 17th Embodiment

According to the above-described semiconductor memory 10 of the 17th embodiment, it is possible to store 9-bit data in two memory cells. Specifically, in the semiconductor memory 10 of the 17th embodiment, 9-bit data is stored in two memory cell transistors MT by forming 24 threshold distributions.

The number of times that read is performed per page in the 17th embodiment is (1+5+5+5+5+6+6+6)/9=4.33. In the semiconductor memory 10 according to the 17th embodiment, if a sequential read is performed, the number of times that read is performed per page is (6+5+5+5)/9=2.33. Accordingly, the semiconductor memory 10 of the 17th embodiment can enhance the speed of a read operation, similarly to the foregoing embodiments.

[19-4] Modifications of 17th Embodiment

In the 17th embodiment, an example where the data allocation shown in FIGS. 162 through 177 is used is described; however, other data allocations may be adopted. Combinations of read voltages and data definitions in the first to 71st modifications of the 17th embodiment are listed below. A data allocation for each of the following combinations is set as appropriate based on a combination of read voltages and data definitions.

(Example) Read voltages: [first-page read ((x) read voltage of PL1, (y) read voltage of PL2), second-page read ((x), (y)), third-page read ((x), (y)), fourth-page read ((x), (y)), fifth-page read ((x), (y)), sixth-page read ((x), (y)), seventh-page read ((x), (y)), eighth-page read ((x), (y)), ninth-page read ((x), (y))]; Data definitions: [first-page read [(a) read data when "0", "0" (=read result of PL1, read result of PL2), (b) read data when "1", "0", (c) read data when "0", "1", (d) read data when "1", "1"], second-page read [(a), (b), (c), (d)], third-page read [(a), (b), (c), (d)], fourth-page read [(a), (b), (c), (d)], fifth-page read [(a), (b), (c), (d)], sixth-page read [(a), (b), (c), (d)], seventh-page read [(a), (b), (c), (d)], eighth-page read [(a), (b), (c), (d)], ninth-page read [(a), (b), (c), (d)]]

First Modification of 17th Embodiment

Read voltages: [((HR), (HR)), ((HR), (JR, LR, NR, SR, WR)), ((JR, LR, NR, SR, WR), (HR)), ((omitted), (AR, CR, ER, GR, PR)), ((AR, CR, ER, GR, PR), (omitted)), ((omitted), (BR, FR, IR, MR, QR, UR)), ((BR, FR, IR, MR, QR, UR), (omitted)), ((omitted), (DR, KR, OR, RR, TR, VR)), ((DR, KR, OR, RR, TR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

Second Modification of 17th Embodiment

Read voltages: [((HR), (HR)), ((HR), (JR, LR, NR, SR, WR)), ((JR, LR, NR, SR, WR), (HR)), ((omitted), (AR, CR, ER, GR, PR)), ((AR, CR, ER, GR, PR), (omitted)), ((omitted), (BR, FR, KR, OR, QR, UR)), ((BR, FR, KR, OR, QR, UR), (omitted)), ((omitted), (DR, IR, MR, RR, TR, VR)), ((DR, IR, MR, RR, TR, VR), (omitted))]; Data definitions:

[[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

Third Modification of 17th Embodiment

Read voltages: [((HR), (HR)), ((HR), (JR, LR, PR, UR, WR)), ((JR, LR, PR, UR, WR), (HR)), ((omitted), (AR, CR, FR, KR, SR)), ((AR, CR, FR, KR, SR), (omitted)), ((omitted), (BR, ER, GR, NR, RR, TR)), ((BR, ER, GR, NR, RR, TR), (omitted)), ((omitted), (DR, IR, MR, OR, QR, VR)), ((DR, IR, MR, OR, QR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

Fourth Modification of 17th Embodiment

Read voltages: [((HR), (HR)), ((HR), (JR, LR, PR, UR, WR)), ((JR, LR, PR, UR, WR), (HR)), ((omitted), (AR, ER, IR, MR, TR)), ((AR, ER, IR, MR, TR), (omitted)), ((omitted), (BR, DR, FR, NR, QR, SR)), ((BR, DR, FR, NR, QR, SR), (omitted)), ((omitted), (CR, GR, KR, OR, RR, VR)), ((CR, GR, KR, OR, RR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

Fifth Modification of 17th Embodiment

Read voltages: [((HR), (HR)), ((HR), (JR, LR, PR, UR, WR)), ((JR, LR, PR, UR, WR), (HR)), ((omitted), (AR, ER, NR, QR, SR)), ((AR, ER, NR, QR, SR), (omitted)), ((omitted), (BR, DR, FR, IR, MR, TR)), ((BR, DR, FR, IR, MR, TR), (omitted)), ((omitted), (CR, GR, KR, OR, RR, VR)), ((CR, GR, KR, OR, RR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

Sixth Modification of 17th Embodiment

Read voltages: [((HR), (HR)), ((HR), (LR, NR, PR, UR, WR)), ((LR, NR, PR, UR, WR), (HR)), ((omitted), (AR, CR, FR, JR, RR)), ((AR, CR, FR, JR, RR), (omitted)), ((omitted), (BR, ER, GR, KR, OR, TR)), ((BR, ER, GR, KR, OR, TR), (omitted)), ((omitted), (DR, IR, MR, QR, SR, VR)), (((DR, IR, MR, QR, SR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

Seventh Modification of 17th Embodiment

Read voltages: [((HR), (HR)), ((HR), (LR, NR, PR, UR, WR)), ((LR, NR, PR, UR, WR), (HR)), ((omitted), (AR, CR, FR, JR, RR)), ((AR, CR, FR, JR, RR), (omitted)), ((omitted), (BR, ER, GR, MR, QR, TR)), ((BR, ER, GR, MR, QR, TR), (omitted)), ((omitted), (DR, IR, KR, OR, SR, VR)), ((DR, IR, KR, OR, SR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

Eighth Modification of 17th Embodiment

Read voltages: [((HR), (HR)), ((HR), (LR, NR, PR, UR, WR)), ((LR, NR, PR, UR, WR), (HR)), ((omitted), (AR, ER, IR, KR, RR)), ((AR, ER, IR, KR, RR), (omitted)), ((omitted), (BR, DR, FR, MR, QR, TR)), ((BR, DR, FR, MR, QR, TR), (omitted)), ((omitted), (CR, GR, JR, OR, SR, VR)), ((CR, GR, JR, OR, SR, VR), (omitted))]; Data definitions:

[[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

Ninth Modification of 17th Embodiment

Read voltages: [((HR), (HR)), ((HR), (LR, NR, PR, UR, WR)), ((LR, NR, PR, UR, WR), (HR)), ((omitted), (AR, ER, MR, QR, TR)), ((AR, ER, MR, QR, TR), (omitted)), ((omitted), (BR, DR, FR, IR, KR, RR)), ((BR, DR, FR, IR, KR, RR), (omitted)), ((omitted), (CR, GR, JR, OR, SR, VR)), ((CR, GR, JR, OR, SR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

10th Modification of 17th Embodiment

Read voltages: [((HR), (HR)), ((HR), (IR, KR, PR, UR, WR)), ((IR, KR, PR, UR, WR), (HR)), ((omitted), (AR, CR, FR, LR, TR)), ((AR, CR, FR, LR, TR), (omitted)), ((omitted), (BR, ER, GR, MR, OR, RR)), ((BR, ER, GR, MR, OR, RR), (omitted)), ((omitted), (DR, JR, NR, QR, SR, VR)), ((DR, JR, NR, QR, SR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

11th Modification of 17th Embodiment

Read voltages: [((HR), (HR)), ((HR), (IR, KR, PR, UR, WR)), ((IR, KR, PR, UR, WR), (HR)), ((omitted), (AR, CR, FR, LR, TR)), ((AR, CR, FR, LR, TR), (omitted)), ((omitted), (BR, ER, GR, NR, QR, SR)), ((BR, ER, GR, NR, QR, SR), (omitted)), ((omitted), (DR, JR, MR, OR, RR, VR)), ((DR, JR, MR, OR, RR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

12th Modification of 17th Embodiment

Read voltages: [((HR), (HR)), ((HR), (IR, KR, PR, UR, WR)), ((IR, KR, PR, UR, WR), (HR)), ((omitted), (AR, ER, JR, MR, SR)), ((AR, ER, JR, MR, SR), (omitted)), ((omitted), (BR, DR, FR, NR, RR, TR)), ((BR, DR, FR, NR, RR, TR), (omitted)), ((omitted), (CR, GR, LR, OR, QR, VR)), ((CR, GR, LR, OR, QR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

13th Modification of 17th Embodiment

Read voltages: [((HR), (HR)), ((HR), (IR, KR, PR, UR, WR)), ((IR, KR, PR, UR, WR), (HR)), ((omitted), (AR, ER, NR, RR, TR)), ((AR, ER, NR, RR, TR), (omitted)), ((omitted), (BR, DR, FR, JR, MR, SR)), ((BR, DR, FR, JR, MR, SR), (omitted)), ((omitted), (CR, GR, LR, OR, QR, VR)), ((CR, GR, LR, OR, QR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

14th Modification of 17th Embodiment

Read voltages: [((HR), (HR)), ((HR), (JR, NR, RR, UR, WR)), ((JR, NR, RR, UR, WR), (HR)), ((omitted), (AR, CR, FR, IR, QR)), ((AR, CR, FR, IR, QR), (omitted)), ((omitted), (BR, ER, GR, LR, PR, TR)), ((BR, ER, GR, LR, PR, TR), (omitted)), ((omitted), (DR, KR, MR, OR, SR, VR)), ((DR, KR, MR, OR, SR, VR), (omitted))]; Data definitions:

[[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

15th Modification of 17th Embodiment

Read voltages: [((HR), (HR)), ((HR), (JR, NR, RR, UR, WR)), ((JR, NR, RR, UR, WR), (HR)), ((omitted), (AR, CR, FR, KR, SR)), ((AR, CR, FR, KR, SR), (omitted)), ((omitted), (BR, ER, GR, LR, PR, TR)), ((BR, ER, GR, LR, PR, TR), (omitted)), ((omitted), (DR, IR, MR, OR, QR, VR)), ((DR, IR, MR, OR, QR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

16th Modification of 17th Embodiment

Read voltages: [((HR), (HR)), ((HR), (JR, OR, SR, UR, WR)), ((JR, OR, SR, UR, WR), (HR)), ((omitted), (AR, CR, FR, LR, TR)), ((AR, CR, FR, LR, TR), (omitted)), ((omitted), (BR, ER, GR, NR, PR, RR)), ((BR, ER, GR, NR, PR, RR), (omitted)), ((omitted), (DR, IR, KR, MR, QR, VR)), ((DR, IR, KR, MR, QR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

17th Modification of 17th Embodiment

Read voltages: [((HR), (HR)), ((HR), (JR, OR, SR, UR, WR)), ((JR, OR, SR, UR, WR), (HR)), ((omitted), (AR, ER, IR, KR, RR)), ((AR, ER, IR, KR, RR), (omitted)), ((omitted), (BR, DR, FR, MR, QR, TR)), ((BR, DR, FR, MR, QR, TR), (omitted)), ((omitted), (CR, GR, LR, NR, PR, VR)), ((CR, GR, LR, NR, PR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

18th Modification of 17th Embodiment

Read voltages: [((HR), (HR)), ((HR), (JR, OR, SR, UR, WR)), ((JR, OR, SR, UR, WR), (HR)), ((omitted), (AR, ER, MR, QR, TR)), ((AR, ER, MR, QR, TR), (omitted)), ((omitted), (BR, DR, FR, IR, KR, RR)), ((BR, DR, FR, IR, KR, RR), (omitted)), ((omitted), (CR, GR, LR, NR, PR, VR)), ((CR, GR, LR, NR, PR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

19th Modification of 17th Embodiment

Read voltages: [((HR), (HR)), ((HR), (IR, MR, RR, UR, WR)), ((IR, MR, RR, UR, WR), (HR)), ((omitted), (AR, CR, ER, GR, PR)), ((AR, CR, ER, GR, PR), (omitted)), ((omitted), (BR, FR, JR, LR, NR, TR)), ((BR, FR, JR, LR, NR, TR), (omitted)), ((omitted), (DR, KR, OR, QR, SR, VR)), ((DR, KR, OR, QR, SR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

20th Modification of 17th Embodiment

Read voltages: [((HR), (HR)), ((HR), (KR, OR, RR, UR, WR)), ((KR, OR, RR, UR, WR), (HR)), ((omitted), (AR, CR, ER, GR, PR)), ((AR, CR, ER, GR, PR), (omitted)), ((omitted), (BR, FR, JR, LR, NR, TR)), ((BR, FR, JR, LR, NR, TR), (omitted)), ((omitted), (DR, IR, MR, QR, SR, VR)), ((DR, IR, MR, QR, SR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

21st Modification of 17th Embodiment

Read voltages: [((HR), (HR)), ((HR), (KR, OR, RR, UR, WR)), ((KR, OR, RR, UR, WR), (HR)), ((omitted), (AR, ER, IR, MR, TR)), ((AR, ER, IR, MR, TR), (omitted)), ((omitted), (BR, DR, FR, NR, QR, SR)), ((BR, DR, FR, NR, QR, SR), (omitted)), ((omitted), (CR, GR, JR, LR, PR, VR)), ((CR, GR, JR, LR, PR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

22nd Modification of 17th Embodiment

Read voltages: [((HR), (HR)), ((HR), (KR, OR, RR, UR, WR)), ((KR, OR, RR, UR, WR), (HR)), ((omitted), (AR, ER, NR, QR, SR)), ((AR, ER, NR, QR, SR), (omitted)), ((omitted), (BR, DR, FR, IR, MR, TR)), ((BR, DR, FR, IR, MR, TR), (omitted)), ((omitted), (CR, GR, JR, LR, PR, VR)), ((CR, GR, JR, LR, PR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

23rd Modification of 17th Embodiment

Read voltages: [((HR), (HR)), ((HR), (LR, OR, QR, UR, WR)), ((LR, OR, QR, UR, WR), (HR)), ((omitted), (AR, ER, JR, MR, SR)), ((AR, ER, JR, MR, SR), (omitted)), ((omitted), (BR, DR, FR, NR, RR, TR)), ((BR, DR, FR, NR, RR, TR), (omitted)), ((omitted), (CR, GR, IR, KR, PR, VR)), ((CR, GR, IR, KR, PR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

24th Modification of 17th Embodiment

Read voltages: [((HR), (HR)), ((HR), (LR, OR, QR, UR, WR)), ((LR, OR, QR, UR, WR), (HR)), ((omitted), (AR, ER, NR, RR, TR)), ((AR, ER, NR, RR, TR), (omitted)), ((omitted), (BR, DR, FR, JR, MR, SR)), ((BR, DR, FR, JR, MR, SR), (omitted)), ((omitted), (CR, GR, IR, KR, PR, VR)), ((CR, GR, IR, KR, PR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

25th Modification of 17th Embodiment

Read voltages: [((HR), (HR)), ((HR), (LR, PR, RR, UR, WR)), ((LR, PR, RR, UR, WR), (HR)), ((omitted), (AR, CR, FR, IR, QR)), ((AR, CR, FR, IR, QR), (omitted)), ((omitted), (BR, ER, GR, JR, NR, TR)), ((BR, ER, GR, JR, NR, TR), (omitted)), ((omitted), (DR, KR, MR, OR, SR, VR)), ((DR, KR, MR, OR, SR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

26th Modification of 17th Embodiment

Read voltages: [((HR), (HR)), ((HR), (LR, QR, SR, UR, WR)), ((LR, QR, SR, UR, WR), (HR)), ((omitted), (AR, CR, ER, GR, PR)), ((AR, CR, ER, GR, PR), (omitted)), ((omitted), (BR, FR, IR, KR, NR, TR)), ((BR, FR, IR, KR, NR, TR), (omitted)), ((omitted), (DR, JR, MR, OR, RR, VR)), ((DR, JR, MR, OR, RR, VR), (omitted))]; Data definitions:

[[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

27th Modification of 17th Embodiment

Read voltages: [((HR), (HR)), ((HR), (LR, QR, SR, UR, WR)), ((LR, QR, SR, UR, WR), (HR)), ((omitted), (AR, CR, ER, GR, PR)), ((AR, CR, ER, GR, PR), (omitted)), ((omitted), (BR, FR, JR, MR, OR, TR)), ((BR, FR, JR, MR, OR, TR), (omitted)), ((omitted), (DR, IR, KR, NR, RR, VR)), ((DR, IR, KR, NR, RR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

28th Modification of 17th Embodiment

Read voltages: [((HR), (HR)), ((HR), (LR, OR, QR, UR, WR)), ((LR, OR, QR, UR, WR), (HR)), ((omitted), (AR, ER, JR, MR, SR)), ((AR, ER, JR, MR, SR), (omitted)), ((omitted), (BR, DR, FR, NR, RR, TR)), ((BR, DR, FR, NR, RR, TR), (omitted)), ((omitted), (CR, GR, IR, KR, PR, VR)), ((CR, GR, IR, KR, PR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

29th Modification of 17th Embodiment

Read voltages: [((HR), (HR)), ((HR), (LR, OR, QR, UR, WR)), ((LR, OR, QR, UR, WR), (HR)), ((omitted), (AR, ER, NR, RR, TR)), ((AR, ER, NR, RR, TR), (omitted)), ((omitted), (BR, DR, FR, JR, MR, SR)), ((BR, DR, FR, JR, MR, SR), (omitted)), ((omitted), (CR, GR, IR, KR, PR, VR)), ((CR, GR, IR, KR, PR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

30th Modification of 17th Embodiment

Read voltages: [((HR), (HR)), ((HR), (LR, PR, RR, UR, WR)), ((LR, PR, RR, UR, WR), (HR)), ((omitted), (AR, CR, FR, IR, QR)), ((AR, CR, FR, IR, QR), (omitted)), ((omitted), (BR, ER, GR, JR, NR, TR)), ((BR, ER, GR, JR, NR, TR), (omitted)), ((omitted), (DR, KR, MR, OR, SR, VR)), ((DR, KR, MR, OR, SR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

31st Modification of 17th Embodiment

Read voltages: [((HR), (HR)), ((HR), (LR, QR, SR, UR, WR)), ((LR, QR, SR, UR, WR), (HR)), ((omitted), (AR, CR, ER, GR, PR)), ((AR, CR, ER, GR, PR), (omitted)), ((omitted), (BR, FR, IR, KR, NR, TR)), ((BR, FR, IR, KR, NR, TR), (omitted)), ((omitted), (DR, JR, MR, OR, RR, VR)), ((DR, JR, MR, OR, RR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

32nd Modification of 17th Embodiment

Read voltages: [((HR), (HR)), ((HR), (LR, QR, SR, UR, WR)), ((LR, QR, SR, UR, WR), (HR)), ((omitted), (AR, CR, ER, GR, PR)), ((AR, CR, ER, GR, PR), (omitted)), ((omitted), (BR, FR, JR, MR, OR, TR)), ((BR, FR, JR, MR, OR, TR), (omitted)), ((omitted), (DR, IR, KR, NR, RR, VR)), ((DR, IR, KR, NR, RR, VR), (omitted))]; Data definitions:

[[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

33rd Modification of 17th Embodiment

Read voltages: [((HR), (HR)), ((HR), (JR, MR, PR, TR, WR)), ((JR, MR, PR, TR, WR), (HR)), ((omitted), (AR, ER, IR, KR, RR)), ((AR, ER, IR, KR, RR), (omitted)), ((omitted), (BR, DR, FR, NR, SR, UR)), ((BR, DR, FR, NR, SR, UR), (omitted)), ((omitted), (CR, GR, LR, OR, QR, VR)), ((CR, GR, LR, OR, QR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

34th Modification of 17th Embodiment

Read voltages: [((HR), (HR)), ((HR), (JR, MR, QR, UR, WR)), ((JR, MR, QR, UR, WR), (HR)), ((omitted), (AR, CR, FR, LR, TR)), ((AR, CR, FR, LR, TR), (omitted)), ((omitted), (BR, ER, GR, NR, PR, RR)), ((BR, ER, GR, NR, PR, RR), (omitted)), ((omitted), (DR, IR, KR, OR, SR, VR)), ((DR, IR, KR, OR, SR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

35th Modification of 17th Embodiment

Read voltages: [((HR), (HR)), ((HR), (JR, NR, PR, SR, WR)), ((JR, NR, PR, SR, WR), (HR)), ((omitted), (AR, ER, IR, MR, TR)), ((AR, ER, IR, MR, TR), (omitted)), ((omitted), (BR, DR, FR, LR, QR, UR)), ((BR, DR, FR, LR, QR, UR), (omitted)), ((omitted), (CR, GR, KR, OR, RR, VR)), ((CR, GR, KR, OR, RR, VR), (omitted))]; Data definitions: [[0, 0, 0, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

36th Modification of 17th Embodiment

Read voltages: [((PR), (PR)), ((PR), (AR, ER, JR, LR, NR)), ((AR, ER, JR, LR, NR), (PR)), ((omitted), (HR, QR, SR, UR, WR)), ((HR, QR, SR, UR, WR), (omitted)), ((omitted), (CR, GR, KR, OR, RR, VR)), ((CR, GR, KR, OR, RR, VR), (omitted)), ((omitted), (BR, DR, FR, IR, MR, TR)), ((BR, DR, FR, IR, MR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

37th Modification of 17th Embodiment

Read voltages: [((PR), (PR)), ((PR), (AR, ER, JR, LR, NR)), ((AR, ER, JR, LR, NR), (PR)), ((omitted), (HR, QR, SR, UR, WR)), ((HR, QR, SR, UR, WR), (omitted)), ((omitted), (CR, GR, IR, MR, RR, VR)), ((CR, GR, IR, MR, RR, VR), (omitted)), ((omitted), (BR, DR, FR, KR, OR, TR)), ((BR, DR, FR, KR, OR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

38th Modification of 17th Embodiment

Read voltages: [((PR), (PR)), ((PR), (AR, CR, HR, LR, NR)), ((AR, CR, HR, LR, NR), (PR)), ((omitted), (ER, MR, RR, UR, WR)), ((ER, MR, RR, UR, WR), (omitted)), ((omitted), (DR, FR, JR, QR, SR, VR)), ((DR, FR, JR, QR, SR, VR), (omitted)), ((omitted), (BR, GR, IR, KR, OR, TR)), ((BR, GR, IR, KR, OR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

39th Modification of 17th Embodiment

Read voltages: [((PR), (PR)), ((PR), (AR, CR, HR, LR, NR)), ((AR, CR, HR, LR, NR), (PR)), ((omitted), (DR, KR, OR, SR, WR)), ((DR, KR, OR, SR, WR), (omitted)), ((omitted), (ER, GR, JR, RR, TR, VR)), ((ER, GR, JR, RR, TR, VR), (omitted)), ((omitted), (BR, FR, IR, MR, QR, UR)), ((BR, FR, IR, MR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

40th Modification of 17th Embodiment

Read voltages: [((PR), (PR)), ((PR), (AR, CR, HR, LR, NR)), ((AR, CR, HR, LR, NR), (PR)), ((omitted), (ER, GR, JR, SR, WR)), ((ER, GR, JR, SR, WR), (omitted)), ((omitted), (DR, KR, OR, RR, TR, VR)), ((DR, KR, OR, RR, TR, VR), (omitted)), ((omitted), (BR, FR, IR, MR, QR, UR)), ((BR, FR, IR, MR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

41st Modification of 17th Embodiment

Read voltages: [((PR), (PR)), ((PR), (AR, CR, HR, JR, LR)), ((AR, CR, HR, JR, LR), (PR)), ((omitted), (FR, NR, RR, UR, WR)), ((FR, NR, RR, UR, WR), (omitted)), ((omitted), (DR, IR, MR, QR, SR, VR)), ((DR, IR, MR, QR, SR, VR), (omitted)), ((omitted), (BR, ER, GR, KR, OR, TR)), ((BR, ER, GR, KR, OR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

42nd Modification of 17th Embodiment

Read voltages: [((PR), (PR)), ((PR), (AR, CR, HR, JR, LR)), ((AR, CR, HR, JR, LR), (PR)), ((omitted), (FR, NR, RR, UR, WR)), ((FR, NR, RR, UR, WR), (omitted)), ((omitted), (DR, GR, KR, QR, SR, VR)), ((DR, GR, KR, QR, SR, VR), (omitted)), ((omitted), (BR, ER, IR, MR, OR, TR)), ((BR, ER, IR, MR, OR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

43rd Modification of 17th Embodiment

Read voltages: [((PR), (PR)), ((PR), (AR, CR, HR, JR, LR)), ((AR, CR, HR, JR, LR), (PR)), ((omitted), (FR, MR, OR, SR, WR)), ((FR, MR, OR, SR, WR), (omitted)), ((omitted), (DR, GR, KR, RR, TR, VR)), ((DR, GR, KR, RR, TR, VR), (omitted)), ((omitted), (BR, ER, IR, NR, QR, UR)), ((BR, ER, IR, NR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

44th Modification of 17th Embodiment

Read voltages: [((PR), (PR)), ((PR), (AR, CR, HR, JR, LR)), ((AR, CR, HR, JR, LR), (PR)), ((omitted), (DR, GR, KR, SR, WR)), ((DR, GR, KR, SR, WR), (omitted)), ((omitted), (FR, MR, OR, RR, TR, VR)), ((FR, MR, OR, RR, TR, VR), (omitted)), ((omitted), (BR, ER, IR, NR, QR, UR)), ((BR, ER, IR, NR, QR, UR), (omitted))]; Data definitions:

[[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

45th Modification of 17th Embodiment

Read voltages: [((PR), (PR)), ((PR), (AR, CR, HR, MR, OR)), ((AR, CR, HR, MR, OR), (PR)), ((omitted), (DR, LR, RR, UR, WR)), ((DR, LR, RR, UR, WR), (omitted)), ((omitted), (FR, IR, KR, QR, SR, VR)), ((FR, IR, KR, QR, SR, VR), (omitted)), ((omitted), (BR, ER, GR, JR, NR, TR)), ((BR, ER, GR, JR, NR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

46th Modification of 17th Embodiment

Read voltages: [((PR), (PR)), ((PR), (AR, CR, HR, MR, OR)), ((AR, CR, HR, MR, OR), (PR)), ((omitted), (DR, LR, RR, UR, WR)), ((DR, LR, RR, UR, WR), (omitted)), ((omitted), (ER, GR, JR, QR, SR, VR)), ((ER, GR, JR, QR, SR, VR), (omitted)), ((omitted), (BR, FR, IR, KR, NR, TR)), ((BR, FR, IR, KR, NR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

47th Modification of 17th Embodiment

Read voltages: [((PR), (PR)), ((PR), (AR, CR, HR, MR, OR)), ((AR, CR, HR, MR, OR), (PR)), ((omitted), (ER, KR, NR, SR, WR)), ((ER, KR, NR, SR, WR), (omitted)), ((omitted), (DR, FR, JR, RR, TR, VR)), ((DR, FR, JR, RR, TR, VR), (omitted)), ((omitted), (BR, GR, IR, LR, QR, UR)), ((BR, GR, IR, LR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

48th Modification of 17th Embodiment

Read voltages: [((PR), (PR)), ((PR), (AR, CR, HR, MR, OR)), ((AR, CR, HR, MR, OR), (PR)), ((omitted), (DR, FR, JR, SR, WR)), ((DR, FR, JR, SR, WR), (omitted)), ((omitted), (ER, KR, NR, RR, TR, VR)), ((ER, KR, NR, RR, TR, VR), (omitted)), ((omitted), (BR, GR, IR, LR, QR, UR)), ((BR, GR, IR, LR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

49th Modification of 17th Embodiment

Read voltages: [((PR), (PR)), ((PR), (AR, CR, FR, JR, NR)), ((AR, CR, FR, JR, NR), (PR)), ((omitted), (GR, OR, RR, UR, WR)), ((GR, OR, RR, UR, WR), (omitted)), ((omitted), (DR, HR, LR, QR, SR, VR)), ((DR, HR, LR, QR, SR, VR), (omitted)), ((omitted), (BR, ER, IR, KR, MR, TR)), ((BR, ER, IR, KR, MR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

50th Modification of 17th Embodiment

Read voltages: [((PR), (PR)), ((PR), (AR, CR, FR, JR, NR)), ((AR, CR, FR, JR, NR), (PR)), ((omitted), (ER, MR, RR, UR, WR)), ((ER, MR, RR, UR, WR), (omitted)), ((omitted), (DR, HR, LR, QR, SR, VR)), ((DR, HR, LR, QR, SR, VR), (omitted)), ((omitted), (BR, GR, IR, KR, OR, TR)), ((BR, GR, IR, KR, OR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

51st Modification of 17th Embodiment

Read voltages: [((PR), (PR)), ((PR), (AR, CR, ER, IR, NR)), ((AR, CR, ER, IR, NR), (PR)), ((omitted), (DR, LR, RR, UR, WR)), ((DR, LR, RR, UR, WR), (omitted)), ((omitted), (FR, HR, JR, QR, SR, VR)), ((FR, HR, JR, QR, SR, VR), (omitted)), ((omitted), (BR, GR, KR, MR, OR, TR)), ((BR, GR, KR, MR, OR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

52th Modification of 17th Embodiment

Read voltages: [((PR), (PR)), ((PR), (AR, CR, ER, IR, NR)), ((AR, CR, ER, IR, NR), (PR)), ((omitted), (FR, MR, OR, SR, WR)), ((FR, MR, OR, SR, WR), (omitted)), ((omitted), (DR, GR, KR, RR, TR, VR)), ((DR, GR, KR, RR, TR, VR), (omitted)), ((omitted), (BR, HR, JR, LR, QR, UR)), ((BR, HR, JR, LR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

53rd Modification of 17th Embodiment

Read voltages: [((PR), (PR)), ((PR), (AR, CR, ER, IR, NR)), ((AR, CR, ER, IR, NR), (PR)), ((omitted), (DR, GR, KR, SR, WR)), ((DR, GR, KR, SR, WR), (omitted)), ((omitted), (FR, MR, OR, RR, TR, VR)), ((FR, MR, OR, RR, TR, VR), (omitted)), ((omitted), (BR, HR, JR, LR, QR, UR)), ((BR, HR, JR, LR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

54th Modification of 17th Embodiment

Read voltages: [((PR), (PR)), ((PR), (AR, CR, FR, KR, OR)), ((AR, CR, FR, KR, OR), (PR)), ((omitted), (HR, QR, SR, UR, WR)), ((HR, QR, SR, UR, WR), (omitted)), ((omitted), (DR, JR, LR, NR, RR, VR)), ((DR, JR, LR, NR, RR, VR), (omitted)), ((omitted), (BR, ER, GR, IR, MR, TR)), ((BR, ER, GR, IR, MR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

55th Modification of 17th Embodiment

Read voltages: [((PR), (PR)), ((PR), (AR, CR, FR, IR, MR)), ((AR, CR, FR, IR, MR), (PR)), ((omitted), (HR, QR, SR, UR, WR)), ((HR, QR, SR, UR, WR), (omitted)), ((omitted), (DR, JR, LR, NR, RR, VR)), ((DR, JR, LR, NR, RR, VR), (omitted)), ((omitted), (BR, ER, GR, KR, OR, TR)), ((BR, ER, GR, KR, OR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

56th Modification of 17th Embodiment

Read voltages: [((PR), (PR)), ((PR), (AR, CR, FR, IR, MR)), ((AR, CR, FR, IR, MR), (PR)), ((omitted), (DR, KR, OR, SR, WR)), ((DR, KR, OR, SR, WR), (omitted)), ((omitted), (ER, GR, JR, RR, TR, VR)), ((ER, GR, JR, RR, TR, VR), (omitted)), ((omitted), (BR, HR, LR, NR, QR, UR)), ((BR, HR, LR, NR, QR, UR), (omitted))]; Data definitions:

[[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

57th Modification of 17th Embodiment

Read voltages: [((PR), (PR)), ((PR), (AR, CR, FR, IR, MR)), ((AR, CR, FR, IR, MR), (PR)), ((omitted), (ER, GR, JR, SR, WR)), ((ER, GR, JR, SR, WR), (omitted)), ((omitted), (DR, KR, OR, RR, TR, VR)), ((DR, KR, OR, RR, TR, VR), (omitted)), ((omitted), (BR, HR, LR, NR, QR, UR)), ((BR, HR, LR, NR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

58th Modification of 17th Embodiment

Read voltages: [((PR), (PR)), ((PR), (AR, CR, GR, IR, LR)), ((AR, CR, GR, IR, LR), (PR)), ((omitted), (ER, KR, NR, SR, WR)), ((ER, KR, NR, SR, WR), (omitted)), ((omitted), (DR, FR, JR, RR, TR, VR)), ((DR, FR, JR, RR, TR, VR), (omitted)), ((omitted), (BR, HR, MR, OR, QR, UR)), ((BR, HR, MR, OR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

59th Modification of 17th Embodiment

Read voltages: [((PR), (PR)), ((PR), (AR, CR, GR, IR, LR)), ((AR, CR, GR, IR, LR), (PR)), ((omitted), (DR, FR, JR, SR, WR)), ((DR, FR, JR, SR, WR), (omitted)), ((omitted), (ER, KR, NR, RR, TR, VR)), ((ER, KR, NR, RR, TR, VR), (omitted)), ((omitted), (BR, HR, MR, OR, QR, UR)), ((BR, HR, MR, OR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

60th Modification of 17th Embodiment

Read voltages: [((PR), (PR)), ((PR), (AR, CR, FR, HR, LR)), ((AR, CR, FR, HR, LR), (PR)), ((omitted), (GR, OR, RR, UR, WR)), ((GR, OR, RR, UR, WR), (omitted)), ((omitted), (DR, JR, NR, QR, SR, VR)), ((DR, JR, NR, QR, SR, VR), (omitted)), ((omitted), (BR, ER, IR, KR, MR, TR)), ((BR, ER, IR, KR, MR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

61st Modification of 17th Embodiment

Read voltages: [((PR), (PR)), ((PR), (AR, CR, ER, GR, LR)), ((AR, CR, ER, GR, LR), (PR)), ((omitted), (HR, QR, SR, UR, WR)), ((HR, QR, SR, UR, WR), (omitted)), ((omitted), (DR, JR, MR, OR, RR, VR)), ((DR, JR, MR, OR, RR, VR), (omitted)), ((omitted), (BR, FR, IR, KR, NR, TR)), ((BR, FR, IR, KR, NR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

62nd Modification of 17th Embodiment

Read voltages: [((PR), (PR)), ((PR), (AR, CR, ER, GR, LR)), ((AR, CR, ER, GR, LR), (PR)), ((omitted), (HR, QR, SR, UR, WR)), ((HR, QR, SR, UR, WR), (omitted)), ((omitted), (DR, IR, KR, NR, RR, VR)), ((DR, IR, KR, NR, RR, VR), (omitted)), ((omitted), (BR, FR, JR, MR, OR, TR)), ((BR, FR, JR, MR, OR, TR), (omitted))]; Data definitions:

189

[[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

63rd Modification of 17th Embodiment

Read voltages: [((PR), (PR)), ((PR), (AR, CR, GR, IR, LR)), ((AR, CR, GR, IR, LR), (PR)), ((omitted), (ER, KR, NR, SR, WR)), ((ER, KR, NR, SR, WR), (omitted)), ((omitted), (DR, FR, JR, RR, TR, VR)), ((DR, FR, JR, RR, TR, VR), (omitted)), ((omitted), (BR, HR, MR, OR, QR, UR)), ((BR, HR, MR, OR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

64th Modification of 17th Embodiment

Read voltages: [((PR), (PR)), ((PR), (AR, CR, GR, IR, LR)), ((AR, CR, GR, IR, LR), (PR)), ((omitted), (DR, FR, JR, SR, WR)), ((DR, FR, JR, SR, WR), (omitted)), ((omitted), (ER, KR, NR, RR, TR, VR)), ((ER, KR, NR, RR, TR, VR), (omitted)), ((omitted), (BR, HR, MR, OR, QR, UR)), ((BR, HR, MR, OR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

65th Modification of 17th Embodiment

Read voltages: [((PR), (PR)), ((PR), (AR, CR, FR, IR, LR)), ((AR, CR, FR, IR, LR), (PR)), ((omitted), (GR, OR, RR, UR, WR)), ((GR, OR, RR, UR, WR), (omitted)), ((omitted), (DR, JR, NR, QR, SR, VR)), ((DR, JR, NR, QR, SR, VR), (omitted)), ((omitted), (BR, ER, IR, KR, MR, TR)), ((BR, ER, IR, KR, MR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

66th Modification of 17th Embodiment

Read voltages: [((PR), (PR)), ((PR), (AR, CR, ER, GR, LR)), ((AR, CR, ER, GR, LR), (PR)), ((omitted), (HR, QR, SR, UR, WR)), ((HR, QR, SR, UR, WR), (omitted)), ((omitted), (DR, JR, MR, OR, RR, VR)), ((DR, JR, MR, OR, RR, VR), (omitted)), ((omitted), (BR, FR, IR, KR, NR, TR)), ((BR, FR, IR, KR, NR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

67th Modification of 17th Embodiment

Read voltages: [((PR), (PR)), ((PR), (AR, CR, ER, GR, LR)), ((AR, CR, ER, GR, LR), (PR)), ((omitted), (HR, QR, SR, UR, WR)), ((HR, QR, SR, UR, WR), (omitted)), ((omitted), (DR, IR, KR, NR, RR, VR)), ((DR, IR, KR, NR, RR, VR), (omitted)), ((omitted), (BR, FR, JR, MR, OR, TR)), ((BR, FR, JR, MR, OR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

68th Modification of 17th Embodiment

Read voltages: [((PR), (PR)), ((PR), (AR, DR, HR, KR, NR)), ((AR, DR, HR, KR, NR), (PR)), ((omitted), (FR, MR, OR, SR, WR)), ((FR, MR, OR, SR, WR), (omitted)), ((omitted), (CR, ER, JR, RR, TR, VR)), ((CR, ER, JR, RR, TR, VR), (omitted)), ((omitted), (BR, GR, IR, LR, QR, UR)), ((BR, GR, IR, LR, QR, UR), (omitted))]; Data definitions:

190

[[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

69th Modification of 17th Embodiment

Read voltages: [((PR), (PR)), ((PR), (AR, CR, GR, KR, NR)), ((AR, CR, GR, KR, NR), (PR)), ((omitted), (DR, LR, RR, UR, WR)), ((DR, LR, RR, UR, WR), (omitted)), ((omitted), (FR, HR, JR, QR, SR, VR)), ((FR, HR, JR, QR, SR, VR), (omitted)), ((omitted), (BR, ER, IR, MR, OR, TR)), ((BR, ER, IR, MR, OR, TR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

70th Modification of 17th Embodiment

Read voltages: [((PR), (PR)), ((PR), (AR, ER, HR, JR, NR)), ((AR, ER, HR, JR, NR), (PR)), ((omitted), (DR, KR, OR, SR, WR)), ((DR, KR, OR, SR, WR), (omitted)), ((omitted), (CR, GR, LR, RR, TR, VR)), ((CR, GR, LR, RR, TR, VR), (omitted)), ((omitted), (BR, FR, IR, MR, QR, UR)), ((BR, FR, IR, MR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

71st Modification of 17th Embodiment

Read voltages: [((PR), (PR)), ((PR), (AR, ER, HR, JR, NR)), ((AR, ER, HR, JR, NR), (PR)), ((omitted), (FR, KR, MR, SR, WR)), ((FR, KR, MR, SR, WR), (omitted)), ((omitted), (CR, GR, LR, RR, TR, VR)), ((CR, GR, LR, RR, TR, VR), (omitted)), ((omitted), (BR, DR, IR, OR, QR, UR)), ((BR, DR, IR, OR, QR, UR), (omitted))]; Data definitions: [[0, 1, 1, 1], [0, 1, 1, 0], [0, 1, 1, 0], [0, 1, 0, 1], [0, 0, 1, 1], [0, 1, 0, 1], [0, 0, 1, 1], [0, 1, 0, 1], [0, 0, 1, 1]]

The semiconductor memory 10 of each of the above-described first through 71st modifications of the 17th embodiment is capable of performing the same operation as that of the 17th embodiment, and can achieve similar advantageous effects.

[20] 18th Embodiment

The 18th embodiment relates to a method of transferring data between the input/output circuit 19 and the sense amplifier module 17 in the semiconductor memory 10 according to the foregoing embodiments. In the following, differences between the semiconductor memory 10 of the 18th embodiment and that of the first to 17th embodiments will be described.

[20-1] Configuration of Semiconductor Memory 10

FIG. 185 shows a configuration example of the semiconductor memory 10 according to the 18th embodiment. As shown in FIG. 185, the semiconductor memory 10 of the 18th embodiment further includes a first conversion circuit 30 and a second conversion circuit 31.

Each of the first conversion circuit 30 and the second conversion circuit 31 is a logic circuit capable of converting data. The first conversion circuit 30 and the second conversion circuit 31 are coupled in series between the input/output circuit 19 and the logic circuit 18. Specifically, the first conversion circuit 30 is coupled between the input/output circuit 19 and the second conversion circuit 31. The second conversion circuit 31 is coupled between the first conversion circuit 30 and the logic circuit 18.

FIG. 186 shows a more detailed configuration example of the semiconductor memory 10 according to the 18th embodiment. As shown in FIG. 186, in the semiconductor memory 10 of the 18th embodiment, the input/output circuit 19 includes node N10 through node N12, the first conversion circuit 30 includes node N20 through node N24, the second conversion circuit 31 includes node N30 through node N34, and the logic circuit 18 includes node N40 through node N42.

Nodes N10 through N12 in the input/output circuit 19 are coupled to nodes N20 through N22 of the first conversion circuit 30, respectively. Nodes N23 and N24 in the first conversion circuit 30 are coupled to nodes N30 and N31 of the second conversion circuit 31, respectively. Nodes N32 through N34 in the second conversion circuit 31 are coupled to nodes N40 through N42 of the logic circuit 18, respectively. Since the rest of the configuration in the semiconductor memory 10 according to the 18th embodiment is the same as those in the semiconductor memory 10 according to the first embodiment, detailed descriptions of the rest of the configuration are omitted.

Hereinafter, a bus coupling node N10 to node N20 is called bus B10; a bus coupling node N11 to node N21 is called bus B11; a bus coupling node N12 to node N22 is called bus B12; a bus coupling node N23 to node N30 is called bus B20; a bus coupling node N24 to node N31 is called bus B21; a bus coupling node N32 to node N40 is called bus B30; a bus coupling node N33 to node N41 is called bus B31; and a bus coupling node N34 to node N42 is called bus B32.

[20-2] Input and Output Method of Semiconductor Memory 10

FIG. 187 shows an example of a method of inputting and outputting data in the semiconductor memory 10 according to the 18th embodiment. Specifically, FIG. 187 shows an example of voltages of bus B10 through bus B12, bus B20, bus B21, and bus B30 through bus B32 in the case of inputting/outputting 3-bit data between the input/output circuit 19 and the sense amplifier module 17.

As shown in FIG. 187, 3-bit data input into the input/output circuit 19 is sent to the first conversion circuit 30 via bus B10 through bus B12. Each data respectively sent via bus B10 through bus B12 corresponds to "0" data in the case of "H" level, and corresponds to "1" data in the case of "L"-level. The embodiment is not limited to this example, and "1" data and "0" data may be associated with the "H" level and the "L"-level, respectively.

Then, the first conversion circuit 30 performs data conversion to the 3-bit data received via bus B10 through bus B12. Specifically, the first conversion circuit 30 allocates 3-bit data to nine combinations made of three voltages and two buses. Then, the first conversion circuit 30 sends the converted 3-bit data to the second conversion circuit 31 via two buses B20 and B21. In bus B20 and bus B21, the voltages of "H" level, "M" level, and "L" level are used, for example. The "H" level, "M" level, and "L" level in FIG. 187 for example respectively correspond to "Z" level, "A" level, and "B" level in the data allocation shown in FIG. 109.

Upon receipt of the 3-bit data converted by the first conversion circuit 30 via bus B20 and bus B21, the second conversion circuit 31 performs data conversion which is inversion of the data conversion by the first conversion circuit 30. Then, the second conversion circuit 31 sends the converted 3-bit data to the sense amplifier module 17 via two buses B30 through B32. In other words, the second conversion circuit 31 restores the data converted by the first conversion circuit 30 to the data before the conversion, then sends it to the sense amplifier module 17. The data from each of bus B30 through B32 corresponds to "0" data in the case of "H" level, and to "1" data in the case of "L" level, similarly to the case of bus B10 through bus B12, for example.

As descried above, the semiconductor memory 10 of the 18th embodiment can transfer the data input into the input/output circuit 19 to the sense amplifier module 17 via the first conversion circuit 30 and the second conversion circuit 31. Similarly, the semiconductor memory 10 of the 18th embodiment can transfer the data retained in the sense amplifier module 17 to the input/output circuit 19 via the first conversion circuit 30 and the second conversion circuit 31. Since the operation equates inversion of the operation described with reference to FIG. 187, descriptions thereof are omitted.

In other words, in the semiconductor memory 10 according to the 18th embodiment, 3-bit data (first page, second page, third page) is converted to "Z", "A", or "B" state, by the logic circuit on the transmitting side (the first conversion circuit 30 or the second conversion circuit 31), and the data is transferred to two signal lines respectively corresponding to memory cell transistors MTa and MTb, as shown in the table of FIG. 109. Then, the 3-bit data converted into the "Z", "A", or "B" state and transferred to two signal lines is restored as 3-bit data (first page, second page, and third page) by the logic circuit on the receiving side (the second conversion circuit 31 or the first conversion circuit 30).

[20-3] Advantageous Effects of 18th Embodiment

FIG. 188 shows an example of a coupling between the input/output circuit and the logic circuit in the semiconductor memory according to a comparative example of the 18th embodiment. As shown in FIG. 188, in a comparative example of the 18th embodiment, the first conversion circuit 30 and the second conversion circuit 31 are omitted, and nodes N10 through N12 in the input/output circuit 19 are directly coupled to nodes N40 through N42 in the logic circuit 18, respectively. Hereinafter, a bus coupling node N10 to node N40 is called bus B40; a bus coupling node N11 to node N41 is called bus B41; and a bus coupling node N12 to node N42 is called bus B42.

FIG. 189 shows an example of a method of inputting and outputting data in a semiconductor memory according to the comparative example of the 18th embodiment. Specifically, FIG. 189 shows an example of voltages of bus B40 through bus B42 in the case of inputting/outputting 3-bit data between the input/output circuit 19 and the sense amplifier module 17.

As shown in FIG. 189, in the semiconductor memory 10 according to the comparative example of the 18th embodiment, the 3-bit data input to the input/output circuit 19 is sent to the sense amplifier module 17 via bus B40 through bus B42. Each data respectively sent via bus B40 through bus B42 corresponds to "0" data in the case of "H" level, and corresponds to "1" data in the case of "L" level. As described above, in the configuration such as the one in the comparative example of the 18th embodiment, three data buses are provided for the sending of 3-bit data.

In contrast, the semiconductor memory 10 of the 18th embodiment has a configuration in which the number of buses used during the data transfer between the input/output circuit 19 and the sense amplifier module 17 is changed. Specifically, in the semiconductor memory 10 of the 18th embodiment, the number of buses between the first conversion circuit 30 and the second conversion circuit 31 is set lower than that between the input/output circuit 19 and the first conversion circuit 30, and lower than that between the sense amplifier module 17 and the second conversion circuit 31.

Even in such a case, the semiconductor memory 10 of the 18th embodiment can relay the data transfer between the input/output circuit 19 and the sense amplifier module 17 by courtesy of data conversion performed as appropriate between the first conversion circuit 30 and the second conversion circuit 31.

As described above, the semiconductor memory 10 of the 18th embodiment can reduce the number of buses, and decrease the difficulty level for a layout of data buses included in the semiconductor memory 10. Furthermore, the semiconductor memory 10 of the 18th embodiment has a room in the layout because of the reduction in the number of buses, thereby lowering the difficulty level in a layout for the other circuits.

[20-4] Modifications of 18th Embodiment

The above-described configuration and operation of the semiconductor memory 10 of the 18th embodiment are applicable to each of the foregoing first through 17th embodiments and data lines used in other circuits. Furthermore, in the 18th embodiments, the logic circuit 18 is coupled between the input/output circuit 19 and the sense amplifier module 17; however, the logic circuit 18 is optional.

FIG. 190 shows a configuration example of the semiconductor memory 10 according to the first modification of the 18th embodiment. As shown in FIG. 190, in the semiconductor memory 10, the logic circuit 18 may be omitted, and the sense amplifier module 17 and the second conversion circuit 31 may be coupled by a bus BUS.

In the configuration shown in FIG. 190, similar to FIG. 112, a plurality of sense amplifier sets SAS are provided, and one of the sense amplifier units SAU in each sense amplifier set SAS is coupled to a bus BUS. As the first modification of the 18th embodiment, similarly to FIG. 107, both of the sense amplifier units SAU of each sense amplifier set SAS may be coupled to a bus BUS.

A method of reducing the number of buses with the use of a set of the first conversion circuit 30 and the second conversion circuit 31 is applicable to interconnects that couples the semiconductor memory 10 to the memory controller 20. FIG. 191 shows a configuration example of a memory system 1 that includes a semiconductor memory 10 according to the second modification of the 18th embodiment. As shown in FIG. 191, in the second modification of the 18th embodiment, the input/output circuit 19 in the semiconductor memory 10 includes the second conversion circuit 31, and the NAND interface circuit 26 in the memory controller 20 includes the first conversion circuit 30.

In other words, in the configuration example shown in FIG. 191, the semiconductor memory 10 includes the second conversion circuit 31, and the memory controller 20 includes the first conversion circuit 30. In this case, multiple-bit data converted by the first conversion circuit 30 or the second conversion circuit 31 is sent/received between the semiconductor memory 10 and the memory controller 20 as an input/output signal I/O. In the present example, at least the first conversion circuit 30 is included in the memory controller 20, and at least the second conversion circuit 31 is included in the semiconductor memory 10.

It is thereby possible to reduce the number of interconnects between the semiconductor memory 10 and the memory controller 20 in the memory system 1 according to the second modification of the 18th embodiment. A set of the first conversion circuit 30 and the second conversion circuit 31 can be provided at a discretionary location. In other words, each of the semiconductor memory 10 and the memory controller 20 may include multiple sets of the first conversion circuit 30 and the second conversion circuit 31. A set of the first conversion circuit 30 and the second conversion circuit 31 can be provided in each of two semiconductor chips.

[21] Other Modifications Etc.

A semiconductor memory according to an embodiment includes a plurality of first and second memory cells, first and second memory cell arrays, first and second word lines, and controller. Each of the first and second memory cells is configured to have any one of first, second, third, fourth, fifth, sixth, seventh, or eighth threshold voltages. The second threshold voltage is higher than the first threshold voltage. The third threshold voltage is higher than the second threshold voltage. The fourth threshold voltage is higher than the third threshold voltage. The fifth threshold voltage is higher than the fourth threshold voltage. The sixth threshold voltage is higher than the fifth threshold voltage. The seventh threshold voltage is higher than the sixth threshold voltage. The eighth threshold voltage is higher than the seventh threshold voltage. The first memory cell array includes the first memory cells. The second memory cell array includes the second memory cells. The first word line is coupled to the first memory cells. The second word line is coupled to the second memory cells. Data of six or more bits including a first bit, a second bit, a third bit, a fourth bit, a fifth bit, and a sixth bit is stored with the use of a combination of a threshold voltage of the first memory cell and a threshold voltage of the second memory cell. In a read operation for a first page which includes the first bit, the controller reads first data from the first memory cells by applying at least one type of read voltage to the first word line, and externally outputs data of the first page which is confirmed based on the first data. In a read operation for a second page which includes the second bit, the controller reads second data from the second memory cells by applying at least one type of read voltage to the second word line, and externally outputs data of the second page which is confirmed based on the second data. In a read operation for a third page which includes the third bit, the controller reads third data from the first memory cells by applying at least one type of read voltage to the first word line, and reads fourth data from the second memory cells by applying at least one type of read voltage to the second word line, and externally outputs data of the third page which is confirmed based on the third data and the fourth data. It is thereby possible to enhance the speed of a read operation in the semiconductor memory.

Each of the modifications of the foregoing embodiments shows the case where multiple-bit data is stored in a combination of a memory cell transistor MT in plane PL1 and a memory cell transistor MT in plane PL2; however, the modifications are not limited thereto. Each of the modifications may be similarly applied to the case where multiple-bit data is stored in a combination of memory cell transistors MTa and MTb coupled to a common word line.

As described in the sixth, 15th and 16th embodiments, a method of storing multiple-bit data with the use of a plurality of memory cell transistors may be achieved by a two-stage write operation. In the present specification, two, three, or four types of threshold distributions are formed in a first-stage write operation, and eight or 16 types of threshold distributions are formed in a second-stage write operation. In the method of storing multiple-bit data in two memory cell transistors MT, a discretionary combination can be made between the number of bits of data to be written in a first write and the number of bits of data to be written in a second write. Data allocation to memory cell transistors MTa and MTb in the first and second writes can be designed as appropriate. Furthermore, a write operation having three or more stages may be performed, similarly to the write operation in the sixth, 15th, and 16th embodiments.

In the foregoing embodiments, the case of storing multiple-bit data in a combination of two memory cell transistors MT was described; however, multiple-bit data may be stored in a combination of three or more memory cell transistors MT. The number of planes PL included in the semiconductor memory 10 is not limited to two; rather, the semiconductor memory 10 may include three or more planes PL.

Furthermore, the semiconductor memory 10 of each of the foregoing embodiments may store multiple-bit data using a plurality of memory cell transistors MT coupled to a common word line WL (as shown in FIG. 83, which was described in the 10th embodiment). In this case, the semiconductor memory 10 has a logic circuit 18 located outside of the memory cell array 11, for example, and externally outputs data through the execution of computation processing by the logic circuit 18 when the data is output.

When multiple-bit data is stored in a combination of three or more memory cell transistors MT, the number of buses BUS coupled to the logic circuit 18 is three or more. As for the arrangement of the memory cell transistors MT, the memory cell transistors MT are at least coupled to word line WLi, and may be arranged at discretionary locations. Similarly, the bit lines BL and sense amplifier units SAU coupled to the memory cell transistors MT may be arranged as appropriate, in accordance with the locations of the memory cell transistors MT.

Furthermore, the semiconductor memory 10 of each of the foregoing embodiments may store multiple-bit data using a plurality of memory cell transistors MT coupled to a common word line WL (as shown in FIGS. 107 and 112 described in the 14th embodiment). In this case, the semiconductor memory 10 may be designed in such a manner that two sense amplifier units SAU, respectively coupled to two associated memory cell transistors MT, are arranged closely, and the logic circuit 18 located outside of the memory cell array 11 may be either omitted or left to only partially perform its function. Furthermore, the semiconductor memory 10 can externally output data by execution of computation processing within the associated two sense amplifier units SAU.

Herein, an example of the operation when the semiconductor memory 10 has a structure shown in FIGS. 112 and 148, and when the computing processing is executed in sense amplifier set SAS0, will be described with reference to FIG. 184. FIG. 184 shows an example of the relationship between the input data and data definitions in a read operation. The "input data" in FIG. 184 corresponds to read results in each sense amplifier unit SAU, and read results of sense amplifier units SAU0 and SAU1 respectively correspond to "first data" and "second data". Each of "w", "x", "y", "z" in FIG. 184 corresponds to a data definition, and "0" or "1" is allocated thereto.

As shown in FIG. 184, "w" corresponds to a data definition when the first data is "1" data, and the second data is "1" data. "x" corresponds to a data definition when the first data is "1" data, and the second data is "0" data. "y" corresponds to a data definition when the first data is "0" data, and the second data is "1" data. "z" corresponds to a data definition when the first data is "0" data, and the second data is "0" data.

The semiconductor memory 10 determines output data in accordance with a computation table of data definitions shown in FIG. 184, and values of read results (input data) of sense amplifier units SAU0 and SAU1. Examples of computation processing in the case where the read result of sense amplifier unit SAU0 is stored in the latch circuit ADL1, and the read result of sense amplifier unit SAU1 is stored in the latch circuit ADL2, are listed below:

Data definition [0001 (w/x/y/z)]: XDL1=ADL1&ADL2
Data definition [0010]: XDL1=ADL1&~ADL2
Data definition [0011]: XDL1=ADL1
Data definition [0100]: XDL1=~ADL1&ADL2
Data definition [0101]: XDL1=ADL2
Data definition [0110]: XDL1=ADL1^ADL2
Data definition [0111]: XDL1=ADL1|ADL2

Data obtained by inverting the data stored in the latch circuit XDL1 under the data definition [0xyz] is stored in the latch circuit XDL1 under the data definition [1xyz]. The semiconductor memory 10 can perform computation processing within a sense amplifier unit SAS as described above, and can confirm output data without use of the logic circuit 18. The computation processing in the sense amplifier set SAS, described with reference to FIG. 184, may be applied to the case where multiple-bit data is stored in two memory cell transistors MT coupled to a common word line WL in the other embodiments.

If there are any defects in a plurality of associated memory cell transistors MT, and a bit line BL and a sense amplifier unit SAU coupled to the memory cell transistors MT, a set of consisting of a plurality of defective associated memory cell transistors MT, a bit line BL coupled to the memory cell transistors MT, and a sense amplifier unit SAU may be replaced with column redundancy. Column redundancy in this example is a set consisting of a plurality of associated memory cell transistors MT, a bit line BL coupled to the memory cell transistors MT, and a sense amplifier unit SAU, which corresponds to a storage region reserved as a redundant region in the semiconductor memory 10.

In the foregoing embodiments, there may be a combination of two memory cell transistors MT that is not used.

For example, in the 10th embodiment, six threshold states are set for one memory cell transistor MT, and 5-bit data is stored using two memory cell transistors MT. The storage of 5-bit data is possible if there are at least $2^5=32$ states. Since there are $6 \times 6=36$ combinations of threshold voltages of two memory cell transistors MT in the 10th embodiment, four combinations are surplus.

In the 11th embodiment, 12 threshold states are provided in one memory cell transistor MT, and 7-bit data is stored using two memory cell transistors MT. The storage of 7-bit data is possible if there are at least $2^7=128$ states. Since there are $12 \times 12=144$ combinations of threshold voltages of two memory cell transistors MT in the 11th embodiment, 16 combinations are surplus.

In the 17th embodiment, 24 threshold states are provided in one memory cell transistor MT, and 9-bit data is stored using two memory cell transistors MT. The storage of 9-bit data is possible if there are at least $2^9=512$ states. Since there are 24×24=576 combinations of threshold voltages of two memory cell transistors MT in the 17th embodiment, 47 combinations are surplus.

In the 14th embodiment, three threshold states are provided in one memory cell transistor, and 3-bit data is stored using two memory cell transistors MT. The storage of 3-bit data is possible if there are at least $2^3$=8 states. Since there are 3×3=9 combinations of threshold voltages of two memory cell transistors MT in the 14th embodiment, one combination is surplus. For example, in the 14th embodiment, the state corresponding to (4) in FIG. 109 is not used.

The semiconductor memory 10 may use such an extra state to store some kind of data. For example, data indicating defects of a memory cell transistor MT or secret data may be stored in such an extra state.

As a modification of the 17th embodiment, 23 types of threshold voltage states may be provided in one memory cell transistor MT. In this case, there are 23×23=529 combinations of the threshold voltages of two memory cell transistors MT, and the number is higher than $2^9$=512 states required for storing 9-bit data. For this reason, the semiconductor memory 10 in the present modification, 9-bit data can be stored, similar to the 17th embodiment.

As another modification, 7 types of threshold voltage states may be provided in one memory cell transistor MT. In this case, there are 7×7×7=343 combinations of the threshold voltages of three memory cell transistors MT, and the number is higher than $2^8$=256 states required for storing 8-bit data. For this reason, the semiconductor memory 10 in the present modification, 8-bit data can be stored, similar to the previous embodiment.

As still another modification, 11 types of threshold voltage states may be provided in one memory cell transistor MT. In this case, there are 11×11×11=1331 combinations of the threshold voltages of three memory cell transistors MT, and the number is higher than $2^{10}$=1024 states required for storing 10-bit data. For this reason, the semiconductor memory 10 in the present modification, 10-bit data can be stored, similar to the previous embodiment.

As still another modification, 13 types of threshold voltage states may be provided in one memory cell transistor MT. In this case, there are 13×13×13=2197 combinations of the threshold voltages of three memory cell transistors MT, and the number is higher than $2^{11}$=2048 states required for storing 11-bit data. For this reason, the semiconductor memory 10 in the present modification, 11-bit data can be stored, similar to the previous embodiment.

As still another modification, 21 types of threshold voltage states may be provided in one memory cell transistor MT. In this case, there are 21×21×21=9261 combinations of the threshold voltages of three memory cell transistors MT, and the number is higher than $2^{13}$=8192 states required for storing 13-bit data. For this reason, the semiconductor memory 10 in the present modification, 13-bit data can be stored, similar to the previous embodiment.

As still another modification, 7 types of threshold voltage states may be provided in one memory cell transistor MT. In this case, there are 7×7×7×7=2401 combinations of the threshold voltages of four memory cell transistors MT, and the number is higher than $2^{11}$=2048 states required for storing 11-bit data. For this reason, the semiconductor memory 10 in the present modification, 11-bit data can be stored, similar to the previous embodiment.

As still another modification, 10 types of threshold voltage states may be provided in one memory cell transistor MT. In this case, there are 10×10×10×10=10000 combinations of the threshold voltages of four memory cell transistors MT, and the number is higher than $2^{13}$=8192 states required for storing 13-bit data. For this reason, the semiconductor memory 10 in the present modification, 13-bit data can be stored, similar to the previous embodiment.

As still another modification, 14 types of threshold voltage states may be provided in one memory cell transistor MT. In this case, there are 14×14×14×14=38416 combinations of the threshold voltages of four memory cell transistors MT, and the number is higher than $2^{15}$=32768 states required for storing 15-bit data. For this reason, the semiconductor memory 10 in the present modification, 15-bit data can be stored, similar to the previous embodiment.

As still another modification, 20 types of threshold voltage states may be provided in one memory cell transistor MT. In this case, there are 20×20×20×20=160000 combinations of the threshold voltages of four memory cell transistors MT, and the number is higher than $2^{17}$=131072 states required for storing 17-bit data. For this reason, the semiconductor memory 10 in the present modification, 17-bit data can be stored, similar to the previous embodiment.

Such a method has various applications. For example, m threshold voltage states (m is a natural number) may be provided for one memory cell transistor MT, and k-bit data ($2^k \le m^n$) may be stored in n memory cell transistors MT (n is a natural number). In the present example, some kind of data may be stored in extra ($m^n - 2^k$) states.

Data allocation, similar to that in the case where four threshold voltage states are provided to one memory cell transistor MT, may be applied to the case where three threshold voltage states are provided in one memory cell transistor MT, as in the 14th embodiment. In this case, an external memory controller 20 controls in such a way that one of four threshold voltage states is not used but the data allocation corresponding to three (=4−1) types of threshold voltage states is used.

This is applicable to the other embodiments; for example, if 6, 12, or 24 (23) types of threshold voltage states are provided to one memory cell transistor MT, a data allocation similar to that in the case where 8, 16, or 32 types of threshold voltages states are provided for one memory cell transistor MT for data storage may be used.

If six types of threshold voltage states are provided in one memory cell transistor MT, the memory controller 20 controls in such a way that two of eight threshold voltage states are not used, and the data allocation corresponding to six (=8−2) types of threshold voltage states is used. If 12 types of threshold voltage states are provided in one memory cell transistor MT, the memory controller 20 controls so that four of 16 threshold voltages distributions are not used, and the data allocation corresponding to 12 (=16−4) types of threshold voltage states is used. If 24 (23) types of threshold voltage states are provided in one memory cell transistor MT, the memory controller 20 controls in such a way that eight of 32 threshold voltages distributions are not used, and the data allocation corresponding to 24 (=32−8) types of threshold voltage states is used.

In the semiconductor memory 10 of the foregoing embodiments, after storing data in the memory cells, the threshold distributions of said memory cells may be shifted due to data retention, etc. The semiconductor memory 10 may perform a method of determining an optimal read voltage through the performance of reading with the use of a slightly-shifted read voltage, whereby searches for valleys of a threshold distribution, or a method of re-reading with a corrected read voltage after errors are corrected by the ECC circuit 25. Such a method of correcting threshold voltages may be applied to any of the foregoing embodiments. The semiconductor memory 10 of the foregoing embodiments can improve reliability of data after data retention through correction of the read voltages of two or more memory cell transistors MT as appropriate.

In the foregoing embodiments, an example where data is confirmed by the logic circuit 18 shown in FIG. 1 or a set of sense amplifier units SAU (m−1) and SAUm shown in FIG. 112 with the use of a plurality of read results obtained from a plurality of memory cell transistors MT, was described. If reading is performed with the use of a slightly-shifted read voltage, a read operation in which a same shift value or a different shift value is applied to a plurality of memory cell transistors MT is executed, and data is confirmed through computation executed by the logic circuit 18 shown in FIG. 1 or a set of amplifier units SAU (m−1) and SAUm shown in FIG. 112. Such a read operation with the use of shift values is called "shift read", for example.

As a different method, in the case of the shift read, a read result may be externally output without involving the logic circuit 18 shown in FIG. 1, or without the execution of computation by a set of amplifier units SAU (m−1) and SAUm shown in FIG. 112. An optimal read voltage may be determined for each memory cell transistor MT in accordance with output data based on these read results.

In the foregoing embodiments and modifications, data allocation corresponding to each page may be changed as appropriate. For example, in the first embodiment, the data allocations applied to the third and fourth pages may be interchanged. Data allocation for other pages is also interchangeable. Even in such a case, courtesy of setting an optimal read voltage for each page, it is possible to store data in a manner similar to the foregoing embodiments.

In the read operation described in the foregoing embodiments, as a preparation to data output, initial data of a cell unit CU from the read data confirmed by the first plane read or the second plane read can be transferred near an output circuit through the use of a pipeline, in advance of the time when the semiconductor memory 10 switches to a ready status.

The order of the first and second stages of the write as described in the sixth embodiment is merely an example, and can be discretionarily determined. At least, the second stage write in which a cell unit CU is selected should be performed after the first stage write in which a cell unit CU adjacent to the selected cell unit CU is performed.

For example, the two-stage write operation described in the sixth embodiment may be performed in the order shown in FIG. 123. FIG. 123 is a flow chart showing an example of an order of write in a write operation in the semiconductor memory 10, according to a modification the sixth embodiment.

As shown in FIG. 123, the processes in steps S20 through S22 are performed, similarly to the 6th embodiment. After the first-stage write is performed in step S22, the process in step S24 is performed.

If j=3 does not hold true at the time when the first stage write in step S24 is finished (No in step S24), the variable j is incremented (step S25), and the operation in step S22 is repeated. On the other hand, if j=3 holds true (Yes in step S24), the variable j is reset (j=0) (step S30), and the write in the second stage is performed in step S23.

If j=3 does not hold true at the time when the second stage write in step S23 is finished (No in step S31), the variable j is incremented (step S32), and the process in step S23 is repeated. If j=3 holds true (Yes in step S31), the process in step S26 is performed, and the value of the variable i is checked.

If i=7 does not hold true (No in step S26), the process returns to step S21, and after the variable i is incremented and the variable j is reset, the process in step S22 and thereafter is repeated. If i=7 holds true on the other hand (Yes in step S26), the process in step S27 is performed, and word line WLi (i=7) is selected, and the write in the second stage in which string units SU0 through SU3 are selected in the order is performed. The two-stage write operation described in the sixth embodiment is applicable to the eighth embodiment. When 16 threshold distributions are formed as in the eighth embodiment, data reliability can be improved through the performance of a two-stage write operation.

A method of the two-stage write operation is not limited to the method described in the sixth embodiment. For example, the semiconductor memory 10 performs writing in an adjacent cell after forming 16 threshold distributions by a write operation in the first stage. Thereafter, the semiconductor memory 10 may form 16 threshold distributions through a write operation in the second stage.

In this case, since precise 16 threshold distribution are formed through the second-stage write operation, the number of the threshold distributions formed by the first-stage write operation may be reduced. In other words, 16 threshold distributions are not necessarily formed in the first-stage write operation; rather, the speed of the first-stage write operation can be enhanced by the formation of, for example, eight or four threshold distributions in the first stage.

The verify voltage in the first-stage write operation may be lower than the verify voltage in the second-stage write operation. In other words, 16 precise threshold distribution may be formed through the second-stage write operation, after 16 rough threshold distributions are formed by the first-stage write operation.

In the read and write operations explained in the foregoing embodiments, operation timing may be different among multiple planes. For example, the timing of applying a program voltage VPGM to a selected word line WLsel in a first write operation performed in plane PL1, and in a second write operation performed in plane PL2, may differ.

In the write operation described in the foregoing embodiments, when a write process is performed to the memory cell transistors MT with threshold voltages already raised, the sequencer 14 may perform the write process in the same state again, without setting the memory cell transistors MT to be write-inhibited. Furthermore, the sequencer 14 may perform a verify operation in advance of an initial loop when performing an operation of writing to a page higher than the first page.

In each of the write operation and the read operation in the foregoing embodiments, a voltage to be applied to a selected word line WLsel is, for example, the same as the voltage of a signal line CG that supplies voltages to the low decoder module 16 from the driver circuit 15. In other words, voltages applied to the lines, and a period during which each of the voltages is applied, can be roughly ascertained by checking a voltage of a signal line CG corresponding to a line.

To estimate voltages applied to a selected gate line and word lines, etc. based on the voltages applied to each signal line coupled to the driver circuit 15, a voltage drop due to a transistor TR included in a row decoder RD may be considered. In this case, the voltages applied to each of a selected gate line and word lines will be lowered by an amount of a voltage drop occurring due to the transistor TR, compared to the voltages applied to the signal lines respectively corresponding to those lines.

In the foregoing embodiments, the driver circuit 15 of the semiconductor memory 10 separately generates voltages to be applied to the memory cell array 11A in plane PL1 and to the memory cell array 11B in plane PL2; however, the embodiments are not limited thereto.

FIG. 124 shows a detailed configuration example of the sense amplifier module 15 included in the semiconductor memory 10 of the first embodiment. As shown in FIG. 124, the driver circuit 15 of the first embodiment includes a first driver circuit DRV1 and a second driver circuit DRV2, for example.

The first driver circuit DRV1 is a circuit for generating voltages to be applied to a word line WL, etc. corresponding to the memory cell array 11A in a read operation and a verify operation. The second driver circuit DRV2 is a circuit for generating voltages to be applied to a word line WL, etc. corresponding to the memory cell array 11B in a read operation and a verify operation.

Thus, in the semiconductor memory 10 of the first embodiment, the first driver circuit DRV1 corresponds to the memory cell array 11A, and the second driver circuit DRV2 corresponds to the memory cell array 11B. In the semiconductor memory 10 of the first embodiment, the first driver circuit DRV1 and the second driver circuit DRV2 are individually operated in a read operation and a verify operation.

FIG. 125 shows an example of a detailed configuration of the driver circuit 15 of the semiconductor memory 10 according to a modification of the first embodiment. As shown in FIG. 125, in a modification of the first embodiment, the driver circuit 15 has a configuration similar to that in the first embodiment, while transistors T0 and T1 are provided between the driver circuit 15 and the memory cell arrays 11A and 11B.

Transistor T0 is coupled to the first driver circuit DRV1 and the memory cell array 11B. Transistor T1 is coupled to the second driver circuit DRV2 and the memory cell array 11B. The control signals S0 and S1 respectively input to the gates of transistors T0 and T1 are generated by the sequencer 14, for example. Although not shown, a plurality of transistors T0 or T1 may be provided in accordance with the number of interconnects coupled to the memory cell array 11, for example.

In the semiconductor memory 10 according to a modification of the first embodiment, in a read operation, if different voltages are applied to plane PL1 and plane PL2, corresponding transistor T0 is controlled to be in an "off" state, and corresponding transistor T1 is controlled to be in an "on" state. As a result, the voltages generated by the first driver circuit DRV1 and the second driver circuit DRV2 are transferred to the memory cell arrays 11A and 11B.

On the other hand, in the semiconductor memory 10 according to a modification of the first embodiment, in a read operation, when the same voltage is applied to plane PL1 and plane PL2, corresponding transistor T0 is controlled to be in an "on" state, and corresponding transistor T1 is controlled to be in an "off" state. As a result, the voltages generated by the first driver circuit DRV1 are transferred to the memory cell arrays 11A and 11B.

Thus, the semiconductor memory 10 of the modification of the first embodiment can omit the operation in the second driver circuit DRV2 as needed. As a result, the semiconductor memory 10 according to the modification of the first embodiment can reduce power consumption in a read operation and a verify operation. The configuration and operation in the modification of the first embodiment, described with reference to FIG. 125, can be combined with the other embodiments.

In the foregoing embodiments, each of the commands "xxh", "yyh", "zzh", "xyh", "xzh", "yxh", "yzh", "zxh", and 'zyh" used in the descriptions of the embodiments may be replaced with a command as appropriate.

In the foregoing embodiments, the examples in which commands "01h" through "08h" as commands for instructing operations corresponding to the first to eighth pages are described; however, the commands used in the embodiments are not limited thereto. For example, the commands "01h" through "08h" may be replaced with other commands, or may be omitted if address information ADD includes page information.

The configuration of the memory cell array 11 in the foregoing embodiments may have a different configuration. As for the other configurations in the memory cell array 11, they are described in, for example, U.S. patent application Ser. No. 12/407,403 filed on Mar. 19, 2009 and entitled "THREE-DIMENSIONALLY STACKED NON-VOLATILE SEMICONDUCTOR MEMORY", U.S. patent application Ser. No. 12/406,524 filed on Mar. 18, 2009 and entitled "THREE-DIMENSIONALLY STACKED NON-VOLATILE SEMICONDUCTOR MEMORY", U.S. patent application Ser. No. 12/679,991 filed on Mar. 25, 2010 and entitled "NON-VOLATILE SEMICONDUCTOR STORAGE DEVICE AND METHOD OF MANUFACTURING THE SAME", and U.S. patent application Ser. No. 12/532,030 filed on Mar. 23, 2009 and entitled "SEMICONDUCTOR MEMORY AND MANUFACTURING METHOD THEREOF" are applied. The entire contents of these applications are incorporated herein by reference.

In the foregoing embodiments, the memory cell transistors MT provided in the memory cell array 11 are three-dimensionally stacked; however, the embodiments are not limited to this example. For example, the memory cell array 11 may be configured to be a flat NAND flash memory in which memory cell transistors MT are two-dimensionally arranged. Even in this configuration, the above embodiments can be realized, and similar advantageous effects can be achieved.

In the foregoing embodiments, a block BLK need not be a unit of erasure. The erase operation is described in, for example, "NON-VOLATILE SEMICONDUCTOR MEMORY DEVICE", which was filed under U.S. patent application Ser. No. 13/235,389 on Sep. 18, 2011, and in "NON-VOLATILE SEMICONDUCTOR MEMORY DEVICE", which was filed under U.S. patent application Ser. No. 12/694,690 on Jan. 27, 2010. The entire contents of these applications are incorporated herein by reference.

In the foregoing embodiments, the method of reducing the number of times of performing a read by storing multiple-bit data in two memory cells is described; however, an erase operation to a memory cell storing multiple-bit data may be simultaneously performed. In order to do this, a source line SL, or a well line in the memory cell array 11 in which a memory cell storing multiple-bit data, may be coupled in common. Furthermore, a selected gate line SGD or SGS may be controlled by one driver circuit as a common interconnect.

In the foregoing embodiments, the examples of the semiconductor memory 10 having two memory cell arrays 11 are described; however, the semiconductor memory 10 may have four or more memory cell arrays 11. FIG. 126 shows the semiconductor memory 10 according to the modification of the first embodiment.

As shown in FIG. 126, in the modification of the first embodiment, the semiconductor memory 10 has four memory cell arrays 11A, 11B, 11C, and 11D (planes PL1 through PL4). In the modification of the first embodiment, plane PL1 and plane PL2 constitute group GR1, and plane PL3 and plane PL4 constitute group GR2.

In the present example, each of group GR1 and group GR2 is controlled in a manner similar to the control of the set of plane PL1 and plane PL2 as described in, for example, the first embodiment. Thus, the semiconductor memory 10 may have two or more sets of two planes, like the one explained in the first embodiment.

The semiconductor memory 10 according to the modification of the first embodiment may input write data that is externally obtained, or externally output read data in plane PL2, while performing a write operation or a read operation in group GR1. The configuration and operation in the modification of the first embodiment described with reference to FIG. 126 can be combined with the other embodiments.

In a write operation in the foregoing embodiments, when a plurality of threshold distributions are formed, it is preferable to form the "Z"-state (which is an erase state) threshold distribution and each of the remainder of the threshold distributions so as to be narrow. For such narrowly-formed distributions, the semiconductor memory 10 can perform two types of verify operations corresponding to each write state. Of these verify operations, the one is verify read using a normal verify voltage (e.g., a verify voltage AV) (hereinafter "V" verify), and the other is verify read using a verify voltage lower than the normal verify voltage (hereinafter "VL" verify).

In a program loop, the sequencer 14 successively performs the "VL" verify and the "V" verify, for example. Then, in a program operation, while a program voltage is being applied to a selected word line WLsel, a ground voltage VSS is applied to a bit line BL corresponding to a sense amplifier module 17 that has not passed the "VL" verify; a voltage VQPW higher than the ground voltage VSS is applied to a bit line BL corresponding to the sense amplifier module 17 that has passed the "VL" verify; and a voltage VBL higher than the voltage VQPW is applied to a bit line BL corresponding to the sense amplifier module 17 that has passed the "V" verify, for example. In the program operation, a rise of a threshold voltage of a memory cell transistor MT when the voltage VQPW is applied to the corresponding bit line BL is smaller than a rise of a threshold voltage of a memory cell transistor MT when the voltage VSS is applied to the corresponding bit line BL.

The semiconductor memory 10 can thereby make the threshold distribution of a memory cell transistors MT that has passed the "V" verify narrower than the threshold distribution of a memory cell transistor MT when the "VL" verify is not used. Furthermore, when such a write operation is performed, flag information indicating whether or not a memory cell transistor MT has passed the "VL" verify is allocated to the latch circuit. Hereinafter, a data write method using two verify voltages will be called "quick pass write (QPW)". Data indicating whether or not a memory cell transistor MT has passed the "VL" verify relating to the QPW will be called "QPW data".

In the foregoing descriptions, the 3-value, 4-value, 6-value, 8-value, 12-value, and 16-value writes respectively refer to the write operations in which three types, four types, six types, eight types, 12 types, and 16 types of threshold distributions of the memory cell transistors MT are formed.

FIG. 127 shows an example of assignment of the latch circuits at the time of performing a 16-value write, and an example of an operation where 4-bit data is stored in a 16-value write, and five latch circuits SDL, ADL, BDL, CDL, and XDL are used. FIG. 128 shows an example of changing the assignment shown in FIG. 127 caused by the progress of the write operation.

As shown in FIG. 127, if 4-bit data is stored by a 16-value write, the write states are distinguished by, for example, four latch circuits ADL, BDL, CDL, and XDL, and the QPW data is retained in the latch circuit SDL. In the example shown in FIG. 127, QPW is not performed to the "S15" state. Since a write operation starts with a lower threshold voltage state, the sequencer 14 changes the assignment of the latch circuits as appropriate, as shown in FIG. 128.

As shown in (1) of FIG. 128, when the write in the "S1" state through the "S8" state is finished, the latch circuit XDL becomes no longer necessary for writing. For this reason, after the write in the "S1" state through the "S8" state is finished, the sequencer 14 uses the latch circuit XDL as a cache for write data of a next page.

As shown in (2) of FIG. 128, when the write in the "S1" state through the "S12" state is finished, the latch circuit CDL no longer becomes necessary for writing. For this reason, after the write in the "S1" state through the "S12" state is finished, the sequencer 14 uses the latch circuit CDL as a cache for write data of a next page.

As shown in (3) of FIG. 128, when the write in the "S1" state through the "S13" state is finished, the latch circuit BDL no longer becomes necessary for writing. For this reason, after the write in the "S1" state through the "S13" state is finished, the sequencer 14 uses the latch circuit BDL as a cache for write data of a next page.

As shown in (4) of FIG. 128, when the write in the "S1" state through the "S14" state is finished, the latch circuit ADL no longer becomes necessary for writing. For this reason, after the write in the "S1" state through the "S14" state is finished, the sequencer 14 uses the latch circuit ADL as a cache for write data of a next page.

FIG. 129 shows an example of assignment of the latch circuits at the time of performing a 12-value write, and an example of an operation where 4-bit data is stored in a 12-value write, and five latch circuits SDL, ADL, BDL, CDL, and XDL are used. FIG. 130 shows an example of changing the assignment shown in FIG. 129 caused by the progress of the write operation.

As shown in FIG. 129, if 4-bit data is stored in a 12-value write, the write states are distinguished by, for example, four latch circuits ADL, BDL, CDL, and XDL, and QPW data is retained in the latch circuit SDL. In the example shown in FIG. 129, the QPW is not performed to the "S11" state. Since a write operation starts with a lower threshold voltage state, the sequencer 14 changes the assignment of the latch circuits as appropriate, as shown in FIG. 130.

As shown in (1) of FIG. 130, when the write in the "S1" state through the "S4" state is finished, the latch circuit XDL no longer becomes necessary for writing. For this reason, after the write in the "S1" state through the "S4" state is finished, the sequencer 14 uses the latch circuit XDL as a cache for write data of a next page.

As shown in (2) of FIG. 130, when the write in the "S1" state through the "S8" state is finished, the latch circuit CDL no becomes longer necessary for writing. For this reason, after the write in the "S1" state through the "S8" state is finished, the sequencer 14 uses the latch circuit CDL as a cache for write data of a next page.

As shown in (3) of FIG. 130, when the write in the "S1" state through the "S9" state is finished, the latch circuit BDL no longer becomes necessary for writing. For this reason, after the write in the "S1" state through the "S9" state is finished, the sequencer 14 uses the latch circuit BDL as a cache for write data of a next page.

As shown in (4) of FIG. 130, when the write in the "S1" state through the "S10" state is finished, the latch circuit ADL no longer becomes necessary for writing. For this reason, after the write in the "S1" state through the "S10" state is finished, the sequencer 14 uses the latch circuit ADL as a cache for write data of a next page.

As described above, the number of the latch circuits required for a 12-value write is the same as that for a 16-value write, for example. On the other hand, in the case of the 12-value write, the latch circuit XDL can be used as a cache for next write data when the "S4"-state write is finished; thus, the performance is improved compared to the 16-value write.

FIG. 131 shows an example of the assignment of the latch circuits at the time of performing an 8-value write, and an example of the operation when 3-bit data is stored in the 8-value write and four latch circuits SDL, ADL, BDL, and XDL are used. FIG. 132 shows an example of changing the assignment shown in FIG. 131 caused by the progress of the write operation.

As shown in FIG. 131, if 3-bit data is stored in a 8-value write, the write states are distinguished by, for example, three latch circuits ADL, BDL, and XDL, and the QPW data is retained in the latch circuit SDL. In the example shown in FIG. 131, the QPW is not performed to the "G" state. Since a write operation starts with a lower threshold voltage state, the sequencer 14 changes the assignment of the latch circuits as appropriate, as shown in FIG. 132.

As shown in (1) of FIG. 132, when the write in the "A" state through the "D" state is finished, the latch circuit XDL no longer becomes necessary for writing. For this reason, after the write in the "A" state through the "D" state is finished, the sequencer 14 uses the latch circuit XDL as a cache for write data of a next page.

As shown in (2) of FIG. 132, when the write in the "A" state through the "E" state is finished, the latch circuit BDL no longer becomes necessary for writing. For this reason, after the write in the "A" state through the "E" state is finished, the sequencer 14 uses the latch circuit BDL as a cache for write data of a next page.

As shown in (3) of FIG. 132, when the write in the "A" state through the "F" state is finished, the latch circuit ADL no longer becomes necessary for writing. For this reason, after the write in the "A" state through the "F" state is finished, the sequencer 14 uses the latch circuit ADL as a cache for write data of a next page.

FIG. 133 shows an example of the assignment of the latch circuits at the time of performing a 6-value write, and an example of the operation when 3-bit data is stored in the 6-value write and four latch circuits SDL, ADL, BDL, and XDL are used. FIG. 134 shows an example of changing of the assignment shown in FIG. 133 caused by the progress of the write operation.

As shown in FIG. 133, if 3-bit data is stored in a 6-value write, the write states are distinguished by, for example, three latch circuits ADL, BDL, and XDL, and the QPW data is retained in the latch circuit SDL. In the example shown in FIG. 133, the QPW is not performed to the "E" state. Since a write operation starts with a lower threshold voltage state, the sequencer 14 changes the assignment of the latch circuits as appropriate, as shown in FIG. 134.

As shown in (1) of FIG. 134, when the write in the "A" state through the "B" state is finished, the latch circuit XDL no longer becomes necessary for writing. For this reason, after the write in the "A" state through the "B" state is finished, the sequencer 14 uses the latch circuit XDL as a cache for write data of a next page.

As shown in (2) of FIG. 134, when the write in the "A" state through the "C" state is finished, the latch circuit BDL no longer becomes necessary for writing. For this reason, after the write in the "A" state through the "C" state is finished, the sequencer 14 uses the latch circuit BDL as a cache for write data of a next page.

As shown in (3) of FIG. 134, when the write in the "A" state through the "D" state is finished, the latch circuit ADL no longer becomes necessary for writing. For this reason, after the write in the "A" state through the "D" state is finished, the sequencer 14 uses the latch circuit ADL as a cache for write data of a next page.

As described above, the number of the latch circuits required for a 6-value write is the same as that for an 8-value write, for example. On the other hand, in the case of the 6-value write, the latch circuit XDL can be used as a cache for next write data when the "B"-state write is finished; thus, the performance is improved compared to the 8-value write.

FIG. 135 shows an example of the assignment of the latch circuits at the time of performing a 4-value write, and an example of the operation when 2-bit data is stored in the 4-value write and three latch circuits SDL, ADL, and XDL are used. FIG. 136 shows an example of changing the assignment shown in FIG. 135 caused by the progress of the write operation.

As shown in FIG. 135, if 2-bit data is stored in a 4-value write, the write states are distinguished by, for example, two latch circuits ADL and XDL, and the QPW data is retained in the latch circuit SDL. In the example shown in FIG. 135, the QPW is not performed to the "C" state. Since a write operation starts with a lower threshold voltage state, the sequencer 14 changes the assignment of the latch circuits as appropriate, as shown in FIG. 136.

As shown in (1) of FIG. 136, when the write in the "A" state is finished, the latch circuit XDL no longer becomes necessary for writing. For this reason, after the write in the "A" state is finished, the sequencer 14 uses the latch circuit XDL as a cache for write data of a next page.

As shown in (2) of FIG. 136, when the write in the "A" state through the "B" state is finished, the latch circuit ADL no longer becomes necessary for writing. For this reason, after the write in the "A" state through the "B" state is finished, the sequencer 14 uses the latch circuit ADL as a cache for write data of a next page.

FIG. 137 shows an example of the assignment of the latch circuits at the time of performing a 3-value write, and an example of the operation when 2-bit data is stored in the 3-value write and two latch circuits SDL and XDL are used. FIG. 138 shows an example of changing the assignment shown in FIG. 137 caused by the progress of the write operation.

As shown in FIG. 137, if 2-bit data is stored in a 3-value write, the write states are distinguished by, for example, a single latch circuit, XDL, and the QPW data is retained in the latch circuit SDL. In the example shown in FIG. 137, the QPW is not performed to the "B" state. Since a write operation starts with a lower threshold voltage state, the sequencer 14 changes the assignment of the latch circuits as appropriate, as shown in FIG. 138.

As shown in FIG. 138, when the write in the "A" state is finished, the latch circuit XDL no longer becomes necessary for writing. For this reason, after the write in the "A" state is finished, the sequencer 14 uses the latch circuit XDL as a cache for write data of a next page. Thus, a write operation in the 3-value write may be performed with less latch circuits, compared to the 4-value write.

As described above, by changing the data allocation after the write at each state is completed, the sequencer 14 can release the latch circuit as appropriate, and use the released latch circuit as a write buffer for receiving write data for the next page.

In the operation described with reference to FIGS. 127 through 138, an example where the latch circuit SDL is used for retaining the QPW data; however, any of the other latch circuits may be used to retain the QPW data. The latch circuit used for performing the above-described operation may be designed to be of a discretionary circuit. In the operation described with reference FIGS. 127 through 138, the QPW may be omitted. In this case, the latch circuit corresponding to the QPW is reduced in the sense amplifier unit SAU.

In the definitions of page data in the first through 17th embodiments, the definitions "1" and "0" assigned to read data from some of or all pages may be interchangeable. The semiconductor memory 10 can thereby reduce the number of times that read is performed.

In the present description, the term "coupled" means an electrical coupling, and does not exclude a coupling with an element being interposed in the coupling, for example. In the present description, "off state" refers to a state in which a voltage lower than a threshold voltage of a transistor is applied to a gate of the transistor, and does not exclude a state in which a microcurrent, such as a leak current in a transistor, flows in the gate.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
a first memory cell configured to have one of a first threshold voltage, a second threshold voltage higher than the first threshold voltage, an m-th threshold voltage higher than the second threshold voltage, or an n-th threshold voltage higher than the m-th threshold voltage, wherein m is a natural number, and n is a natural number equal to or greater than m;
a second memory cell configured to have one of the first to m-th threshold voltages;
a first word line coupled to the first and second memory cells;
a first bit line connected to the first memory cell;
a second bit line connected to the second memory cell;
a first sense amplifier connected to the first bit line;
a second sense amplifier connected to the second bit line;
a first switch provided between the first sense amplifier and the second sense amplifier; and
a controller,
wherein:
data of a first bit, a second bit, an i-th bit, and a j-th bit are stored using a combination of a threshold voltage of the first memory cell and a threshold voltage of the second memory cell, wherein i is a natural number, j is a natural number equal to or greater than i, and n×n>2^j, and
the controller is configured to:
in a first read operation for a first page that includes the first bit:
read first data of the first page from the first memory cell by applying at least one type of read voltage to the first word line;
read second data of the first page from the second memory cell by applying the at least one type of read voltage to the first word line; and
determine data of the first page based on the first data and the second data,
in a second read operation for a second page that includes the second bit:
read data of the second page from the second memory cell by applying at least two types of read voltage to the first word line, and
in a third read operation for a third page that includes a third bit:
read data of the third page from the first memory cell by applying at least two types of read voltage to the first word line.

2. The semiconductor memory of claim 1, wherein the at least one type of read voltage applied to the first word line during the first read operation is different from each of the at least two types of read voltage applied to the first word line during the second read operation.

3. The semiconductor memory of claim 1, wherein the at least two types of read voltage applied to the first word line during the second read operation are the same as the at least two types of read voltage applied to the first word line during the third read operation, respectively.

4. The semiconductor memory of claim 1, wherein the controller is configured to:
in a fourth read operation for a fourth page that includes a fourth bit:
read first data of the fourth page from the first memory cell by applying at least two types of read voltage to the first word line;
read second data of the fourth page from the second memory cell by applying the at least one type of read voltage to the first word line; and
determine data of the fourth page based on the first data and the second data, and
in a fifth read operation for a fifth page that includes a fifth bit:
read first data of the fifth page from the first memory cell by applying at least one type of read voltage to the first word line;
read second data of the fifth page from the second memory cell by applying the at least two types of read voltage to the second word line; and
determine data of the fifth page based on the first data and the second data.

5. The semiconductor memory of claim 4, wherein the at least one type of read voltage applied to the first word line during the fourth read operation is different from each of the at least two types of read voltage applied to the first word line during the fourth read operation.

6. The semiconductor memory of claim 4, wherein:
the at least one type of read voltage applied to the first word line during the fourth read operation is the same as the at least one type of read voltage applied to the first word line during the fifth read operation, and the at least two types of read voltage applied to the first word line during the fourth read operation are the same as the at least two types of read voltage applied to the first word line during the fifth read operation, respectively.

7. The semiconductor memory of claim 4, wherein the at least one type of read voltage applied to the first word line during the first read operation is the same as (i) the at least one type of read voltage applied to the first word line during the fourth read operation and (ii) the at least one type of read voltage applied to the first word line during the fifth read operation.

8. The semiconductor memory of claim 1, wherein, in the first read operation, the data of the first page is determined through a logical operation between the first data stored in the first sense amplifier and the second data stored in the second sense amplifier by turning on the first switch.

9. The semiconductor memory of claim 8, wherein the first switch is turned off in each of the second read operation and the third read operation.

10. The semiconductor memory of claim 1, further comprising:

a third memory cell configured to have one of the first to m-th threshold voltages, the third memory cell being coupled to the first word line;

a fourth memory cell configured to have one of the first to m-th threshold voltages, the fourth memory cell being coupled to the first word line;

a third bit line connected the third memory cell;

a fourth bit line connected to the fourth memory cell;

a third sense amplifier connected to the third bit line;

a fourth sense amplifier connected to the fourth bit line; and a second switch provided between the third sense amplifier and the fourth sense amplifier.

11. The semiconductor memory of claim 10, wherein no switch is provided between the second sense amplifier and the third sense amplifier.

* * * * *